United States Patent [19]

Warren et al.

[11] Patent Number: 4,791,356

[45] Date of Patent: Dec. 13, 1988

[54] IN-CIRCUIT TESTING SYSTEM

[75] Inventors: Frederick E. Warren, Walnut Creek; Harvey B. Crisler, El Sobrante; Robert G. Jacobson, Brentwood; Chang H. Kim, Berkeley; Edward C. Llewellyn, Albany, all of Calif.

[73] Assignee: Zehntel Incorporation, Walnut Creek, Calif.

[21] Appl. No.: 909,940

[22] Filed: Sep. 19, 1986

[51] Int. Cl.[4] .............................................. G01R 31/28

[52] U.S. Cl. ............................. 324/73 R; 324/73 PC; 371/20

[58] Field of Search ............ 324/73 R, 73 PC, 158 R; 371/16, 20

[56] References Cited

U.S. PATENT DOCUMENTS 4,168,796 9/1979 Fulks et al. ........................ 324/73 R

OTHER PUBLICATIONS

Stefanski, A.; "Free-Running Signature . . . "; EDN; Feb. 5, 1979; pp. 37-39.

*Primary Examiner*—Ernest F. Karlsen

*Attorney, Agent, or Firm*—Arnold, White & Durkee

[57] ABSTRACT

An in-circuit test system having means to stimulate the device-under-test at any desired electrical node of the device, means to record the device's response waveform at any node, means to edit the response waveform, and means to use the edited waveform to restimulate the same device in a subsequent in-circuit test.

16 Claims, 119 Drawing Sheets

TEST SYSTEM 26 HARDWARE

Fig-1 TEST SYSTEM 26 HARDWARE

DATA POD 30

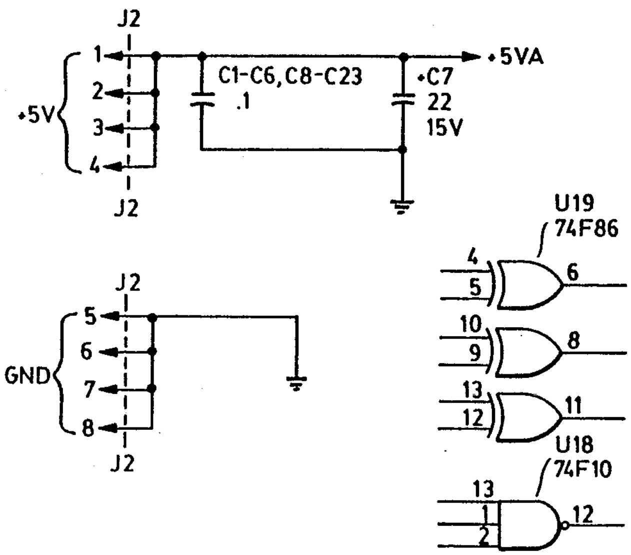
| COMPONENT REF DESIG. | |
|---|---|
| LAST USED | NOT USED |
| C26 | |
| CR95 | |
| DL2 | |
| K1 | |
| R3 | |
| RP14 | |
| U25 | U7, U8 |
| J8 | J5, J6 |
| INTEGRATED CIRCUIT IDENTIFICATION TABLE | | | | |
|---|---|---|---|---|
| REF DESIG. | TYP | +5VA | DIGITAL GND | SPARE GATES |
| DL1, DL2 | DDU-6 | 14 | 7 | |
| U20 | 74LS164 | 14 | 7 | |
| U14, U17, U21, U24 | 74LS299 | 20 | 10 | |
| U9, U22 | 74LS32 | 14 | 7 | |
| U12, U25 | 74LS74 | 14 | 7 | |
| U11, U13, U10 | 74LS244 | 20 | 10 | 3 |
| U1, U2, U5 | 74LS240 | 20 | 10 | 17 |
| U16, U23 | 74LS688 | 20 | 10 | |
| U3, U6 | 74LS153 | 16 | 8 | |
| U19 | 74F86 | 14 | 7 | 3 |
| U18 | 74F10 | 14 | 7 | 1 |
| U15 | 74F11 | 14 | 7 | 1 |
| U4 | 74F240 | 20 | 10 | |
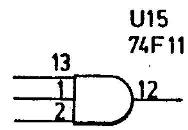
LEGEND:
1. ALL RESISTANCE VALUES ARE IN OHMS, 1/4 W, ±5%.
2. ALL CAPACITANCE VALUES ARE IN MICROFARADS, 50V, ±20%.
3. [FIG...] INTERCONNECT IDENTIFICATION
Fig. 3A
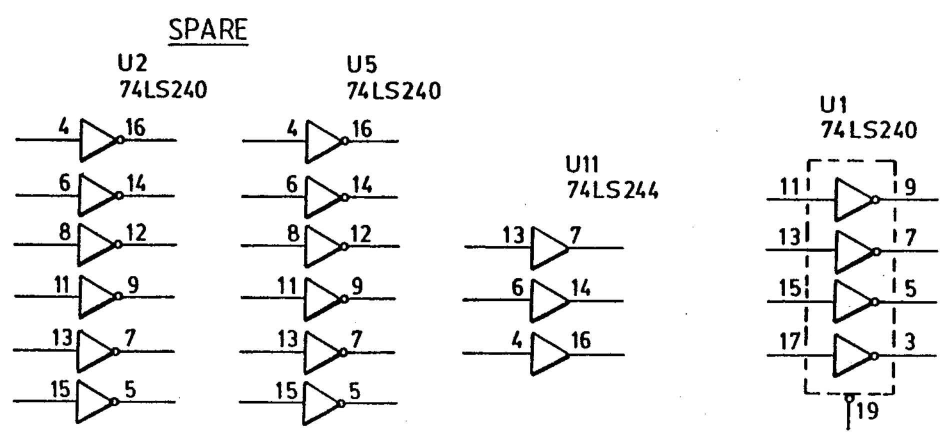
Fig. 3B

U20
74LS164
+5V
THC DATA 0

FIG3H EARLY CLOCK*

CLOCK SEL 1
CLOCK SEL 0
A
B
CLR
QA
QB
QC
QD
QE
QF
QG
QH
U23
74LS688
ADDR (7--0)
3 5
AD 0
AD 1
AD 2
AD 3
AD 4
AD 5
AD 6
AD 7
P=Q
132
122
START Y
U14
74LS299
CMPR AD15
CMPR AD14
CMPR AD13
CMPR AD12
CMPR AD11
CMPR AD10
CMPR AD9
CMPR AD8
CMPR AD0
CMPR AD1
CMPR AD2
CMPR AD3
CMPR AD4
CMPR AD5
CMPR AD6
CMPR AD7
124
START X
U21
74LS299
126
STOP Y
U17
74LS299
U16
74LS688
130
ADDR (15-8)
3 6
AD 8
AD 9
AD 10
AD 11
AD 12
AD 13
AD 14
AD 15
128
STOP X
U24
74LS299

CMND20
144
146
TEST ENV

142

SYNC X. 41
SYNC Y. 42
IEXT CLK OUT. 39
DUT CLK 1. 49
DUT CLK 1. 54
DUT CLK 2. 56
DUT CLK 2. 58
J3
EX
EY
J1
8 .IEXT CLK OUT
10 .DUT CLK 1
11 .DUT CLK 1
6 .DUT CLK 2
7 .DUT CLK 2
RP1
(SPARE)
J1-18, Vcc
J2-18, Vcc
EXG
EYG

GND. 2
GND. 4
GND. 6
GND. 8
GND. 10
GND. 12
GND. 14
GND. 16
GND. 19
GND. 21
GND. 24
GND. 26
GND. 29
GND. 31
GND. 33
GND. 35
GND. 38
GND. 40
GND. 43
GND. 45
GND. 48
GND. 50
GND. 53
GND. 55
GND. 57
GND. 59
GND. J1-9
GND. J2-9

LEGEND:

1. ALL RESISTANCE VALUES ARE IN OHMS, 1/4 W, ±5%
2. ALL CAPACITANCE VALUES ARE IN MICROFARADS, 50 V, ±20%
3. FIG... INTERCONNECT IDENTIFICATION
4. ⏚-1 INDICATES ANALOG GROUND
   ⏚-2 INDICATES SIGNAL GROUND
   ⏚-3 INDICATES 2003 GROUND
5. DIODES ARE 1N914

INTEGRATED CIRCUIT IDENTIFICATION TABLE

| REFERENCE DESIGNATION | TYPE | SIG. GND | ANA. GND | +5V | +28V | +15V | -15V | SPARE GATES |
|---|---|---|---|---|---|---|---|---|
| U1, 2, 3 | DAC-04 | 10 | - | 1 | - | 16 | 12 | - |
| U4, 12 | 74123 | 8 | - | 16 | - | - | - | - |
| U92, 100 | 74LS107 | 7 | - | 14 | - | - | - | - |
| U6, 13, 20, 21, 25, 26, 27, 32, 33, 34, 45, 46, 53, 54 | 74LS174 | 8 | - | 16 | - | - | - | - |
| U7, 8, 9 | 7511 | 2 | - | - | - | 8 | 1 | - |
| U36, 41, 42, 43, 44, 60 | 74125N | 7 | - | 14 | - | - | - | 3 |
| U11, 99, 116, 78 | 74LS08 | 7 | - | 14 | - | - | - | - |
| U16, 22, 75, 82, 83 | 74LS00 | 7 | - | 14 | - | - | - | 4 |
| U14, 15, 35 | 74LS139 | 8 | - | 16 | - | - | - | 1 |
| U19, 31 | 74LS66 | 7 | - | 14 | - | - | - | 3 |
| U23, 61, 91, 122 | 74LS32 | 7 | - | 14 | - | - | - | - |
| U24, 37, 58, 68, 70, 72, 74, 86, 109, 113 | 74LS04 | 7 | - | 14 | - | - | - | 2 |
| U28, 29, 30, 76, 77, 107 | 74LS193 | 8 | - | 16 | - | - | - | - |
| U38, 39 | 2003A | 8 | - | - | 9 | - | - | 4 |
| U40, 48 | 74LS240 | 10 | - | 20 | - | - | - | - |
| U47, 55, 57, 64, 71, 80, 88, 90, 104 | 3649 | 8 | - | 16 | - | - | - | 7 |
| U49, 50, 51, 52 | 74LS160A | 8 | - | 16 | - | - | - | - |
| U56, 112 | R220/330 | 1 | - | 10 | - | - | - | - |
| U59, 98, 121 | 74111 | 8 | - | 16 | - | - | - | 1 |
| U62, 96 | 3649 | 8 | - | 16 | - | - | - | - |
| U63, 79 | R220 | 16 | - | - | - | - | - | - |
| U5 | 74H106 | 13 | - | 5 | - | - | - | - |
| U67, 66, 73 | 9401 | 7 | - | 14 | - | - | - | - |
| U69, 85 | 74LS20 | 7 | - | 14 | - | - | - | 1 |
| U81, 84 | 74LS279 | 8 | - | 16 | - | - | - | 2 |
| U87 | 145171 | 8 | - | 16 | - | - | - | - |
| U89, 97, 106 | 74LS138 | 8 | - | 16 | - | - | - | - |
| U93 | 74LS165 | 8 | - | 16 | - | - | - | - |
| U94, 102 | 74LS153 | 8 | - | 16 | - | - | - | - |
| U95, 103 | 74LS157 | 8 | - | 16 | - | - | - | - |
| U101 | 74LS189 | 8 | - | 16 | - | - | - | - |
| U108 | 75LS195 | 8 | - | 16 | - | - | - | - |
| U110, 111 | 74LS348 | 8 | - | 16 | - | - | - | - |
| U114 | 74265 | 8 | - | 16 | - | - | - | 2 |
| U115 | 556 | 7 | - | 14 | - | - | - | - |
| U117, 118, 124, 125 | 74LS161 | 8 | - | 16 | - | - | - | - |
| U120 | 74LS629 | 8 | - | 16 | - | - | - | - |
| U123 | 74LS11 | 7 | - | 14 | - | - | - | 1 |
| U17 | 7410 | 7 | - | 14 | - | - | - | - |
| U119 | R220/330 | 1 | - | 8 | - | - | - | - |
| U65 | R220/330 | 8 | - | 16 | - | - | - | - |
| U10 | 74LS126 | 7 | - | 14 | - | - | - | - |
| U18 | 74LS273 | 10 | - | 20 | - | - | - | - |

TEST POINT IDENTIFICATION TABLE

| REF. DESIG. | FUNCTION |
|---|---|
| TP1 | E & G THRESH |
| TP2 | F LO THRESH |
| TP3 | F HI THRESH |
| TP4 | F BUFFER |
| TP5 | G BUFFER |
| TP6 | E BUFFER |
| TP7 | DATA TRANSFER |
| TP8 | DIGITAL GROUND |

LED IDENTIFICATION TABLE

| REF. DESIG | FUNCTION |
|---|---|
| DS1-A | NO CLK |
| DS1-B | EXT MODE |
| DS1-C | DUT V+ |
| DS1-D | TEST ENV |
| DS2-A | THRESH ERROR |

COMPONENT REFERENCE DESIGNATION

| LAST | NOT USED |
|---|---|
| A1 | |
| AR11 | |
| C185 | C11, 12, 16, 25, 26, 106, 110-112, 116, 169, 155, 163, 171-174, 186 |
| CR28 | CR19 |
| DS2 | |
| J5 | |
| L3 | |
| P3 | |
| Q1 | |
| R104 | R1, 2, 12, 13, 87 |
| TP8 | |
| U126 | U105 |
| VR3 | |
| Y1 | |
| K9 | |

Fig. 5B

| JUMPERS | | |
|---|---|---|
| -01 | -02 | -03 |
| 21-22 | 21-22 | 22-23 |

| JUMPERS | | |
|---|---|---|
| -01 | -02 | -03 |
| 25-26 | 25-26 | 24-26 |

MEMORY ADRS MUX
U94 74LS153
U102 74LS153
U80 3649
U71 3649
U79 220
P2
FIG.50 MA0
FIG.50 MA1
FIG.50 MA2
FIG.50 MA3
70, MA0-A
65, MA0-B
66, MA1-A
68, MA1-B
69, MA2-A
67, MA2-B
60, MA3-A
59, MA3-B
U122 74LS32
U123 74LS11
U78 74LS08
61, D SYNC A
62, D SYNC B
64, E SYNC A
63, E SYNC B
U18 74LS273
U57 3649
J5
20, TRIG ON RISE
FIG.5C F POLE HI BI MSB
FIG.5C F POLE LO BI MSB
FIG.50 DD OVERDRIVE
FIG.51 EXT MEAS CLK SEL
FIG.51 RISING CLK SEL
FIG.51 QLO
FIG.51 QH1
-01 ONLY
-5V

LOGIC ANALYZER 32

| FUNCTION NAMES DISTRIBUTION TABLE | |
|---|---|
| FUNCTION NAMES | SHEET NUMBER |
| 8 MHZ CLOCK (IN) | 13,17 |
| ADDR READ ENABLE * (IN) | 6,10 |
| ADDR RESET * (OUT) | 5,6 |
| BIN0 - BIN12 (IN) | 3 |
| BIN0 - BIN15 (OUT) | 3 |
| BIN0 - BIN7 (IN) | 6 |
| BIN11 (IN) | 9 |
| BIN12 * (IN) | 9 |
| BIN13 (IN) | 9 |
| BIN14 (IN) | 9 |
| BIN15 (IN) | 9 |
| CL0 * - CL15 * (OUT) | 3,6,9 |
| CLEAR ST * (OUT) | 6 |
| CLEAR STOP * (IN) | 6,7 |
| CLEAR1 * (OUT) | 6,7 |
| CLEAR2 * (OUT) | 6,7 |
| CLEAR3 * (OUT) | 6,8 |
| CLK EDGE SET * (OUT) | 6 |
| CLK PH1 (IN) | 5,7,11 |
| CLK PH2 (IN) | 5,7,11 |
| CLK SEL 0 | 6,7 |
| CLK SEL 1 | 6,7 |
| CLOCK | 7,8 |
| CLOCK * | 7,8 |
| COUNT EN | 7 |
| COUNT ENV | 5,7 |
| CS1 * | 9,14,16 |
| CS2 * | 9,15,16 |
| CTR CLK | 8 |
| DATA IN0 - DATA IN15 | 4 |
| DATA0 - DATA3 | 8,11,13 |
| DCLK1 0 | 6,17 |
| DCLK1 1 | 6,17 |
| DCLK1 EN * | 6,17 |
| DCLK2 0 | 6,17 |
| DCLK2 1 | 6,17 |
| DCLK2 EN * | 6,17 |
| DCT EN | 7,8 |
| DELAY 0 - DELAY 15 | 6,8 |
| DELAY FF CL * | 6,8 |
| DUT CLK DIS 1 | 6 |
| DUT CLK DIS 2 | 6 |
| DUT CLOCK 1 * | 17 |
| DUT CLOCK 2 * | 17 |
| E POLE | 4,12 |
| ECLK IN | 8 |
| ECLK OUT | 7 |
| ECLOCK | 7,17 |
| EE LATCH CL * | 6,7 |
| ETERM1 SEL | 6,12 |
| ETERM2 SEL | 6,12 |
| EXEC ENV | 4,6,7,8 |
| EXEC ENV IN | 4 |
| EXEC ENV * | 6,10 |
| EXT CLK 0 | 6,17 |
| EXT CLK 1 | 6,17 |
| EXT CLK EN * | 6,17 |
| EXT CLK IN | 17 |
| EXT CLK OUT | 17 |
| F POLE | 4,12 |

1. RESISTORS ARE IN OHMS, 1/4W, 5%.
2. ALL CAPACITANCE VALUE ARE IN MICROFARADS, 50V, 20%.

Fig. 7A'

| FUNCTION NAMES DISTRIBUTION TABLE | |
|---|---|
| FUNCTION NAMES | SHEET NUMBER |
| FTERM1 SEL | 6,12 |
| FTERM2 SEL | 6,12 |
| G POLE | 4,12 |
| GTERM1 SEL | 6,12 |
| GTERM2 SEL | 6,12 |
| HCLOCK | 7,13 |
| IN0 - IN15 | 3 |
| LD CT EN* | 6,8 |
| LISTEN | 4 |
| LOAD COUNT | 6,8 |
| LTC* | 6,8 |
| LTR | 7,8 |
| MEMADDR1 0 - MEMADDR1 11 | 5,9,10,11,14,16 |
| MEMADDR2 0 - MEMADDR2 11 | 5,9,11,15,16 |
| MULTIBUS 0 - MULTIBUS 15 | 10 |
| NO TRIGGER | 6,7 |
| POD POWER OFF | 2,6 |
| R LISTEN | 4,11 |
| R/F 0 - R/F 3 | 6,8 |
| RADD0 * | 10 |
| RADD0 - RADD12 | 3,9 |
| RD PH1* | 10 |
| RD PH2* | 10 |
| R DATA PH1 0-R DATA PH1 15 | 10 |
| R DATA PH1 0-R DATA PH1 11 | 14 |
| R DATA PH1 12 - R DATA PH1 15 | 16 |
| R DATA PH2 0-R DATA PH2 15 | 10 |
| R DATA PH2 0-R DATA PH2 11 | 15 |
| R DATA PH2 12-R DATA PH2 15 | 16 |
| RDIN 0 - RDIN 15 | 4,11 |
| RE POLE | 4,11 |
| RF POLE | 4,11 |
| RG POLE | 4,11 |
| S0 - S3 | 6,8 |
| SET COUNT EN* | 6,7 |
| SET NO DELAY* | 6,8 |
| SET NO TRIG* | 6,8 |
| SET STOP* | 6,7 |
| SET1 * | 6,7 |
| SIG SEL | 6,11 |
| ST1 - ST4 | 6,11 |
| STARTED | 6,10 |
| SYNC SET* | 6,17 |
| SYNC START SEL | 6,17 |
| SYNC START1 - SYNC START2 | 17 |
| SYNC STOP SEL | 6,17 |
| SYNC STOP1 - SYNC STOP2 | 17 |
| TCA1 | 5,7 |
| TCB1 | 5,7 |
| TCC1 | 5,7 |
| TCLOCK | 7 |
| TESTER CLK | 4,7 |
| TESTER CLK IN | 4 |
| W DATA PH1 0 - W DATA PH1 15 | 11,14,16 |
| W DATA PH2 0 - W DATA PH2 15 | 11,14,16 |
| WE1* | 11,14,16 |
| WE2* | 11,14,16 |
| WRITE DISABLE | 7,11 |
| WRITE SELECT | 5,6,9,10 |

1. RESISTORS ARE IN OHMS, 1/4W, 5%.
2. ALL CAPACITANCE VALUE ARE IN MICROFARADS, 50V, 20%.

Fig.7A''

| INTEGRATED CIRCUIT IDENTIFICATION TABLE | | | | | | | | |
|---|---|---|---|---|---|---|---|---|
| REFERENCE DESIGNATION | TYPE | +28V | +18V | +5V | DIG GND | ANAL GND | -5V | SPARES |
| U1,11,17,27,33,43,44,48,49 | 74LS244 | - | - | 20 | 10 | - | - | - |
| U2,18,28,56,61,62,85,86,91,92 | 74F161 | - | - | 16 | 8 | - | - | - |
| U3-10,13-16,19-26,29-32,35-42 | 61470-70 | - | - | 18 | 9 | - | - | - |
| U12,34,50,55 | 74F244 | - | - | 20 | 10 | - | - | - |
| U45,51,57,69,78,88,93,99 | 74LS14 | - | - | 14 | 7 | - | - | - |
| U46,52,58,63,66,72,74,82,94,104,133 | 74HCT04 | - | - | 14 | 7 | - | - | - |
| U47,53,80,84,90,95,101,107,113,118,124,130 | 74HC374 | - | - | 20 | 10 | - | - | - |
| U54,65,76,126 | 74LS00 | - | - | 14 | 7 | - | - | 2 |
| U59,60 | 74HC138 | - | - | 16 | 8 | - | - | - |
| U64,70,75,79, | 74F374 | - | - | 20 | 10 | - | - | - |
| U67 | 74LS04 | - | - | 14 | 7 | - | - | - |
| U68 | 74F240 | - | - | 20 | 10 | - | - | - |
| U71 | 74LS86 | - | - | - | - | - | - | 3 |
| U73 | 2003A | 9 | - | - | 8 | - | - | - |
| U77,103,110,114,119,121 | 74F74 | - | - | 14 | 7 | - | - | - |
| U81,109 | 74F08 | - | - | 14 | 7 | - | - | - |
| U83 | 74F157 | - | - | 16 | 8 | - | - | - |
| U87 | 74F157 | - | - | 1,16 | 8 | - | - | - |
| U89 | 74LS240 | - | - | 20 | 10 | - | - | - |
| U96 | 74F86 | - | - | 14 | 7 | - | - | - |
| U97 | 74F151 | - | - | 16 | 8 | - | - | - |
| U98 | 74F109 | - | - | 16 | 8 | - | - | - |
| U100,106,111,112,131 | 74HC153 | - | - | 16 | 8 | - | - | - |
| U102 | 74F10 | - | - | 14 | 7 | - | - | 2 |
| U105 | 74HCT86 | - | - | 14 | 7 | - | - | - |
| U108,120 | 74F32 | - | - | 14 | 7 | - | - | 3 |
| U115,125 | 74F11 | - | - | 14 | 7 | - | - | - |
| U116 | 74F00 | - | - | 14 | 7 | - | - | - |
| U117 | 74HC161 | - | - | 16 | 8 | - | - | - |
| U122 | LF351 | - | 7 | - | - | - | 4 | - |
| U123 | 74HC74 | - | - | 14 | 7 | - | - | - |
| U127 | HCT00 | - | - | - | - | - | - | 1 |
| U128,129 | LH0033 | - | 12 | - | - | - | 10 | - |
| U132 | 74F241 | - | - | 20 | 10 | - | - | - |

| COMPONENT | REF. DESIG |
|---|---|
| LAST USED | NOT USED |
| C172 | C136,149,160 |
| CR24 | - |
| DL4 | - |
| J7 | - |
| JMPR9 | - |
| K7 | - |
| L5 | L1 |
| Q7 | - |
| R37 | R21 |
| RP13 | - |
| TP3 | - |
| U134 | - |
| VR4 | - |
| Y1 | - |

Fig. 7B

Fig. 7H
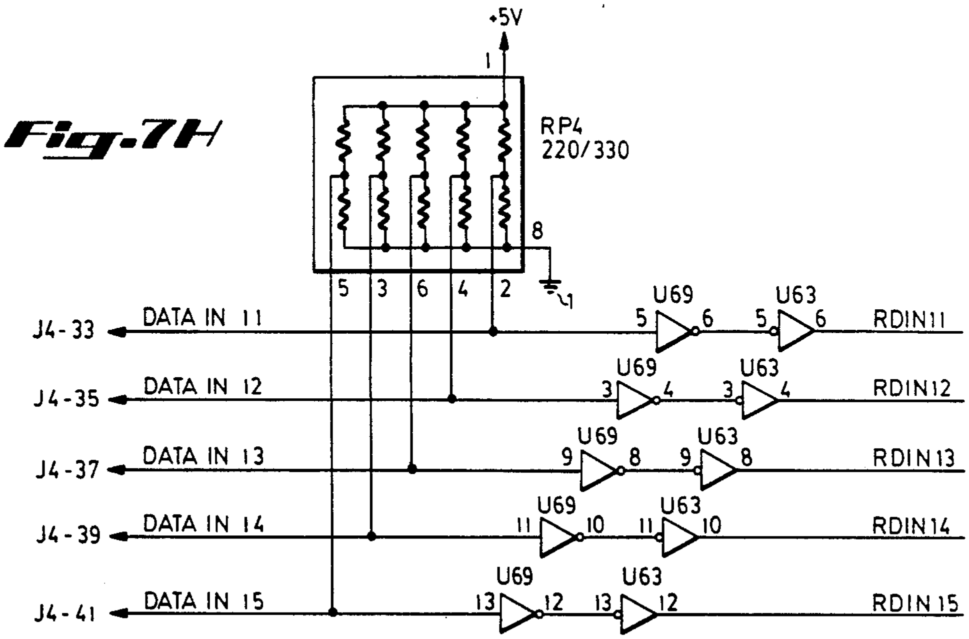
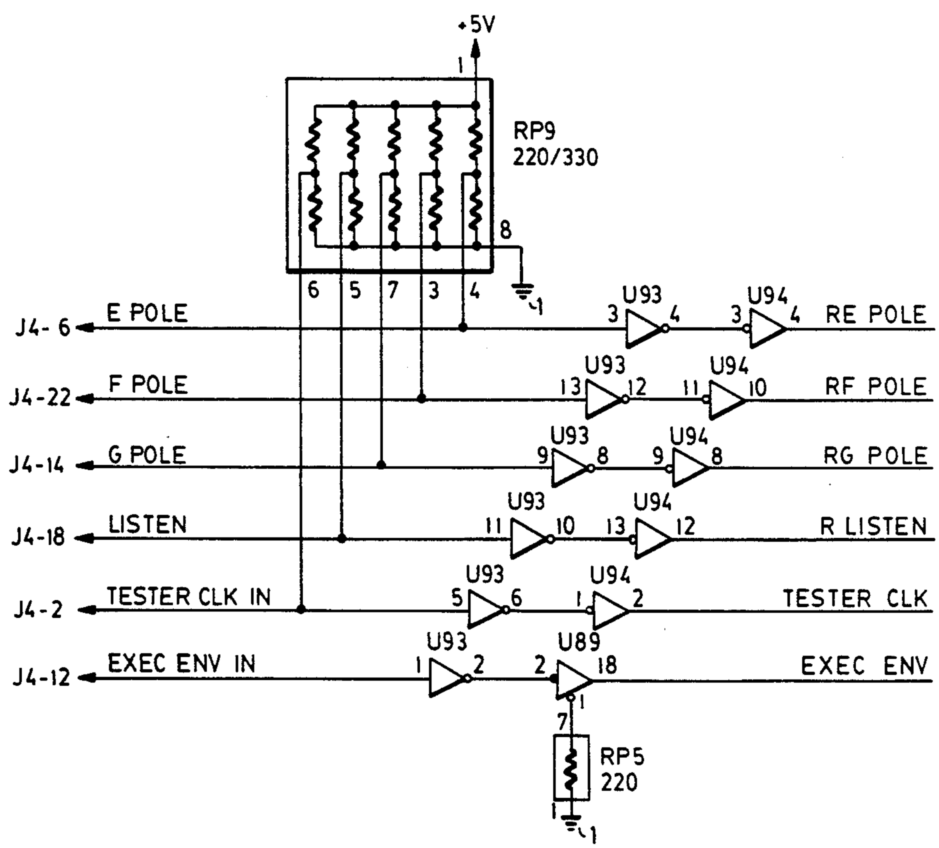

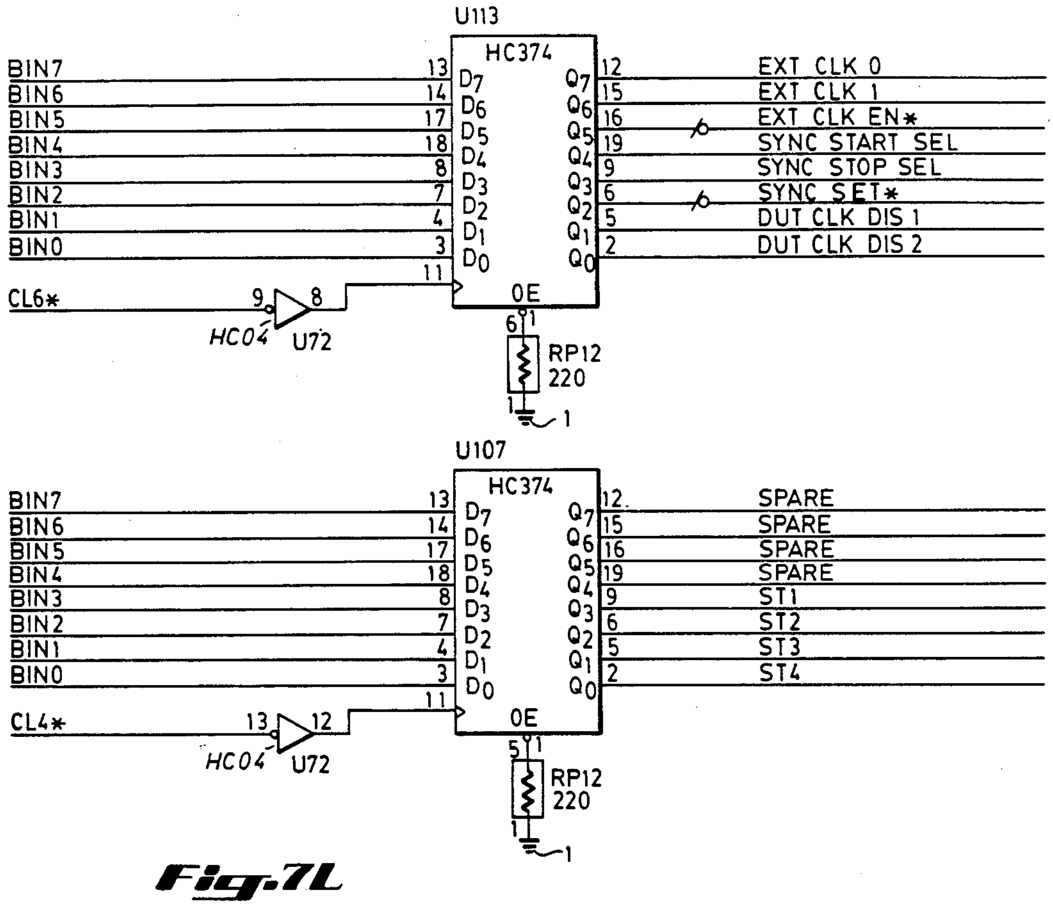
Fig.7L
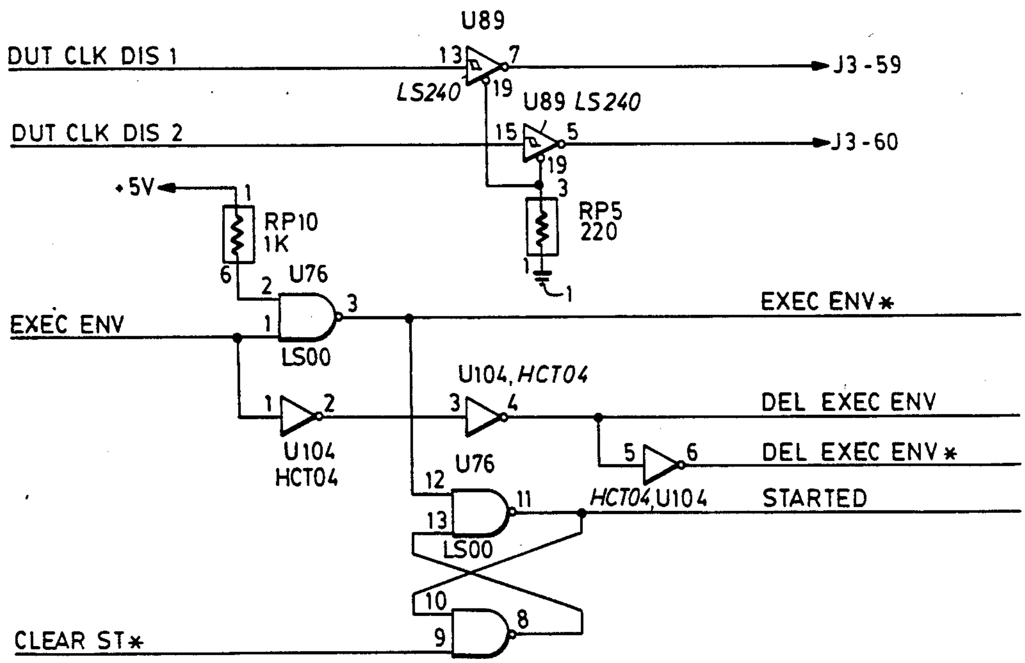

Fig. 7W
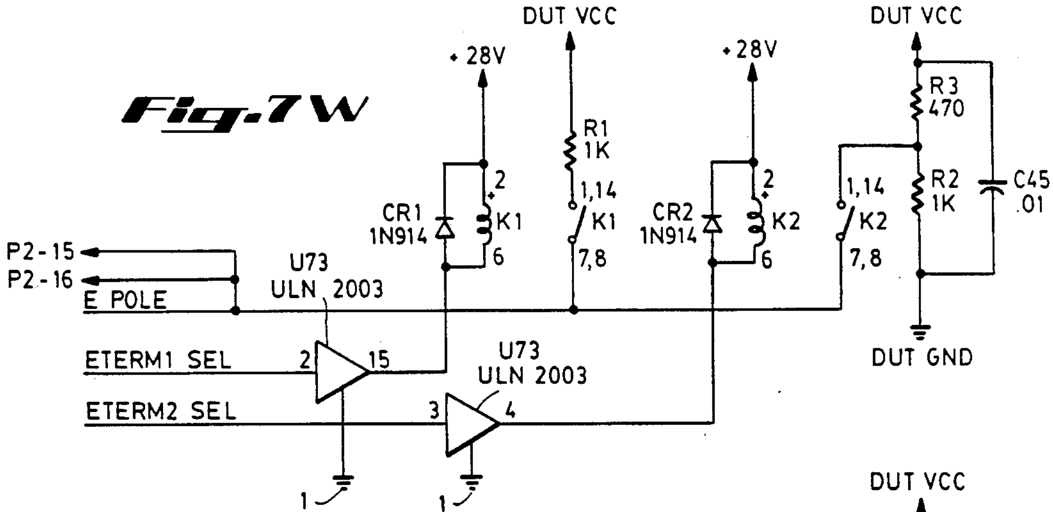
E,F,G BUS TERMINATIONS
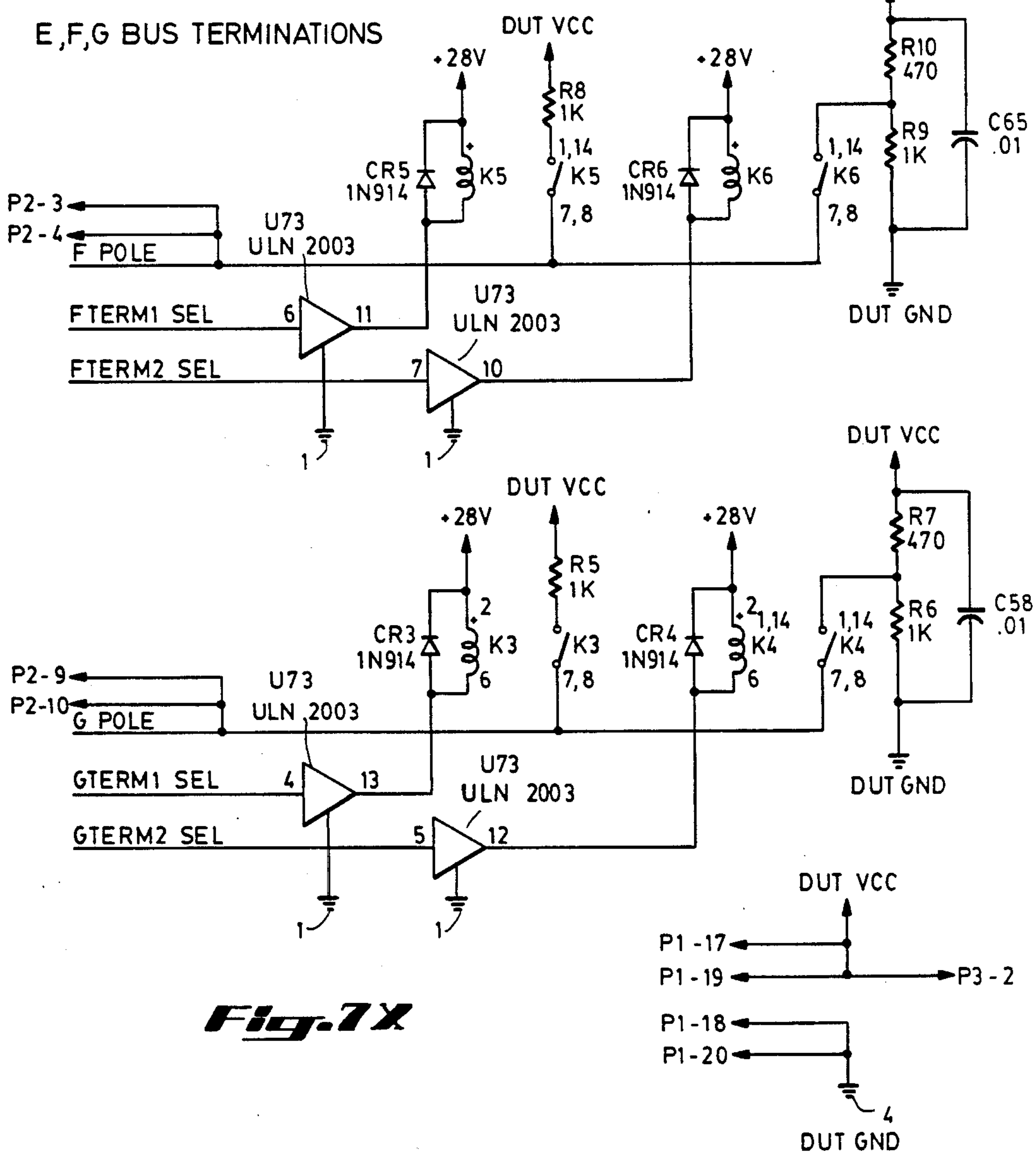
Fig. 7X

CALLING PROGRAMS
ABOVE
CALLED PROGRAMS

| | CALLING PROGRAM SENDS: | CALLED PROGRAM SENDS BACK: |
|---|---|---|
| 1 | FILE NAME | ERROR CODE |
| 2 | FHEADER, FILE NAME | LENGTH-OF-FHEADER |
| 3 | BYTE | ——— |
| 4 | FILE DESCRIPTOR | ERROR CODE |
| 5 | TIME | BYTE |
| 6 | BUFFER, NUMBYTES, BLOCKNUM | ERROR CODE |
| 7 | (CHAR*) PTR, NUMBYTES | ——— |

DATA DIRECTOR WORKSTATION
MACINTOSH SOFTWARE

DATA DIRECTOR WORKSTATION
WAVEFORM EDITOR
MAIN LOOP FUNCTIONS
270

DATA DIRECTOR WORKSTATION
LOGIC ANALYZER
MAIN LOOP FUNCTIONS
272

DATA DIRECTOR WORKSTATION
DATA PROTOCOL EDITOR
MAIN LOOP FUNCTIONS
268

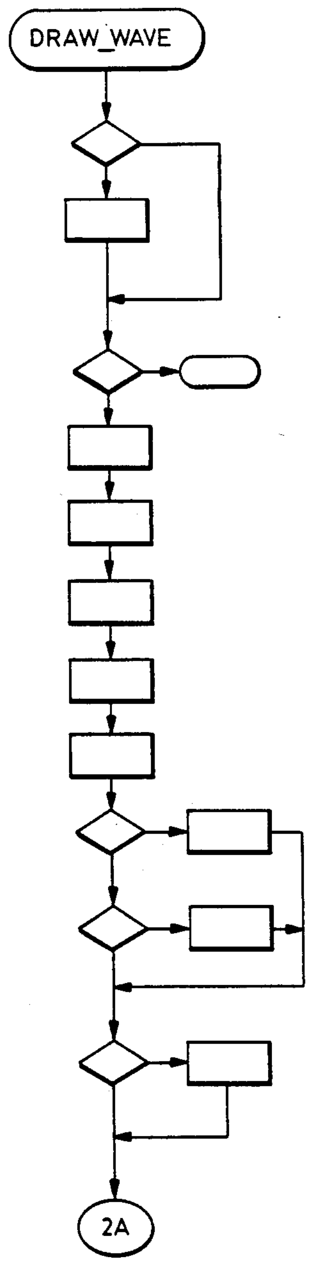

DRAW ONE WAVEFORM
SUBROUTINE 337

IS THIS A NEW WAVEFORM ?

IF SO, ALLOCATE NEW MEMORY.

OTHERWISE, SKIP

IF WAVEFORM NOT VISIBLE, RETURN.

DETERMINE WAVE INDEX AND CLOCK INDEX.

DETERMINE WAVE HEIGHT AND CLOCK WIDTH FROM SETUP DATA.

DETERMINE STATE OF FIRST CLOCK TO BE DRAWN.

USE INDECES TO FIND CLOCK IN WAVEFORM STRUCTURE.

CREATE A SCRATCH-PAD BITMAP.

IF EXPAND MODE IS ASSERTED, SET COUNT TO EXPANDED LENGTH.

OTHERWISE, IF REQUESTED LENGTH IS GREATER THAN TOTAL WAVEFORM, SET LENGTH TO STOP AT END OF ACTUAL DATA.

IF COMPUTED COUNT CARRIES BEYOND END OF SCREEN, ADJUST COUNT TO STOP AT END OF SCREEN.

*Fig. 15A*

'EFORM

| RECORD TYPE | I.D. NUMBER | RECORD LENGTH | NODE NUMBER | CLOCK CYCLES | NAME... (NULL) | DATA .... | |
|---|---|---|---|---|---|---|---|

| | | |
|---|---|---|
| RECORD TYPE = 1 | SHORT | |
| I.D. NUMBER | SHORT | CROSS REFERENCE (UNIQUE) |
| RECORD LENGTH | SHORT | TOTAL BYTE COUNT OF THIS RECORD |
| NODE / CHANNEL NUMBER | SHORT | REFERS TO EXTERNAL HARDWARE (– IS NO VALUE) |
| CLOCK CYCLES | SHORT | LENGTH OF WAVEFORM |
| NAME | C-STRING | |
| DATA | SHORT [ ] | |

| STATE | REPLICATIONS |
|---|---|

STATE 0=LOW 1=HIGH 2=TRISTATE

ME

| RECORD TYPE | I.D. NUMBER | RECORD LENGTH | NAME TYPE | PROTO LENGTH | NAME... (NULL) |
|---|---|---|---|---|---|

| | | |
|---|---|---|
| RECORD TYPE = 3 | SHORT | |
| I.D. NUMBER | SHORT | CROSS REFERENCE |
| RECORD LENGTH | SHORT | |
| NAME TYPE | SHORT | 1=CONTROL PROTO, 2=DATA PROTO, 3=LA |
| PROTOCOL LENGTH | SHORT | |
| NAME | C-STRING | |

1MENT

| RECORD TYPE | I.D. NUMBER | RECORD LENGTH | COMMENT... (NULL) |
|---|---|---|---|

RECORD TYPE = 2

Fig. 16
WAVEFORM FILE FORMAT

LEGEND:

1. ALL RESISTANCE VALUES ARE IN OHMS 1/4 W, ±5%
2. ALL CAPACITANCE VALUES ARE IN MICROFARADS.
3. [FIG...] INTERCONNECT IDENTIFICATION

INTEGRATED CIRCUIT IDENTIFICATION TABLE

| REF. DES | TYPE | GND | +5V | UNUSED GATES |
|---|---|---|---|---|
| U1-4,7,8,11,12,17,18, 23,24,35,36,43,44 | 74LS245 | 10 | 20 | - |
| U5,6,9,10,19,20,25,26, 37,38 | 74LS273 | 10 | 20 | - |
| U13,14,27,28,32 | 74S32 | 7 | 14 | 3 |
| U15,16,21,22 | 74LS240 | 10 | 20 | - |
| U29 | 74S138 | 8 | 16 | - |
| U30,42,45 | 74S04 | 7 | 14 | 5 |
| U31 | SPARE | 7 | 14 | - |
| U33,40 | 74LS30 | 7 | 14 | - |
| U34,41 | OPTIONAL 74S04. | 7 | 14 | - |
| U39,46 | 74LS123 | 8 | 16 | 1 |
| U47 | 74LS08 | 7 | 14 | 3 |
| U48 | 74368 | 8 | 16 | 2 |
| U49 | SPARE | - | - | - |
| U50-53 | SPARE | 10 | 20 | - |

COMPONENT REF. DES.

| LAST USED | NOT USED |
|---|---|
| C39 | - |
| E84 | - |
| J4 | - |
| R4 | - |
| U53 | - |

SPARE GATES

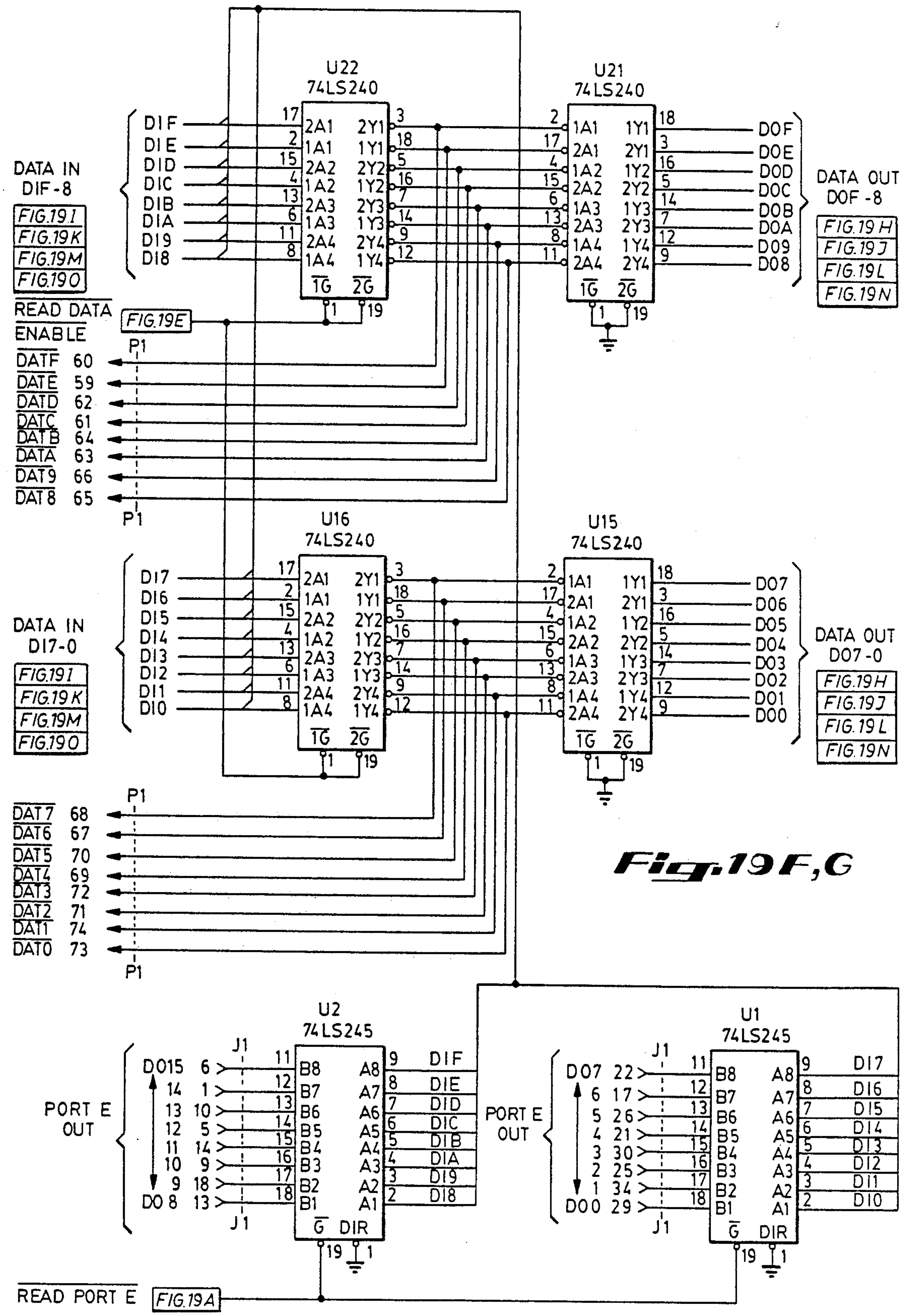
Fig. 19F,G

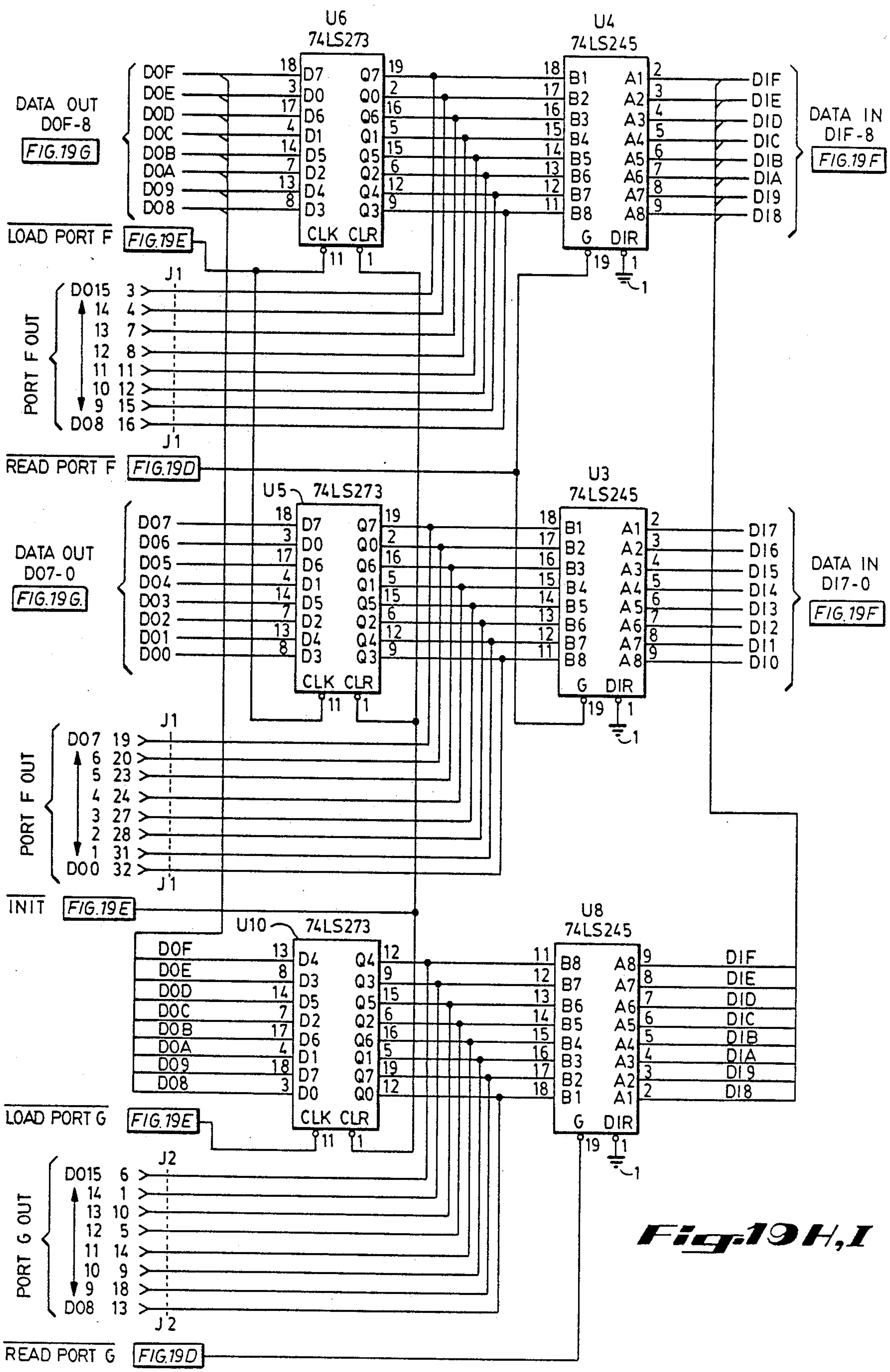
Fig. 19H,I

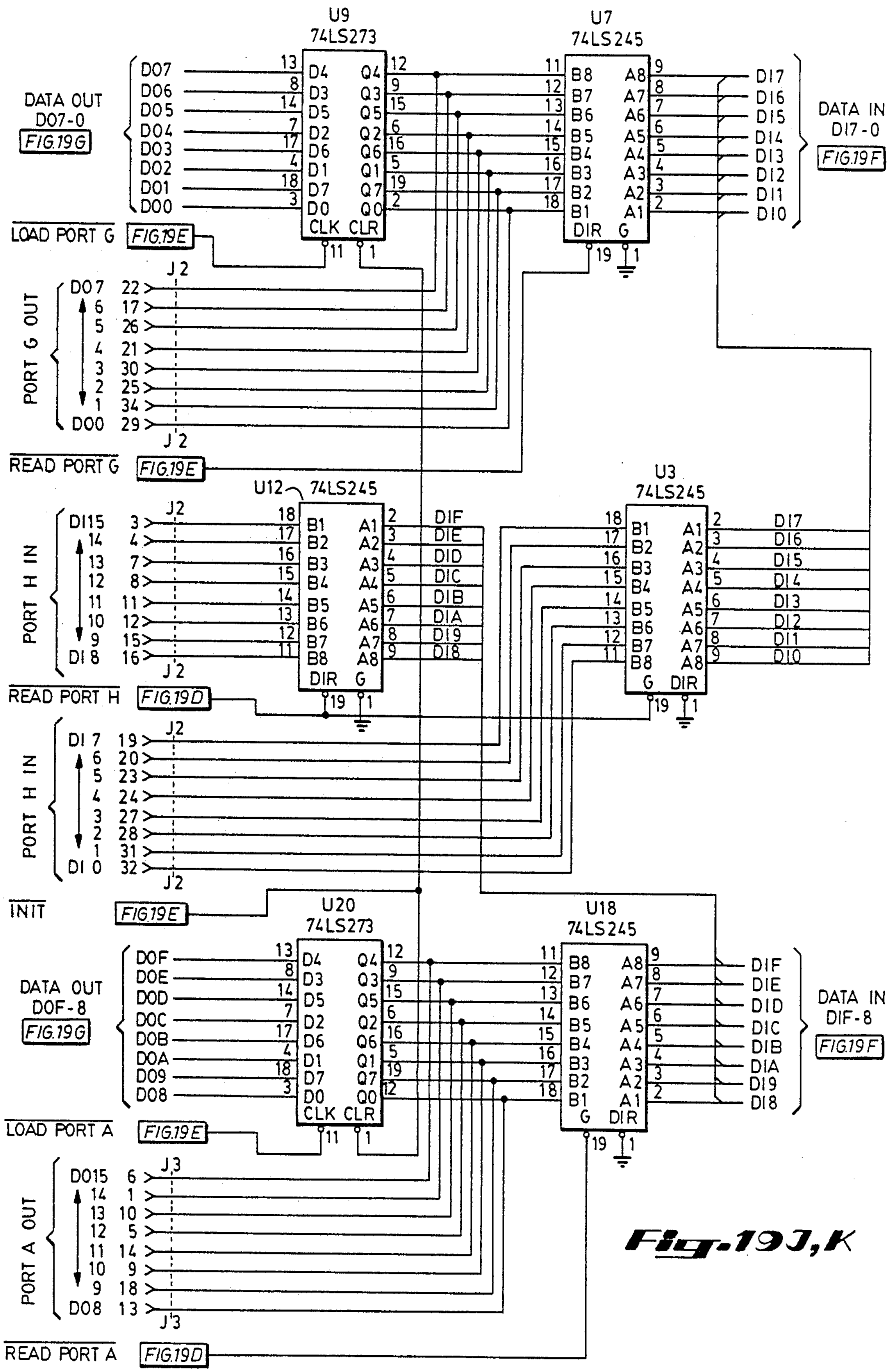
Fig-19J,K

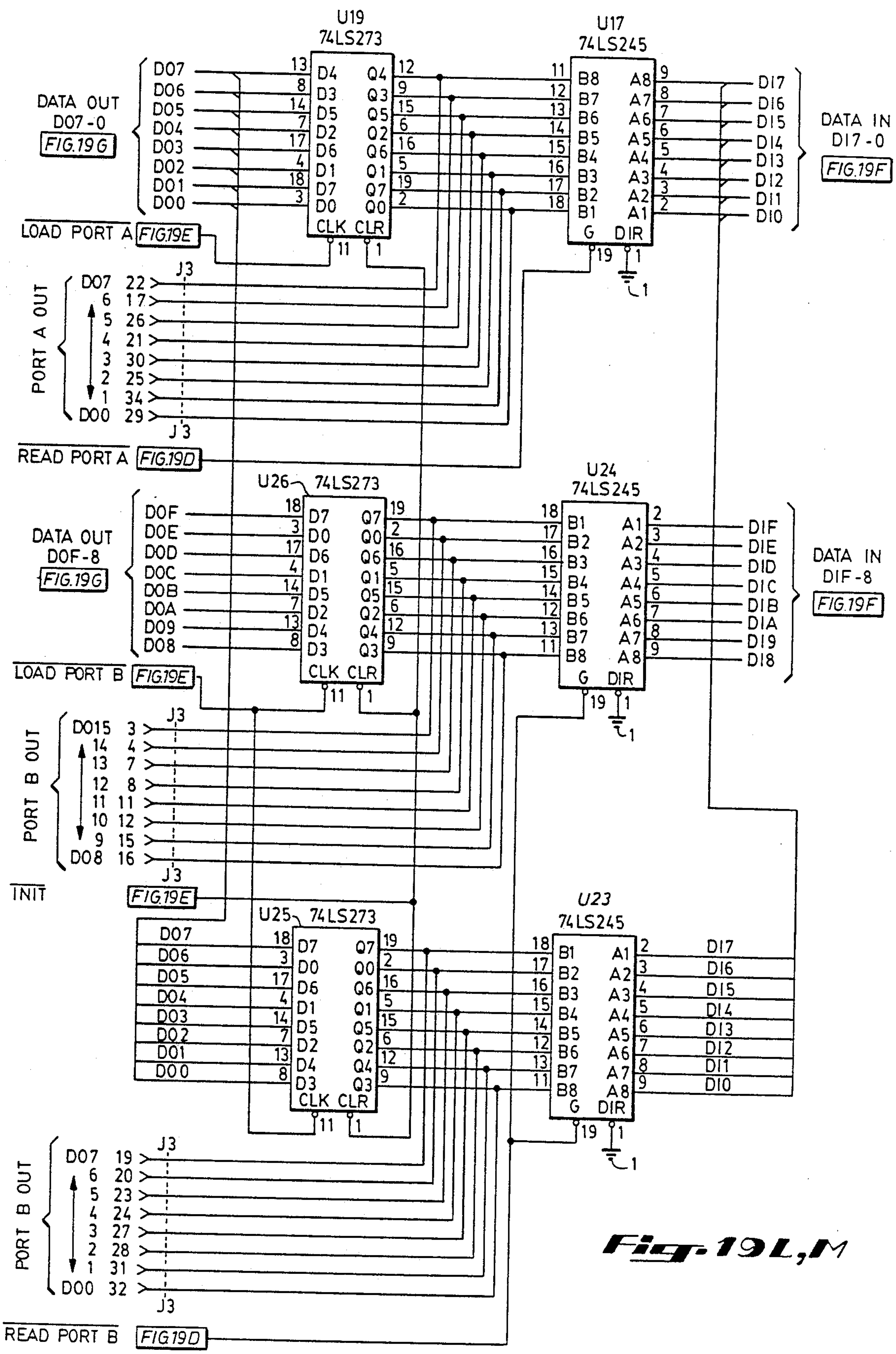
Fig. 19L,M

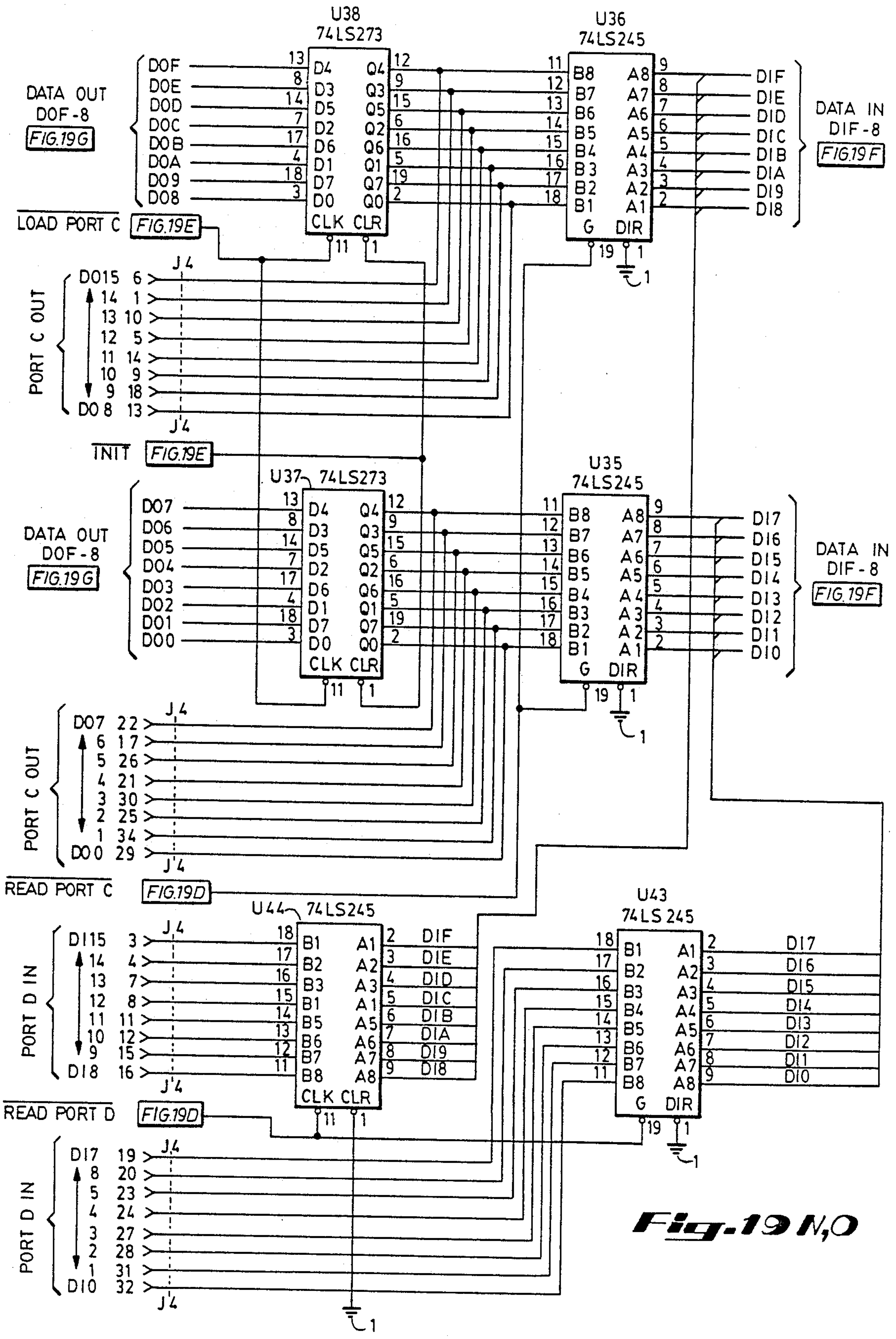
Fig-19N,O

LEGEND (1) REQUIRED IF NO VACUUM PUMP ORDERED.

(2) SINGLE POWER SUPPLY OPTION } MUTUALLY EXCLUSIVE (07-A-5250-XX) PER CUSTOMER ORDER.

(3) DUAL POWER SUPPLY OPTION } MUTUALLY EXCLUSIVE (07-A-5250-XX) PER CUSTOMER ORDER.

(4) IF 50 Hz OPTION IS ORDERED THE POWER SUPPLY MUST BE INSTALLED IN THE OPTIONAL BAY (07A41109).

(5) OPTION MAY BE INSTALLED AT RS232-1 THROUGH RS232-7.

(6) INSTALL POWER CABLE AT AC POWER CONTROL ASSEMBLY 5286 (REFER TO 03D40501).

(7) SEE FIG.20E AND FIG.20F FOR INTERCONNECT.

(8) CBL PN 40709 IS USED FOR ATM EXTERNAL ANALOG SYNC/OSC SIGNALS FOR SYSTEM ALLOCATION NUMBERS 850-000 THRU 850-146 REF FCA 40710.

CBL PN 41334-03 IS USED FOR ATM EXTERNAL ANALOG SYNC/OSC SIGNALS FOR SYSTEM ALLOCATION NUMBERS 850-147 AND ABOVE.

CABLES 40709 AND 41334-03 ARE MUTUALLY EXCLUSIVE.

Fig. 20A''

6 5 } SEE FIG. 20 A''

Fig. 21

MICRORUN STATE DIAGRAM (0) CLEARED STATE.

(1) IDLE STATE-COMMANDED (LISTEN WINDOW UNDEFINED).

(2) FULL SETUP-LISTEN WINDOW FROM SYNC X TO SYNC Y.

(3) PARTIAL SETUP-NORMAL LISTEN WINDOW.

(4) IDLE STATE-FULL SETUP SENT TO POD.

(5) IDLE STATE-PARTIAL SETUP SENT TO POD.

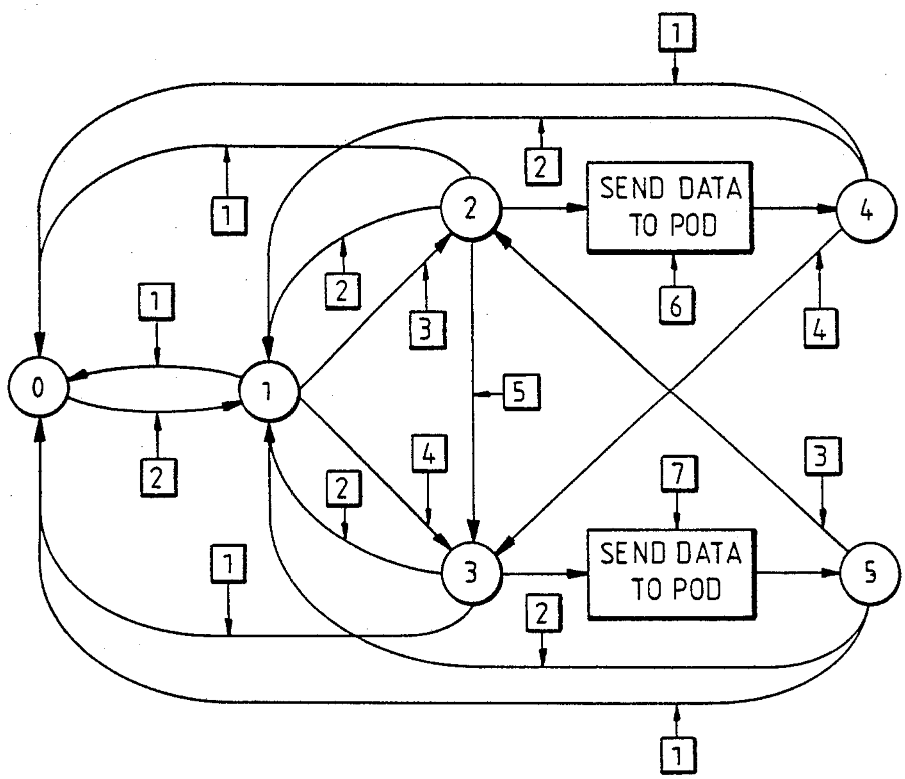

[1] CLEAR-ISSUED BY RESTARTDIGITAL( ).

[2] MICRORUN COMMAND RECEIVED-SET IN MICRO_RUN( ).

[3] SYNC X TO SYNC Y SPECIFIED-SET IN SETLISTEN( ).

[4] NORMAL LISTEN SPECIFIED-SET IN SETLISTEN( ).

[5] SYNC SPECIFIED, BUT NO EXTMEAS ENABLE SET IN SETMICRORUN( ).

[6] SEND FULL MICRORUN SETUP-SET IN SETMICRORUN( ).

[7] SEND PARTIAL MICRORUN SETUP-SET IN SETMICRORUN( ).

IN-CIRCUIT TESTING SYSTEM

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

This invention relates to digital in-circuit testers. More particularly, this invention relates to a user-interactive test system for generating testing waveforms and measuring the outputs of devices to which those testing waveforms are inputted. The use of the term "in-circuit" means that the device or circuit under test does not have to be isolated or removed from the surrounding circuits in order to apply test signals and to monitor the output of the device.

2. Descriotion of the Related Art

U.S. Pat. No. 4,216,539, incorporated herein by reference, and assigned to the assignee of the present application, discloses an in-circuit digital tester. That patent discloses a digital test signal generator with each pin in a "bed of nails" fixture capable of generating a wide variety of digital test signals to test components in a circuit under test. U.S. Pat. No. 4,339,819, incorporated herein by reference, and assigned to the assignee of the present application, discloses a programmable sequence generator for in-circuit digital testing. That patent discloses a circuit for generating data bus and control input test signals to test bus-oriented electrical components, such as microprocessors, in a circuit under test.

Some companies have produced in-circuit testers which can display on a CRT waveforms outputted by a device-under-test (DUT). The Genrad 2270 series manufactured by Genrad in Concord, Mass., is such a device. However, apparently that device cannot record or edit the output waveforms of the DUT. Some companies have produced logic analyzer workstations for debugging microprocessors. These workstations utilize personal computers. One such workstation is produced by Northwest Instrument Systems, Inc., Beaverton, Ore.

The workstations currently produced suffer from various deficiencies. Existing workstations cannot provide stimuli in the middle of a circuit board. Stated another way, these workstations cannot "in-circuit back drive". These workstations are also unable to edit recorded DUT outputted waveforms and then use the edited waveforms as input stimuli for the same DUT in a subsequent test. Furthermore, even for those workstations which utilize personal computers, none of those workstations have a user-friendly interface, such as a computer "mouse", for user interface with the personal computer.

Thus, there exists a need for a workstation that allows easy and efficient user interface with the personal computer, and has a capability of not only viewing measured waveforms, but also recording and editing those measured waveforms, and then using those edited waveforms as stimuli for retesting the DUT.

SUMMARY OF THE INVENTION

The above-noted and other drawbacks of the prior art are overcome by providing a method and apparatus for in-circuit testing which features the capability of editing measured waveforms of the DUT and which can achieve stimulating the DUT by the edited measured waveforms. The undesirable feature common to existing devices wherein the user is not able to program a test from the DUT measured waveforms is eliminated by the invention, and it is believed to be the first personal-computer-based test system which can achieve using edited DUT-measured waveforms as stimuli to the same DUT.

In another aspect of the invention, the DUT's microprocessor can "free-run", executing on-board programs (the board self-test in ROM, for example). The test system of the present invention then measures the DUT signals, with the measurement clock being either an external clock, a clock internal to the test system, or a DUT clock combined by the test system of the present invention with a qualifying signal to produce a measurement clock that is valid for the bus cycles of a particular microprocessor.

The above-noted and other aspects of the present invention will become more apparent from a detailed description of preferred embodiments when read in conjunction with the drawings.

BRIEF DESCRIPTION OF THE DRAWINGS

The invention will further be described by reference to the accompanying drawings which illustrate particular embodiments of an in-circuit test system in accordance with the present invention, wherein like members bear like reference numerals and wherein:

FIGS. 3A–3R are schematic diagrams of the Pod 30 illustrated in FIG. 2, wherein FIGS. 3M–3O illustrate a relay within the Pod and FIGS. 3P–3R illustrate a self-test circuit within the Pod;

FIGS. 15A–15F illustrate in flow chart form the "draw one waveform" subroutine 337 of the update events routine 336 illustrated in FIG. 12;

FIG. 16 illustrates in block diagram form the waveform file format used in the test system 26 of the present invention;

FIG. 21 illustrates in block diagram form the actions of the interpreter 282*b* (illustrated in FIG. 9) during the process of using the "micro-run" feature 283.

DESCRIPTION OF A PREFERRED EMBODIMENT

Overview of the System 26

Figure 1:
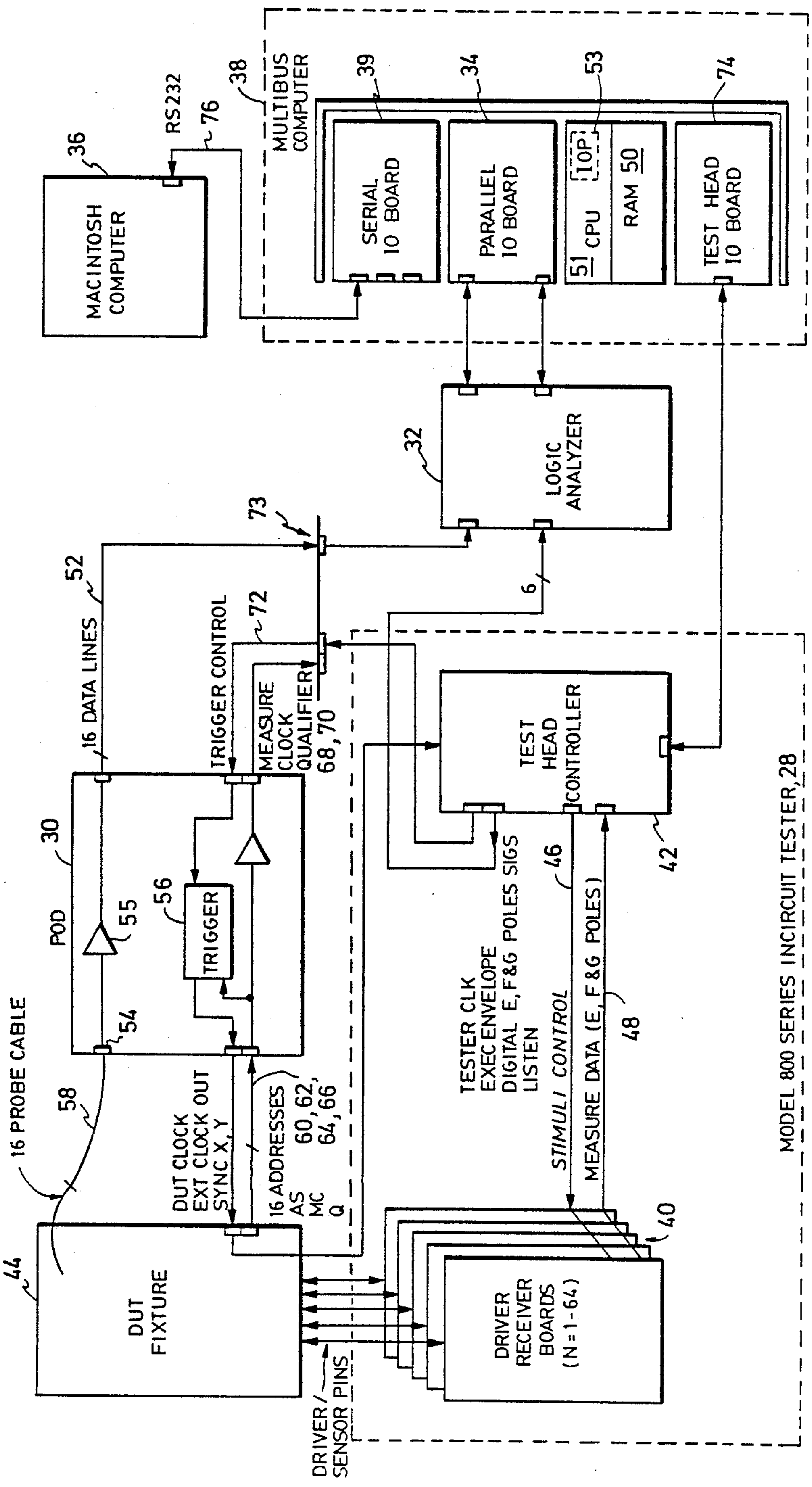
FIG. 1 is a block diagram showing an overview of the test sytem 26 according to the present invention.

FIG. 1 illustrates in a block diagram form the preferred embodiment of the In-Circuit Test System 26 of the present invention. The hardware of the invention plugs into a "model 800 series" tester 28 by Zehntel (the assignee of the present application), Walnut Creek Calif., using portions of the existing tester and new assemblies to perform its function. The new assemblies are a Data Pod 30, a Logic Analyzer printed circuit board 32, a Parallel IO Board 34, and a standard MACINTOSH TM (Macintosh is a trademark licensed to Apple Computer, Inc.) PLUS computer 36. Existing assemblies are a Multibus Computer 38, Driver Receiver Boards 40, Test Head Controller 42, and a DUT Fixture 44, some of which are disclosed in Zehntel's manuals for the 800 series testers, in U.S. Pat. No. 4,216,539, issued Aug. 5, 1980 to Raymond et al., and in U.S. Pat. No. 4,339,819, issued July 13, 1982 to Jacobson. These patents are incorporated herein by reference. The Test Head Controller (THC) 42 was modified, however, to provide signals to and from the new assemblies.

A DUT Fixture 44 is a "Bed of Nails" fixture, in which a spring-loaded probe contacts a printed circuit board Device-Under-Test (DUT) at each unique circuit node or connection. These probes are wired to a test connection (pin) on one of the Driver Receiver Boards as required to test the DUT. A digital driver capable of applying a programmed stimulus, a means for connecting the test pin to a stimuli bus 46, and a means for connecting the test pin to a measurement bus 48 (E, F & G Poles) exists on each test pin of each Driver Receiver Board. These are used for stimulating and measuring the DUT during a test.

The standard part of the Test Head Controller 42 provides the Driver Receivers 40 the control signals necessary to stimulate the DUT, and has the measurement signature analyzers which accumulate the clock-by-clock response, from the DUT, to the test stimuli. The Multibus Computer 38 controls the whole test system 26 by using conventional IO boards on the computer bus. A serial I/O board 39 lets the Macintosh computer 36 talk to the multibus computer 38. A test program is executed from its memory 50, containing a series of stimuli, tester control commands and expected DUT responses. A central processing unit (CPU) 51 of the computer 38 includes an I/O processor 53.

The Test Head Controller generates the following signals required by the Logic Analyzer 32. A TESTER CLOCK signal is a Test Head Controller 42 measurement clock and allows the Logic Analyzer to measure at the same time the THC 42 does. Signals E, F, and G are the digitized data from the Driver Receiver measurement inputs, which can be recorded by the logic analyzer. A LISTEN signal on a THC 42 control line qualifies which TESTER CLOCKS are used to accumulate measurements. The Logic Analyzer 32 can also record this signal along with measurement data. An EXEC ENVELOPE (Execution Envelope) is a THC signal which tells the Logic Analyzer 32 when the tester 28 is running a test, thus enabling the analyzer 32.

The Logic Analyzer Board 32 is controlled by the Parallel IO Board 34 added to the Multibus Computer 38. Logic analyzer 32 records, in a high speed RAM 50, measured data from the DUT. The data comes from the three measurement poles E,F, and G and from the Test Head Controller LISTEN signal, or from 16 high-speed lines 52. The Data Pod 30 buffers sixteen probes from the DUT to the lines 52. The captured data is read back via the Parallel IO 34 into the multibus computer 38 for analysis, storage or display.

The Data Pod 30 contains 16 buffered probe inputs 54, which act as logic analyzer inputs, and also a 16 bit trigger circuit 56. Usually, a Probe cable 58 connects to the pod 30 to allow clips to access 16 nodes on the DUT for test verification or debug, but the inputs 54 could be hard wired to test pins allowing a small number of measurement lines of higher speed than the Driver Receiver board inputs to be used in actual testing by the logic analyzer under control of a test program. The trigger circuit 56, via sixteen address lines 60 and an address strobe line 62, generates a pair of pulses (SYNC x or START SYNC and SYNC y or STOP SYNC) which go through the DUT FIXTURE interface 44 to the Test Head Controller 42. These SYNC lines 60 and 62 allow the DUT, via the Trigger circuit 56, to tell the Test Head Controller 42 when to measure based on the LISTEN signal mentioned above and when not to, during the execution of a test. Pod 30 control registers buffer and select DUT signals on an MC line 64 and a Q line 66 to become the MEASURE CLOCK and QUALIFIER signals on a MEASURE CLOCK line 68 and a QUALIFIER line 70, respectively. The MEASURE CLOCK and QUALIFIER signals allow the DUT to actually clock the measurement circuitry in the Test Head Controller 42 (and thus the Logic Analyzer 32 via the TESTER CLOCK signal), during the time between the START SYNC and STOP SYNC signals.

TRIGGER CONTROL lines 72 are a serial bus which allow the Test Head IO Board 74, via the Test Head Controller 42, to program the expected START and STOP trigger words, and other Pod control. A test jack panel 73 connects the Pod 30 to the Test Head Controller 42 and the Logic Analyzer 32. More specifically, referring now to FIGS. 18A, 18B, and 18C, the test jack panel 73 connects lines 52, 68, 70, and 72 to the test head controller 42 and the logic analyzer 32.

The Macintosh TM computer 36 is used as a terminal emulator, to display the Logic Analyzer 32 memory contents as waveforms, and to otherwise act as the means by which a user interacts with the tester. Waveforms can also be created on the Macintosh, converted into test language stimuli and executed by the Multibus computer. Logic Analyzer measured data may be displayed, edited, and converted into test stimuli and/or expected responses and executed, rerecording the results. The Macintosh 36 connects to the Multibus computer 38 via an RS232 interface 76. Those skilled in the art will understand that the present In-Circuit Test System invention is not limited to using a Macintosh computer. Rather, applications programs may be written for a general purpose computer to provide a user interface that gives to the user the above-described functionality of recording, displaying, and editing test data, converting the data into test stimuli, executing the test, and rerecording the test data.

FIGS. 20A–20G illustrate in a schematic diagram form the interconnection of the Test System 26 illustrated in FIG. 1.

Hardware: The Data Pod 30

The Data Pod 30, in conjunction with the Test Head Controller 42, supports the "Micro-run" testing portion of the In-Circuit Test System of the present invention. Micro-run is a scheme of testing microprocessor-based boards in which the board tester 28 provides a minimum set of stimuli (RESET for example) to the device under test (DUT) and allows the DUT to run its bootstrap firmware. While the DUT is running (thus micro-running), the tester 28 establishes a measurement window, the beginning and end of which coincides with two bus events specified by the user.

During this measurement window, one or more clock-like signals from the DUT are combined and gated to clock the measurement circuit in the Test Head Controller 42.

Figure 2:
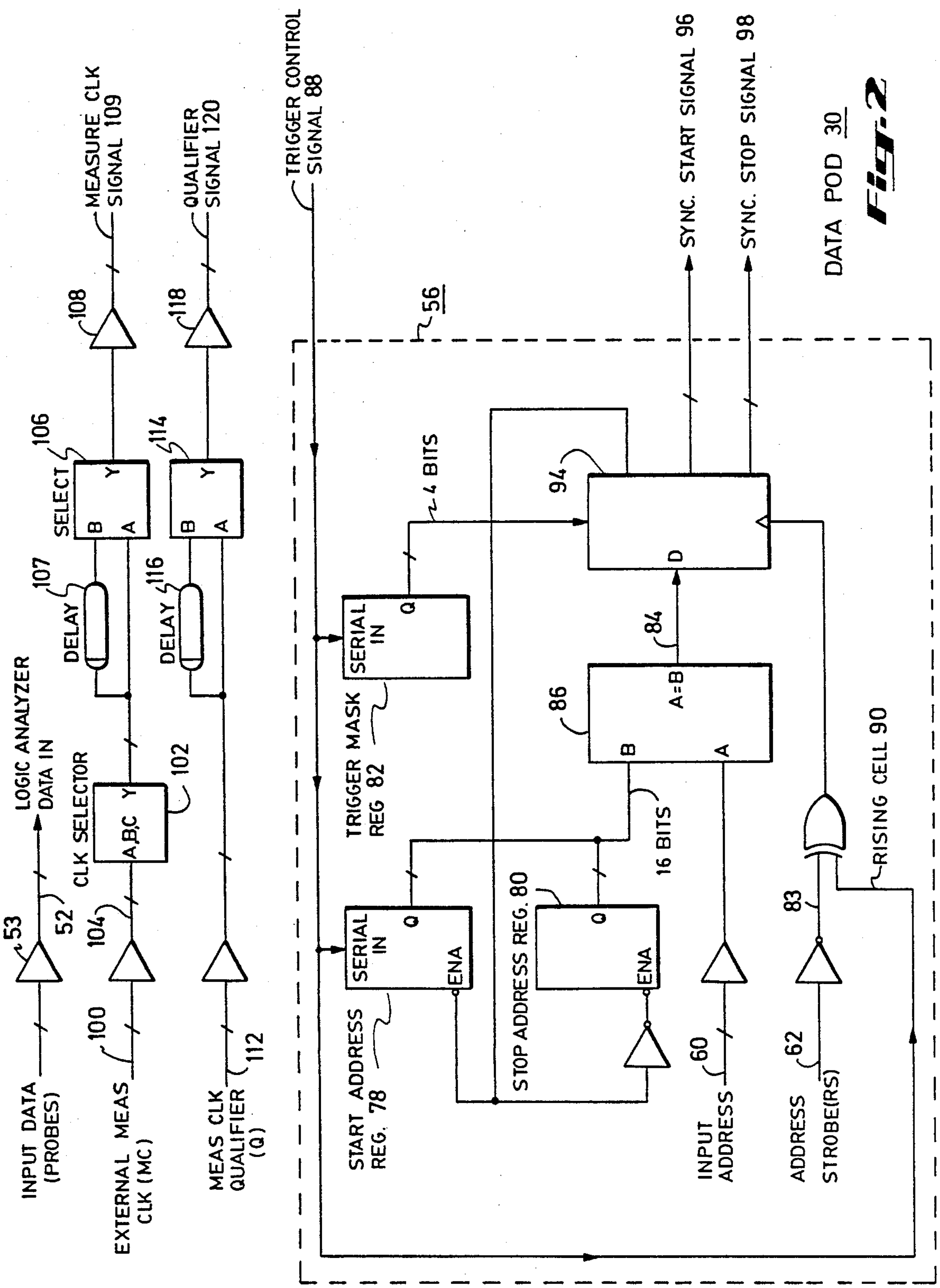
FIG. 2 is a block diagram of the Data Pod 30 illustrated in FIG. 1.

Referring now to FIG. 2, the Trigger Circuit 56 and other elements of the present invention in the Data Pod 30 are illustrated in a block diagram. START ADRS REG 78, STOP ADRS REG 80, and TRIGGER MASK REG 82 are serially loaded registers. The START ADRS REG 78 and the STOP ADRS REG 80 are loaded with start and stop addresses which will be sought one at a time beginning with the start address. The TRIGGER MASK REG 82 contains four-bit information, and each bit will specify whether the low eight bits of the start address, the high eight bits of the start address, the low eight bits of the stop address, and the high eight bits of the stop address can be ignored while searching for a match.

The sixteen Input Address lines 60 are attached to the DUT bus lines on which events are to be monitored.

The Address Strobe (AS) line 62 is attached to the DUT. The DUT, via the AS line 62 generates a validity strobe 83 of an event on the bus. The validity strobe 83 is used to latch a "Match Found" signal 84 from a comparator block 86.

As a part of a Trigger Control signal 88 from the Test Head Controller 42, a Rising Sel signal 90 speciiies the asserting edge of the validity strobe 83.

In response to the validity strobe 83 and the "Match Found" signal 84, a comparator block 94 generates a SYNC START signal 96 when the start event is found, and generates a SYNC STOP signal 98 when the stop event is found. These signals 96, 98 go to the Test Head Controller 42 to start and end the measurement window.

One to three DUT signals suitable for measurement clock use are connected to any of three External Meas Clk inputs 100. Prior to measurements, the user selects with a clock selector 102 one of three clock signals 104 as a clock source. Using a time selector 106, the user selects either a signal delayed 120 ns by a time delay 107 or a straight signal, which is then buffered by a buffer 108 to the Test Head Controller 42 as a Measure Clk signal 109.

A DUT signal which can conditionally assert or negate the signal at the External Meas Clks inputs 100 is transmitted to a Meas Clk Qualifier clock input 112. Using a time selector 114, the user selects either a signal delayed 120 ns by a time delay 116 or a straight signal, either of which is then buffered by a buffer 118 to the Test Head Controller 42 as a Qualifier signal 120.

A buffer 55 buffers data/trigger capture signals on the cable 58 from the DUT fixture 44 and transmits those signals to the Logic Analyzer 32 on the sixteen data lines 52.

A summary of the operations of the Data Pod 30 related to Micro-run is as follows:

a. The Data Pod accepts and stores START and STOP addresses and then seeks them out on the DUT bus during the test. When the START address is found, the Data Pod generates the SYNC START signal 96 to start the measurement window, and when the STOP address is found, the Data Pod generates the SYNC STOP signal 98 to stop the measurement window.

b. The Data Pod buffers three external measurement clock inputs, selects one from the three, inserts a time delay if so programmed, and buffers out the Measure Clock Signal 109 to the Test Head Controller 42.

c. The Data Pod buffers one measurement clock qualifier signal, inserts a delay if so programmed, and buffers out the Qualifier Signal 120 to the Test Head Controller 42.

For the Logic Analyzer 32, the Data Pod 30 buffers and sends sixteen measurement inputs from probes at the DUT Fixture to the Logic Analyzer.

Figures 3C, 3F, 3H:
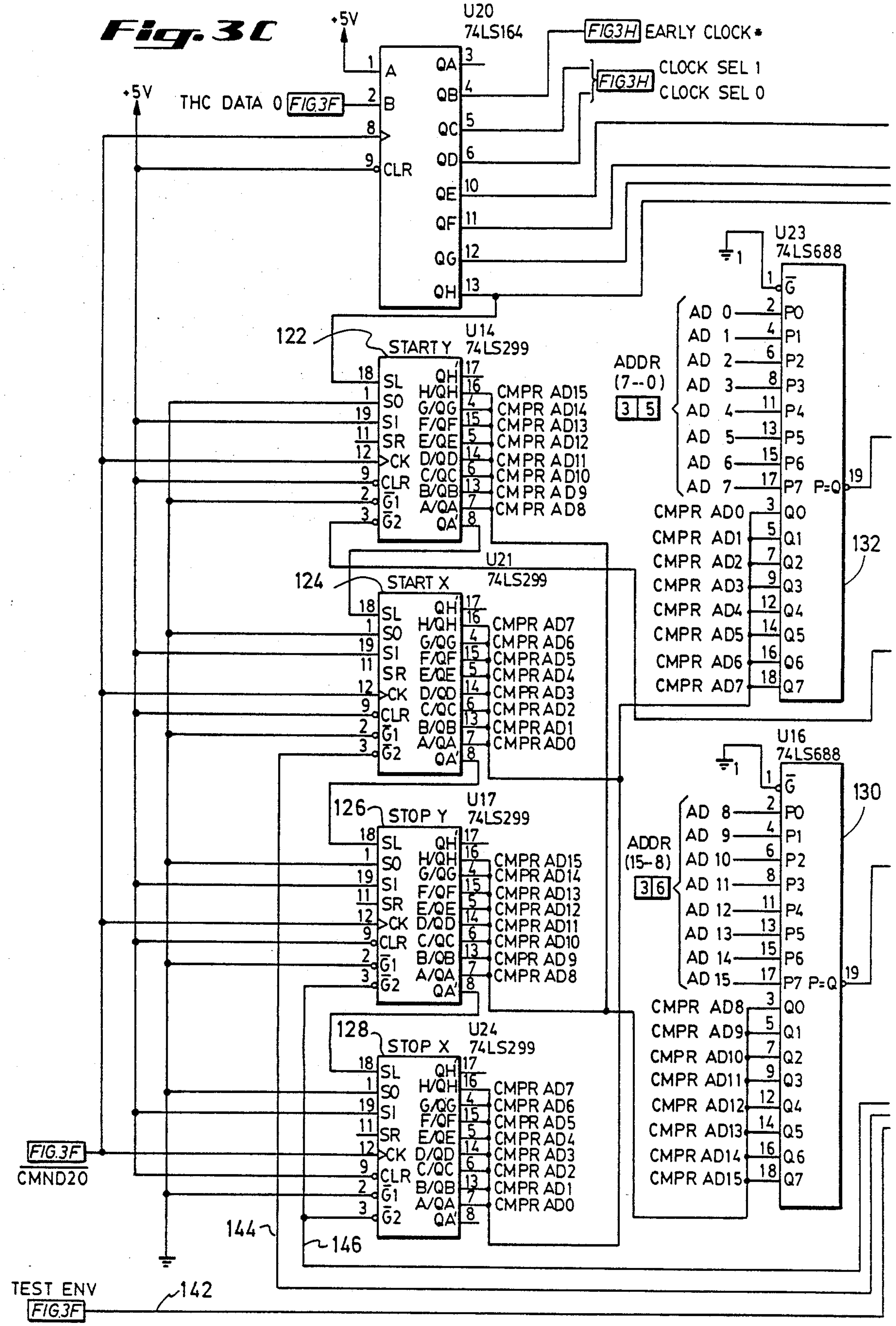
Figure 3D:
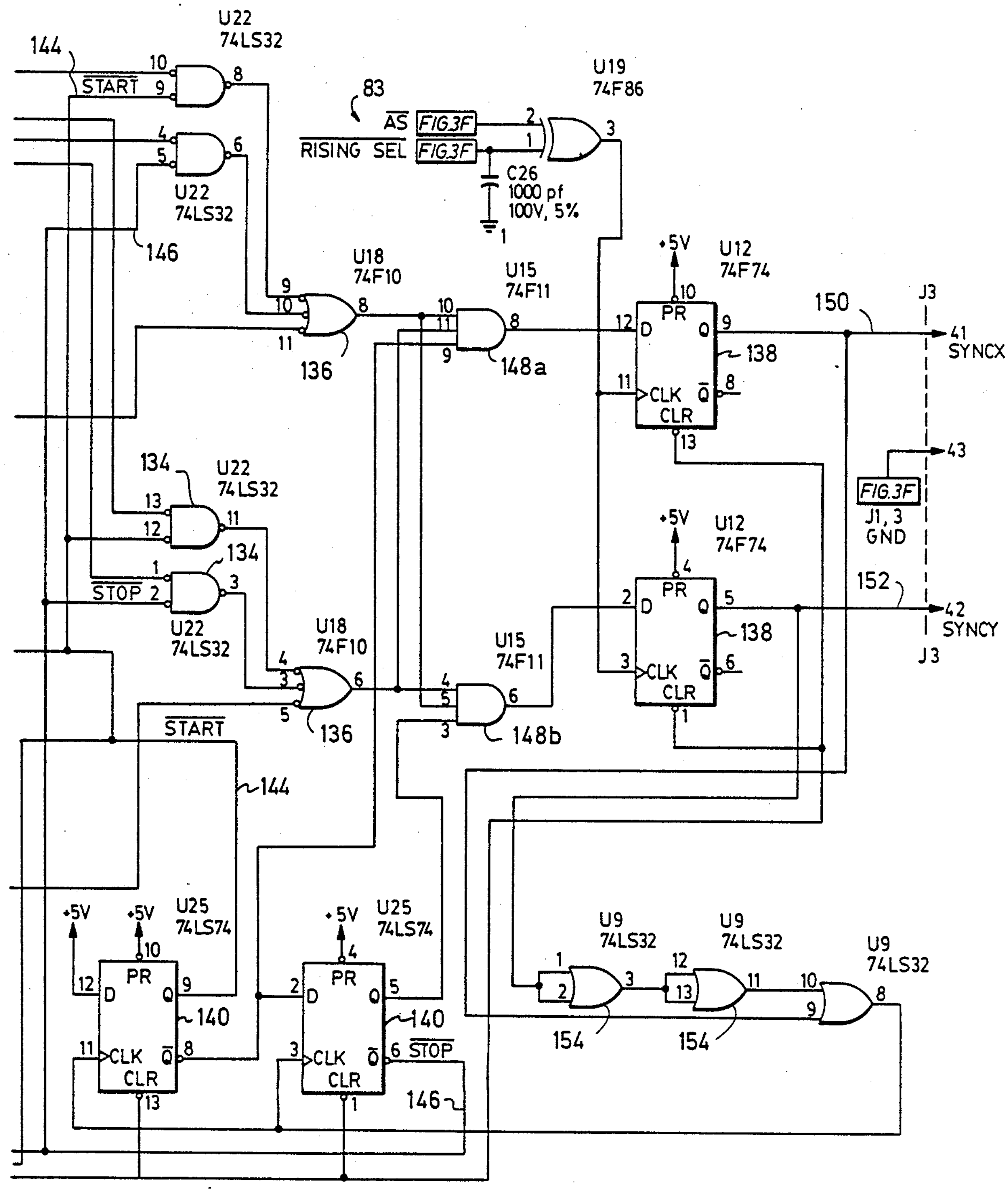
Figure 3E:
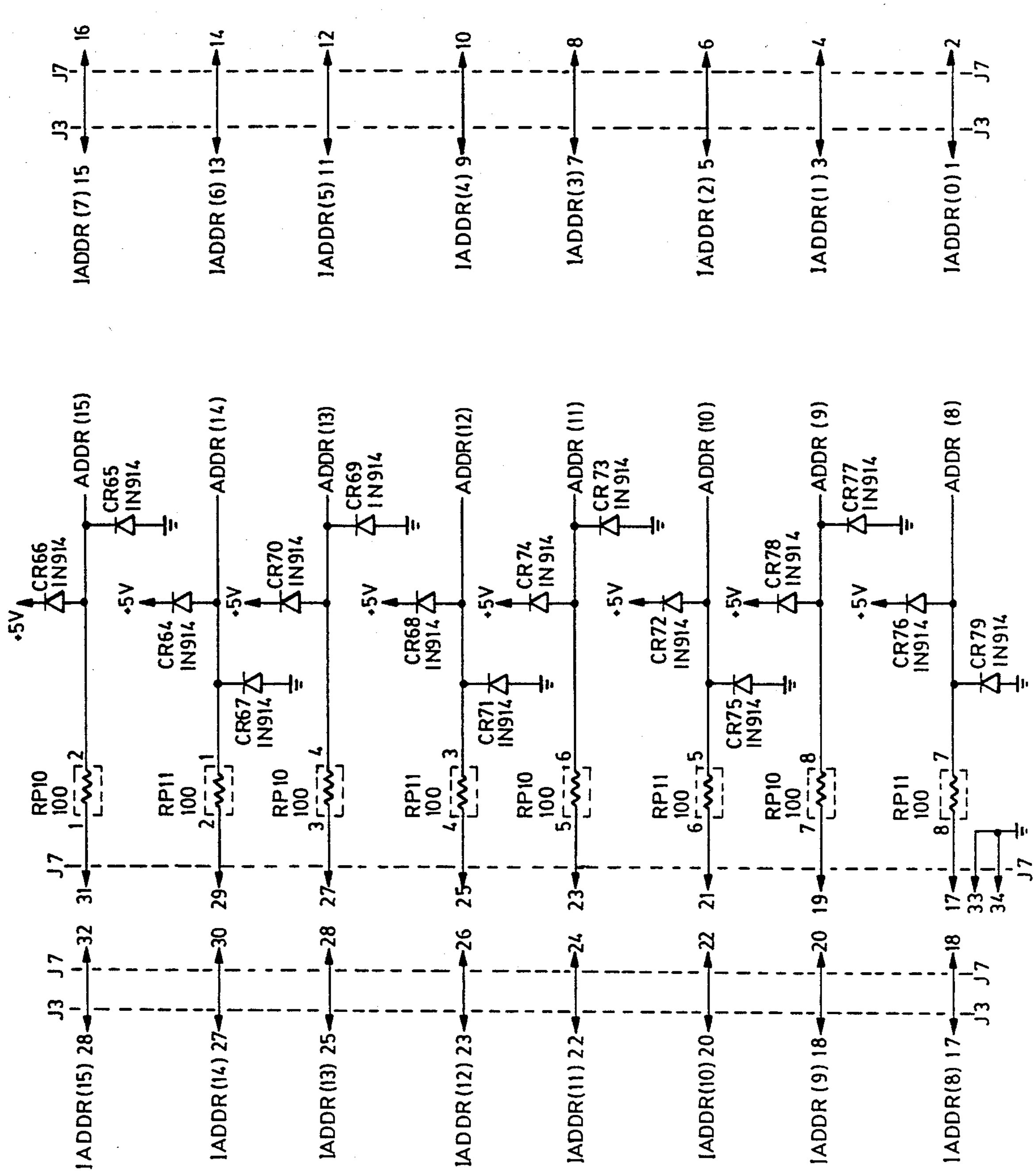
Figure 3F:
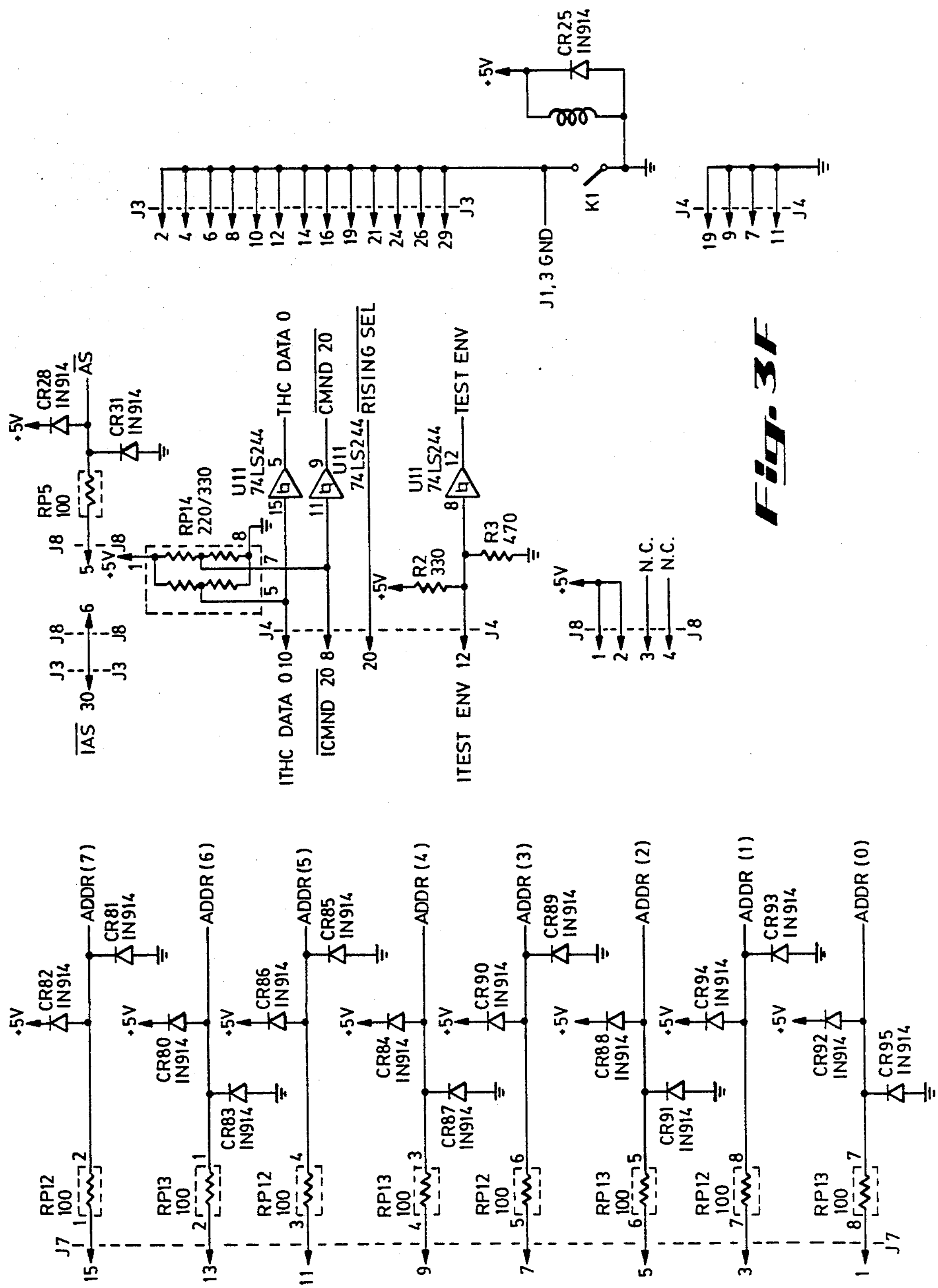
Figure 3G:
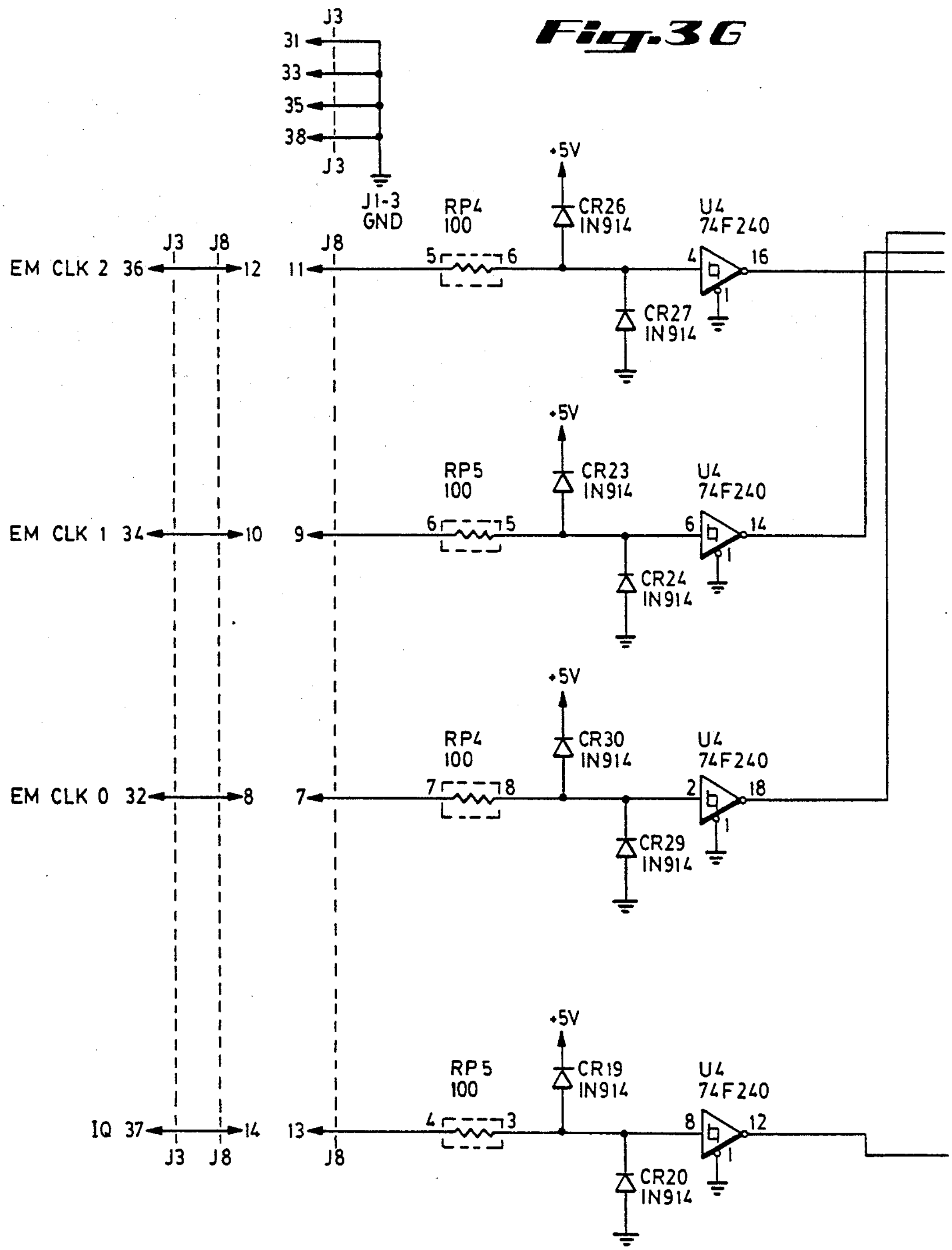
Figure 3H:
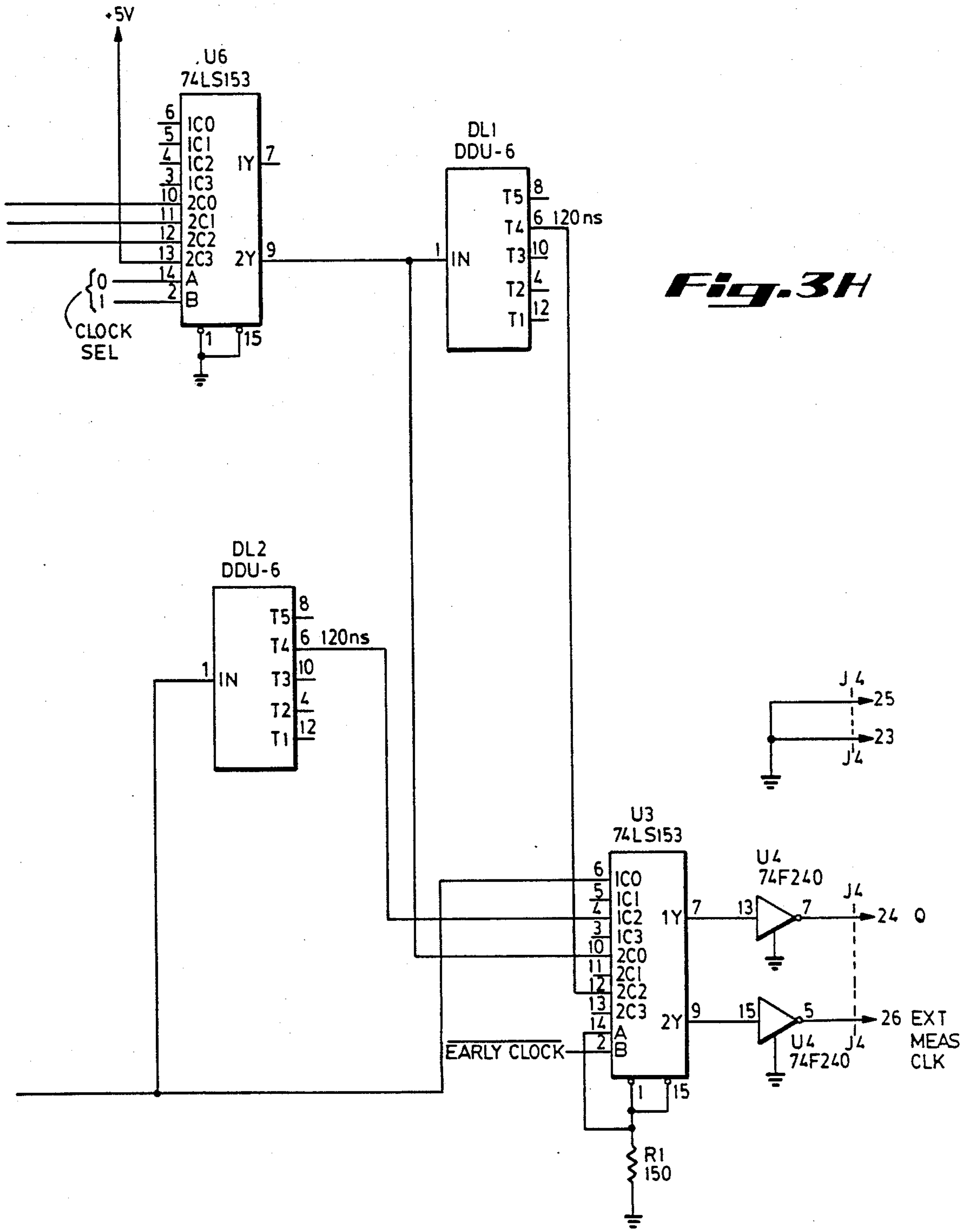
Figure 31:
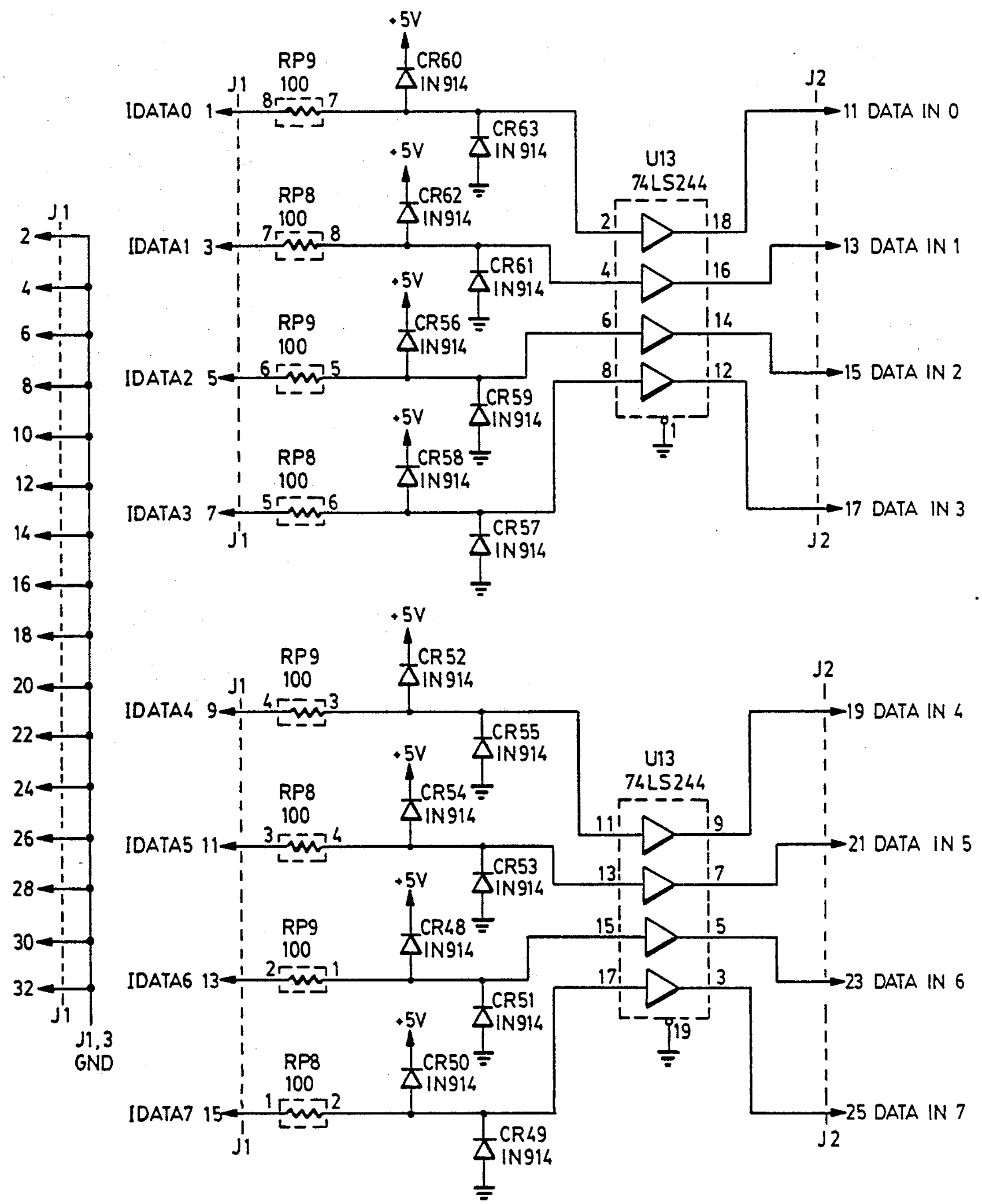
Figure 3J:
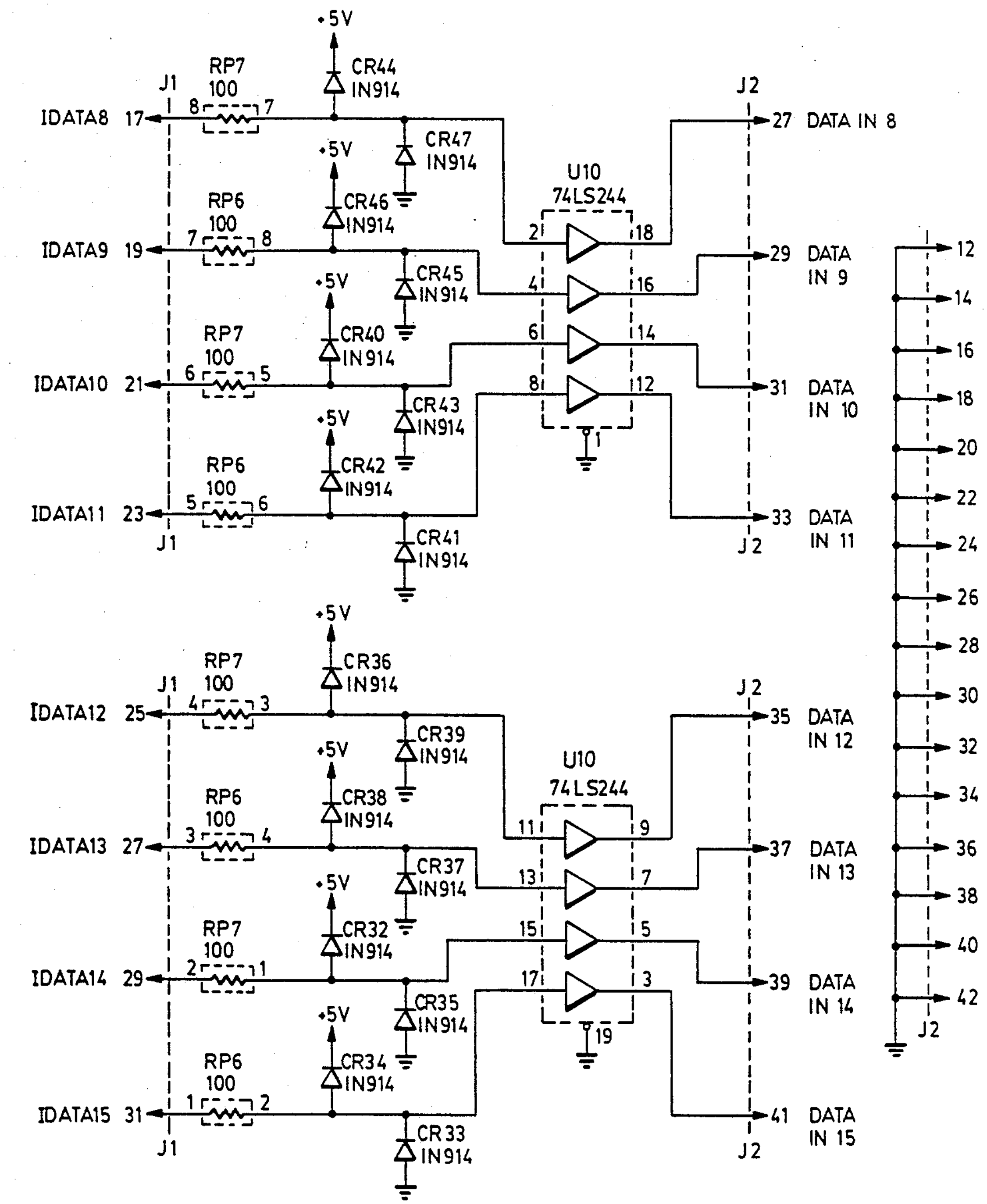
Figure 3K:
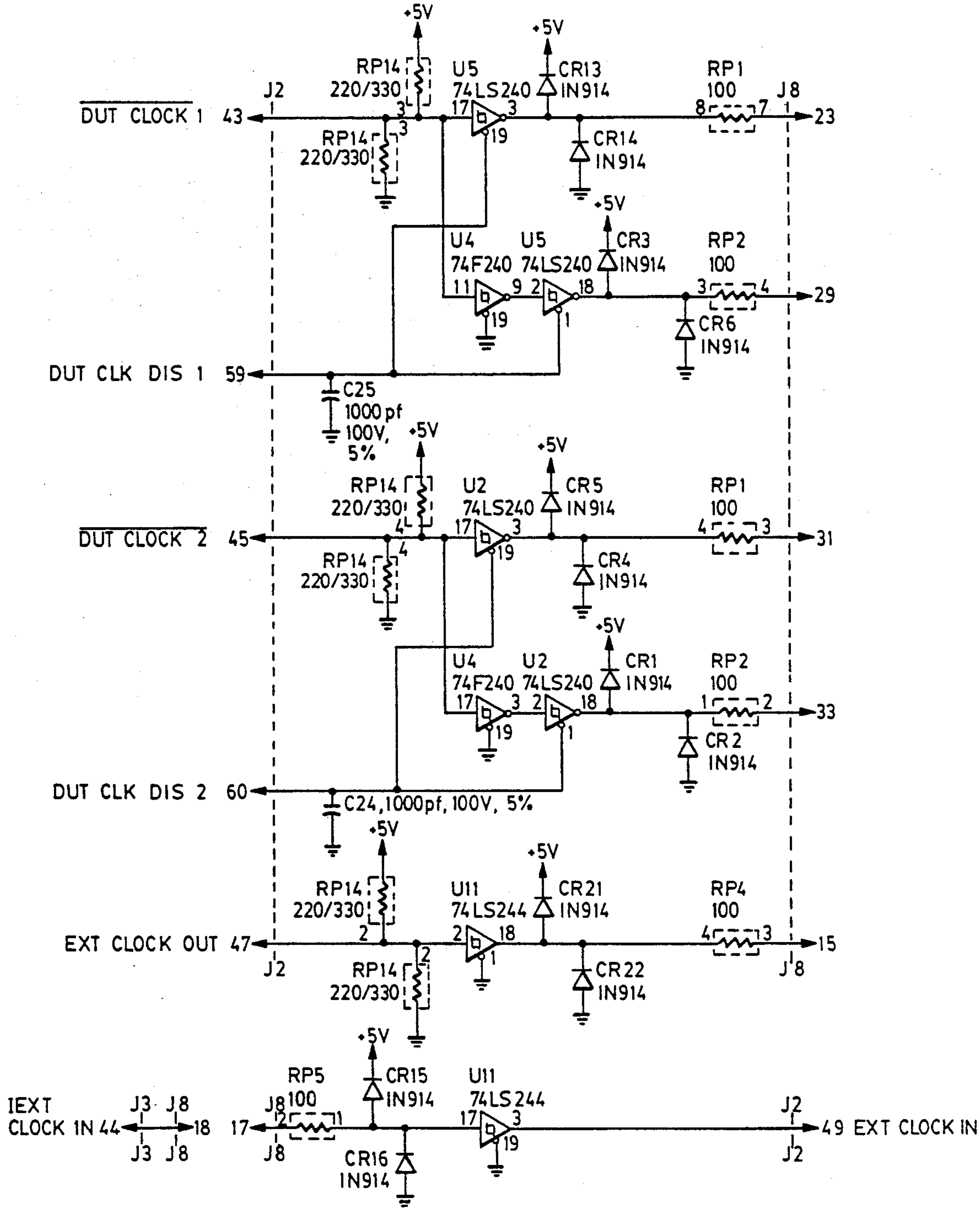
Figure 3L:
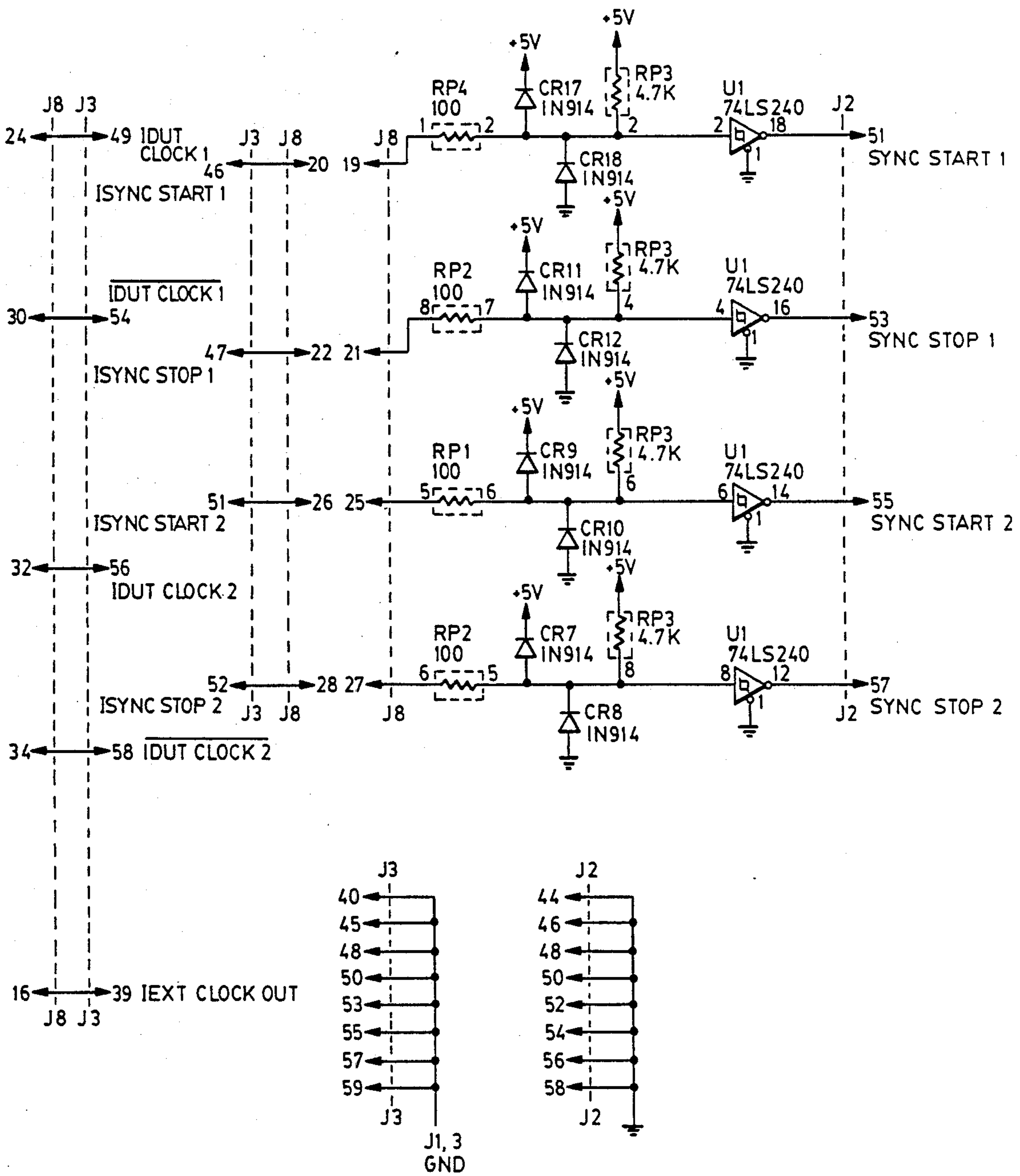
Figures 3M, 3N:
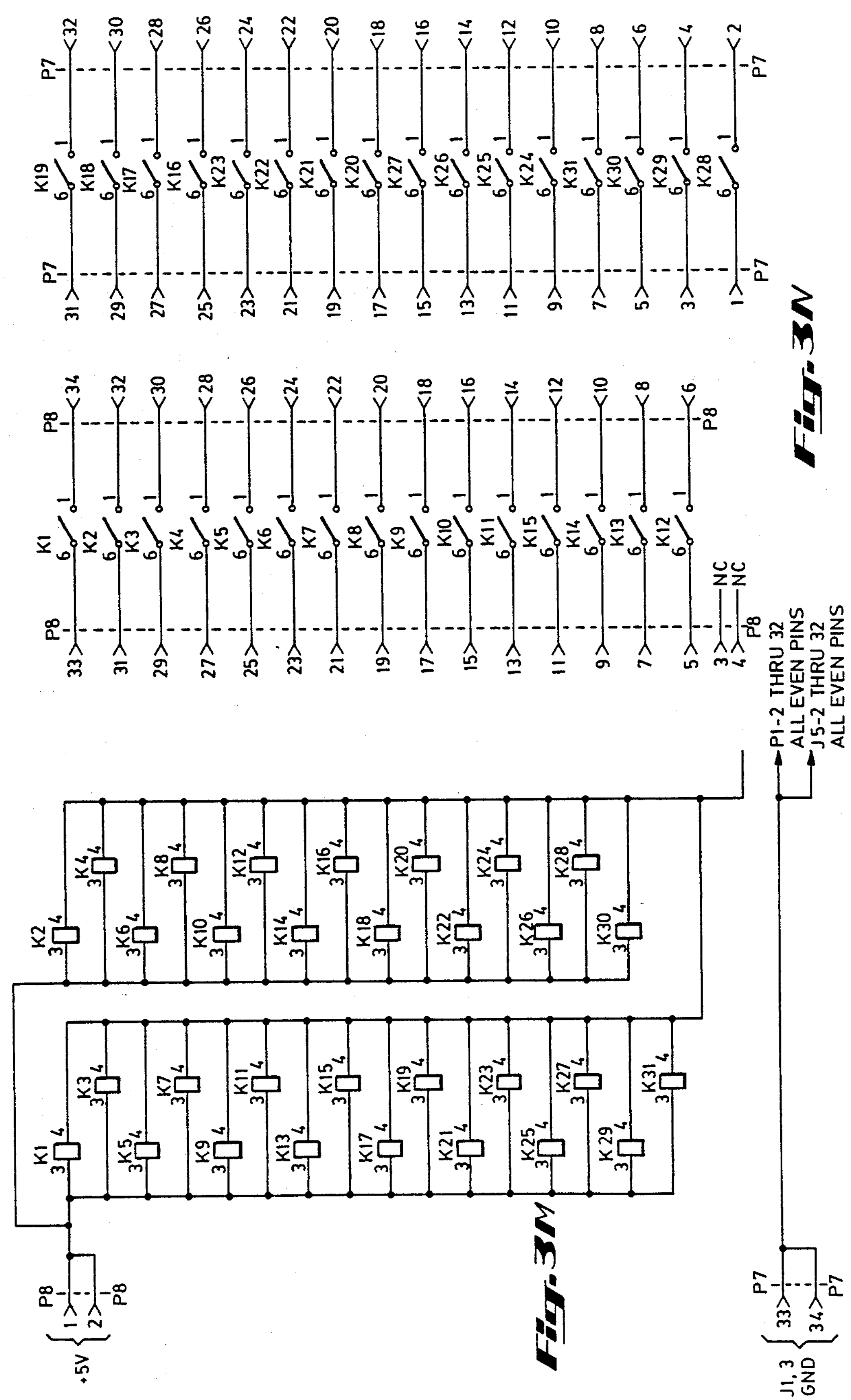
Figure 30:
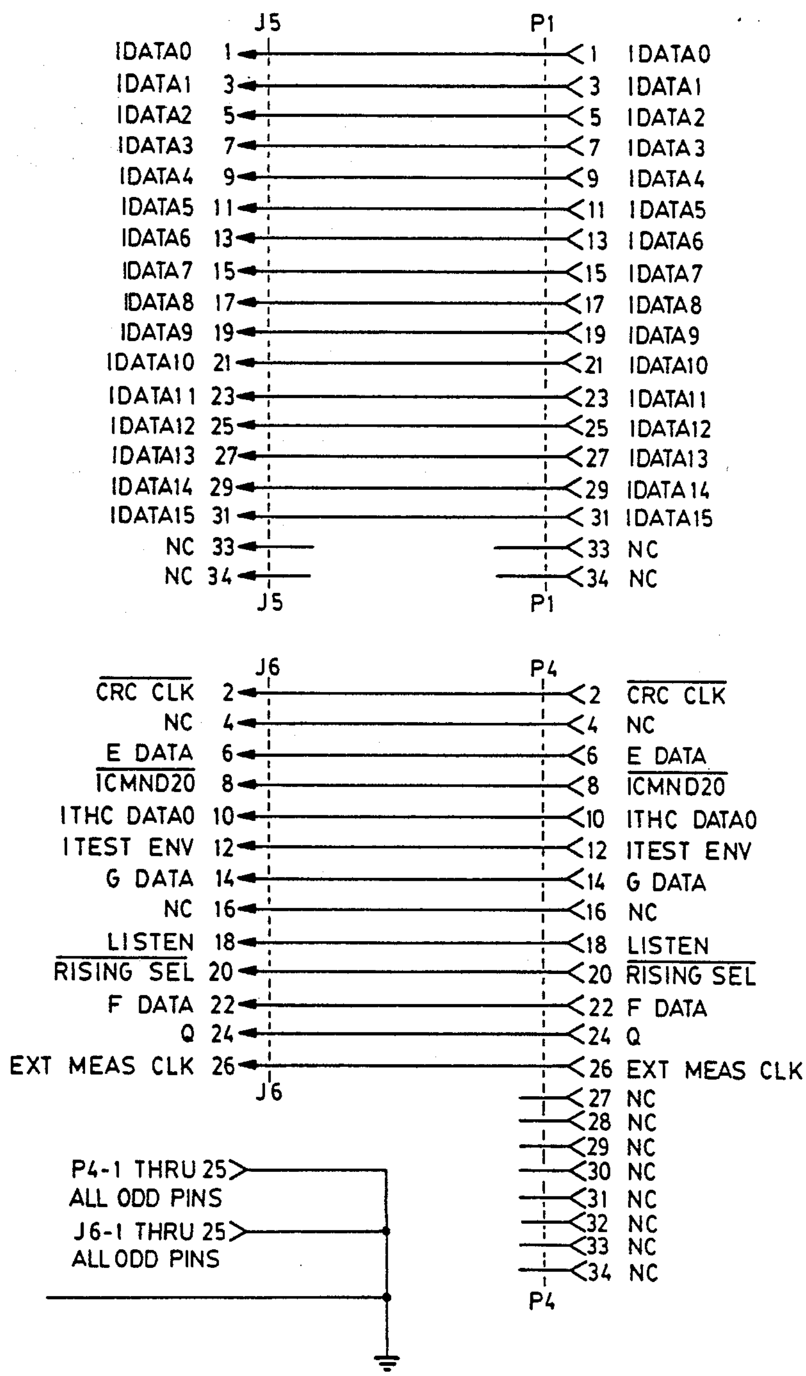
Figure 3P:
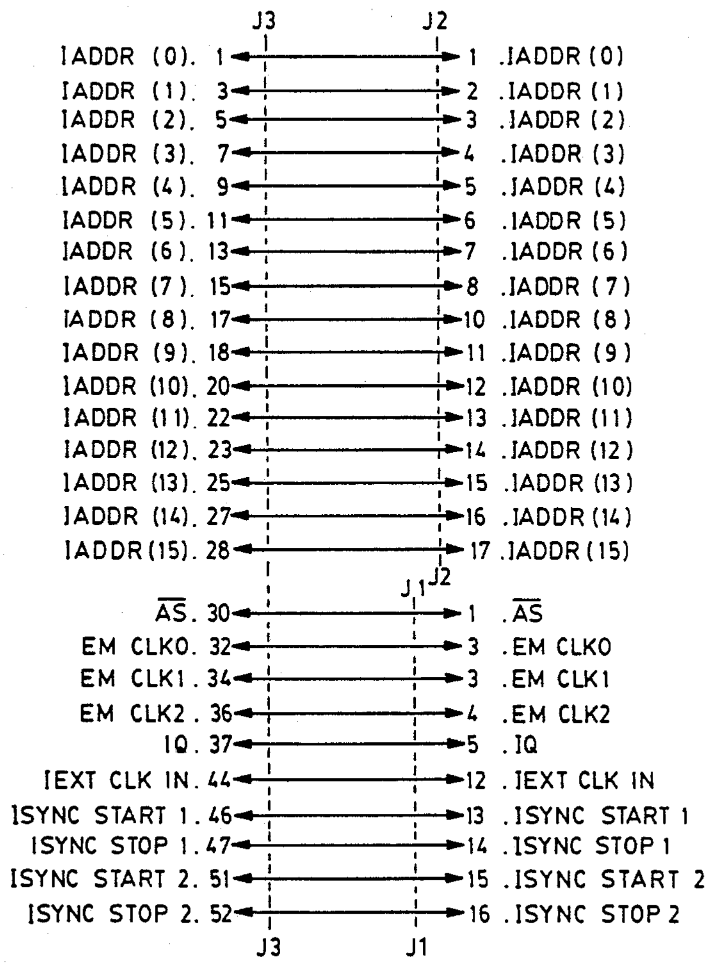
Figures 3Q, 3R:
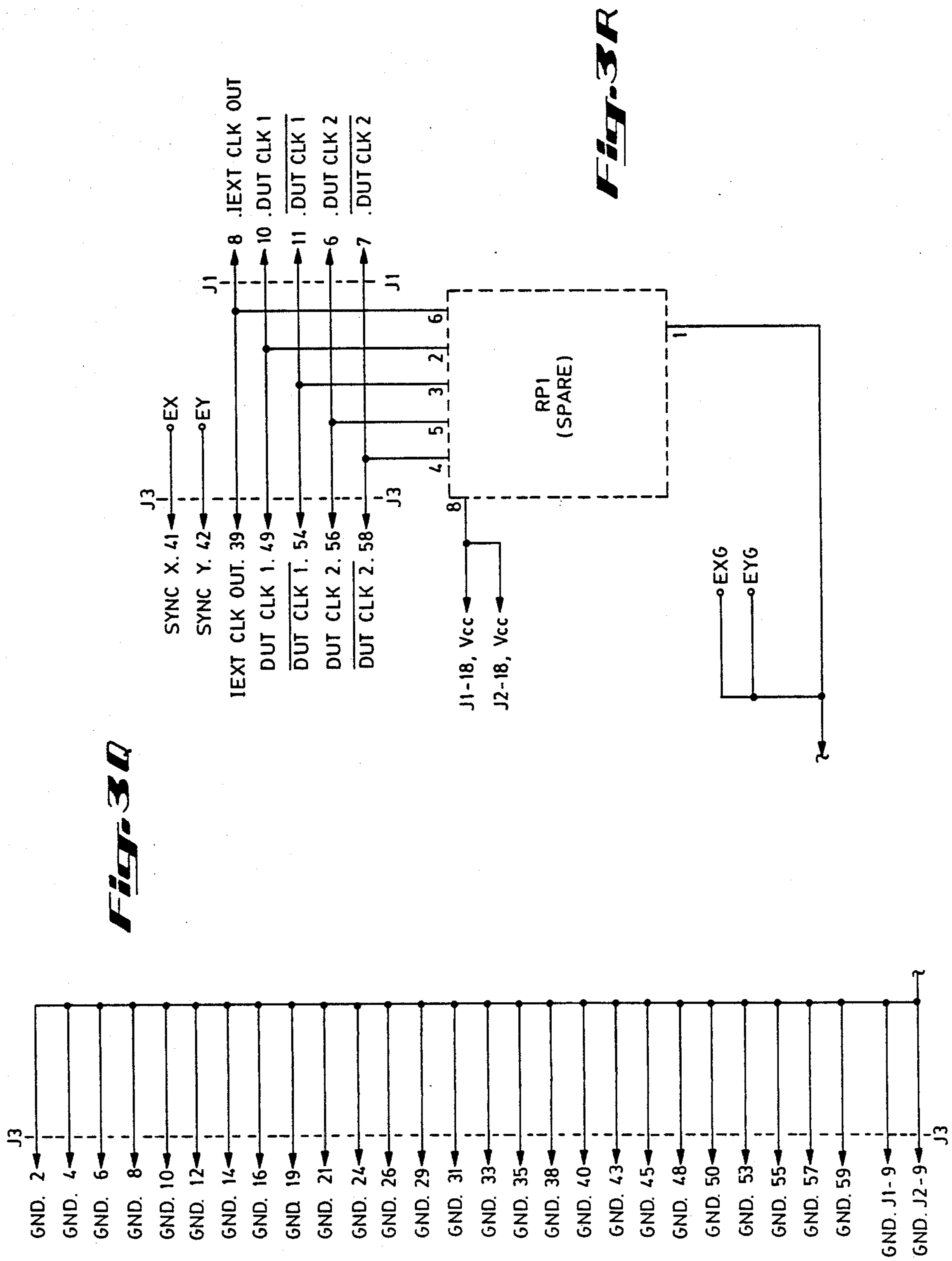
Figure 3S:
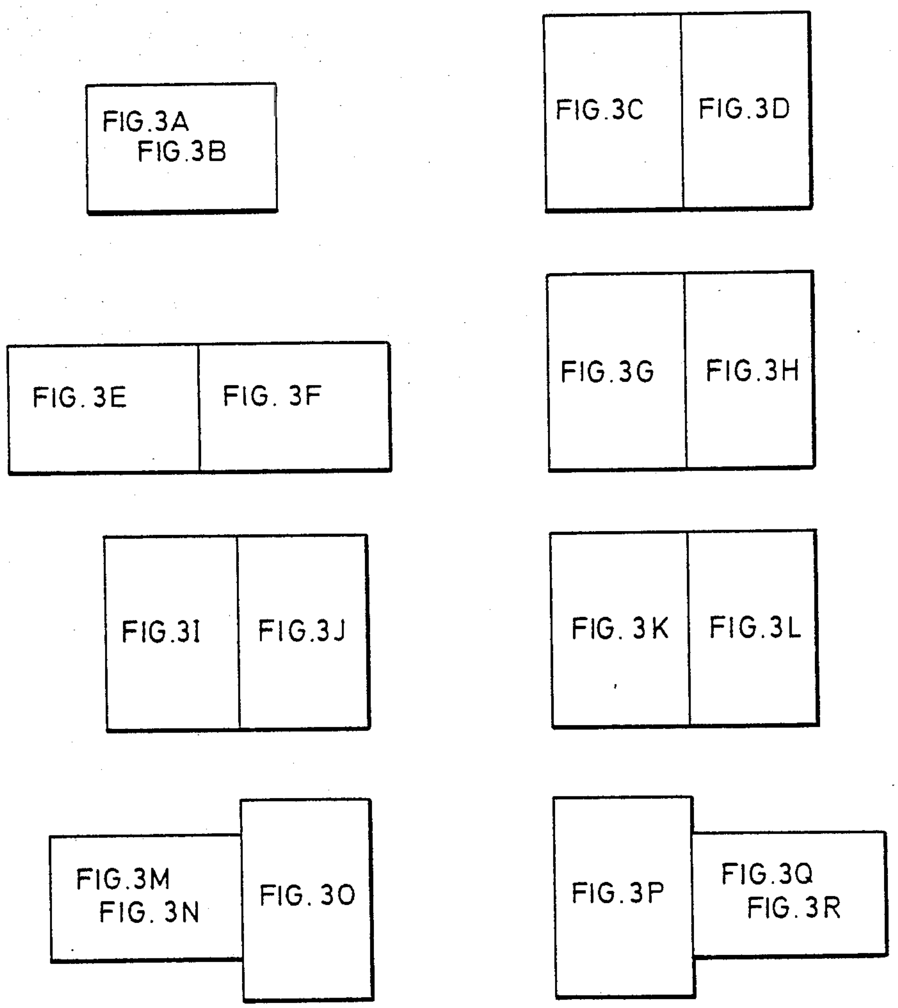
FIG. 3S illustrates in block diagram form how FIGS. 3A–3R fit together.

Referring now to FIGS. 3A–3L, the Data Pod 30 is illustrated in greater detail in schematic diagrams. FIG. 3M is a diagram indicating how FIGS. 3A–3L relate to each other. Referring now to FIGS. 3C and 3D, Shift Registers 122 and 124 form the start address register 78. Shift Registers 126 and 128 form the stop address register 80. Outputs of registers 122 and 126 are tied together, bit per bit, and go into a comparator 130 which is part of the comparator block 86 in FIG. 2. Outputs of registers 124 and 128 are tied together, bit per bit, and go into a comparator 132, which is part of the comparator block 86 in FIG. 2.

The other leg of the comparator block 86 (Addr 0–7 of the register 132 and Addr 8–15 of the register 130) is connected to the DUT. Pairs of gates 134 and 136 are compare block extensions. They recognize "DON'T CARE" conditions set by the user and appropriately filter through the match conditions. A pair of Flip-Flops, or latch, 138 latches the "Match Found" flag with a DUT supplied handshake signal. A pair of flip-flops or latch 140 controls the sequence of event search.

Prior to test, a ZERO on a TEST ENV line 142 resets the latch 138, and initializes the control flip-flops 140 so that the signal on a NOT-START line 144 is ZERO and the signal on a NOT-STOP line 146 is ONE. As the test begins, the TEST ENV line 142 goes ONE, releasing the reset on the flip-flops 138. With the signal on the NOT-START line 144 still ZERO and the signal on the NOT-STOP line 146 at ONE, output of the start address register 78 (shift registers 122 and 124) is enabled, and an impending match condition will be recognized by a pair of gates 148*a,b* as the start event and not the stop event. When the DUT produces an event that is being sought, the gate 148*a* goes ONE and this is clocked in by the accompanying NOT-AS signal generated from the DUT, causing the SYNC X line 150 to go ONE. A ONE on the SYNC X line 150 toggles the control flip-flop 140 so that NOT-START is now ONE and NOT-STOP is ZERO. This enables the stop address register 80 (the shift registers 126 and 128) and the next match is recognized as the stop event by the gates 148*a,b*. With the detection of the stop event, a ONE at the output of the gate 148*b* is clocked in by the NOT-AS validity strobe 83, thus generating a ONE on the SYNC Y line 152. A ONE on the SYNC Y line 152 toggles the flip-flop 140 once more and now both NOT-START and NOT-STOP are ONE. This prohibits any further detection of matching conditions by disabling the start and stop address registers and gates 148*a,b* until the test is over and the flip-flops 140 are reinitialized by a ZERO on the TEST ENV line 142. Gates 154 delay the SYNC X pulse to flip-flops 140 for the reason that without them if the start event and the stop event occur back to back, the flip-flop 140 clock input will remain at ONE, thus failing to toggle the flip-flop 140.

Hardware: Test Head Controller ("THC") 42

Figure 4:
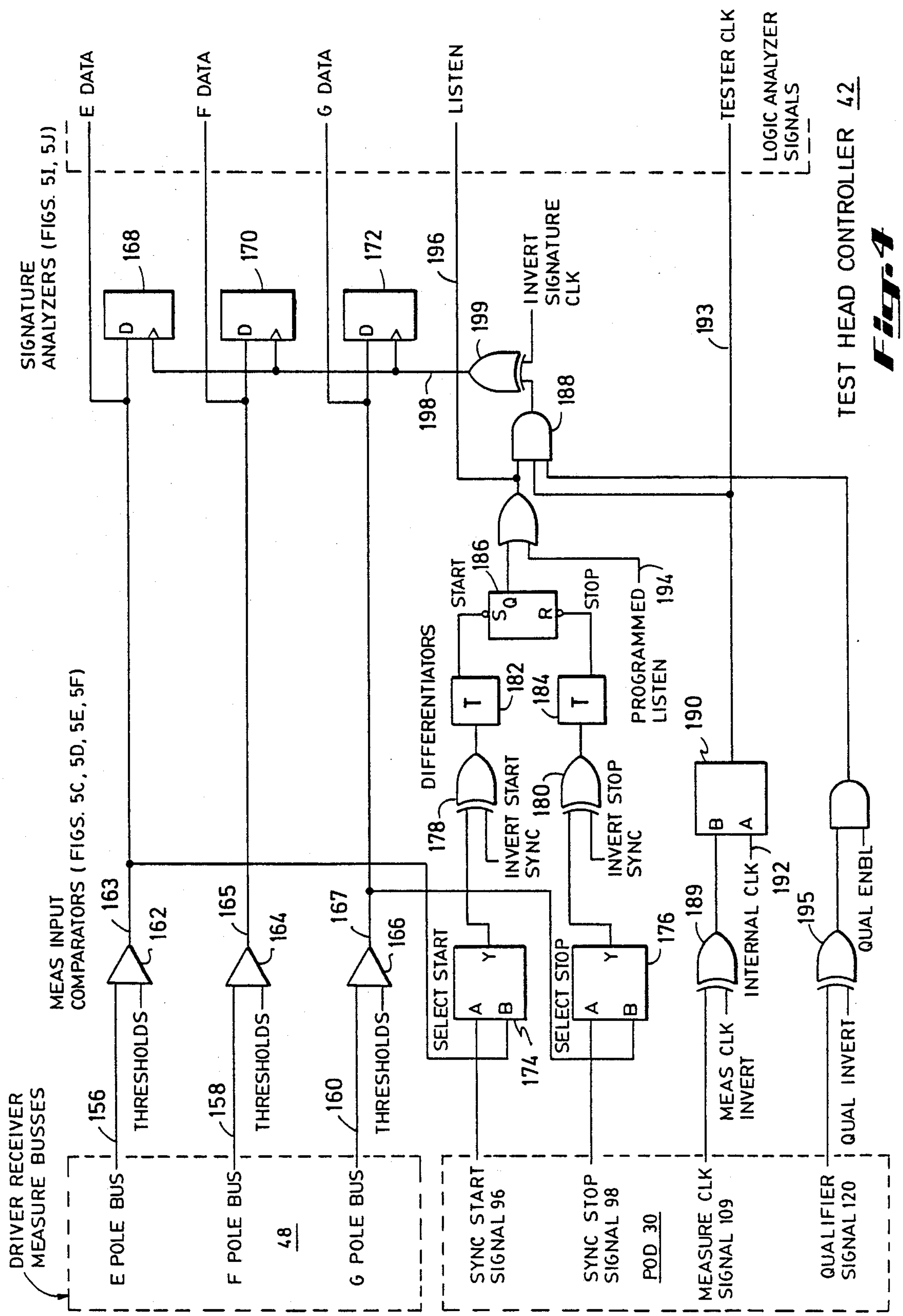
FIG. 4 illustrates in block diagram form the test head controller 42 of FIG. 1.

Referring now to FIG. 4, the Test Head Controller 42 is illustrated in a block diagram. The E POLE 156, F POLE 158, and G POLE 160 busses from the 800-series tester 28 back-plane are three "analog" signal busses which connect to each Driver Receiver Board 40. The Driver Receiver connects to the measured nodes of the DUT by a three-by-sixteen pole reed relay switch (sixteen test pins per Driver Receiver board). The measured signal is then switched to one of these busses directly or through a times-one buffer amplifier. The Measurement Input Comparator Circuits 162, 164, and 166 then compare the signals against analog thresholds, producing digital logic E, F, and G Pole signals 163, 165, and 167, respectively, from the analog ones. The digital signals 163, 165, and 167 then go to Signature analyzers 168, 170, and 172 on the THC and to the Logic Analyzer 32.

Figure 5A:
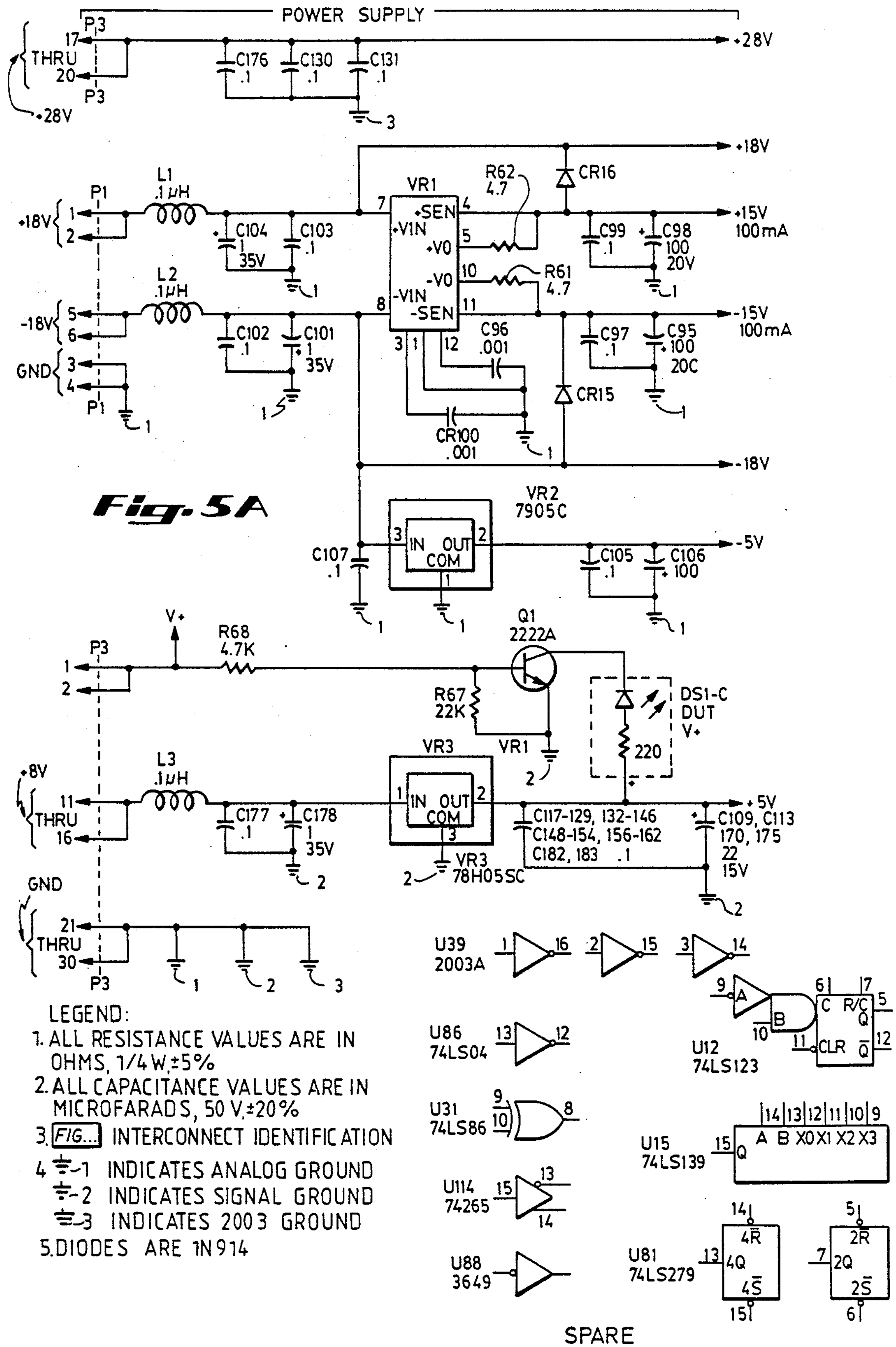
FIGS. 5A–5X illustrate in schematic diagrams the test head controller 42 of FIG. 4.
Figure 5C:
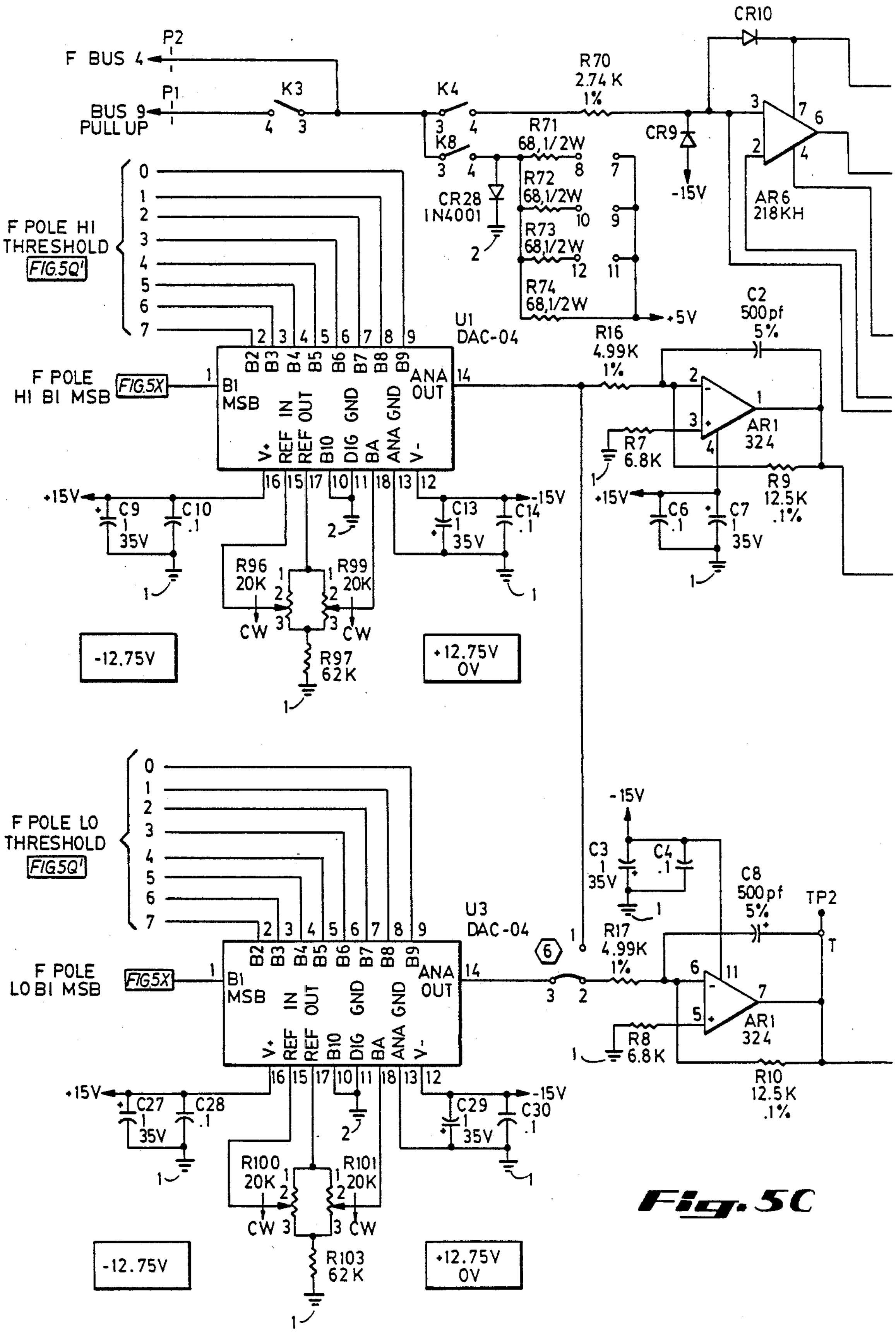
FIG. 5Y illustrates in block diagram form how FIGS. 5A–5X fit together.
Figure 5D:
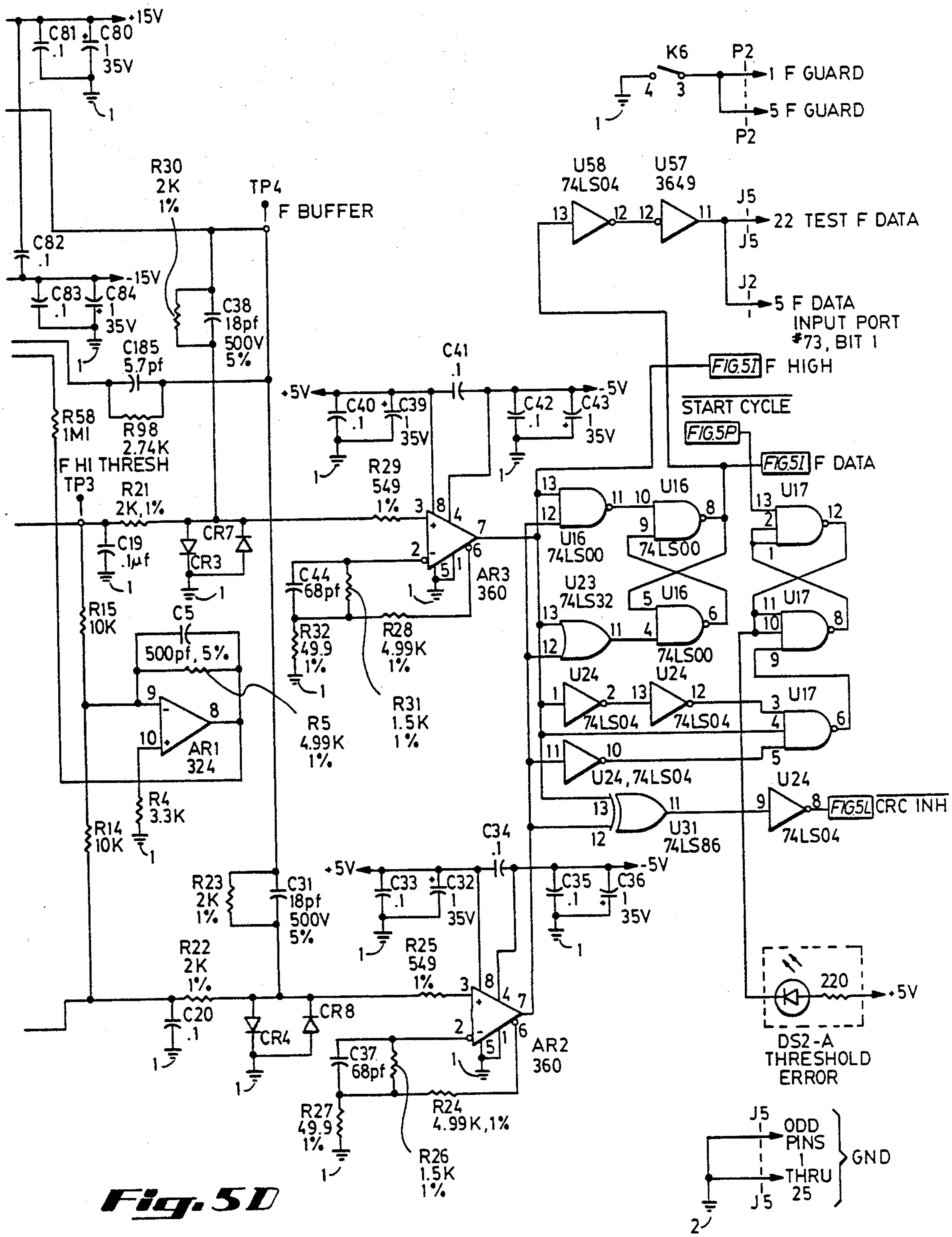
Figure 5E:
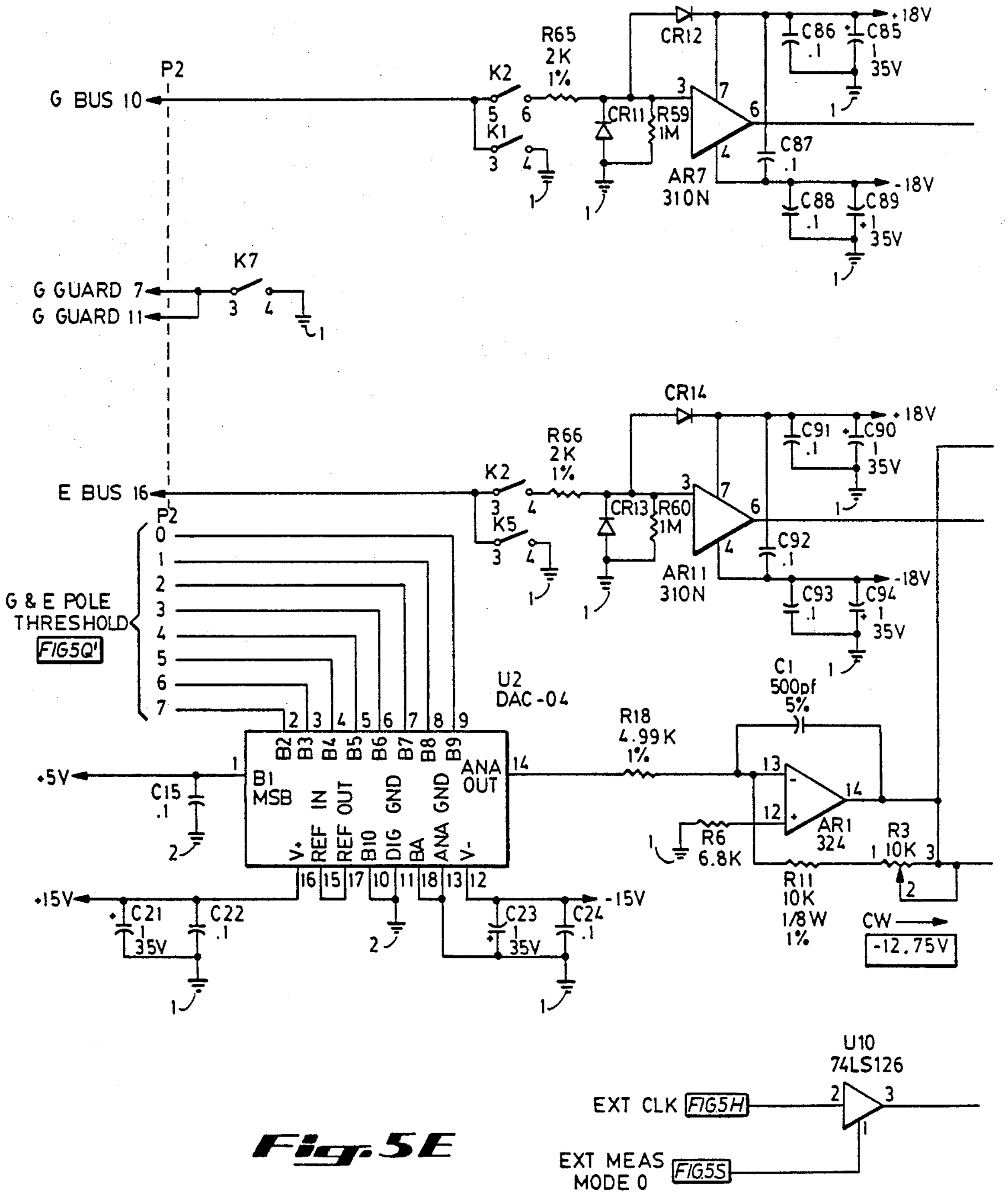
Figure 5F:
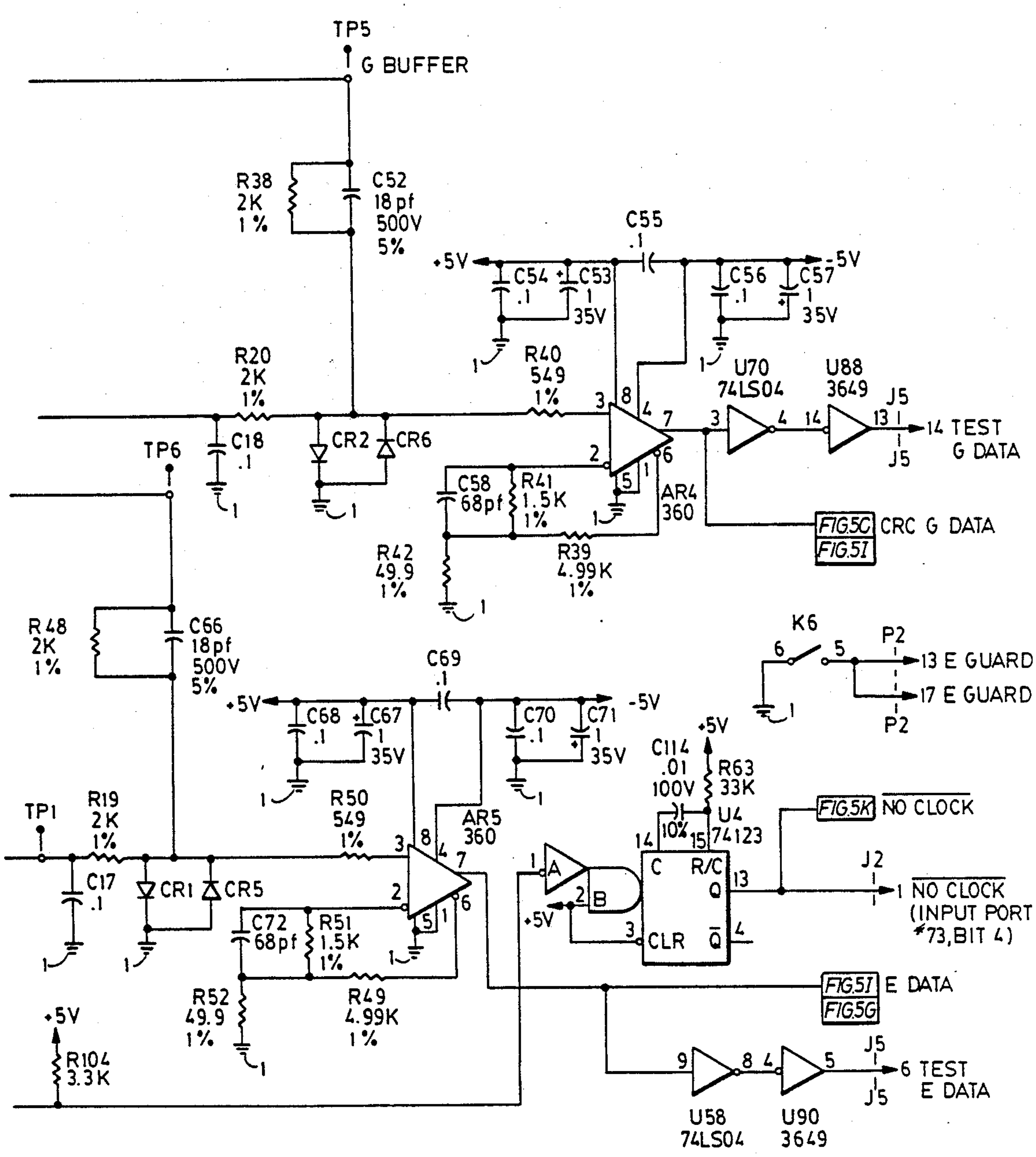
Figure 5G:
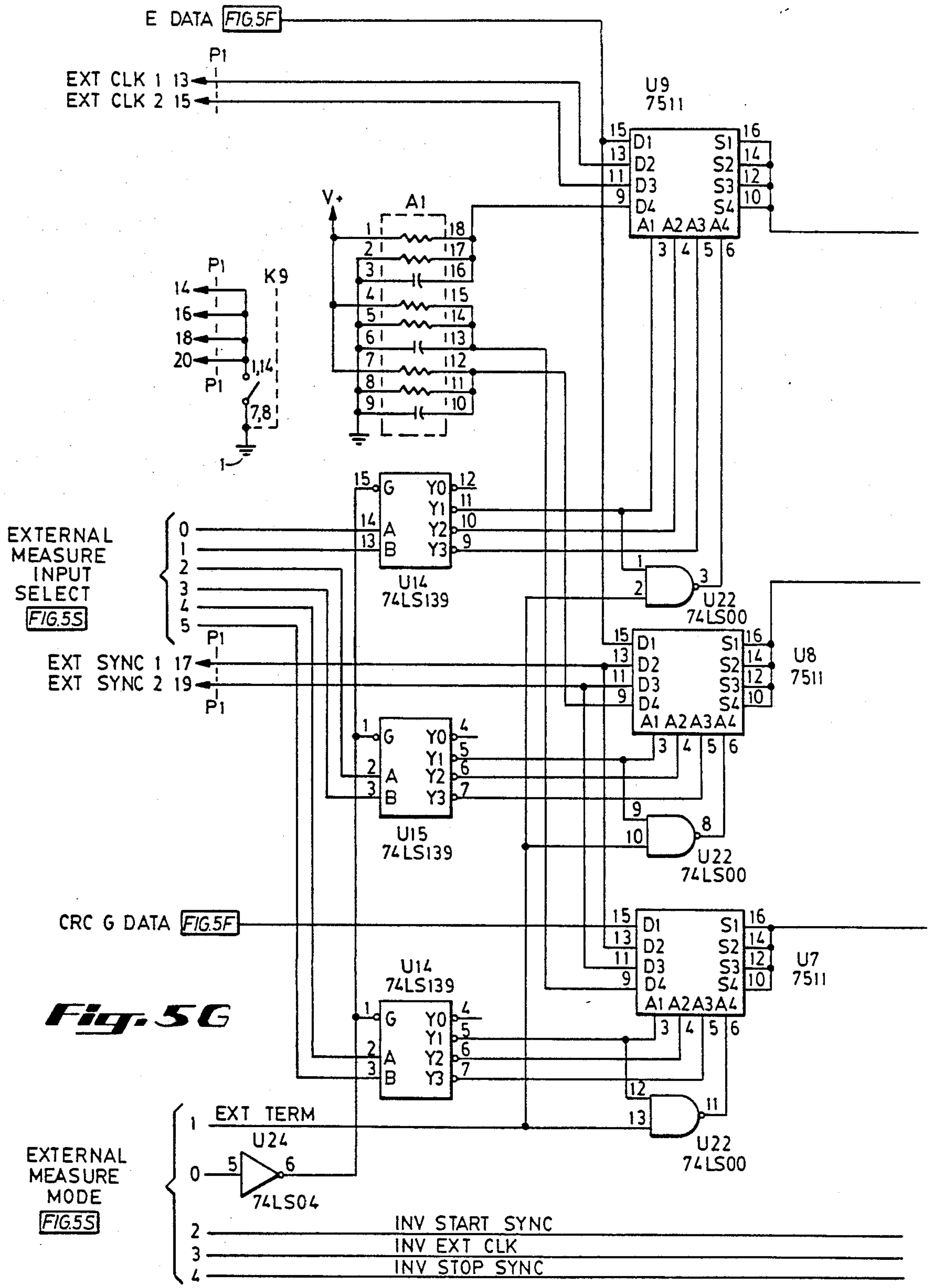
Figure 5H:
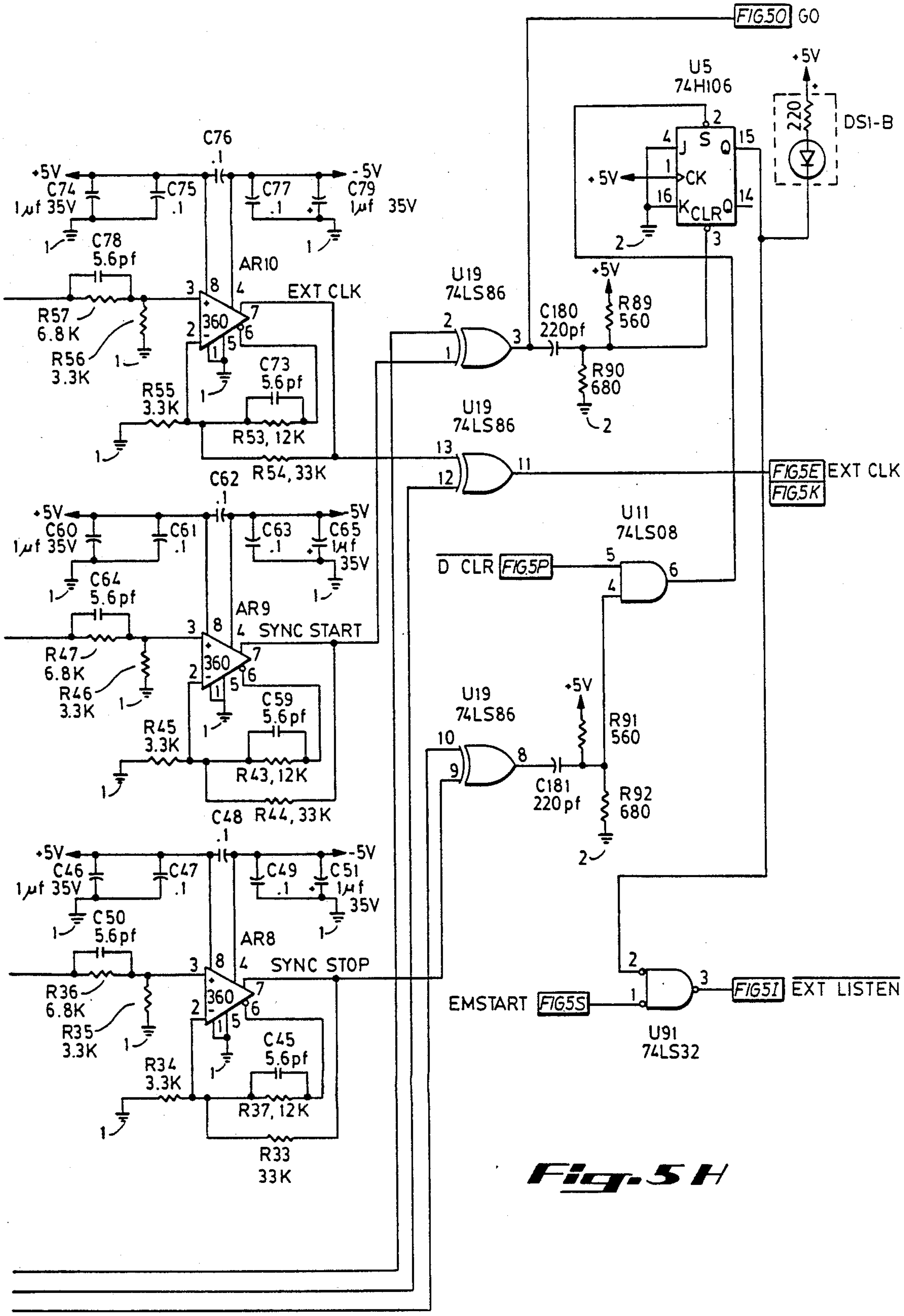
Figure 51:
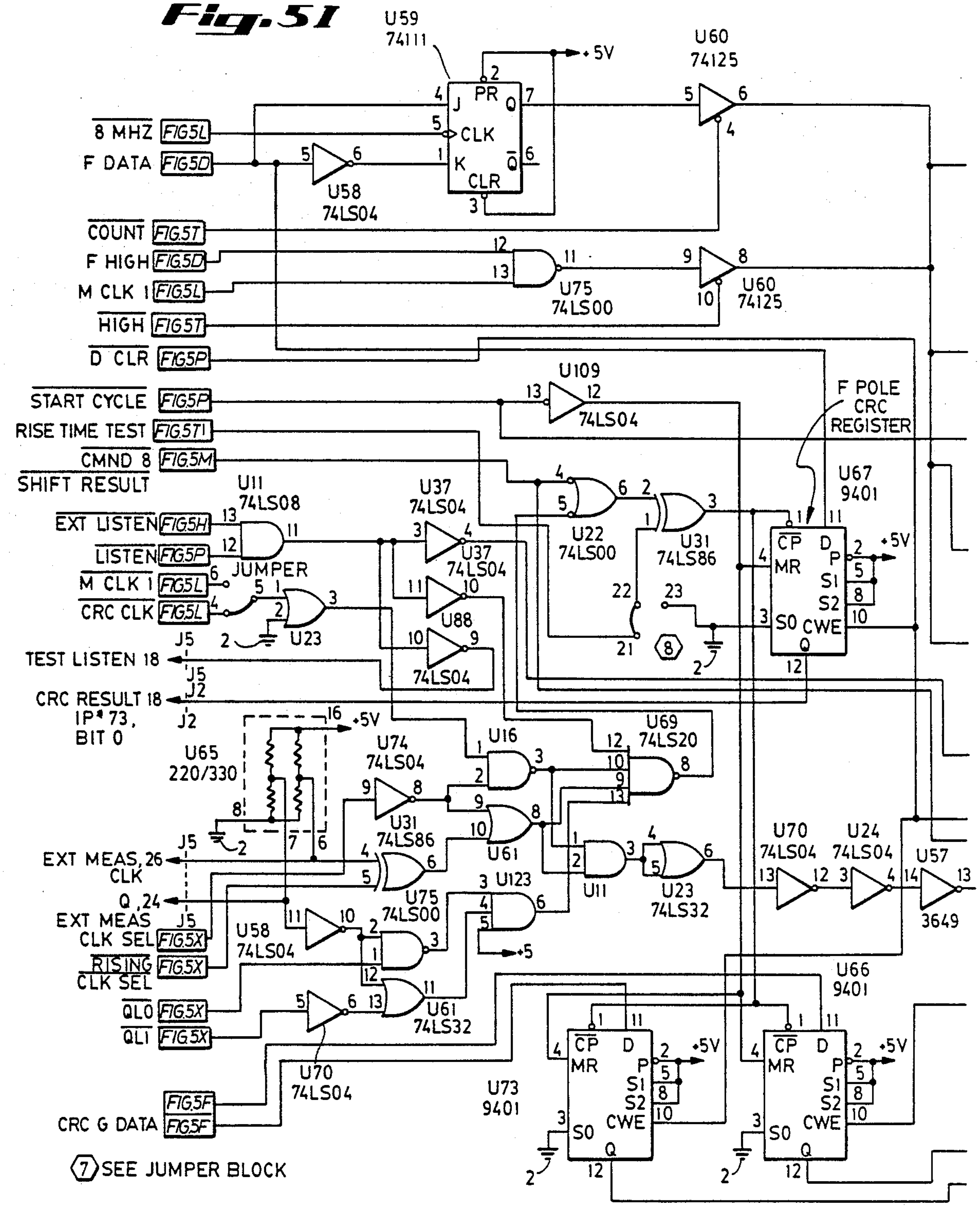
Figure 5J:
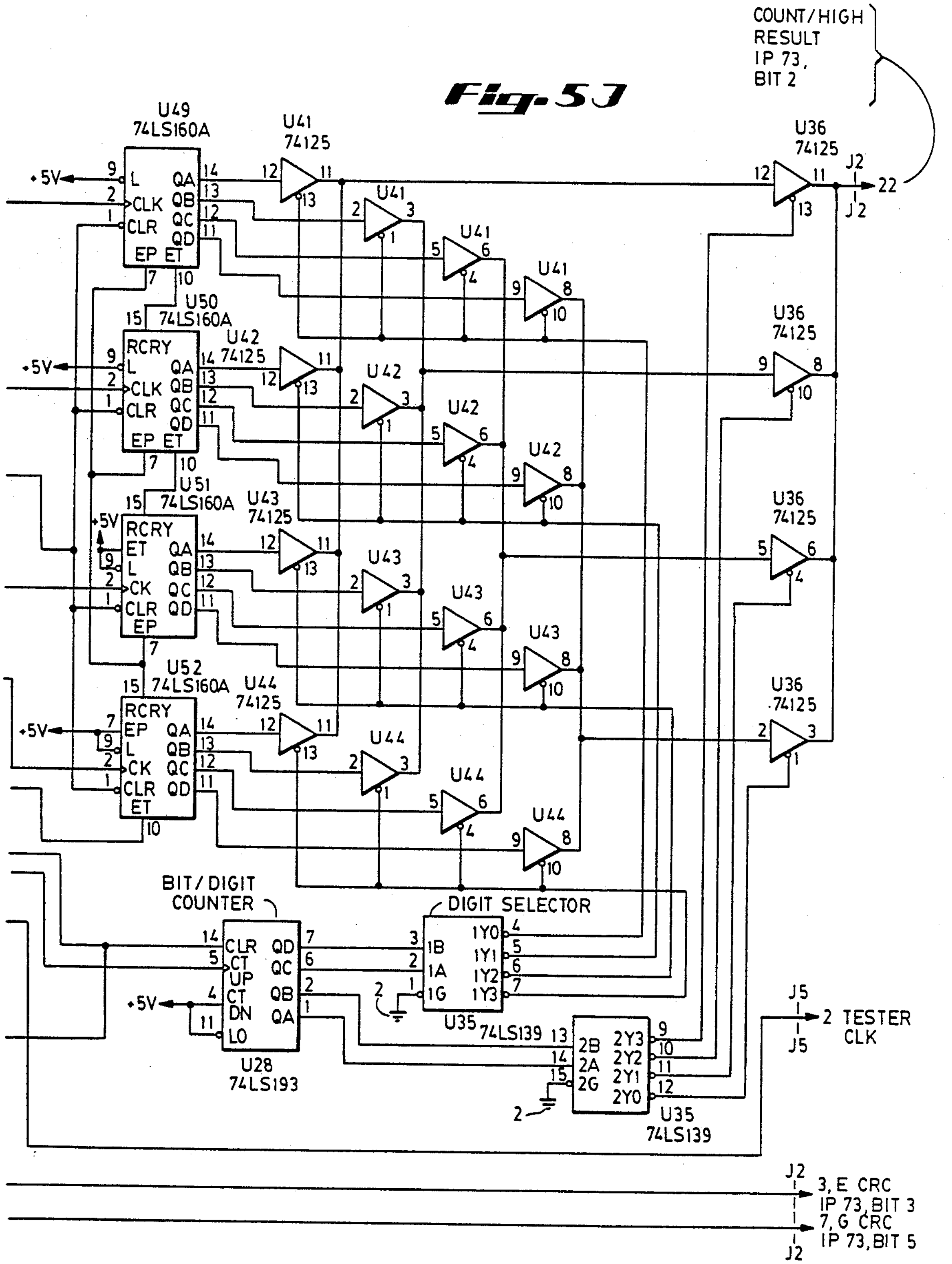
Figure 5K:
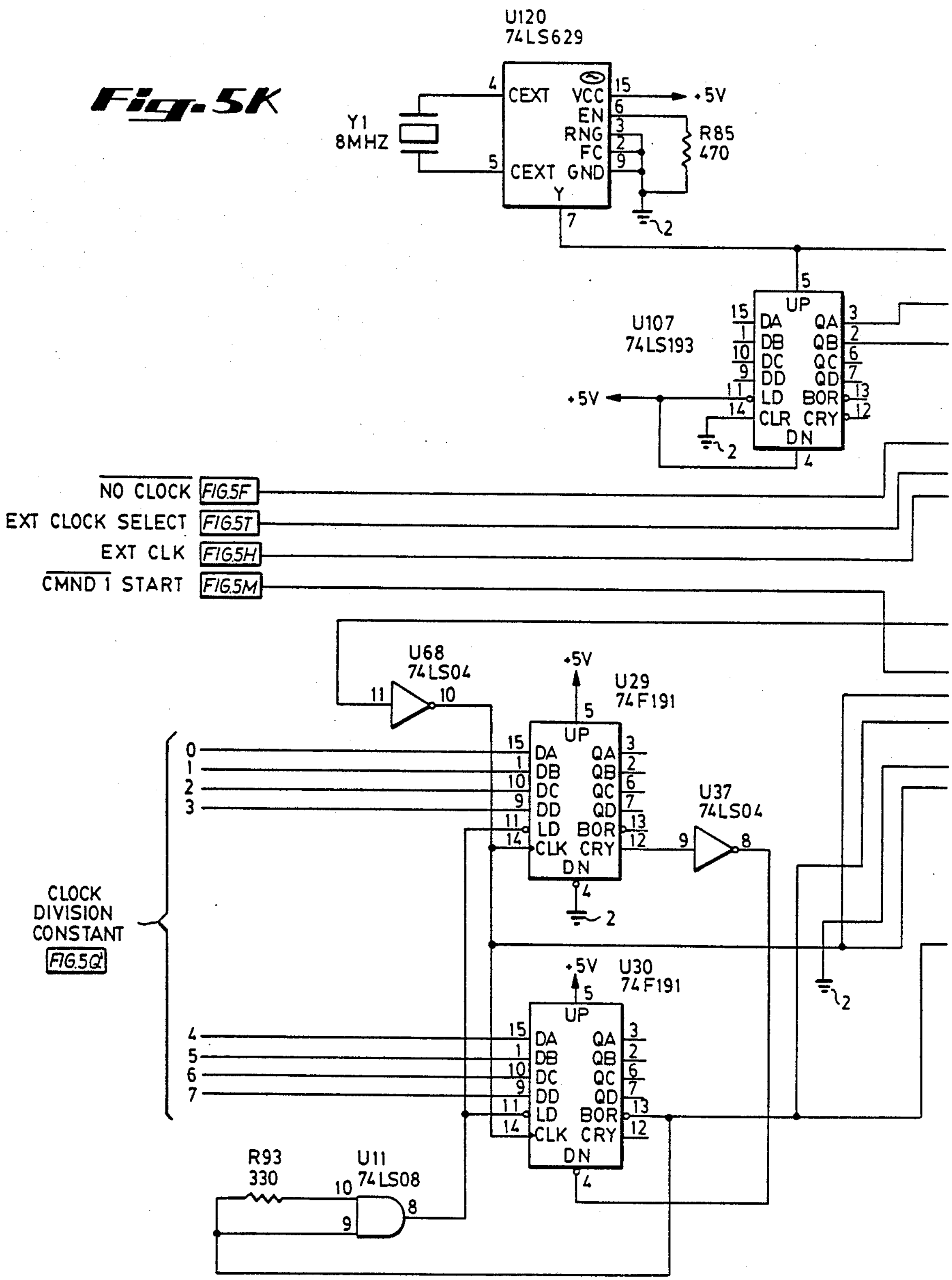
Figure 5L:
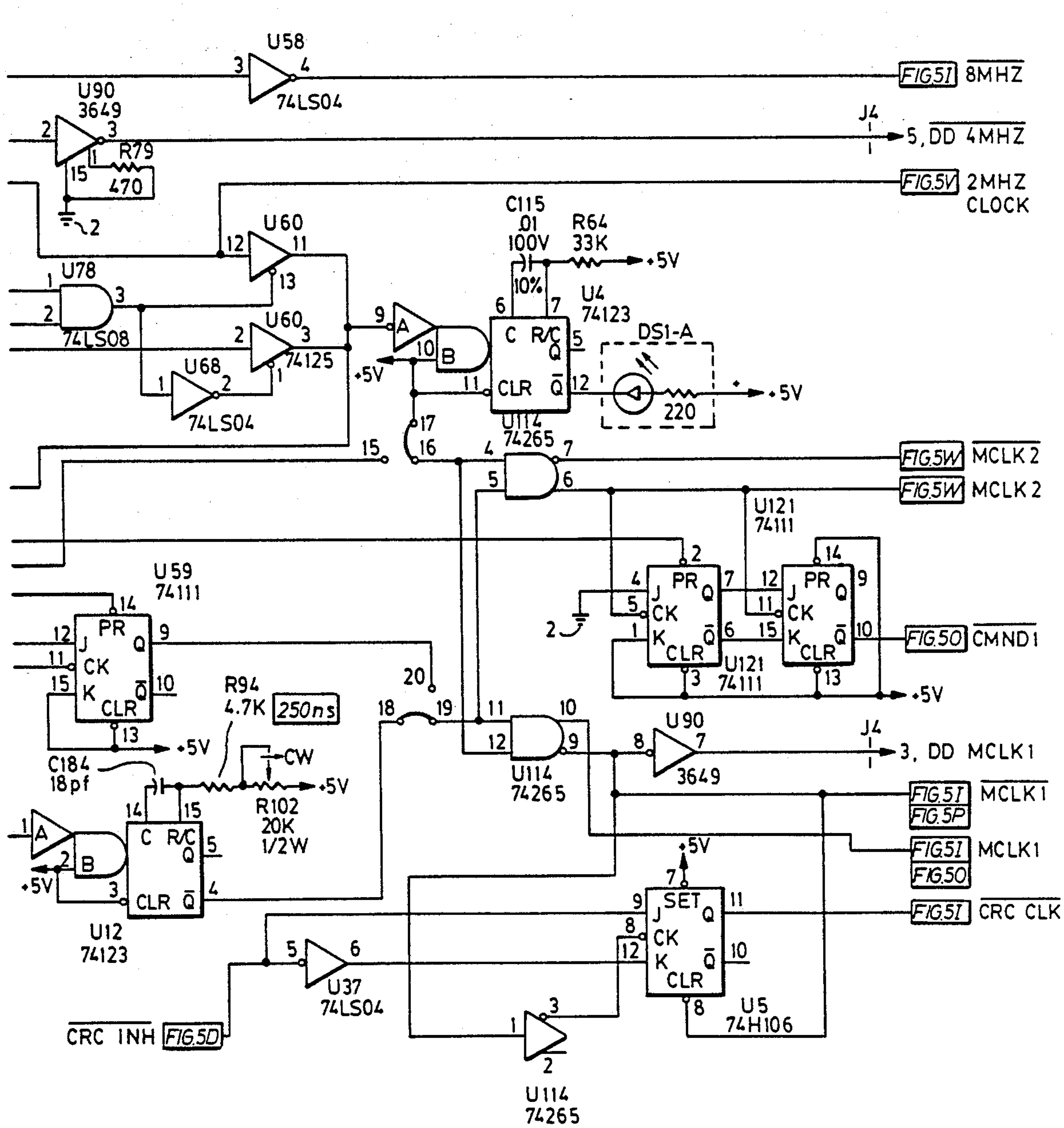
Figure 5M:
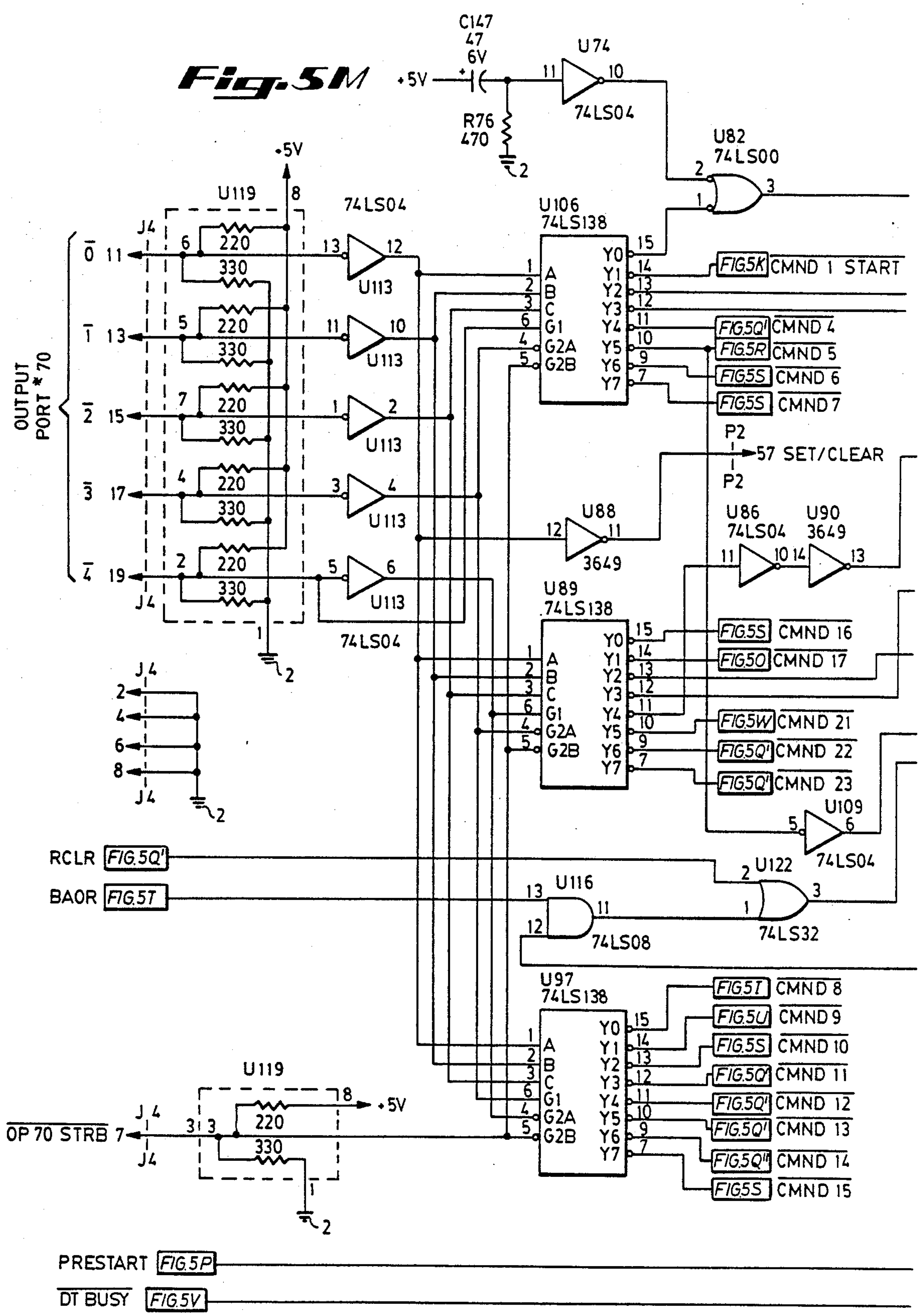
Figure 5N:
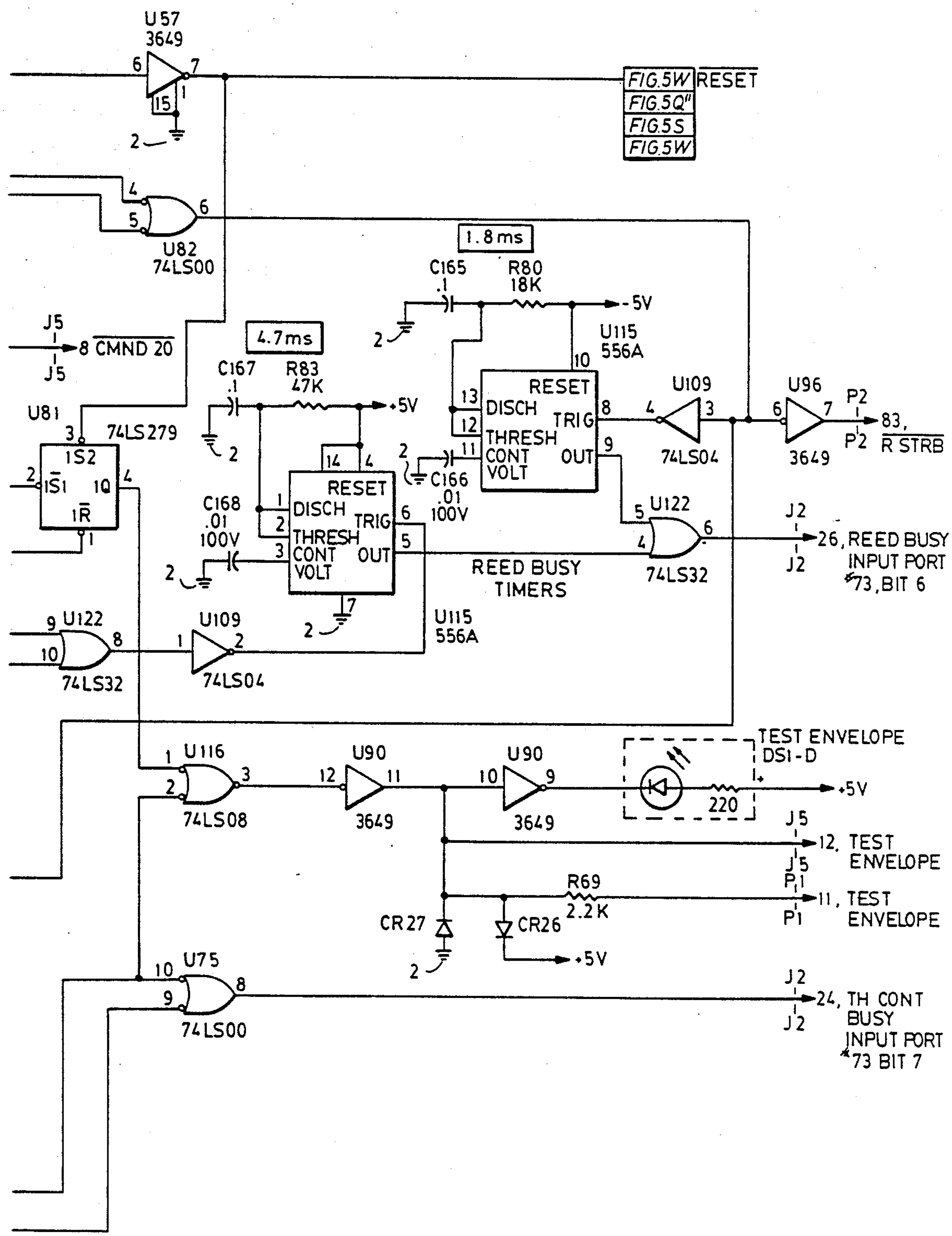
Figure 5O:
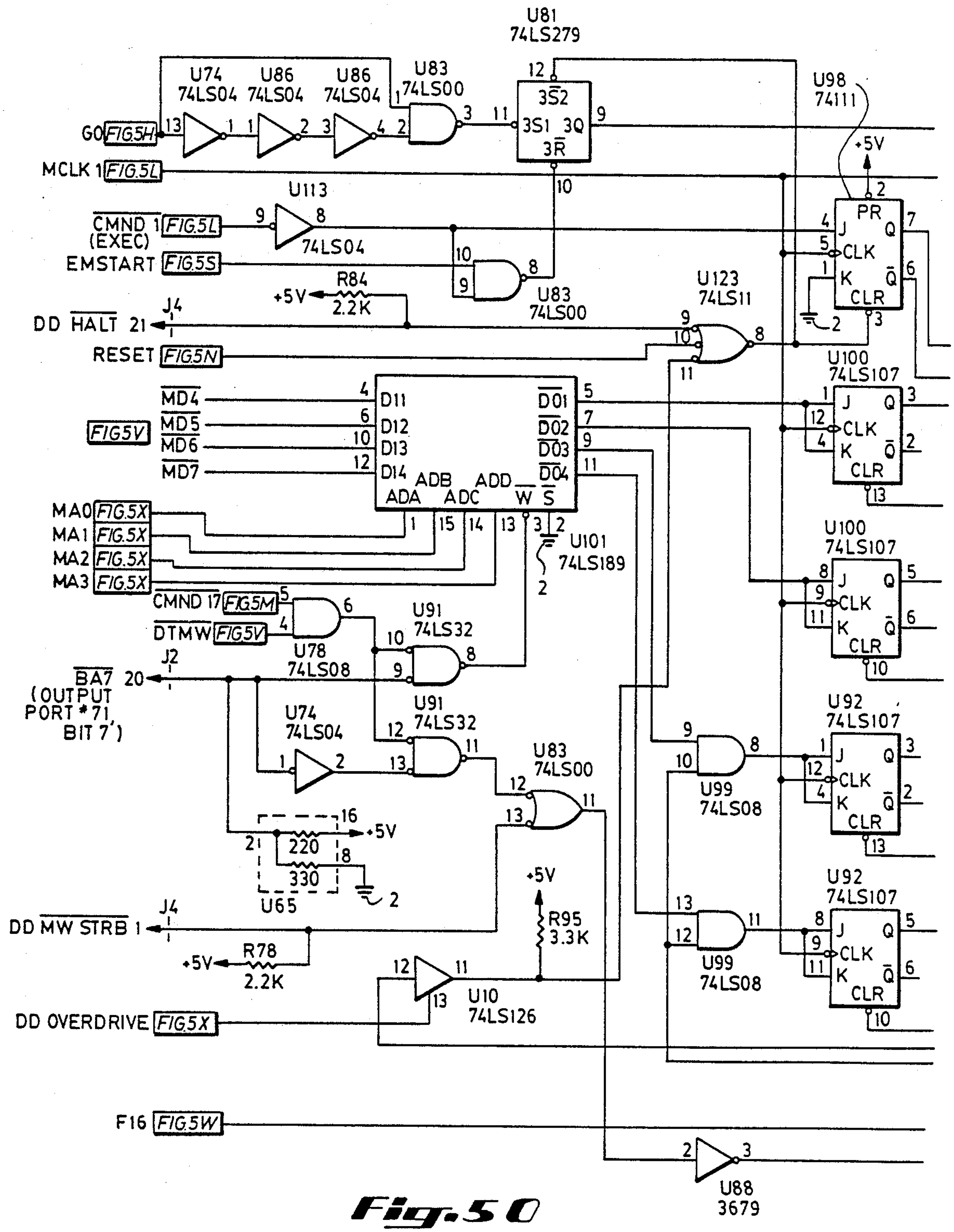
Figure 5P:
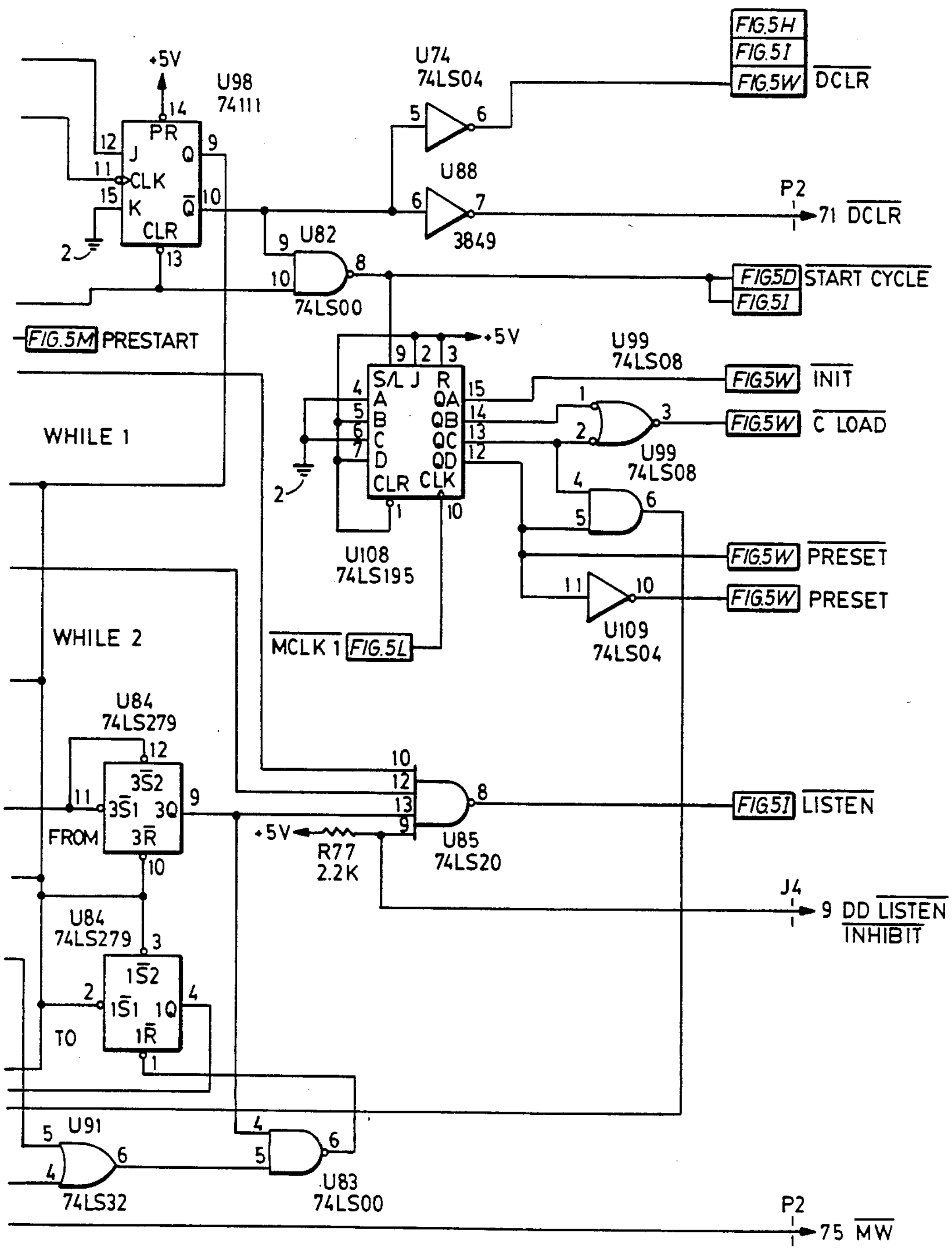
Figure 5Q:
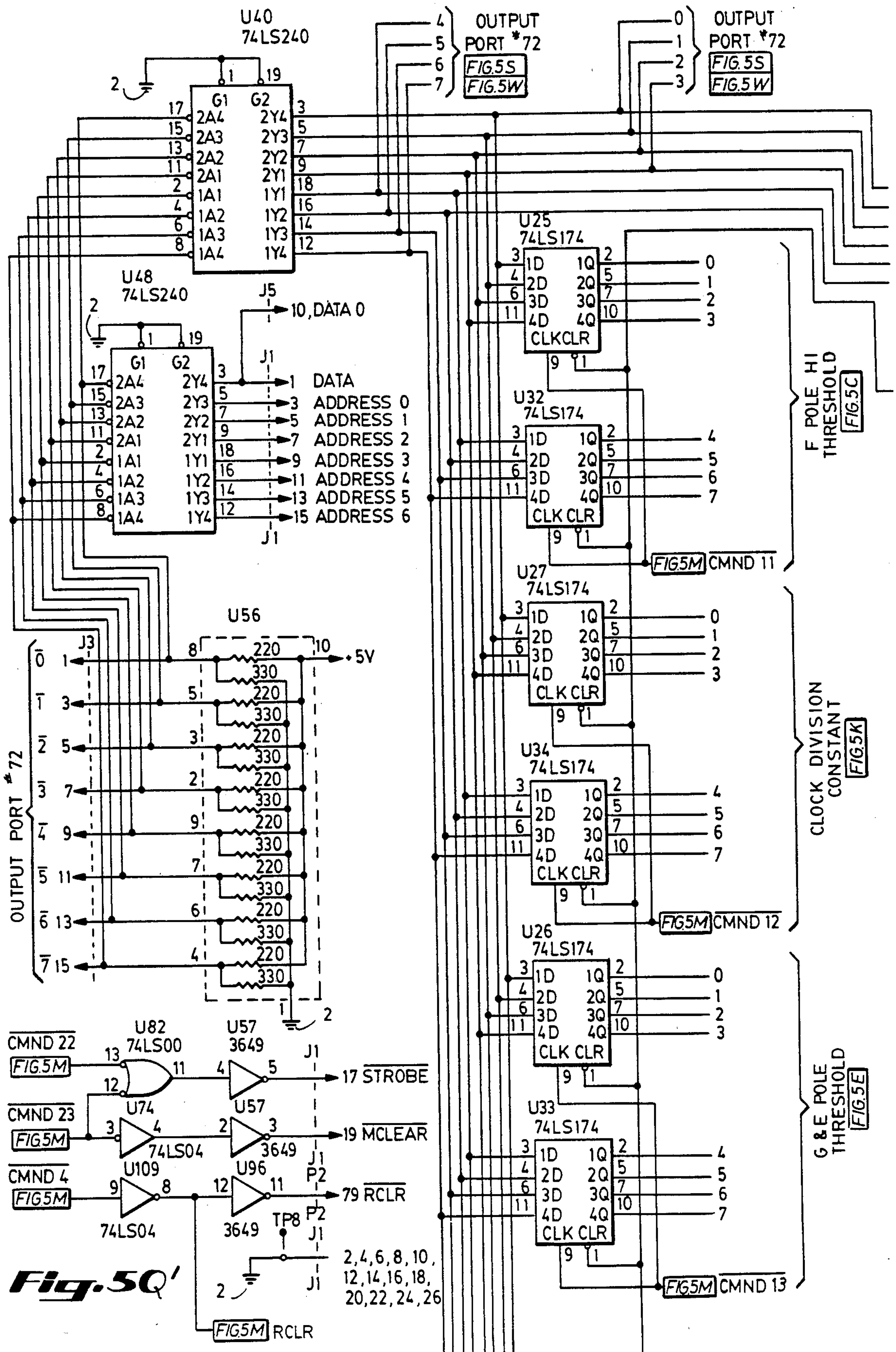
Figure 5Q:
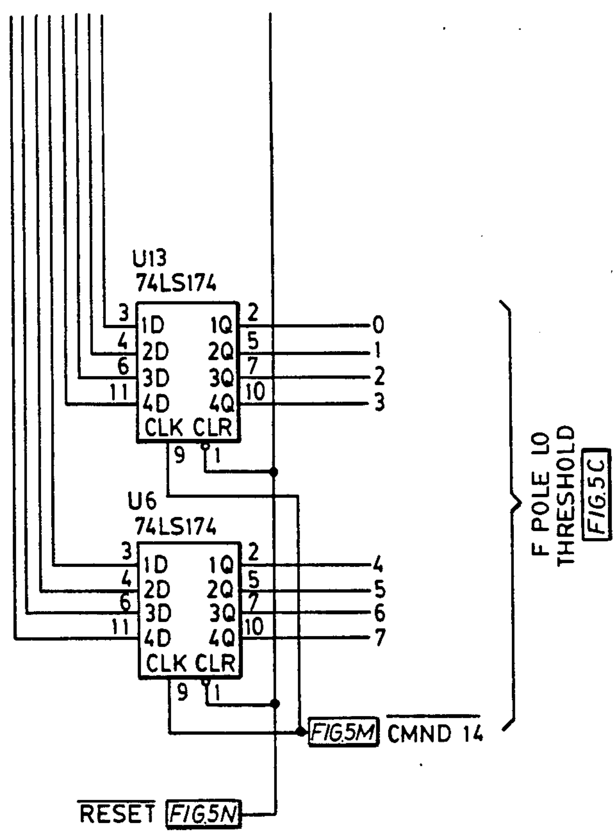
Figure 5R:
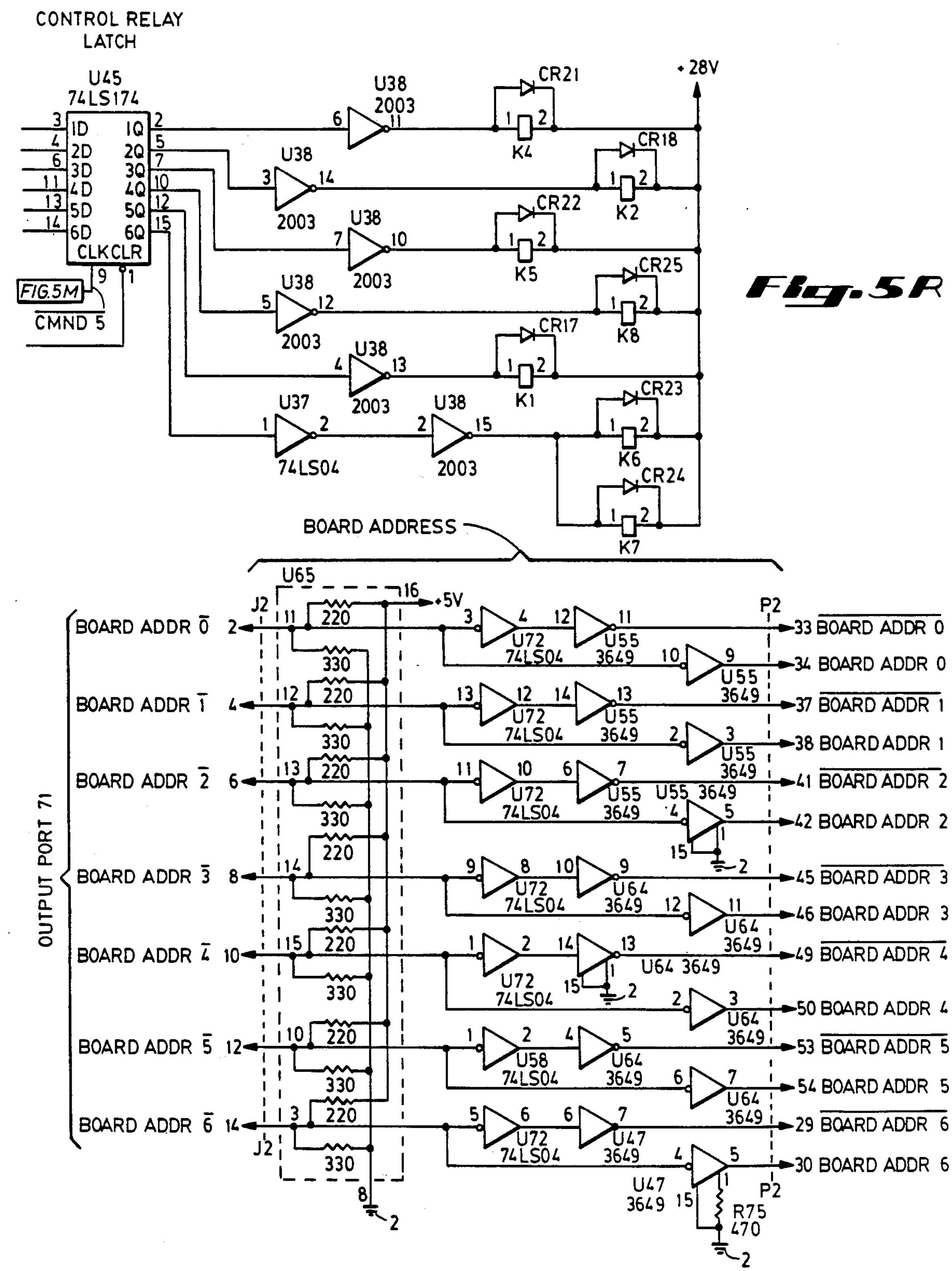
Figure 55:
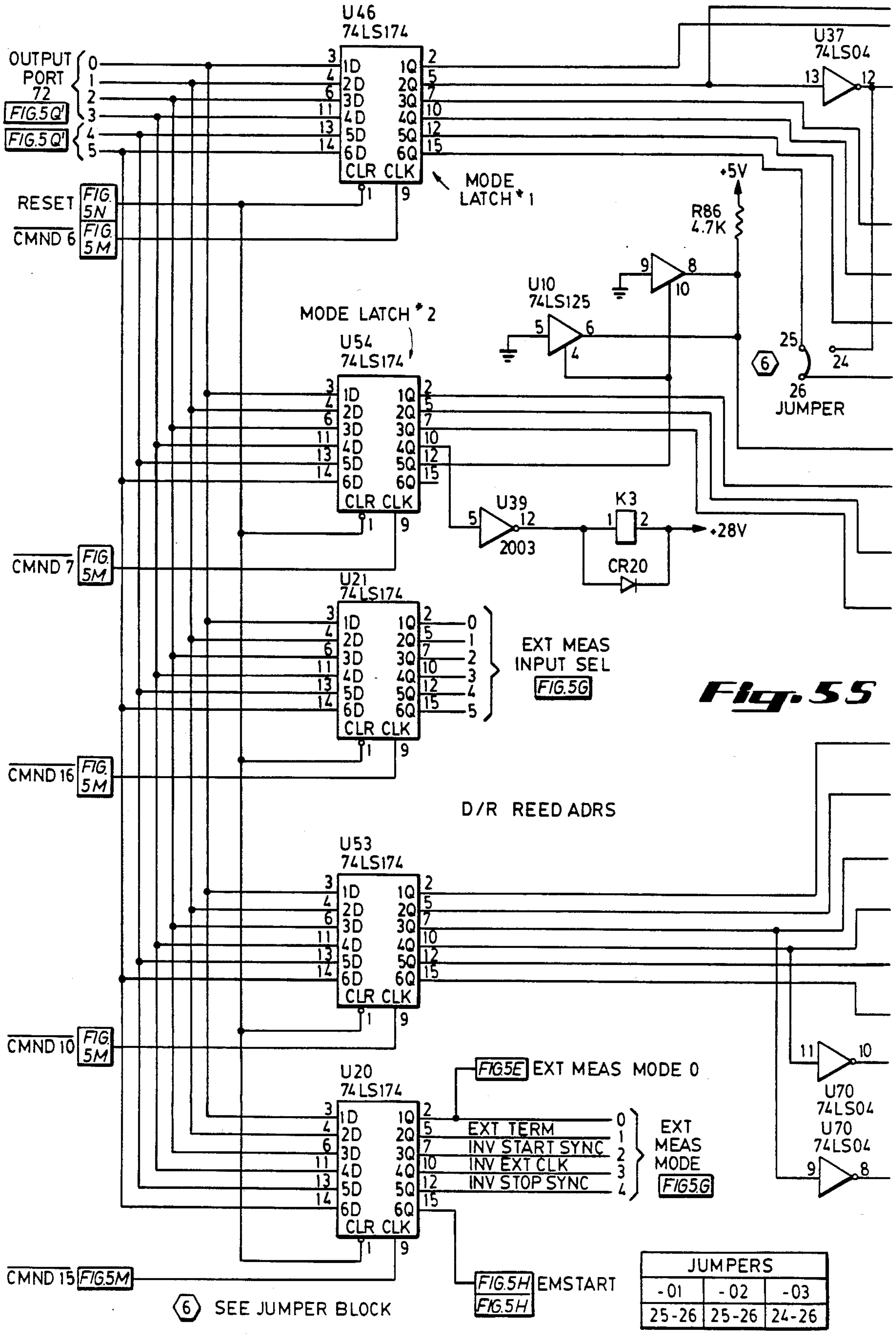
Figure 5T:
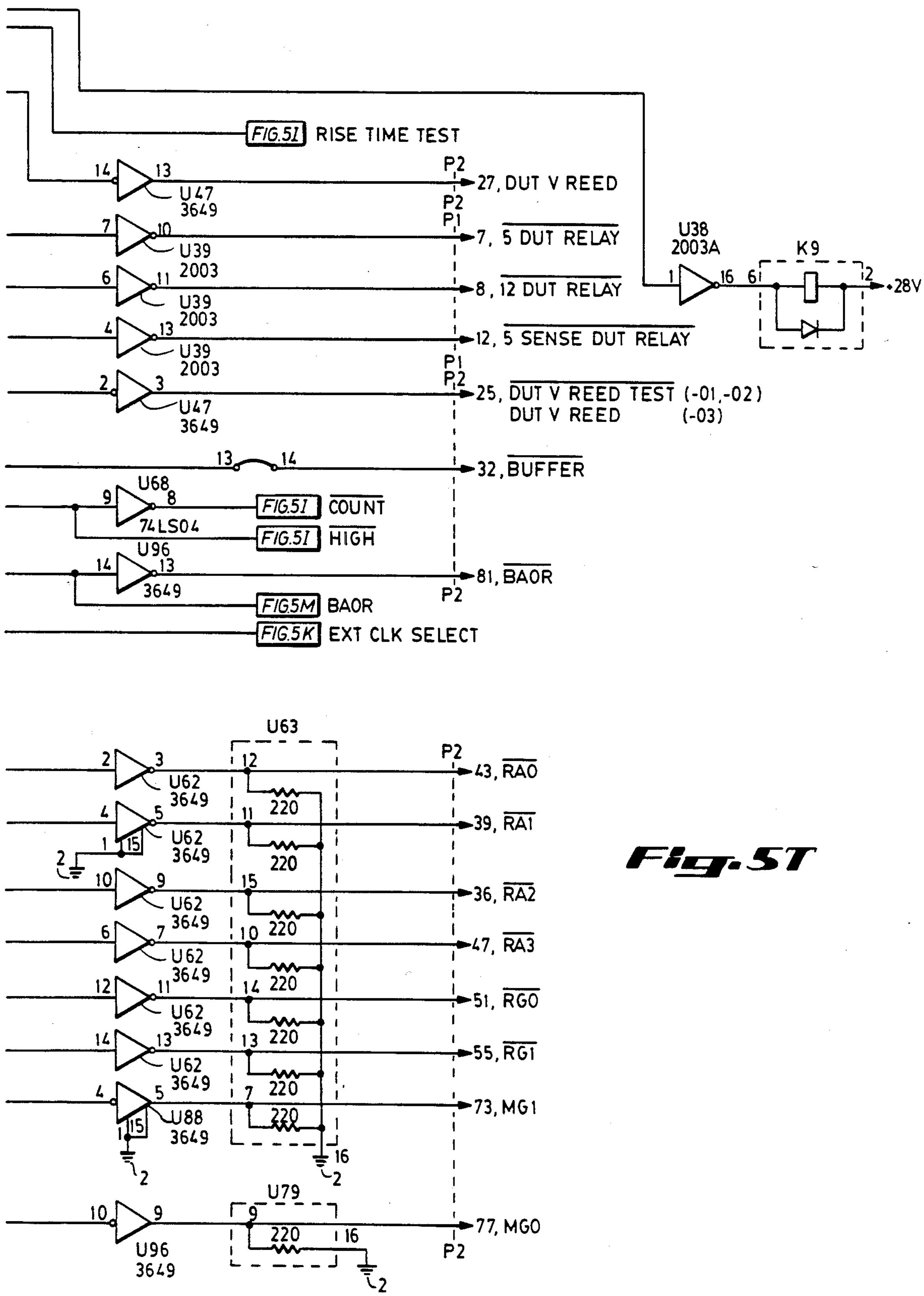
Figure 5U:
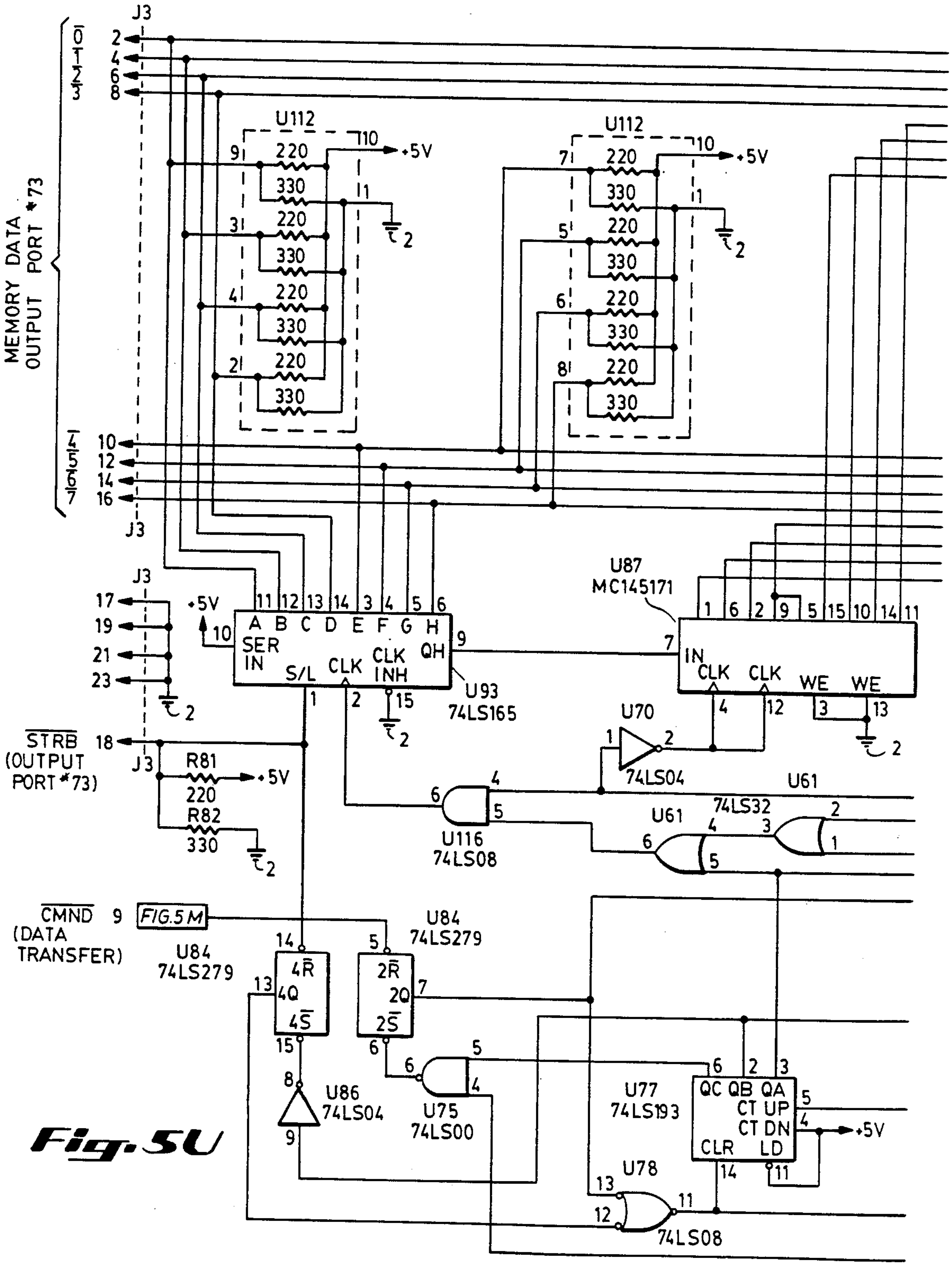
Figure 5V:
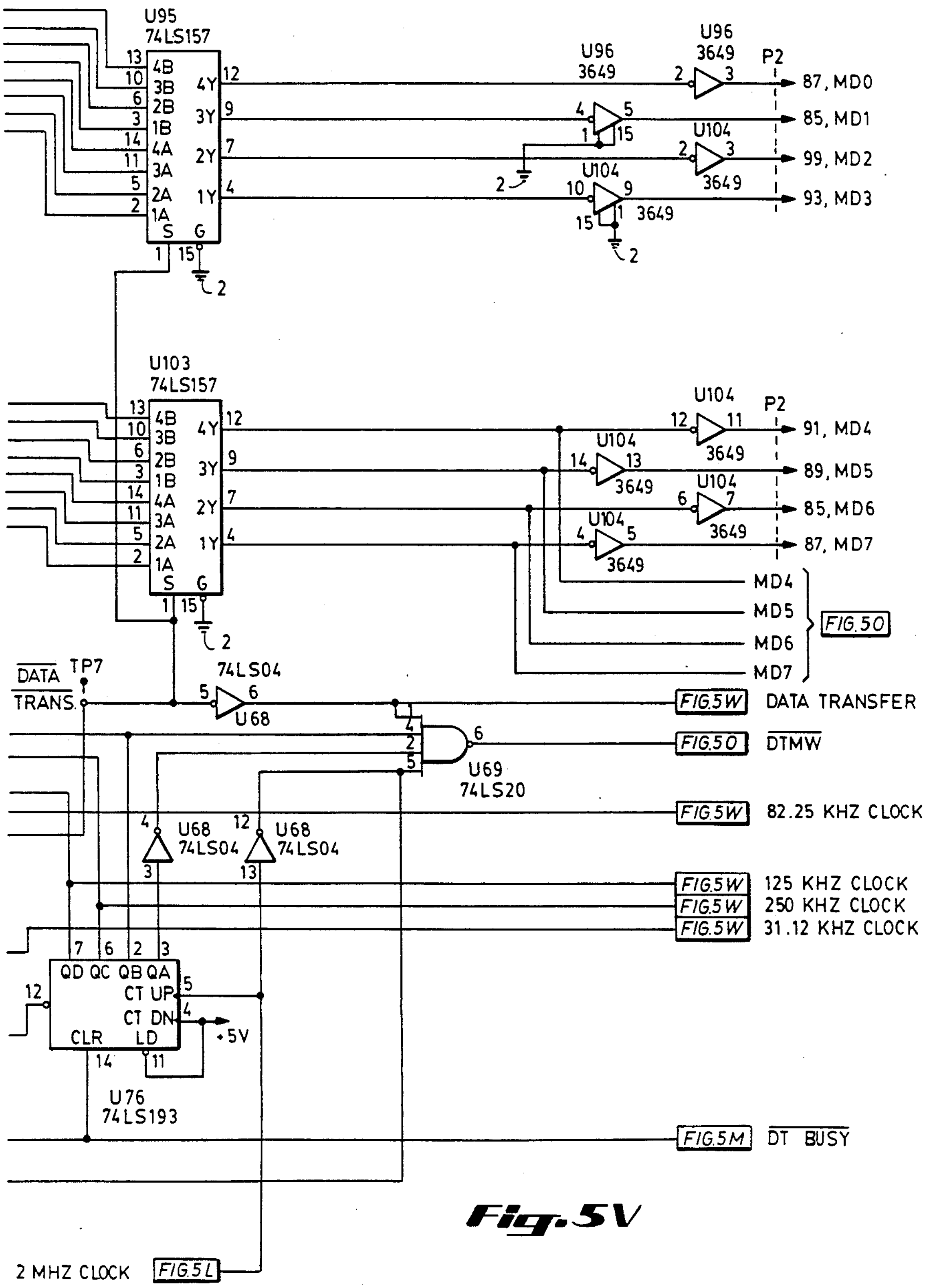
Figure 5W:
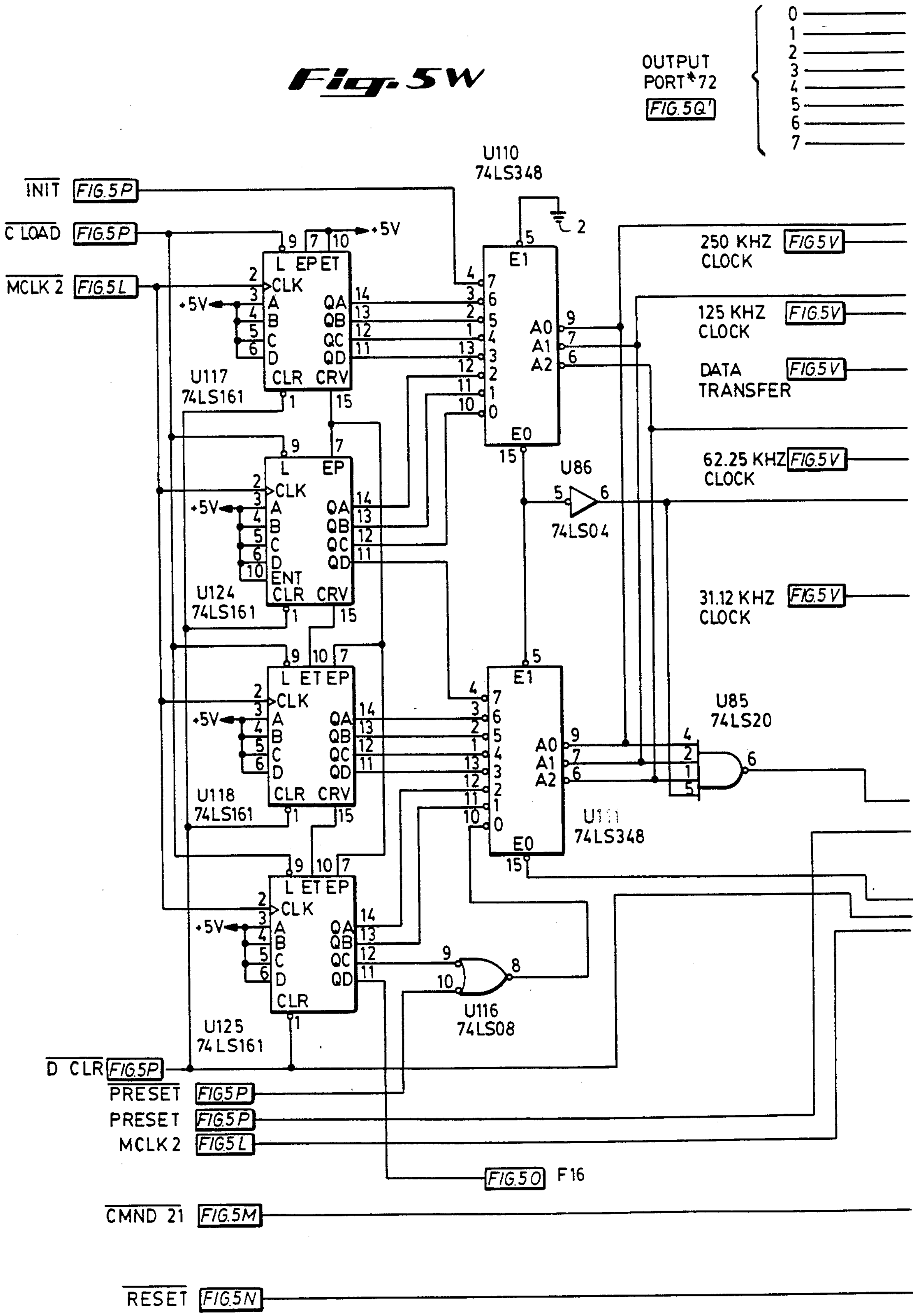
Figure 5X:
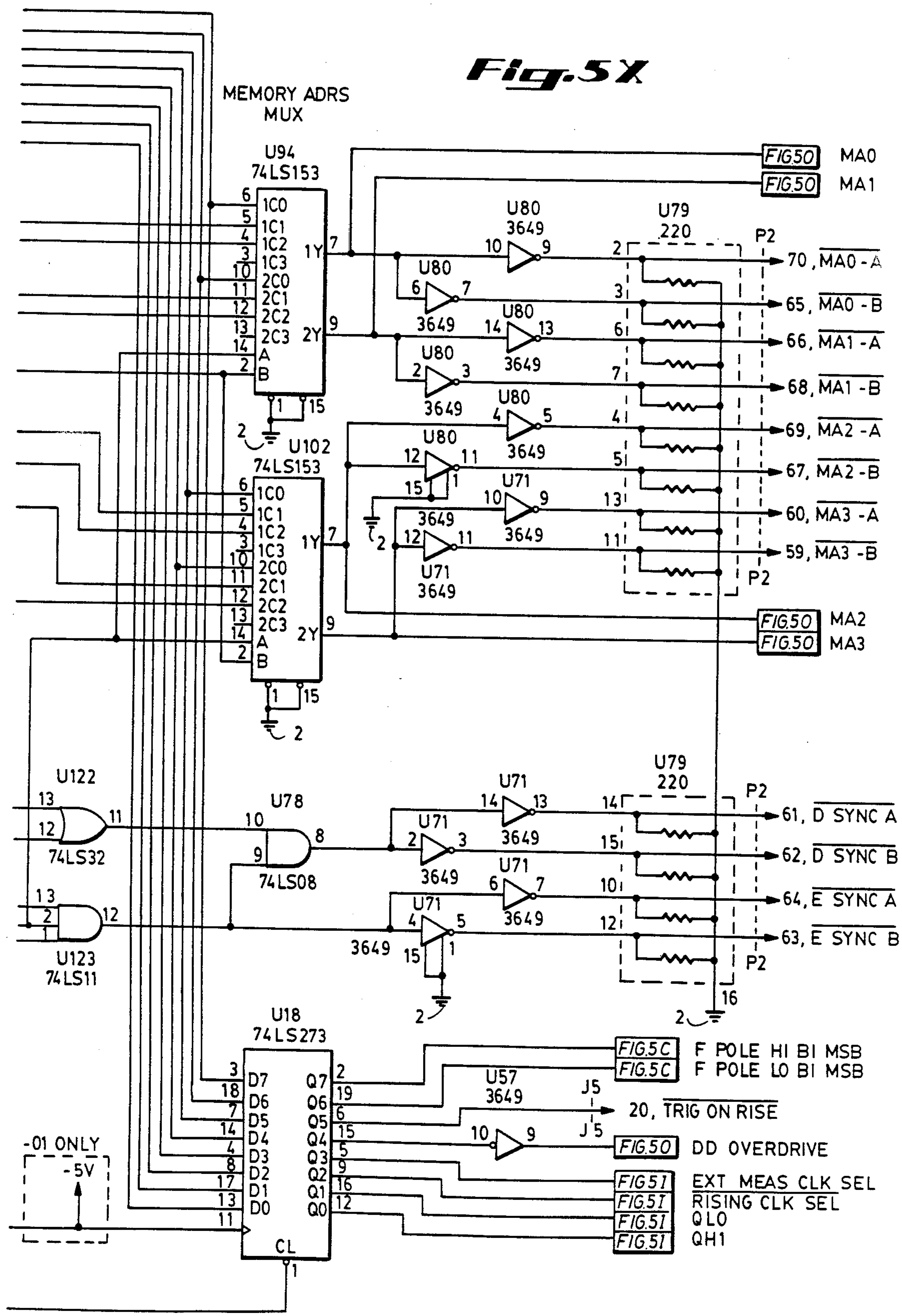
Figure 5Y:
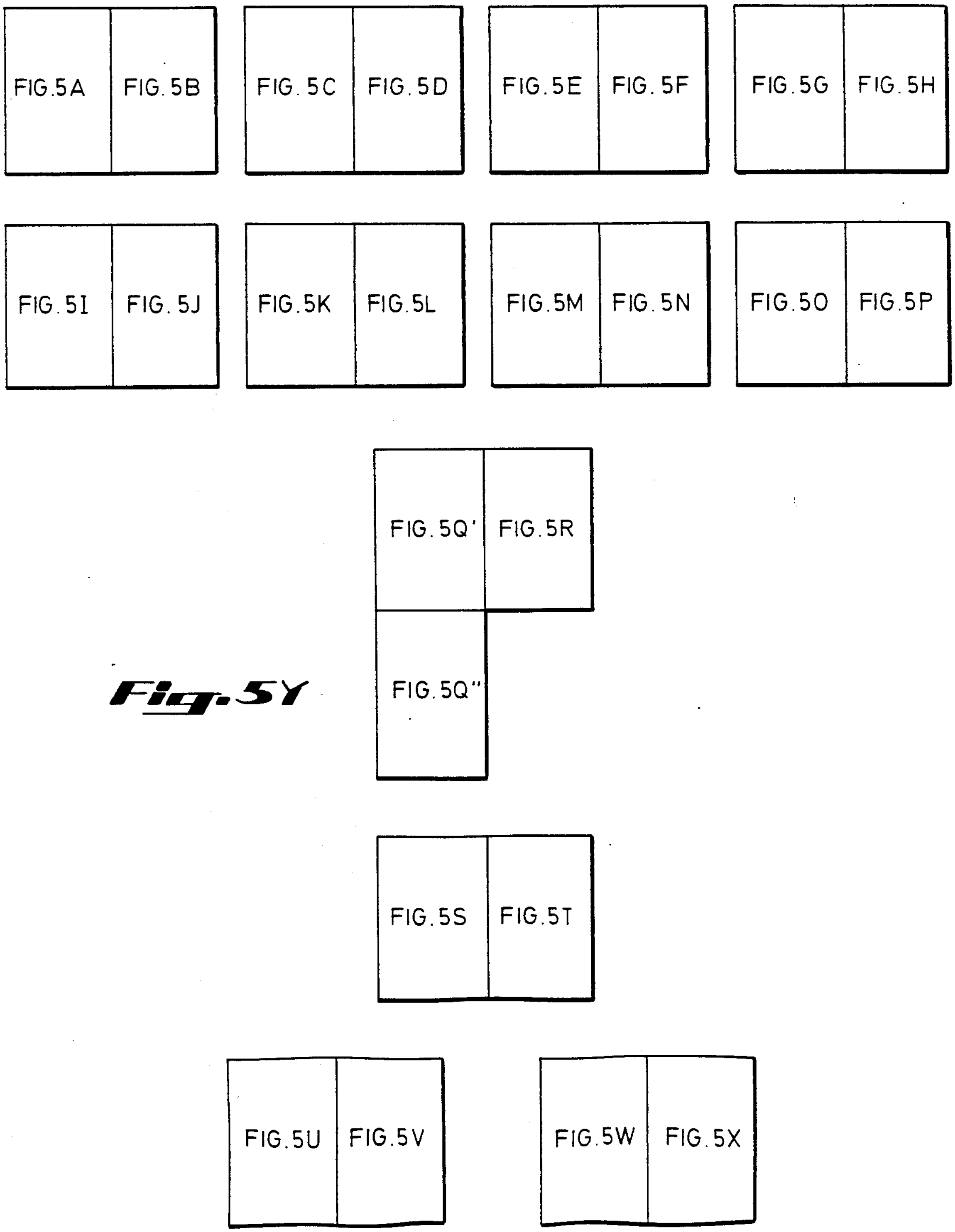

FIGS. 5A–X illustrate in schematic diagrams further detail of the Test Head Controller 42 of FIG. 4. Referring now to FIG. 4 and FIGS. 5G and 5H, the SYNC START signal 96 from the Pod trigger circuit 56, enters the THC and goes to a select start circuit 174 that allows either the SYNC START signal 96 or the E Pole signal 163 to be used for the START function. Similarly, either the SYNC STOP signal 98 or the G Pole signal 167 is selected by a select stop circuit 176 to be used for the STOP function. The selector outputs go through exclusive-or gates 178 and 180 where they may be inverted by an IO signal. This inversion allows operation on the logical complement of the trigger signal (trigger going false). Differentiator circuits 182 and 184 on the output of the exclusive-or gates 178 and 180, respectively, produce a low going spike on the falling edges of their respective input signals, to set or reset an RS flip-flop 186 only on transitions of the SYNC signals 96 and 98. The flip-flop 186 then opens and closes a gate 188 for the clocks to the signature analyzers, effectively controlling when measurements are made.

The MEASURE CLOCK signal 109 from the Data Pod 30 may be inverted by an inverter selector 189 at the THC input. The signal 109 is then selected, if desired, by a clock selector 190 or an internal clock signal 192 is used for a resulting tester clock or measurement clock 193. The internal clock signal 192 is typically repetitive and happens once at each test vector. When using the internal clock signal 192, a Programmed Listen signal 194 must be created, telling the tester 28 when valid measure data is present. The Measure Clock signal 109, as mentioned earlier, is generated by the DUT only when data to be measured is present. A Qualifier signal 120 for the Measure clock signal 109 may be inverted by an invertor selector 195 and selectively used during a test. The Qualifier signal 120, the Measure Clock signal 109, and a LISTEN signal 196 must all be true in order that a clock 198 may be passed to the signature analyzers by the gate 188. This clock 198 may be inverted by an inverter selector 199 by an IO signal if the falling edge is the one which is useful for measurement.

Hardware: logic Analyzer 32

Figure 6:
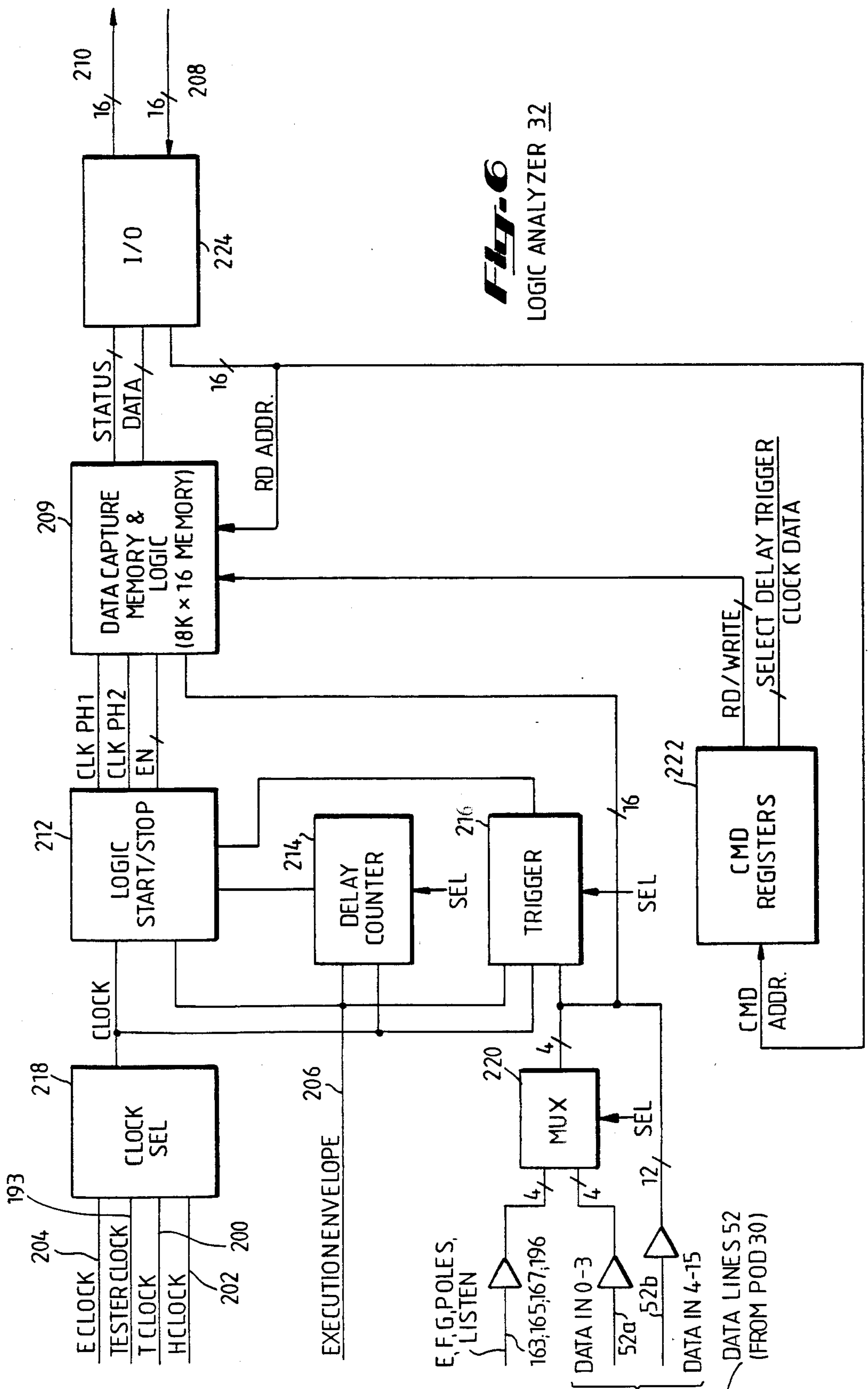
FIG. 6 illustrates in block diagram form the logic analyzer 32 of FIG. 1.
Figure 7C:
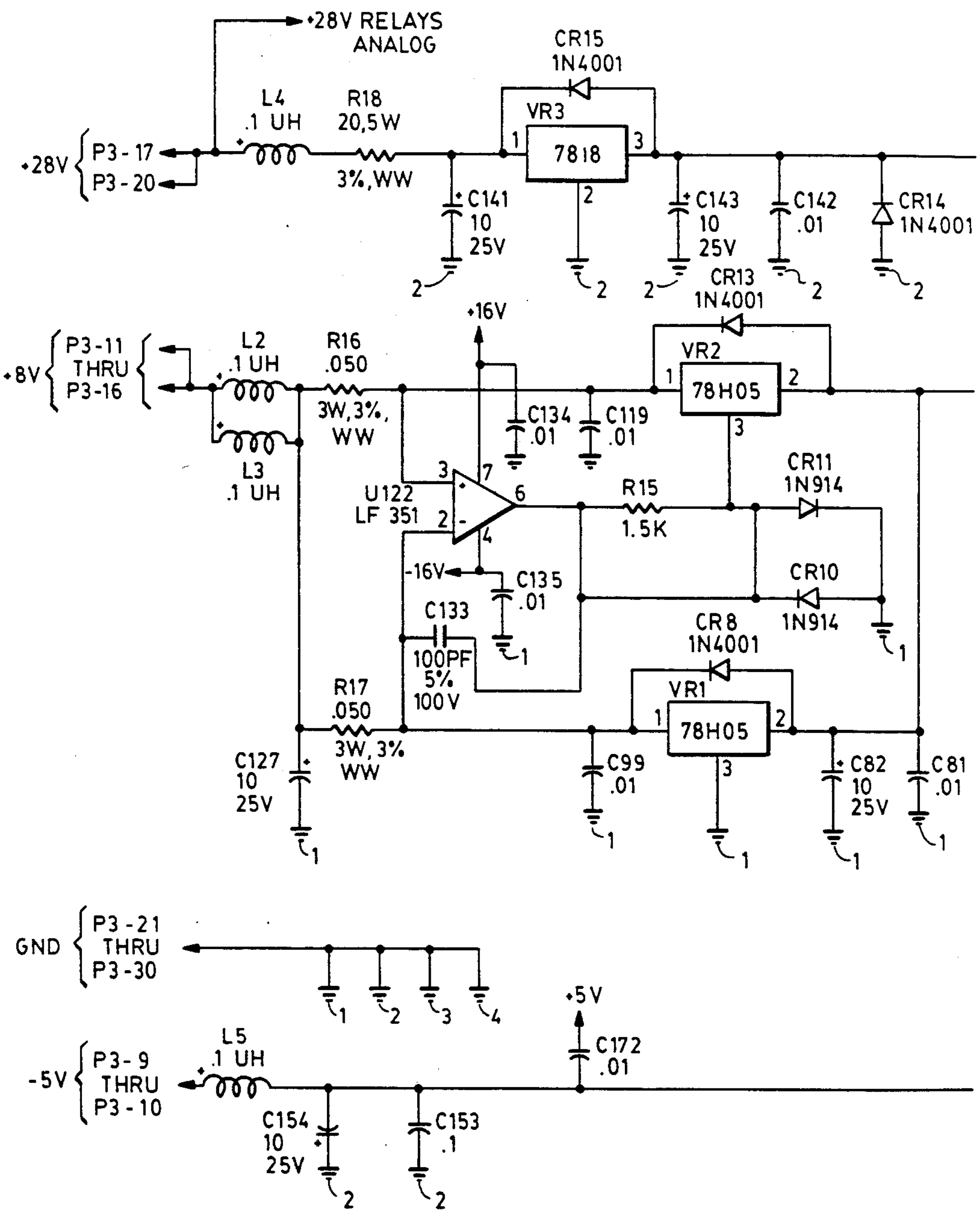
FIGS. 7A–7HH illustrate in schematic diagrams the logic analyzer 32 of FIG. 6.
Figure 7D:
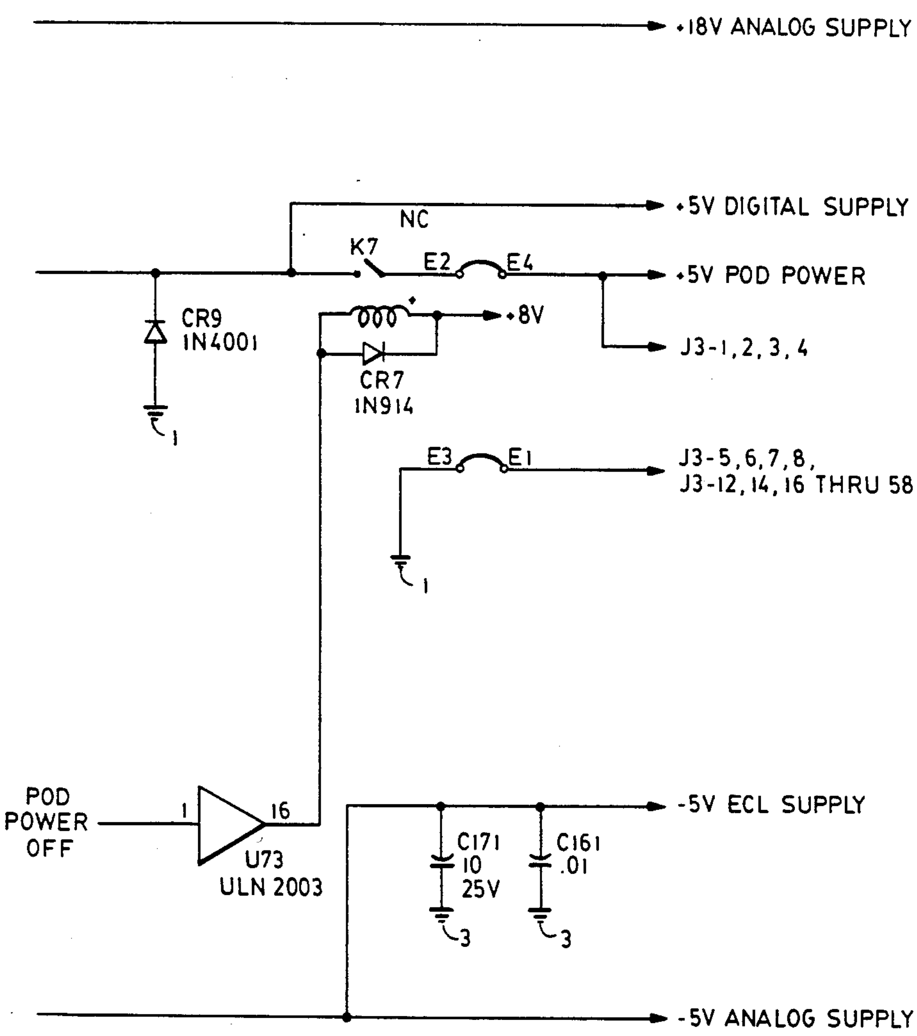
Figure 7E:
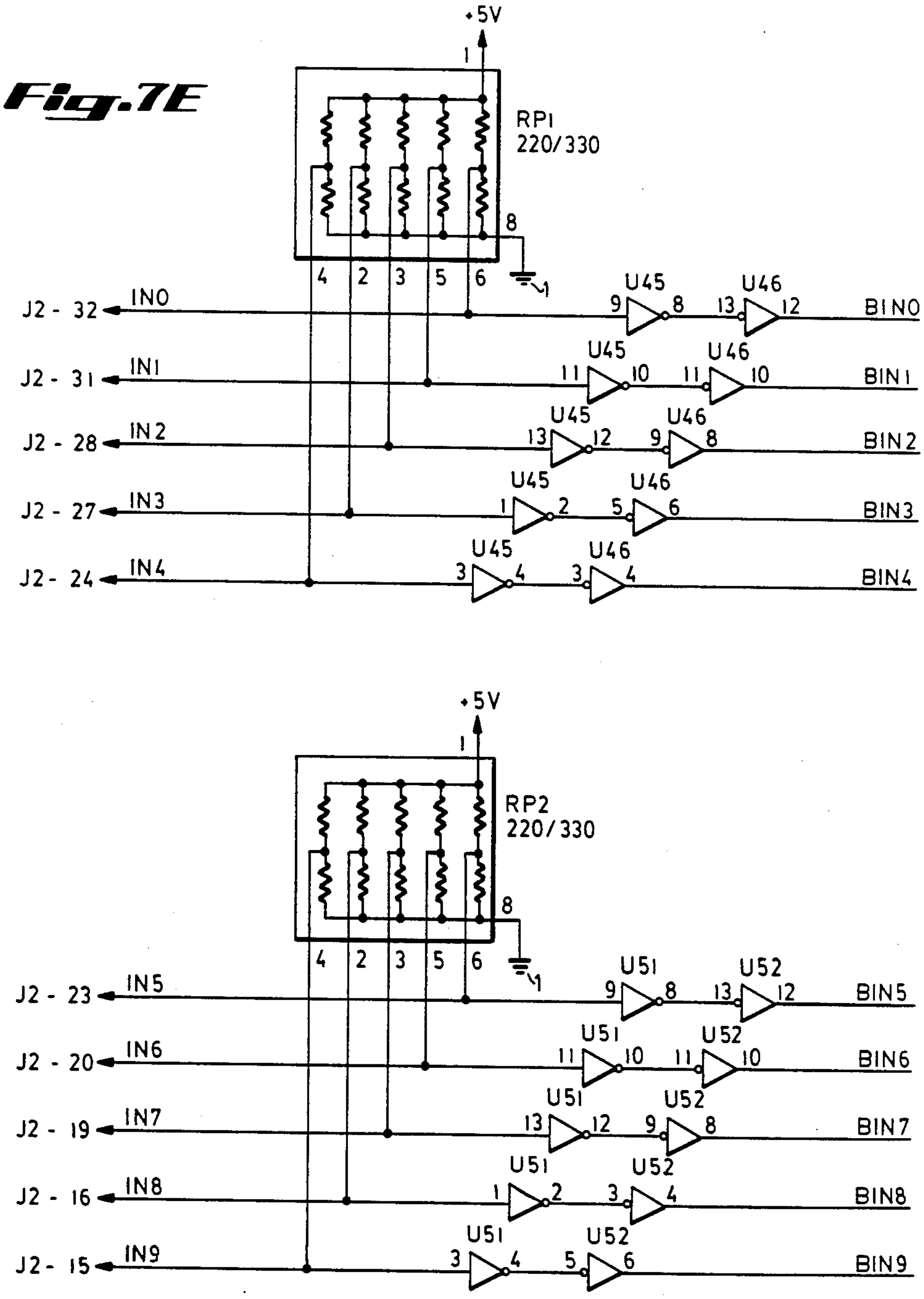
Figure 7F:
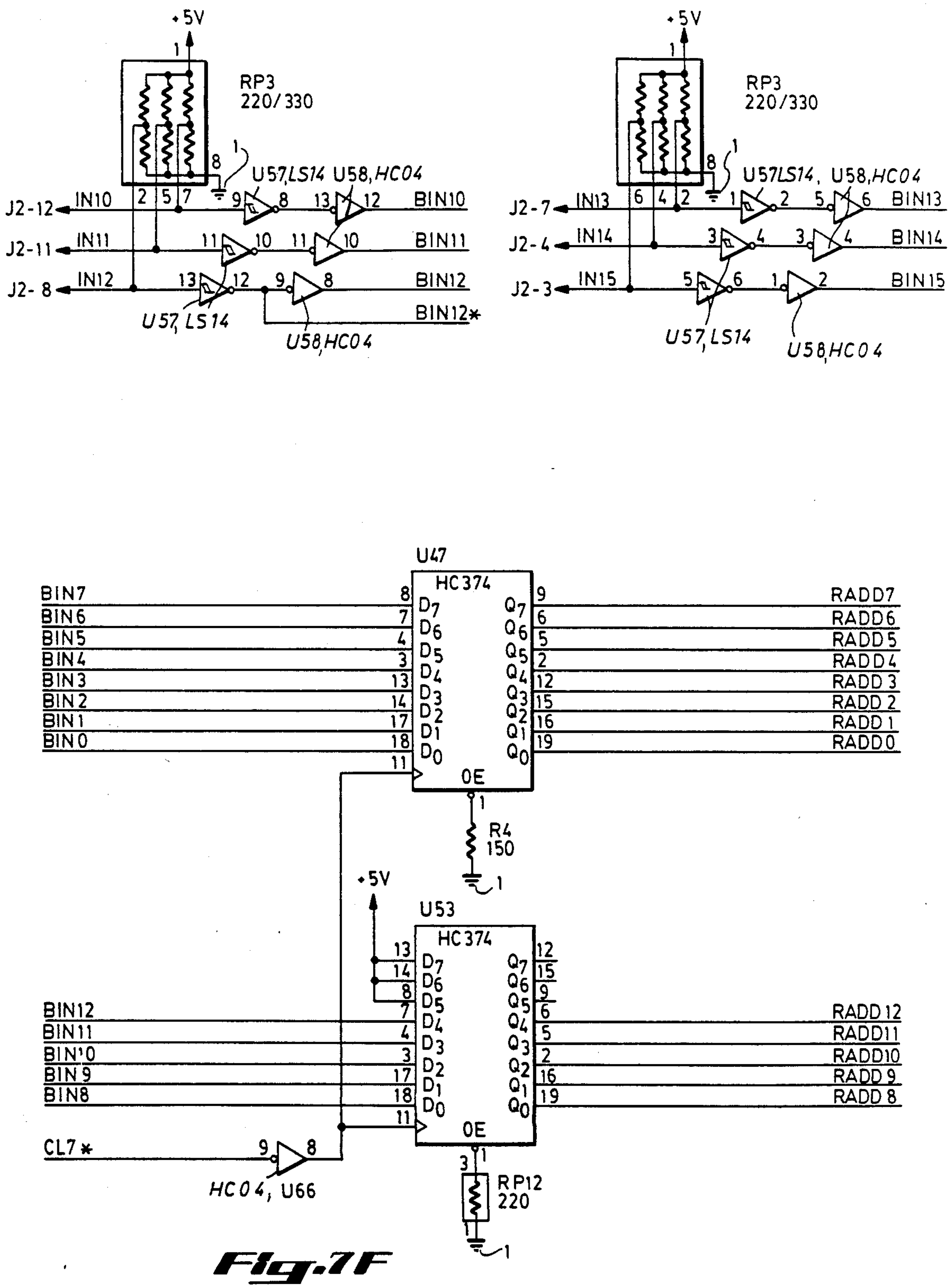
Figure 7G:
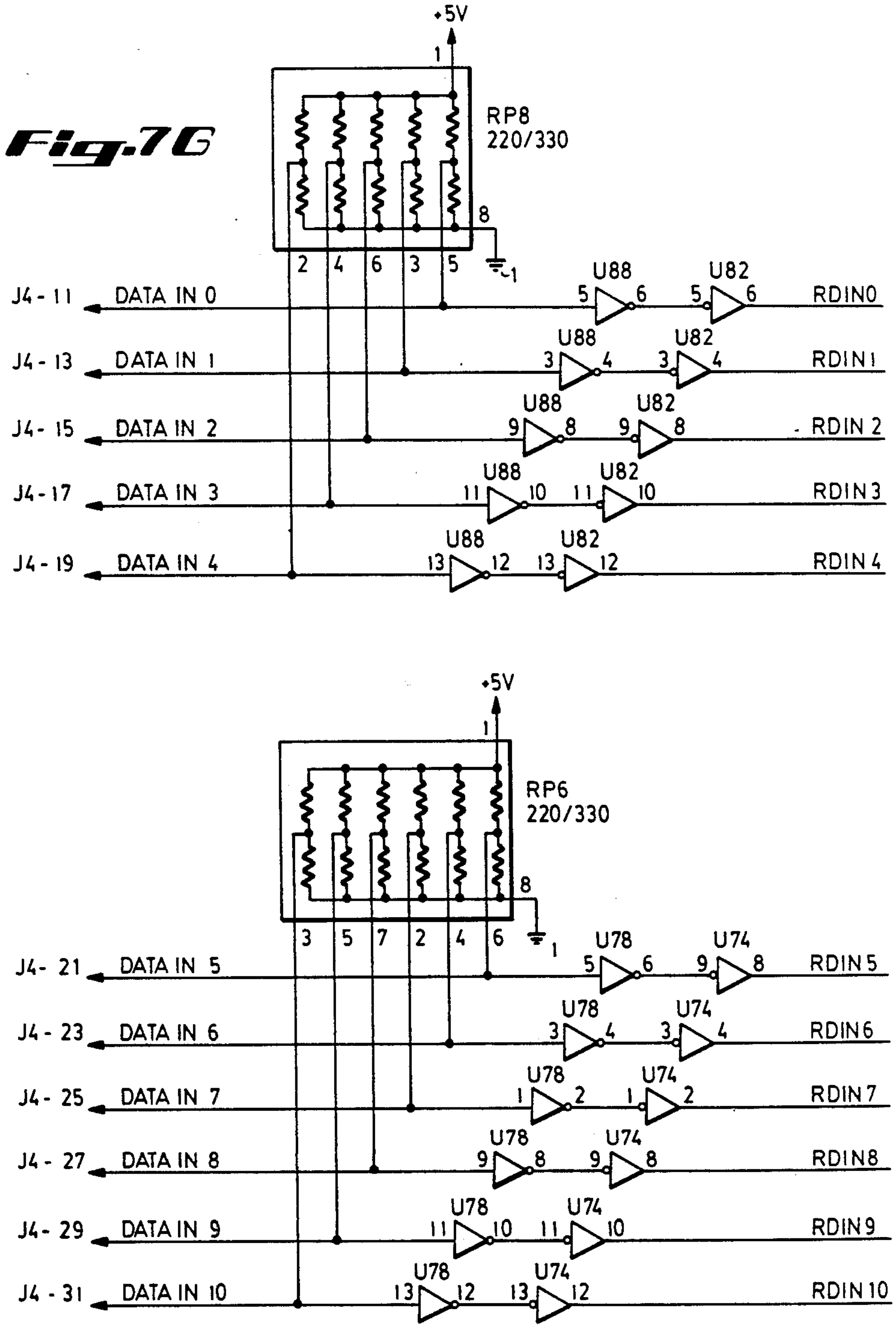
Figure 71:
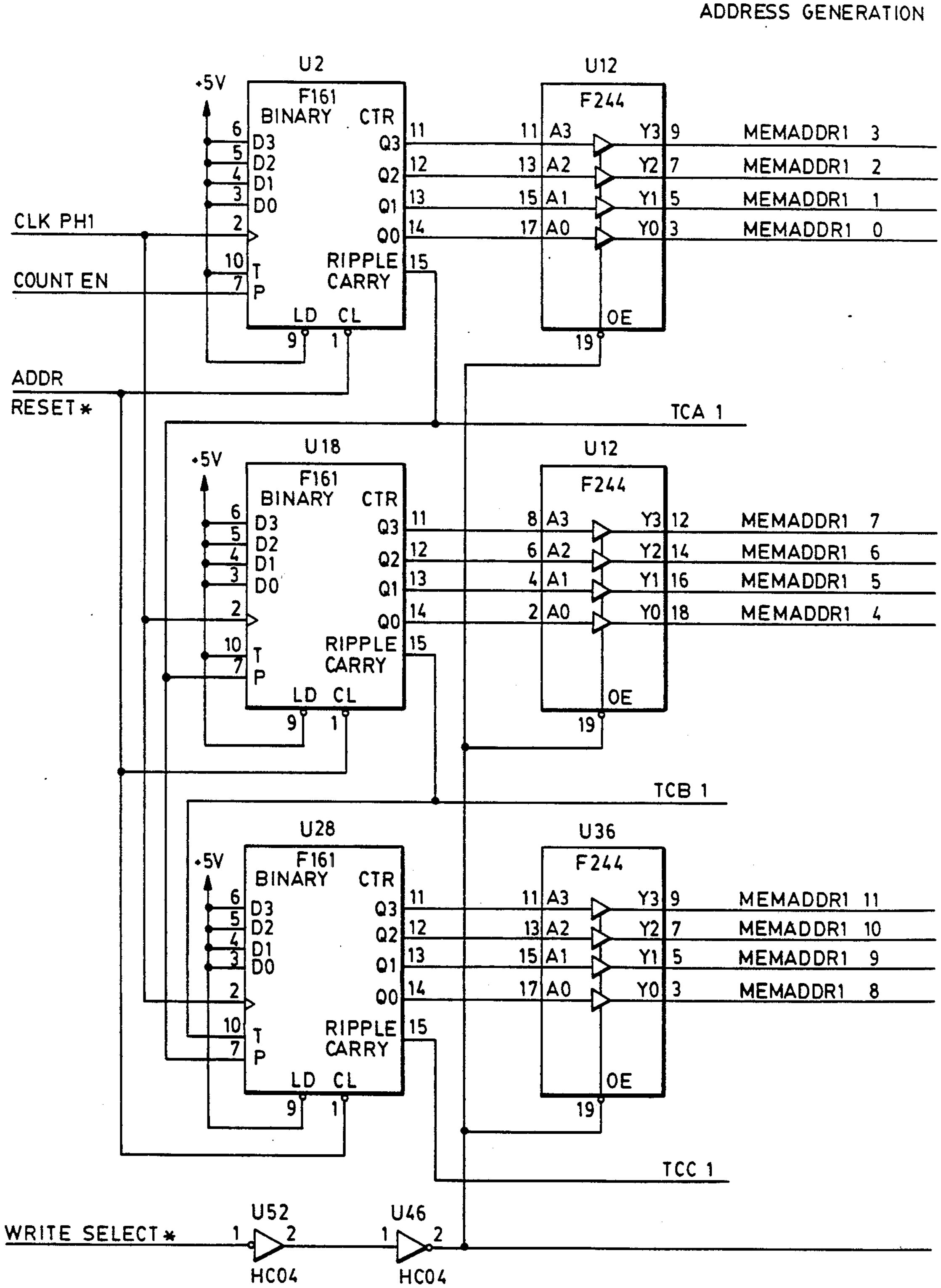
Figure 7J:
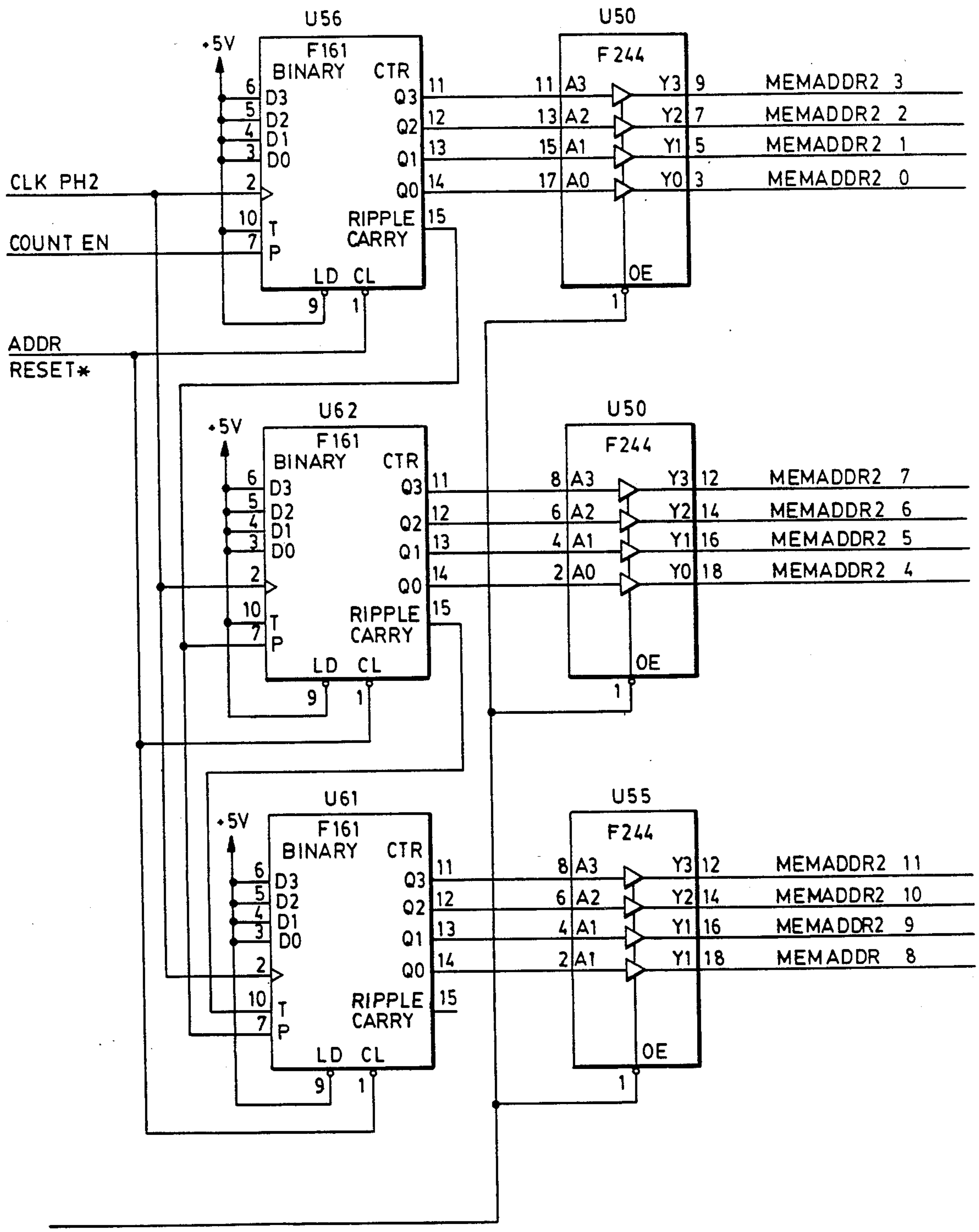
FIG. 7II illustrates in block diagram form how FIGS. 7A–7HH fit together.
Figure 7K:
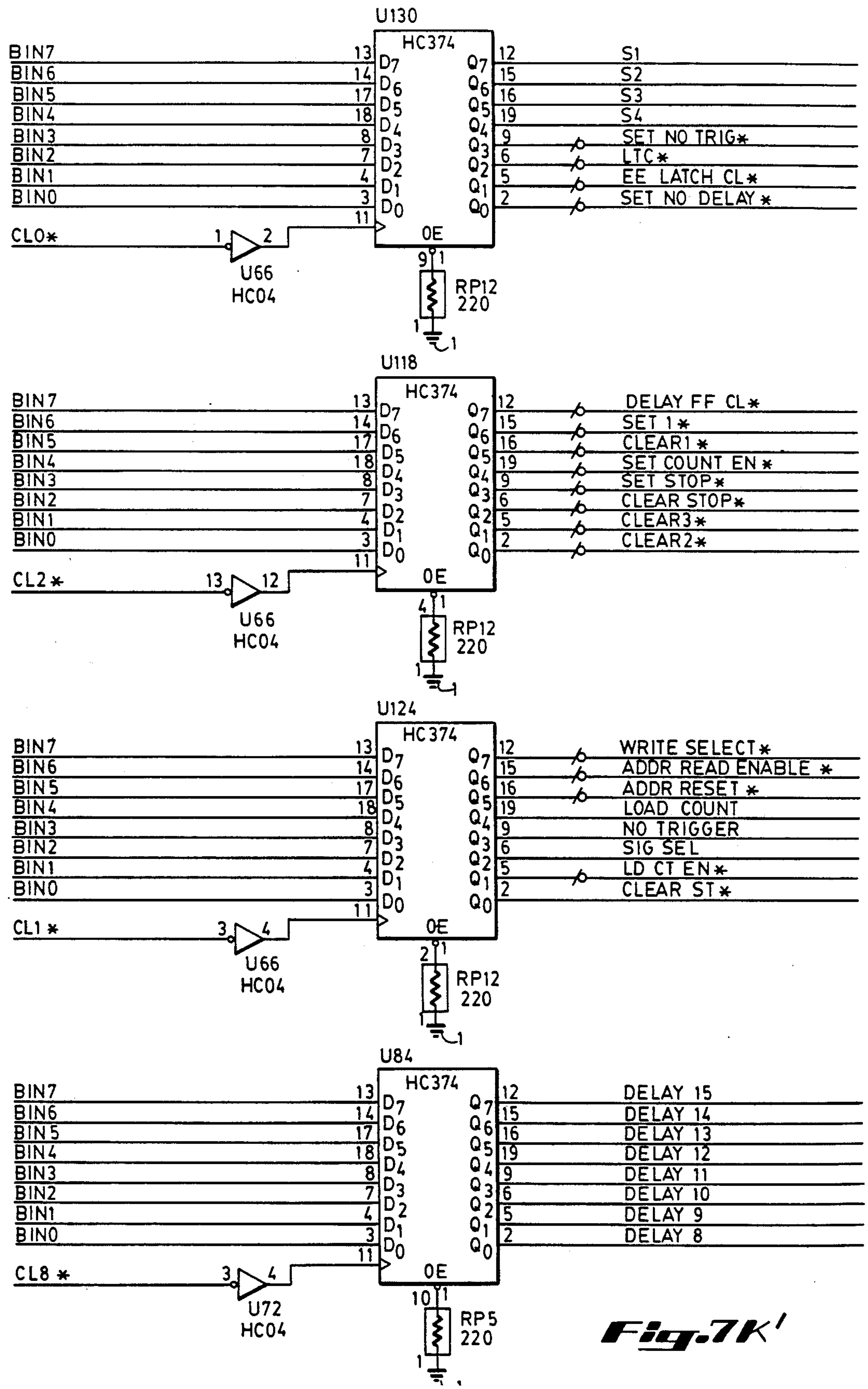
Figure 7K:
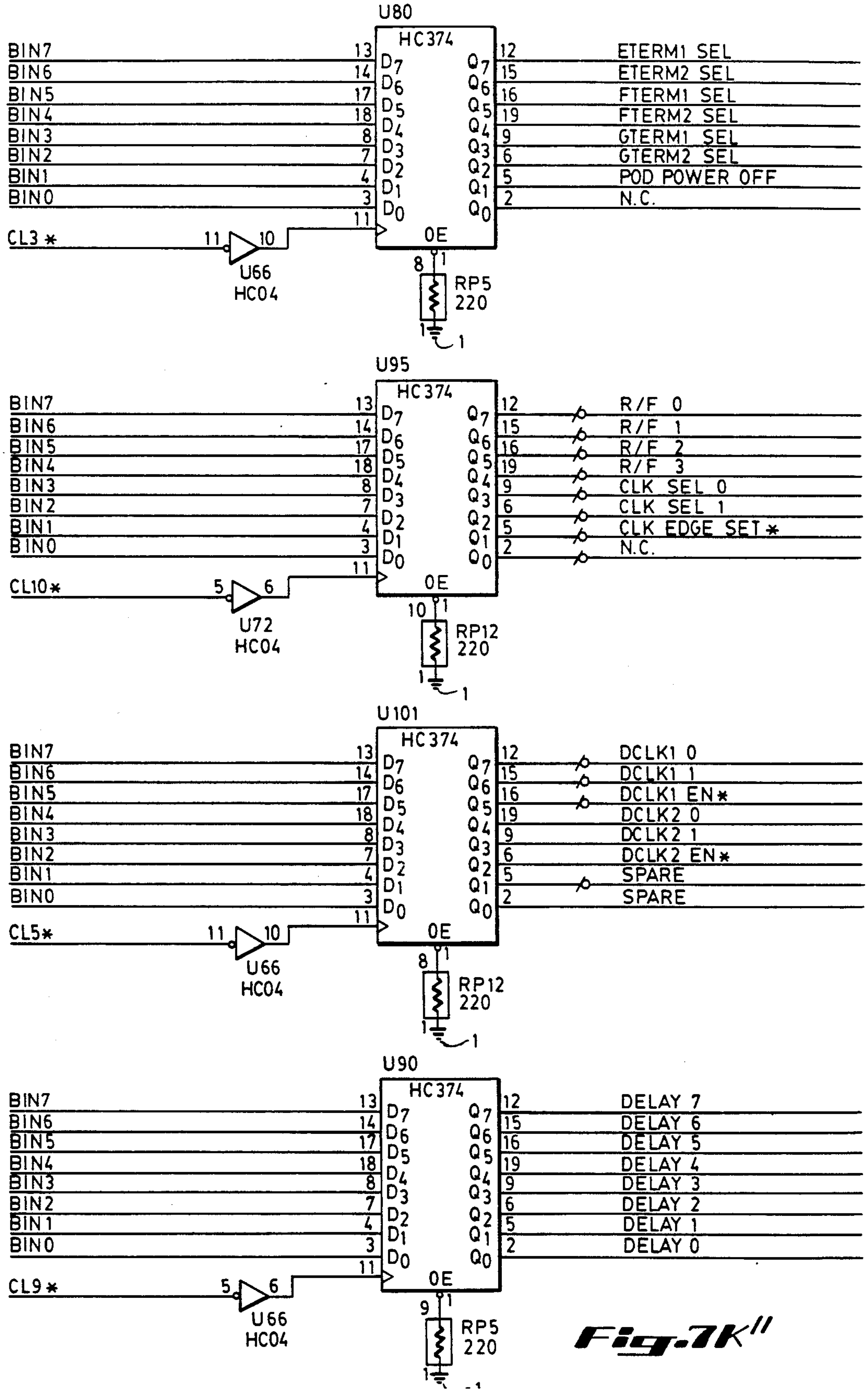
Figure 7M:
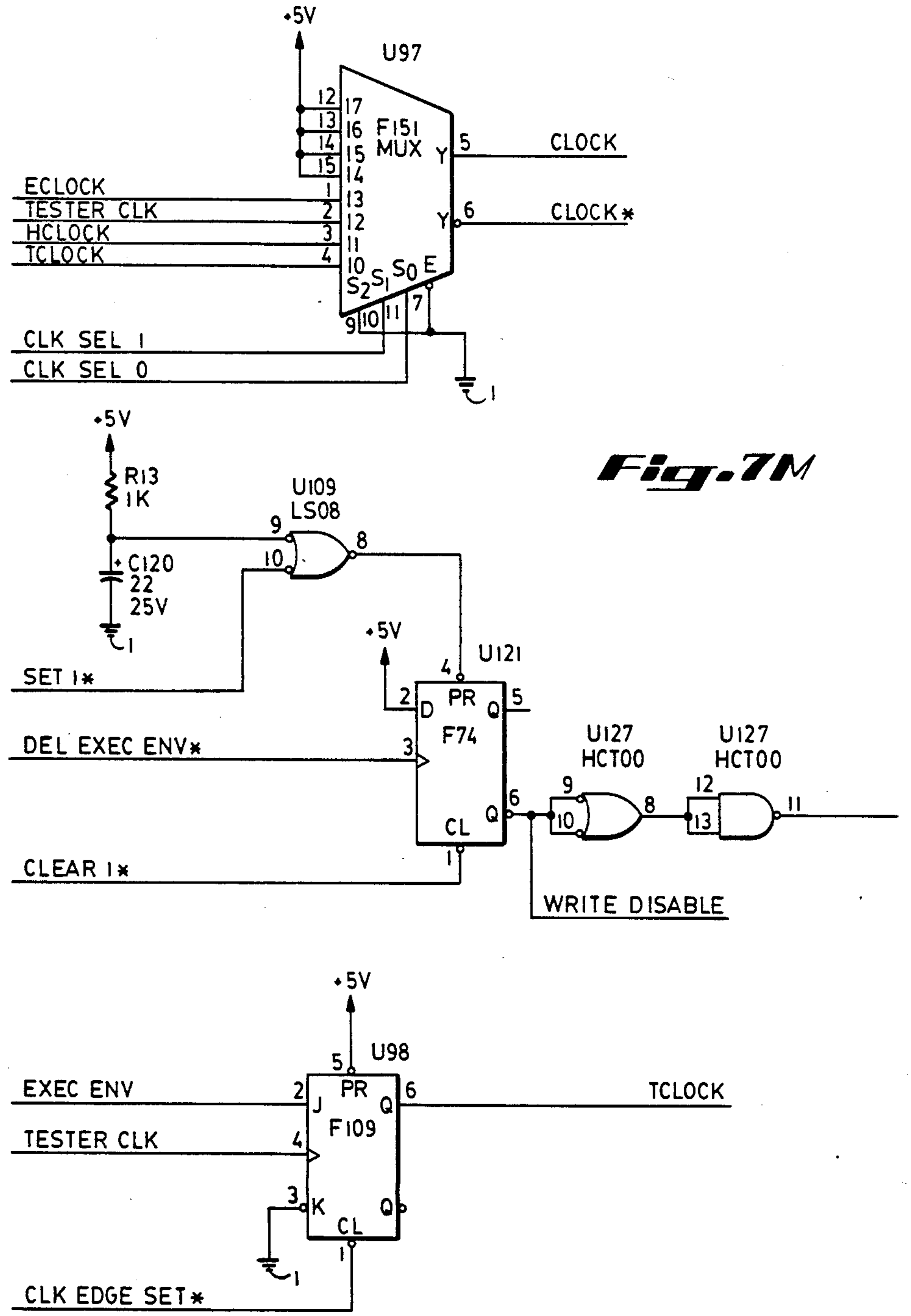
Figure 7N:
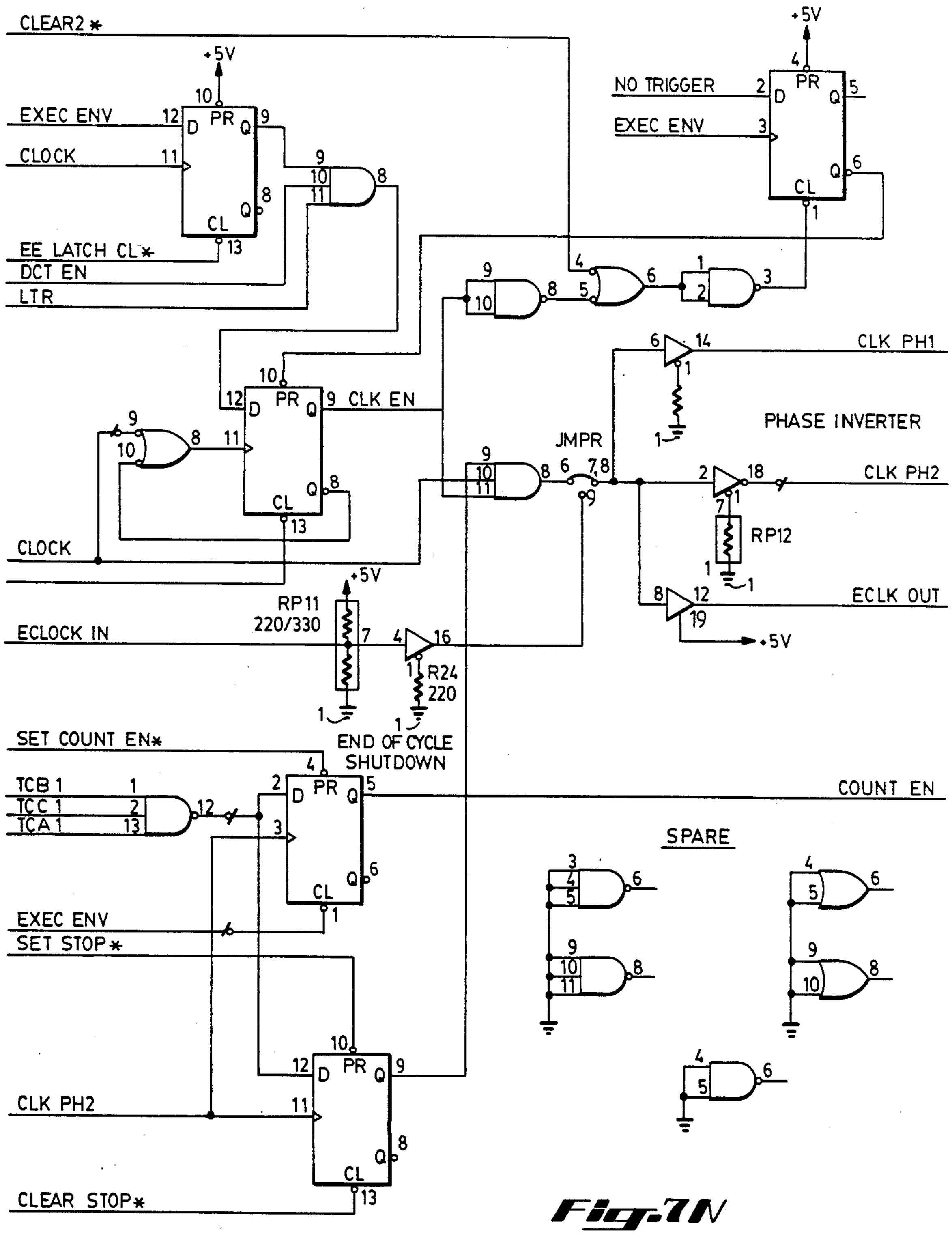
Figure 70:
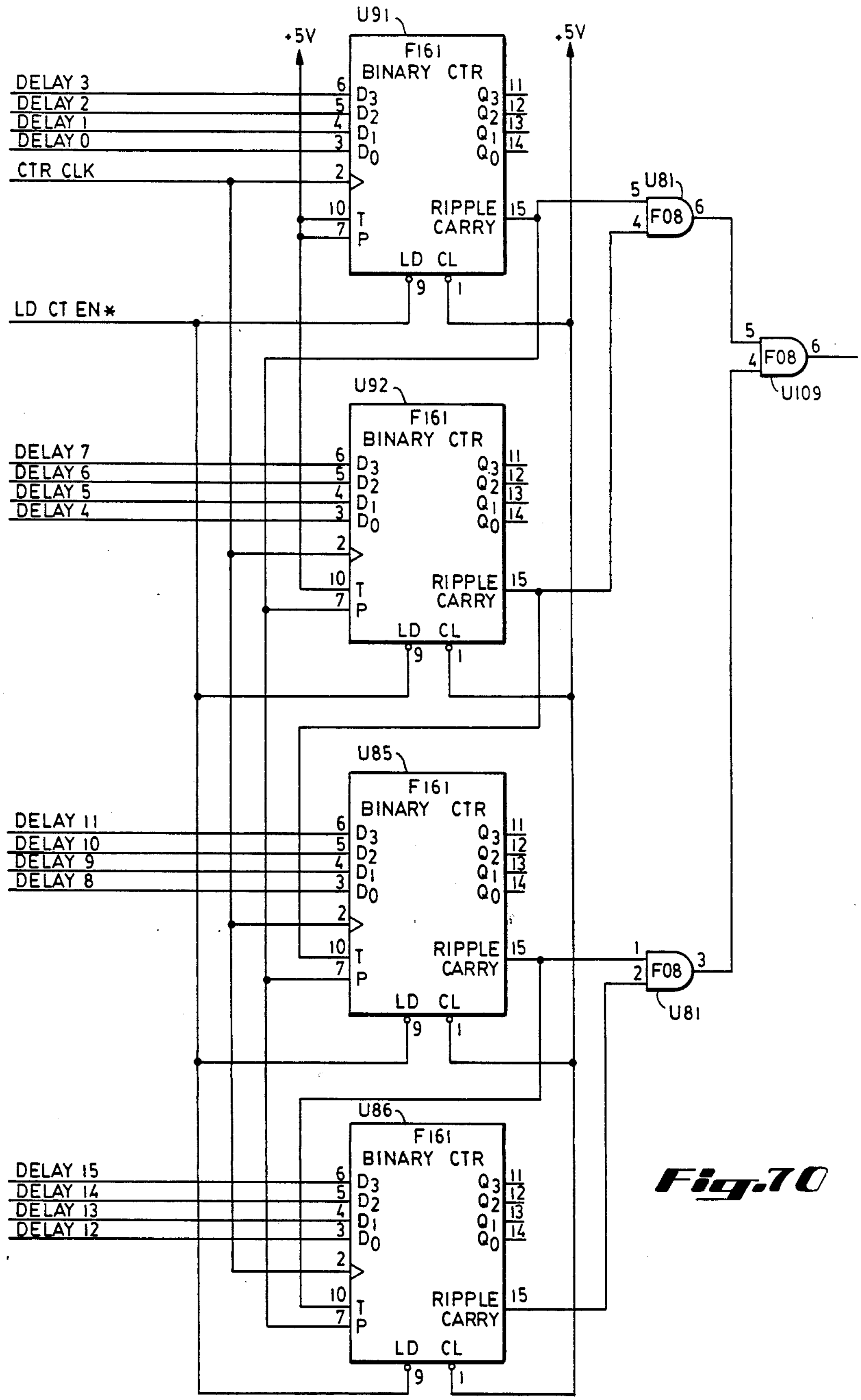
Figure 7P:
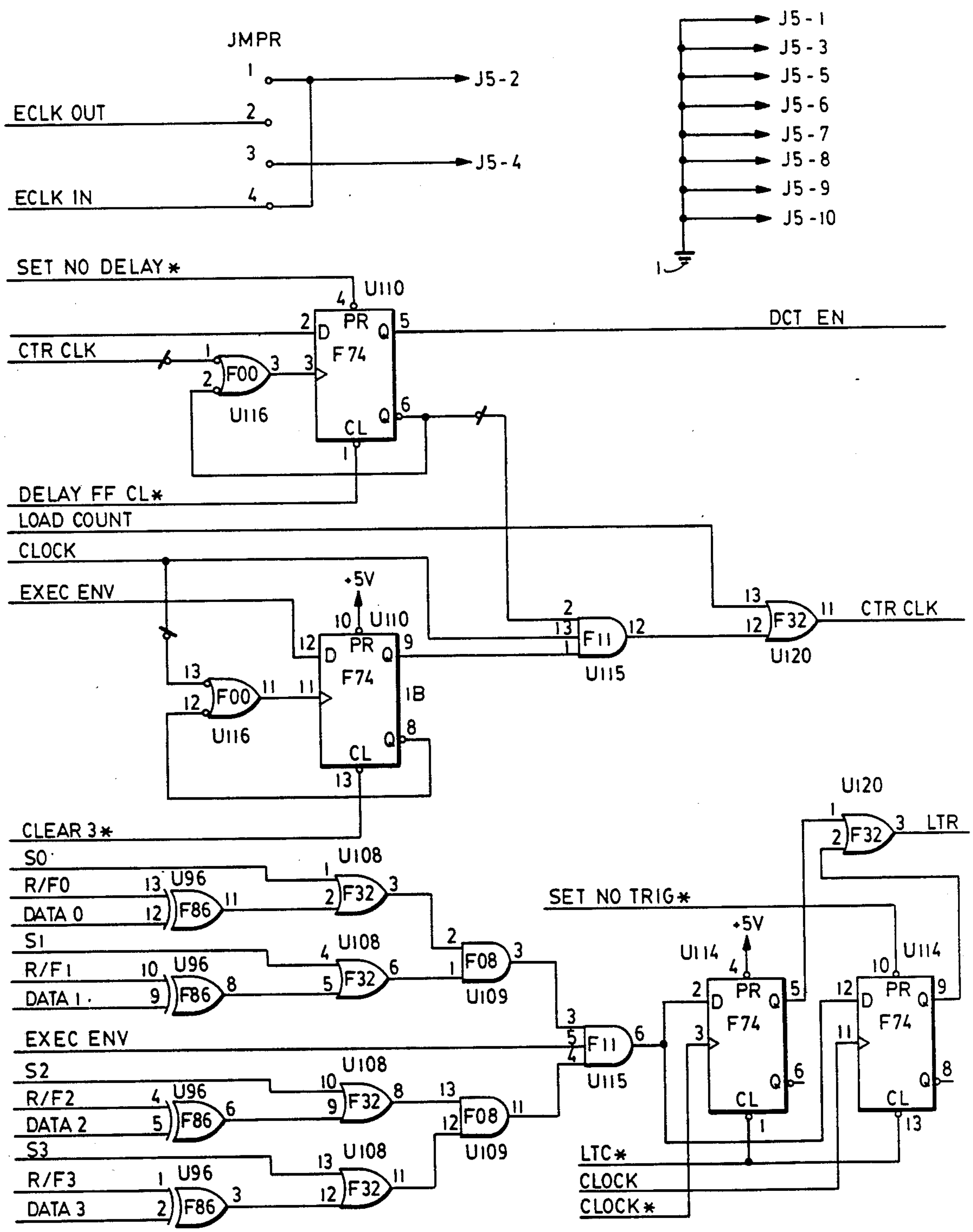
Figure 7Q:
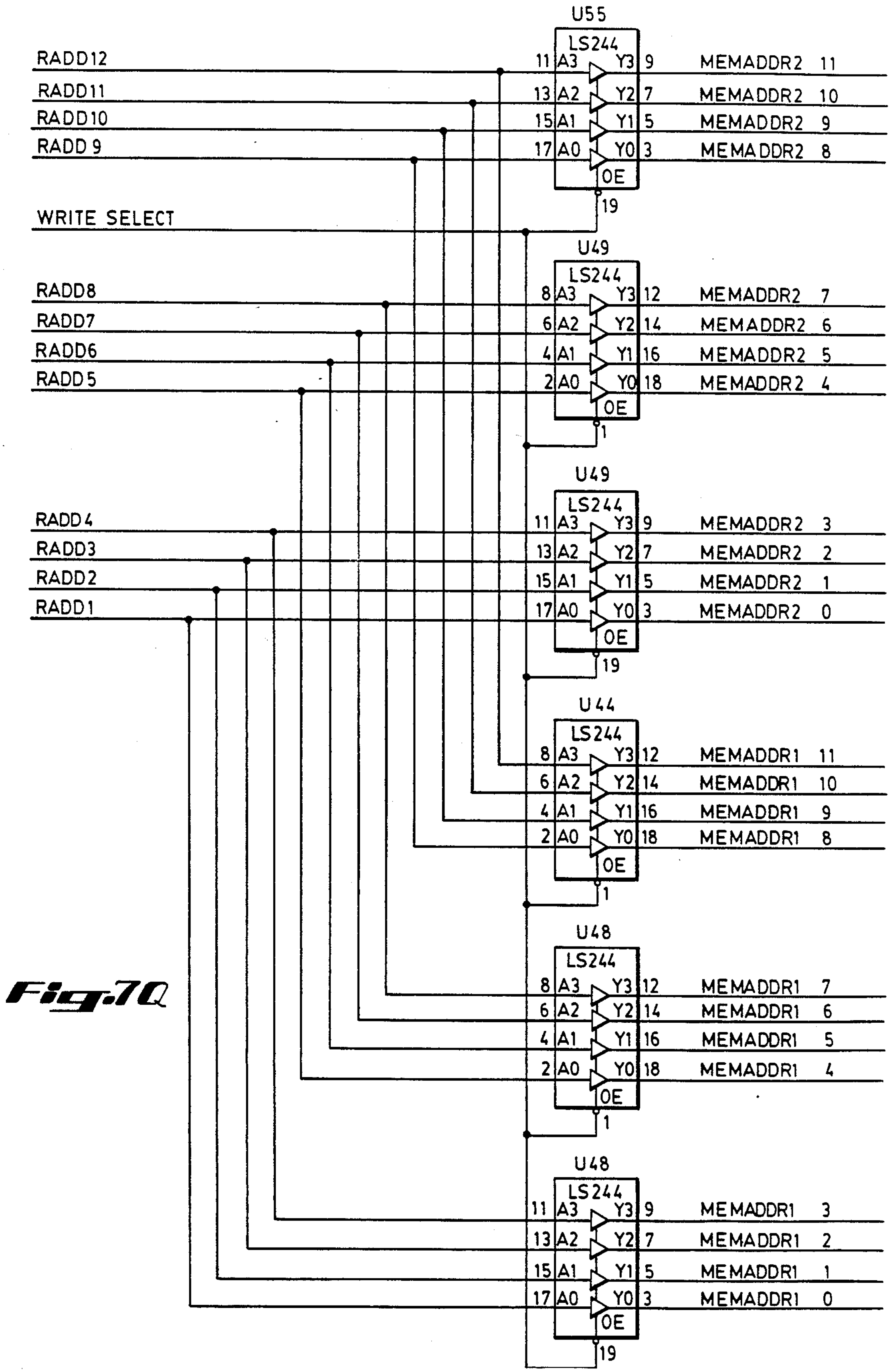
Figure 7R:
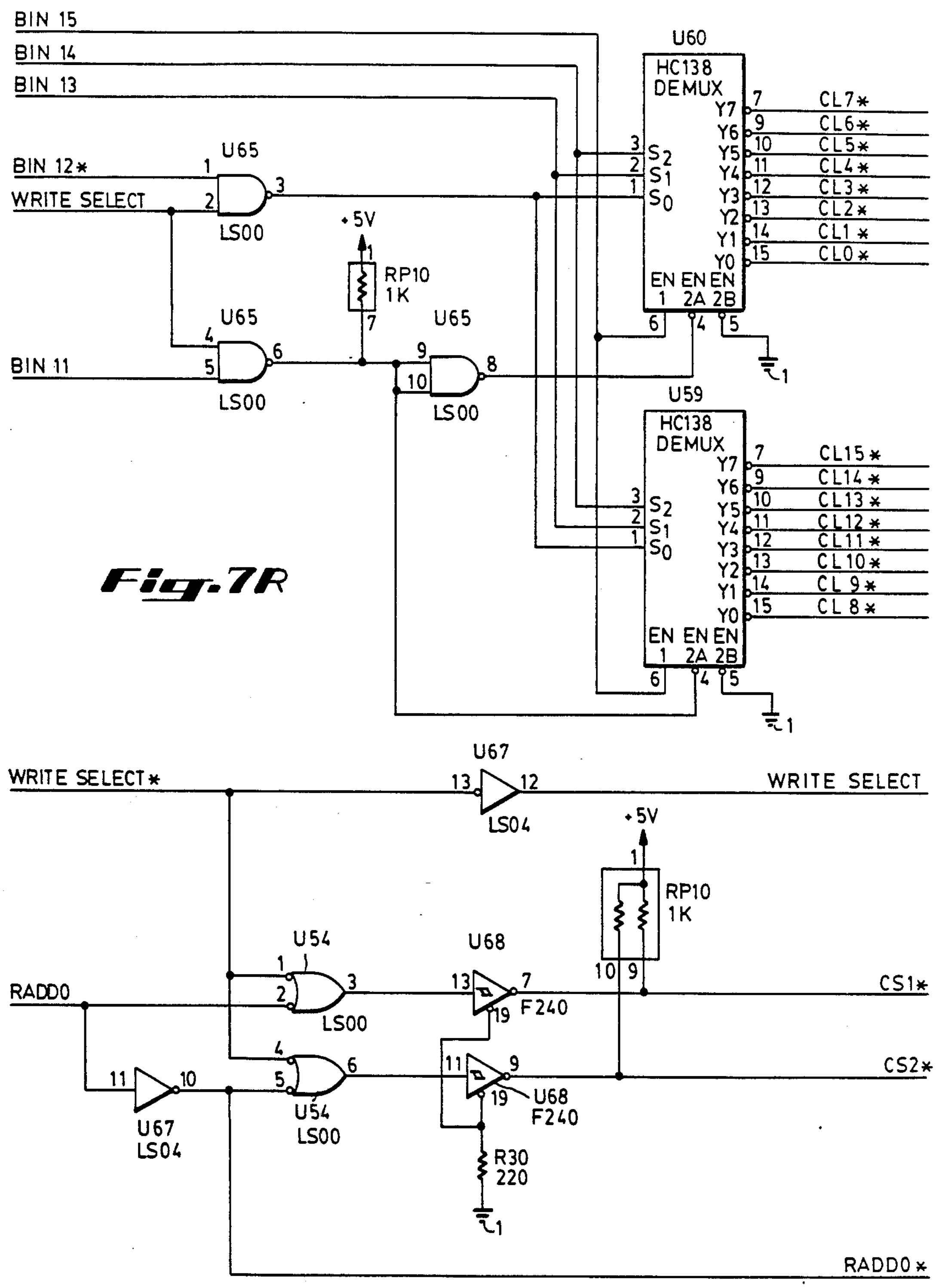
Figure 75:
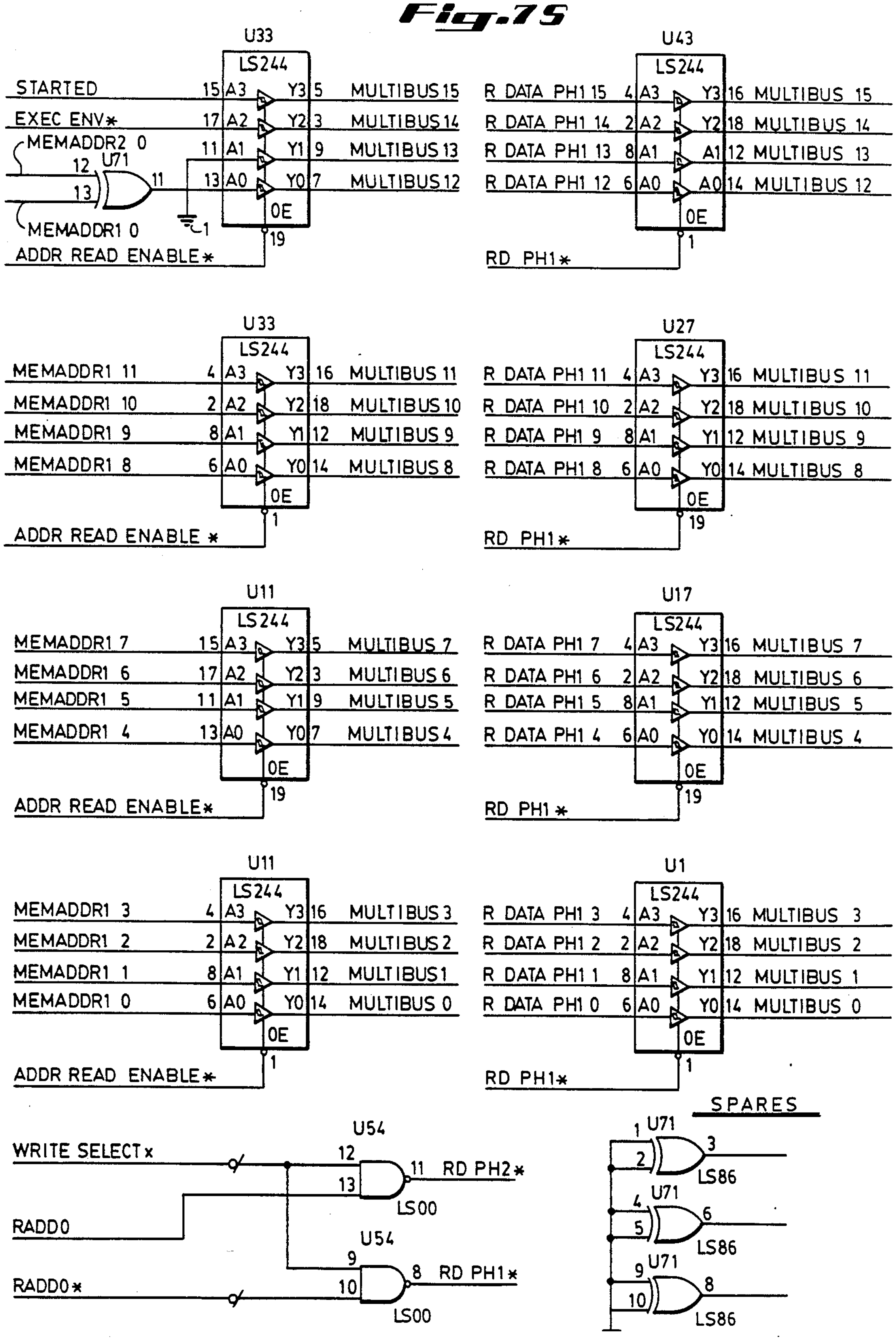
Figure 7T:
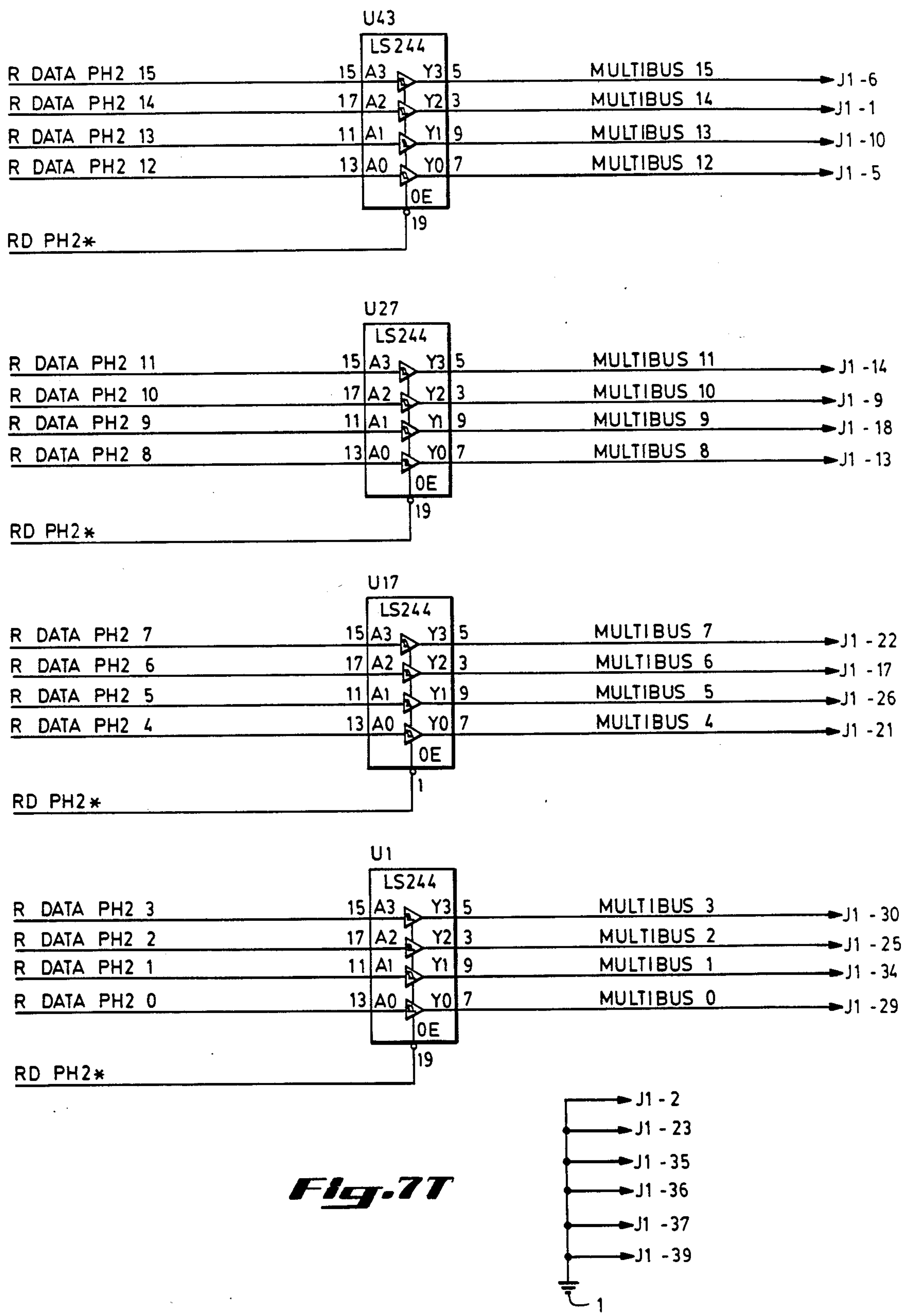
Figure 7U:
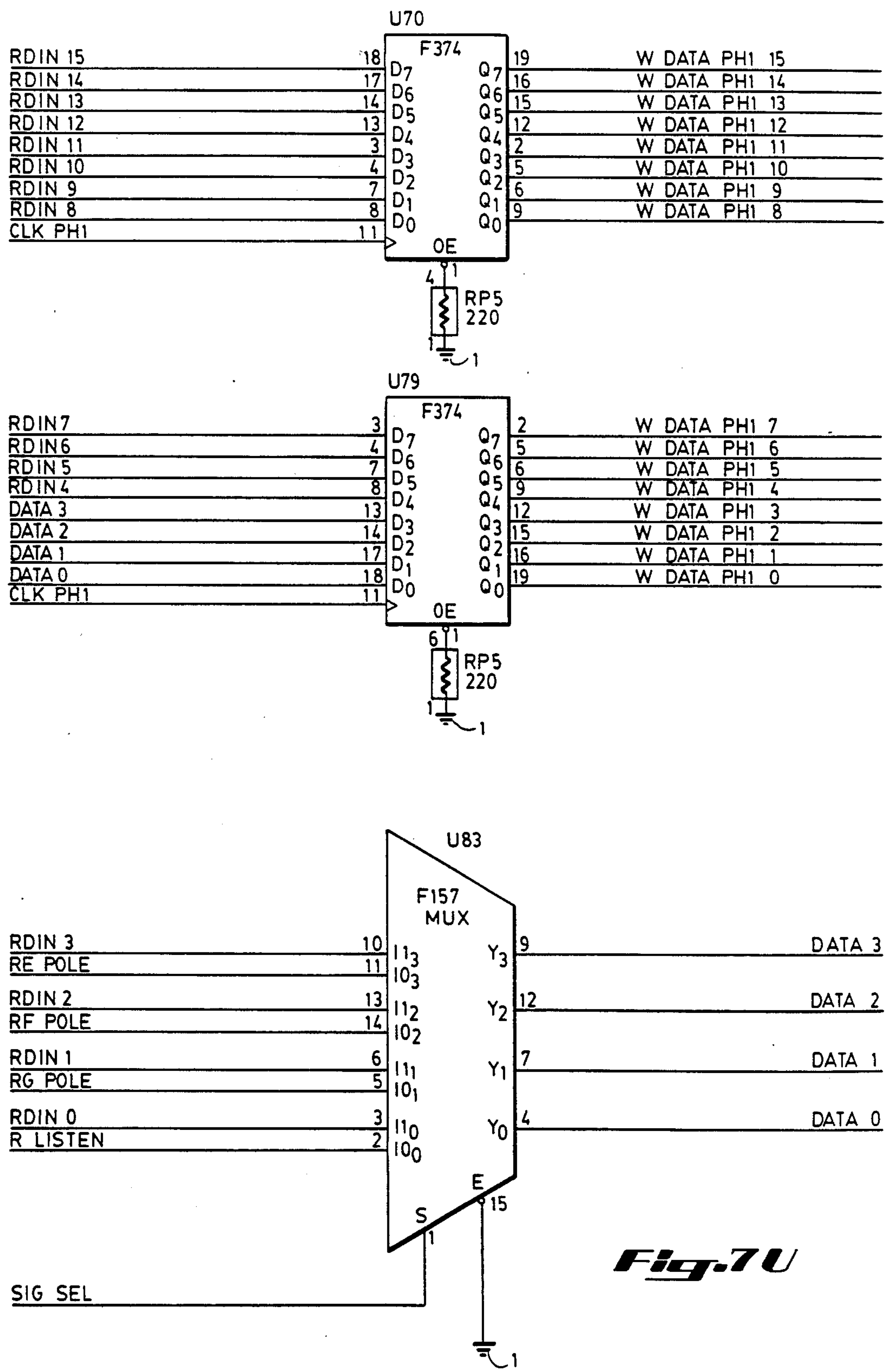
Figure 7V:
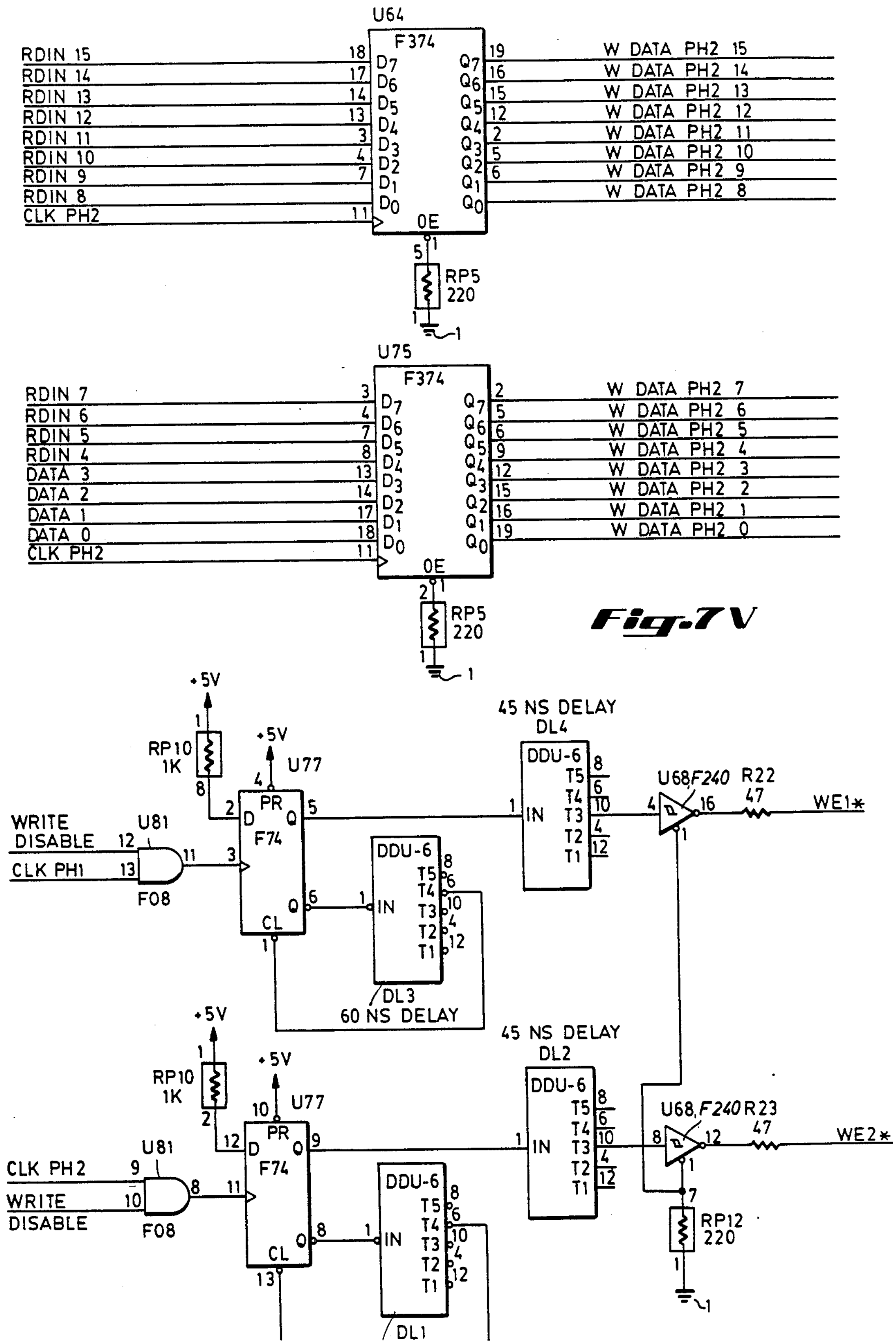
Figure 7Y:
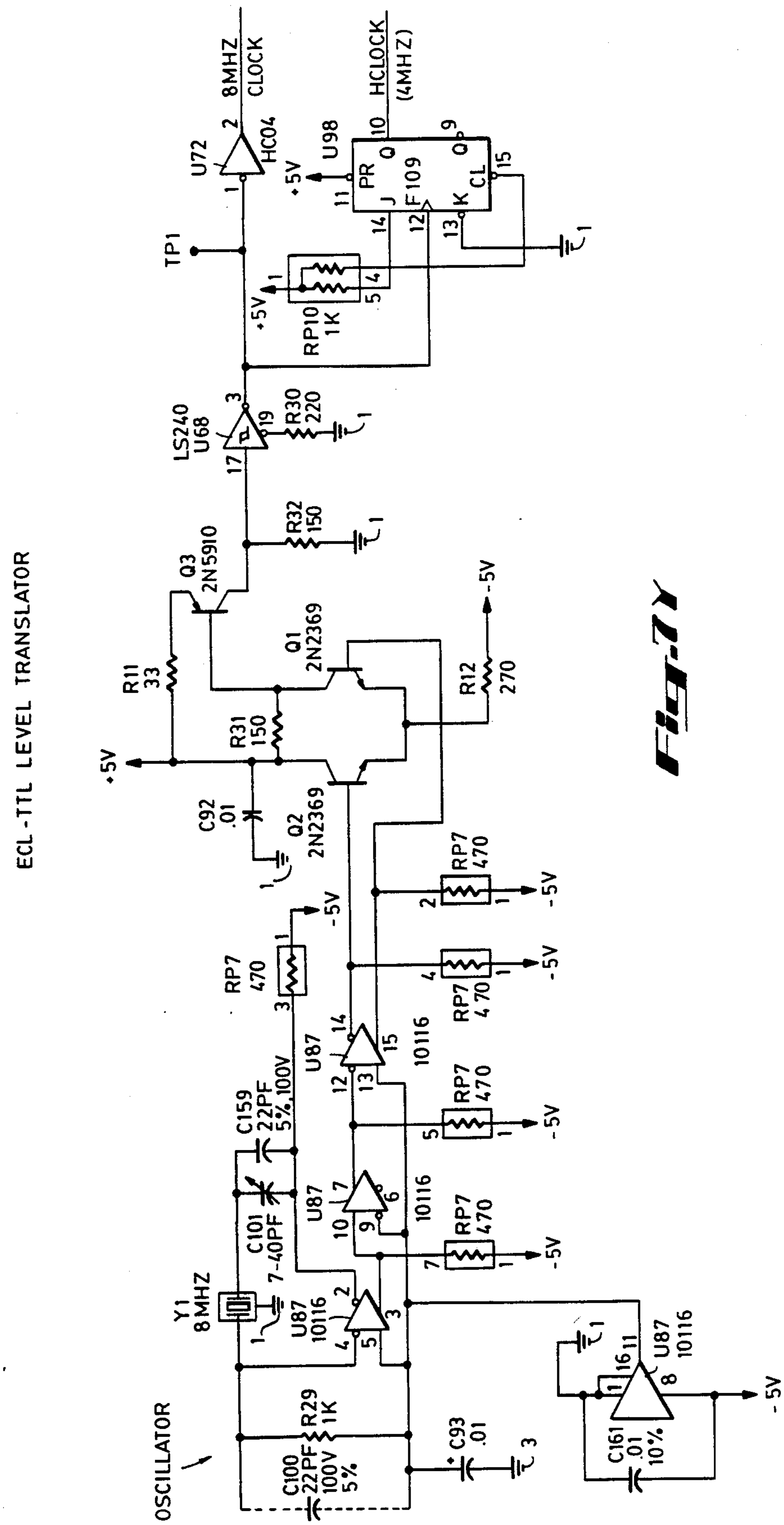
Figure 7Z:
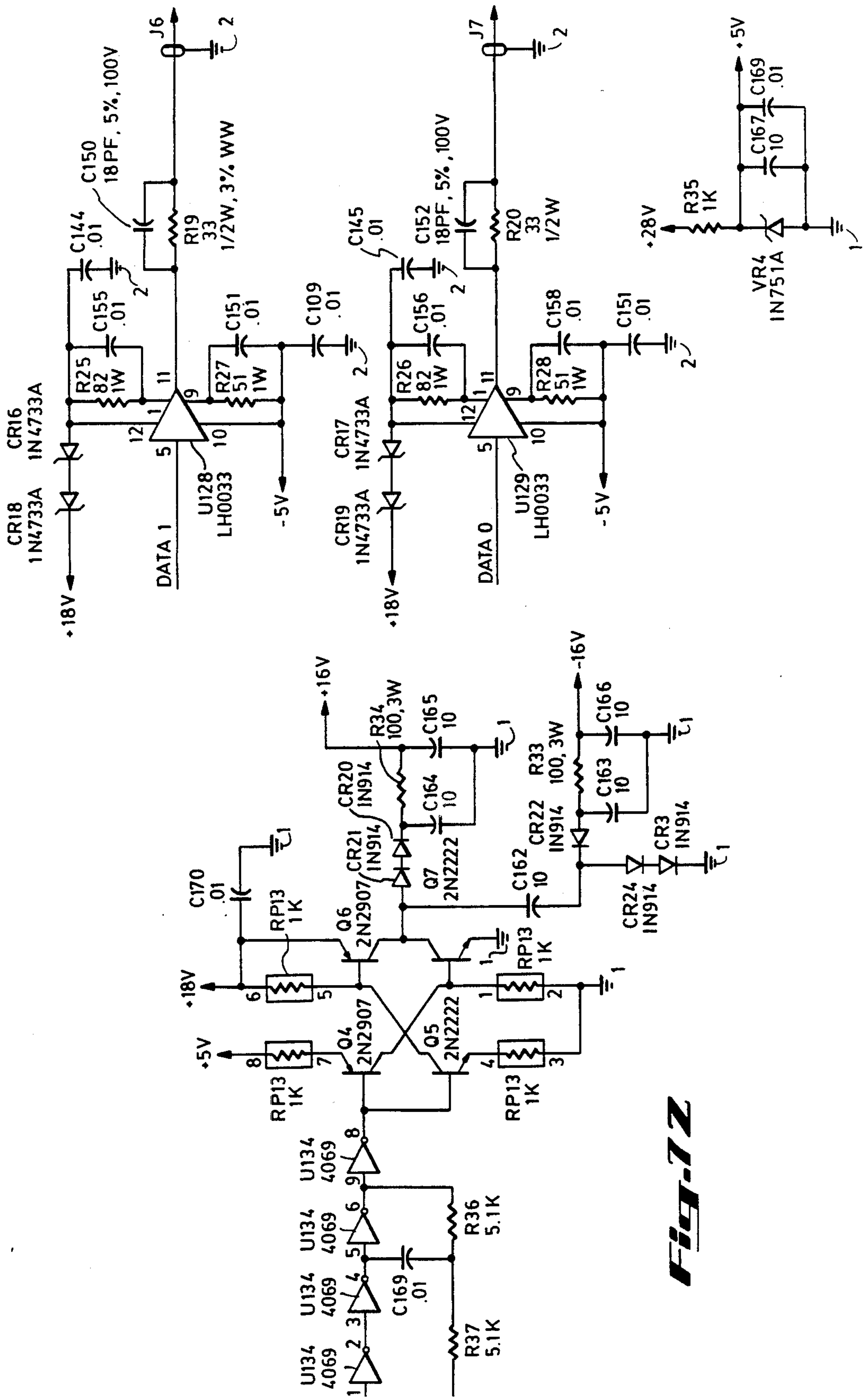
Figure 7A:
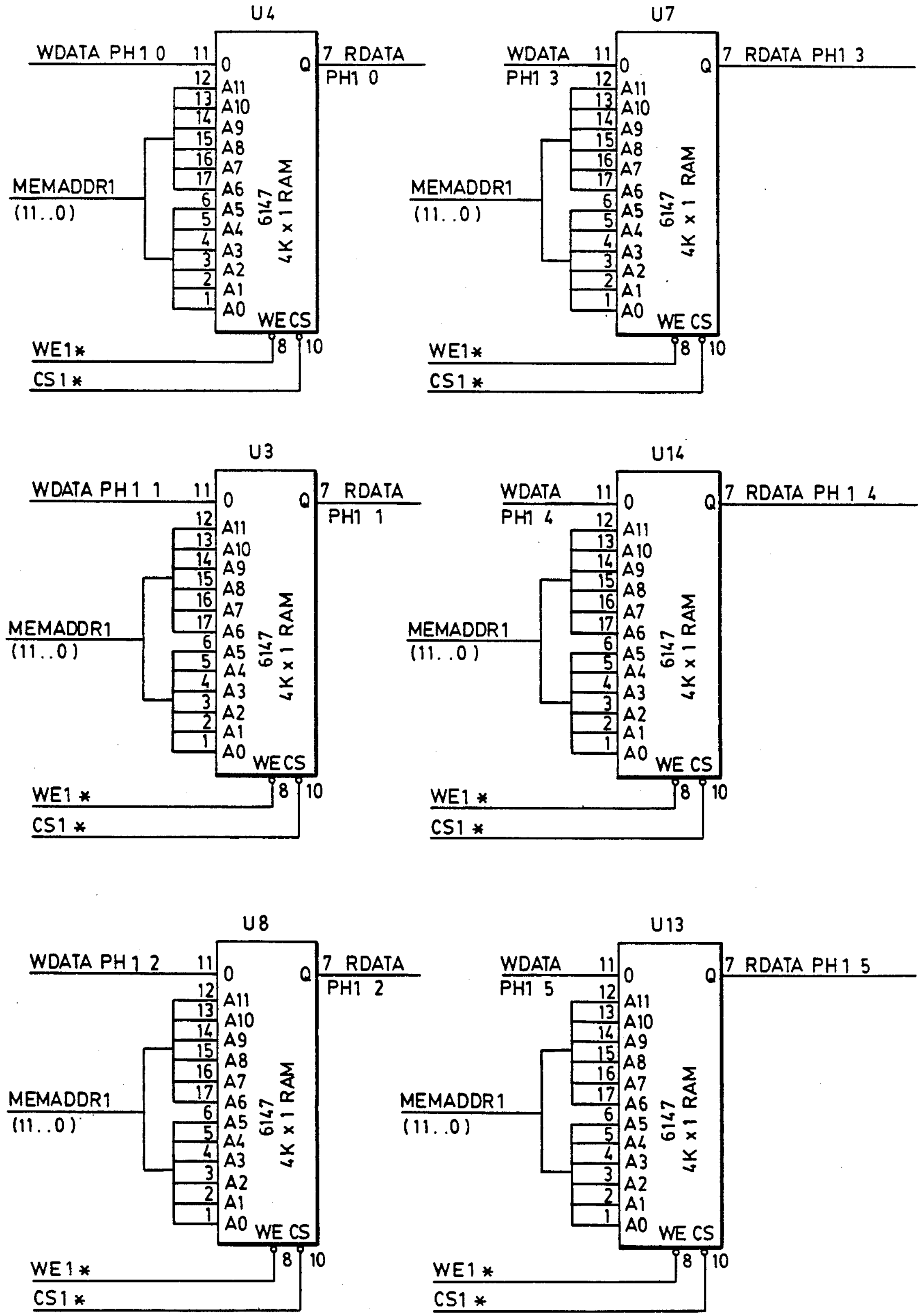
Figure 78B:
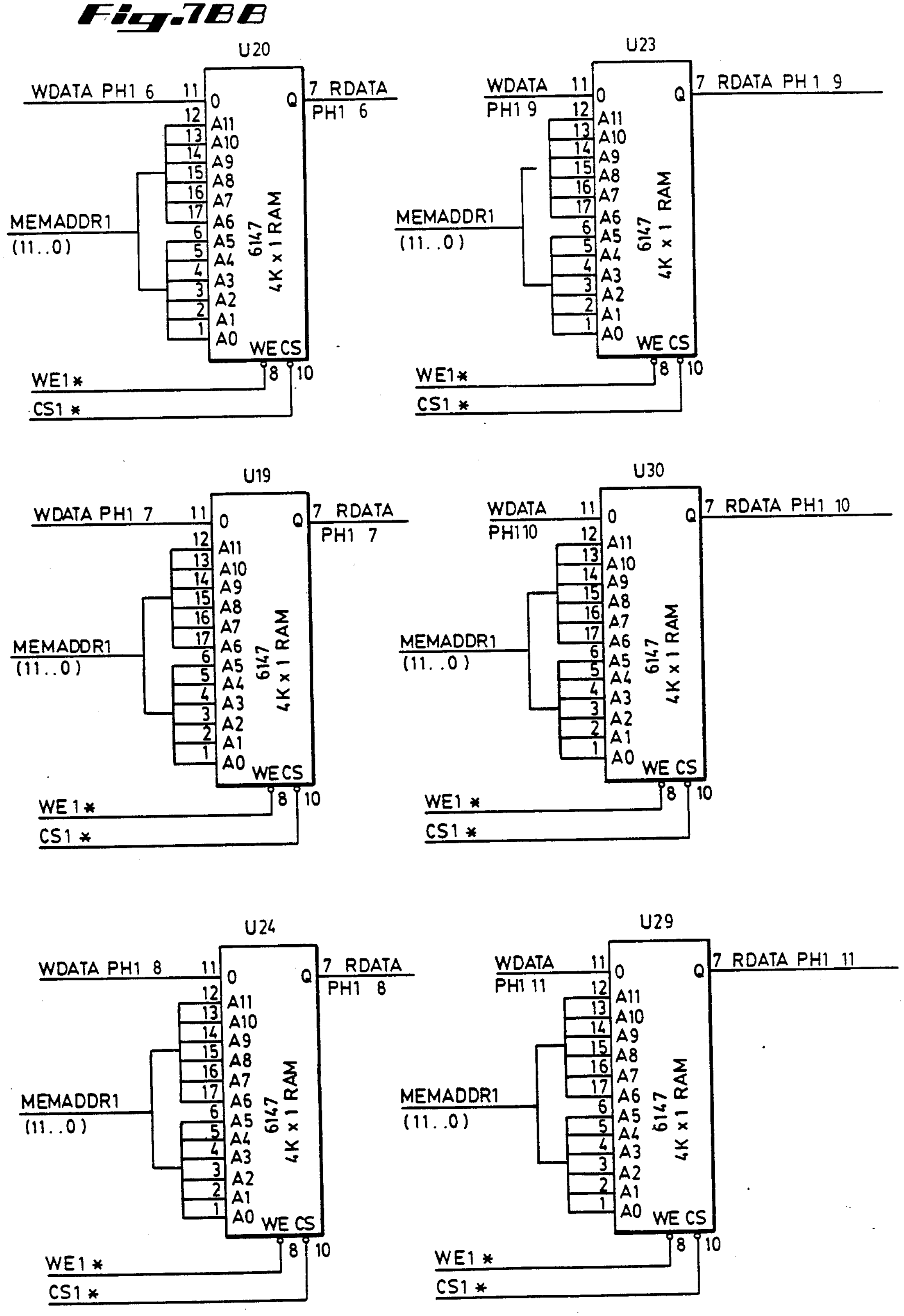
Figure 7C:
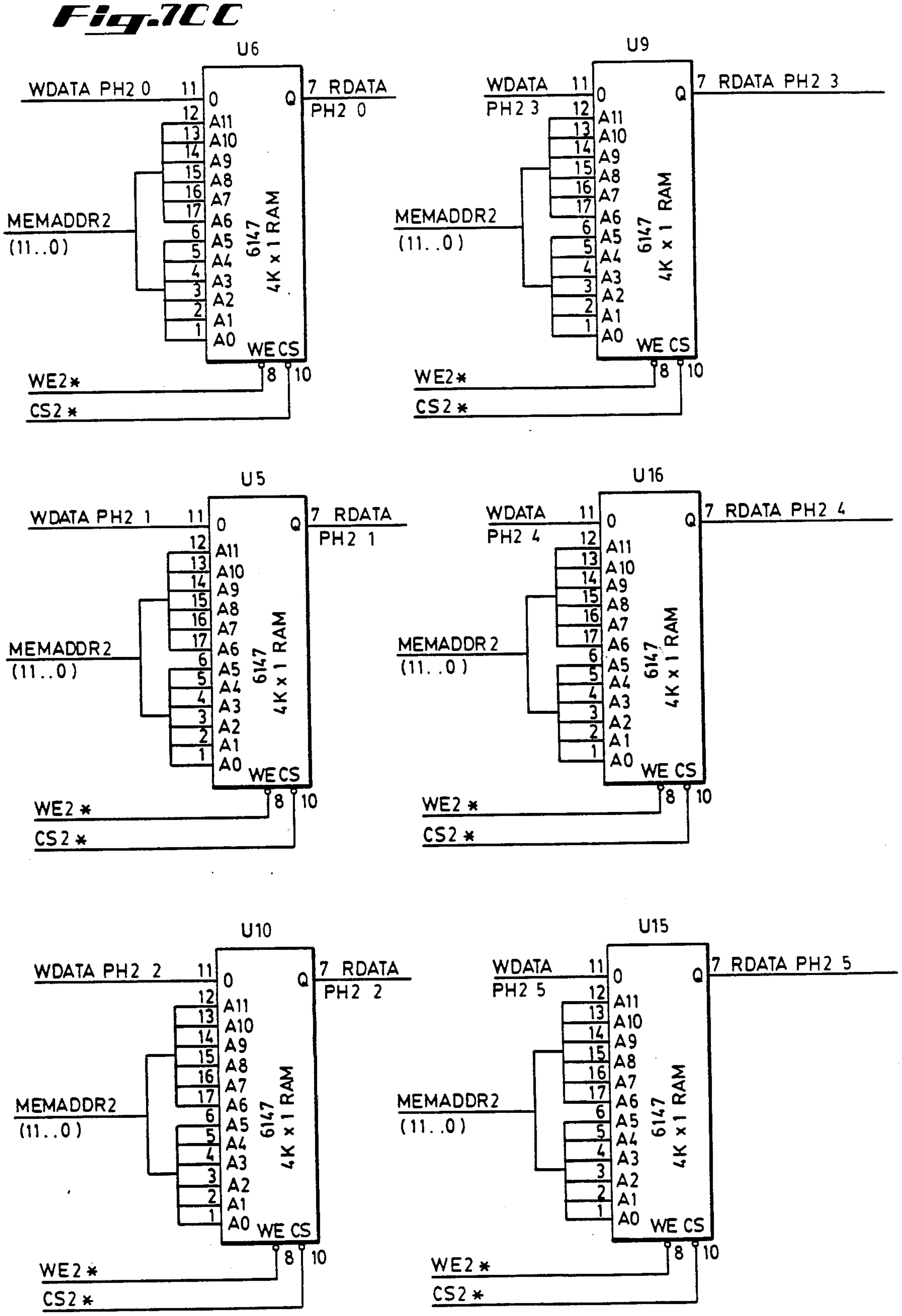
Figure 10D:
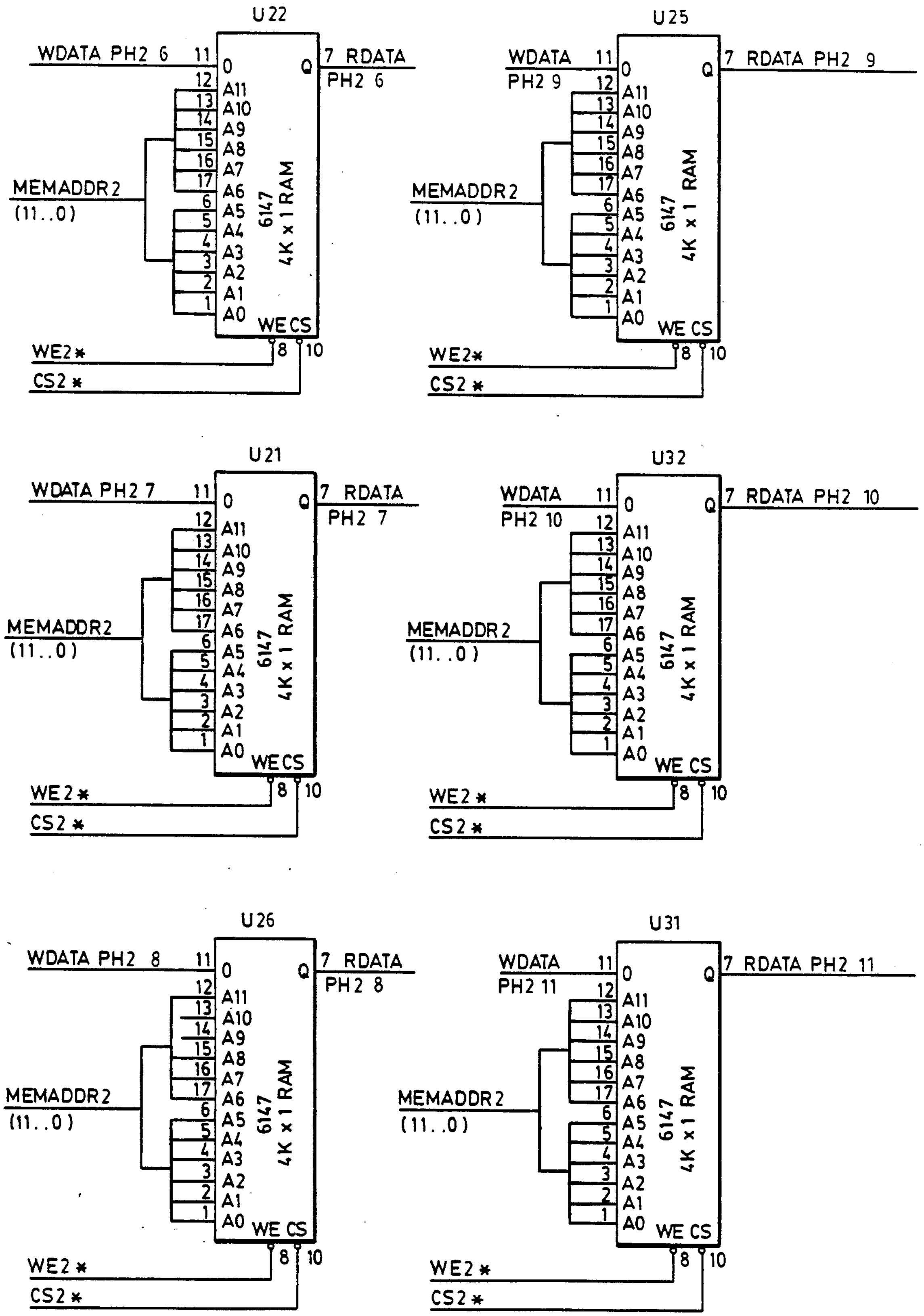
FIG. 10 illustrates in flow chart form the Ztop software module 274 illustrated in FIG. 9.
Figure 7E:
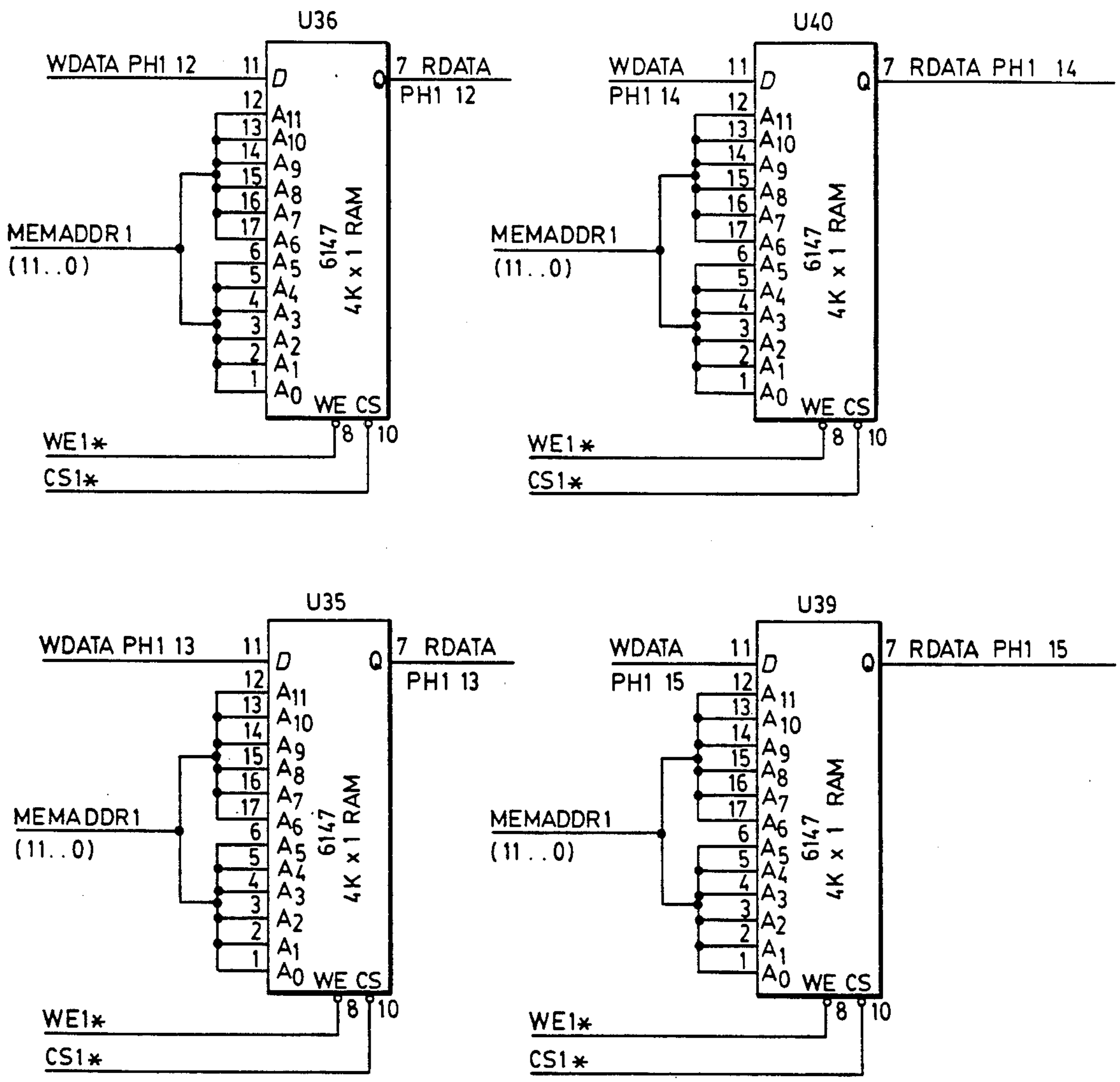
Figure 7F:
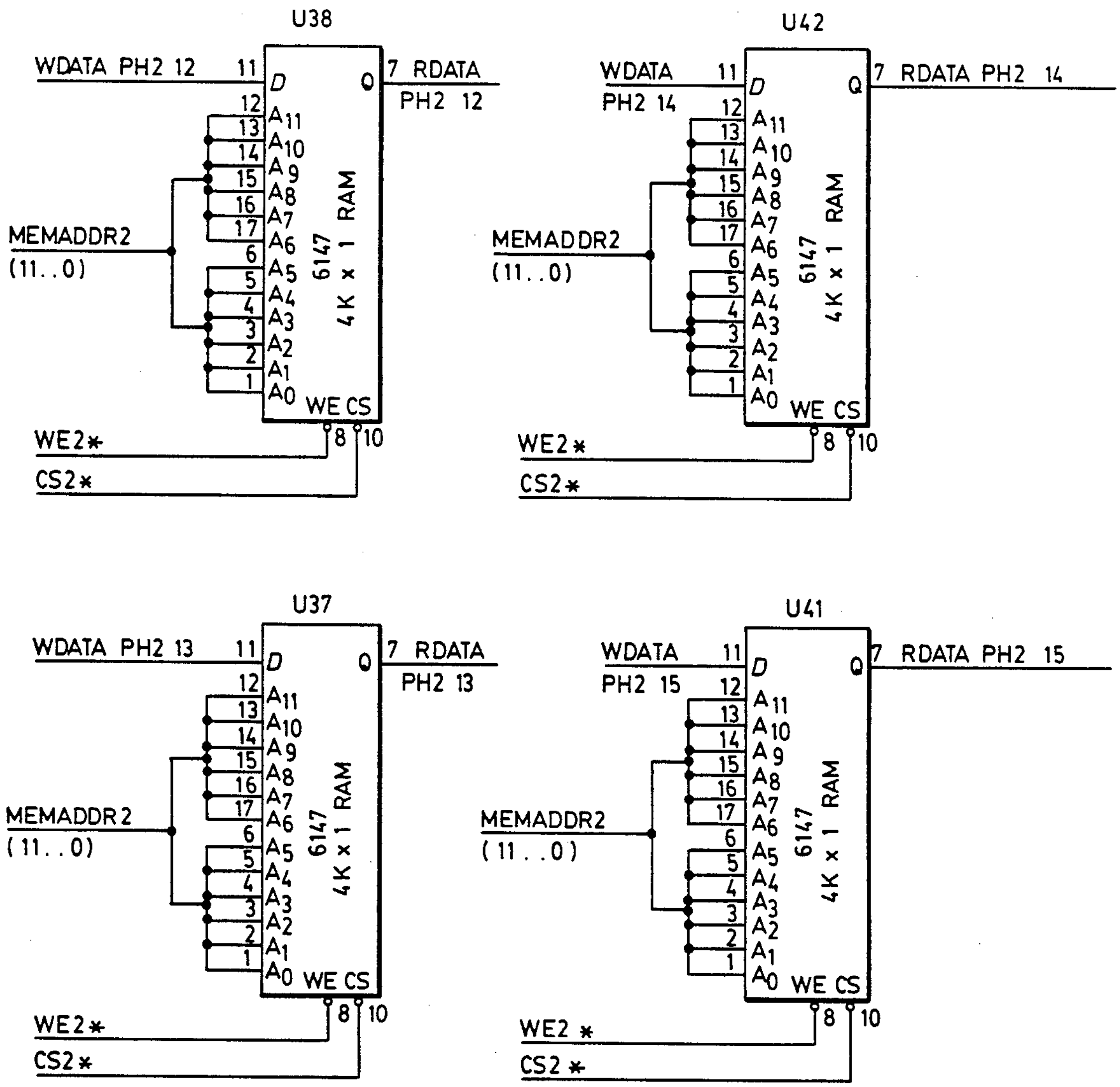
Figure 7G:
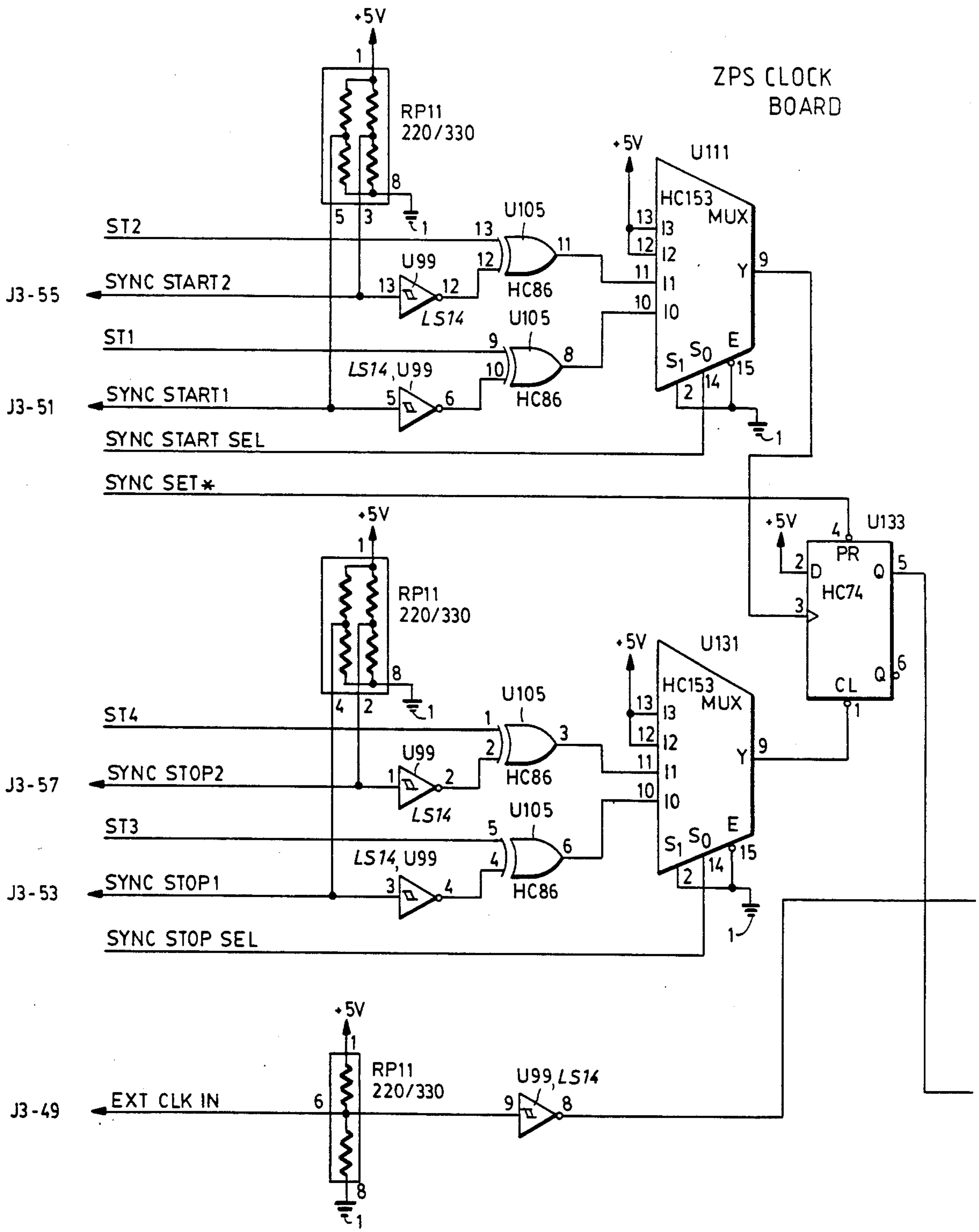
Figure 7H:
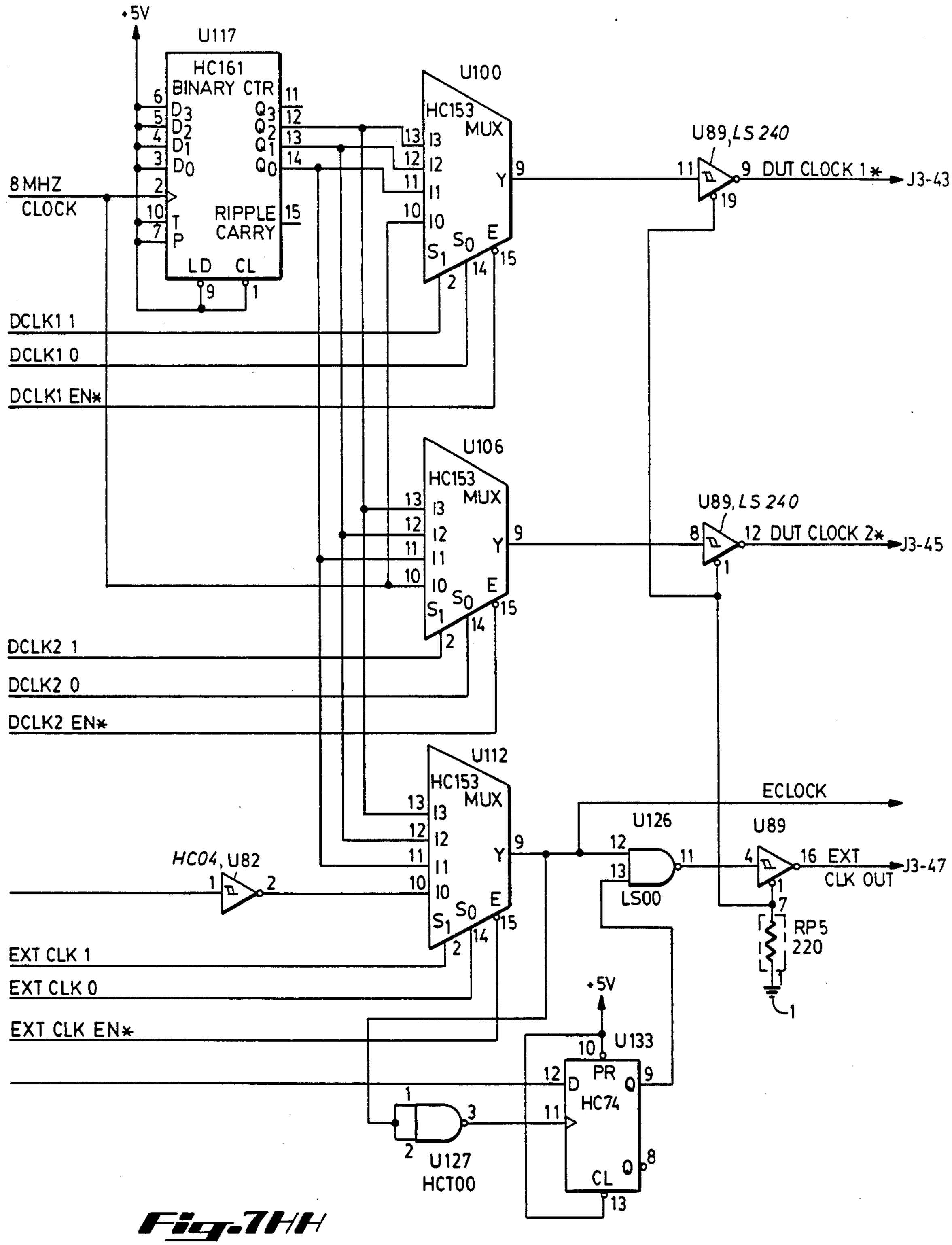
Figure 7I:
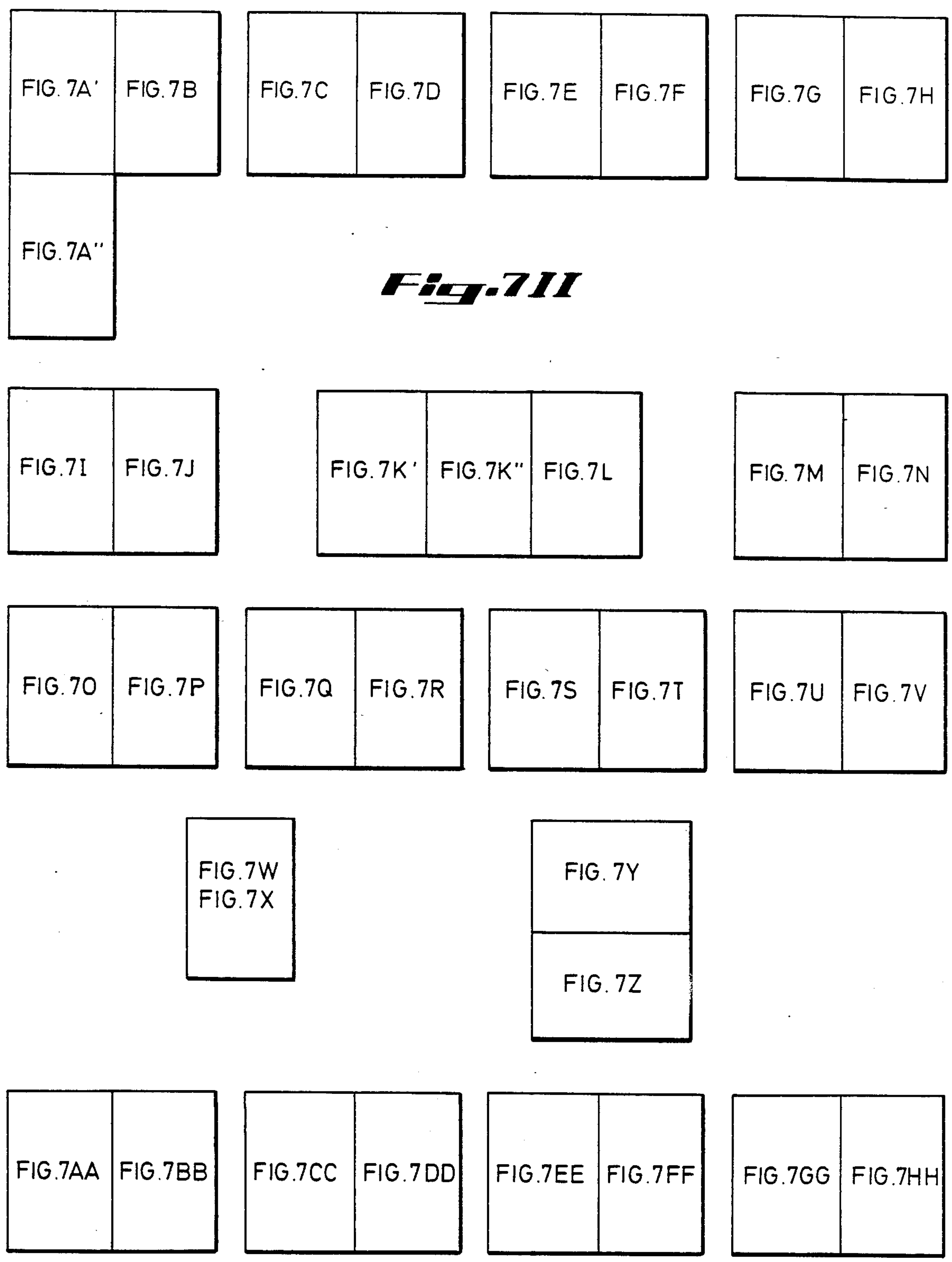
Figure 19P:
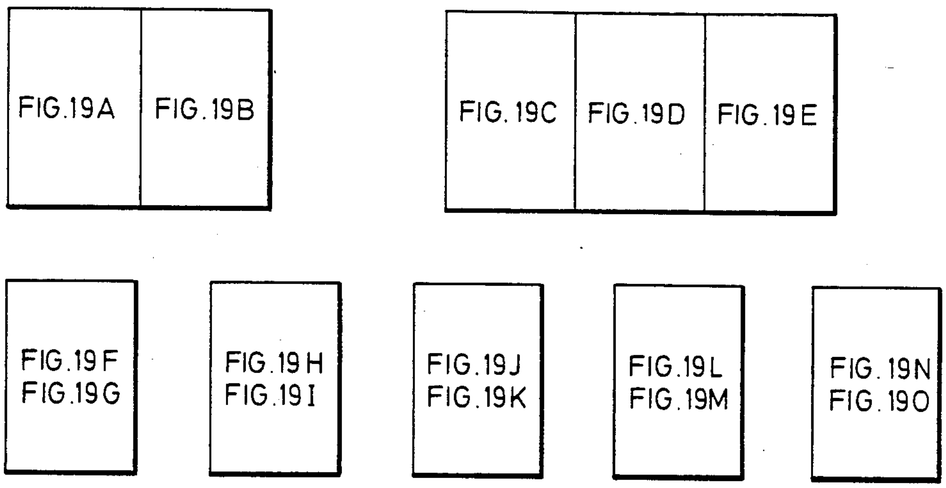
FIG. 19P illustrates in block diagram form how FIGS. 19A–19O fit together.
Figure 19A:
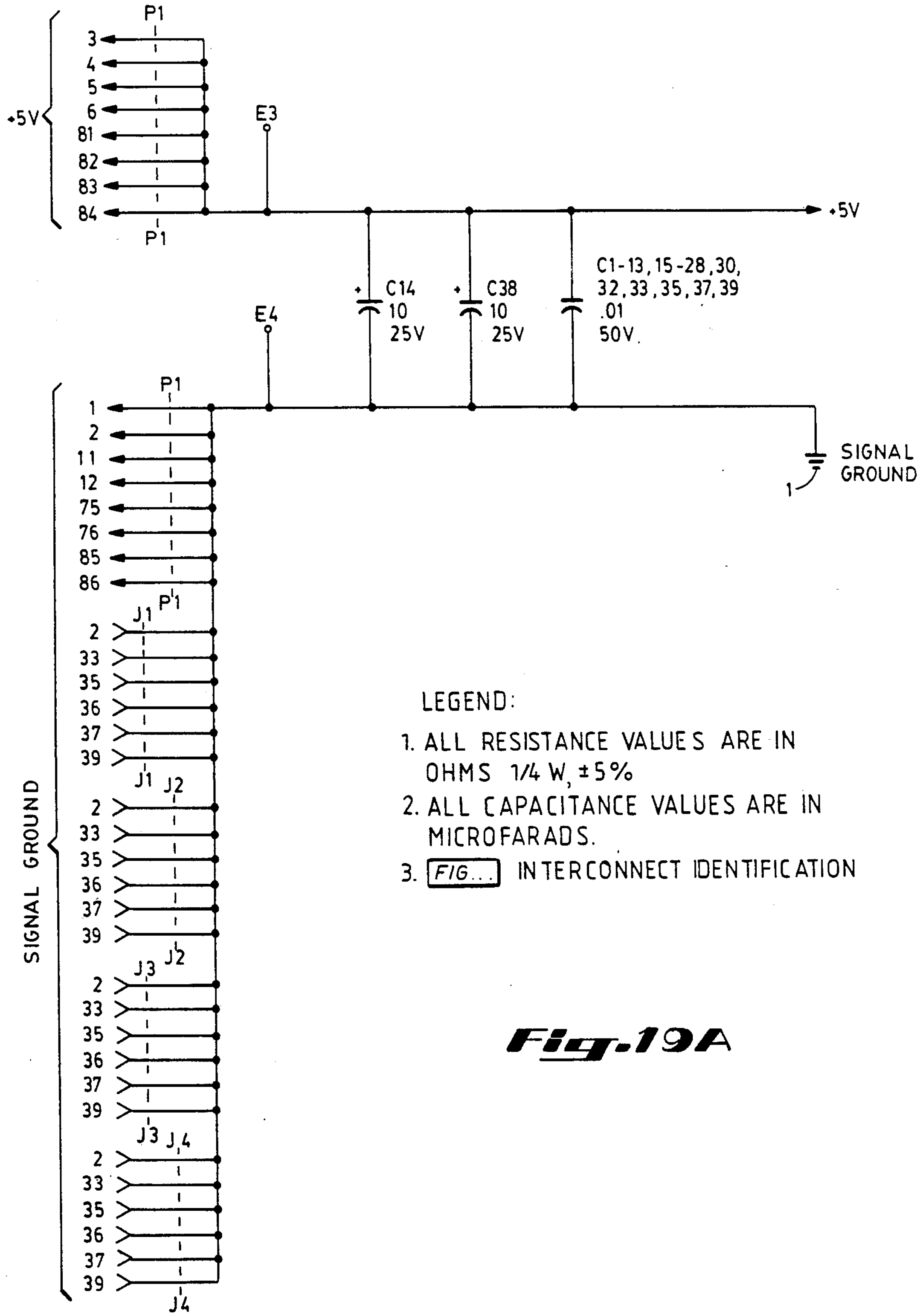
FIGS. 19A–19O illustrate in schematic diagram form the parallel input/output board 34 of FIG. 1.
Figure 19B:
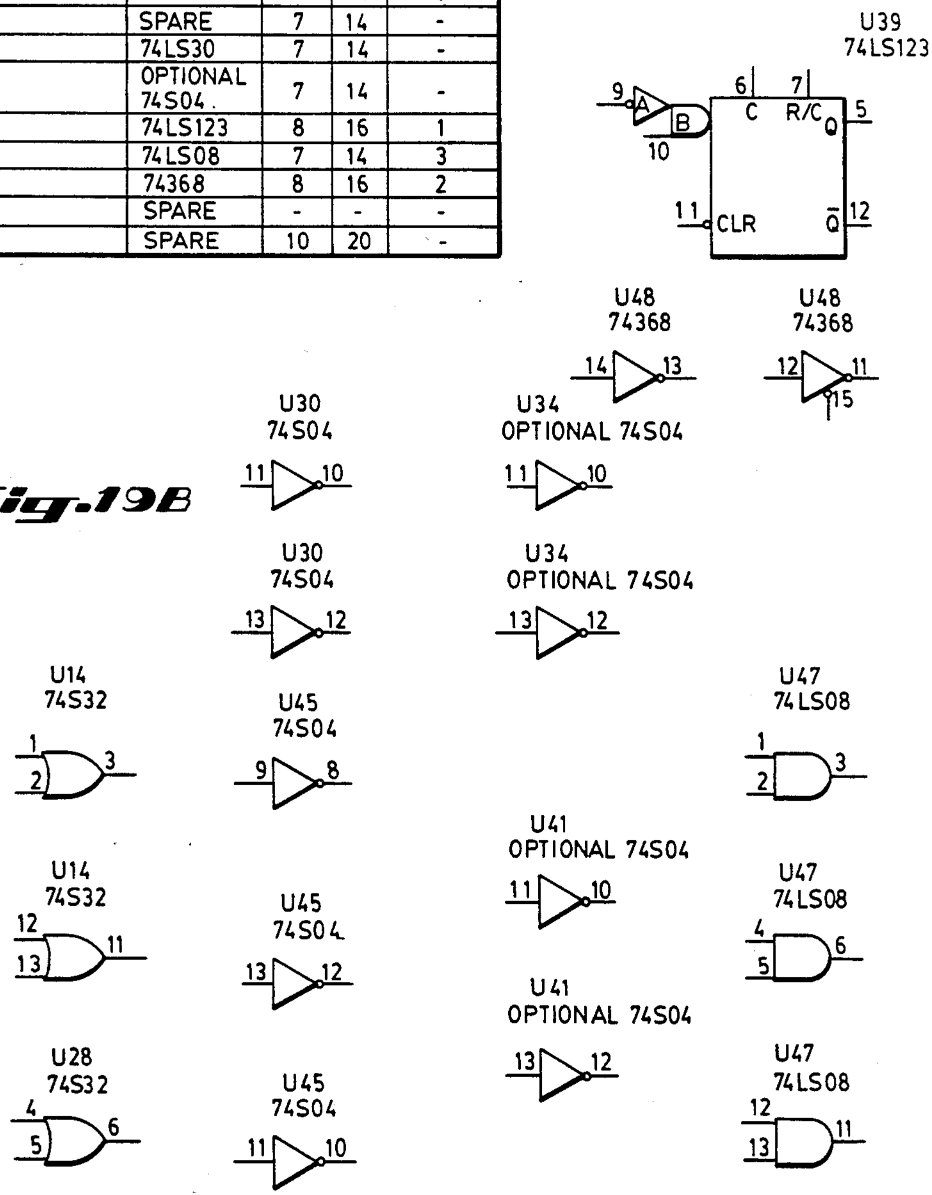
Figure 19C:
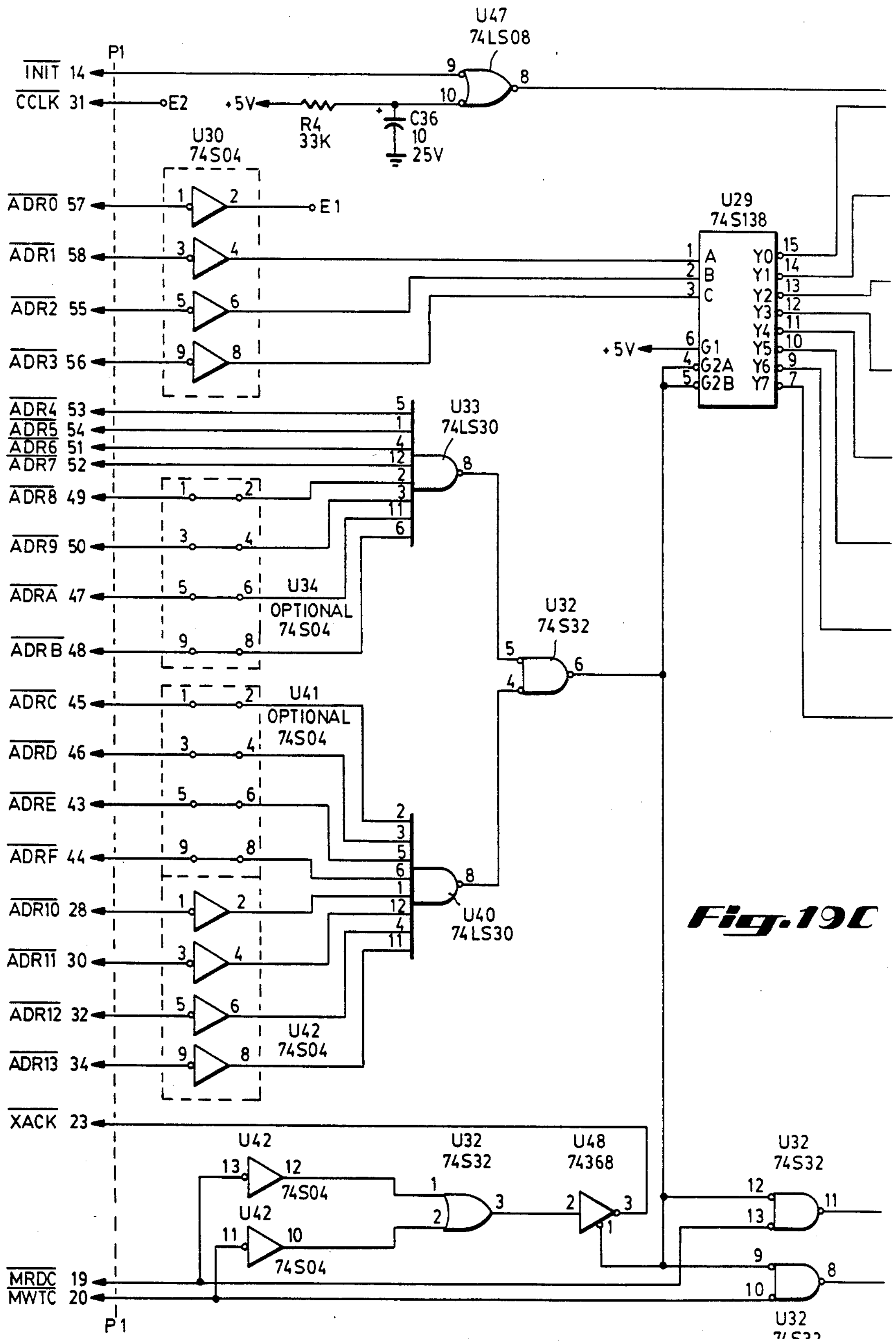
Figure 19D:
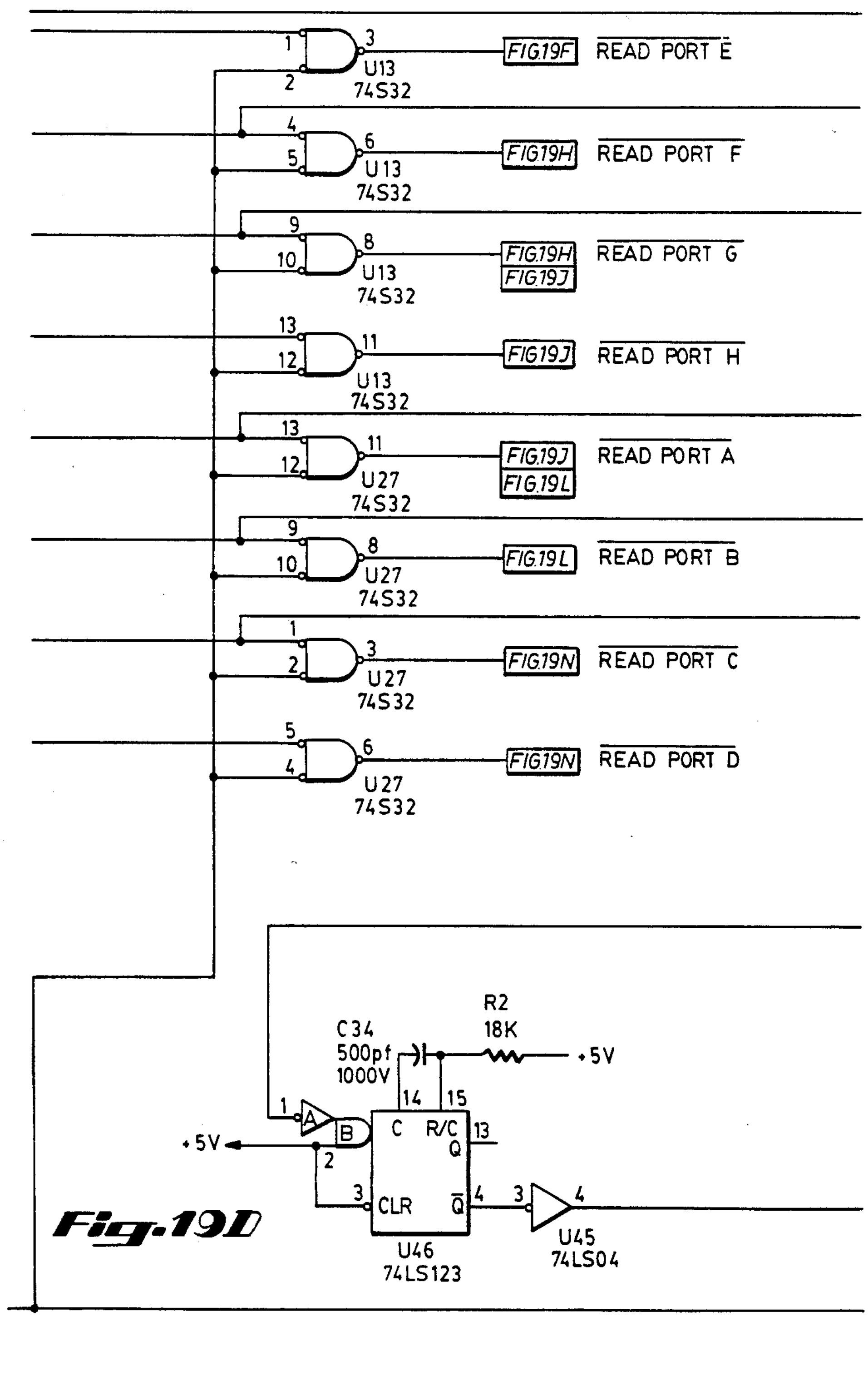
Figure 19E:
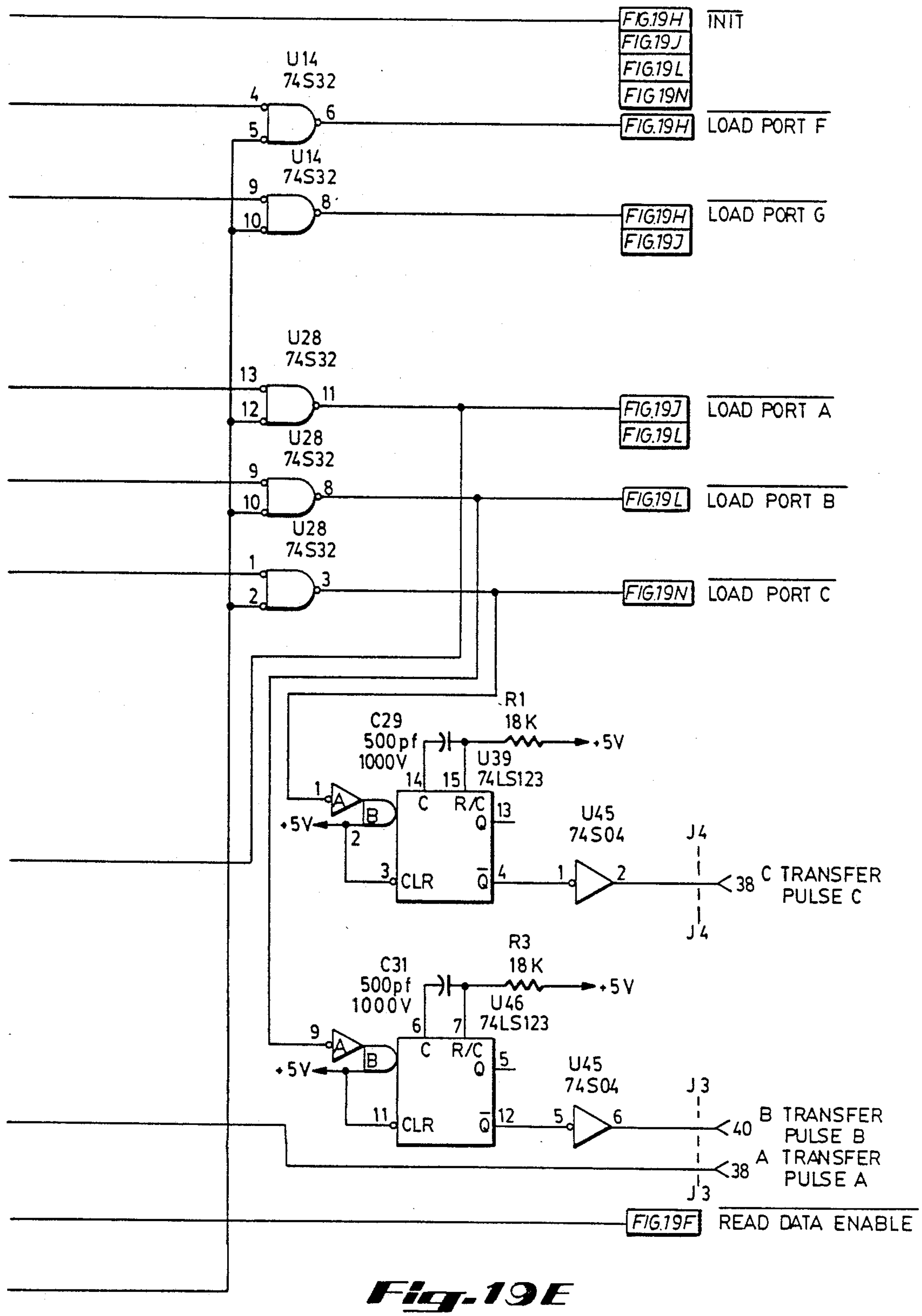
Figure 20A:
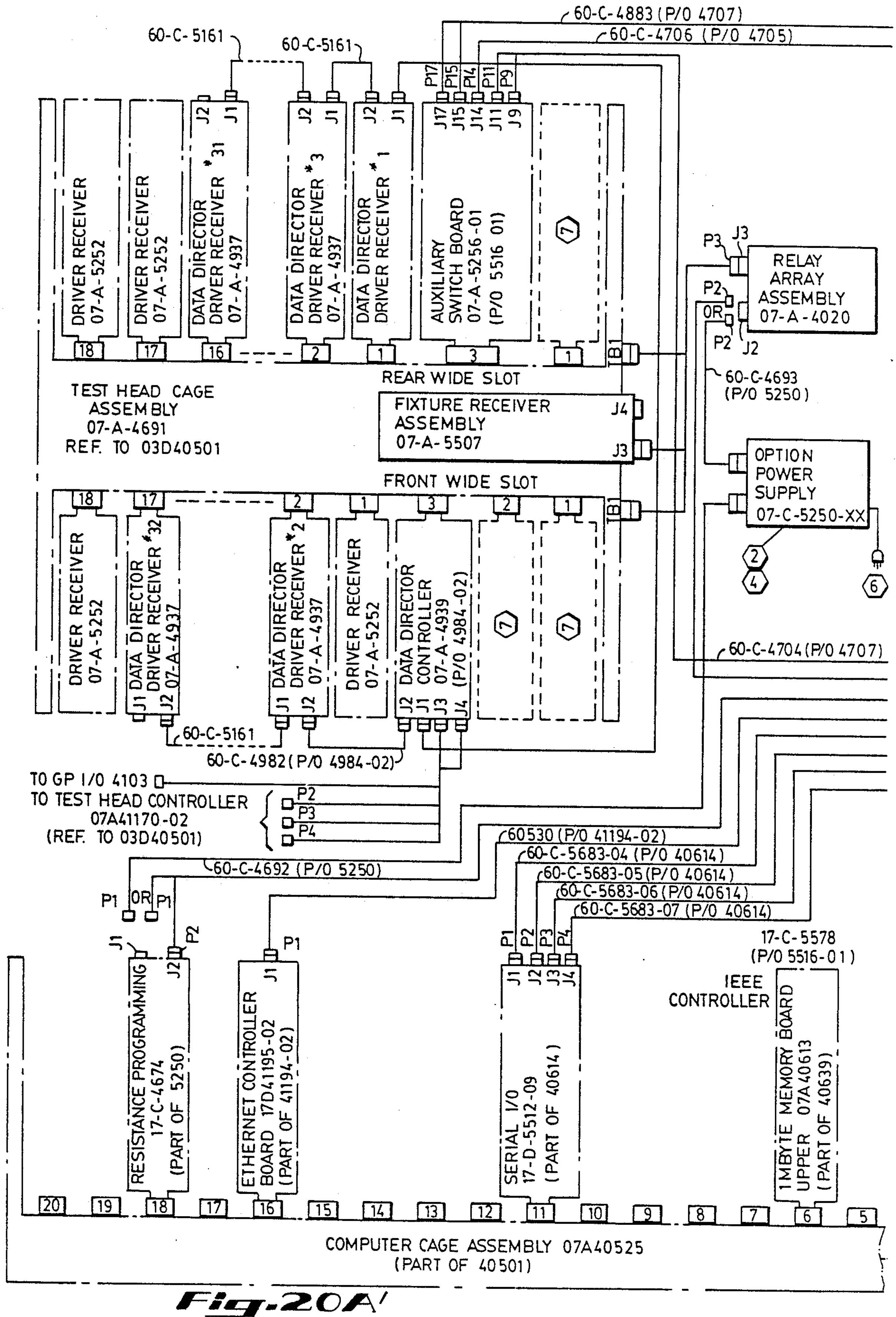
FIGS. 20A–20F illustrate in schematic diagram form the interconnections between the various elements of the test system 26 as shown in FIG. 1.
Figure 20B:
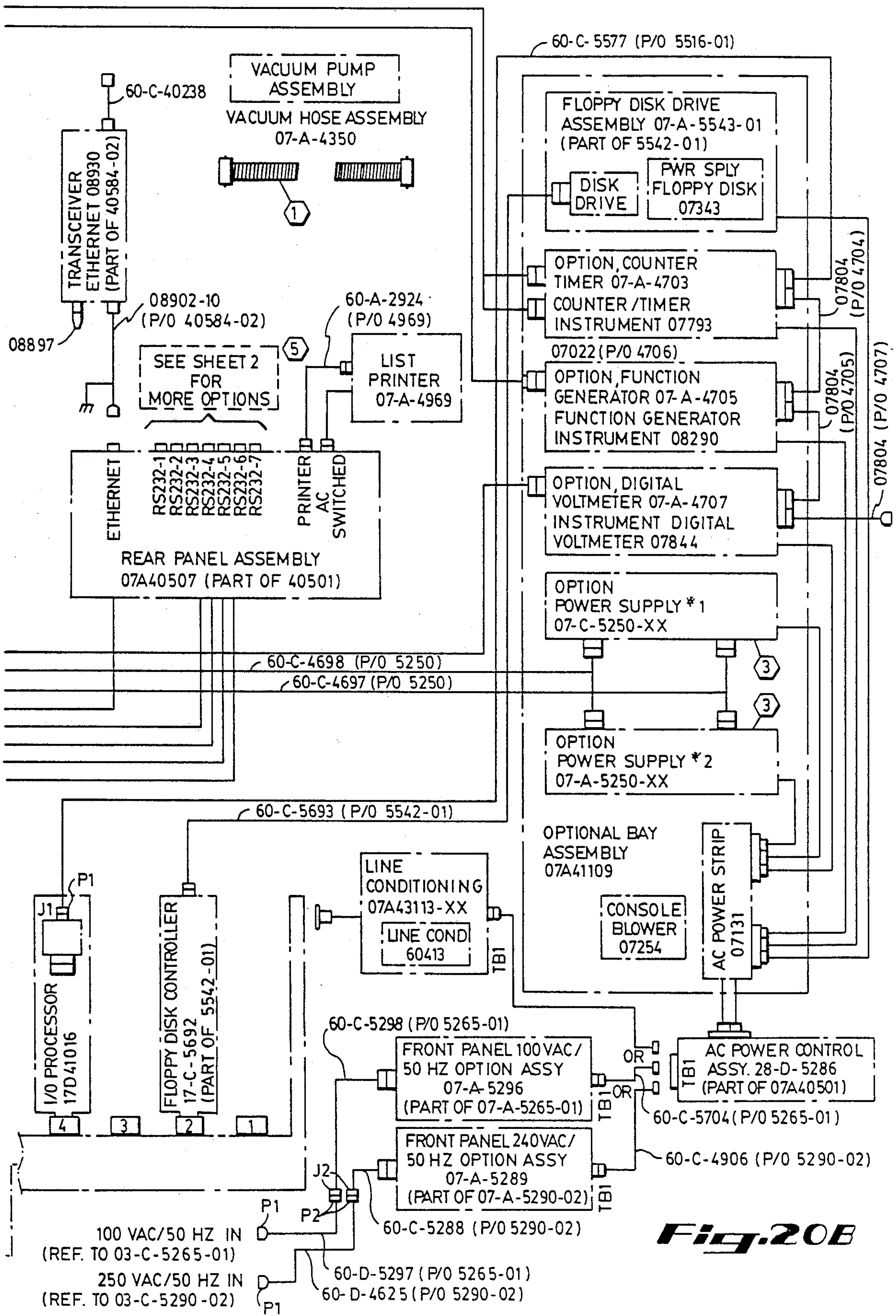
Figure 20C:
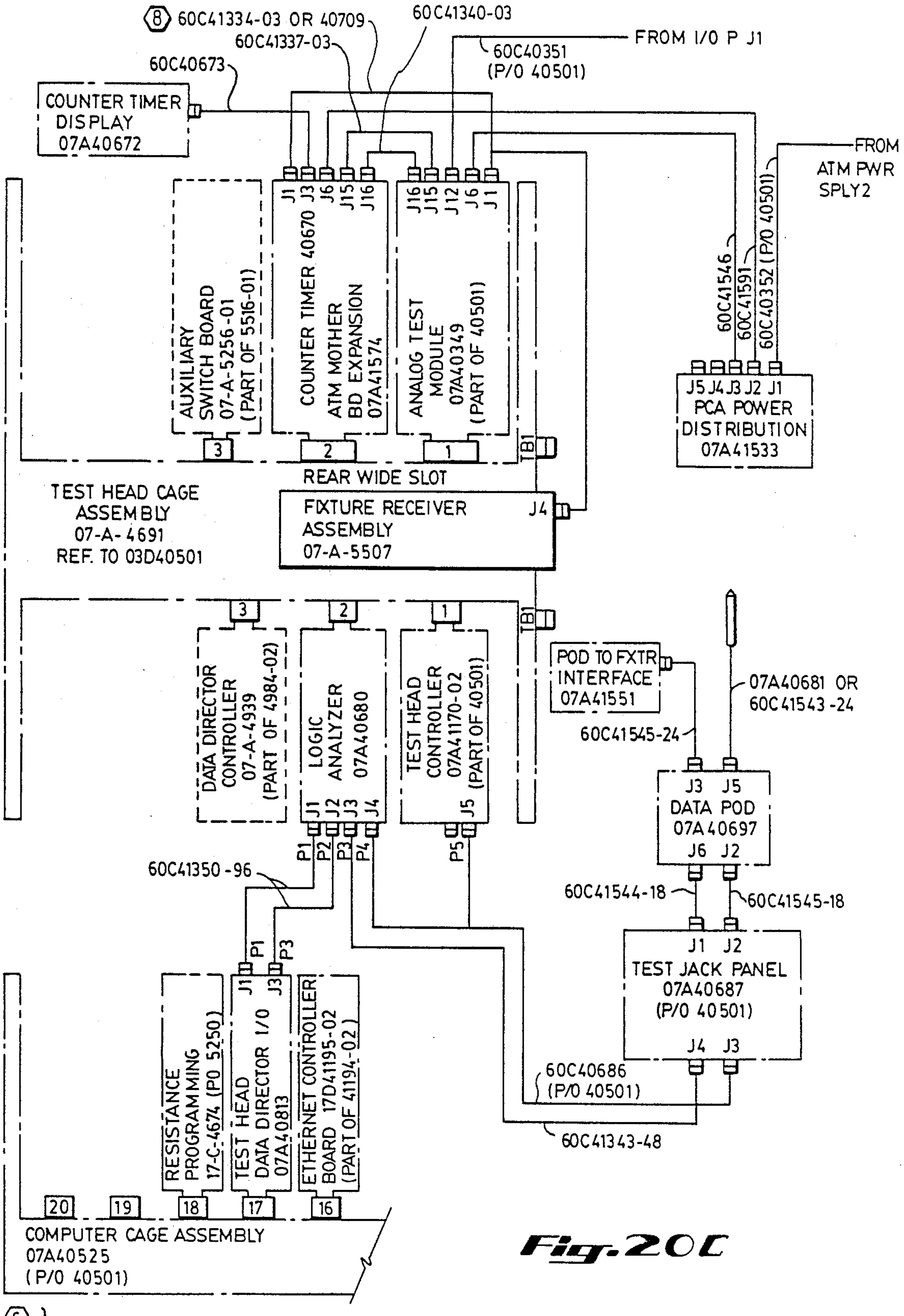
Figure 20D:
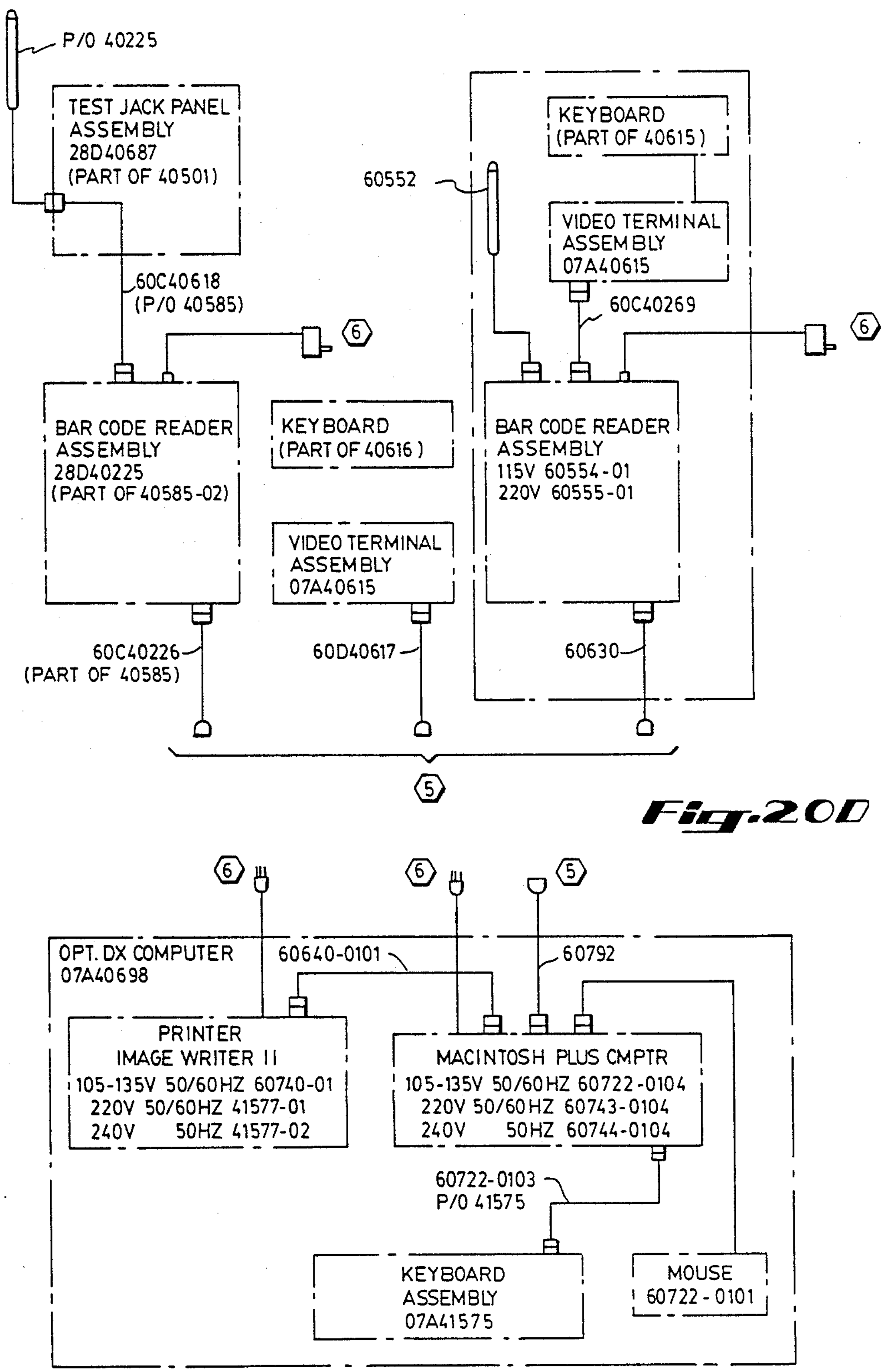
Figure 20E:
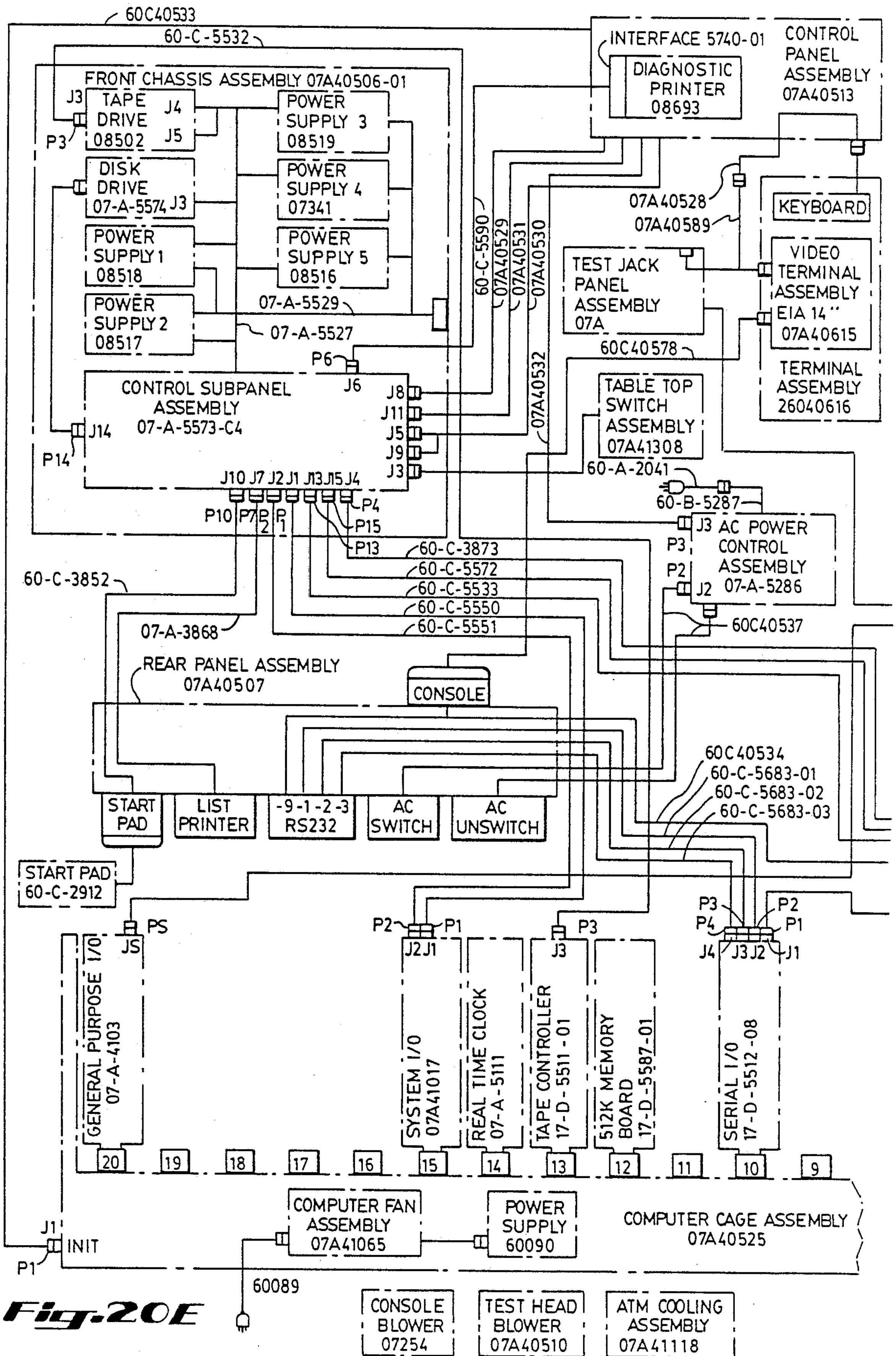
Figure 20F:
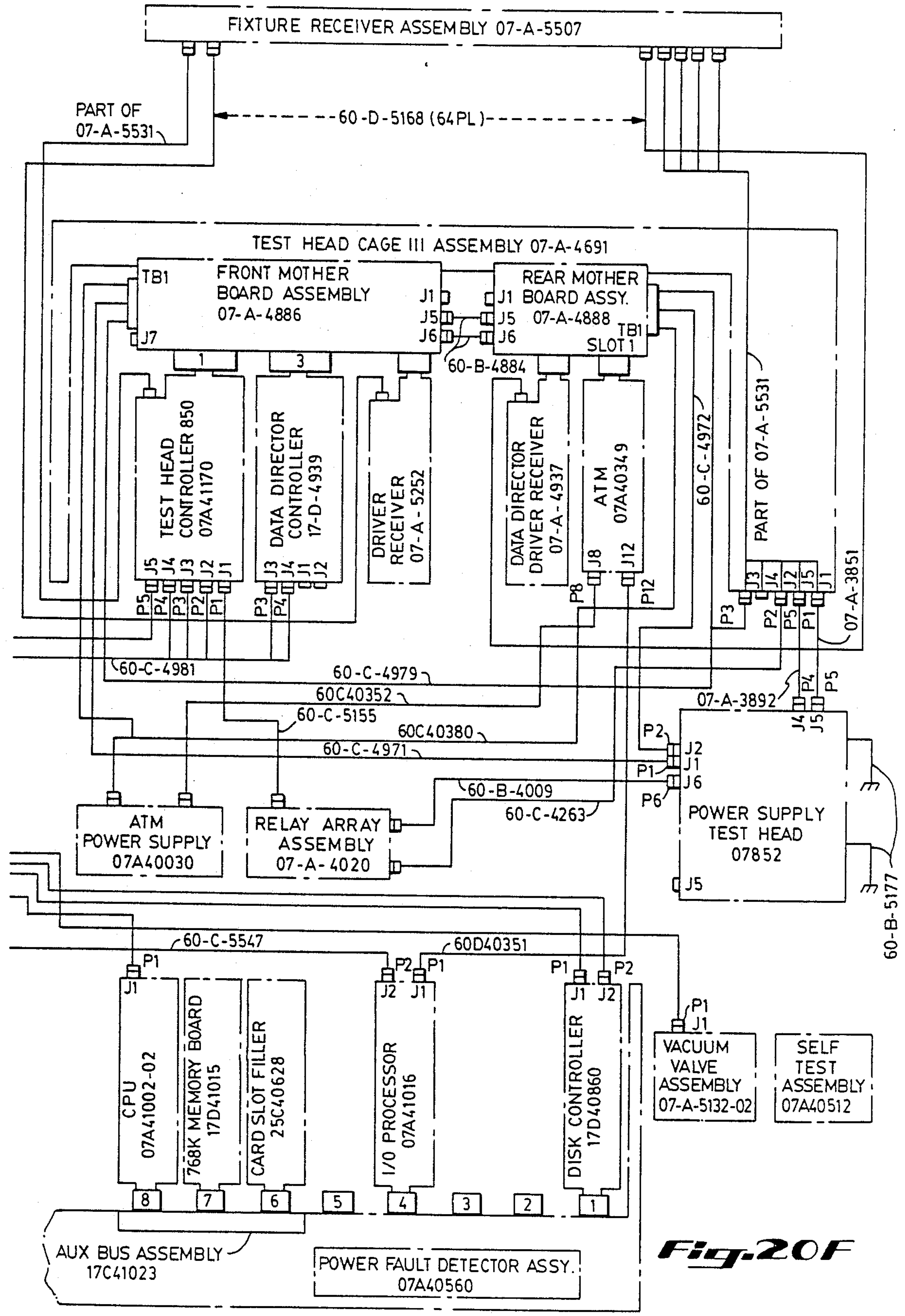

Referring now to FIG. 6, the logic analyzer 32 is illustrated in block diagram form. The logic analyzer circuit includes a logic start/stop circuit 212, a delay counter 214, a trigger circuit 216, a clock sel 218, a mux 220, CMD registers 222, and an I/O circuit 224. FIGS. 7A–7HH illustrate in schematic diagram form the logic analyzer 32. FIGS. 19A–190 illustrate in schematic diagram form the Parallel I/O Board 34, which allows the logic analyzer 32 to talk to the multibus computer 38. The input signals to the logic analyzer are as follows. Signals from the DUT fixture 44, received and buffered by the Data Pod 30, are input via four lines 52*a* and twelve lines 52*b*. E, F, and G Pole signals 163, 165, and 167 are digital data signals from the Test Head Controller 42. The Listen signal 196 is generated by the Test Head Controller. A HIGH state for the signal 196 indicates that the THC is processing data from the E, F, G busses 156, 158, and 160. The Tester Clock signal 193 is generated by the THC and is used to sample data from the E, F, and G busses 156, 158, and 160. A TCLOCK signal 200 is generated by the logic analyzer. The TCLOCK signal 200 sampling rate is one-half the Tester Clock signal 193 sampling rate. An HCLOCK signal 202 is generated by the logic analyzer from an on-board oscillator. The HCLOCK signal 202 provides four times the Tester Clock signal 193 sampling rate. An ECLOCK input line 204 is a provision for an external sampling clock. An Execution Envelope signal 206 is generated by the THC. A rising edge of the signal 206 indicates that a digital test cycle has commenced. All commands to control the logic analyzer and to read a capture memory 209 originate on a command/memory address bus 208. A response bus 210 returns memory data and status bits in response to a command on the command/address bus 208.

The operation of the logic analyzer is as follows. Data collection commences after either [1] the execution envelope signal 206 is true, [2] a user specified delay count, or [3] a user specified pattern of the least significant four bits of received data is detected. These choices are implemented by the LOGIC START/STOP 212, DELAY COUNTER 214, and TRIGGER 216. For the second and third scenarios, the delay count or search for data pattern starts after the execution envelope signal 206 is true. The clock sel 218 selects the sampling clock from one of the four inputs: the Tester Clock signal 193, the TCLOCK signal 200, the HCLOCK signal 202, and the external clock provided by the user on the ECLOCK line 204. The effective sampling rate is doubled by using both true and complemented sampling clocks. Data is latched on the rising edge of each sampling clock and held for writing into the capture memory. Data collection stops when the memory is filled or the execution envelope goes low. Status bits are provided to indicate busy, waiting for test cycle to commence, and locations of memory written. This data collection is implemented by the DATA CAPTURE MEMORY & LOGIC 209.

Software Sendfile Module 250

Figure 8:
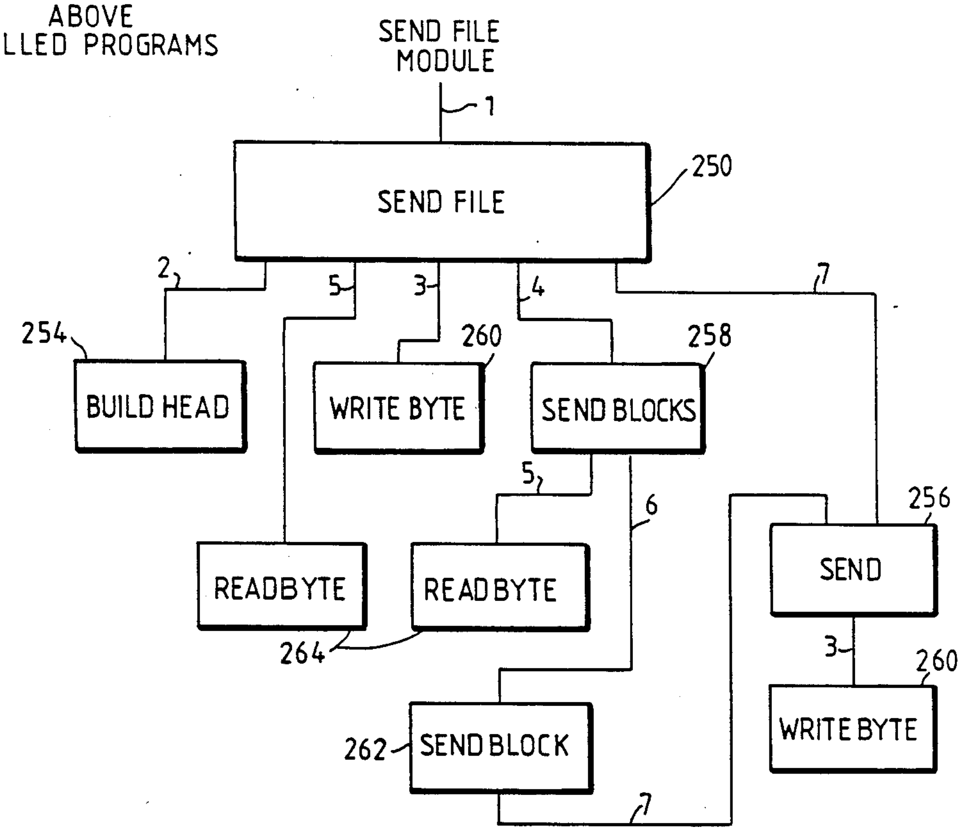
FIG. 8 illustrates in block diagram form the SendFile module software.

As stated earlier, the RS232 interface 76 connects the Macintosh Computer 36 (also called the "Mac") with the Multibus Computer 38. At either end of the RS232 interface 76 is a software Sendfile module 250, and a sister software module (not shown) for receiving files. Referring now to FIG. 8, the Sendfile module 250 uses the following programs: a Stat program 252, a Buildhead program 254, a Send program 256, a Sendblocks program 258, a Writebyte program 260, a Sendblock program 262, and a Readbyte program 264. The Sendfile module 250 calls the Stat program 252 to get the file size information, calculates the number of blocks, calls the Buildhead program 254 to make the file header, sends the file header to the Mac computer 36 with the Send program 256, and waits for an acknowledgment. The Sendfile module 250 makes three retries if the acknowledgment isn't forthcoming, and then gives up. If the file head is sent successfully, the SendFile module 250 then calls the SendBlocks program 258 to send the rest of the file. The Buildhead program 254 puts the file size, name, and number of blocks into a data structure. The Writebyte program 260 writes a byte to the Macintosh computer 36. The Sendblock program 262 sends a block of data to the Mac-36, as well as a checksum for the block and the size of the block. It waits for an acknowledgement from the Mac 36 for receipt of the block. The Sendblocks program 258 in a loop reads a block and sends a block with the Sendblock program 262 until all the blocks are sent or an error occurs, then sends the End-of-Transmission (EOT) character, and waits for an acknowledgment on the EOT character. The Sendblocks program 258 returns an error code if there was no acknowledgment (ACK) of the EOT, or if the wrong number of bytes or blocks were sent due to an error in sending the file. The ReadByte program 264 reads a byte from the input (the Macintosh). If a byte doesn't appear within the given number of seconds, control returns to the program calling the readbyte program. The Send program 256 writes an array of bytes out by calling the Writebyte program 260 repeatedly. The input parameters for the Send program 256 are a pointer to an array of bytes (characters) and the number of bytes to write out.

Software: Data Director Workstation Overview

Figure 9:
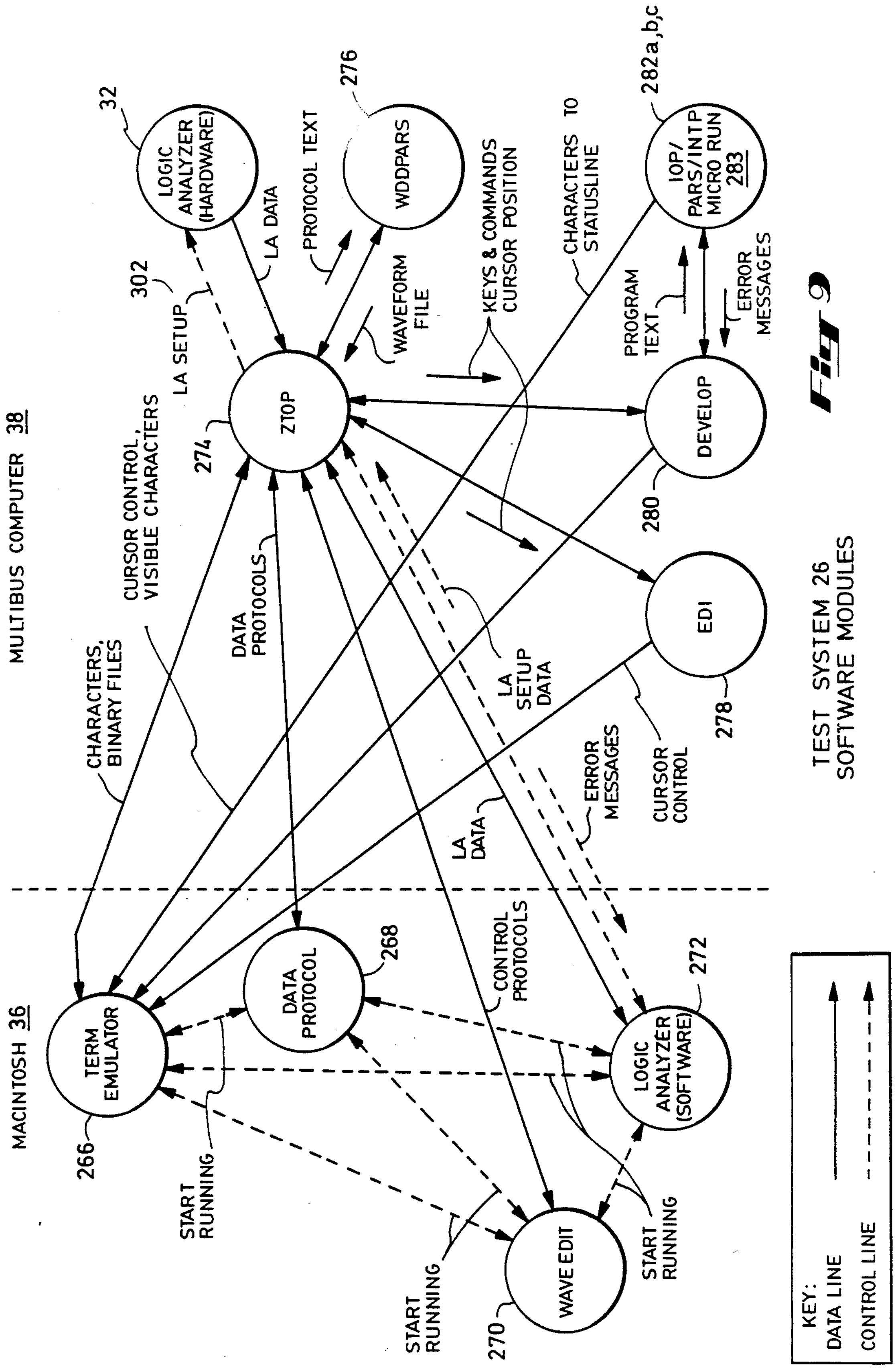
FIG. 9 illustrates in block diagram form the major software modules of the test system 26 of the present invention.

Referring now to FIG. 9, a data-flow diagram shows the major software pieces (also called "modules" or "modes") of the test system 26 (also called a "Data Director Workstation" or "DDW") and what data and control commands travels between them. The circles represent the major software pieces, except that the Logic Analyzer circle represents hardware. The arrows show where the data flows from and to. The arrows are labelled with the type of data flowing between modules.

On the left side of the diagram are the four main modes of the Macintosh software in the DDW. They are: a Terminal Emulator 266, a Data Protocol Editor 268, a Waveform Editor 270 and a Logic Analyzer display 272. These software modules were created especially for the test system 26 of the present invention. When one of these modes is running it talks to a Ztop mode 274, on the tester 28 side. When the user switches modes, the main loop of the DDW suspends the mode currently running and starts the chosen mode running. All the modes send sequences of characters to the Ztop module 274 to issue commands.

On the right side of the diagram is the Logic Analyzer hardware 32 and the Multibus computer 38, having the following software modules: a Wddpars 276, the Ztop 274, an EDI editor 278, a DEVELOP editor 280, and a parser/interpreter 282. These software modules 274, 276, 278, 280, and 282 in the Multibus Computer existed before the test system 26 of the present invention, but ZTOP, WDPPARS, EDI, and DEVELOP have been modified for the Data Director Workstation and PARSER/INTERPRETER has been modified to allow for a "Micro-Run" feature, to be discussed later. The Terminal Emulator mode software 266 sends characters to the Ztop 274 to be stored in the EDI 278 or in the DEVELOP mode edit 280 file. The Terminal Emulator 266 also sends setup data, and protocols to be inserted/replaced. The Terminal Emulator 266 receives characters to display on the screen and control and escape character sequences to move the cursor and perform various terminal functions, emulating a Qume terminal. The Data Protocol Editor software 268 gets a data protocol from the tester when the user selects "Load" from the "Protocol" menu by sending a sequence of characters to the Ztop software module 274. The Logic Analyzer software module 272 sends characters to the Ztop software module 274 to specify the Logic Analyzer setup, and receives Logic Analyzer data from Ztop when the data is ready. (When the start key is pressed on the Mac 36 and the Logic Analyzer board has been enabled with setup data, the Mac 36 waits for the Logic Analyzer board data from Ztop). The Logic Analyzer mode 272 also displays error messages, such as reporting that the Logic Analyzer board isn't plugged in. The Waveform Editor software module 270 receives a Control protocol from the Ztop software 274 when it sends a sequence of characters for the "Load" command. The Ztop software module 274 gets characters from the various Mac 36 modes. Ztop parses the input for command sequences. The command sequences, named "KMAC"'s, will be discussed in detail later. If it doesn't see a command sequence, it sends the characters to either the EDI module 278 or the DEVELOP mode 280 if either is running. If Ztop sees a command sequence, it executes the command, sends setup data to the Logic Analyzer hardware 32 and receives captured data in return. Ztop sends protocol text files to the Wddpars module 276 and receives waveform files in return. Ztop sends protocol text, commands, and characters-to-be-displayed to the EDI module 278 or to the DEVELOP module 280. The EDI software module 278 gets characters to store in a memory buffer or to the disk. It also gets two commands: one to dump the characters in the file from the cursor position to the end of the edit file to a temporary file, and the other to tell the Ztop module 274 (by writing to a temporary file) whether the cursor is at the end of the file. The EDI module 278 sends cursor control and escape sequences to the Terminal Emulator module 266. The DEVELOP software module 280 gets characters to store, characters to display to the Terminal Emulator 266 screen. The Develop software 280 also receives the two commands described above that the EDI software 278 processes. It sends visible characters and control and escape sequences to the Terminal Emulator 266 to manipulate the screen. The parser-interpreter software module 282 gets program text fragments from the Develop module 280 to process and run, and sends error messages and results to display on the Terminal Emulator screen. The parser-interpreter 282 also lets the Develop mode 280 know if the program segment was acceptable or contained errors. The parser-interpreter 282 also includes a microprocessor-testing software 283 entitled "Micro Run", which allows the test system 26 to listen and make measurements while a microprocessor "free-runs", executing on-board programs. The Wddpars software module 276 is the parser which takes data and control protocols from Ztop 274 and returns an error if the protocol (data or control) contained errors, or produces a waveform file if the protocol was "OK". The Logic Analyzer Hardware 32 accepts setup data from the Ztop software 274 and sends captured data to the Ztop software upon request.

FIG. 16 illustrates the Waveform File Format, produced by a "C" language, program which is used for storing waveforms and related data on disk. For the node/channel number, a "−1" is no value. The following two notes will be obvious to one of ordinary skill in the art, but they are included anyway for clarity. The notation "C-string" refers to a text string terminated by a null character. The notation "short []" refers to a sixteen-bit array.

Software: Data Director Workstation Main Program 265

The Macintosh Personal Computer is an event-driven machine with a built-in set of toolbox routines burned into ROM. The use of these routines and a user interface standard are described in detail in an Apple Computer, Inc. publication entitled "Inside Macintosh".

The Macintosh has a main program 265, which has four basic modes of operation, each of which is handled (at least conceptually) by a separate event loop. Except for the source code appended at the end of this specification, the terminal emulator program 266 is not described beyond its main event loop, since it emulates a QUME terminal, a feat which may have been accomplished by many other software developers. As illustrated in routines 304–318, the terminal emulator 266 handles desk accessories, local blinking, timeouts, mouse-down events, key-down events, auto-key events, update events, and serial input/output.

As illustrated in routines 320–340, the waveform editor main loop 270 handles desk accessories, local blinking, timeouts, updates cursor, handles text edit cursor blinking, handles mouse-down, mouse-up, key-down, auto-key, and update events, and handles incoming escape sequences. The waveform editor 270 contains many routines which are called by the data protocol editor 268 and the logic analyzer 272 software.

The data protocol editor 268 contains its own event processing loop and all of its own graphics routines, since its visual appearance is radically different from the waveform editor 270. It does, however, share some of the menu selection, file transfer, and error routines of the waveform editor 270. As illustrated in routines 342–358, the data protocol editor main loop 268 handles desk accessories, timeouts, mouse-down events, key-down, auto-key, and update events, incoming escape sequences, and cursor blinking. It also updates the cursor according to the screen location.

The logic analyzer software 272 is, in one sense, a subset of the waveform editor 270, in that it actually shares much of the same event loop and display functions, but it does not employ any of the actual editing functions. On the other hand, the logic analyzer software 272 does contain additional software to control several dialog boxes which are used to gather information for setting up the logic analyzer hardware 32. As illustrated in routines 260–276, the logic analyzer software 272 handles desk accessories, local blinking, timeouts, it updates the cursor according to the screen position, it handles mouse-down events, mouse-up events, update events, and incoming escape sequences.

Software: Waveform Editor Main Loop 270

Figure 11A:
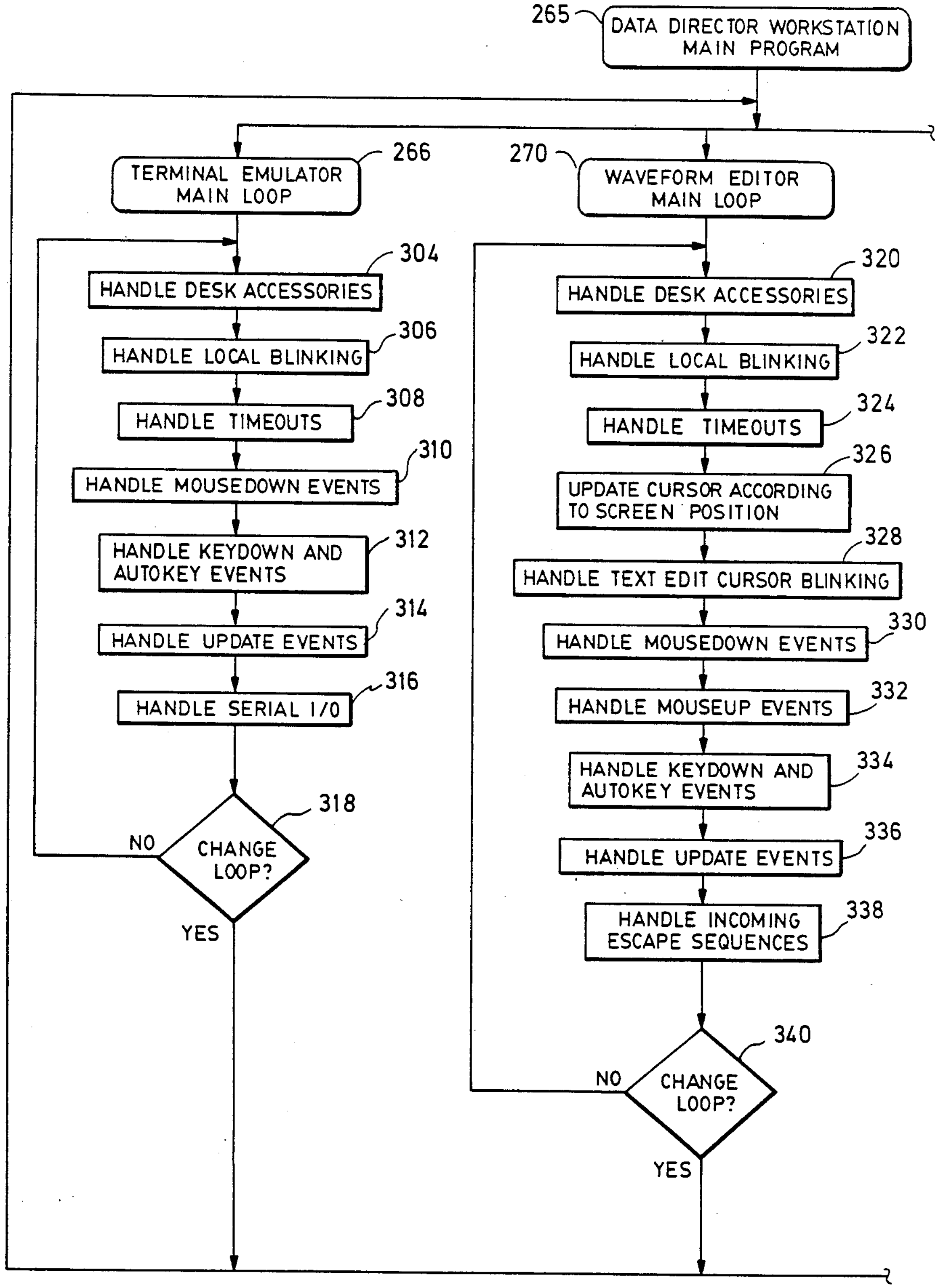
FIG. 11 illustrates in flow chart form the four software modules created for the test system 26 of the present invention which reside in the Macintosh computer.
Figure 11B:
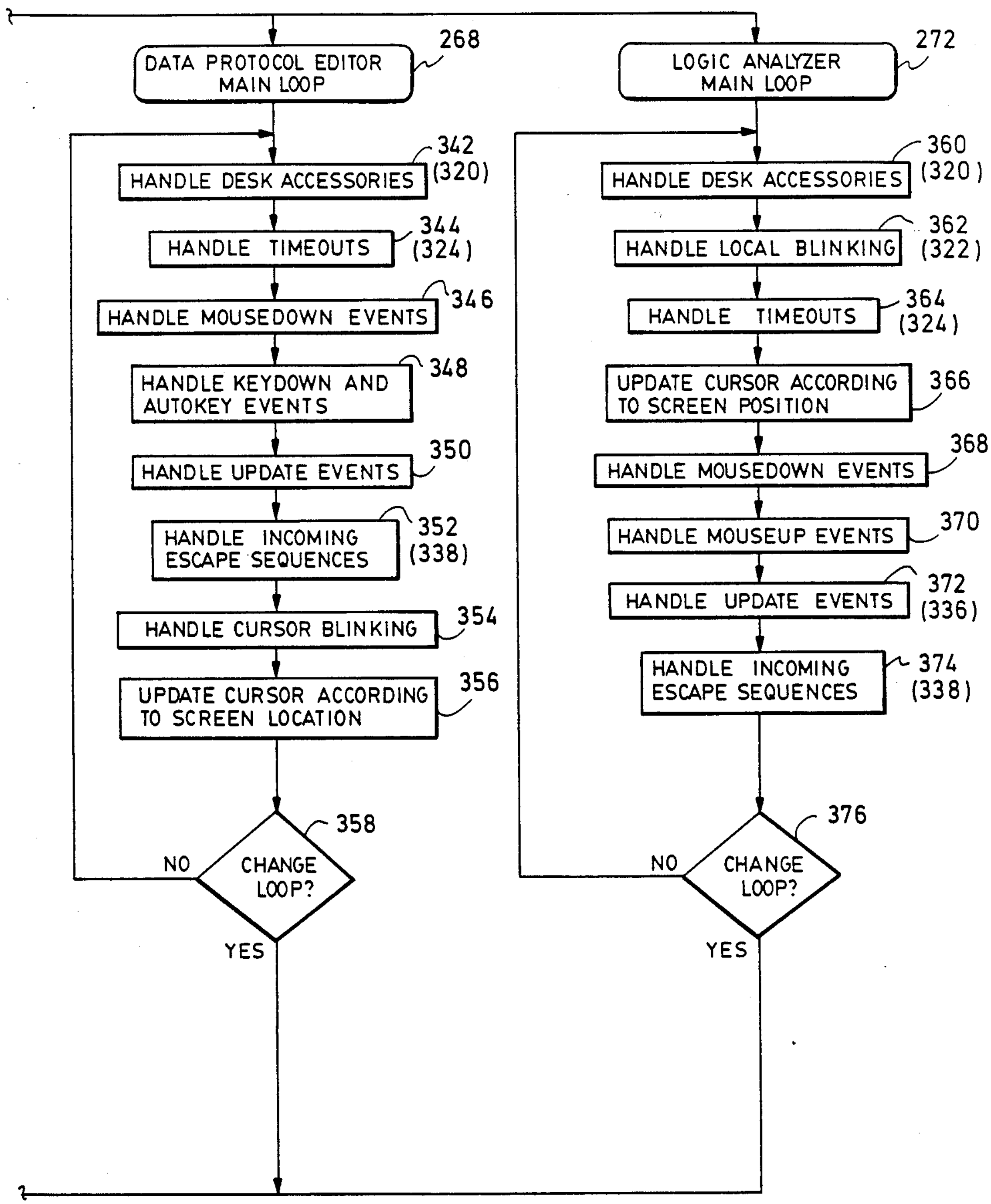
Figure 12:
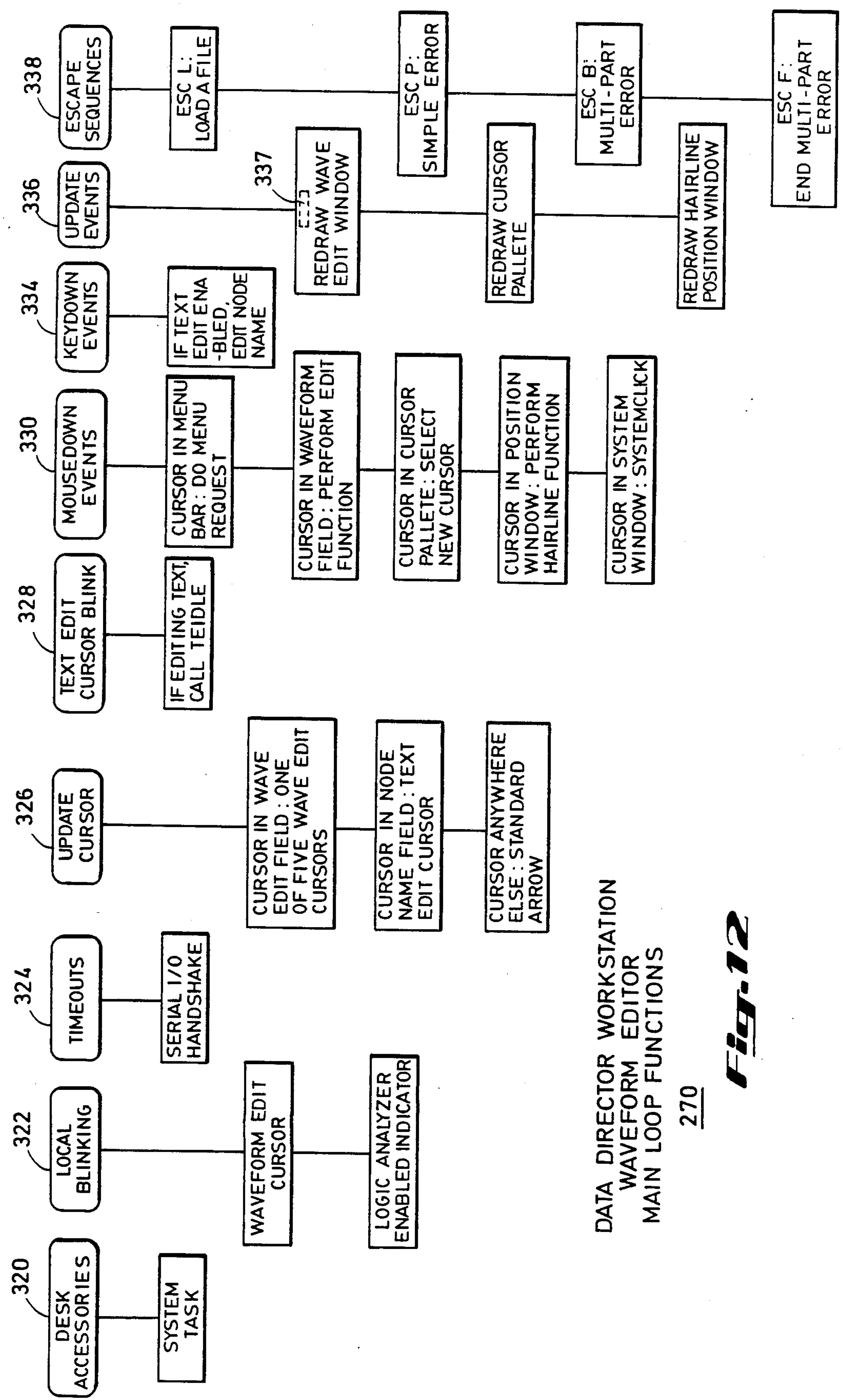
FIG. 12 illustrates in flow chart form the major routines of the waveform editor software module 270 illustrated in FIG. 9.

Referring now to FIGS. 11 and 12, the routines 320–336 are perfomed every time through the main program loop of the waveform editor. The Desk Accessories routine 320 calls the Apple rom trap routine "SystemTask" to automatically handle the updating of any open desk accessories which require service.

The Local Blinking routine 322 handles the waveform editing cursor. If the waveform editing cursor is currently active, it is necessary to alternately draw it and erase it approximately every half a second. This is accomplished by keeping track of the elapsed time according to the system clock and drawing the cursor with an exclusive-or (XOR) pen every thirty ticks of the clock. The local blinking routine 322 also handles the logic analyzer enabled indicator. If the logic analyzer hardware has been enabled, it is necessary to alternately draw and erase an outlined capital 'L' at the right-hand end of the menu bar, approximately four times a second. This is accomplished by keeping track of the elapsed time according to the system clock and drawing the symbol with an XOR pen every fifteen clock ticks.

The Timeouts routine 324 handles the Serial I/O Handshake. If the Macintosh end of the test system 26 (Data Director Workstation) is currently waiting for serial input from the main tester 28, it is necessary to eventually time out and alert the operator if the tester 28 does not respond. The Timeout routine 324 keeps track of the elapsed time according to the system clock, and if The timeout threshhold occurs before the expected serial data arrives, the waveform editor 270 displays an alert box describing the situation. The duration of the timeout is set to thirty seconds.

The Update Cursor routine 326 updates the cursor according to the screen position. The appearance of the cursor is one of the main visual feedback tools for the user of the Data Director Workstation. As the Macintosh "mouse" is moved the cursor moves accordingly.

As the cursor passes from one graphic field to the next, its shape is altered by the update cursor routine 326 to indicate the cursor's new functionality.

When the cursor passes over the graphic field in which the waveforms are displayed, it must automatically take on the appearance of whichever edit function has been selected. This selection was previously made clicking in the cursor pallete at the far left-hand side of the screen. The five possibilities are the cross-hair, the I-beam, the double-ended vertical arrow, the double-ended horizontal arrow, and the bold equals sign. To change from one cursor to another, the update cursor routine 326 calls the Apple toolbox function "SetCursor". When the cursor passes over the node name field, the update cursor routine 326 changes it to the standard Apple TextEdit cursor. When the cursor is anywhere not described above, the update cursor routine 326 uses the standard Apple arrow cursor by calling the Apple toolbox routine, "InitCursor".

If a text edit session has been initiated (by clicking the mouse in the node name field), it is necessary to keep the text cursor blinking to adhere to Apple user interface standards. The Text Edit Cursor Blink routine 328 does this by calling the Apple toolbox routine "TEIdle".

The mouseDown Events routine 330 handles all occurrences of depressing the mouse button. Whenever the mouse button is depressed, a mouseDown event is posted which includes the coordinates of where the cursor was at the time. These coordinates are then deciphered to determine what class of function is being requested.

If the mouse has been clicked in the menu bar, it is standard Apple user interface procedure to service a menu selection. The mousedown events routine 330 makes the selection by calling the Apple toolbox routines "SelectMenu" to determine which menu is being selected, and "GetItem" to determine which item within that menu has been chosen. The Data Director Workstation software then employs a series of nested "switch" statements to call the appropriate subroutines to comply with the user's request.

If the mouse has been clicked in the waveform editing area, the mousedown events routine 330 decodes the exact coordinates to determine which editing function is desired. The routine 330 also determines which editing cursor is currently active, since that also determines the functionality of the mouse at the time of the mouseDown event. If the cursor has been clicked in any of the scroll bar controls, located at the bottom and right sides of the wave edit window, the routine 330 calls the appropriate scrolling functions.

If the mouse has been clicked in the cursor pallete, the routine 330 further decodes the coordinates to determine which cursor type within the pallete is being requested. If the new type is not the same as the current edit cursor type, then the cursor will take on the appearance and functionality of this new type whenever the cursor moves into the wave edit field again.

If the cursor is clicked in the hairline position window, the coordinates are further decoded by the mousedown events routine 330 to determine which position function is being requested. If the cursor is in the region containing the left-pointing triangle and the left hairline is not currently visible on the screen, the left hairline is moved to and drawn at the left-hand side of the wave edit area. If the cursor is in the region containing the right-pointing triangle, the right hairline is moved to and drawn at the right side of the wave edit area.

If the mouse has been clicked in a window which is controlled by the Apple Desk Manager, the mousedown events routine 330 passes the event along to the Macintosh system software by calling the Apple toolbox routine "SystemClick".

Whenever a key is pressed on the Macintosh keyboard, an event is posted to reflect that action. It is up to the Keydown Events routine 334 to take whatever action is deemed appropriate at that time.

The only time the waveform editor software 270 pays attention to keyDown events is when node name editing has been initiated (by clicking in the node name field). If this is the case, the Keydown Events routine 334 passes along the character represented by the event to the Apple TextEdit manager by calling the Apple toolbox routine "TEKey".

The Update Events routine 336 handles "window damage". Whenever any portion of a window is damaged by normal activity (dialog boxes, scrolling, etc), an update event is posted indicating which window is in need of repair. An exact mapping of the damaged region within the window is also made available. When these events are detected by the Data Director Workstation software, the update events routine 336 redraws the entire window and allow the window manager to take care of the appropriate clipping.

The software redraws the wave edit window as follows. The Data Director Workstation software keeps track of exactly which data is currently being displayed and in what format. When an update event is detected, the update events routine 336 run through all window status variables and draws the entire grid, all of the waveforms and names, scroll bars, hairlines, and highlighting. The software redraw the cursor pallete as follows. The information to draw the cursor pallete window is stored in hexadecimal format in the resource file of the Data Director Workstation software. The binary images are loaded into memory by software request, and the update events routine 336 copies these images to the screen to form the cursor pallete window. The software redraws the hairline position window as follows. The format of the hairline position window is determined by a quickdraw algorithm which is part of the Data Director Workstation software. The position data itself is stored in global variables and is drawn numerically by the update events routine 336 by calling the Apple toolbox routines "NumToString" and "TextBox".

FIGS. 15A–F illustrate in a flow chart form a subroutine 337 used for drawing waveforms. Referring now to FIGS. 11 and 12, the draw waveform subroutine 337 is used, for example, within the Waveform Editor software module 270, in the Update Events routine 336. More particularly, referring to FIG. 12, the draw waveform subroutine 337 is used in the first section of the Update Events routine 336, entitled "Redraw wave edit window".

The Escape Sequences routine 338 handles incoming "Escape" sequences. When the Data Director Workstation is in the wave edit mode 270, it pays little attention to the serial input port unless it is alerted by the arrival of an escape character ("ESC"), indicating a data stream is about to arrive. The nature of this data is indicated by the next character following the escape character.

A capital 'L' following the ESC indicates that an entire waveform file is about to be sent by the main tester computer. When this sequence is detected, the escape sequences routine 338 starts up a file loading sequence. A capital 'P' following the ESC indicates that a "simple" error message is on its way. When this happens, the escape sequences routine 338 causes a single character string to be read from the serial input port and then to be displayed in a standard Macintosh Alert Box.

A capital 'B' following the ESC indicates that a message made up on one or more 80-column lines will be arriving. These are usually lines of text from the user's source program from the main tester which contain some sort of syntax error. The Data Director Workstation software stores up to six of these strings, but displays nothing until the end-of-message escape sequence is received. A capitial 'F' following the ESC indicates the end of a multi-line message which was initiated by "Ec B", as described above. At this point the Data Director Workstation software displays all lines of the message in an extra-wide alert box.

Software: Logic Analyzer Main Loop 272

Figure 13:
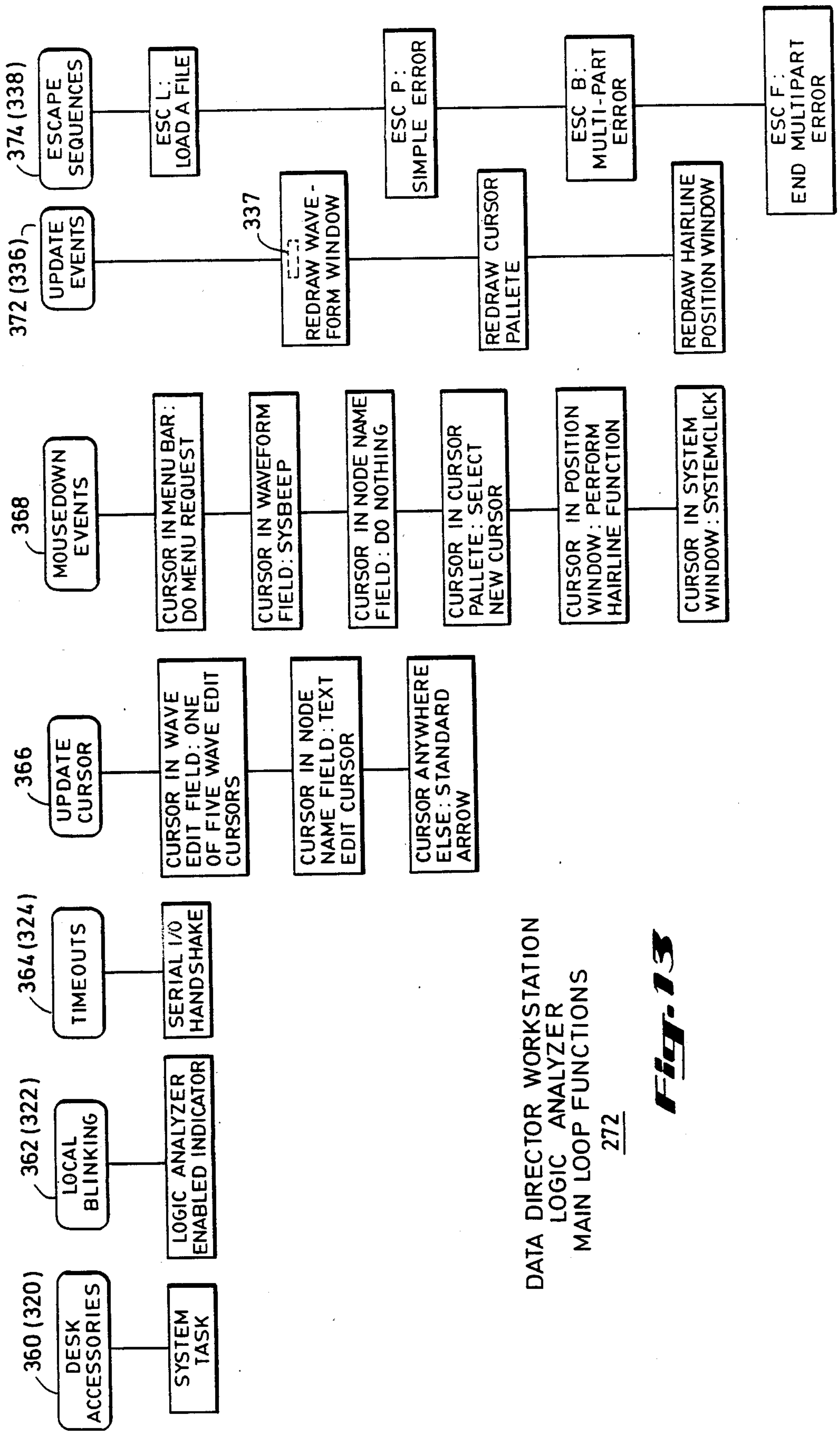
FIG. 13 illustrates in block diagram form the major routines of the logic analyzer software module 272 illustrated in FIG. 9.

Referring now to FIGS. 11 and 13, the Logic Analyzer portion 272 of the Macintosh software for the Data Director Workstation is in one sense a subset of the waveform editor 270. That is, the display functions are identical and even share the same source code. The differences lie in the fact that the wave editor 270 allows the waveforms to be edited while the logic analyzer 272 does not, and the logic analyzer software 272 includes dialog boxes for setting up the logic analyzer hardware 32 while the wave editor 270 does not.

The Desk Accessories routine 360 is the same as the Desk Accessories routine 320 of the Waveform Editor module 270. The Local Blinking routine 362 is the same as the Local Blinking routine 322 of the Waveform Editor software 270. The Timeouts routine 364 is the same as the Timeouts routine 324 of the Waveform Editor software module 270.

The mouseDown Events routine 368 is the same as the mousedown routine 330 of the waveform editor 270 when the cursor is in the following locations: the menu bar, the cursor pallete, the positon window, and the system window. When the cursor is inthe waveform field, the mousedown events routine 368 produces an audible "beep" to remind the user that editing is not allowed while in Logic Analyzer mode. This is accomplished by caling is in the node name field, the mousedown events routines 368 does nothing.

The Update Events routine 372 is the same as the update events routine 336 of the Waveform Editor software 270. The Escape Sequences routine 374 is the same as the escape sequences routine 338 of the Waveform Editor software 270.

Software: Data Protocol Editor Main Loop 268

Figure 14:
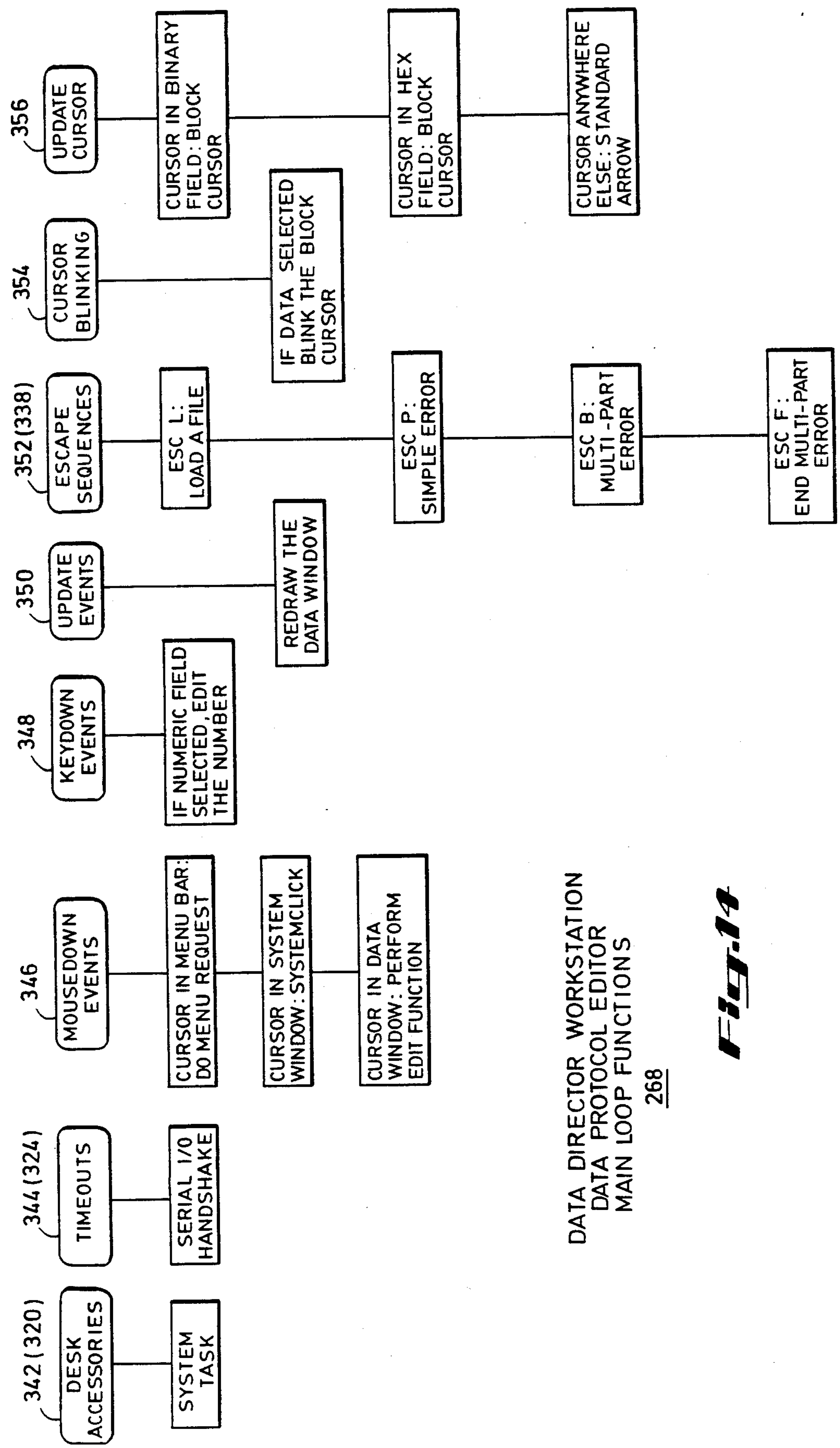
FIG. 14 illustrates in block diagram form the major routines of the data protocol editor software module 268 illustrated in FIG. 9.
Figure 15B:
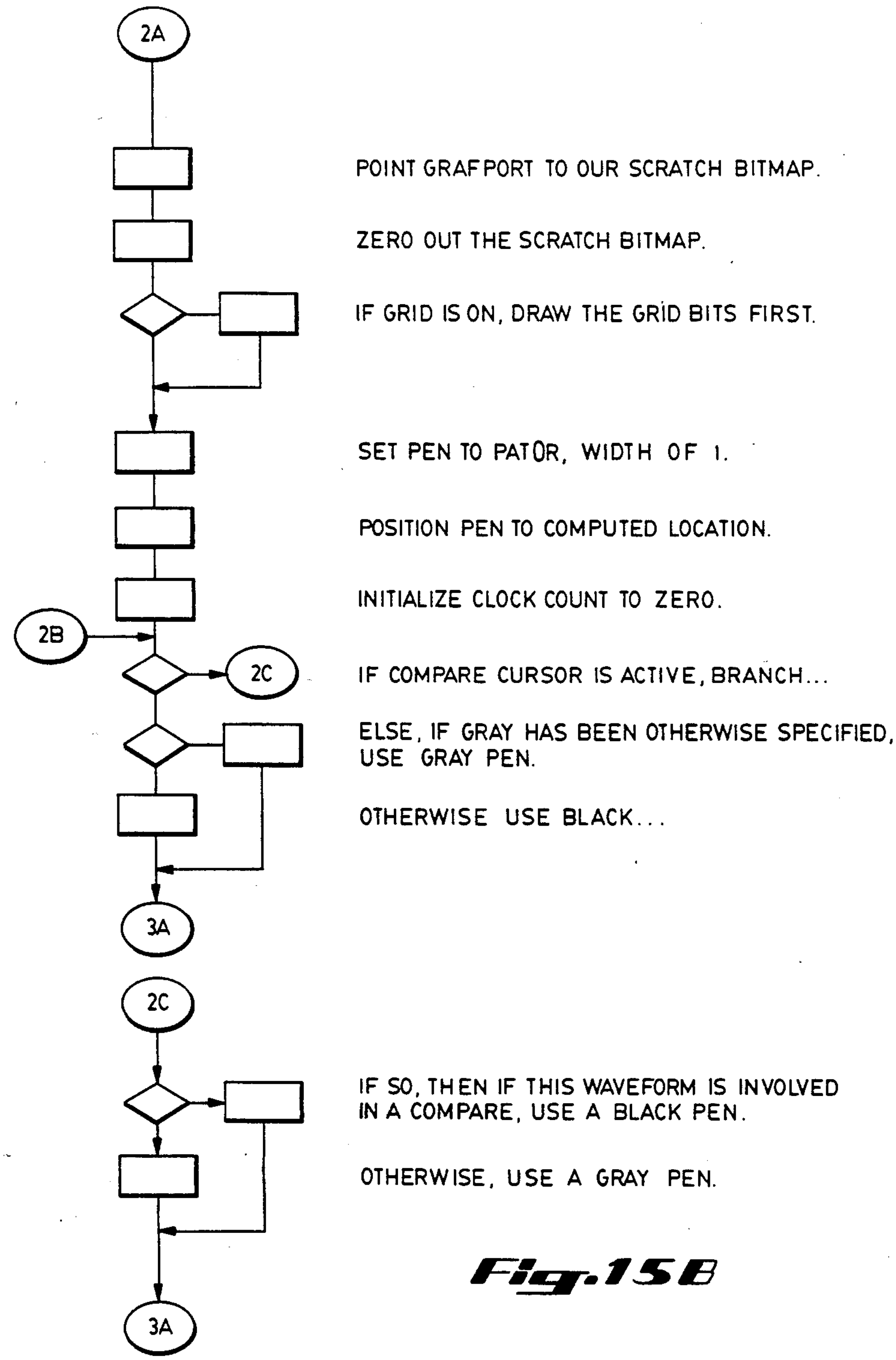
Figure 15C:
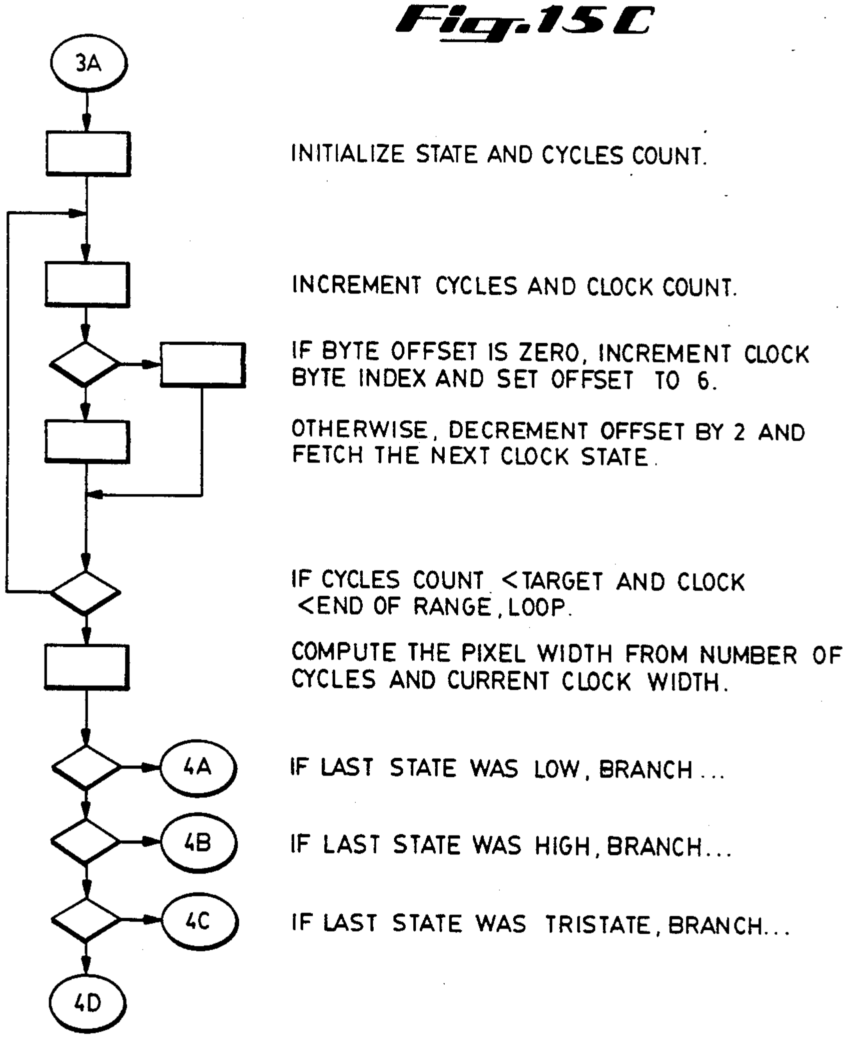
Figure 15D:
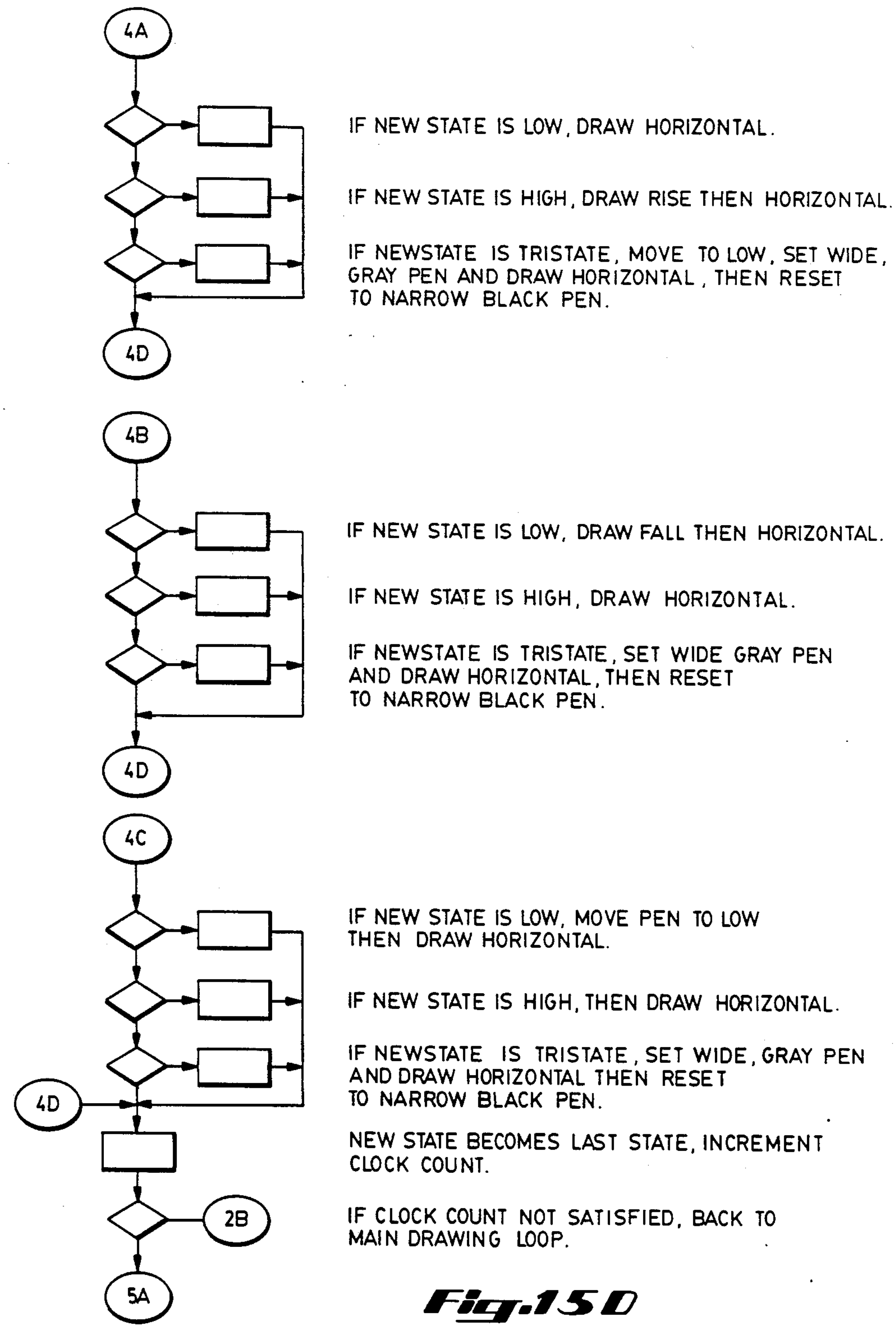
Figure 15E:
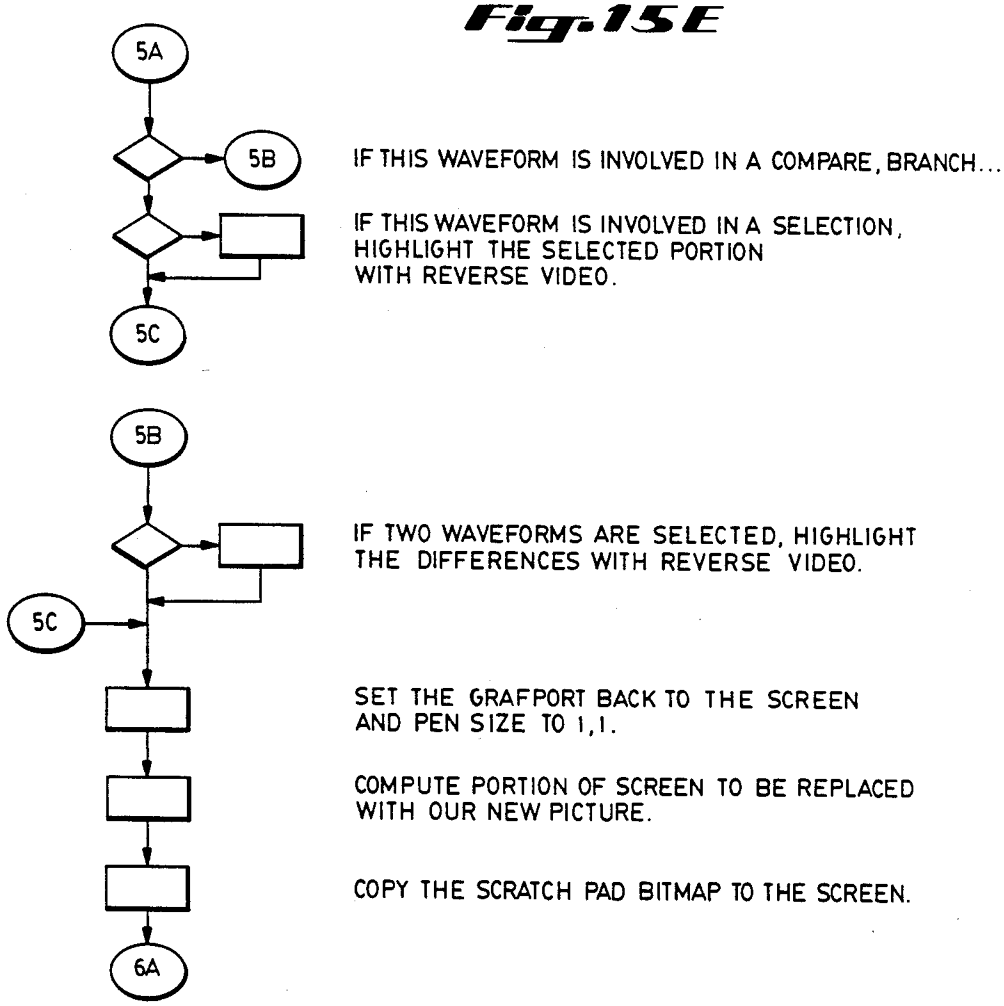
Figure 15F:
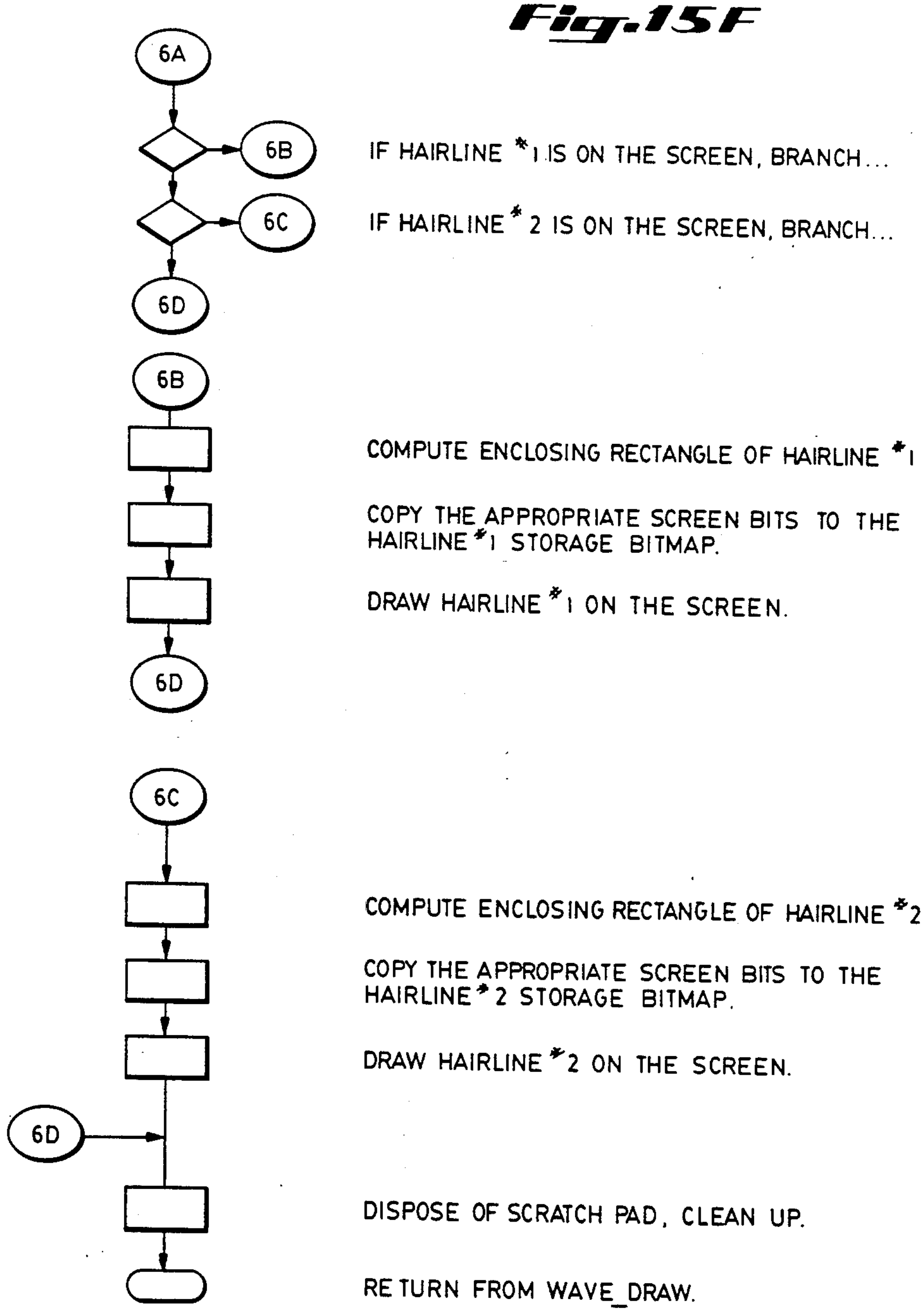

Referring now to FIGS. 11 and 14, the Desk Accessories routine 342 of the Data Protocol Editor software 268 is the same as the Desk Accessories routine 320 in the Waveform Editor software 270. The Timeouts routine 344 is the same as the Timeouts routine 324 in the Waveform Editor software 270.

The MouseDown Events routine 346 is the same as the Mousedown routine 330 of the Waveform Editor 270 when the cursor is in the system window. When the mouse is clicked in the menu bar, the Mousedown events routine 346 disables any editing selections that are in force at the time, since the menu selection may alter the data on the screen. Otherwise, the Mousedown events routine 346 is the same as in the Waveform Editor software, when the cursor is in the menu bar.

If the mouse is clicked when the cursor is in a data window, the Mousedown routine 346 does the following. If the cursor is in one of the hexadecimal fields, a mouseDown event indicates that an edit selection is being made. That means that the position of the cursor indicates the number currently pointed to by the cursor which becomes the focus of any editing hereafter. By definition, this becomes the location of the blinking block cursor, and the corresponding binary field to the right is highlighted in reverse video.

If the cursor is located within the binary field, a mouseDown event indicates that the binary digit beneath the cursor is to be mddified. If the current digit is a zero, it becomes a one. If it is a one, it becomes a 'Z' (tristate). If it is a 'Z', it becomes a zero.

If the cursor is located within either the left or right arrow near the top of the screen, control is passed to a set of Data Director Workstation routines which alter the width of the data word being edited.

If the cursor is located within the scroll bar at the right edge of the screen, the appropriate scrolling routines are called at this time.

The keyDown Events routine 348 handles keydown events as follows. If a key is pressed while in data edit mode, it is only recognized if it represents a hexadecimal number, and only then if an edit field has been selected with a mouseDown event, as described above. If these conditions exist, the data represented by the key replaces the data indicated by the blinking block cursor. The change in data is immediately reflected on the screen in both hexadecimal fields (Deposit and Tristate) as well as the binary fields. After the event is processed, the cursor is automatically moved to the next logical digit for a smooth flow of editing. If the character is a carriage-return, the cursor is moved to the beginning of the next hex field below the one just modified. If there is no existing data field below, a new one is created with a zero value and the display is updated. Scrolling is automatic.

Update Events routine 350 handles update events as follows. The software keeps track of the exact status of the data being displayed at all times. When an update event is received, the Data Protocol Editor window display is completely redrawn as per the data stored in global variables, including highlighting. The Apple Window Manager takes cares of clipping to just the damaged area.

The Escape Sequences routine 352 is the same as the Escape Sequences routine 338 in the Waveform Editor software module 270. The Cursor Blinking routine 354 handles cursor blinking as follows. If a particular hexadecimal digit is currently selected for editing, it is necessary to alternately highlight and un-highlight that digit with reverse video. This gives visual feedback as to the focus of editing, and appears as a blinking rectangular cursor. The blinking is accomplished by defining a rectangle which just encloses the desired desired screen character and then calling the Apple toolbox routine "InvertRect", which inverts all of the enclosed pixels. The Data Director Workstation keeps track of the elapsed time according to the system clock, and does the inversion approximately twice a second (every thirty clock ticks).

As in the wave editor module 270, the appearance of the cursor provides visual feedback indicating the current functionality of mouseDown events. However, the Update Cursor routine 356 of the Protocol Editor 268 either displays the standard Apple arrow cursor (by calling the Apple toolbox routine "InitCursor"), or turns off the cursor (by calling the Apple toolbox routine "HideCursor") and indicates the cursor position by highlighting the digit which the cursor is touching with reverse video. When the cursor is in the binary field, the cursor is turned off and the binary digit which the cursor is nearest becomes highlighted in reverse video. When the cursor is in the hex field, the cursor is turned off and the hex digit which the cursor is nearest becomes highlighted in reverse video. When the cursor is anywhere else, the standard Apple arrow cursor is enabled.

Software: ZTOP Main Loop 274

Figure 10:
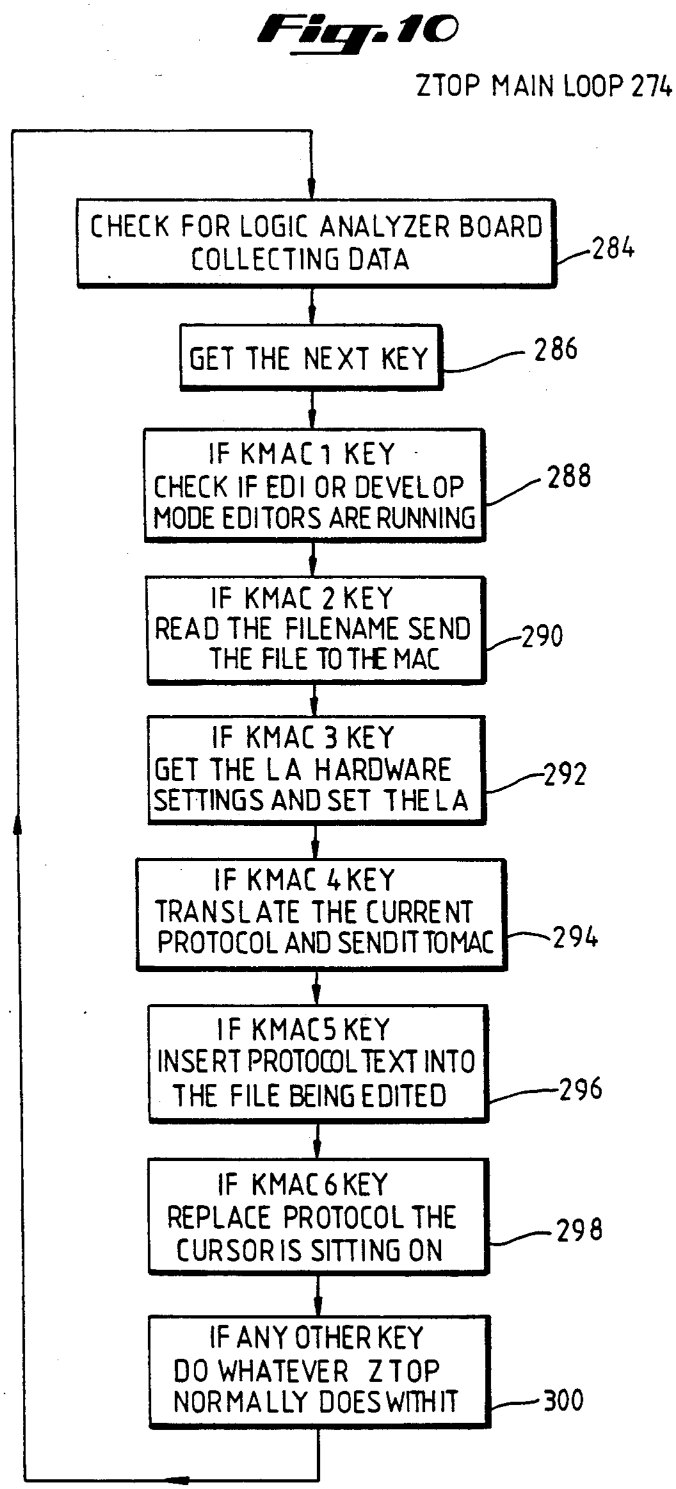

The Ztop main loop program 274 is the program running on the multibus computer 38 that reads data from the keyboard, and starts up the various programs the user wants to run, such as command mode, develop mode, and operate mode. As modified for the test system 26 of the present invention, the Ztop program 274 accepts new "keys" (actually character sequences) from the Mac, one "key" for each command the Mac wants it to perform. Referring now to FIG. 10, the new modifications of the Ztop program 274 are illustrated in steps 284–300 in flow chart form. Following is a description of the actions done by the Ztop program 274 for the Mac "keys" added for the test system 26 of the present invention.

Referring now to the step 288, the Ztop 274, in response to a "KMAC1" command, checks if the EDI editor software 278 or the DEVELOP mode editor 280 is running. More particularly, in the step 288, the Ztop software looks for a semafore file. If this file exists (in the expected place) then the Ztop program 274 knows the EDI editor 278 or the Develop mode 280 is running. Ztop then sends a sequences of characters to the Mac to tell the Mac what it found out.

Referring now to the step 290, in response to a "KMAC2" command, the Ztop program 274 reads the file name which the Mac sends, looks for this waveform file, and if found, sends the file to the Mac with the SendFile software module 250.

Referring now to the step 292, in response to a "KMAC3" command, the Ztop program 274 reads the characters which follow the KMAC3 character sequence. These are the characters describing the desired setting of the Logic Analyzer hardware (which the user set up in a Logic Analyzer Setup 302). The Ztop then checks for errors in the settings, initializes the Logic Analyzer 32 if it hasn't been already, sets a variable "MBarm" to "ONE", and sets the logic analyzer hardware 32 to the settings the user wanted.

Referring now to the step 294, in response to the KMAC4 character sequence, the Ztop program 274 translates the current protocol and sends it to the Mac. More particularly, the Ztop program 274 asks the Editor 278 to write out to a temporary file the text in the file the user is editing from the current cursor position to the end of the file. Ztop then reads the protocol from this temporary file and puts it into another temporary file. Ztop then calls the Wddpars program 276 to translate this protocol file into a waveform file. Ztop sends the file to the Mac with the SendFile program 250. If there were any syntax errors with the protocol the cursor was sitting on (or if the cursor wasn't sitting on a protocol) Ztop sends an error message to be displayed on the Mac.

Referring now to the step 296, in response to a KMAC5 command, the Ztop program 274 inserts protocol text into the file being edited. More particularly, the Ztop reads the protocol text from the Mac with a RecFile program. Ztop then checks to see if EDI 278 or DEVELOP 280 is running, and if not, issues an error message to the Mac for display. Ztop then sends the protocol text to the editor character by character, as though someone were typing it in, and then sends a special command key to tell the editor the insertion is finished.

Referring now the the step 298, in response to a KMAC6 command, the Ztop program 274 replaces the protocol the cursor is sitting on. More particularly, if the EDI 278 or DEVELOP 280 mode editors are running, Ztop asks the Editor to write out to a temporary file the text in the file the user is editing, from the current cursor position to the end of the file. Ztop then finds the end of the current protocol by looking for the keyword "DONE;" and while doing this, counts the number of lines in the protocol and stores the result in the variable nlines. Ztop then gets the new protocol from the Mac with the RecFile program, and deletes the lines of the old protocol by looking in the variable nlines to see how many lines it had. If the cursor is now at the end of the file being edited, Ztop then appends the new protocol to the end of the file. If the cursor is not at the end of the file, Ztop inserts the protocol into the file.

Software: Micro Run 283

The Test Head Controller 42, combined with the Data Pod 30, provides a programmable digital listen function for testing DUTs with a free running microprocessor. The Pod is used to generate trigger signals based on DUT activity, to control the digital measurement window within the THC 42. This allows onboard tests to be run and conditionally monitored by the test system 26. The Micro Run software 283 also supplies various clock signals to the DUT.

The Pod 30 is controlled by both the Logic Analyzer board 32 and the THC 42, modified according to the present invention. The majority of setup information needed to control the Micro Run 283 features are controlled by the THC 42. The Micro Run 283 makes use of the Logic Analyzer 32 to control the Pod 30 environment (i.e. Pod power, high rate clock generation, etc.). The trigger circuit 56 of the Pod 30 monitors up to sixteen data lines to form start and stop signals for digital measurement window control. The Pod 30 also does some signal selection and routing for digital test clocks.

The Micro Run feature of the test system 26 is included to allow the user to monitor the digital signals produced by a free running microprocessor. The user can specify two sixteen-bit patterns that determine the start and end of the measurement window (the high or low byte of either word can be specified as don't care). When the data bus matches the start pattern, the listen window is opened. When the data bus matches the stop pattern, the listen window is closed. The data monitored during this listen window can be clocked by either the internally generated clock or the Measure Clock Signal 109.

Figure 17:
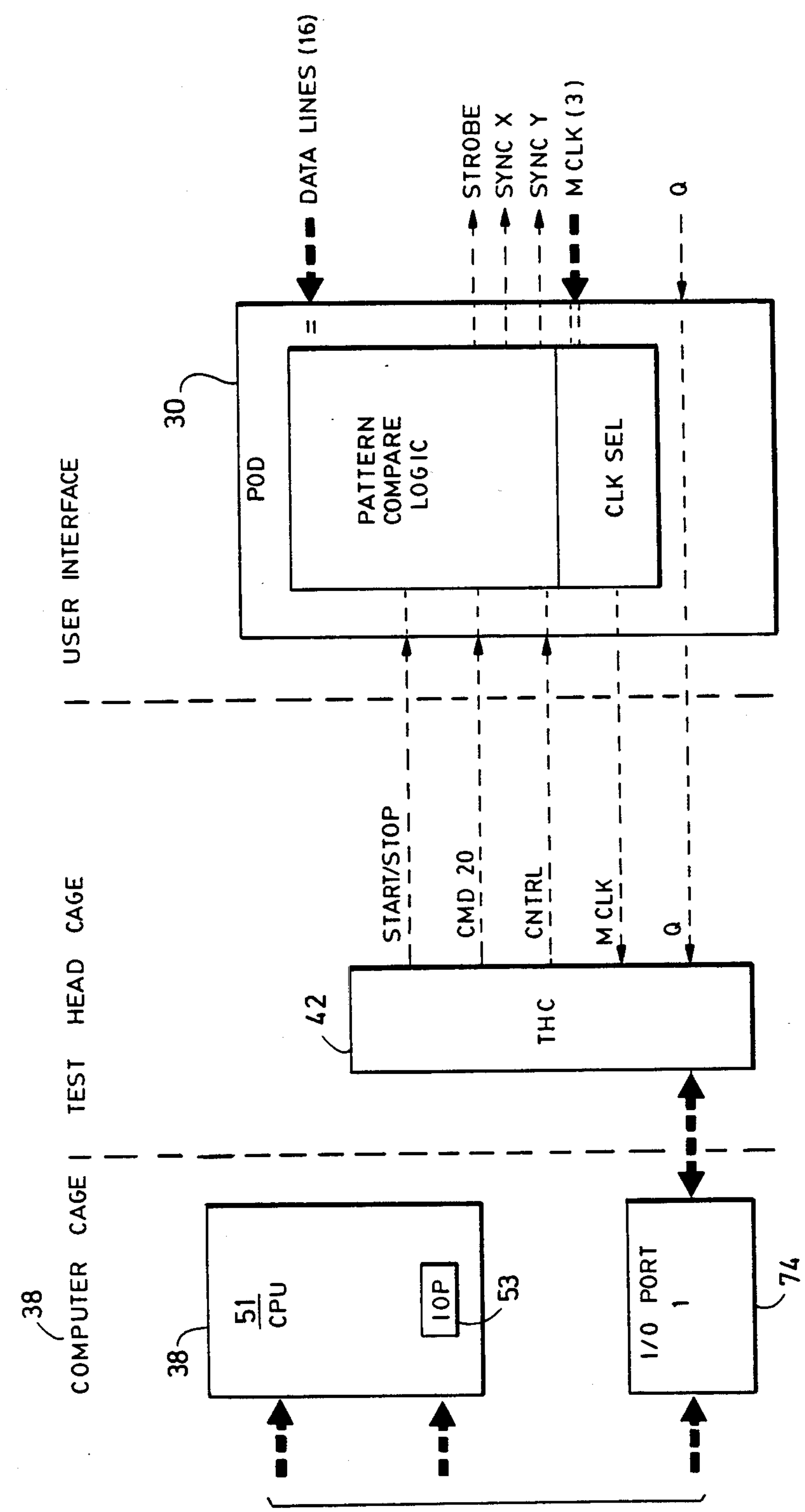
FIG. 17 illustrates in block diagram form the communications between the multibus computer 38, the test head controller 42, and the data Pod 30.
Figure 18A:
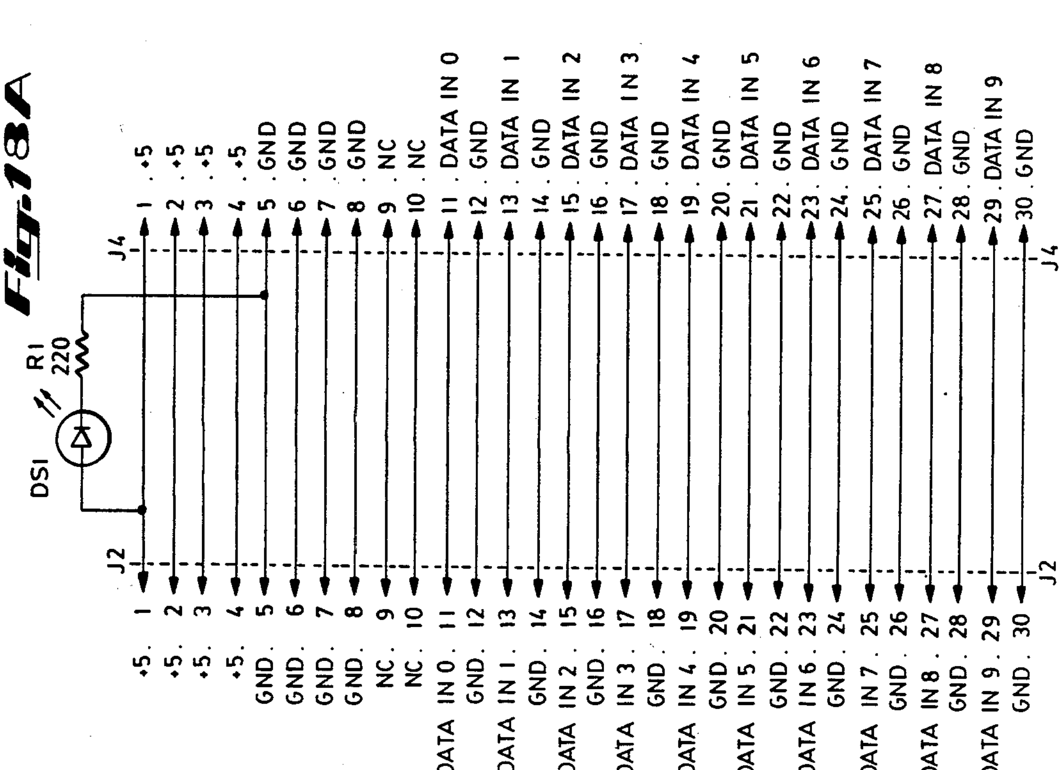
FIGS. 18A–18C illustrate in schematic diagram form the test jack panel 73 of FIG. 1.
Figure 18B:
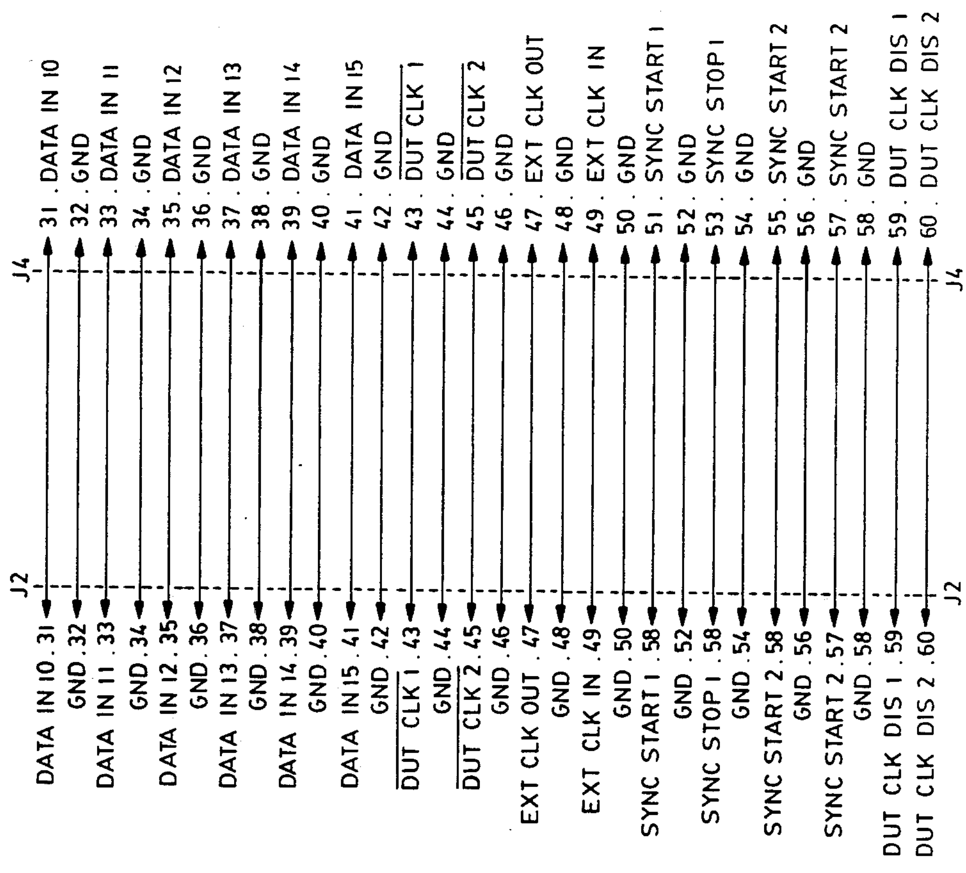
Figure 18C:
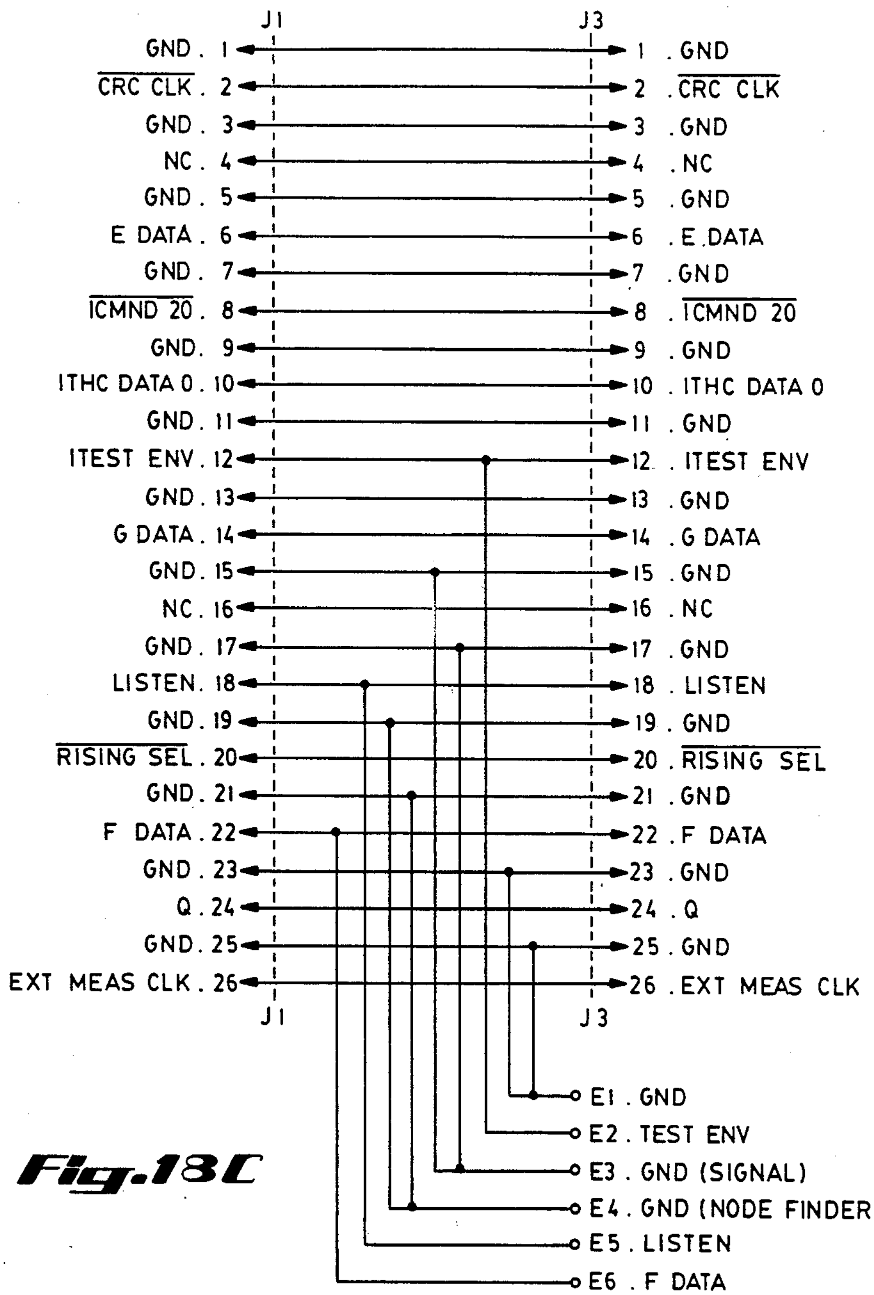
Figure 18D:
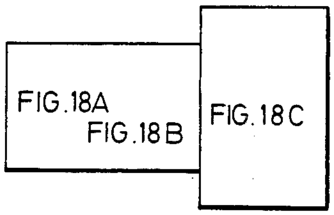
FIG. 18D illustrates in block diagram form how FIGS. 18A–18C fit together.
Figure 20G:
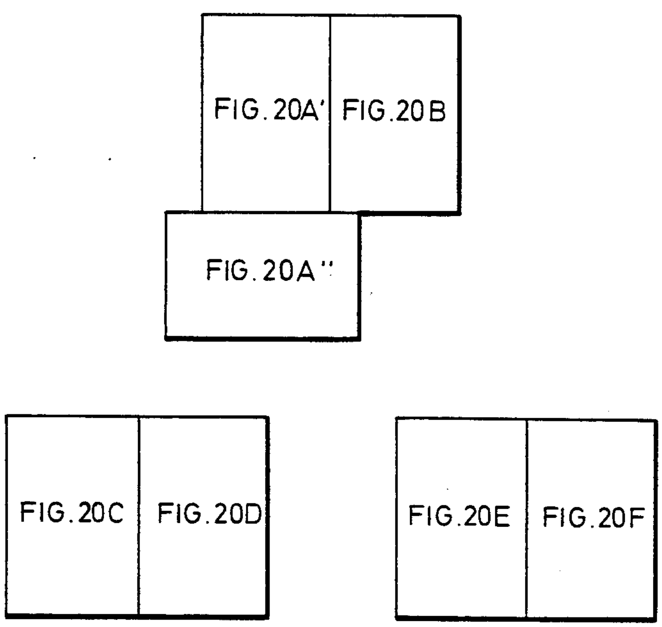
FIG. 20G illustrates in block diagram form how FIGS. 20A–20F fit together.

Referring now to FIG. 17, the Input/Output Processor Software Module (IOP) sends setup information through the THC 42 to the Pod 30, to properly configure the start/stop pattern monitoring circuits. This setup information includes: start pattern, stop pattern, pattern don't care bits, external clock select, and delay enable. The THC requires internal setup information also. This information includes: sync polarity, external measure enable, and clock qualifier selection. FIGS. 18A-C illustrate in a schematic form the test jack panel 73 which connects the THC 42 to the lines 68, 70, and 72 from the Pod 30.

The software system architecture is designed to support a high level programming language to control the tester electronics. This is accomplished through the usage of three major software subsystems. These subsystems are the parser **282*a*, the interpreter 282*b* and an I/O processor (IOP) 282*c***.

TABLE 1

The System 26 Software Architecture.

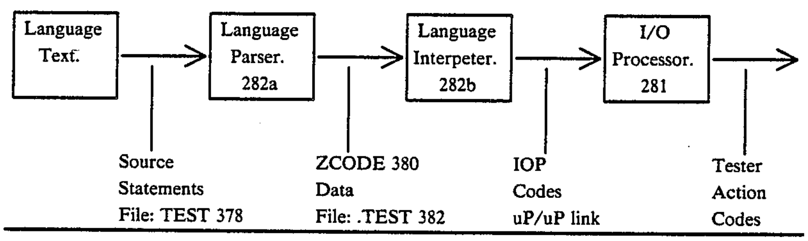

The parser **282*a* is used to convert the high level language input (from file TEST 378) into ZCODE 380 data. The ZCODE 380 structures are passed to the interpreter through a secondary file type (.TEST 382). This file structure contains the ZCODEs used to execute the desired actions of the high level language statements. The ZCODES 380 are processed by the interpreter 282*b* (also known as the Z-machine) into IOP codes 384. The IOP codes 384 are passed over a interprocessor bus to the IOP hardware 53 and software 281. The IOP codes 384 are translated into test actions by sending data to the Test Head Controller (THC) 42. The THC 42** converts the codes into tester actions (i.e. open/close relay, apply/measure digital signals, etc.).

The inclusion of the Micro Run feature to the previous test system required the addition of five new source statements, one new ZCODE 380 and one new IOP code 384. The following sections will describe these additions in some detail.

Software: PARSER 282*a* ADDITIONS

With the Addition of Micro Run into the test system, five new test statements needed to be added to the test language. These additions are intended to provide control of the Micro Run hardware in a manner consistent with the exsisting test language. The parser **282*a*** additions are covered more fully in the following sections.

The following statements and syntax in the "C" programming language were developed for this addition:

```
SYNC (X|Y) ON sync_add;
SYNC STROBE (HI|LO);
EXTMEAS DELAY (ON|OFF);
EXTMEAS ENABLE (ON|OFF);
EXTMEAS WITH clock_qual;
```

In addition to the new language statements, the parser 282 needed a new ZCODE 380 structure to transfer the intended actions to the interpreter. A single ZCODE was identified to support this need. The following is description of the new ZCODE structure:

```
#define MICRO_RUN       214   /* proceeds micro_run structure         */
struct  micro_run {
    short act_code;           /* desired action (see below)           */
    short param1;             /* usage varies with action             */
    short param2;             /* usage varies with action             */
    short param3;             /* usage varies with action             */
};
/*    The following are the defined Micro Run action codes            */
#define SYNC_ON          1    /* SYNC (X|Y) ON address                */
#define SYNC_STRB        2    /* SYNC STROBE (HI|LO)                  */
#define EXTM_DELAY       3    /* EXTMEAS DELAY (ON|OFF)               */
#define EXTM_ENABLE      4    /* EXTMEAS ENABLE (ON|OFF)              */
#define EXTM_WITH        5    /* EXTMEAS WITH clock_qual              */
```

Software: INTERPRETER 282*b* ADDITIONS

Additional support is needed in the interpreter **282*b* to process the above mentioned zcode (MICRO_RUN). The interpreter accepts all the Micro Run instruction via the MICRO_RUN Zcode. These commands are processed into a single structure which is sent to the IOP software 282*c* when the apropriate actions have been taken. Each action code of the MICRO_RUN zcode, are used to set some part of the IOP Micro Run structure 283** (MicroRunData). The following is a description of the new IOP structure:

```
struct  MicroRunData {
    short   Command;     /* MICRORUN, IOP            */
                            command #214
    short   SyncYaddr;   /* sync Y address           */
    short   SyncXaddr;   /* sync X address           */
    short   EMCn_DC;     /* Don't cares, EMCn Delay  */
    short   ClkQual;     /* Strobe, Ext Meas, Clk Qual */
    short   InvClkQ;     /* clock qualifier Invert   */
};
```

The following description further defines the bit packed data word of the MicroRunData 283 structure.

EMCn_DC

| 15-7 NOT USED | 6 | 5 | 4 | 3 | 2 | 1 | 0 |
| --- | --- | --- | --- | --- | --- | --- | --- |

EXTMEAS DELAY (ON = 1, OFF = 0)
EMCn (n: 0 = 00, 1 = 01, 2 = 10)
(part of EXTMEAS WITH command)
Don't care select for SYNC X ADDRESS
(xxxx = 00, ddxx = 01, xxdd = 10, dddd = 11)
Don't care select for SYNC Y ADDRESS
(xxxx = 00, ddxx = 01, xxdd = 10, dddd = 11)

ClkQual

| 15-7 NOT USED (NU) | 7 | 6 | 5 | 4 | 3 NU | 2 | 1 | 0 NU |
| --- | --- | --- | --- | --- | --- | --- | --- | --- |

clock qualifier (clock_qual)
EMCn = 000
EMCn* = 001
EMCn & Q or EMCn* | Q* = 010
EMCn* & Q or EMCn | Q* = 011
EMCn & Q* or EMCn* | Q = 011
EMCn* & Q* or EMCn | Q = 101
EXTMEAS ENABLE (ON = 0, OFF = 1)
SYNC STROBE (HI = 0, LO = 1)

InvClkQ

| 15-1 NOT USED | 0 |
| --- | --- |

clock qualifier invert
EMC only or EMC & Q or (EMC | Q)* = 1
(EMC & Q)* or EMC | Q = 0

Support of the Micro Run 283 feature is integrated into the overall structure of the interpreter 282*b*. The processing of digital stimulus and measurement is broken up into many small parts that can be combined to perform several different tasks. The integration of Micro Run requires that much if its processing also be broken up. The best way to describe this type of process is to examine its states and state transitions. Referring now to FIG. 21, the Micro Run State Diagram pictorally describes the interpreter 282*b* actions during the process of using the Micro Run feature 283.

Micro Run starts its processing from a cleared state (state 0 in the Micro Run State Diagram). The Micro Run state is set to the zero state, from any other state, whenever the interpreter is sent a mode change (e.g. RES mode to DIGITAL mode) or new component identifier (any double quoted string at the beginning of a test step, e.g. "U21"). Upon the receipt of any of the Micro Run commands the Micro Run state is advanced to the idle, but commanded state (state 1). This state is maintained throughout the Micro Run setup instructions.

When the interpreter 282*b* receives the digital listen window information for a digital test, the Micro Run state is advanced to one of the two Setup states, if the present state was one of three idle states. If a normal listen window is specified (e.g. from Fx to Fy), the state is set to the partial setup state (state 3). Partial setup implies that the normal measurement sequence is used (no Micro Run gating of the measurement window). To set up Micro Run to this state, the clock qualifier setup information is cleared in the MicroRunData structure. In this state the Micro Run hardware continues to monitor the data bus, looking for the matching start and stop patterns, but the sync X and Y outputs are not connected to the measurement circuits. This type of setup can be used to trigger some external device (e.g. oscilloscope or logic analyzer).

If a Sync to Sync listen window is specified, and the present state is one of the idle states, the Micro Run state is set to the full setup state (state 2). In this state the Micro Run hardware will monitor the data bus, and control the measurement window based on the setup information in the MicroRunData structure.

As the interpreter 282*b* progresses through the stimulus/measurement sequence, the interpreter receives the instructions to initiate the digital sequence. Prior to the start of the sequence, if the Micro Run state is one of the setup states (state 2 and 3), the Micro Run setup is sent to the Pod 30. Before the setup is sent, a final check is performed to determine if the full setup state (state 2) is actually complete. If the EXTMEAS ENABLE is not set (ON), the state is changed to the partial setup state (state 3). Without the THC 42 and Micro Run enabled, the THC will receive no clock, and the test cycle would timeout.

With either of the two setup states selected the MicroRunData structure is now sent to the Pod 30, via the THC 42: Then depending on the setup state, the Micro Run state is set to either of the two idle states that occur after a setup has been sent (states 4 and 5).

The interpreter 282*b* additions are covered more fully in the following sections.

Software: IOP 282*c* ADDITIONS

Additional support is needed in the IOP 282*c* to process the above mentioned IOP structure (MicroRunData). The IOP accepts the MicroRunData structure prior to the start of a digital test sequence. The IOP converts this data structure into data images that are sent to the THC 42. Some of this data is sent through the THC to the Pod 30. This data includes the Sync X and Y patterns, "Don't care" information (this applies to the Sync X and Y patterns), EMCn, and Delay selection. Some of the data is used to configure the THC in order to perform the requested measurement setup. This information includes: Sync Strobe polarity, EXTMEAS Enable, Clock Qualifier specification and Clock Qualifier polarity.

The information sent through the THC 42 to the Pod 30 is formatted into a 40-bit data stream. This data stream is shifted, one bit at a time, to the the Pod. The data is transfered to the LSB of port 72 of the General Purpose I/O board (GPIO). Then a CMND20 strobe is generated to shift the data from the input port to the Pod. As this data is transfered from the IOP in serial manner, it is necessary that all 40 bits are transferred for each data change. If less than 40 bits are transferred, the data will be misaligned, and meaningless to the Pod. The format of the 40-bit stream is as follows:

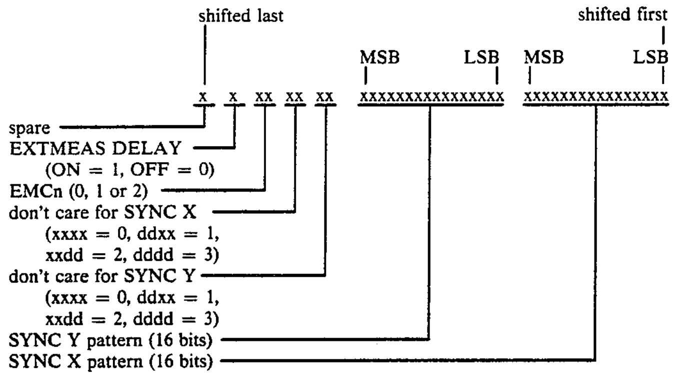

The data used to configure the THC is sent out to two of the THC registers. Sync strobe polarity, EXTMEAS enable, and the Clock Qualifier specification are sent out to command register 21. The Clock Qualifier polarity select is sent out to command register 6. The format of these registers is described as follows:

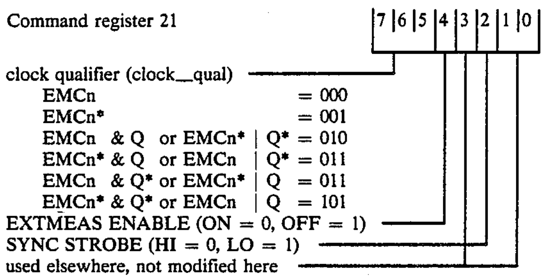

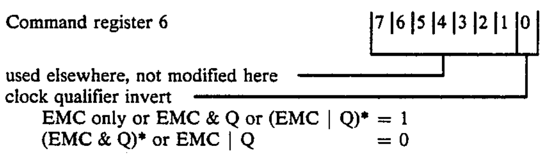

Software: Micro Run USER LANGUAGE SYNTAX

The user language needed to support the Micro Run feature is defined below. The purpose of this language addition is to properly configure the pod and test head controller for micro run testing.

The statement syntax to specify the desired start or stop address is programmed with the SYNC ON command. The user can completely specify either address, or use a don't care assignment for either the high or low byte of the address. When the Pod detects the specified address, a pulse is generated on the corresponding SYNC (X or Y) line. The SYNC (X and Y) lines need to be connected in the test fixture to EXT (1 and 2) lines.

```
SYNC (X | Y) ON sync_add;
sync_add          :: (hex | hexxx | xxhex | xxxx)
```

The parser 282*a* support for the 'SYNC ON' provides the user with the language interface for this command. The parser 282*a* first needs to recognize the language syntax. This is accomplished by identifying the tokens that are to recongnized. For this statement, the necessary tokens are as folows:

| SYNC | X | Y | ON |
|---|---|---|---|
| HEX | HEXXX | XXHEX | XXXX |

The numeric tokens (HEX, HEXXX XXHEX and XXXX) are identified during the lexical scan portion of the parsing process. The lexical rules for these tokens is defined below.

| | |
|---|---|
| {h} [A−Fa−f0−9]+ | HEX |
| {h} {x} {x} [A−Fa−f0−9] [A−Fa−f0−9] | XXHEX |
| {h} [A−Fa−f0−9] [A−Fa−f0−9] {x} {x} | HEXXX |
| {h} {x} {x} {x} {x} | XXXX |

Notes:

| | |
|---|---|
| {h} | either 'H' or 'h'. |
| {x} | either 'X' or 'x'. |
| [A−Fa−f0−9] | any character between 'A' and 'F' or 'a' and 'f' or '0' and '9'. |
| + | repeat previous pattern as needed. |

The tokens are processed in the parser, according to the instructions built into the grammar rules. The grammar instructions are built using YACC (Yet Another Compiler Compiler). The following rules are added to support the SYNC ON instruction:

```
    %token  TSYNC,TX,TY,TON        /* micro run tokens */
    /* Rules for language statement ("stat") syntax */
    | TSYNC TX TON sync_add       { sync_on(0);}
    | TSYNC TY TON sync_add       { sync_on(1);}
    /* Lower reductions used to build "stat" syntax */
sync_add            : hex         { sync_addr($1, 3);}
                    | xxhex       { sync_addr($1, 2);}
                    | hexxx       { sync_addr($1, 1);}
                    | xxxx        { sync_addr($1, 0);}
                    ;
hex                 : HEX         { $$=(int) save_str($1);}
                    ;
xxhex               : XXHEX       { $$=(int) save_str($1);}
                    ;
hexxx               : HEXXX       { $$=(int) save_str($1);}
                    ;
xxxx                : XXXX        { $$=(int) save_str($1);}
                    ;
```

In processing the statement syntax rules, the parser 282*a* compares the tokens in the input string to the defined tokens. Upon finding the first matching pattern, the parser checks the remaining field until the tokens are exhausted, or until the pattern no longer matches. If a mismatch occurs, the parser advances to the next syntax rule, and continues. If the parser matches the syntax definition to the end of a given rule (including all lower level reductions), then the tokenvalues (as indicated by the action part of the rule) are processed to build the appropriate ZCODE translation of the input string.

In the preceeding definition, if an input string of "SYNC Y ON HIDXX;" was passed to the parser 282a, the following actions would be taken. The second syntax rule would match the first three fields (SYNC Y ON). This would advance the parser to process the 'sync_add' reduction. This reduction would recognize the field 'HIDXX', to be of the hexxx type. The hexxx reduction would in turn, return a pointer to the string saved by the action part of the rule.

The action part of the previous reduction (sync_add) passes the pointer returned by hexxx ('$1' indicates the value of the first field, either a constant or the value returned by the action part of the rule) and a constant (1) to the routine sync_addr(). The sync_addr() routine accepts the string pointer and don't care state, and converts the string to an integer. This routine does not return any information. The converted string is stored in a global integer, Sync_Addr. The "don't care" information passed to sync_addr() routine is also stored in a global integer, Dont_Care.

Upon returning from the sync_addr() routine, the action part of the sync_add reduction is complete. The parser 282a then processes the action part of the 'SYN Y ON' rule. This action is to call the sync_on() routine with the constant identified (1). The sync_on() routine builds and sends the MICRO RUN instruction to the ZCODE 380 file. The follow data is sent for this example:

| | | |
|---|---|---|
| zcode | 214 | /* micro run zcode */ |
| act_code | 1 | /* Sync on instr. */ |
| x_or_y | 1 | /* passed to sync_on */ |
| Sync_Addr | 7427 | /* data from snyc_addr( ) */ |
| Dont_Care | 1 | /* data from sync_addr( ) */ |

Notes:

| | |
|---|---|
| x_or_y | 0 - sync x |
| | 1 - sync y |
| Dont_care | 0 - don't care high and low byte |
| | 1 - don't care low byte |
| | 2 - don't care high byte |
| | 3 - fully specified address |

Upon receipt of the MICRO RUN ZCODE 380 structure with the SYNC ON action code, the interpreter 282b enters the micro run() routine. Based on the value of the first parameter (param1), the interpreter 282b processes the indicated sync pattern fields in the MicroRunData structure.

In addition to the changes made in the MicroRunData structure, the interpreter 282b changes the Micro Run state to the idle, but commanded state (state 1 in FIG. 21). These changes can take place from any of the Micro Run states. The following fields are modified for the MicroRunData structure:

| Input Data (MICRO_RUN) | Output Data (MicroRunData) |
|---|---|
| if param1 = 1 (SYNC_Y_ADDR) | |
| param2 → | SyncYaddr |
| param3 (bits 0 & 1) → | EMCn_DC (bits 0 & 1) |
| if param1 = 1 (SYNC_X_ADDR) | |
| param2 → | SyncXaddr |
| param3 (bits 2 & 3) → | EMCn_DC (bits 2 & 3) |

The user must also specify on which edge of the address strobe pulse the address information is valid. The Pod 30 AS input line 62 needs to be connected in the test fixture 44 to the desired DUT address strobe signal. The statement syntax to specify the strobe edge is as follows:

SYNC STROBE (HI|LO);

The parser 282a support for the 'SYNC STROBE' provides the user with the language interface for this command. The parser 282a first needs to recognize the language syntax. This is accomplished by identifying the tokens that are to recognized. For this statement, the necessary tokens are as follows:

| | | | |
|---|---|---|---|
| SYNC | STROBE | HI | LO |

The tokens are processed in the parser 282a, according to the instructions built into the grammar rules. The grammar instructions are built using YACC (Yet Another Compiler Compiler). The following rules are added to support the SYNC STROBE instruction:

```
%token TSYNC,TSTROBE,THI,TLO        /* micro run tokens */
/* Rules for language statement ("stat") syntax */
| TSYNC TSTROBE THI                  { sync_strb(0);}
| TSYNC TSTROBE TLO                  { sync_strb(1);}
```

In the preceeding definition, if an input string of "SYNC STROBE HI;" was passed to the parser, the following actions would be taken. The first syntax rule would match the three identifed fields (SYNC STROBE HI). The action part of this rule passes a zero to the routine sync_strb().

The sync_strb() routine has only one parameter, hi_or_lo. This parameter is the state of the HILO field of the statement syntax. In the example hi_or_lo is passed as a zero (HI). The sync_strb() routine builds and sends the micro run instruction to the ZCODE file. The follow data is sent for this example:

| | | | |
|---|---|---|---|
| zcode | 214 | /* micro run zcode | */ |
| act_code | 2 | /* Sync strobe instr. | */ |
| hi_or_lo | 0 | /* input to sync_strb( ) | */ |
| param2 | xxxx | /* data not used | */ |
| param3 | xxxx | /* data not used | */ |

| | |
|---|---|
| hi_or_lo | 0 - strobe HI |
| | 1 - strobe LO |
| xxxx | 0 - data not altered. |

Upon receipt of the MICRO RUN ZCODE structure with the SYNC STROBE action code, the interpreter 282b enters the micro_run() routine. Based on the value of the first parameter (paraml), the interpreter 282b processes part of the MicroRunData structure.

In addition to the changes made in the MicroRunData structure, the interpreter 282b changes the Micro Run state to the idle, but commanded state (state 1 in FIG. 21). These changes can take place from any of the Micro Run states. The following fields are modified for the MicroRunData structure:

| Input Data (MICRO_RUN) | Output Data (MicroRunData) |
|---|---|
| param1 (bit 0)——————— | ——>ClkQual (bit 2) |

The Micro Run feature clocks data based on a combination of the selected EMC and Q signals. As discussed in relation to FIG. 2, it is possible to delay this clock by 120 ns in the Data Pod 30. The syntax for controlling this clock delay is as follows:

EXTMEAS DELAY (ON|OFF);

The parser 282a support for the 'EXTMEAS DELAY' provides the user with the language interface for this command. The parser first needs to recognize the language syntax. This is accomplished by identifying the tokens that are to recongnized. For this statement, the necessary tokens are as follows:

| | | | |
|---|---|---|---|
| EXTMEAS | DELAY | ON | OFF |

The tokens are processed in the parser, according to the instructions built into the grammar rules. The grammar instructions are built using YACC (Yet Another Compiler Compiler). The following rules are added to support the EXTMEAS DELAY instruction:

```
%token  TEXTMEAS,TDELAY,          /* micro run tokens */
TON,TOFF
/* Rules for language statement ("stat") syntax */
| TEXTMEAS TDELAY on_off        { sync_delay($3);}
/* Lower reductions used to build "stat" syntax */
        on_off          : TON           { $$ = 1;}
                        | TOFF          { $$ = 0;}
                        ;
```

In the preceeding definition, if an input string of "EXTMEAS DELAY ON;" was passed to the parser 282a, the following actions would be taken. The EXTMEAS syntax rule would match the first two fields (EXTMEAS DELAY). This would advance the parser to process the 'on off' reduction. This reduction would recognize the field 'ON', and would in turn, return a constant (1). The action part of this rule passes the result of the on_off reduction to the routine sync_delay().

The sync delay() routine has only one parameter, on_or_off. This parameter is the state of the ON|OFF field of the statement syntax. In the example on_or_off is passed as a one (ON). The sync_delay() routine builds and sends the micro run instruction to the ZCODE file. The follow data is sent for this example:

| | | | |
|---|---|---|---|
| zcode | 214 | /* micro run zcode | */ |
| act_code | 3 | /* EXTMEAS DELAY instr. | */ |
| on_or_off | 1 | /* input to sync_delay( ) | */ |
| param2 | xxxx | /* data not used | */ |
| param3 | xxxx | /* data not used | */ |

Notes:
on_or_off 0 - delay OFF

-continued

1 - delay ON
xxxx 0 - data not altered.

Upon receipt of the MICRO RUN zcode structure with the EXTMEAS DELAY action code, the interpreter 282b enters the micro_run() routine. Based on the value of the first parameter (paraml), the interpreter processes part of the MicroRunData structure.

In addition to the changes made in the MicroRunData structure, the interpreter 282b changes the Micro Run state to the idle, but commanded state (state 1). This changes can take place from any of the Micro Run states. The following fields are modified for the MicroRunData structure:

| Input Data (MICRO_RUN) | Output Data (MicroRunData) |
|---|---|
| param1 (bit 0)——————— | ——>EMCn_DC (bit 6) |

To properly configure the THC 42 for Micro Run operation the data input must be enabled from the Pod 30 to the THC 42. The following statement enables the Micro Run data collection.

EXTMEAS ENABLE (ON|OFF);

The parser 282a support for the 'EXTMEAS ENABLE' provides the user with the language interface for this command. The parser first needs to recognize the language syntax. This is accomplished by identifying the tokens that are to recongnized. For this statement, the necessary tokens are as follows:

| | | | |
|---|---|---|---|
| EXTMEAS | ENABLE | ON | OFF |

The tokens are processed in the parser, according to the instructions built into the grammar rules. The grammar instructions are built using YACC. The following rules are added to support the EXTMEAS ENABLE instruction:

```
%token  TEXTMEAS,TENABLE,          /* micro run tokens */
TON,TOFF
/* Rules for language statement ("stat") syntax */
| TEXTMEAS TENABLE on_off       { sync_delay($3);}
/* Lower reductions used to build "stat" syntax */
        on_off          : TON           { $$ = 1;}
                        | TOFF          { $$ = 0;}
                        ;
```

In the preceeding definition, if an input string of "EXTMEAS ENABLE ON;" was passed to the parser, the following actions would be taken. The EXTMEAS syntax rule would match the first two fields (EXTMEAS ENABLE). This would advance the parser to process the 'on_off' reduction. This reduction would recognize the field 'ON', and would in turn, return a constant (1). The action part of this rule passes the result of the on off reduction to the routine sync_enable().

The sync_enable() routine has only one parameter, on_or_off. This parameter is the state of the ON/OFF field of the statement syntax. In the example on or off is passed as a one (ON). The sync_enable() routine builds and sends the micro run instruction to the ZCODE file. The follow data is sent for this example:

| | | | |
|---|---|---|---|
| zcode | 214 | /* micro run zcode | */ |
| act_code | 4 | /* EXTMEAS ENABLE instr. | */ |
| on_or_off | 1 | /* input to sync_enable( ) | */ |
| param2 | xxxx | /* data not used | */ |
| param3 | xxxx | /* data not used | */ |

Notes:
on_or_off 0 - enable OFF
1 - enable ON
xxxx 0 - data not altered.

Upon receipt of the MICRO RUN zcode structure with The EXTMEAS ENABLE action code, the interpreter 282*b* enters the micro_run () routine. Based on the value of the first parameter (param1), the iterpreter 282*b* processes part of the MicroRunData structure.

In addition to the changes made in the MicroRunData structure, the interpreter 282*b* changes the Micro Run state to the idle, but commanded state (state 1 in FIG. 21). These changes can take place from any of the Micro Run states. The following fields are modified for the MicroRunData structure;

| Input Data (MICRO_RUN) | Output Data (MicroRunData) |
|---|---|
| param1 (bit 0) ——→ | ClkQual (bit 4) |

The process of specifying when the data to be measured is valid is handled with the "EXTMEAS WITH" command. This command allows the programmer to specify what combination of signals are necessary to validate the measured data. The syntax for specifying the data valid logic is as follows:

```
EXTMEAS WITH ( clock_qual | '('clock_qual')*' );
clock_qual    :: emc_type[*] [ (AND | OR) Q[*] ]
emc_type      :: (EMC0 | EMC1 | EMC2)
```

The parser 282*a* support for the 'EXTMEAS WITH' provides the user with the language interface for this command. The parser 282*a* first needs to recognize the language syntax. This is accomplished by identifying the tokens that are to recongnized. For this statement, the necessary tokens are as follows:

| | | | | | | | |
|---|---|---|---|---|---|---|---|
| EXTMEAS | WITH | AND | OR | EMC0 | EMC1 | EMC2 | Q |

-continued

The tokens are processed in the parser, according to the instructions built into the grammar rules. The grammar instructions are built using YACC. The following rules are added to support the EXTMEAS WITH instruction:

```
%token  TEXTMEAS,TWITH,TAND,TOR              /* micro run tokens */
%token  TEMC0,TEMC1,TEMC2,TQ                 /* micro run tokens */
/* Rules for language statement ("stat") syntax */
| TEXTMEAS TWITH clock_qual                  { sync_clkq($3,0);}
| TEXTMEAS TWITH '(' clock_qual ')' '*'      { sync_clkq($4,1);}
/* Lower reductions used to build "stat" syntax */
 clock_qual: emc_type              { set_qual_type($1,0); $$ = 0;}
           | emc_type TAND q_type  { set_qual_type($1,$3);$$ = 1;}
           | emc_type TOR q_type   { set_qual_type($1,$3);$$ = 2;}
           ;
 emc_type   : TEMC0                { $$ = 0;}
            | TEMC0 '*'            { $$ = 1;}
            | TEMC1                { $$ = 2;}
            | TEMC1 '*'            { $$ = 3;}
            | TEMC2                { $$ = 4;}
            | TEMC2 '*'            { $$ = 5;}
            ;
 q_type     : TQ                   { $$ = 0;}
            | TQ '*'               { $$ = 1;}
            ;
```

In the preceeding definition, if an input string of "EXTMEAS WITH EMCL AND Q*;" was passed to the parser, the following actions would be taken. the first syntax rule would match the first two fields (EXTMEAS WITH). The parser would not match the second rule, as there is not a '(' following the token WITH. This would advance the parser to process the 'clock_qual' reduction.

The clock_qual reduction would then advance to the emc_type reduction to resolve that field. The emc_type would resolve to EMCl or a return value of two (2). The clock_qual reduion would then process the 'AND' field, thus identifying the second syntax rule. The parser would then advance to the q_type reduction. The q_type would resolve to Q* or a return value of one (1).

The action part of the second syntax rule would then be processed. This results in a call to set_qual_type() routine, with the parameters of emc_type (2) and q_type (1).

The set_qual_type() routine processes the emc_type and q_type into some global values. The following global values are modified:

| Input Data | Global Values |
|---|---|
| emc_type (bit 0) ——→ | EMCp (bit 0) (EMC polarity indicator) |
| emc_type (bits 1 & 2) ——→ | EMCn (bits 0 & 1) (EMC selector 0, 1, or 2) |
| q_type (bit 0) ——→ | Qpol (bit 0) (Q polarity indicator) |

Upon return from the set qual type() routine, the clock_qual reduction returns a clock qualifier type code (0–2). This type code is specified in the three syntax rules statements in the clock_qual reduction. The EXTMEAS WITH rules now advance to the call of the action part of these rules. Sync_clkq() routine is called with two parameters: qual_type (return from clock_qual reduction) and inv_op (based on which EXTMEAS WITH rule was selected). In the example clock_qual is passed as a one (AND) and inv_op is passed as a zero (clock_qual not inverted). Sync_clkq() also uses the information contained in the globals EMCp, EMCn and Qpol to build up the ZCODE data. The sync_clkq() routine builds and sends the micro run instruction to the ZCODE file. The following data is sent for this example:

| | | | |
|---|---|---|---|
| zcode | 214 | /* micro run zcode | */ |
| act_code | 5 | /* EXTMEAS WITH instr. | */ |
| param1 | x80 | /* EMC and Q | */ |
| param2 | 1 | /* inversion flag | */ |
| param3 | 1 | /* EMC selection | */ |

Upon receipt of the MICRO RUN zcode structure with the EXTMEAS WITH action code, the interpreter 282b enters the micro_run() routine. Based on the value of the first parameter (param1), the interpreter 282b processes part of the MicroRunData structure.

In addition to the changes made in the MicroRunData structure, the interpreter 282b changes the Micro Run state to the idle, but commanded state (state 1 in FIG. 21). These changes can take place from any of the Micro Run states. The following fields are modified for the MicroRunData structure:

| Input Data (MICRO_RUN) | Output Data (MicroRunData) |
|---|---|
| param1 (bits 5-7) → | ClkQual (bits 5-7) |
| param2 (bit 1) → | InvClkQ (bit 1) |
| param1 (bits 0-3) → | EMCn_DC (bits 4-6) |

| Software: MICRO RUN EXAMPLE | |
|---|---|
| DIGITAL; | |
| HICHECK OFF; | |
| : | |
| SYNC X ON H0002; | 'setup micro run start address |
| SYNC Y ON H1DXX; | 'setup micro run stop address |
| SYNC STROBE LO; | 'trigger edge of strobe (LO) |
| EXTMEAS MODE ON; | 'enable external measure mode |
| EXTMEAS DELAY OFF; | 'disable clock delays |
| EXTMEAS WITH EMC1 AND Q; | 'identify combinational logic |
| : | 'of trigger qualifier |
| DATA PROTOCOL . . . ; | 'data director test sequence |
| CONTROL PROTOCOL . . . ; | |
| : | |
| DEFINE SEQ 1; | |
| : | |
| DONE; | |
| CRC Hxxxx; | 'measure data and compare CRC |
| Myyyy FROM SYNCX TO SYNCY; | 'identify measurement pin and |
| : | 'listen window start and stop |

Appendix A contains the source code for the software modules Term Emulator, WaveEdit, Logic Analyzer and Data Protocol.

The principles, preferred embodiments and modes of operation of the present invention have been described in the foregoing specification. The invention is not to be construed as limited to the particular forms disclosed, since these are regarded as illustrative rather than restrictive. Moreover, variations and changes may be made by those skilled in the art without departing from the spirit of the invention.

APPENDIX A

```
#include <mac/quickdraw.h>
#include <mac/osintf.h>
#include <mac/toolintf.h>
#include "global.h"
#include "ddw.h"

#define VER   0x00d7
#define TIMEOUT   0xff
#define MAX_MESSAGE 105

extern int resume();

int (*New_waves)();

struct QDVar QDVar;
MenuHandle menus[MAXMENUS];

wavestruct *waves; /* array of waveform structures */

DialogRecord noterec;
DialogPtr noteptr;
Rect  armrect;
```

```
LASetup  setup_values;
short  auto_display;
char  LA_enable[4] = { '\033', '3', 'x', '\000' };
cursestruct cursors[MAXCURSORS]; /* array of cursors */

Handle  proto_handle;
short  proto_length;
char  proto_name[11];

int  logic_time;
short  logic_enabled;
short  which_loop;
short  block_count;
short  maxwaves;
short  maxclocks;
short  wavechange;
short  debug;
short bugflags[10] = {0xda,0xdb,0xdc,0xdd,0xde,0xdf,0xe0,0xa1,0xe1,0xe2};

#define ON              1
#define OFF   0

/* Main terminal window */
WindowRecord main_wrec; /* main window record */
WindowPtr main_wptr; /* main window pointer */

/* userline window of terminal */
WindowRecord user_wrec; /* user window record */
WindowPtr user_wptr; /* user window pointer */

RgnHandle user_visrgn;  /* Handle to the visible region of the user line
     * window of terminal */
RgnHandle main_visrgn;  /* Handle to the visible region of the main terminal
     * window */
Rect    screen_rect;  /* writeable portion of the main window terminal */

BitMap main_bitmap; /* for holding the bitmap of the main window terminal */
BitMap user_bitmap; /* for holding the bitmap of the user window of the
       * terminal */
/* terminal cursor */
Rect    curse_rect;    /* terminal cursor rectangle */
short   curse_state;   /* terminal cursor: 1 if cursor on (black), 0 if
   * it's off */
short   curse_enable;  /* terminal cursor: OFF if cursor is off (invisible),
   * ON if it's on (black) */

char *mbuffer; /* character buffer for macbuff() and macflush() */
char *mbptr;  /* pointer into mbuffer */
short mbsize;  /* current character count of mbuffer */
short arm_toggle;
short waiting; /* TRUE indicates we're waiting for the tester */
short new_file; /* TRUE indicates we have just loaded a new file */
GrafPtr deskptr;
/* for debugging */
short   dumb;

init_mac()

{
 InitGraf(&thePort);
 InitFonts();
 InitWindows();
 InitMenus();
 TEInit();
 InitDialogs( (ProcPtr) resume );
}

sputnhex( dest, data, nnibbles )
char *dest;
unsigned int data;
int nnibbles;
```

```
{
 unsigned char nibble;
 int i;

 i = 0;
 do
     {
  nibble = ( data >>  ( ( nnibbles - 1 ) * 4 )  ) & 0xf;
  *dest++ = ( nibble <= 0x09 ? nibble + 0x30 : nibble + 0x37 );
     }
 while ( --nnibbles );
 dest[i] = NULL;
}

/*
 *  Desk accessory names begin with a null character.
 *  Fudge is given a C string and returns a Pascal string
 *  with a leading nul character inserted.
 */

char *
fudge(s)
register char *s;
{
    static char ps[256];
    register i;
    register char *dp;

    dp = &ps[2];
    for (i = 1; *dp++ = *s++; i++)
 continue;
    ps[0] = i;
    ps[1] = '\0';
    return isapstr(ps);
}
/* bugout --   Just like aprintf() if and only if debug is TRUE  */

/* VARARGS2 */
bugout(code, format)
int code;
char *format;
{
 char buffer[256];

 if ( debug & code )
     {
  save_te_windows();
  sprintf(buffer, "%r", &format);
  ParamText(buffer,"","","");
  (void) Alert(17, (ProcPtr) 0);
}    }

/*
 wiz_service  -- for internal wizards only.
 Toggle the appropriate bit in "debug" for use by bugout().
*/

wiz_service ( wizword )
int wizword;

{
 register i;
 register wizmask;
 extern char version_message[];

 if ( wizword == VER )
     {
  /* This is the official place for the version number */
  attention ( version_message );
  Wait_Button;
  at_ease();
```

```
        }
    for ( i = 0; i < 10; i++ )
        {
     if ( wizword == bugflags[i] )
         {
      break;
         }
        }
    if ( i == 9 )  /* command-shift-option + '0' clears debug */
        {
     debug = 0;
        }
    else   /* otherwise, we toggle the correct  bit */
        {
     wizmask = 1 << i;
     debug ^= wizmask;
        }
  }

  attention ( format )
  char *format;

  {
   Rect  itembox;
   Handle  itemhandle;
   int  itemhit;
   char  buffer[256];

   save_te_windows();
   sprintf ( buffer, "%r", &format );
   ParamText ( buffer, "", "", "" );
   noteptr =  GetNewDialog ( 258, (Ptr)&noterec, (WindowPtr) -1 );

   if ( noteptr == 0 )
       {
    aprintf ( "GetNewDialog() Failed.\rBummer!" );
       }
   else
       {
    GetDItem ( noteptr, 1, &itemhit, &itemhandle, &itembox );
    SetIText ( itemhandle, buffer );
    ShowWindow ( (WindowPtr) noteptr );
    DrawDialog ( noteptr );
       }
  }

 at_ease()

 {
  if ( noteptr )
      {
    CloseDialog ( noteptr );
    noteptr = (DialogPtr) 0;

    if ( EqualRgn( main_wrec.port.visRgn, main_visrgn ) )
     /* copy bits from main_bitmap to screen area */

     {
         CopyBits ( &main_bitmap, &thePort->portBits,
      &main_bitmap.bounds, &screen_rect,
     srcCopy, (RgnHandle) 0 );
         /* cursor was turned off when the screen was copied,
          * so if cursor now on, restore it */
                if ( curse_state == ON )
                           InvertRect ( &curse_rect );
      }
else
if ( EqualRgn( user_wrec.port.visRgn, user_visrgn ) )
 /* copy bits from user_bitmap to screen area */
```

```
        {
           CopyBits ( &user_bitmap, &thePort->portBits,
        &user_bitmap.bounds, &thePort->portRect,
          srcCopy, (RgnHandle) 0 );
        }
      }
}

/*
 mprintf()  --  Corresponds to mprintf() in ZTOP.

 ESC P from tester triggers this routine which reads character from
 the serial port until EOT, then displays string with aprintf().

 This allows the tester to display messages neatly on the Mac.
*/

mprintf()

{
 register i = 0;
 register char *ptr;
 unsigned char error;
 unsigned char get_byte();
 char message[256];
 char c;
 char last_c;

 put_tty ( ACK ); /* tell tester we're ready for message */

 ptr = message;
 last_c = '\000';
      /* read the message */
 while ( ( error = get_byte ( &c ) ) != TIMEOUT && c != EOT )
      {
  if ( c == '\n' )  /* map \n or \r\n to \r */
      {
   if ( last_c == '\r' )
       {
    c = '\000';
       }
   else
       {
    c = '\r';
       }
      }
  if ( c && (i++ < 255) ) /* truncate on overflow */
      {
   *ptr++ = c;
      }

  last_c = c;
     }
 *ptr = NULL;

 if ( error == TIMEOUT )
     {
  aprintf ( "System Error!\rTimed out while receiving an error message" );
     }
 if ( strlen ( message ) > 0 )
     {
   /* aprintf() waits for operator response */
  aprintf ( message );
   /* tell tester we're through */
     }
 put_tty ( ACK );
 waiting = 0;
 if ( which_loop != WAVEDIT )
```

```
      {
    InitCursor();
      }
  }  /* mprintf() */

  /*
   macbuff()  --  Corresponds to macbuff() on 850.

   ESC B from tester triggers this routine which reads characters from
   the serial port into mbuffer until EOT.
   An ESC F from the tester would then cause macflush() to be called,
   which would display the contents of mbuffer in an alert window.

   The purpose of this routine is to handle multiple printf() type
   statements from the tester.
  */

  macbuff()

  {
   register char *ptr;
   char c;
   char last_c;

   if ( mbuffer == (char *) 0 ) /* allocate buffer if needed */
       {
    mbuffer = NewPtr ( 256 );
    mbptr = mbuffer;
    mbsize = 0;
       }
   put_tty ( ACK ); /* tell tester we're ready for message */
  last_c = '\000';
       /* read the message */
  while ( ( c = get_tty() ) != EOT )
      {
   if ( c == '\n' )  /* map \n or \r\n to \r */
       {
    if ( last_c == '\r' )
        {
     c = '\000';
        }
    else
        {
     c = '\r';
        }
       }
   if ( c && mbsize++ < 255 ) /* truncate on overflow */
       {
    *mbptr++ = c;
       }

   last_c = c;
     }
 *mbptr = NULL;
     /* signal tester that we got it */
 put_tty ( ACK );
}

macflush()

{
 int font;
 char flag;

 if ( mbsize > 0 )
     {
     /* save terminal window if necessary */
  save_te_windows();
     /* set the text */
```

```
ParamText ( mbuffer, "", "", "" );
   /* set up for fixed-width font */
GetFNum ( "Monaco", &font );
SetDAFont ( font );
   /* disable font scaling */
flag = FScaleDisable;
FScaleDisable = 1;
   /* Alert waits for operator response */
(void) Alert ( 262, (ProcPtr) 0 );
   /* return to system font */
SetDAFont ( systemFont );
   /* restore font scaling flag */
FScaleDisable = flag;

put_tty ( ACK ); /* tell tester we're through */

DisposPtr ( mbuffer ); /* free the buffer */
mbuffer = (char *) 0;
      }
 waiting = 0;
 if ( which_loop != WAVEDIT )
      {
  InitCursor();
      }
}

/*
 zero_bits()  --  write zeros to an entire bitmap
*/
zero_bits ( map_ptr )
BitMap *map_ptr;

{
 register short *ptr;
 register short size;


 ptr = (short *) map_ptr->baseAddr;
 size = map_ptr->rowBytes / sizeof ( short ) * map_ptr->bounds.bottom;

 while ( size-- )
      {
  *ptr++ = 0;
      }
}

/*
 fetch_text  --  Puts up a dialog box which prompts the user
 with string "prompt", and returns user's response in string
 "cptr".  Includes standard OK and Cancel buttons.
 Intended for getting file names and such.
*/

fetch_text ( prompt, cptr )
char *prompt;
char *cptr;

{
 Rect  itembox;
 Handle  itemhandle;
 Handle  namehandle;
 DialogRecord dlogrec;
 DialogPtr dlogptr;
 int  itemhit;
 char  buffer[256];

 sprintf ( buffer, "%r", &prompt );
 dlogptr =  GetNewDialog ( 261, (Ptr)&dlogrec, (WindowPtr) -1 );
```

```
if ( dlogptr == 0 )
    {
 aprintf ( "GetNewDialog() Failed.\rBummer!" );
    }
else
    {
  save_te_windows();
  GetDItem ( dlogptr, 3, &itemhit, &itemhandle, &itembox );
  SetIText ( itemhandle, buffer );
  GetDItem ( dlogptr, 4, &itemhit, &namehandle, &itembox );
  SetIText ( namehandle, cptr );
  SelIText ( dlogptr, 4, 0, 50 );
  ShowWindow ( (WindowPtr) dlogptr );

  do
      {
   ModalDialog ( (ProcPtr) 0, &itemhit );
   switch ( itemhit )
       {
    case OK:
        {
     GetIText ( namehandle, cptr );
     break;
        }
    case Cancel:
        {
     break;
        }
    case 4:
        {
     break;
        }
    default:
        {
     aprintf ( "Unexpected Item Number: %d",
        itemhit );
        }
      }
    }
  while ( itemhit > Cancel );
  CloseDialog ( dlogptr );
  fetch_window_bits();
  return ( itemhit );
    }
}

decide1 ( format )
char *format;
{
 GrafPtr saveport;
 int value;
 char buffer[256];

 GetPort( &saveport );
 save_te_windows();
 sprintf(buffer, "%r", &format);
 ParamText ( buffer, "", "", "" );
 value = Alert ( 259, (ProcPtr) 0 );
 SetPort( saveport );
 fetch_window_bits();
 return ( value );
 }

 decide2 ( format )
 char *format;
 {
     int value;
     char buffer[256];
```

```
 save_te_windows();
 sprintf(buffer, "%r", &format);
 ParamText ( buffer, "", "", "" );
 value = Alert ( 269, (ProcPtr) 0 );
 fetch_window_bits();
 return ( value );
}

/*
 maxwavelen() -- Returns the length of the longest waveform
*/
maxwavelen()

{
 register i;
 register max;

 max = 0;
 for ( i = 0; i < MAXWAVES; i++ )
     {
  if ( waves[i].len > max )
      {
   max = waves[i].len;
      }
     }
 return ( max );
}

resume()

{
 ExitToShell();
}
/* save_te_windows(): checks to see if the terminal emulator windows
 * are visible, and if so, then it saves their windows bits, so that
 * they can be restored when the terminal windows get update events */
save_te_windows()
{

 if ( EqualRgn( main_wrec.port.visRgn, main_visrgn ) )
     {
        cursor( OFF );
        save_window_bits( main_wptr );
     }
 if ( EqualRgn( user_wrec.port.visRgn, user_visrgn ) )
     save_window_bits( user_wptr );
} /* save_te_windows() */
/* save_window_bits(): saves the bitmap of the window contents,
 * so that it can be redrawn later when the window contents need updating.
 */
save_window_bits( wptr )
WindowPtr wptr;
{
 GrafPtr saveport;

#ifdef save_window_bits_debug
 errprintf("called save_window_bits()");
#endif
 GetPort( &saveport );
 if (wptr == main_wptr)
    SetPort( &main_wrec.port );
 else if (wptr == user_wptr)
   SetPort( &user_wrec.port );

 if (wptr == main_wptr)
  /* copy bits from screen to main_bitmap area */
    {
```

```
          CopyBits ( &thePort->portBits, &main_bitmap,
        &screen_rect, &main_bitmap.bounds,
      srcCopy, (RgnHandle) 0 );
        }
  else
       if (wptr == user_wptr)
   /* copy bits from screen to user_bitmap area */
         {
        CopyBits ( &thePort->portBits, &user_bitmap,
            &thePort->portRect, &user_bitmap.bounds,
          srcCopy, (RgnHandle) 0 );
           }
       else
   errprintf("save_window_bits(): don't know this window!");
  SetPort( saveport );
 } /* save_window_bits() */

 /* fetch_window_bits() : restore screen which had been saved with
  * save_te_windows() */
 fetch_window_bits()

 {
  if ( EqualRgn( main_wrec.port.visRgn, main_visrgn ) )
   /* copy bits from main_bitmap to screen area */
     {
   CopyBits ( &main_bitmap, &thePort->portBits,
      &main_bitmap.bounds, &screen_rect,
     srcCopy, (RgnHandle) 0 );
          /* cursor was turned off when the screen was copied,
           * so if cursor now on, restore it */
          if ( curse_state == ON )
                     InvertRect ( &curse_rect );
     }
  else
  if ( EqualRgn( user_wrec.port.visRgn, user_visrgn ) )

   /* copy bits from user_bitmap to screen area */
      {
   CopyBits ( &user_bitmap, &thePort->portBits,
      &user_bitmap.bounds, &thePort->portRect,
        srcCopy, (RgnHandle) 0 );
      }
 }

 /* errprintf() is the same as sprintf(), except that it first saves the
  * bitmaps of the terminal windows which are about to be blasted by the
  * alert box.
  */
 /* VARARGS1 */
 errprintf( format )
 char *format;
 {
     char buffer[256];

     save_te_windows();

     /* now put out the message */
     sprintf(buffer, "%r", &format);
     ParamText(buffer,"","","");
     (void) Alert(17, (ProcPtr) 0);
 } /* errprintf() */

/* cursor(): enable and disable the terminal emulator cursor */
cursor ( state )
int      state;  /* OFF means to turn the cursor off (invisible),
   * ON means to enable the cursor to blink */

{
        if ( state == OFF && curse_state == ON )
            {
```

```
                InvertRect ( &curse_rect );
                curse_state = OFF;
            }
        curse_enable = state;
} /* cursor() */

/* aprintf(): print a message in an alert box.  First save the terminal
 * emulator windows for later restoration.  Also check the length of
 * the message and truncate it at MAX_MESSAGE length.  (MAX_MESSAGE is
 * the number of charcters that can fit in the alert box in system font) */
/* VARARGS1 */
aprintf(format)
char *format;
{
 char buffer[256];
 /*
 int nextevent;
 EventRecord     evt;
 int remove;   should the update Event be removed from the Event
   queue? 1 if yes, 0 if no */

 if ( which_loop )
     {
  save_te_windows();
     }
 /* take out until it can be tested
 EventAvail( updateMask, &evt );
 if (evt.what == updateEvt)
     remove = 0;
 else
     remove = 1;
 */
 if ( strlen( format ) > MAX_MESSAGE )
     format[ MAX_MESSAGE ] = NULL;
 sprintf(buffer, "%r", &format);
 ParamText(buffer,"","","");
 (void) Alert(17, (ProcPtr) 0);

 /* remove until it can be tested
 fetch_window_bits();

 if (remove)
     {
  * intercept the update event so update() doesn't process it *
  nextevent = GetNextEvent ( updateMask, &evt );
     }
 */
} /* aprintf() */

/*
 SetDAFont  -- This routine is an implementation of the routine
 documented in the Inside Macintosh manual (Dialog Manager p19), but
 is only implemented in the Pacal support library, which we are not
 using.

 It should be noted that the user may also want to modify a Macintosh
 system global called FScaleDisable, which determines whether or not
 font scaling is to occur.  If this flag is set FALSE, the chosen font
 will be scaled to 12Pt, no matter what the current font size is.
 If the flag is TRUE, the font will appear in the size in which the font
 was defined.

 It appears that the Font Manager will always load the specified font
 in whatever size it can find that is closest to system font size.
 There does not appear to be any way to force any other sizes into a
 dialog/alert box.

 The system variable "FScaleDisable" is defined in ddw.h.
```

```
*/

SetDAFont ( fontnum )
int fontnum;

{
 DlgFont = (short) fontnum;
}

/*
 bytewidth  -- Return the width of the given rectangle, in bytes,
 rounded up to the nearest byte.

 Handy for setting up bitmaps.
*/

bytewidth( rctptr )
Rect *rctptr;

{
 int hdelta, hbytes;
 int slop;

 hdelta = rctptr->right - rctptr->left + 1;
 if ( ( slop = hdelta % 8 ) > 0 )
     {
  hdelta += 8 - slop;
     }
 hbytes = hdelta / 8;
 if ( hbytes % 2 )
     {
  hbytes++;
     }
 return( hbytes );
}

armblink()

{
 GrafPtr saveport;

 if ( logic_enabled )
     {
  GetPort ( &saveport );
  SetPort ( deskptr );
  TextFont ( systemFont );
  TextSize ( 12 );
  TextMode ( srcXor );
  TextFace ( shadowStyle );
  MoveTo ( 490, 14 );
  DrawChar ( 'L' );
  TextFace ( 0 );
  SetPort ( saveport );
     }
}

#ifdef optionmenu
printerr( string, error )
char    *string;
int     error;

{
 aprintf ( "Error %d\r%s", error, string );
}

#endif optionmenu
```

```
#include <mac/quickdraw.h>
#include <mac/osintf.h>
#include <mac/toolintf.h>
#include "global.h"

extern short debug;

int news;  /* total number of calls to NewPtr() */
int dispos;  /* total number of calls to DisposPtr() */
int alloc;  /* total bytes currently allocated */

Ptr
_newptr ( arg )
int arg;

{
 register Ptr ptr;
 register int size;

 if ( ( ptr = NewPtr ( arg ) ) == 0 )
     {
  aprintf ("System error!\r\rFailed to allocate %d bytes.",arg);
  ExitToShell();
     }
 if ( ( size = GetPtrSize ( ptr ) ) == 0 )
     {
  aprintf("System Warning!\r\rNew pointer has no length.");
     }
 else
     {
  news++;
  alloc += size;
  if ( debug & BUG4 )
      {
   aprintf ( "Bytes currently allocated: %d\rNewPtr() calls: %d  DisposPtr()
      calls: %d\r",

    alloc, news, dispos, news - dispos );
      }
     }

 return ( ptr );
}

_disposptr ( arg )
Ptr *arg;

{
 register size;

 if ( *arg == 0 )
     {
  aprintf("System error!\r\rAttempt to dispose of null pointer");
  ExitToShell();
     }
 if ( ( size = GetPtrSize ( *arg ) ) == 0 )
     {
 aprintf("Warning!\r\rAttempt to dispose of free block.\rarg = %08x",
         *arg );
     }
 else
     {
  DisposPtr ( *arg );
  *arg = (Ptr) 0;
  alloc -= size;
  dispos++;
     }
}
```

```
#include        <mac/quickdraw.h>
#include        <mac/osintf.h>
#include        <mac/toolintf.h>

#include "ddw.h"
#include        "terminal.h"

#define TIMEOUT 0xff

#ifdef io_out_debug
int  debug_index;
char debug_buff[BUFSIZE];
#endif

typedef unsigned char Byte;

OpParamType     config_A;
OpParamType     *status_A;
short   baud;

short   inref, outref;
short   errnum;
static short    abortflag = 0;
static char     *serial_input_buffer;

extern MenuHandle menus[];
extern short  waiting;
extern short  which_loop;

static short    baudrate[] =
        {
                0xCD7C,         /* 300 */
                0xCCBD,         /* 600 */
                0xCC5E,         /* 1200 */
                0xCC2E,         /* 2400 */
                0xCC16,         /* 4800 */
                0xCC0A,         /* 9600 */
                0xCC04          /* 19200 */
        };

#define TRUE  0xFFFF
#define NULL            '\000'

init_io()

{
        serial_input_buffer = NewPtr ( BUFSIZE );
        status_A = (OpParamType *) NewPtr ( 22 );

        inref = OpenDriver ( ".AIn" );
        outref = OpenDriver ( ".AOut" );

                        /* 9600 baud, 8 data , 2 stop , no parity */
        config_A.asncConfig = 0xCC0A;

                        /* set the serial port configuration ( csCode = 8 ) */
       if ( ( errnum = Control ( inref, 8, &config_A ) ) > 0 )
           {
                printerr ( "Control", errnum );
                abortflag++;
           }
                        /* point the driver to our own buffer */
       config_A.asyncInBuff.asncBPtr = serial_input_buffer;

                        /* set buffer size to BUFSIZE */
       config_A.asyncInBuff.asncBLen = BUFSIZE;

                        /* set the serial port buffer info ( csCode = 9 ) */
       if ( ( errnum = Control ( inref, 9, &config_A ) ) > 0 )
```

```
		{
			printerr ( "Control", errnum );
			abortflag++;
		}

#ifdef io_out_debug
 {
     int i;

     for (i = 0; i < BUFSIZE; i++)
  debug_buff[i] = 0;
     debug_index = 0;
 }
#endif
}

unsigned char
get_byte ( byte_ptr )
Byte *byte_ptr;

{
	int	count;
 int start_time;
 int now;
 int max_time;

 if ( inbufcnt() < 1 )
     {
  (void) ReadDateTime ( &start_time );
  max_time = start_time + 10;
  while ( inbufcnt() < 1 )
      {
   (void) ReadDateTime ( &now );
   if ( now >= max_time )
       {
    aprintf ( "Tester not responding..." );
    *byte_ptr = '\000';
    waiting = 0;
    if ( which_loop != WAVEDIT )
        {
     InitCursor();
        }

    return ( TIMEOUT );
       }
      }
     }

	count = 1;
	if ( ( errnum = FSRead ( inref, &count, byte_ptr ) ) > 0 )
		{
			printerr ( "FSRead", errnum );
  *byte_ptr = '\000';
			return ( -1 );
		}
	else
		{
			return ( 0 );
		}
}

char
get_tty()

{
	int	count;
	char	c;

	count = 1;
	if ( ( errnum = FSRead ( inref, &count, &c ) ) > 0 )
```

```
            {
                printerr ( "FSRead", errnum );
                return ( -1 );
            }
        else
            {
                return ( c );
            }
}

put_tty( c )
char    c;

{
        int     count;

        count = 1;
        if ( ( errnum = FSWrite ( outref, &count, &c  ) ) > 0 )
            {
                printerr ( "FSWrite", errnum );
            }

#ifdef io_out_debug
 if (debug_index < BUFSIZE)
     debug_buff[debug_index++] = c;
 else {
  int i;

  printf("The io_out debug buffer overflowed!");
  for( i = 0; i < BUFSIZE; i++)
      debug_buff[i] = 0;
  debug_index = 0;
  debug_buff[debug_index] = c;
      }
#endif
}

/* Find out how many bytes are in the inref buffer
   (inref is a global variable containing the reference number
    of a device driver).
 */
inbufcnt()

{
        if ( ( errnum = Status ( inref, 2, status_A ) ) > 0 )
            {
                printerr ( "Input Status", errnum );
                return ( -1 );
            }
        else
            {
                return ( (int) status_A->asyncNBytes );
            }
}

set_baud ( n )
int     n;

{
        if ( n > 6 )
            {
                n = 6;
            }
        config_A.asncConfig = baudrate[n];

        if ( ( errnum = Control ( inref, 8, &config_A ) ) > 0 )
            {
                printerr ( "Control", errnum );
                abortflag++;
```

```
        }
        CheckItem ( menus[BAUD_INDEX], baud + 1, FALSE );
        baud = n;
        CheckItem ( menus[BAUD_INDEX], baud + 1, TRUE );
}
/*
tty_service()

{
        buff_count = inbufcnt();
        if ( buff_count > maxbufcnt )
            {
                maxbufcnt = buff_count;
            }
        if ( ( errnum = FSRead ( inref, &buff_count, buffer ) ) > 0 )
            {
                printerr ( "FSRead", errnum );
                return ( -1 );
            }
        *( buffer + buff_count ) = NULL;
        flush_buff();
        return ( 0 );
}
*/
/* Function: putstr
 * What it does:
 * Puts a 'C' language character string out the serial port.
 * Discussion:
 *   Simply make repeated calls to put_tty() to put the characters
 * of the string out the serial port.  Delay() is called for each character
 * sent because UNIX doesn't listen fast enough.  There is probably a
 * better solution, something involving handshakes, I will look into it
 * if I have time.
 */
putstr ( cptr )
char    *cptr;

{
 int dummy;
        char    c;

        while ( c = *cptr++ )
            {
                put_tty( c );
/*
                Delay ( 6, &dummy );
*/
            }
}  /* putstr() */
#include <mac/quickdraw.h>
#include <mac/osintf.h>
#include <mac/toolintf.h>
#include <ctype.h>

#include "ddw.h"
#include "global.h"
#include "waveLA.h"

#define BS '\010'
#define vAxisOnly 2

extern LASetup  setup_values;

extern short  auto_display;
extern char  LA_enable[];
extern char  file_name[];
extern wavestruct *waves;
extern short  debug;
```

```
Rect  screenrect;
Rect  wavescreen;
Rect  namescreen;
Rect  bustitle_box;
Rect  bushex_box;
Rect  busbin_box;
short  scale[MAXSCALES] = { 2, 4, 8, 16 };
short  size[MAXSIZES] = { 4, 8, 12, 16 };
short  cur_size;
short  cur_scale;
short  ind_clock;
short  ind2_clock;

extern short *getpargs();

ResType hexa_rsrc = { 'HEXA' };

struct modalargs
    {
 short  *itemhit;
 EventRecord *event;
 DialogPtr dlog_ptr
    };

struct itemargs
    {
 short  itemno;
 WindowPtr wptr;
    };

Namestruct LAnames[16] =
    {
 0, '-----------',
 1, '-----------',
 2, '-----------',
 3, '-----------',
 4, '-----------',
 5, '-----------',
 6, '-----------',
 7, '-----------',
 8, '-----------',
 9, '-----------',
 10, '-----------',
 11, '-----------',
 12, '-----------',
 13, '-----------',
 14, '-----------',
 15, '-----------'
    };

Namestruct *tmp_names;

DialogRecord dlogrec;
DialogPtr dlogptr;
Handle  count_handle;
Handle  name_handle;

Rect  namebox;
Rect  chanrect;
Rect  editrect;

short  namewidth;
short  textheight;
short  selected_name;

Rect  te_destrect;
Rect  te_viewrect;
Rect  markrect;
Rect  bus_screen;
```

```
Rect  busrect;
Rect  textrect;
Rect  namerect;
Rect  chanrect;
Rect  viewrect, destrect;

short  name_selected = -1;
short  chan_selected = -1;
short  bus_width;
short  bus[16];
short  tmp_bus[16];

char qualstate[3][2] = { "L", "H", "-" };

WindowRecord disp_wrec;
WindowPtr disp_wptr;
WindowPtr wavewptr;

ControlHandle ok_handle;
ControlHandle can_handle;
TEHandle tehandle = (TEHandle) 0;
short  disp_done;
init_la()

{
 setup_values.exec = 1;
 setup_values.mhz2 = 1;
 setup_values.efg = 1;
 setup_values.del_off = 1;
 setup_values.q1 = 2;
 setup_values.q2 = 2;
 setup_values.q3 = 2;
 setup_values.q4 = 2;
 strcpy ( setup_values.fname, "Test" );
}


modalfilter()

{
 struct modalargs args;
 short *funretptr;
 char numstring[10];
 char c;

 funretptr = getpargs ( &args, sizeof args );

 switch ( args.event->what )
     {
  case mouseDown:
      {
   *funretptr = 0;
   break;
      }
  case keyDown:
  case autoKey:
      {
   c = args.event->message & 0xff;
   switch ( c )
       {
    case BS:
        {
     *funretptr = 0;
     break;
        }
    default:
        {
     if ( c < '0' || c > '9' )
```

```
      {
 *(args.itemhit) = DELAYCOUNT;
 *funretptr = 0xffff;
      }
else
      {
 GetIText ( count_handle,
   numstring );
 if ( strlen ( numstring ) > 4 )
        {
        *(args.itemhit) =
         DELAYCOUNT;
        *funretptr = 0xffff;
            }
        else
            {
        *funretptr = 0;
            }
          }
      break;
          }
        }
    break;
       }
   default:
       {
    *funretptr = 0;
    break;
       }
     }
}

outline ()

{
 struct itemargs args;
 Handle  itemhandle;
 Rect  itembox;
 int  itemtype;

 getpargs ( &args, sizeof args );

 GetDItem ( dlogptr, OUTLINE, &itemtype, &itemhandle, &itembox );
 PenSize ( 3, 3 );
 FrameRoundRect ( &itembox, 16, 16 );
 PenSize ( 1, 1 );
}

qualbox ()

{
 struct itemargs args;
 Handle  itemhandle;
 Rect  itembox;
 int  itemtype;

 getpargs ( &args, sizeof args );

 GetDItem ( dlogptr, QBOX, &itemtype, &itemhandle, &itembox );
 FrameRect ( &itembox );
 TextFont ( Monaco );
 TextSize ( 9 );
 MoveTo ( itembox.left + 6, itembox.top - 12 );
 DrawString ( "Channel" );
 MoveTo ( itembox.left + 6, itembox.top - 2 );
 DrawString ( "3 2 1 0" );
```

```
 TextFont ( systemFont );
 TextSize ( 0 );
}

LAsetup( values )
LASetup *values;

{
 LASetup new_values;
 Rect itembox;
 Handle item_handle;
 Handle logic_handle;
 Handle exec_handle;
 Handle mhz2_handle;
 Handle mhz4_handle;
 Handle mhz8_handle;
 Handle efg_handle;
 Handle dut_handle;
 Handle qual_handle;
 Handle delay_handle;
 Handle fname_handle;
 Handle on_handle;
 Handle off_handle;
 Handle clock_handle;
 Handle q1_handle;
 Handle q2_handle;
 Handle q3_handle;
 Handle q4_handle;
 int itemtype;
 int itemhit;
 int (*proc)();
 char numstring[10];
 char name_buffer[50];

 ParamText ( qualstate[setup_values.q1],
      qualstate[setup_values.q2],
      qualstate[setup_values.q3],
      qualstate[setup_values.q4]
           );

 dlogptr = GetNewDialog ( 256, (Ptr)&dlogrec, (WindowPtr) -1 );

 GetDItem ( dlogptr, Cancel, &itemtype, &item_handle, &itembox );
 InsetRect ( &itembox, -4, -4 );
 SetDItem ( dlogptr, OUTLINE, UserItem + ItemDisable,
    (Handle) outline, &itembox );

 GetDItem ( dlogptr, QBOX, &itemtype, &item_handle, &itembox );
 SetDItem ( dlogptr, QBOX, UserItem + ItemDisable,
    (Handle) qualbox, &itembox );
 ShowWindow ( (WindowPtr) dlogptr );

 GetDItem ( dlogptr, LOGICINPUT, &itemtype, &logic_handle, &itembox );
 GetDItem ( dlogptr, EXECENV, &itemtype, &exec_handle, &itembox );
 GetDItem ( dlogptr, MHZ2, &itemtype, &mhz2_handle, &itembox );
 GetDItem ( dlogptr, MHZ4, &itemtype, &mhz4_handle, &itembox );
 GetDItem ( dlogptr, MHZ8, &itemtype, &mhz8_handle, &itembox );
 GetDItem ( dlogptr, EFG, &itemtype, &efg_handle, &itembox );
 GetDItem ( dlogptr, DUT, &itemtype, &dut_handle, &itembox );
 GetDItem ( dlogptr, DELAY_ON, &itemtype, &on_handle, &itembox );
 GetDItem ( dlogptr, DELAY_OFF, &itemtype, &off_handle, &itembox );
 GetDItem ( dlogptr, DELAYCOUNT, &itemtype, &count_handle, &itembox );
 GetDItem ( dlogptr, FILENAME, &itemtype, &fname_handle, &itembox );
 GetDItem ( dlogptr, QUALIFIER, &itemtype, &qual_handle, &itembox );
 GetDItem ( dlogptr, DELAY, &itemtype, &delay_handle, &itembox );
 GetDItem ( dlogptr, CLOCKS, &itemtype, &clock_handle, &itembox );
 GetDItem ( dlogptr, Q1, &itemtype, &q1_handle, &itembox );
 GetDItem ( dlogptr, Q2, &itemtype, &q2_handle, &itembox );
 GetDItem ( dlogptr, Q3, &itemtype, &q3_handle, &itembox );
 GetDItem ( dlogptr, Q4, &itemtype, &q4_handle, &itembox );
```

```
new_values = *values;
NumToString ( new_values.del_count, numstring );
SetIText ( count_handle, numstring );
SelIText ( dlogptr, DELAYCOUNT, 0, 5 );
SetIText ( fname_handle, new_values.fname );
SelIText ( dlogptr, FILENAME, 0, 50 );

proc = 0;

do
    {
    SetCtlValue ( (ControlHandle) logic_handle, new_values.logic );
    SetCtlValue ( (ControlHandle) exec_handle, new_values.exec );
    SetCtlValue ( (ControlHandle) mhz2_handle, new_values.mhz2 );
    SetCtlValue ( (ControlHandle) mhz4_handle, new_values.mhz4 );
    SetCtlValue ( (ControlHandle) mhz8_handle, new_values.mhz8 );
    SetCtlValue ( (ControlHandle) efg_handle, new_values.efg );
    SetCtlValue ( (ControlHandle) dut_handle, new_values.dut );
    SetCtlValue ( (ControlHandle) on_handle, new_values.del_on );
    SetCtlValue ( (ControlHandle) off_handle, new_values.del_off );

    if ( new_values.exec )
        {
        HiliteControl ( (ControlHandle) on_handle, 0 );
        }
    else
        {
        HiliteControl ( (ControlHandle) on_handle, 255 );
        new_values.del_on = 0;
        new_values.del_off = 1;
        SetCtlValue ( (ControlHandle) on_handle,
            new_values.del_on );
        SetCtlValue ( (ControlHandle) off_handle,
            new_values.del_off );
        }

    ModalDialog ( (ProcPtr) proc, &itemhit );
    switch ( itemhit )
        {
        case OK:
            {
            GetIText ( count_handle, numstring );
            if ( !is_good_number ( numstring ) )
                {
                aprintf("Maximum delay count is 65535");

/*      aprintf does a ParamText(), so we have to restore things with our own */

                ParamText ( qualstate[new_values.q1],
                    qualstate[new_values.q2],
                    qualstate[new_values.q3],
                    qualstate[new_values.q4]
                );
                itemhit = 999;
                break;
                }
            new_values.del_count = atoi ( numstring );
            GetIText ( fname_handle, name_buffer );
            strncpy ( new_values.fname, name_buffer,
                NAMELENGTH );
            *values = new_values;
            break;
            }
        case Cancel:
            {
            break;
            }
        case LOGICINPUT:
            {
```

```
 new_values.logic = 1;
 new_values.exec = 0;
 break;
    }
case EXECENV:
    {
 new_values.exec = 1;
 new_values.logic = 0;
 break;
    }
case MHZ2:
    {
 new_values.mhz2 = 1;
 new_values.mhz4 = 0;
 new_values.mhz8 = 0;
 break;
    }
case MHZ4:
    {
 new_values.mhz2 = 0;
 new_values.mhz4 = 1;
 new_values.mhz8 = 0;
 break;
    }
case MHZ8:
    {
 new_values.mhz2 = 0;
 new_values.mhz4 = 0;
 new_values.mhz8 = 1;
 break;
    }
case EFG:
    {
 new_values.efg = 1;
 new_values.dut = 0;
 break;
    }
case DUT:
    {
 new_values.efg = 0;
 new_values.dut = 1;
 break;
    }
case DELAY_ON:
    {
 new_values.del_on = 1;
 new_values.del_off = 0;
 break;
    }
case DELAY_OFF:
    {
 new_values.del_on = 0;
 new_values.del_off = 1;
 break;
    }
case DELAYCOUNT:
    {
 proc = modalfilter;
 break;
    }
case FILENAME:
    {
 proc = 0;
 break;
    }
case Q1:
    {
 if ( new_values.q1 == 2 )
     {
  new_values.q1 = 0;
     }
```

```
else
    {
    new_values.q1++;
    }
SetIText (q1_handle, qualstate[new_values.q1]);
break;
    }
case Q2:
    {
    if ( new_values.q2 == 2 )
        {
        new_values.q2 = 0;
        }
    else
        {
        new_values.q2++;
        }
    SetIText (q2_handle, qualstate[new_values.q2]);
    break;
    }
case Q3:
    {
    if ( new_values.q3 == 2 )
        {
        new_values.q3 = 0;
        }
    else
        {
        new_values.q3++;
        }
    SetIText (q3_handle, qualstate[new_values.q3]);
    break;
    }
case Q4:
    {
    if ( new_values.q4 == 2 )
        {
        new_values.q4 = 0;
        }
    else
        {
        new_values.q4++;
        }
    SetIText (q4_handle, qualstate[new_values.q4]);
    break;
    }
default:
    {
        aprintf ( "Don't know what to do with item #%d",
        itemhit );
/*    aprintf does a ParamText(), so we have to restore things with our own */

    ParamText ( qualstate[new_values.q1],
        qualstate[new_values.q2],
        qualstate[new_values.q3],
        qualstate[new_values.q4]
        );


    break;
    }
  }
 }
 while ( itemhit > Cancel );
 CloseDialog ( dlogptr );
}

is_good_number ( string )
char *string;
```

```
{
 char *str_ptr;
 int number;
 short n;
 char c;

 str_ptr = string;
 n = strlen ( string );
 if ( n > 5 )
     {
  return ( FALSE );
     }
 while ( c = *str_ptr++ )
     {
  if ( !isdigit ( c ) )
      {
   return ( FALSE );
      }
     }
 if ( ( number = atoi ( string ) ) < 0 || number > 65535 )
     {
  return ( FALSE );
     }
 return ( TRUE );
}

LAdisplay()

{
 register  i;
 EventRecord event;
 GrafPtr saveport;    /* storage for current grafport */
 short  bus_count;

 SelectWindow ( disp_wptr );
 ShowWindow ( disp_wptr );
 DrawControls ( disp_wptr );

 GetPort ( &saveport );
 SetPort ( disp_wptr );
 tmp_names = (Namestruct *) NewPtr ( 16 * sizeof (Namestruct) );

 for ( i = 0; i < 16; i++ )
     {
  tmp_bus[i] = bus[i];
  tmp_names[i] = LAnames[i];
     }

 disp_done = 0;
 bus_count = bus_width;

 while ( !disp_done )
     {
  SystemTask();
  if ( GetNextEvent( everyEvent, &event ) )
     {
  switch ( event.what )
      {
   case mouseDown:
       {
    disp_mouse ( &event );
    break;
       }
   case keyDown:
   case autoKey:
       {
     if ( (event.modifiers & BUGMASK)
         == WIZARD )
          {
```

```
      wiz_service ( event.message
        & 0xff );
         }
     else
        {
      name_key ( event.message
       & 0xff );
        }
     break;
       }
    case updateEvt:
       {
     if ( (WindowPtr) event.message
       == disp_wptr )
        {
      BeginUpdate ( disp_wptr );
      disp_draw();
      EndUpdate ( disp_wptr );
        }
     break;
       }
    default:
       {
     break;
       }
      }
     }
  if ( name_selected > -1 )
     {
   TEIdle ( tehandle );
     }
    }

 chan_selected = -1;
 name_selected = -1;

 SetPort ( saveport );

 if ( ( bus_count && !bus_width ) || ( !bus_count && bus_width ) )
    {
  return ( 1 );
    }
    else
       {
     return ( 0 );
       }
   }

   disp_mouse ( event_ptr )
   EventRecord *event_ptr;

   {
    Point  mouseloc;
    ControlHandle whichcontrol;
    WindowPtr window;
    int  controlpart;
    int  code;

    code = FindWindow ( &event_ptr->where, &window );

    if ( window != disp_wptr )
       {
     SysBeep ( 1 );
     return;
       }
    mouseloc = event_ptr->where;
    GlobalToLocal ( &mouseloc );

    if ( name_selected > -1 && !PtInRect ( &mouseloc, &textrect ) )
       {
```

```
copytext ( tmp_names[name_selected].text, tehandle,
      NAMELENGTH );
TEDeactivate ( tehandle );
TEDispose ( tehandle );
tehandle = (TEHandle) 0;
name_selected = -1;
   }
switch ( code )
   {
   case inMenuBar:
      {
      SysBeep ( 1 );
      break;
      }
   case inSysWindow:
      {
      SystemClick ( event_ptr, disp_wptr );
      break;
      }
   case inContent:
      {
      controlpart = FindControl ( &mouseloc,
         disp_wptr, &whichcontrol );
      if ( controlpart )
         {
         disp_control ( whichcontrol,
            controlpart, &mouseloc );
         }
      else
         {
         disp_task ( &mouseloc );
         }
      break;
      }
   default:
      {
      break;
      }
   }
}

disp_control ( cntl_handle, cntl_part, mptr )
ControlHandle cntl_handle;
int  cntl_part;
Point  *mptr;

{
 register i;

 if ( TrackControl ( cntl_handle, mptr, (ProcPtr) 0 )  == cntl_part )
    {
   switch ( GetCRefCon ( cntl_handle ) )
      {
      case OK:
         {
         for ( i = 0; i < 16; i++ )
            {
            bus[i] = tmp_bus[i];
            LAnames[i] = tmp_names[i];
            }
         DisposPtr ( tmp_names );
         tmp_names = (Namestruct *) 0;
         HideWindow ( disp_wptr );
         disp_done++;
         break;
         }
      case Cancel:
         {
         DisposPtr ( tmp_names );
```

```
    tmp_names = (Namestruct *) 0;
    HideWindow ( disp_wptr );
    disp_done++;
    break;
        }
   default:
        {
        }

      }
     }
}

disp_draw()
{
 register i;
 Namestruct *names;
 GrafPtr saveport;     /* storage for current grafport */
 Rect numrect;
 Rect textbox;
 Rect box;
 Rect underbox;
 char numstring[10];

 GetPort ( &saveport );
 SetPort ( disp_wptr );

 names = tmp_names ? tmp_names : LAnames;

 numrect = chanrect;
 numrect.bottom = numrect.top + textheight;

 textbox = textrect;
 textbox.bottom = textbox.top + textheight;

 TextFont ( systemFont );
 TextSize ( 0 );
 TextFace ( 0 );

 DrawControls ( disp_wptr );

 for ( i = 0; i < 16; i++ )
     {
  NumToString ( names[i].channel, numstring );
  TextBox ( numstring, strlen ( numstring ),
      &numrect, teJustRight );
  TextBox ( names[i].text, strlen ( names[i].text ),
      &textbox, teJustLeft );
  OffsetRect ( &numrect, 0, textheight );
  OffsetRect ( &textbox, 0, textheight );
     }

 MoveTo ( busrect.left + ( busrect.right - busrect.left ) / 2 - 8,
       busrect.top - 5 );
 DrawString ( "Bus" );

 box = busrect;
 box.right = busrect.left + 18;
 underbox = box;
 OffsetRect ( &underbox, 0, textheight + 5 );

 PenMode ( patOr );
 for ( i = 0; i < 16; i++ )
     {
  if ( bus[15 - i] > -1 )
      {
   TextFont ( Monaco );
   TextSize ( 9 );
   TextFace ( boldStyle );
   textbox = box;
```

```
    InsetRect ( &textbox, 1, 3 );
    NumToString ( bus[15 - i], numstring );
    TextBox ( numstring,
     strlen ( numstring ), &textbox, teJustCenter );
       }

   TextFont ( Monaco );
   TextSize ( 9 );
   TextFace ( 0 );
   NumToString ( 15 - i, numstring );
   TextBox ( numstring,
    strlen ( numstring ), &underbox, teJustCenter );

   FrameRect ( &box );
   OffsetRect ( &box, 17, 0 );
   OffsetRect ( &underbox, 17, 0 );
      }

 TextFace ( 0 );
 SetPort ( saveport );
}

disp_task ( mptr )
Point *mptr;

{
 if ( chan_selected > -1 )
     {
  InvertRect ( &markrect );
     }

 if ( PtInRect ( mptr, &busrect ) )
     {
  sel_bus ( mptr );
     }
 else
     {
  chan_selected = -1;

  if ( PtInRect ( mptr, &chanrect ) )
      {
   sel_channel ( mptr );
      }
  else if ( PtInRect ( mptr, &textrect ) )
      {
   edit_name ( mptr );
      }
     }
}

sel_channel ( mptr )
Point *mptr;

{
 register i, j;
 Namestruct tmpname;
 Rect arrow_rect;
 Point mouseloc;
 Handle arrow_handle;
 BitMap arrow;
 short arrow_slot;
 short arrow_on;
 short new_slot;

 markrect = chanrect;
 markrect.bottom = chanrect.top + textheight;

 for ( i = 0; i < 16; i++ )
     {
```

```
if ( PtInRect ( mptr, &markrect ) )
    {
    break;
    }
OffsetRect ( &markrect, 0, textheight );
  }
chan_selected = i;
InvertRect ( &markrect );

arrow_handle = GetResource ( hexa_rsrc.s, 256 );
SetRect ( &arrow.bounds, 0, 0, 7, 9 );
arrow.rowBytes = 2;
arrow.baseAddr = NewPtr ( SizeResource ( arrow_handle ) );
bytecopy ( arrow.baseAddr, *arrow_handle,
   SizeResource ( arrow_handle ) );
ReleaseResource ( arrow_handle );

arrow_slot = -1;
arrow_on = 0;
arrow_slot = ( mptr->v - chanrect.top) / textheight;
i = arrow_slot;

while ( StillDown() )
    {
    GetMouse ( &mouseloc );
    if ( mouseloc.v < chanrect.top )
        {
        mouseloc.v = chanrect.top;
        }
    else
        {
        if ( mouseloc.v > chanrect.bottom )
            {
            mouseloc.v = chanrect.bottom;
            }
        }
    new_slot = (mouseloc.v - chanrect.top) / textheight;
    if ( new_slot != arrow_slot )
        {
        if ( arrow_on )
            {
            CopyBits ( &arrow, &thePort->portBits,
                &arrow.bounds, &arrow_rect,
                srcXor, (RgnHandle) 0 );
            }
        else
            {
            HideCursor();
            arrow_on = 1;
            }
        arrow_rect = arrow.bounds;
        OffsetRect ( &arrow_rect, chanrect.left - 5,
            ( new_slot * textheight ) );
        CopyBits ( &arrow, &thePort->portBits,
            &arrow.bounds, &arrow_rect,
            srcXor, (RgnHandle) 0 );
        j = new_slot;

        arrow_slot = new_slot;
        }
    }

/*
 MoveTo ( 300, 120 );
 TextMode ( srcCopy );
 NumToString ( i, numstring );
 DrawString ( numstring );
 DrawString ( ", " );
 NumToString ( j, numstring );
 DrawString ( numstring );
*/
```

```
  if ( arrow_on )
      {
   CopyBits ( &arrow, &thePort->portBits,
        &arrow.bounds, &arrow_rect,
        srcXor, (RgnHandle) 0 );
   ShowCursor();
   InvertRect ( &markrect );
   chan_selected = -1;

   tmpname =  tmp_names[i];
   if ( i >= j )
       {
    while ( i != j )
        {
     tmp_names[i] = tmp_names[i-1];
     i--;
        }
       }
   else
       {
    j--;
    while ( i != j )
        {
     tmp_names[i] = tmp_names[i+1];
     i++;
        }
       }
   tmp_names[j] = tmpname;
   InvalRect ( &chanrect );
   InvalRect ( &textrect );
      }
}

edit_name ( mptr )
Point *mptr;

{
 register i;

 TextFont ( systemFont );
 TextSize ( 0 );
 TextFace ( 0 );

 markrect = textrect;
 markrect.bottom = textrect.top + textheight;

 for ( i = 0; i < 16; i++ )
     {
  if ( PtInRect ( mptr, &markrect ) )
      {
   break;
      }
  OffsetRect ( &markrect, 0, textheight );
     }
 if ( i != name_selected )
     {
  if ( tehandle )
      {
   if ( name_selected > -1 )
       {
    copytext ( tmp_names[name_selected].text,
       tehandle, NAMELENGTH );
       }
   TEDeactivate ( tehandle );
   TEDispose ( tehandle );
   tehandle = (TEHandle) 0;
      }
  name_selected = i;
  te_destrect = markrect;
  te_viewrect = markrect;
```

```
  tehandle = TENew ( &te_destrect, &te_viewrect );
  TESetText ( tmp_names[i].text, NAMELENGTH, tehandle );
  TEActivate ( tehandle );
      }
 TEClick ( mptr, 0, tehandle );
 TEUpdate ( &markrect, tehandle );
}

name_key ( c )
char c;

{
 if ( name_selected > -1 )
     {
  TEKey ( c, tehandle );
     }
}

sel_bus ( mptr )
Point *mptr;

{
 register i, j;
 Rect box;
 char numstring[10];

 box = busrect;
 box.right = busrect.left + 18;

   /* set "i" to indicate which box the mouse is in */
 for ( i = 15; i >= 0; i-- )
     {
  if ( PtInRect ( mptr, &box ) )
      {
   break;
      }
  OffsetRect ( &box, 17, 0 );
     }
 InsetRect ( &box, 1, 3 );

/* make sure that the selected channel does not appear twice on the bus */

 if ( chan_selected > -1 )
     {
  for ( j = 0; j < 16; j++ )
      {
   if ( tmp_bus[j] == tmp_names[chan_selected].channel )
       {
    SysBeep ( 1 );
    chan_selected = -1;
    break;
       }
      }

  TextFont ( Monaco );
  TextSize ( 9 );
  TextFace ( boldStyle );

   /* if we're not in a valid box, deselect the channel */

  if ( i > bus_width && chan_selected > -1 )
      {
   InvertRect ( &markrect );
      }
  else
      {
   if ( chan_selected > -1 && i <= bus_width )
       {
    if ( tmp_bus[i] == -1 )
```

```
        {
     bus_width++;
        }
    tmp_bus[i] = tmp_names[chan_selected].channel;
    NumToString ( tmp_bus[i], numstring );
    ClipRect ( &box );
    TextBox ( numstring, strlen ( numstring ),
       &box, teJustCenter );
    ClipRect ( &thePort->portRect );
    chan_selected = -1;
       }
      }
     }
 else
     {
  if ( i == bus_width - 1 )
      {
   EraseRect ( &box );
   tmp_bus[i] = -1;
   bus_width--;
      }
     }

 TextFace ( 0 );

 TextFont ( systemFont );
 TextMode ( srcCopy );

 if ( debug & BUG8 )
     {
  MoveTo ( busrect.left + 50, busrect.bottom + 60 );
  NumToString ( bus_width, numstring );
  DrawString ( numstring );
     }
}

bus_update()

{
 register i;
 register unsigned mask;
 register short busnum;

 GrafPtr saveport;     /* storage for current grafport */
 char hexnum[10];
 char binnum[40];

 if ( bus_width == 0 )
     {
  return;
     }

 GetPort ( &saveport );
 SetPort ( wavewptr );

 TextFont ( systemFont );
 TextSize ( 12 );
 TextFace ( 0 );
 TextMode ( srcOr );

 mask = 1;
 busnum = 0;
 binnum[bus_width] = '\000';

 for ( i = 0; i < bus_width; i++ )
     {
  if ( State ( bus[i], ind_clock ) == HIGH )
      {
   binnum[bus_width-i-1] = '1';
```

```
    busnum |= mask;
        }
    else
        {
    binnum[bus_width-i-1] = '0';
        }
    mask <<= 1;
      }
  sputnhex ( hexnum, busnum, (bus_width + 3) / 4 );
  TextBox ( hexnum, strlen ( hexnum ), &bushex_box, teJustCenter );
  TextBox ( binnum, strlen ( binnum ), &busbin_box, teJustCenter );

  SetPort ( saveport );
}

draw_bus()

{
 GrafPtr saveport;      /* storage for current grafport */
 short bwidth;
 short left_side;
 short title_width;
 short hex_width;
 short bin_width;
 short all_width;
 short window_width;

 if ( bus_width == 0 )
     {
  return;
     }

 GetPort ( &saveport );
 SetPort ( wavewptr );

 title_width = ( strlen ( "Bus" ) + 2 ) * 8;
 hex_width = ( ( bus_width + 4 ) / 4 + 2 ) * 8;
 bin_width = ( bus_width + 1 ) * 8;
 all_width = title_width + hex_width + bin_width;
 window_width = thePort->portRect.right - thePort->portRect.left;

 left_side = screenrect.left + ( window_width - all_width ) / 2;
 SetRect ( &bustitle_box,
   left_side,
    thePort->portRect.bottom - 50,
     left_side + title_width,
      thePort->portRect.bottom - 30);
 bushex_box = bustitle_box;
 bushex_box.left = bustitle_box.right - 1;
 bushex_box.right = bushex_box.left + hex_width;

 busbin_box = bushex_box;
 busbin_box.left = bushex_box.right - 1;
 busbin_box.right = busbin_box.left + bin_width;

 PenMode ( patOr );
 FrameRect ( &bustitle_box );
 FrameRect ( &bushex_box );
 FrameRect ( &busbin_box );
 InsetRect ( &bustitle_box, 1, 1 );
 InsetRect ( &bushex_box, 1, 2 );
 InsetRect ( &busbin_box, 1, 2 );

 TextFont ( systemFont );
 TextSize ( 12 );
 TextFace ( 0 );
 TextMode ( srcOr );
 TextBox ( "Bus", strlen ( "Bus" ), &bustitle_box, teJustCenter );
 InvertRect ( &bustitle_box );
```

```
 SetPort ( saveport );
}

copytext ( destptr, tehdl, maxn )
register char *destptr;
TEHandle tehdl;
int maxn;

{
 register n;
 register char *srcptr;

 n = (*tehdl)->TElength > maxn ? maxn : (*tehdl)->TElength;
 srcptr = *((*tehdl)->hText);
 while ( n-- )
     {
  *destptr++ = *srcptr++;
     }
 *destptr = '\0';
}

start_la()

{
 int value;
 char buffer[50];
 char numstring[20];
 char *cptr;
 cptr = buffer;
 *cptr++ = ' ';
 if ( setup_values.mhz2 )    /* clock */
     {
  *cptr++ = '2';
     }
 else if ( setup_values.mhz4 )
     {
  *cptr++ = '4';
     }
 else if ( setup_values.mhz8 )
     {
  *cptr++ = '8';
     }
 else
     {
  *cptr++ = '0';
     }
       /* trigger */
 *cptr++ = ' ';
 *cptr++ = setup_values.logic ? '1' : '0';
       /* trigger qualifier */
 *cptr++ = ' ';
 value = 0;
 value |= setup_values.q1 == 2 ? 0x00 : 0x01;
 value |= setup_values.q2 == 2 ? 0x00 : 0x02;
 value |= setup_values.q3 == 2 ? 0x00 : 0x04;
 value |= setup_values.q4 == 2 ? 0x00 : 0x08;
 sputnhex ( cptr++, (unsigned int) value, 1 );
       /* trigger level */
 *cptr++ = ' ';
 value = 0;
 value |= setup_values.q1 == 2 ? 0x00 : !setup_values.q1;
 value |= setup_values.q2 == 2 ? 0x00 : !setup_values.q2 << 1;
 value |= setup_values.q3 == 2 ? 0x00 : !setup_values.q3 << 2;
 value |= setup_values.q4 == 2 ? 0x00 : !setup_values.q4 << 3;
 sputnhex ( cptr++, (unsigned int) value, 1 );
       /* delay */
 *cptr++ = ' ';
 *cptr++ = setup_values.del_on ? '1' : '0';
       /* delay count */
```

```
  *cptr++ = ' ';
  sputnhex ( cptr, (unsigned int) setup_values.del_count, 4 );
  cptr += strlen ( cptr );
        /* capture */
  *cptr++ = ' ';
  *cptr++ = setup_values.dut ? '1': '0';
        /* auto display */
  *cptr++ = ' ';
  *cptr++ = auto_display ? '1' : '0';
        /* file name */
  *cptr++ = ' ';
  strcpy ( cptr, setup_values.fname );
  cptr += strlen ( setup_values.fname );
        /* new */
  *cptr++ = ' ';
  *cptr++ = '1';
  *cptr = '\000';

  putstr ( LA_enable );
  putstr ( buffer );
 }
```

---

```
#include <mac/quickdraw.h>
#include <mac/osintf.h>
#include <mac/toolintf.h>
#include <ctype.h>

#include "global.h"
#include "ddw.h"

#define MAXPROTO  500
#define EXPANDSIZE 512
#define EOL  '\012'
#define TAB  '\011'
#define TABSTOP  12

extern wavestruct *waves; /* array of waveform structures */
extern short wavechange;
extern short maxwaves;
extern short debug;
extern char * strcpy();

extern Handle proto_handle;
extern short proto_length;
extern char proto_name[11];
int offset;
int heap_used;
short proto_type;
short maxdatawords;
short word_width;

char state_sym[4] = { 'L', 'H', 'Z', '?' };
char *buffer;

wave_to_proto()

{
 if ( proto_type == CONTROL )
     {
  bugout ( BUG7, "control_proto()..." );
  return ( control_proto() );
     }
 else if ( proto_type == DATA )
     {
  bugout ( BUG7, "data_proto()..." );
  return ( data_proto() );
     }
}
```

```
control_proto()

{
 Rect cliprect;
 short i, j;
 short line;
 short namelen;
 char protolength[10];
 char *bptr;
 char *ptr;

 if ( strlen ( proto_name ) == 0 )
      {
  if ( name_and_length() != OK )
       {
   return ( 1 );
       }
      }

 buffer = NewPtr ( MAXPROTO );
 bptr = buffer;

/* proto_length = maxwavelen();  */

 for ( i = 0; i < maxwaves; i++ )
      {
  if ( waves[i].len > 0 )
       {
   if ( proto_length % waves[i].len != 0 )
        {
    errprintf (
"%s waveform (length %d) does not divide evenly into protocol (length %d)",
    waves[i].name, waves[i].len, proto_length );
    DisposPtr ( buffer );
    return ( -1 );
        }
       }
      }

 attention ( "Converting Data..." );

 strcpy ( buffer, "CONTROL PROTOCOL " );
 strcat ( buffer, proto_name );
 strcat ( buffer, " (" );
 NumToString ( proto_length, protolength );
 strcat ( buffer, protolength );
 strcat ( buffer, ");\n" );

 heap_used = 0;
 offset = 0;
 line = 20;
 for ( i = 0; i < maxwaves; i++ )
      {
  if ( waves[i].len > 0 )
       {
   strcat ( bptr, waves[i].name );
   namelen = strlen ( waves[i].name );
   strcat ( bptr, "," );
   strncat ( bptr, "                    ",
    TABSTOP - strlen ( waves[i].name ) - 1 );
   w_to_p ( i, &bptr[strlen(bptr)] );
   ramtext ( bptr );
   bptr = buffer;
   *bptr = NULL;
       }
      }
 ramtext ( "DONE;\n" );
 wavechange = 0;

 at_ease();  /* erase "Converting Data..." message   */
 return ( 0 );
}
```

```
send_proto ()

{
/* send the entire protocol to the tester ( offset happens to be the size ) */

 bugout ( BUG7, "Sending protocol \"%s\"\roffset = %d",
        proto_name, offset );
 HLock ( proto_handle );
 send_file ( proto_name, *proto_handle, offset );
 HUnLock ( proto_handle );

 if ( proto_handle )
     {
  DisposHandle ( proto_handle );
  proto_handle = (Handle) 0;
     }
 DisposPtr ( buffer );
}

w_to_p ( wave, cptr )
int wave;
register char *cptr;

{
 short clock;
 short statecount;
 short state, laststate;
 short line = 0;
 char *cp;
 char *line_ptr;

 laststate = State ( wave, 0 );
 statecount = 1;
 clock = 1;
 *cptr = '\000';
 cp = cptr;
 line_ptr = cptr;
 while ( clock <= waves[wave].len )
     {
  if ( clock == waves[wave].len ||
   ( state = State ( wave, clock ) ) != laststate )
      {
   if ( statecount > 1 ) /* if 1 count, leave off */
       {
    NumToString ( statecount, cp );
    cp += strlen ( cp );
       }
   *cp++ = state_sym[laststate];
 laststate = state;
 statecount = 0;
 if ( clock < waves[wave].len )
     {
  *cp++ = ',';
  *cp = NULL;
  if ( strlen ( line_ptr ) + TABSTOP > 40 )
      {
   next_comment ( line_ptr,
     wave, &line, &cp );
   strcpy ( cp, "\n                    " );
   cp += TABSTOP;
   *cp = NULL;
   if ( cp - buffer > 400 )
       {
    ramtext ( buffer );
    cp = buffer;
    *cp = NULL;
       }
   line_ptr = cp;
      }
     }
```

```
    else
        {
     *cp++ = ';';
     *cp = NULL;
        }
       }
   statecount++;
   clock++;
      }

  if ( line < waves[wave].comcount )
      {
   while ( next_comment ( line_ptr, wave, &line, &cp ) )
       {
    *cp++ = EOL;
    *cp = NULL;
       }
      }
  else
      {
   *cp++ = EOL;
   *cp = NULL;
      }
}

next_comment ( line_ptr, wave, lptr, cptr )
char *line_ptr;
int wave;
short *lptr;
char **cptr;

{
 char register *sptr;
 register  pad;
 short comlen;

 *(*cptr) = '\000';
 if ( *lptr < waves[wave].comcount )
      {
   bugout ( BUG6, "Copying waves[%d].comlist[%d] to buffer",
         wave, *lptr );
   bugout ( BUG6, "Comment:\r\"%s\"",
      waves[wave].comlist[*lptr] );
   comlen = strlen ( waves[wave].comlist[*lptr] );
   bugout ( BUG6, "strlen(line_ptr) %d TABSTOP %d  comlen %d",
     strlen ( line_ptr ), TABSTOP, comlen );
   if ( comlen < 35 )
       {
    pad = 45 - strlen ( line_ptr ) - TABSTOP;
       }
   else
       {
    *(*cptr)++ = '\n';
    pad = 0;
       }
   bugout ( BUG6, "Padding in %d spaces", pad );
   while ( pad-- )
       {
    *(*cptr)++ = ' ';
       }
   *(*cptr)++ = '\'';
   sptr = waves[wave].comlist[*lptr];
   while ( *(*cptr)++ = *sptr++ )
       {
       }
   *lptr += 1;
   *(*cptr)--;
/*  *(*cptr-1) = '\n'; */
/*  *(*cptr) = '\000'; */
   return ( 1 );
      }
```

```
else
    {
/*
  if ( waves[wave].comcount == 0 )
      {
   *(*cptr)++ = '\n';
   *(*cptr) = '\000';
      }
*/
  return ( 0 );
    }
}

#ifdef MAYBE
out_state_text ( state, count )
int state;
int count;

{
/*
 Point now_loc;
 short tabstop;
 char numstring[10];

 tabstop = 10 + StringWidth ( "Longest Name" );
 GetPen ( &now_loc );
 DrawString ( ", " );
 if ( now_loc.h < tabstop  )
     {
  MoveTo ( tabstop, now_loc.v );
     }
*/
 NumToString ( count, cptr );
/*
 DrawString ( numstring );
 DrawChar ( state_sym[state] );
*/
 cptr += strlen ( cptr );
 *cptr++ = state_sym[state];
 *cptr = NULL;
}
#endif

proto_to_wave()

{
}


/*
 ramtext  -- Copies string indicated by argument into cumulative
      ram buffer, allocating more memory as required.
*/

ramtext ( sptr )
register char *sptr;

{
 register char *dptr;
 int  size;
 short  linelen;

 linelen = 0;
 size = strlen ( sptr );

 bugout ( BUG6,"buffer size %d\rheap_used  %d\roffset %d",
      size, heap_used, offset );
 if ( size > heap_used - offset )
     {
  more_heap ( EXPANDSIZE );
     }
```

```
dptr = *proto_handle + offset;
while ( *dptr++ = *sptr++ )
     {
     }
offset = dptr - *proto_handle - 1;
}

more_heap ( n )
int n;

{
 int error;

 if ( heap_used == 0 )
     {
  if ( !( proto_handle = NewHandle ( n ) )  )
      {
   errprintf ( "Failed to allocate more heap space." );
   ExitToShell();
      }
  heap_used = n;
     }
 else
     {
  heap_used += n;
  SetHandleSize ( proto_handle, heap_used );

  if ( error = MemError() )
      {
   errprintf ( "SetHandleSize() error: %d", error );
      }
     }
}

data_proto()

{
 register buflen = 0;
 register char *bptr;
 short i;
 short j;
 short tristate = 0;
 short line_len;
 short hex_len;
 short hex2;
 char *ptr;
 char hexstring[10];

 buffer = NewPtr ( MAXPROTO );
 bptr = buffer;

 if ( strlen ( proto_name ) == 0 )
     {
  if ( name_and_length() != OK )
      {
   return ( 1 );
      }
  proto_length = maxwavelen();
     }

 maxdatawords = maxwavelen();
 for ( i = 0; i < maxwaves; i++ )
     {
  for ( j = 0; j < waves[i].len; j++ )
      {
   if ( State ( i, j ) == TRISTATE )
       {
    tristate = 1;
    break;
       }
```

```
        }
      }

   strcpy ( buffer, "DATA PROTOCOL " );
   strcat ( buffer, proto_name );
   strcat ( buffer, " HEX;\n" );

   hex_len = ( word_width + 3 ) / 4;
   hex2 = hex_len > 4 ? hex_len - 4 : 0;
   heap_used = 0;
   offset = 0;
   strcat ( bptr, "DEPOSIT    " );
   line_len = 10;
   for ( i = 0; i < maxdatawords; i++ )
      {
    sputnhex ( hexstring, data_to_int ( i, HIGH ), hex_len );
    line_len += strlen ( hexstring );
    if ( hex_len > 4 )
       {
     line_len++;
       }
    if ( line_len > 40 )
       {
     buflen += line_len;
     strcat ( bptr, "\n            " );
     line_len = 11;
     if ( buflen > 400 )
        {
      ramtext ( bptr );
      bptr = buffer;
      buflen = 0;
      *bptr = NULL;
        }
       }
    else
       {
     strcat ( bptr, " " );
     line_len++;
       }
    if ( isalpha ( hexstring[0] ) )
       {
     strcat ( bptr, "0" );
       }
    if ( hex_len > 4 )
       {
     strncat ( bptr, hexstring, hex2 );
     strcat ( bptr, "." );
     if ( isalpha ( hexstring[hex2] ) )
        {
      strcat ( bptr, "0" );
        }
     strcat ( bptr, &hexstring[hex2] );
       }
    else
       {
     strcat ( bptr, hexstring );
       }
      }
   strcat ( bptr, ";\n" );
   ramtext ( bptr );
   bptr = buffer;
   *bptr = NULL;

   if ( tristate )
      {
    buflen = 0;
    strcat ( bptr, "TRISTATE  " );
    line_len = 10;
    for ( i = 0; i < maxdatawords; i++ )
       {
```

```
 sputnhex ( hexstring,
   data_to_int ( i, TRISTATE ), hex_len );
 line_len += strlen ( hexstring );
 if ( hex_len > 4 )
     {
  line_len++;
     }
 if ( line_len > 40 )
     {
  buflen += line_len;
  strcat ( bptr, "\n            " );
  line_len = 11;
  if ( buflen > 400 )
      {
   ramtext ( bptr );
   bptr = buffer;
   *bptr = NULL;
      }
     }
 else
     {
  strcat ( bptr, " " );
  line_len++;
     }
 if ( isalpha ( hexstring[0] ) )
     {
  strcat ( bptr, "0" );
     }
 if ( hex_len > 4 )
     {
  strncat ( bptr, hexstring, hex2 );
  strcat ( bptr, "." );
   if ( isalpha ( hexstring[hex2] ) )
       {
    strcat ( bptr, "0" );
       }
   strcat ( bptr, &hexstring[hex2] );
      }
  else
      {
   strcat ( bptr, hexstring );
      }
     }

 strcat ( bptr, ";\n" );
 ramtext ( bptr );
 bptr = buffer;
 *bptr = NULL;
    }

ramtext ( "DONE;\n" );
return ( 0 );
}

data_to_int ( dataword, hi_type )
short dataword;
short hi_type;

{
register unsigned  int word;
int  i;
char  bugtext[10];

word = 0;
for ( i = word_width - 1; i >= 0; i-- )
     {
  word <<= 1;
  if ( State ( i, dataword ) == hi_type )
      {
```

```
    word++;
       }
     }
  return ( word );
 }

shownum ( strptr, num )
char *strptr;
int num;

{
 char string[50];

 TextMode ( srcCopy );
 DrawString ( strptr );
 NumToString ( num, string );
 DrawString ( string );
}
#include <mac/quickdraw.h>
#include <mac/osintf.h>
#include <mac/toolintf.h>

#include "global.h"
#include "ddw.h"
#include "waveLA.h"

  /* when sending a file, large blocks overrun the tester */
#undef BLK_SIZE
#define BLK_SIZE 100

#define WAVEREC  1
#define COMMENTREC 2
#define NAMEREC  3

#define NAMESIZE 20
#define STATEMASK 0xf000

#define LOADSEQ  "x"
#define CREATEPROTO "x"
#define LOADPROTO "x"
#define INSERTPROTO "x"
#define REPLACEPROTO "x"

#define TIMEOUT 0xff

OpParamType     config_A;
OpParamType     *status_A;

#ifdef STAND_ALONE
extern WindowPtr main_wptr;
#endif STAND_ALONE

extern int (*New_waves)();
extern WindowPtr wavewptr;
extern Rect  screenrect;
extern short  logic_enabled;
extern wavestruct  *waves;  /* array of waveform structures */
extern Namestruct LAnames[];
extern cursestruct  cursors[]; /* array of cursors */

extern short  getshort();
extern short  chksum();
extern Rect  armrect;
extern GrafPtr  deskptr;

ControlHandle w_hscroll;
ControlHandle w_vscroll;

short  recnum;
short  rectype;
```

```
short  recid;
short  reclen;
Byte  *recname;
short  length;
short  node;
short  efgl;
short  nextwave;
short  expand;
short  firstclock;
short  lastclock;
short  visclocks;
short  firstwave;
short  lastwave;
short  viswaves;
short  greatest;  /* latest value of maxwavelen() */

short   nextin, nextout;
short abortflag;
short   errnum;

extern short in_count;
extern short which_loop;
extern short debug;
extern short auto_display;
extern short maxwaves;

extern short block_count;
extern short proto_type;
extern short proto_length;
extern short proto_name[];
extern char    *serial_input_buffer;
extern short waiting;
extern short new_file;

extern Byte get_byte();

Block header;
Block block;

char file_name[50];
Byte *file_ptr = 0;
int file_size = BLK_SIZE;
int file_blocks;

char *nodenames = "EFGL";
Byte *inptr;
Byte *outptr;

int buff_count;
int error;
int wait_time;
short append_offset;
short load_type;
short escaping;
short edit_length;
short just_back;
int (*save_new_waves)();
wavestruct undo_wave; /* "undo" storage area */
wavestruct clipboard; /* "clipboard" storage for waveform data */
load_file()
{
 if ( fetch_text ( "File Name:", file_name ) != OK )
      {
  return;
      }

 if ( save_new_waves != New_waves )
      {
```

```
ıbbiNeo_wavesNew_waves\" has been trashed!\rTrying to repair it...\rsave_new_waves:
  New_waves = save_new_waves;
      }

 if ( New_waves ( LOADFILE ) == OK )
      {
  putstr ( LOADSEQ );
  putstr ( file_name );
  put_tty ( '\n' );
      }
}

load_protocol ()

{
 if ( save_new_waves != New_waves )
      {
ıbbiNeo_wavesNew_waves\" has been trashed!\rTrying to repair it...\rsave_new_waves:
      }
  New_waves = save_new_waves;

 if ( New_waves ( LOAD ) == OK )
      {
  putstr ( LOADPROTO );
  load_type = PROTOCOL;
  SetCursor ( &cursors[WAIT].c_cursor );
  (void) ReadDateTime ( &wait_time );
  waiting = 1;
      }
}

read_file()

{
 GrafPtr saveport;
 Byte c;
 short i;
 short scroll_limit;

 if ( !(debug & BUG8) )
      {
  attention ( "Receiving new data..." );
      }

 error = 0;
 recnum = 0;
 nextwave = append_offset;
 maxwaves = nextwave;
 block_count = 1;
 file_size = BLK_SIZE;

 put_tty ( ACK );  /* assure them of our presence */

      /* wait for RDY */
 do
      {
  if ( get_byte ( &c ) == TIMEOUT || c == EOT || c == CAN )
       {
 if ( !(debug & BUG8) )
      {
  at_ease();
      }
   return ( -1 );
       }
      }
 while ( c != RDY );
      /* read header block */
 header.bldata = (unsigned char *) NewPtr ( BLK_SIZE );
 if ( read_next_block ( &header ) != 0 )
      {
```

```
  if ( !(debug & BUG8) )
      {
   at_ease();
      }
  DisposPtr ( header.bldata );
  return ( -1 );
     }
 parse_header ( &header );
 DisposPtr ( header.bldata );

 if ( file_size == 0 )
     {
  put_tty ( CAN );
  errprintf (
    "File \"%s\" has zero length.\r\rTransmission cancelled.",
        file_name );
 if ( !(debug & BUG8) )
     {
  at_ease();
     }
  return ( -1 );
     }

 print_file();
 if ( file_ptr )
     {
  DisposPtr ( file_ptr );
     }
 file_ptr = (Byte *) NewPtr ( file_size * sizeof ( Byte )
       + sizeof ( short ) );
 if ( !file_ptr )
    {
 errprintf ( "Failed to allocate %d bytes for file data",
    file_size * sizeof ( Byte ) );
 if ( !(debug & BUG8) )
     {
  at_ease();
     }
 put_tty ( CAN );
 return ( -1 );
    }

block.bldata = file_ptr;
while ( file_blocks-- )
    {
 if ( read_next_block ( &block ) != 0 )
     {
  DisposPtr ( file_ptr );
  return ( -1 );
     }
 block.bldata += ( block.blcount - 4 ) * sizeof ( Byte );
    }
  /* terminate the data stream */
*(block.bldata++) = 0;
*(block.bldata) = 0;

put_tty ( ACK );
(void) get_byte ( &c );
if ( c  != EOT )
    {
 errprintf ( "Expected EOT (%02x)\rReceived %c (%02x)",
       EOT, c, c );
 put_tty ( CAN );
    }
else
    {
 put_tty ( ACK );
    }
inptr = file_ptr;
```

```
if ( !(debug & BUG8) )
    {
    at_ease();
    }

/*   Clear out any old data */

for ( i = append_offset; i < MAXWAVES; i++ )
    {
    waves[i].len = 0;
    waves[i].name[0] = '\000';
    }

/*  Convert file data into waveforms */

if ( !(debug & BUG8) )
    {
    attention ( "Converting data..." );
    }
while ( next_rec() >= 0 )
    {
    }
if ( !(debug & BUG8) )
    {
    at_ease();
    }
new_file = TRUE;

if ( proto_type == CONTROL )
    {
    which_loop = WAVEDIT;
    }
else if ( proto_type == DATA )
    {
    which_loop = DATAEDIT;
    }
else
    {
    if ( auto_display )
        {
        which_loop = LOGIC;
        }
    logic_enabled = 0;
    GetPort ( &saveport );
    SetPort ( deskptr );
    EraseRect ( &armrect );
    SetPort ( saveport );
    }
firstwave = 0;
lastwave = firstwave + viswaves - 1;
firstclock = 0;
lastclock = firstclock + visclocks - 1;
set_controls();

#ifdef MAYBE_REDUNDANT
greatest = maxwavelen();
if ( proto_type == CONTROL || proto_type == DATA )
    {
    SetCtlMax ( w_hscroll, edit_length - visclocks );
    }
else
    {
    if ( greatest > visclocks )
        {
        SetCtlMax ( w_hscroll, greatest - visclocks );
        }
    else
        {
        SetCtlMax ( w_hscroll, 0 );
        }
```

```
    }
maxwaves = max_wave();
scroll_limit = maxwaves < viswaves ? 0 : maxwaves - viswaves + 1;
SetCtlMax ( w_vscroll, scroll_limit );
SetCtlValue ( w_vscroll, firstwave );
SetCtlValue ( w_hscroll, firstclock );
#endif MAYBE_REDUNDANT

if ( undo_wave.data )
    {
    DisposPtr ( undo_wave.data );
    }
undo_wave.data = (unsigned char *) NewPtr ( ( edit_length + 3 ) / 4 );
if ( clipboard.data )
    {
    DisposPtr ( clipboard.data );
    }
clipboard.data = (unsigned char *) NewPtr ( ( edit_length + 3 ) / 4 );
load_type = 0;
waiting = 0;
InitCursor();
}

revert()

{
register i;

if ( !file_ptr )
    {
    aprintf ( "Sorry!\rThere is nothing to revert to." );
    return;
    }

if ( decide1 ( "Reverting to last version loaded.\rAre you sure?" )
              == YES )

    {
    error = 0;
    recnum = 0;
    append_offset = 0;
    nextwave = 0;
    maxwaves = 0;

    for ( i = 0; i < MAXWAVES; i++ )
        {

        waves[i].len = 0;
        waves[i].name[0] = '\000';
        }

    inptr = file_ptr;

    while ( next_rec() >= 0 )
        {
        }
    InvalRect ( &screenrect );
    }
}
read_next_block ( blk_ptr )
Block *blk_ptr;

{
    short i;

    for ( i = 0; i < MAXRETRY; i++ )
        {
        put_tty ( ACK );
        if ( ( error = read_block ( blk_ptr ) ) == 0 )
            {
```

```
   return ( 0 );
      }
  else
      {
   if ( error == TIMEOUT )
       {
    put_tty ( CAN );
    return ( TIMEOUT );
       }
   put_tty ( NAK );
      }
     }
put_tty ( CAN );
aprintf ( "Failed to read block %d\rTransmission terminated",
        block_count );
return ( -1 );

read_block ( blk_ptr )
Block *blk_ptr;

{
Byte  c;
unsigned register sum;
register  i;

     /* wait for start-of-header */
do
    {
  if ( ( error = get_byte ( &c ) ) != 0 )
      {
   return ( error );
      }
    }
while ( c != SOH );
     /* read block number */
if ( read_bytes ((Byte *) &blk_ptr->blnum, sizeof (short)) != 0 )
    {
 return ( TIMEOUT );
    };
     /* read block size */
if ( read_bytes ((Byte *) &blk_ptr->blcount, sizeof (short)) != 0 )
    {
 return ( TIMEOUT );
    };
if ( blk_ptr->blcount > file_size + 4 )
    {
aprintf ( "Block %d\rSize is too big: %d   (%04x)\rFile size = %d",
 blk_ptr->blnum, blk_ptr->blcount, blk_ptr->blcount, file_size );
 return ( -2 );
    }
sum = 0;
    /* read the data */
for ( i = 0; i < blk_ptr->blcount - 4; i++ )
    {
  if ( get_byte ( &c ) == TIMEOUT )
      {
   return ( TIMEOUT );
      }
  sum += (unsigned) ( blk_ptr->bldata[i] = c );
    }


     /* read the checksum */
if ( read_bytes ((Byte *) &blk_ptr->blcksum, sizeof (short)) != 0 )
    {
 return ( TIMEOUT );
    }

if ( ( sum & 0xffff ) != blk_ptr->blcksum )
    {
```

```
   aprintf ( "Checksum Error\rExpected: %04x\rActual: %04x",
       blk_ptr->blcksum, sum );
   bugout ( BUG9, "Block number=%d (%08x)\rByte count=%d (%08x)\rCheck sum=%08
     blk_ptr->blnum, blk_ptr->blnum,
     blk_ptr->blcount, blk_ptr->blcount,
     blk_ptr->blcksum );
   if ( debug & BUG9 )
       {
    dump ( blk_ptr->bldata, blk_ptr->blcount - 4 );
    Wait_Button;
       }
   return ( -2 );
      }

  if ( block_count != blk_ptr->blnum )
      {
   aprintf ( "Bad Block Number\rExpected: %d\rActual: %d",
       block_count, blk_ptr->blnum );
   if ( debug & BUG9 )
       {
    dump ( blk_ptr->bldata, blk_ptr->blcount - 4 );
    Wait_Button;
       }
   return ( -2 );
      }

 ugout ( BUG9, "Block Number %d\rBlock size: %d (%04x)\rChecksum: %04x",
    blk_ptr->blnum,
     blk_ptr->blcount,
     blk_ptr->blcount,
      blk_ptr->blcksum & 0xffff);
 if ( debug & BUG9 )
     {
  dump ( blk_ptr->bldata, blk_ptr->blcount - 4 );
  Wait_Button;
     }
 block_count++;
 return ( 0 );

ead_bytes ( ptr, n )
yte *ptr;
nt n;

while ( n-- )
     {
  if ( get_byte ( ptr++ ) == TIMEOUT )
      {
   return ( TIMEOUT );
      }
     }
 return ( 0 );

rite_bytes ( ptr, n )
yte *ptr;
nt n;

 while ( n-- )
     {
  put_tty ( *ptr++ );
     }
 return ( 0 );

etnhex( n )
nt n;
```

```
register int value;
Byte c;

value = 0;
while ( n-- )
    {
  do
     {
    if ( get_byte ( &c ) == TIMEOUT )
       {
      return ( TIMEOUT );
       }
     }
  while ( c == ' ' );
  value *= 16;
  if ( c >= '0' && c <= '9' )
     {
   value += c - '0';
     }
  else if ( c >= 'a' && c <= 'f' )
     {
   value += c - 'a' + 10;
     }
  else if ( c >= 'A' && c <= 'F' )
     {
   value += c - 'A' + 10;
     }
  else
     {
   aprintf ( "Non-hex character: '%c' (%02x)", c, c );
     }
    }
return ( value );


arse_header ( blk_ptr )
lock *blk_ptr;


register i;
char  *bptr;  /* block pointer */
char  *fptr;  /* file info pointer */

     /* file name */
bptr = (char *) blk_ptr->bldata;
fptr = file_name;
while ( *fptr++ = *bptr++ )
     {
     }
     /* file size */
fptr = (char *) &file_size;
i = sizeof (int);
while ( i-- )
     {
 *fptr++ = *bptr++;
     }
     /* file blocks */
fptr = (char *) &file_blocks;
i = sizeof (int);
while ( i-- )
     {
 *fptr++ = *bptr++;
     }

ugout(BUG9, "File Name: \"%s\"\rFile size: %d (%08x)\rFile Blocks: %d (%08x)",
     file_name,
      file_size,
       file_size,
        file_blocks,
```

```
        file_blocks );

ext_string ( dptr, sptr )
har *dptr;
har *sptr;


 int delta = 0;

 while ( *sptr == ' ' )
      {
  if ( *sptr == '\000' )
       {
   *dptr = '\000';
   return ( delta );
       }
  sptr++;
  delta++;
      }
 while ( *sptr && *sptr != ' ' )
      {
  *dptr++ = *sptr++;
  delta++;
      }
 *dptr = '\000';
 return ( delta );


rint_file()




rinterr( string, error )
har     *string;
nt      error;


 aprintf ( "Error %d\r%s", error, string );


ump ( ptr, n )
har *ptr;
nt n;


 define HEADER \
 0  1  2  3  4  5  6  7  8  9  a  b  c  d  e  f      0123456789abcdef"
 Rect   destrect, viewrect;
 TEHandle tehandle;
 GrafPtr  saveport;
 char  *end;
 short  textheight; /* height of text line ( in pixels ) */
 short  i, j, k;
 short  lines;
 char  buffer[80];

 ifdef STAND_ALONE
 SetPort ( main_wptr );
 endif STAND_ALONE

 save_te_windows();

 TextFont ( Monaco );
        TextSize ( 9 );

 destrect = thePort->portBits.bounds;
 viewrect = thePort->portBits.bounds;
```

```
    /* force creation of an edit record */
tehandle = TENew ( &destrect, &viewrect );
    /* get the lineheight from the record */
textheight = (*tehandle)->lineHeight;
    /* let go of the handle */
TEDispose ( tehandle );
EraseRect ( &viewrect );
MoveTo ( 40, 2 * textheight );
DrawString ( HEADER );

end = ptr + n;
lines = n % 16 ? n/16 + 1 : n/16;

for ( j = 0; j < lines; j++ )
    {
 for ( i = 0; i < 80; i++ )
     {
  buffer[i] = ' ';
     }
 buffer[68] = '\000';

 MoveTo ( 40, ( j + 4) * textheight );
 k = 51;
 for ( i = 0; i < 16; i++ )
     {
  sputnhex ( &buffer[i*3], (unsigned) *ptr, 2 );
  buffer[i*3 + 2] = ' ';
  buffer[k++] = *ptr >= ' ' ? *ptr : ' ';
  ptr++;
  if ( ptr == end )
      {
   break;
      }
     }
 DrawString ( buffer );
    }


ext_rec()


length = 0;
if ( ( rectype = getshort() ) == 0 )
    {
 return ( -1 );
    }
recid = getshort();
reclen = getshort();
recnum++;

switch ( rectype )
    {
 case WAVEREC:
     {
  getwaverec();
  break;
     }
 case NAMEREC:
     {
  getnamerec();
  break;
     }
 case COMMENTREC:
     {
  getcommentrec();
  break;
     }
 default:
     {
```

```
    errprintf ( "Unknown record type: %d (%04x\rConversion terminated)",
        rectype, rectype );
    return ( -1 );
    break;
      }
     }
  return ( 0 );


 etwaverec()


  short clocks;
  Byte *nptr;

  recname = (Byte *) NewPtr ( 50 );
  nptr = recname;
  node = getshort();  /* get the node/channel number */
  if ( node < 0 )
      {
   node = ~node;
   efgl = 1;
      }
  clocks = getshort();  /* get the clock count */
      /* get the node/channel name */
  while ( *nptr++ = *inptr++ )
      {
      }
  length += strlen ( recname ) + 1;
 /* decide which name to use (this one or the logic anlalyzer one */

 if ( logic_enabled && load_type == 0 )
     {
  get_LA_name ( node );
     }
 else
     {
  strncpy ( waves[nextwave].name, recname, NAMELENGTH );
     }
     /* get the waveform data */
 make_wave ( inptr, ( reclen - length ) / 2, clocks );
 DisposPtr ( recname );
 nextwave++;
 maxwaves++;


 et_LA_name ( n )
 hort n;  /* node (channel) number from file */


 register i;
 char  numstring[10];


 *    get the order of appearance from the Logic Display dialog data */

 for ( i = 0; i < 16; i++ )
     {
  if ( LAnames[i].channel == n )
      {
   break;
      }
     }
 *
     if this is an immediate result of running the logic analyzer,
     then we'll take the names from the Logic Display dialog.
     Otherwise, this is probably an exsiting file, so we'll use the
     names from that file.
 /
 if ( logic_enabled && load_type == 0 )
```

```
    {
 strncpy ( waves[i].name, LAnames[i].text, NAMELENGTH );
    }
else
    {
 strncpy (.waves[i].name, recname, NAMELENGTH );
    }
if ( efgl && node <= 4 )
    {
 numstring[0] = nodenames[n];
 numstring[1] = '\000';
    }
else
    {
 NumToString ( n, numstring );
    }
 strcat ( waves[i].name, "  " );
 strcat ( waves[i].name, numstring );


ake_wave ( ptr, n, clk_count )
yte *ptr;
hort n;
hort clk_count;


 register unsigned char *aptr;
 register unsigned char mask;
 register short count;
 short data_word;
 short clock;
 short state;
 short i;
 short len;
 unsigned char  state_bits;

 bugout ( BUG8, "%d Data Words\r%d Clocks", n, clk_count );
 if ( proto_type == 3 )
    /*    get order of appearance from Logic Display dialog data  */
    {

  for ( i = 0; i < 16; i++ )
      {
   if ( LAnames[i].channel == node )
       {
    break;
       }
      }
  if ( i == 16 )
      {
   errprintf ( "Bad channel number: %d\rNot expecting channel greater than 16.", node
   return;
      }
  i += append_offset;
    }
 else
    {
  i = nextwave;
    }
 if ( waves[i].data )
    {
  DisposPtr ( waves[i].data );
    }
 waves[i].data = (Byte *) NewPtr ( ( edit_length + 3 ) / 4 );

 clock = 0;
 waves[i].id = recid;
 waves[i].len = 0;

 aptr = waves[i].data;
 mask = 0xc0;
```

```
while ( n-- )
    {
 data_word = getshort();
 if ( ( count = data_word & ~STATEMASK ) + waves[i].len
      > edit_length )
    {
  errprintf ( "Bad clock length (%d) at cycle %d\ron waveform %d.\rMaximum length of wave
    count, waves[i].len, i, edit_length );
  count = 1;
    }
 if ( ( state = ( data_word & STATEMASK ) >> 12 ) > 3 )
    {
  errprintf ( "Bad clock state (%d) at clock position %d\ron waveform %d.\rSetting to Tri
  state = TRISTATE;
    }
 bugout ( BUG8, "data_word = %04x\rcount = %d\rstate = %d",
   data_word & 0xffff, count, state );
 append ( i, state, count );
    }
bugout ( BUG8, "waves[%d].len = %d", i, waves[i].len );

if ( debug & BUG8 )
    {
 dump ( waves[i].data, ( waves[i].len + 3 ) / 4 );
 Wait_Button;
    }


etnamerec()


Byte *nptr;

nptr = (Byte *) proto_name;

proto_type = getshort();
proto_length = getshort();
edit_length = proto_length < MAXCLOCKS ? MAXCLOCKS : proto_length;
while ( *nptr++ = *inptr++ )
    {
    }
length += strlen ( proto_name ) + 1;

     short rec_type = 3;
     short rec_id;
     short rec_length;
     short name_type;
        >>> short proto_length; <<<
     char proto_name[]:



etcommentrec()
register char *cptr;
register i;
register j;
short comsize = 1;
char combuffer[100];
char c;

cptr = combuffer; /*  grab the comment */

while ( *cptr++ = *inptr++ )
    {
 comsize++;
    }
*cptr = '\000';

bugout ( BUG6, "Received %d bytes of comment:\r\"%s\"",
      comsize, combuffer );

   /* find the waveform with the matching id */
for ( i = 0; i < maxwaves; i++ )
    {
 if ( waves[i].id == recid )
      {
  break;
      }
```

```
    }
if ( i < maxwaves )
    {
 bugout ( BUG6, "Attaching comment to waveform %d", i );
   /* if new list, allocate space */
 if ( !waves[i].comcount )
     {
  bugout ( BUG6, "Allocating memory for new list..." );
  waves[i].comlist =
   (char**) NewPtr ( 20 * sizeof ( char * ) );
  waves[i].comcount = 0;
     }

 j = waves[i].comcount;
bugout ( BUG6, "Stuffing comment into wave[%d].comlist[%d]", i, j );
 waves[i].comlist[j] = (char*) NewPtr ( comsize );
 strcpy ( waves[i].comlist[j], combuffer );
bugout ( BUG6, "waves[%d].comlist[%d] =\r\"%s\"",
     i, j, waves[i].comlist[j] );
 waves[i].comcount++;
    }
else
    {
 bugout ( BUG6, "Orphaned comment...\rid = %d", recid );
    }


hort
etshort()
Byte *ptr;
short value;


ptr = (Byte *) &value;
*ptr++ = *inptr++;
*ptr++ = *inptr++;
length += sizeof ( short );
return ( value );


nsert ( wave, clock, state, n )
nt wave, clock, state, n;


register i, j;
register max_i;
register unsigned char mask;
register unsigned char tmp1, tmp2;
register unsigned char *byte_ptr;

for ( j = 0; j < n; j++ )
    {
   /* increment the wave length */
 waves[wave].len++;

 byte_ptr = &waves[wave].data[clock / 4];
 max_i = waves[wave].len / 4;
 mask = 0xFF << ( 8 - ( ( clock % 4 ) * 2 ) );

 tmp1 = *byte_ptr << 6;
 tmp2 = *byte_ptr >> 2;
 *byte_ptr &= mask;
 tmp2 &= ~mask;
 *byte_ptr |= tmp2;

 for ( i = ( clock / 4 ) + 1; i <= max_i; i++ )
     {
  byte_ptr = &waves[wave].data[i];
  tmp2 = *byte_ptr << 6;
```

```
  *byte_ptr >>= 2;
  *byte_ptr |= tmp1;
  tmp1 = tmp2;
     }
 newstate ( wave, clock, state );
    }


ewstate ( wave, clock, state )
nt wave;
nt clock;
nt state;


int i;
char mask;

if ( clock >= edit_length )
    {
 SysBeep ( 1 );
 return;
    }
if ( clock >= 0 )
    {
 i = clock / 4;
 mask = 0xC0 >> ( clock % 4 ) * 2;

 if ( clock >= waves[wave].len )
     {
  waves[wave].len++;
     }

 waves[wave].data[i] &= ~mask;

 switch ( state )
     {
  case LOW:
      {
   break;
      }
  case HIGH:
      {
   waves[wave].data[i] |= mask & 0x55;
   break;
      }
  case TRISTATE:
      {
   waves[wave].data[i] |= mask & 0xAA;
   break;
      }
  case NOT_USED:
      {
   waves[wave].data[i] |= mask & 0xFF;
   waves[wave].len--;
   break;
      }
     }
    }


end_file ( name, fptr, size )
har *name;
yte *fptr;
nt size;


char *bptr;
char *ptr;
int block_count;
int remaining;
int data_size;
```

```
short error;
char headbuff[100];
char c;

 /* wait for acknowledge */
do
    {
 if ( ( error = get_byte ( &c ) ) != 0 )
     {
  return ( error );
     }
    }
while ( c != ACK );

attention ( "Sending Data To Tester..." );

strcpy ( file_name, name );
file_ptr = fptr;
file_size = size;
file_blocks = ( size + BLK_SIZE ) / BLK_SIZE + 1;


header.blcount = 0;   /* init byte count */
bptr = headbuff;   /* init buffer pointer */

strcpy ( bptr, name );   /* copy name into buffer */
header.blcount += strlen ( name ) + 1;
bptr += strlen ( name ) + 1;

ptr = (char *) &size;   /* copy size into buffer */
bytecopy ( bptr, ptr, sizeof ( int ) );
header.blcount += sizeof ( int );
bptr += sizeof (int);

block_count = file_blocks;
ptr = (char *) &block_count;  /* copy block count to buff */
bytecopy ( bptr, ptr, sizeof ( int ) );

header.blcount += sizeof ( int );
header.bldata = (Byte *) headbuff;

header.blnum = 1;
header.blcksum = chksum ( header.bldata, header.blcount );
header.blcount += 4;

send_block ( &header );

remaining = size;
block.blnum = 1;
block.bldata = fptr;

while ( --file_blocks )
    {
 data_size = remaining > BLK_SIZE ? BLK_SIZE : remaining;

 block.blnum++;
 block.blcount = data_size + 4;
 block.blcksum = chksum ( block.bldata, data_size );

 send_next_block ( &block );

 block.bldata += data_size;
 remaining -= data_size;
    }

file_ptr = (Byte *) 0;
put_tty ( EOT );

at_ease();
```

```
 /* wait for acknowledge */
if ( ( error = get_byte ( &c ) ) != 0 || c != ACK )
    {
 return ( error );
    }


end_next_block ( blk_ptr )
lock *blk_ptr;


short i;

for ( i = 0; i < MAXRETRY; i++ )
    {
 if ( ( error = send_block ( blk_ptr ) ) == 0 )
     {
  return ( 0 );
     }
 else
     {
  if ( error == TIMEOUT )
      {
   put_tty ( CAN );
   return ( TIMEOUT );
      }
  put_tty ( NAK );
     }
    }
put_tty ( CAN );
errprintf ( "Failed to send block %d\rTransmission terminated",
       block_count );
return ( -1 );


end_block ( blkptr )
lock *blkptr;


Byte *ptr;
short i;
short error;

char c;

  /* send start-of-header */
put_tty ( SOH );
  /* send the block number */
write_bytes ( (Byte *) (&blkptr->blnum), sizeof (short) );

  /* send the byte count */
write_bytes ( (Byte *) (&blkptr->blcount), sizeof (short) );

  /* check the data for "reasonability" */
ptr = blkptr->bldata;
for ( i = 0; i < blkptr->blcount - 4; i++ )
    {
ifdef DEBUG
 if ( blkptr->blnum != 1 &&
  ( *ptr < ' ' || *ptr > '~' ) && *ptr != '\012' )
      {
  at_ease();
printf ( "Funny-looking protocol text!\rCall Harvey!\rDump to follow..." );
  dump ( blkptr->bldata, blkptr->blcount - 4 );
  Wait_Button;
  return (-1);
      }
endif DEBUG
    }
```

```
  /* send the data */
ptr = blkptr->bldata;
for ( i = 0; i < blkptr->blcount - 4; i++ )
    {
 put_tty ( *ptr++ );
    }
  /* send the checksum */
write_bytes ( (Byte *) (&blkptr->blcksum), sizeof (short) );

 /* wait for acknowledge */
if ( ( error = get_byte ( &c ) ) != 0 || c != ACK )
    {
 return ( error );
    }
return ( 0 );


hort
hksum(ptr, wc)
har *ptr;
nt wc;


register unsigned short result = 0;
short bytes;

bytes = wc;
if ( wc )
   {
do
    {
  result += (*ptr++);
    }
 while(--wc);
   }

return( result );


ytecopy ( dptr, sptr, n )
har *dptr;
har *sptr;
nt n;


while ( n-- )
    {
 *dptr++ = *sptr++;
    }


ppend ( wave, state, count )
nt wave, state, count;


register unsigned char *aptr;
register unsigned char mask;
unsigned char  state_bits;

aptr = waves[wave].data + ( ( waves[wave].len ) / 4 );
mask = 0xc0 >> ( ( ( waves[wave].len ) % 4 ) * 2 );

switch ( state )
    {
 case LOW:
     {
  state_bits = 0x00;
  break;
     }
 case HIGH:
```

```
     {
 state_bits = 0x55;
 break;
     }
case TRISTATE:
     {
 state_bits = 0xaa;
 break;
     }
default:
     {
 bugout ( BUG9, "Uh-oh!  Bad state!" );
 state_bits = 0xff;
 break;
     }
     }

waves[wave].len += count;
bugout ( BUG9, "count = %d\rNew length of waves[%d] = %d",
   count, wave, waves[wave].len );

while ( count-- )
     {
 *aptr &= ~mask;
 *aptr |= state_bits & mask;
 if ( mask == 0x03 )
      {
  aptr++;
  mask = 0xc0;
      }
 else
      {
  mask >>= 2;
      }
     }


ax_wave()


register i = MAXWAVES;

while ( i-- )
     {
 if ( waves[i].len > 0 )
      {
  return ( i + 1 );
      }
     }

*
set_controls  -- update the scroll bars.
/

et_controls()


short h_max;
short scroll_limit;

greatest = maxwavelen();
if ( which_loop == WAVEDIT )
     {
 h_max = edit_length - visclocks;
     }
else
     {
 if ( greatest > visclocks )
      {
  h_max = greatest - visclocks;
      }
```

```
else
    {
  h_max = 0;
    }
   }
if ( firstclock > h_max )
   {
 firstclock = h_max;
 lastclock = firstclock + visclocks - 1;
   }

maxwaves = max_wave();
scroll_limit = maxwaves < viswaves ? 0 : maxwaves - viswaves + 2;
if ( firstwave > scroll_limit )
   {
 firstwave = scroll_limit;
   }
SetCtlMax ( w_vscroll, scroll_limit );
SetCtlMax ( w_hscroll, h_max );
SetCtlValue ( w_hscroll, firstclock );
SetCtlValue ( w_vscroll, firstwave );


ame_and_length()

Rect  itembox;
Handle  itemhandle;
Handle  namehandle;
Handle  lenhandle;
DialogRecord dlogrec;
DialogPtr dlogptr;
int  itemhit;
char  buffer[256];
char  protolen[20];

dlogptr =  GetNewDialog ( 263, (Ptr)&dlogrec, (WindowPtr) -1 );
NumToString ( proto_length, protolen );

if ( dlogptr == 0 )
    {
 aprintf ( "GetNewDialog() Failed.\rBummer!" );
    }
else
    {
 save_te_windows();
 GetDItem ( dlogptr, 6, &itemhit, &namehandle, &itembox );
 SetIText ( namehandle, proto_name );
 SelIText ( dlogptr, 6, 0, 50 );
 GetDItem ( dlogptr, 7, &itemhit, &lenhandle, &itembox );
 SetIText ( lenhandle, protolen );
 SelIText ( dlogptr, 7, 0, 50 );
 ShowWindow ( (WindowPtr) dlogptr );

 do
     {
  ModalDialog ( (ProcPtr) 0, &itemhit );
  switch ( itemhit )
      {
   case OK:
       {
    GetIText ( namehandle, proto_name );
    GetIText ( lenhandle, protolen );
    proto_length = atoi ( protolen );
    break;
       }
   case Cancel:
       {
    break;
       }
   case 6:
```

```
  case 7:
      {
   break;
      }
  default:
      {
   aprintf ( "Unexpected Item Number: %d",
      itemhit );
      }
     }
    }
while ( itemhit > Cancel );
CloseDialog ( dlogptr );
return ( itemhit );
   }
ypedef unsigned char Byte;

* Wizard stuff  --  for internal use only */

define BUGMASK 0x0f00  /* relavant key event modifier mask */
define WIZARD 0x0b00  /* command - option - shift */

* the following correspond to bits in the "debug" variable */

define BUG1 0x0001
define BUG2 0x0002
define BUG3 0x0004
define BUG4 0x0008
define BUG5 0x0010
define BUG6 0x0020
define BUG7 0x0040
define BUG8 0x0080
define BUG9 0x0100
define BUG0 0x0200
define FALSE  0

define OUTLINE  3
define LOGICINPUT 5
define QUALIFIER 6
define EXECENV  7
define DELAY  8
define CLOCKS  9
define DELAY_ON 10
define DELAY_OFF 11
define MHZ2  13
define MHZ4  14
define MHZ8  15
define EFG  17
define DUT  18
define DELAYCOUNT 19
define FILENAME 21
define Q4  22
define Q3  23
define Q2  24
define Q1  25
define QBOX  26

define NAME_EDIT 4
define TOPNAMES 5
define BOTTOMNAMES 6
define LA_CHANNELS 7

define Wait_Button {while(!Button()); while(Button());}

ypedef struct
   {
short channel;
char text[NAMELENGTH+1];
   } Namestruct;
```

```
/* Pseudo code for integrated Terminal Emulator & Harvey's stuff:
Main loop */

#include        <mac/quickdraw.h>
#include <mac/toolintf.h>
#include <mac/osintf.h>
#include "ddw.h"

#define DDW_MAGIC 0x1234567

extern struct QDVar QDVar;
extern GrafPtr deskptr;
extern short which_loop;

MenuHandle      menus[MAXMENUS];
ResType typeDRVR = { "DRVR" };
.
LASetup setup_values;


main()
{
     /* Initialize The World */

 /* initialize standard stuff */
 standard_init();
 /* save a pointer to the desktop */
 GetPort ( &deskptr );
/* init_menus();  */
 /* do a cold start on the waveform program */
 wave ( DDW_MAGIC );

 FlushEvents(everyEvent,0);

 /* cover our fannies with a Copyright notice  */

 (void) Alert( 300, (ProcPtr) 0);

 /* TE & WAVES  will initialize their own stuff */

    which_loop = TERMINAL;

     /* forever loop until Quit exits */
 /* Quit will cause one of the applications (terminal or wavedit)
  * to ExitToShell() to get to the launching program
  */
     for (;;)
           {
  switch ( which_loop )
      {
   case TERMINAL:
       {
           /* run terminal emulator event loop */
           term( DDW_MAGIC );
           break;
       }
   case WAVEDIT:
       {
    wave ( DDW_MAGIC );
    break;
       }
   case DATAEDIT:
       {
    wave ( DDW_MAGIC );
    break;
       }
   case LOGIC:
       {
    wave ( DDW_MAGIC );
```

```
     break;
        }
    default:
        {
     aprintf("which_loop has a funny value: %d",
               which_loop);
     which_loop = TERMINAL;
        }
       }
             }
}

init_menus()

{
 int i;

 menus[DESKMENU] = NewMenu(APPLE, APPLE_SYM);
 menus[DDWMENU] = GetMenu ( DDW );
 menus[MODEMENU] = GetMenu ( MODE );
 menus[FUNCTIONMENU] = GetMenu ( FUNCTION );
 menus[MOVEMENU] = GetMenu ( MOVEMENT );
 menus[CONTROLMENU] = GetMenu ( CONTROLS );
 menus[PROTOMENU] = GetMenu ( PROTOCOL );
 menus[EDITMENU] = GetMenu ( EDIT );
 menus[DISPLAYMENU] = GetMenu ( DISPLAY );
 AddResMenu(menus[DESKMENU], typeDRVR.s); /* desk accessories */
 for ( i = 0; i < MAXMENUS; i++ )
     {
  InsertMenu ( menus[i], 0 );
     }
 DrawMenuBar();
}

after_smoke()

{
 ExitToShell();
}
/* standard_inits() does all the initializations most MAC applications need */
standard_init()
{
 /* after_smoke() is the resume function to resume after a
  * crash (otherwise know as a smoking bomb).
  */
     extern after_smoke();

        QD = &QDVar;
        InitGraf(&thePort);
        InitFonts();
        InitWindows();
 InitMenus();
 TEInit(); /* for desk accessories! */
 InitDialogs( (ProcPtr) after_smoke );
        InitCursor();
} /* standard_inits() */

quit()

{
 ExitToShell();
}
#define TE_LOOP  1
#define WAVES_LOOP  2

#define LOADSEQ  'x'

#define CREATE_PROTO 'x'
#define LOAD_PROTO 'x'
```

```
#define INSERT_PROTO 'x'
#define REPLACE_PROTO 'x'

/* Macintosh system globals */

#define DlgFont (*((short*)0x0afa))      /* default dialog font */
#define FScaleDisable (*((char*)0x0a63))  /* flag to disable font scaling */

/* Macros  */

#define Textlength(tehdl) ((*tehdl)->TElength)
#define Textlineheight(tehdl) ((*tehdl)->lineHeight)
#define Textselsize(tehdl) ((*tehdl)->selEnd - (*tehdl)->selStart)
#define State(wv,clk) ((waves[wv].data[(clk)/4]>>((3-(clk)%4)*2))&0x03)
#define Wait_Button {while(!Button()); while(Button());}
#define NewPtr(arg) _newptr(arg)
#define DisposPtr(arg) _disposptr(&(arg))

/*  Constants */

#define YES  1
#define NO  2
#define ABORT  3
#define NULL  '\000'
#define APPLE_SYM  '\024'
#define TRUE  0xffff
#define FALSE  0
#define MAXCURSORS 6
#define MAXCLOCKS 1024
#define MAXWAVES 256
#define MAXSCALES 4
#define MAXSIZES 4
#define NAMELENGTH 16
#define WAVEHEIGHT 12
#define WAVEWIDTH 448
#define CLOCKWIDTH 8
#define LINEWIDTH 2
#define LOW  0
#define HIGH  1
#define TRISTATE 2
#define NOT_USED 3
#define BACKSPACE '\010'
#define CR  '\015'
#define CURSEBLINK      30
#define LOGICBLINK 30
#define BLK_SIZE 256
#define BUF_SIZE 10000
#define TEXT  4
#define CONTROL  1
#define DATA  2

#define ESC  '\033'
#define TRAP_L  'L'  /* load file */
#define TRAP_P  'P'  /* mprintf */
#define TRAP_B  'B'  /* macbuff */
#define TRAP_F  'F'  /* macflush */

/* Window Reference Numbers */

#define WAVEWINDOW 1
#define CURSEWINDOW 2
#define POSWINDOW 3
#define LADISPWINDOW 5
#define DATAWINDOW 7
#define PROTOWINDOW 9

/* Controls */

#define VSCROLL  1
```

```
#define HSCROLL  2

#define NO_HIGHLIGHT 254

/* Menu Definitions */

#define APPLE   1 /* menu ID for desk accessory menu */
#define MAXMENUS 9

#define DESKMENU 0
#define DDWMENU  1
#define MODEMENU 2
#define FUNCTIONMENU 3
#define MOVEMENU 4
#define CONTROLMENU 5
#define PROTOMENU 6
#define EDITMENU 7
#define DISPLAYMENU 8

#define DDW  256
#define TERMINAL 1
#define WAVEDIT  2
#define DATAEDIT 3
#define LOGIC  4
#define PRINT  6
#define QUIT  8

#define MODE  257
#define COMMAND  1
#define DEVELOP  2
#define OPERATE  3
#define DUMB  4

#define FUNCTION 258
#define CANCEL  1
#define START  2
#define HOLD  4
#define REPEAT  5
#define CRT  6
#define REPPAGE  7
#define BREAK  8
#define CHARINSERT 9
#define CHARDELETE 10
#define LINEINSERT 11
#define LINEDELETE 12
#define PAGEERASE 13

#define MOVEMENT 259
#define UP  1
#define DOWN  2
#define LEFT  3
#define RIGHT  4
#define HOME  5
#define END  6
#define NEXTPAGE 7
#define PREVPAGE 8

#define CONTROLS 260
#define HANDSHAKE 1
#define LOGICSETUP 2
#define LOGICDISPLAY 3
#define LOADFILE 4
#define AUTODISPLAY 5
#define LOGICENABLE 6
/* for XOFF's testing the speed of the TE */
#ifdef tespeed
#define XOFF_300 7
#define XOFF_2000 8
#endif
```

```
#define PROTOCOL 261
#define NEW  1
#define LOAD  2
#define INSERT  3
#define REPLACE  4
#define REVERT  5
#define NAME  6

#define EDIT  262
#define UNDO  1
#define CUT  2
#define COPY  3
#define PASTE  4
#define REPLICATE 5

#define DISPLAY  263
#define GRID  1
#define HAIRLINE 2
#define EXPAND  3

/* Keyboard Definitions */
#define EXIT  'q'

/* Cursor Definitions */

#define CROSSHAIR 0
#define SELECTOR 1
#define VERTDRAG 2
#define HORIZDRAG 3
#define COMPARE  4
#define WAIT  5

/* Type Definitions */

typedef struct
    {
 Point  org; /* top-left corner of waveform screen area */
 short  len; /* length of waveform ( in clocks ) */
 short  id; /* cross reference for comments 'n' such */
 char  **comlist; /* pointer to comments */
 short  comcount; /* numger of comment lines */
 char  name[NAMELENGTH+1]; /* waveform name (+ NULL) */
 unsigned char *data; /* packed waveform data */
    } wavestruct ;

typedef struct
    {
 short c_id;
 BitMap c_map;
 Rect c_rect;
 Cursor c_cursor;
    } cursestruct;

typedef struct
    {
 short blnum;   /* block number */
 short blcount;  /* byte count */
 short blcksum;  /* check sum */
 unsigned char  *bldata;  /* pointer to data */
    } Block;

typedef struct
    {
 short  logic;
 short  exec;
 short  mhz2;
 short  mhz4;
 short  mhz8;
 short  efg;
```

```
 short  dut;
 short  del_off;
 short  del_on;
 short  q1;
 short  q2;
 short  q3;
 short  q4;
 unsigned short del_count;
 char  fname[NAMELENGTH];
    } LASetup;

typedef struct
    {
 short  *itemhit;
 EventRecord *event;
 DialogPtr dlog_ptr
    } modalargs;

/* take out because it interferes with the Mac ROM Delay()
#define Delay(n) { delay_count = n; while ( delay_count-- ); }
*/

/* Sender/Receiver definitions */

#define READTIME  30.

#define RDY  0x31
#define SOH   0x01
#define ACK   0x06
#define NAK   0x15
#define CAN   0x18
#define EOT  0x04

#define TIMOUT   -1
#define GOOD   0
#define NOTOK   1
#define MAXRETRY  3
#define BSIZE   256

/* struct for terminal emulator setup */
typedef struct
    {
     short   baud300;
 short  baud600;
 short  baud1200;
 short baud1800;
 short baud2400;
 short baud3600;
 short baud4800;
 short baud9600;
 short baud19200;
 short  baud57600;
 short bitschar7;
 short bitschar8;
 short evenparity;
 short oddparity;
 short offparity;
 short stopbits1;
 short stopbits1_5;
 short stopbits2;
 short  XOnXOff;
 short nohandshake;
    } TESetup;
extern Ptr _newptr();
ddw

Type TEST = STR
 ,0
Version 1.0 H. Crisler terminal.c
```

```
Type CODE
  ddw.out,1

Type MENU
,256 (4)
DDW
  Terminal
  Waveform Editor
  Data Editor
  Logic Analyzer
   (-
  Print
   (-
  Quit

Type MENU
,257 (4)
Mode
  Command
  Develop
  Operate
* for debugging
* Play Dumb

Type MENU
,258 (4)
Function
   Cancel
   Start
   (-
   Hold
   Repeat
   CRT
   Rep Page
   Break
   Char Insert
   Char Delete
   Line Insert
   Line Delete
   Page Erase

Type MENU
  ,259 (4)
Moves
   Up
   Down
   Left
   Right
   Home
   End
   Next Page
   Previous Page

Type MENU
,260 (4)
Controls
  Xon Xoff Handshake
  Analyzer Setup...
  Analyzer Display...
  Load File
  Auto Display
  Analyzer Enable

Type MENU
,261 (4)
Protocol
  New
  Load
  Insert
```

```
  Replace
  Revert
  Name...

Type MENU
,262 (4)
Edit
  Undo
  Cut
  Copy
  Paste
  Replicate

Type MENU
,263 (4)
Display
  Grid
  Hairline
  Expand
   (-
  x  2
  x  4
  x  8
  x 16
   (-
  4 Pt
  8 Pt
 12 Pt
 16 Pt

Type MENU
,265 (4)
Options
  Clear Screen
  Play Dumb
  Print Trace
  Free Mem
  Hide Windows
  Show Windows
  Disable Menus
  Enable Menus
* Program Name
* Change Prog Name
  Quit

Type MENU
,266 (4)
Baud
  300
  600
  1200
  2400
  4800
  9600
  19200

* This window is the main Terminal Emulator window, which for a Qume
* has 24 lines.
Type WIND
 ,400 (4)
 Terminal
 40, 5, 314, 490
 Visable NoGoAway
 0
 0

* This window is the user line for the Qume
Type WIND
 ,401 (4)
```

```
User Line
333, 5, 340, 500
Visable NoGoAway
3
1

* Waveform Window

Type WIND
,256 (4)
Waveform Editor
40, 30, 340, 510
Invisable NoGoAway
0
1

* Cursors Window

Type WIND
,300 (4)
Cursors
140, 2, 265, 27
Invisable NoGoAway
3
2

* Hairline Position Window

Type WIND
,301 (4)
Positions
40, 2, 115, 27
Invisable NoGoAway
3
3

* Data Protocol Window

Type WIND
,302 (4)
dedit
40, 5, 332, 507
Invisable NoGoAway
0
7

* Protocol Window

Type WIND
,257 (4)
Protocol
220, 35, 340, 465
InVisable GoAway
0
9

* LA Display Setup Window

Type WIND
,258 (4)
Display
65 50 330 460
Invisible 16 NoGoAway 0
16
5

* Crosshair Cursor

Type CURS
,257 (4)
```

```
 0100 0100 0100 0000 0000 0100 0100 e7ce 0100 0100 0000 0000 0100 0100 0100 0000
 0000 0000 0000 0000 0000 0000 0000 0000 0000 0000 0000 0000 0000 0000 0000 0000
 0007 0007

* Selector Cursor

Type CURS
 ,258 (4)
 0380 0100 0100 0100 0100 0100 0100 0100 0100 0100 0100 0100 0100 0100 0100 0380
 0000 0000 0000 0000 0000 0000 0000 0000 0000 0000 0000 0000 0000 0000 0000 0000
 0007 0007

* Vertical Drag Cursor

Type CURS
 ,259 (4)
 0100 0380 07c0 0fe0 1ff0 0380 0380 0380 0380 0380 0380 1ff0 0fe0 07c0 0380 0100
 0000 0000 0000 0000 0000 0000 0000 0000 0000 0000 0000 0000 0000 0000 0000 0000
 0007 0007

* Horizontal Drag Cursor

Type CURS
 ,260 (4)
 0000 0000 0000 0810 1818 381c 7ffe ffff 7ffe 381c 1818 0810 0000 0000 0000 0000
 0000 0000 0000 0000 0000 0000 0000 0000 0000 0000 0000 0000 0000 0000 0000 0000
 0007 0007

* Compare Cursor

Type CURS
 ,261 (4)
 0000 0000 0000 0000 1ff8 1ff8 1ff8 0000 0000 1ff8 1ff8 1ff8 0000 0000 0000 0000
 0000 0000 0000 0000 0000 0000 0000 0000 0000 0000 0000 0000 0000 0000 0000 0000
 0007 0007

Type HEXA
,3
008001C003E007F00FF81FFC3FFE7FFF3FFE1FFC
0FF807F003E001C00080

Type HEXA
,4
0100038007C00FE01FF03FF87FFCFFFE7FFC3FF8
1FF00FE007C003800100

* Arrow

Type HEXA
,256
8000C000E000F000F800F000E000C0008000

*       Control characters
*
*       Format:   ffcc
*
*       ff = function code ( see terminal.h )
*       cc = ascii control character

Type CTLS = HEXA
,257 (4)
* CTL Z - Clear all unprotected to spaces
  8f1a
* CTL ^ - Home cursor
  8a1e
* CTL H - Left
  8608
* CTL L - Right
  870c
* CTL K - Up
  880b
```

```
* CTL V - Down
  8916
* end-of-list
  0000

*       Escape sequences
*
*       Format:    ffcc...cc00
*
*       ff = function code ( see terminal.h )
*       cc...cc00 = null terminated character string
*
*    [ Note: The escape character itself is NOT included in these strings. ]

Type ESCS = HEXA
,258 (4)
* ESC ; - Clear all unprotected to spaces
  8f3b00
* ESC * - Clear all to Nulls
  8f2a00
* ESC + - Clear all unprotected to spaces
  8f2b00
* ESC 1 - Set Column tab
  973100
* ESC = RC - Address Cursor (move it)
  8b3dffff00
* ESC T - Line erase to spaces
  8C5400
* ESC t - Line erase to Nulls
  8C7400
* ESC T
* 8E5400
* ESC t
* 8e7400
* ESC ( - Half Intensity On (Null function for now)
  802800
* ESC ) - Half Intensity OFF (Null function for now)
  802900
* ESC Q - Character Insert
  905100
* ESC W - Character Delete
  915700
* ESC E - Line Insert
  924500
* ESC R - Line Delete
  935200
* ESC g - User Line: Display
  986700
* ESC h - User Line: Blank
  996800
* ESC f - User Line: (Data) CR
  9a6600
* ESC Y - Page erase to spaces
  9b5900
* ESC j - Reverse Linefeed
  9c6a00
* ESC G 4 - Reverse Video
  94473400
* ESC G 0 - Normal Video
  95473000
* ESC L  - Load a File
  a04c00
* ESC P
  a15000
* ESC B
  a24200
* ESC F
  a34600
* ESC xx  ztop said it is running on the tester.
  a4787800
```

```
* ESC xy  ztop said it's exiting.
  a5787900
* These last several below are mapped to the Null function, as they
* have no meaning at this time, I just put them in so they won't
* be echoed on login.
* ESC d - Normal Video (whole screen)
  806400
* ESC I - Back Tab
  804900
* ESC " - Keyboard Unlock
  802200
* ESC , - Clear All to 1/2 Intensity Spaces
  802C00
* ESC 3 - Clear All Tabs
  803300
* ESC ' - Protect mode off
  802700
* ESC l - Set Duplex Edit Mode
  806C00
* end-of-list
  000000

Type SIZE = HEXA
 ,-1
 0000003
 4000003
 4000

* aprintf() alert box

Type ALRT
 ,17 (4)
 120 100 230 412
 17
 4444
* Copyright alert box

Type ALRT
 ,300 (4)
 120 100 230 412
 300
 4444

* decide1() alert box

Type ALRT
 ,259 (4)
 110 100 230 412
 259
 5555

* decide2() alert box

Type ALRT
 ,269 (4)
 110 100 230 412
 269
 5555

* macflush() alert box

Type ALRT
 ,262 (4)
 115 10 270 490
 262
 5555

Type DLOG
 ,256 (4)
 70 50 310 460
```

```
Invisible 16 NoGoAway 0
256
Logic Analyzer Setup

Type DLOG
,257 (4)
65 50 330 460
Visible 16 NoGoAway 0
257
Logic Analyzer Display

* 'Attention' message dialog box

Type DLOG
,258 (4)
100 150 140 362
Invisible 1 NoGoAway 0
258

Type DLOG
,260 (4)
70 50 310 500
Invisible 16 NoGoAway 0
260
Terminal Emulator Setup

Type DLOG
,501 (4)
115 128 171 383
Visible 1 NoGoAway 0
501
a

* Fetch Text Dialog Box

Type DLOG
,261 (4)
120 150 220 360
Invisible 1 NoGoAway 0
261

* Fetch Name and Protocol Length Dialog Box

Type DLOG
,263 (4)
120 150 220 360
Invisible 1 NoGoAway 0
263

* aprintf() item list

Type DITL
,17 (4)
2
BtnItem Enabled
80 10 100 90
OK

StatText Disabled
10 10 60 292
^0

* Copyright item list

Type DITL
,300 (4)
4
BtnItem Enabled
80 10 100 90
OK
```

```
 StatText Disabled
 10 30 30 292
Data Director Workstation

 StatText Disabled
 30 30 50 292
(c) Copyright 1985 Zehntel, Inc.

 StatText Disabled
 50 30 70 292
This is an unpublished work.

* macflush() item list

Type DITL
 ,262 (4)
 2
 BtnItem Enabled
 130 10 150 90
 OK

 StatText Disabled
 10 5 120 470
^0

Type DITL
 ,256 (4)
 26
 BtnItem Enabled
 210 220 230 280
 OK

 BtnItem Enabled
 210 320 230 380
 Cancel

 UserItem Disabled
 0 0 0 0

 StatText Disabled
 10 10 30 100
 Trigger

 RadioItem Enabled
 30 30 50 185
 Logic Input

 StatText Disabled
 32 195 52 265
 Qualifier

 RadioItem Enabled
 65 30 85 185
 Execution Envelope

 StatText Disabled
 67 195 87 235
 Delay

 StatText Disabled
 67 285 87 335
 Clocks

 RadioItem Enabled
 55 235 75 275
 On

 RadioItem Enabled
 75 235 95 275
 Off

 StatText Disabled
 92 10 112 100
 Sample Clock

 RadioItem Enabled
 110 30 130 185
 2 MHz Synchronous

 RadioItem Enabled
 130 30 150 185
 4 MHz Synchronous

 RadioItem Enabled
 150 30 170 185
 8 MHz Asynchronous

 StatText Disabled
 173 10 193 100
 Channels 3-0

 RadioItem Enabled
 190 30 210 185
 EFGL

 RadioItem Enabled
 210 30 230 185
 DUT

 EditText Enabled
 65 340 81 390
 0

 StatText Disabled
 110 235 126 390
 File Name:

 EditText Enabled
 130 235 146 390
 Test

 StatText Enabled
 32 280 48 292
 ^3

 StatText Enabled
 32 292 48 304
 ^2

 StatText Enabled
 32 304 48 316
 ^1

 StatText Enabled
 32 316 48 328
 ^0

 UserItem Disabled
 31 275 49 330

Type DITL
 ,257 (4)
 7
 BtnItem Enabled
 210 220 230 280
 OK

 BtnItem Enabled
 210 320 230 380
 Cancel
```

```
UserItem Disabled
0 0 0 0

EditText Disabled
-20 250 -4 350

UserItem Enabled
2 50 260 150

UserItem Enabled
260 50 260 150

UserItem Enabled
2 25 260 45

* 'Attention' message text item

Type DITL
,258 (4)
1
StatText Disabled
3 10 38 200
^0

* decide1() item list

Type DITL
,259 (4)
4
BtnItem Enabled
90 20 110 100
Yes

BtnItem Enabled
-20 -100 0 0
Dummy

BtnItem Enabled
90 220 110 300
Cancel

StatText Disabled
10 10 80 292
^0

* decide2() item list

Type DITL
,269 (4)
4
BtnItem Enabled
60 20 80 100
Overwrite

BtnItem Enabled
90 20 110 100
Append

BtnItem Enabled
90 220 110 300
Cancel

StatText Disabled
10 10 50 292
^0

Type DITL
,260 (4)
28
BtnItem Enabled
210 260 230 320
OK

BtnItem Enabled
210 360 230 420
Cancel

StatText Disabled
10 10 30 100
Baud Rate

RadioItem Enabled
30 30 50 185
300

RadioItem Enabled
30 130 50 285
600

RadioItem Enabled
30 230 50 385
1200

RadioItem Enabled
30 330 50 485
1800

RadioItem Enabled
50 430 70 185
2400

RadioItem Enabled
50 30 70 185
3600

RadioItem Enabled
50 30 70 185
4800

RadioItem Enabled
50 30 70 185
7200

RadioItem Enabled
50 30 70 185
9600

RadioItem Enabled
50 30 70 185
19200

RadioItem Enabled
50 30 70 185
57200

StatText Disabled
92 10 112 100
Bits per Character

RadioItem Enabled
50 30 70 185
7 Bits

RadioItem Enabled
50 30 70 185
8 Bits
```

```
StatText Disabled
92 10 112 100
Parity

RadioItem Enabled
110 30 130 185
Even

RadioItem Enabled
130 30 150 185
Odd

RadioItem Enabled
150 30 170 185
None

StatText Disabled
92 10 112 100
Stop Bits

RadioItem Enabled
50 30 70 185
1 Bit

RadioItem Enabled
50 30 70 185
1.5 Bits

RadioItem Enabled
50 30 70 185
2 Bits

StatText Disabled
92 10 112 100
Handshake

RadioItem Enabled
50 30 70 185
XOn/XOff

RadioItem Enabled
50 30 70 185
None

Type DITL
,501 (32)
4
BtnItem Enabled
31 10 51 80
Cancel

BtnItem Enabled
31 90 51 160
Pause

BtnItem Enabled
31 170 51 240
Continue

StatText Disabled
5 56 21 230
Printing in progress.

* Fetch Text Dialog Item List

Type DITL
,261 (4)
4
```

```
.nItem Enabled
,0 10 90 70
OK

BtnItem Enabled
70 140 90 200
Cancel

StatText Disabled
10 10 26 200
File Name:

EditText Enabled
40 10 56 200
Default

* Fetch Name and Protocol Length
  Dialog Item List

Type DITL
,263 (4)
7
BtnItem Enabled
70 10 90 70
OK

BtnItem Enabled
70 140 90 200
Cancel

StatText Disabled
5 60 21 200
Protocol

StatText Disabled
25 10 41 115
Name:

StatText Disabled
25 125 41 200
Length:

EditText Enabled
45 10 61 115
Default

EditText Enabled
45 125 61 200
Default

* OK Button
Type CNTL
,300 (4)
OK
210 220 230 280
Visible
0
1
0 0 0

* Cancel Button

Type CNTL
,301 (4)
Cancel
210 320 230 380
Visible
0
2
0 0 0
```

```
/* Module FUNCTIONS.c  */

 This module includes do_function(), and most of the functions which affect
 the screen */

nclude        <mac/quickdraw.h>
nclude        <mac/toolintf.h>
nclude        "terminal.h"
 for BUG# for debugging */
nclude  "global.h"

efine Wait_Button     {while(!Button()); while(Button());}

tern Point     penloc;   /* pen location */
tern short     charwidth;   /* character width */
tern short     lineheight; /* line height */
tern short     right_margin;
tern short     bottom_margin;
tern short     echoline;
tern short     topline;
tern Rect      screen_rect;
tern Rect      lastline_rect;
tern Rect  firstline_rect;
tern WindowRecord main_wrec;
tern short   user_load;
tern short   trace;
tern short   tabs[];
tern short   x;
tern short   y;
tern char      esc_string[10];
tern FontInfo        fontinfo;
 for the scroll twice scheme */
tern Rect last_two_rect;

atic RgnHandle dummyRgn;

atic have_scrolled = 0; /* have we already scrolled for a LINEFEED? */
tern int more_to_scroll; /* how many more linefeeds to scroll? */
tern short   dumb;
 do_function(): execute the given function */
_function ( n )
t n;


      short   rvalue;

      rvalue = 0;  /* zero means we recognized the function
      * -1 means we didn't */
lush_line();
nit_line_buff();
      GetPen ( &penloc );
      switch ( n & 0xFF )
          {
               case LINEFEED:
                   {
 /* this business of have_scrolled
  * was done to speed up the Terminal Emulator
  * basically, if possible, we scroll multiple lines
  * at a time */
         if ((have_scrolled <= 0) && more_to_scroll)
     {
  int num_sc;
  int num_scrolls;
    /* if on bottom line */
            if ( echoline >= bottom_margin - lineheight )
      {
    if (more_to_scroll >= MAXSCROLLS)
       num_scrolls = MAXSCROLLS;
    else
```

```
     num_scrolls = more_to_scroll;
  num_sc = num_scrolls;
  vd_num_scr_up( num_sc );
  multi_scroll( num_scrolls );
  more_to_scroll -= num_scrolls;
  have_scrolled = num_scrolls - 1;
     } /* if on bottom */
else
    {
 more_to_scroll--;
        line_feed();
    }
    } /* if (!have_scrolled  && more_to_scroll) */
else
        if ( echoline >= bottom_margin - lineheight )
        {
     line_feed();
     vid_scroll_up();
 }
    else
        {
         have_scrolled--;
                echoline += lineheight;
                Move ( 0, lineheight );
        }
                    break;
                }
            case RETURN:
                {
carriage_return();
                    break;
                }
            case TAB:
                {
tab_key();
                    break;
                }
            case LEFT_CURSOR:
                {
left_cursor();
                    break;
                }
            case RIGHT_CURSOR:
                {
right_cursor();
                    break;
                }
            case UP_CURSOR:
                {
up_cursor();
                    break;
                }
            case DOWN_CURSOR:
                {
down_cursor();
                    break;
                }
            case HOME_CURSOR:
                {
home_cursor();
                    break;
                }
            case MOVE_CURSOR:
                {
moveto_cursor();
                    break;
                }
            case EOL_CLEAR:
                {
```

```
char_pos charloc;
int redo_line;

get_char_position( &penloc, &charloc, &screen_rect );
redo_line = vid_eol_clear( &charloc );
eol_clear();
if (redo_line == REDO_LINE)
    redo_eolc( &charloc );
                        break;
                    }
                case CLEAR_LINE:
                    {
short line;

get_line( &penloc, &line, &screen_rect );
vid_clearline( line );
clear_line();
                        break;
                    }
                case CLEAR_SCREEN:
                    {
vd_clear_screen();
clear_screen();
                        break;
                    }
                case CHAR_INSERT:
                    {
char_pos charloc;

get_char_position( &penloc, &charloc, &screen_rect );
insert_att( &charloc, NORMAL_VIDEO );
char_insert();
                        break;
                    }
                case CHAR_DELETE:
                    {
char_pos charloc;
DEL_EFF redo_line;

get_char_position( &penloc, &charloc, &screen_rect );
delete_att( &charloc, &redo_line );
char_delete( &charloc, &redo_line );
                        break;
                    }
                case LINE_INSERT:
                    {
short line;

get_line( &penloc, &line, &screen_rect );
vid_insert_line( line );
line_insert();
                        break;
                    }
                case LINE_DELETE:
                    {
short line;

get_line( &penloc, &line, &screen_rect );
vid_delete_line( line );
line_delete();
                        break;
                    }
                case BELL:
                    {
                        SysBeep ( 1 );
                        break;
                    }
                case ESCAPE:
```

```
                        {
 escape();
                            break;
                        }

                case USER_DISPLAY:
                        {
 user_display();
                            break;
                        }
                case USER_BLANK:
    {
 user_blank();
                            break;
                        }
                case USER_LOAD:
                        {
 set_user1();
                            break;
                        }
case CLEAR_TO_END:
    {
 int update_value;
 char_pos charloc;

 get_char_position( &penloc, &charloc, &screen_rect );
 update_value = vd_eos_clear( &charloc );
 clear_to_end();
 break;
     }
case REVERSE_LF:
    {
 /* if top line */
     if ( echoline <= TOPMARGIN + lineheight )
     vid_scroll_down();
 reverse_linefeed();
 break;
    }
case VID_REVERSE:
    {
 video_reverse();
 break;
    }
case VID_NORMAL:
    {
 video_normal();
 break;
    }

                case SET_TAB:
                        {
                            break;
                        }
                case NULL_FUNC:
                        {
                            break;
                        }
fndef optionmenu
case LOAD_FILE:
    {
 read_file();
 break;
    }
ndif optionmenu
case MPRINTF:
    {
 mprintf();
 break;
    }
```

```
:ase MACBUFF:
     {
 macbuff();
 break;
     }
:ase MACFLUSH:
     {
 macflush();
 break;
     }
:ase ZTOP_THERE:
     {
 ztop_up();
 break;
     }
:ase ZTOP_N_THERE:
     {
 ztop_not_up();
 break;
     }
:ase CTL_ECHO:
     {
 ctl_echo();
 break;
     }
                default:
                     {
         unsigned int nv;

 nv = n;
                         print_string ( "Unknown function: " );     /* DEBUG */
                         putnhex ( nv, 2 );        /* DEBUG */
                         rvalue = -1;
                         break;
                     }
          }
       GetPen ( &penloc );
       move_cursor ( &penloc );
       return ( rvalue );
/* do_function()  */
   initialize dummy region to be used in calls to ScrollRect */
  it_dummyRgn()

    dummyRgn = NewRgn();
 function: do a line feed */
ne_feed()

  if ( echoline < bottom_margin - lineheight )
       {
            echoline += lineheight;
            Move ( 0, lineheight );
       }
  else
       {
            ScrollRect ( &screen_rect, 0, -lineheight,
                                   (RgnHandle) dummyRgn );
            EraseRect ( &lastline_rect );
       }
/* line_feed() */
 do a carriage return */
rriage_return()

  if (!user_load)
       MoveTo ( LEFTMARGIN, echoline );
  else
       {
fdef user_debug
f (trace)
   errprintf("got a RETURN in user load");
ndif
```

```
        reset_user1();
    SetPort( &main_wrec.port );
        }
/* return() */
 do a tab */
b_key()

    short i;
    short column; /* current column */
    short tab;  /* tab location */

    column = ( penloc.h - LEFTMARGIN ) / charwidth;
    i = 0;
    while ( tab = tabs[i++] )
        {
            if ( column < tab )
                {
                    MoveTo ( LEFTMARGIN +
                            (charwidth * tab), echoline );
                    break;
                }
        }
/* tab() */
 move the cursor left one position */
ft_cursor()

    if ( ( penloc.h - charwidth ) >= LEFTMARGIN )
        {
            Move ( -charwidth, 0 );
        }
/* left_cursor() */
 move the cursor to the right one character position, unless the cursor
 is up against the right margin */
ght_cursor()

    if ( ( penloc.h + charwidth ) <= right_margin )
        {
            Move ( charwidth, 0 );
        }
/* right_cursor() */
 move the cusor down 1 line in the same column */
wn_cursor ()

    if ( ( penloc.v + lineheight ) <= bottom_margin )
        {
            Move ( 0, lineheight );
            echoline += lineheight;
        }
/* down_cursor() */
 move the cursor up one column in the same line */
_cursor()

  if (.( penloc.v - lineheight ) >= topline )
      {
          Move ( 0, -lineheight );
          echoline -= lineheight;
      }
/* up_cursor() */
 home_cursor(): move the cursor to "home" position (the upper left-hand
 corner on a Qume.
/
me_cursor()

oveTo ( LEFTMARGIN, topline );
choline = topline;
 move_cursor(): move the cursor to the specified coordinates */
veto_cursor()

 = ( ( esc_string[1] - ' ' ) * lineheight )
```

```
                                        + topline;
    x = ( ( esc_string[2] - ' ' ) * charwidth )
                                        + LEFTMARGIN;

f ( ((x >= LEFTMARGIN) && (x <= right_margin)) &&
    ((y >= topline) && (y <= bottom_margin)) )
   {
              MoveTo ( x, y );
              echoline = y;
   }
/* moveto_cursor() */
 eol_clear(): clear from cursor position to end of line */
l_clear()

      Rect    tmp_rect;

etRect ( &tmp_rect, penloc.h,
                          penloc.v - fontinfo.ascent,
                            right_margin,
                            penloc.v + fontinfo.descent );
raseRect ( &tmp_rect );
 clear_line(): clear the line */
ear_line()

      Rect    tmp_rect;

etRect ( &tmp_rect, LEFTMARGIN,
                            penloc.v - fontinfo.ascent,
                            right_margin,
                            penloc.v + fontinfo.descent );
raseRect ( &tmp_rect );
 clear_screen(): clear the screen */
ear_screen()

raseRect ( &screen_rect );
oveTo ( LEFTMARGIN, topline );
choline = topline;


 char_insert(): make room for a character where the cursor is */
ar_insert()

      Rect    tmp_rect;

etRect ( &tmp_rect, penloc.h,
                            penloc.v - fontinfo.ascent,
      /* a bug, why it was done this way, I don't
       * know.
                            right_margin - charwidth,
      */
      right_margin,
                            penloc.v + fontinfo.descent );
crollRect ( &tmp_rect, charwidth, 0, (RgnHandle) dummyRgn );
etRect ( &tmp_rect, penloc.h,
                            penloc.v - fontinfo.ascent,
                            penloc.h + fontinfo.widMax,
                            penloc.v + fontinfo.descent );
raseRect ( &tmp_rect );
/* char_insert() */
 char_delete(): delete the current character by moving the chars to
 the right left one character position */
ar_delete( charloc, redo_line )
ar_pos *charloc;
L_PTR redo_line;

      Rect    tmp_rect;
har_pos last_charloc;
hort last_attribute, lookup_att();
```

```
       SetRect ( &tmp_rect, penloc.h,
                               penloc.v - fontinfo.ascent,
                                right_margin,
                                penloc.v + fontinfo.descent );
       ScrollRect ( &tmp_rect, -charwidth, 0, (RgnHandle) dummyRgn );

 * check if last char isn't just a normal video white space,
 * and if so, then invert it if it's an inverse video one */
ast_charloc.line = charloc->line;
ast_charloc.column = MAXCOLUMNS-1;
ast_attribute = lookup_att( &last_charloc );
fdef delete_debug
ugout(BUG1, "the last_attribute is %d", last_attribute);
ndif
f (last_attribute == REVERSE_HL)
   {
SetRect( &tmp_rect, right_margin - charwidth,
       penloc.v - fontinfo.ascent,
       right_margin,
       penloc.v + fontinfo.descent );
InvertRect( &tmp_rect );
   }
f (redo_line->redo)
   {
int aff_chars; /* the actual chars which will have to change */
short aff_attrib;

/* if affected field stretches to end */
if ( charloc->column + redo_line->affected_chars
     == MAXCOLUMNS )
     redo_line->affected_chars--;

        SetRect( &tmp_rect, penloc.h,
        penloc.v - fontinfo.ascent,
           penloc.h + ( redo_line->affected_chars
      * charwidth),
           penloc.v + fontinfo.descent );
aff_attrib = lookup_att( charloc );
fdef delete_debug
bugout(BUG1, "in char_delete(), aff_attrib is %d", aff_attrib);
ndif
if (aff_attrib == REVERSE_HL || aff_attrib == NORMAL_VIDEO)
     InvertRect( &tmp_rect );
           } /* if (redo_line->redo) */
/* char_delete() */
 line_insert(): insert a blank line at the cursor position; scroll
 data on the cursor's line and below downward */
ne_insert()

       Rect tmp_rect;

       SetRect ( &tmp_rect, LEFTMARGIN,
                               penloc.v - fontinfo.ascent,
                               right_margin,
                               bottom_margin - lineheight );
       ScrollRect ( &tmp_rect, 0, lineheight, (RgnHandle) dummyRgn );
       tmp_rect.bottom = penloc.v + fontinfo.descent;
       EraseRect ( &tmp_rect );
/* line_insert() */
 line_delete(): delete a line */
ne_delete()

       Rect tmp_rect;

       SetRect ( &tmp_rect, LEFTMARGIN,
       penloc.v - fontinfo.ascent,
       right_margin,
       bottom_margin );
crollRect ( &tmp_rect, 0, -lineheight, (RgnHandle) dummyRgn );
raseRect ( &lastline_rect );
/* line_delete() */
```

```
 do a reverse linefeed */
verse_linefeed()

   if ( echoline > TOPMARGIN + lineheight )
       {
            echoline -= lineheight;
            Move ( 0, -lineheight );
       }
   else
       {
            ScrollRect ( &screen_rect, 0, lineheight,
                                      (RgnHandle) dummyRgn );
            EraseRect ( &firstline_rect );
       }
/* reverse_linefeed() */
 video_reverse(): start an embedded inverse video field */
deo_reverse()

   char_pos charloc;
   Rect    tmp_rect;
   int numchars;
   int already_affected;

   get_char_position( &penloc, &charloc, &screen_rect );
   already_affected = put_embedded( &charloc, ST_REVERSE_VIDEO );
   if (!already_affected)
       {
    numchars = affected_chars( &charloc );
fdef video_debug
          bugout(BUG3, "video_reverse(), numchars (affected) %d", numchars);
ndif video_debug

            /* highlight the reverse video field */
            SetRect ( &tmp_rect, penloc.h,
                                   penloc.v - fontinfo.ascent,
            penloc.h + ((numchars + 1) * charwidth),
                                   penloc.v + fontinfo.descent );
            InvertRect ( &tmp_rect );
 }
   /* draw the screen representation of start of inverse video */
   print_scr_rep( ST_REVERSE_VIDEO );

/* video_reverse() */
 video_normal(): start an embedded normal video field */
deo_normal()

    char_pos charloc;
    Rect    tmp_rect;
nt numchars;
nt already_affected;

    get_char_position( &penloc, &charloc, &screen_rect );
    already_affected = put_embedded( &charloc, END_REVERSE_VIDEO );
f (!already_affected)
   {
       numchars = affected_chars( &charloc );

             /* un-highlight the normal video field */
             SetRect ( &tmp_rect, penloc.h,
                                   penloc.v - fontinfo.ascent,
               penloc.h + ((numchars + 1) * charwidth),
                                   penloc.v + fontinfo.descent );
             InvertRect ( &tmp_rect );
    }
* draw the screen representation of normal video embedded
* attribute */
      print_scr_rep( END_REVERSE_VIDEO );
/* video_normal() */
```

```
normal_field(): make a normal video field from given position to next
embedded attribute, or end of line, whichever comes first.

Parameters:
charloc  (char_pos *) character position in the attribute
     data struture.
adjustchars short  number of chars to adjust the highlight-
     ing from the current pen location.
Discussion:
Put the NORMAL_VIDEO attribute into the attribute structure with
put_embedded() to change to NORMAL_VIDEO any non-embedded attributes
further along on the line, even though NORMAL_VIDEO isn't an
"embedded" attribute (put_embedded will treat it as though it is
embedded.  Highlight the appropriate characters, if any.
/
rmal_field( charloc, adjustchars )
ar_pos *charloc;
ort adjustchars;

nt numchars;
nt already_affected;
ect tmp_rect;

     already_affected = put_embedded( charloc, NORMAL_VIDEO );
f (!already_affected)
   {
       numchars = affected_chars( charloc );

if (numchars == 0)
    return;
            /* un-highlight the normal video field */
            SetRect ( &tmp_rect, penloc.h + adjustchars,
                                   penloc.v - fontinfo.ascent,
              penloc.h + ((numchars + 1 + adjustchars)
      * charwidth),
                                   penloc.v + fontinfo.descent );
            InvertRect ( &tmp_rect );
   }
* don't have to deal with the attribute here */
/* normal_field() */
Procedure: reverse_field

Function:
  Make a reverse video field from given position to next
  embedded attribute, or end of line, whichever comes first.


Parameters:
charloc  (char_pos *)    position of the new attribute in
    the attribute structure.
adjustchars short  how many char positions to move the
    highlighted field beyond the pen
    location.

Return Values:
None

Discussion:
Put the REVERSE_HL attribute into the attribute structure with
put_embedded() to change to REVERSE_HL any non-embedded attributes
further along on the line, even though REVERSE_HL isn't strictly an
"embedded" attribute (put_embedded() will handle it as though it was).
* Highlight .ne

Imports modified:
None
/
reverse_field(): start an embedded reverse video field */
verse_field( charloc, adjustchars )
```

```
ar_pos *charloc;
ort adjustchars;

    int numchars;
    int already_affected;
    Rect tmp_rect;

    already_affected = put_embedded( charloc, REVERSE_HL );
    if (!already_affected)
        {
     numchars = affected_chars( charloc );
fdef video_debug
          bugout(BUG3, "video_reverse(), numchars (affected) %d", numchars);
ndif video_debug

     if (numchars == 0)
 return;
             /* highlight the reverse video field */
             SetRect ( &tmp_rect, penloc.h + adjustchars,
                                     penloc.v - fontinfo.ascent,
             penloc.h + ((numchars + 1 + adjustchars)
          * charwidth),
                                     penloc.v + fontinfo.descent );
             InvertRect ( &tmp_rect );
/* reverse_field() */
 clear_to_end(): clear the page from the cursor position to the end of
 the page */
ear_to_end()

ect tmp_rect;

* clear line cursor sits on */
etRect( &tmp_rect, penloc.h,
     penloc.v - fontinfo.ascent,
     right_margin,
     penloc.v + fontinfo.descent );
raseRect( &tmp_rect );
* clear rest of lines to end of page */
etRect( &tmp_rect, LEFTMARGIN,
     penloc.v + fontinfo.descent,
     right_margin,
     bottom_margin );
raseRect( &tmp_rect );
/* clear_to_end() */
 multi_scroll(): scroll the screen the given number of lines */
lti_scroll( lines )
t lines;

ect tmp_rect;

* bullet proofing */
f ( lines > MAXSCROLLS )
   lines = MAXSCROLLS;
f ( lines < 0 )
   lines = 1;
crollRect ( &screen_rect, 0, -( lines * lineheight),
                                (RgnHandle) dummyRgn );
*
ugout(BUG2, " just scrolled multi lines, a distance of %d",
    -lines * lineheight);
/
      SetRect ( &tmp_rect, screen_rect.left,
                           screen_rect.bottom - (lines * lineheight),
                           screen_rect.right,
                           screen_rect.bottom );
raseRect ( &tmp_rect );

* put the cursor up on the FIRST of the multiple lines we scrolled,
* as it will start writing there */
```

```
      echoline = echoline - (lineheight * (lines - 1));
      Move ( 0, -(lineheight * (lines - 1)) );

 redo_eolc(): redo line after an end-of-line clear function. Basically,
 check to see if there is a highlight attribute after the given character
 location, and if so, then highlight the rest of the line with that
 attribute */
do_eolc( charloc )
ar_pos *charloc;

      Rect    tmp_rect;
hort lookup_att();

fdef eolc_debug
rrprintf('in redo_eolc(), attribute is %d', lookup_att( charloc ));
ndif

* does the char location have a inverse video attribute? */
   if (lookup_att( charloc ) == REVERSE_HL)
   {
    SetRect ( &tmp_rect, penloc.h,
                              penloc.v - fontinfo.ascent,
                                right_margin,
                                  penloc.v + fontinfo.descent );
InvertRect ( &tmp_rect );
   }
/* redo_eolc() */
 Procedure: draw_normal_text

 Function: draw characters in the current window, at current pen location,
  without any highlighting.


 Parameters:
  region   (RgnHandle) - place to save the current region.
  first_char  (short)  - place to start in the string.
  num_chars (short) - number of chars to print.
  string  (char *) - character string to print from.

 Return Values:
 None

 Discussion:  Save the current region.  Set the Clip region to enclose just
  the characters to be written.  Draw the characters and restore
  the old region.




 Imports modified:
 region (RgnHandle).  See Discussion.
*/
aw_normal_text( region, first_char, num_chars, char_buffer )
nHandle region;
ort first_char;
gister short num_chars;
ar *char_buffer;

ect chars_rect;

       GetClip( region );
       SetRect( &chars_rect, penloc.h,
           penloc.v - fontinfo.ascent,
        penloc.h + ( charwidth *
        num_chars ),
        penloc.v + fontinfo.descent);
       ClipRect( &chars_rect );
       DrawText( char_buffer, first_char, num_chars );
       SetClip( region );
/* draw_normal_text() */
```

```
   Module MENU.c     */
 This module contains the function do_menu(), the menu handler for
 terminal emulator mode */

nclude        <mac/quickdraw.h>
nclude        <mac/osintf.h>
nclude        <mac/toolintf.h>

nclude        <ctype.h>

nclude        "terminal.h"
nclude <ddw.h>

tern short which_loop;  /* which mode (event loop) are we in? */

atic char *proto_com[] =
  {
\0335x", /* Load */
\0336x", /* Insert */
\0337x", /* Replace */
\0334x", /* Create */
  };

tern char *keys[];

efine PROTOLOAD 0
efine PROTOINSERT 1
efine PROTOREPLACE 2
efine PROTOCREATE 3

tern MenuHandle      menus[MAXMENUS];

 set to 1 if XON/XOFF handshaking is enabled */
ort handshake = 0;

tern GrafPtr  deskptr;
tern Rect armrect;
tern short auto_display; /* 1 = Auto Display toggle is on, 0 = toggle off */
tern LASetup setup_values; /* structure to hold setup values for Logic
       * Analyzer */
tern short logic_enabled; /* 1 = logic analyzer enabled, 0 = not enabled */
tern char  proto_name[11];

 command to ztop for the remote login lock function */
efine LOCKSEQ  "x"
 command to ztop to unlock the remote login lock function */
efine UNLOCKSEQ "x"

tern Rect    screen_rect;  /* writeable portion of the main window */
ort   echoline;
ort   topline;
int   penloc;  /* pen location in the main window */
tern short   curse_state;   /* 1 if cursor on (black), 0 if it's off */

tern short   dumb;       /* used for dumb terminal debugging */
   /* 1 means act as a dumb terminal, 0 means don't */
ort  trace = 0; /* used for debugging, to turn on debug messages */
ndif
 do_menu handles menu processing.  It sees which menu item was selected,
 and performs the associated command.
/
_menu ( menustuff )
t     menustuff;


      int      menu_number, menu_item;
nt err;
har name[256];
har *fudge();
indowPtr wptr;
rafPtr saveport;
```

```
      menu_number = HiWord ( menustuff );
      menu_item = LoWord ( menustuff );

      switch ( menu_number )
          {
case APPLE:
    {
 GrafPtr saveport;

 save_te_windows();
 GetItem(menus[DESKMENU], menu_item, name);
 GetPort( &saveport );
 (void) OpenDeskAcc(fudge(name));
 SetPort( saveport );
    };  /* menu APPLE */
    break;

/* menu OPTIONS */
fdef optionmenu
              case OPTIONS:
                  {
                      switch ( menu_item )
                          {
                              case CLEAR:
                                  {
                                      EraseRect ( &screen_rect );
                                      echoline = topline;
                                      MoveTo ( LEFTMARGIN, echoline );
   GetPen ( &penloc );
   move_cursor ( &penloc );
   curse_state = OFF;
                                      break;
                                  }
                              case PLAYDUMB:
                                  {
                                      dumb = !dumb;
   CheckItem ( menus[OPTIONS_INDEX],
       2, dumb );
                                      break;
                                  }
  case PRINT_TRACE:
    {
 trace = !trace;
 CheckItem ( menus[OPTIONS_INDEX],
     3, trace );
 break;
    }
case FREE_MEM:
    {
 int grow;
 (void) MaxMem( &grow );
 errprintf("Free memory is %d", grow);
        break;
    }
case HIDE_WINDOWS:
    {
 hide_windows();
 break;
    }
case SHOW_WINDOWS:
    {
 show_windows();
 break;
    }
case DISABLE_MENUS:
    {
 disable_menus();
 break;
    }
```

```
case ENABLE_MENUS:
    {
    enable_menus();
    break;
    }

                    }
                break;
            } /* menu OPTIONS */
        case BAUD:
            {
                set_baud ( menu_item - 1 );
                break;
            } /* menu BAUD */
ndif optionmenu
fndef optionmenu
case PROTOCOL:
    {
    switch ( menu_item )
        {
        case NEW:
            {
            (void) New_waves();
            break;
            }
        case LOAD:
            {
            load_protocol();
            break;
            }
        case INSERT:
            {
            if ( maxwavelen() == 0 )
                {
                aprintf ( "No waveforms" );
                }
            else if ( ( err = wave_to_proto() )
                == -1 )
                {
                which_loop = WAVEDIT;
                }
            else if ( err == 0 )
                {
                putstr(proto_com[PROTOINSERT]);
                send_proto();
                }
            break;
            }
        case REPLACE:
            {
            if ( maxwavelen() == 0 )
                {
                aprintf ( "No waveforms" );
                }
            else if ( ( err = wave_to_proto() )
                == -1 )
                {
                which_loop = WAVEDIT;
                }
            else if ( err == 0 )
                {
                putstr(proto_com[PROTOREPLACE]);
                send_proto();
                }
            break;
            }
        case NAME:
            {
            if ( fetch_text ( "Protocol Name",
                proto_name ) == OK )
                {
```

```
      }
   break;
      }
     }
 break;
    }
ndif

case FUNCTION:
   {
      switch ( menu_item )
    {
      case CANCEL:
     {
    putstr(keys[ CANCEL_INDEX ]);

     break;
}
   case START:
{
    putstr(keys[ START_INDEX ]);

     break;
}
   case HOLD:
{
    putstr(keys[ HOLD_INDEX ]);

     break;
}
   case REPEAT:
{
    putstr(keys[ REPEAT_INDEX ]);

     break;
}
   case CRT:
{
    putstr(keys[ CRT_INDEX ]);

     break;
}
   case REP_PAGE:
{
    putstr(keys[ RP_PAGE_INDEX ]);

     break;
}
   case BREAK:
{
    putstr(keys[ BREAK_INDEX ]);

     break;
}
   case CHR_INSERT:
{
    putstr(keys[ CHR_INSERT_INDEX ]);

     break;
}
   case CHR_DELETE:
{
    putstr(keys[ CHR_DELETE_INDEX ]);

     break;
}
   case LN_INSERT:
{
    putstr(keys[ LN_INSERT_INDEX ]);
```

```
          break;
        }
          case LN_DELETE:
        {
           putstr(keys[ LN_DELETE_INDEX ]);

            break;
        }
          case PAGE_ERASE:
        {
           putstr(keys[ PAGE_ERASE_INDEX ]);

            break;
        }
    } /* switch */
        break;
      } /* case FUNCTION */

   case MOVEMENT:
        {
     switch ( menu_item )
          {
          case UP:
        {
           putstr(keys[ UP_INDEX ]);

            break;
        }
          case DOWN:
        {
           putstr(keys[ DOWN_INDEX ]);

            break;
        }
          case LEFT:
        {
           putstr(keys[ LEFT_INDEX ]);

            break;
        }
          case RIGHT:
        {
           putstr(keys[ RIGHT_INDEX ]);

            break;
        }
          case HOME:
        {
           putstr(keys[ HOME_INDEX ]);

            break;
        }
          case END:
        {
           putstr(keys[ END_INDEX ]);
            break;
        }
          case NEXT_PAGE:
        {
           putstr(keys[ NXT_PAGE_INDEX ]);

            break;
        }
          case PREVIOUS_PAGE:
        {
           putstr(keys[ PREV_PAGE_INDEX ]);

            break;
        }
```

```
      } /* switch menu_item */
  break;
     }  /* menu MOVES */
fndef optionmenu
case CONTROLS:
     {
 switch ( menu_item )
      {
  /* to be replaced by XON/XOFF setting
  case TERMSETUP:
      {
   save_te_windows();
   TEsetup( &te_setup );
   break;
      }
  */
  case HANDSHAKE:
      {
   if (handshake)
       {
    CheckItem ( menus[CONTROLMENU],
     HANDSHAKE, FALSE );
    handshake = 0;
       }
   else
       {
    CheckItem ( menus[CONTROLMENU],
     HANDSHAKE, TRUE );
    handshake = 1;
       }
   break;
      }
  case LOGICSETUP:
      {
   save_te_windows();
   LAsetup ( &setup_values );
   break;
      }
  case LOGICDISPLAY:
      {
   save_te_windows();
   LAdisplay();
   break;
      }
  case LOADFILE:
      {
   load_file();
   break;
      }

  case AUTODISPLAY:
      {
   if ( auto_display )
       {
    auto_display = 0;
    CheckItem ( menus[CONTROLMENU],
     AUTODISPLAY, FALSE );
       }
  .else
      {
    auto_display = 1;
    CheckItem ( menus[CONTROLMENU],
     AUTODISPLAY, TRUE );
      }
   break;
      }
  case LOGICENABLE:
      {
   if ( logic_enabled )
```

```
    {
  logic_enabled = 0;
  CheckItem( menus[CONTROLMENU],
             LOGICENABLE, FALSE);
  ShowCursor();
  GetPort ( &saveport );
  SetPort ( deskptr );
  EraseRect ( &armrect );
  SetPort ( saveport );
    }
 else
    {
  start_la();
  logic_enabled++;
  CheckItem( menus[CONTROLMENU],
             LOGICENABLE, TRUE );
  GetPort ( &saveport );
  SetPort ( deskptr );
  TextFont ( systemFont );
  TextSize ( 12 );
  TextMode ( srcXor );
  TextFace ( shadowStyle );
  MoveTo ( 490, 14 );
  DrawChar ( 'L' );
  TextMode ( srcOr );
  TextFace ( 0 );
  SetPort ( saveport );
    }
 break;
     }
fdef tespeed
  case XOFF_300:
     {
   xoff_level = 300;
   break;
     }
  case XOFF_2000:
     {
   xoff_level = 2000;
   break;
     }
ndif tespeed
     }
 break;
    } /* menu CONTROLS */
ndif
case MODE:
    {
 switch ( menu_item )
    {

  case COMMAND:
     {
        putstr(keys[COMMAND_INDEX]);

         break;
     }

  case DEVELOP:
     {
        putstr(keys[DEVELOP_INDEX]);

         break;
     }

  case OPERATE:
     {
         putstr(keys[OPERATE_INDEX]);
          break;
     }
```

```
case DUMB:
{
dumb = !dumb;
CheckItem ( menus[MODEMENU],
    DUMB, dumb );
break;
}

} /* switch ( menuitem ) */
break;
   } /* case MODE */
case DDW:
   {
switch( menu_item )
    {
 case TERMINAL:
    {
  which_loop = TERMINAL;
  break;
    }
 case WAVEDIT:
    {
  which_loop = WAVEDIT;
  break;
    }
 case DATAEDIT:
    {
  which_loop = DATAEDIT;
  break;
    }
 case LOGIC:
    {
  which_loop = LOGIC;
  break;
    }
 case QUIT:
    {
  quit();
  break;
    }
   }
break;
   } /* case DDW menu */
default:
   {
break;
   }

          }
      HiliteMenu ( 0 );
/* do_menu() */
    Terminal Emulator Program for the Macintosh      */

Note: a convention is used to keep track of which functions
are Mac ROM functions, and which are 'application' functions
(written by someone here at Zehntel).  The Mac ROM functions use capitals
in the names -- we used lower-case and underscores.

For instance, a Mac ROM function is 'FSRead()'.  One of our functions
is 'init_globals()'.
/

nclude        <mac/quickdraw.h>
nclude        <mac/osintf.h>
nclude        <mac/toolintf.h>

nclude        <ctype.h>
```

```
nclude "global.h"
nclude         "terminal.h"
nclude <ddw.h>


efine MAXTABS          20

 CURSEBLINK defines the tick interval between cursor blinks (off to on
 or on to off). */
efine CURSEBLINK       30

 the sequence to send to the tester when we want to load a file
 of waveforms from the tester */
efine LOADSEQ  "x"

ndowPtr        window;

 Main window */
tern WindowRecord main_wrec; /* main window record */
tern WindowPtr main_wptr; /* main window pointer */

 userline window */
tern WindowRecord user_wrec; /* user window record */
tern WindowPtr user_wptr; /* user window pointer */

entRecord      event;

tern int (*New_waves)();

tern OpParamType     *status_A;
tern char  file_name[];

tern GrafPtr  deskptr;
tern Handle  proto_handle;
tern short  proto_length;
tern char  proto_name[11];
tern int  logic_time;
tern short  waiting; /* 1 = waiting for file */
tern int  wait_time; /* time that request was posted */

tern Rect armrect;
tern Rect    screen_rect;  /* writeable portion of the main window */
ct    lastline_rect; /* rectangle enclosing the last line of main window */
ct firstline_rect; /* rectangle enclosing first line of main window */
ct    char_rect;     /* rectangle which is big enough to enclose a char */
tern Rect    curse_rect;    /* cursor rectangle */
tern short   curse_state;   /* 1 if cursor on (black), 0 if it's off */
tern short   curse_enable;  /* terminal cursor; OFF if cursor is
        * off (invisible), ON if it's on (black) */

int   penloc;  /* pen location in the main window */

sType ctls_rsrc = { 'CTLS' };
sType escs_rsrc = { 'ESCS' };
sType typeDRVR = { 'DRVR' };

pedef FontRec          *FontPtr;
pedef FontPtr          *FontHandle;

ntInfo         fontinfo; /* fontinfo for the main window */

c_struct       *escapes;  /* pointer to the structure which will hold
     * the escape sequences the terminal recognizes */
ar             *esc_seqs; /* a pointer to point at the strings containing
     * the escape sequences */

ar    ctrls[32] =
  {
```

```
        NULL_FUNC,              /* 00 */
        CTL_ECHO,               /* 01 */
        CTL_ECHO,               /* 02 */
        CTL_ECHO,               /* 03 */
        CTL_ECHO,               /* 04 */
        CTL_ECHO,               /* 05 */
        CTL_ECHO,               /* 06 */
        BELL,                   /* 07   Bell */
        LEFT_CURSOR,            /* 08   Backspace */
        TAB,                    /* 09   Tab */
        LINEFEED,               /* 0A   Line Feed */
        CTL_ECHO,               /* 0B */
        CTL_ECHO,               /* 0C */
        RETURN,                 /* 0D   Carriage Return */
        CTL_ECHO,               /* 0E */
        CTL_ECHO,               /* 0F */
        CTL_ECHO,               /* 10 */
        CTL_ECHO,               /* 11 */
        CTL_ECHO,               /* 12 */
        CTL_ECHO,               /* 13 */
        CTL_ECHO,               /* 14 */
        CTL_ECHO,               /* 15 */
        CTL_ECHO,               /* 16 */
        CTL_ECHO,               /* 17 */
        CTL_ECHO,               /* 18 */
        CTL_ECHO,               /* 19 */
        CTL_ECHO,               /* 1A */
        ESCAPE,                 /* 1B   Escape */
        CTL_ECHO,               /* 1C */
        CTL_ECHO,               /* 1D */
        CTL_ECHO,               /* 1E */
        CTL_ECHO                /* 1F */
    };

ort   tabs[MAXTABS] = { 8, 16, 24, 32, 40, 48, 56, 64, 72 };

ort   x, y;
tern short   dumb;      /* used for dumb terminal debugging */
   /* 1 means act as a dumb terminal, 0 means don't */
ar    *buffer;

ar    *seq_ptr;

t     buff_count;
t     curse_time; /* last time (in ticks) the cursor was blinked */

ort   curse_count;
ort   nextin, nextout;
ort   topline;
ort   echoline;
ort   linelength;
ort   maxbufcnt;
tern short   baud;

ort   charwidth;  /* width of a character in the main window */
ort   lineheight; /* height of a line in the main window */
ort   right_margin; /* rightmost margin of the writeable area of the
       * main window */
ort   bottom_margin; /* the bottom most margin of the writeable area of
  * the main window */
ort   max_escapes;
ar    esc_string[10];

tern short user_load; /* are characters being written to the user line
   * window? 1 if yes, 0 otherwise */

efine BACK_TICK '\140'

fdef io_out_debug
tern char debug_buff[];
ndif
```

```
ar *keys[] =
    {
 "@\r",   /* command key */
 "A\r", /* develop key */
 "B\r", /* operate key */
 "F\r",   /* Cancel */
 "G\r", /* Start  */
 "C\r", /* Hold   */
 "D\r", /* Repeat */
 "E\r", /* CRT    */
 "I\r", /* Rep Page */
 "\177", /* Break */
 /* added these last four to test them */
 "\033Q", /* char insert */
 "\033W", /* char delete */
 "\033E", /* line insert */
 "\033R", /* line delete */
 "\033Y", /* page erase */
 "



   /* Cursor Up */
 "",  /* Cursor Down */
 "",  /* Cursor Left */
 "

   /* Cursor Right */
 "",  /* Home */
 "J\r", /* End */
 "J\r", /* Next Page */
 "



  /* Previous Page */
 "\012",   /* line feed */
 "",  /* control-<clear space> */
 "\033x"  /* control-shift-<clear space> */
    };


ar *proto_com[] =
  {
\0335x", /* Load *
\0336x", /* Insert *
\0337x", /* Replace *
\0334x", /* Create *
  };


 for user line window */
tern FontInfo        user_fontinfo; /* font info for the user line window */

tern MenuHandle      menus[MAXMENUS];
tern struct QDVar QDVar;
tern short which_loop;  /* which mode (event loop) are we in? */
tern short logic_enabled; /* 1 = logic analyzer enabled, 0 = not enabled */
tern LASetup setup_values; /* structure to hold setup values for Logic
         * Analyzer */
tern short auto_display; /* 1 = Auto Display toggle is on, 0 = toggle off */
tern TESetup te_setup;

efine DEACTIVATE 0x01
tern BitMap main_bitmap; /* for holding the bitmap of the main window */
tern BitMap user_bitmap; /* for holding the bitmap of the user window */

 serial_io.c variables */
tern short inref;
tern short errnum;
```

```
 called_from tells us if we were called from the Finder or from DDW */
t called_from;
 this value is hopefully different from the garbage value in it */
efine FROM_DDW 0x1234567

tern GrafPtr  scratchport;

tern RgnHandle user_visrgn;  /* Handle to the visible region of the user line
    * window */
tern RgnHandle main_visrgn;  /* Handle to the visible region of the
   * main window */
atic int ztop_there = 0;
 1 = remote login lock function enabled, 0 = disabled */
ort lock_test;
 for testing the terminal's speed, this sets the level at which we "XOFF" */
ort xoff_level = 300;

 for trying the scroll 2 times at once scheme */
ct last_two_rect;


 set to 1 if XON/XOFF handshaking is enabled *
ort handshake = 0;


t more_to_scroll = 0; /* how many more linefeeds to scroll? */

atic int edi_up = NO;  /* is EDI or Develop mode running on tester? YES, if it
     * is, NO if not */
in( called_from )
t called_from; /* were we started up from the Finder or DDW? */


* resume() is the resume function to resume after a
* crash.
*/
   extern resume();
tatic short first_time = 1;
hort mode_change;

hich_loop = TERMINAL;
f (first_time)
   {
mode_change = FALSE;
first_time = 0;
QD = &QDVar;
if (called_from != FROM_DDW)
    {
        init_mac();
 InitCursor();
 init_te_menus();
 errprintf(" called init_mac()");
    }
fdef speed_debug
errprintf("the buffer size is %d", BUFSIZE);
ndif

init_te();
   }
lse
   mode_change = TRUE;

how_windows();
electWindow( main_wptr );
etPort( &main_wrec.port );
nable_menus();
isable_menus();
fdef cursor_debug
```

```
rrprintf("just before te_loop, curse_state is %d, curse_enable is %d",
 curse_state, curse_enable);
ndif
f ((mode_change == TRUE) && (ztop_there == 1))
   {
edi_up = is_edi_up();
if (edi_up == YES)
        redraw_screen();
   }
lse
   edi_up == NO;
e_loop();
 init_te() initializes the global variables specific to Terminal
 mode. */
it_te()


nit_main_window();
lushEvents(everyEvent,0);

* allocate a scratch port to write to */
cratchport = (GrafPtr) NewPtr ( sizeof ( GrafPort ) );
penPort ( scratchport );

etPort( &main_wrec.port );

      init_globals();
fdef cursor_debug
rrprintf("after init_globals curse_state is %d, curse_enable is %d",
  curse_state, curse_enable);
ndif
nit_win_out();

nit_userline();

howWindow( main_wptr );
electWindow( main_wptr);

      init_controls();
      init_escapes();
      init_io();
nit_bitmap( &main_bitmap, &screen_rect, main_wptr );
nit_bitmap( &user_bitmap, &user_wrec.port.portRect, user_wptr );
nit_video_tab();
nit_dummyRgn();
nit_line_buff();
      MoveTo ( LEFTMARGIN, TOPLINE );

      GetPen ( &penloc );
      move_cursor ( &penloc );
/* init_te() */

 code put in to experiment with having a "shift" key on the keypad */
fdef keypad_shift
atic short keypad_shift;
efine KEYPAD_SHIFT  0x47
ndif keypad_shift

atic int now;
atic int nextevent;
 te_loop() is the event loop for the Terminal Emulator
 It handles all the tasks which have to pe handled periodically
 including getting the Events from the event queue */
_loop()

     for ( ;; )
         {
fdef tespeed
```

```
ow = TickCount();
ndif tespeed
if (which_loop != TERMINAL)
    return;
            SystemTask();
            our_task();

fdef cursor_debug
put_tty('\015');
ndif
/* if waiting for a file, watch the clock so we can time out */

if ( waiting )
    {
 (void) ReadDateTime ( &now );
 if ( now >= wait_time +  READTIME )
     {
  aprintf("Tester did not acknowledge request.");
  waiting = 0;
  InitCursor();
     }
    }

nextevent = GetNextEvent ( everyEvent, &event );

* if waiting for a file, process only update events */

if ( nextevent && ( !waiting || event.what == updateEvt ) )
                    {
                        switch ( event.what )
                            {
                                case mouseDown:
                                    {
                                        mouse_service();
                                        break;
                                    }
                                case keyDown:
                                case autoKey:
                                    {
                                        key_service();
                                        break;
                                    }
                                case updateEvt:
                                    {
                                        update ( (WindowPtr) event.message );
                                 break;
        }
                                 default:
                                     {
                                         break;
                                     }
                            }
                    }
                if ( tty_service() < 0 )
                    {
                    };
          }
 /* te_loop() */

: atic short user_visible;
 hide_windows() hides the terminal emulator windows */
de_windows()

indowPtr wptr;

f (user_wrec.visible)
   user_visible = 1;
lse
   user_visible = 0;
```

```
* save bitmaps of main window and user line window */
ave_te_windows();
ideWindow( user_wptr );
ideWindow( main_wptr );
/* hide_windows() */
 show_windows shows the terminal emulator windows */
ow_windows()

f (user_visible)
   ShowWindow( user_wptr );
howWindow( main_wptr );
disable_menus() disables all the menu items which are not used by
the terminal emulator
/
sable_menus()

fndef optionmenu
isableItem( menus[EDITMENU], 0 );
isableItem( menus[DISPLAYMENU], 0 );
isableItem( menus[PROTOMENU], REVERT );
isableItem( menus[PROTOMENU], NEW );
ndif optionmenu
isableItem( menus[DDWMENU], PRINT );
rawMenuBar();
enable_menus() enables all the menu items which are only used by
the terminal emulator (and therefore wouldn't already be enabled).
/
able_menus()

nableItem ( menus[DDWMENU], 0 );
isableItem ( menus[DDWMENU], TERMINAL );
nableItem( menus[MODEMENU], 0 );
nableItem( menus[MODEMENU], COMMAND );
nableItem( menus[MODEMENU], DEVELOP );
nableItem( menus[MODEMENU], OPERATE );
nableItem( menus[MODEMENU], DUMB );
nableItem( menus[FUNCTIONMENU], 0 );
nableItem( menus[FUNCTIONMENU], CANCEL );
nableItem( menus[FUNCTIONMENU], START );
nableItem( menus[FUNCTIONMENU], HOLD );
nableItem( menus[FUNCTIONMENU], REPEAT );
nableItem( menus[FUNCTIONMENU], CRT );
nableItem( menus[FUNCTIONMENU], REP_PAGE );
nableItem( menus[FUNCTIONMENU], BREAK );
nableItem( menus[FUNCTIONMENU], CHR_INSERT );
nableItem( menus[FUNCTIONMENU], CHR_DELETE );
nableItem( menus[FUNCTIONMENU], LN_INSERT );
nableItem( menus[FUNCTIONMENU], LN_DELETE );
nableItem( menus[FUNCTIONMENU], PAGE_ERASE );
nableItem( menus[MOVEMENU], 0 );
nableItem( menus[MOVEMENU], UP );
nableItem( menus[MOVEMENU], DOWN );
nableItem( menus[MOVEMENU], LEFT );
nableItem( menus[MOVEMENU], RIGHT );
nableItem( menus[MOVEMENU], HOME );
nableItem( menus[MOVEMENU], END );
nableItem( menus[MOVEMENU], NEXT_PAGE );
nableItem( menus[MOVEMENU], PREVIOUS_PAGE );
nableItem( menus[CONTROLMENU], 0 );
nableItem( menus[CONTROLMENU], HANDSHAKE );
nableItem( menus[CONTROLMENU], LOGICSETUP );
nableItem( menus[CONTROLMENU], LOGICDISPLAY );
nableItem( menus[CONTROLMENU], LOADFILE );
nableItem( menus[CONTROLMENU], AUTODISPLAY );
nableItem( menus[CONTROLMENU], LOGICENABLE );
nableItem( menus[PROTOMENU], 0 );
nableItem( menus[PROTOMENU], LOAD );
nableItem( menus[PROTOMENU], INSERT );
nableItem( menus[PROTOMENU], REPLACE );
nableItem( menus[PROTOMENU], NAME );
```

```
rawMenuBar();
/* enable_menus() */
 Initialize Terminal Emulator main window (the 24 line one) */
it_main_window()


ain_wptr = GetNewWindow( 400, (Ptr) &main_wrec, (WindowPtr) -1 );
 init_userline(): Initialize the user line window.  Set it's location,
 size, text characteristics, and pen location */
it_userline()


rafPtr saveport;

ser_wptr = GetNewWindow( 401, (Ptr) &user_wrec,
      (WindowPtr) -1 );
izeWindow( user_wptr, (int) right_margin,
         (2 * (int) lineheight), 1);
oveWindow( user_wptr, (int) LEFTMARGIN,
         (int) (bottom_margin + 49),
         0);
etPort( &saveport );
etPort( &user_wrec.port );
ser_visrgn = NewRgn();
opyRgn( thePort->visRgn, user_visrgn );
extFont ( Monaco );
      TextSize ( 9 );
      TextMode ( srcCopy );
   GetFontInfo ( &user_fontinfo );
   MoveTo( LEFTMARGIN,( 2 * user_fontinfo.ascent) );
etPort( saveport );
ideWindow( user_wptr );
/* init_userline() */
 init_globals(): initialize a number of global variables */
it_globals()


rafPtr saveport;

etPort( &saveport );
etPort( &main_wrec.port );
extFont ( Monaco );
      TextSize ( 9 );
      TextMode ( srcCopy );
      GetFontInfo ( &fontinfo );
      charwidth = fontinfo.widMax;
      lineheight = ( thePort->portRect.bottom - thePort->portRect.top
    - TOPMARGIN ) / MAXLINES;
      right_margin = LEFTMARGIN + ( charwidth * 80 );

      bottom_margin = TOPMARGIN + ( lineheight * MAXLINES );

      SetRect ( &screen_rect, LEFTMARGIN, TOPMARGIN,
    right_margin, bottom_margin );
      SetRect ( &lastline_rect, screen_rect.left,
                                screen_rect.bottom - lineheight,
                                screen_rect.right,
                                screen_rect.bottom );
      SetRect ( &last_two_rect, screen_rect.left,
                                screen_rect.bottom - (2 * lineheight),
                                screen_rect.right,
                                screen_rect.bottom );
      SetRect ( &char_rect, 0, 0, charwidth, lineheight );
etRect ( &firstline_rect, screen_rect.left,
     screen_rect.top,
     screen_rect.right,
     screen_rect.top + lineheight);
ain_visrgn = NewRgn();
opyRgn( thePort->visRgn, main_visrgn );
```

```
        curse_rect = char_rect;
        curse_state = OFF;
        curse_enable = ON;
        topline = screen_rect.top + fontinfo.ascent;
 choline = topline;

        buffer = NewPtr ( BUFSIZE );
        nextin = 0;
        nextout = 0;
        linelength = 0;
        curse_time = 0;
        curse_count = 0;
        baud = 5;
 etPort( saveport );
 fdef optionmenu
        CheckItem ( menus[BAUD_INDEX], baud + 1, TRUE );
 ndif
  /* init_globals() */
  init_te_menus(): initialize the terminal emulator menus, by reading
  them in from the resource file */
 it_te_menus()


 nt i;

 enus[DESKMENU] = NewMenu(APPLE, APPLE_SYM);
 enus[DDWMENU] = GetMenu ( DDW );
 enus[MODEMENU] = GetMenu ( MODE );
 enus[FUNCTIONMENU] = GetMenu ( FUNCTION );
 enus[MOVEMENU] = GetMenu ( MOVEMENT );
 enus[CONTROLMENU] = GetMenu ( CONTROLS );
 fdef menudebug
 enus[DEBUG_INDEX] = GetMenu ( DEBUG );
 enus[DEBUG_ZTOP_INDEX] = GetMenu ( DEBUG_ZTOP );
 enus[DEBUG_ESC_INDEX] = GetMenu ( DEBUG_ESCAPES );
 lse
 enus[PROTOMENU] = GetMenu ( PROTOCOL );
 fdef optionmenu
        menus[OPTIONS_INDEX] = GetMenu ( OPTIONS );
 enus[BAUD_INDEX] = GetMenu( BAUD );
 lse
 enus[EDITMENU] = GetMenu ( EDIT );
 enus[DISPLAYMENU] = GetMenu ( DISPLAY );
 ndif optionmenu
 ndif menudebug
 ddResMenu(menus[DESKMENU], typeDRVR.s); /* desk accessories */
 or ( i = 0; i < MAXMENUS; i++ )
    {
 InsertMenu ( menus[i], 0 );
    }
 rawMenuBar();
 /* init_te_menus() */
 init_controls(): Initialize the table full of control characters that
 the terminal emulator recognizes. */
it_controls()


      short   i;
      short   ctl;
      short   func;
      char    **rhdl;

                        /* get a handle on the controls resource */
      rhdl = GetResource ( ctls_rsrc.s, 257 );

      i = 0;
      while ( ( func = (short)(*rhdl)[i++] ) != NULL )
          {
                ctl = (short)(*rhdl)[i++];
                ctrls[ctl] = func;
          }
 /* init_controls() */
```

```
 init_escapes(): Initialize table of escape sequences which the terminal
 emulator knows about */
it_escapes()

      short   i, j;
      short   not_sorted;
      char    **rhdl;
      Esc_struct      tmp;
nt errornum;

                       /* get a handle on the escape sequence resource */
      rhdl = GetResource ( escs_rsrc.s, 258 );
f (rhdl == NIL_HANDLE) {
  errornum = ResError();
  printerr(
   "ERROR in call to GetResource in init_escapes ", errornum);

      i = 0;
                       /* find out how big it is */
      max_escapes = 0;
      while ( (*rhdl)[i++] || (*rhdl)[i] )
          {
                       /* keep track of how many sequences there are */
              if ( (*rhdl)[i] == NULL )
                  {
                       max_escapes++;
                  }
          }
                       /* allocate memory for the escape sequence strings */
      esc_seqs = (char *) NewPtr ( i - max_escapes );
                       /* allocate memory for the escape table */
      escapes = (Esc_struct *) NewPtr ( max_escapes * sizeof( Esc_struct ) );

      i = 0;
      j = 0;
                       /* copy the resource into our own space */
      seq_ptr = esc_seqs;
      for ( j = 0; j < max_escapes; j++ )
          {
                       /* function codes go into the escape table */
              escapes[j].e_func = (*rhdl)[i++] & 0xff;
                       /* with pointers to the escape sequence strings */
              escapes[j].e_seq = seq_ptr;
                       /* the actual strings go to their own space */
              while ( *seq_ptr++ = (*rhdl)[i++] )
                  {
                  }
          }
                       /* let go of the resource handle */
      DisposHandle ( rhdl );
     /* sort the escape table by alphabetic order of the escape strings */

     do
    {
        not_sorted = 0;
        for ( i = 0; i < max_escapes - 1; i++ )
            {
                if ( strcmp ( escapes[i].e_seq, escapes[i+1].e_seq )
                        > 0 )
                    {
                        tmp = escapes[i];
                        escapes[i] = escapes[i+1];
                        escapes[i+1] = tmp;
                        not_sorted++;
                    }
            }
    }
 while ( not_sorted );
```

```
y_service()

fdef tespeed
nt now_buffc;
ndif tespeed

       buff_count = inbufcnt();
fdef tespeed
ow_buffc = buff_count;
ndif tespeed
       if ( buff_count > maxbufcnt )
            {
                 maxbufcnt = buff_count;
            }
fdef handshdebug
rrprintf("the maxbufcnt now is %d", maxbufcnt );
ndif
       if ( ( errnum = FSRead ( inref, &buff_count, buffer ) ) > 0 )
            {
                 errprintf ( "FSRead error is %d", errnum );
                 return ( -1 );
            }
       *( buffer + buff_count ) = NULL;
f (buff_count > xoff_level)
   more_to_scroll = scan_for_linefeeds();
lse
   more_to_scroll = 0;
       flush_buff();
fdef tespeed
f (now_buffc)
   {
attention ( "Elapsed Time: %d ticks", TickCount() - now );
Wait_Button;
at_ease();
   } —
ndif tespeed
       return ( 0 );
/* tty_service() */
use_service()


       int       code;

       code = FindWindow ( &event.where, &window );
f (code == inMenuBar || code == inSysWindow)
   {
        switch(code)
        {
                case inMenuBar:
                    {
                         do_menu ( MenuSelect ( &event.where ) );
                    }
             break;
        case inSysWindow:
    {
 save_te_windows();
         SystemClick( &event, window );
         break;
    }

        };
    }
else if (window == main_wptr)
 window_service( window, &event.where, code );

 /* mouse_service() */
```

```
ndow_service ( wptr, mptr, code )
ndowPtr wptr;
int  *mptr;
t  code;


witch ( code )
   {
case inGrow:
     {
 /* it's not really working
 grow_window( wptr );
 break;
 */
     }
case inDrag:
     {
 /* not now, I'm not sure if it works.
 DragWindow ( wptr, &event.where, &thePort->portRect );
 */
 break;
     }
case inGoAway:
     {
 if ( TrackGoAway ( wptr, mptr ) )
      {
  HideWindow ( wptr );
      }
 break;
     }
case inContent:
     {
                       if (wptr != FrontWindow())
                       {
                           SelectWindow(wptr);
                       }
                       break;
     }
default:
     {
     }

   }
/* window_service() */

 key_service(): service a key stroke */
y_service()


nt keycode;

fdef MAC_PLUS
nt asciicode;
lse
fdef MAC_512K
* Do Nothing */
lse
o machine specified
ndif MAC_512K
ndif MAC_PLUS

*
rrprintf("keycode in hex is %x", ((event.message >> 8) & 0xff) );
rrprintf("ascii key value is %x", (event.message & 0xff));
f (event.modifiers & SHIFTKEY)
   errprintf("key is shifted");
f (event.modifiers & OPTIONKEY )
   errprintf("key is optioned");
/
```

```
* WARNING: this checking of the ascii code HAS to come before the
* checking of the keypad keycodes, because the four arrow keys
* have identical keycodes with four of the keys on the keypad
*/

fdef MAC_PLUS
sciicode =  (int) ( event.message & 0xff );
witch ( asciicode )
   {
case LEFT_ARROW:
     {
 putstr( keys[ LEFT_INDEX ] );
 return;
     }
case RIGHT_ARROW:
     {
 putstr( keys[ RIGHT_INDEX ] );
 return;
     }
case UP_ARROW:
     {
 putstr( keys[ UP_INDEX ] );
 return;
     }
case DOWN_ARROW:
     {
                else
                    if (event.modifiers & OPTIONKEY)
                  putstr(keys[
                  CTRL_CLEAR_SPACE_INDEX ]);
                else
             putstr(keys[ OPERATE_INDEX ]);
lse
fdef MAC_PLUS
    if ( event.modifiers & OPTIONKEY )
    —  putstr( keys[ CRT_INDEX ] );
    else
        putstr( keys[ END_INDEX ] );
lse
hat machine then?
ndif MAC_PLUS
ndif MAC_512K
           break;
       }
           case KP_MULT:
       {
    if ( event.modifiers & OPTIONKEY )
        put_tty( ESC );
    else
        putstr( keys[ BREAK_INDEX ] );
           break;
       }
           case KP_SEVEN:
       {
   putstr( keys[ CHR_INSERT_INDEX ] );
           break;
       }
           case KP_EIGHT:
       {
   if (event.modifiers & OPTIONKEY)
        putstr( keys[ PREV_PAGE_INDEX ] );
   else
        putstr( keys[ UP_INDEX ] );
           break;
       }
           case KP_SLASH:
       {
```

```
fdef MAC_512K
    if (event.modifiers & OPTIONKEY )
        putstr( keys[ REPEAT_INDEX ]);
    else
        putstr( keys[ HOLD_INDEX ] );
lse
fdef MAC_PLUS
    if ((event.modifiers & COMMANDKEY) &&
        (event.modifiers & OPTIONKEY))
               putstr(keys[
     CTRL_SHIFT_CL_SP_IND]);
           else
               if (event.modifiers & OPTIONKEY)
            putstr(keys[
            CTRL_CLEAR_SPACE_INDEX ]);
               else
            putstr(keys[ OPERATE_INDEX ]);
lse
o machine specified


ndif MAC_PLUS
ndif MAC_512K
           break;
       }
           case KP_NINE:
       {
    putstr( keys[ CHR_DELETE_INDEX ]);
           break;
       }
           case KP_FOUR:
       {
    putstr( keys[ LEFT_INDEX ]);
           break;
       }
           case KP_FIVE:
       {
    putstr( keys[ HOME_INDEX ] );
           break;
       }
           case KP_SIX:
       {
    putstr( keys[ RIGHT_INDEX ] );
           break;
       }
           case KP_EQUALS:
       {
fdef MAC_512K
    if ( event.modifiers & OPTIONKEY )
        putstr( keys[ CRT_INDEX ] );
    else
        putstr( keys[ END_INDEX ] );
lse
fdef MAC_PLUS
    if (event.modifiers & OPTIONKEY)
        putstr(keys[ PAGE_ERASE_INDEX ]);
    else
        putstr(keys[ DEVELOP_INDEX ]);
lse
hat machine then?
ndif MAC_PLUS
ndif MAC_512K
           break;
       }
           case KP_ONE:
       {
    putstr( keys[ LN_INSERT_INDEX ] );
           break;
       }
```

```
case KP_TWO:
{
if (event.modifiers & OPTIONKEY)
    putstr( keys[ NXT_PAGE_INDEX ] );
else
    putstr( keys[ DOWN_INDEX ] );
    break;
}

case KP_THREE:
{
putstr( keys[ LN_DELETE_INDEX ] );
    break;
}
case KP_ENTER:
{
    putstr(keys[ START_INDEX ]);
    break;
}
case KP_ZERO:
{
putstr( keys[ RP_PAGE_INDEX ] );
    break;
}
case KP_PERIOD:
{
putstr( keys[ CANCEL_INDEX ] );
    break;
}
default:
{
fdef debug
    errprintf("Missed a keypad key!!");
ndif
    break;
}
} /* switch */
/* key not on key pad */
lse
{
fdef key_debug
ugout(BUG3,"key in hex is %x", ((event.message >> 8) & 0xff) );
ugout(BUG3,"keycode in hex is %x", keycode);
ugout(BUG3,"ONE_KEY is %x", ONE_KEY);
ugout(BUG3,"TWO_KEY is %x", TWO_KEY);
ugout(BUG3,"THREE_KEY is %x", THREE_KEY);
ndif
    /* for wizards only:  special key combinations for
 * internal use only */

    if ( (event.modifiers & BUGMASK) == WIZARD )
        {
        wiz_service ( event.message & 0xff );
        return;
        }
if ( (event.modifiers & OPTIONKEY) &&
    (event.modifiers & SHIFTKEY) )
    {
    switch ( keycode )
{
    case ONE_KEY:
putstr( OPTION1 );
break;
  case TWO_KEY:
putstr( OPTION2 );
break;
  case THREE_KEY:
putstr( OPTION3 );
break;
```

```
        case FOUR_KEY:
    putstr( OPTION4 );
    break;
        case FIVE_KEY:
    putstr( LINE_LOAD );
    break;
        case SIX_KEY:
    putstr( DISK_LOAD );
    break;
        default:
fdef key_debug
ugout(BUG3, 'in switch, keycode: %x didn't match', keycode);
ndif

    return;
   }
      return;
      }
 else
      if (event.modifiers & OPTIONKEY)
   return;
fdef key_debug
ugout(BUG3, 'in key_service(), the Shift-Option code didnt get it');
ndif
 check for the command key pressed down at the same time as the keystroke */
                if ( event.modifiers & COMMANDKEY )
                    {
          int key;
          int menu_key;

          key = MenuKey( (char) event.message & 0xff );
          menu_key = HiWord( key );
          if (!menu_key)
              {
      _    if ( (event.message & 0xff) == CHAR_SIX)
      _         put_tty( (char) CTRL_ARROW );
           else
        if ( (event.message & 0xff) == CHAR_TWO)
     put_tty( (char) CTRL_ATSIGN );
                else
   put_tty ( (char) event.message & 0x1f );
              }
          else
              do_menu( key );
                    }
               else
                      put_tty ( (char) event.message & 0xff );
   } /* else */
   /* key_service() */
 move_cursor(): our cursor the given location */
ve_cursor ( locptr )
int   *locptr;


      SetRect ( &curse_rect, locptr->h,
                             locptr->v - fontinfo.ascent,
                             locptr->h + fontinfo.widMax,
                             locptr->v + fontinfo.descent );
  Procedure: our_task
  function:  Just blinks the cursor if it's time.
/
r_task()


      int     now;  /* now is the time in Ticks from the startup of the
       * program */

      now = TickCount();
      if ( now - curse_time > CURSEBLINK )
          {
```

```
            if ( curse_enable )
                {
                    InvertRect ( &curse_rect );
                    curse_state = !curse_state;
                }
            curse_time = now;
        }
fdef cursor_debug
rrprintf("in our_task(), cursor state is %d", curse_state);
ndif

        if ( now - logic_time > LOGICBLINK )
    {
armblink();
logic_time = now;
    }
 /* our_task() */
 it()


        EraseRect ( &thePort->portBits.bounds );
        ExitToShell();
 grow_window(): call Mac ROM function GrowWindow() with the limit
 rectangle we give it */
ow_window( wptr )
ndowPtr wptr;


ect limitrect;
nt newsize;

etRect ( &limitrect, 100, 50, 494, 292 );
ewsize = GrowWindow ( wptr, &event.where, &limitrect );
izeWindow ( wptr, newsize & 0xffff, newsize >> 16, 1 );
/* grow_window() */
 update(): update the window recieving the update event
 WindowPtr wptr - the pointer to the window recieving the update event *
 main_bitmap and user_bitmap are initialized in init_bitmap() and
 changed in save_te_windows() , at_ease() and fetch_window_bits() */
date ( wptr )
ndowPtr wptr;

rafPtr saveport;

etPort( &saveport );
f (wptr == main_wptr)
  SetPort( &main_wrec.port );
lse if (wptr == user_wptr)
 SetPort( &user_wrec.port );
lipRect ( &thePort->portRect );
   BeginUpdate ( wptr );
      if (wptr == main_wptr && edi_up == NO)
/* copy bits from main_bitmap area to screen area */
         {
              CopyBits ( &main_bitmap, &thePort->portBits,
           &main_bitmap.bounds, &screen_rect,
         srcCopy, (RgnHandle) 0 );
/* cursor was turned off when the screen was copied,
 * so if cursor now on, restore it */
       if ( curse_state == ON )
                   InvertRect ( &curse_rect );
          }
      else
f (wptr == user_wptr)
/* copy bits from user_bitmap area to screen area */
   {
      CopyBits ( &user_bitmap, &thePort->portBits,
                &user_bitmap.bounds, &thePort->portRect,
            srcCopy, (RgnHandle) 0 );
```

```
   }
lse
   if (edi_up == YES)
edi_up = NO;
fdef debug
      else
          errprintf("update(): don't know this window!");
ndif
   EndUpdate ( wptr );
etPort( saveport );
/* update() */
 Procedure: user_display

 Function: display the user line on the screen.

 Parameters:
 None.

 Return Values:
 None.

 Discussion:
 Simply call ShowWindow() to make the window visible.

 Imports modified:
 None.
/
er_display()

howWindow( user_wptr );
/* user_display() */
 Procedure: user_blank

 Function: Hide the user line window

 Parameters:
 None.

 Return Values:
 None.

 Discussion:
 If the user line window is completely un-covered by anything else
 then save the bits of the user line window.  Then call HideWindow()
 to hide it.

 Imports modified:
 None.
/
er_blank()

f ( EqualRgn( user_wrec.port.visRgn, user_visrgn ) )
   save_window_bits( user_wptr );
ideWindow( user_wptr );
/* user_blank() */


 Procedure: ztop_up

 Function: set ztop_there to 1.

 Parameters:
 None.
 Return Values:
 None

 Discussion:
 set ztop_there to 1.
```

```
 Imports modified:
 int ztop_there  - 1 ztop running on the set, 0 ztop not running
        on the set.
/
op_up()

  ztop_there = 1;
/* ztop_up() */


 Procedure: ztop_not_up
 Function: set ztop_there to 0

 Parameters:
 None.
 Return Values:
 None

 Discussion:
 set ztop_there to 0

 Imports modified:
 int ztop_there  - 1 ztop running on the set, 0 ztop not running
        on the set.
/
op_not_up()

  ztop_there = 0;
/* ztop_not_up() */

   Module Utilities.c   */

 Note: this module was created to move some of the miscellaneous utilities
 out of terminal.c where the main control functions are
/

nclude        <mac/quickdraw.h>
nclude        <mac/osintf.h>
nclude        <mac/toolintf.h>
nclude        "terminal.h"
nclude "ddw.h"

efine EDIUP     '\006'
efine EDINOTUP  '\025'
efine ISEDIUP   "x"
efine REDRAW_SCREEN  '\034'

 Main window */
tern WindowRecord main_wrec;
tern WindowPtr main_wptr;

 userline window */
tern WindowRecord user_wrec;
tern WindowPtr user_wptr;

tern BitMap main_bitmap; /* for holding the bitmap of the main window */
tern BitMap user_bitmap; /* for holding the bitmap of the user window */

tern Rect    screen_rect;  /* rectangle for the main window */

tern struct QDVar QDVar;

afPtr  scratchport; /* port for writing to off-screen */

tern RgnHandle user_visrgn;
```

```
tnhex( data, nnibbles )
signed int data;
t     nnibbles;


      unsigned char   nibble;

      do
           {
                nibble = ( data >>  ( ( nnibbles - 1 ) * 4 )  ) & 0xf;
                print_char ( (char) ( nibble <= 0x09 ?
                                          nibble + 0x30 : nibble + 0x37 ) );

           }
      while ( --nnibbles );

 init_bitmap(): initializes the bitmap with the given bounds, with the bits
 in the given window.

 Parameters:
 this_bitmap - bitmap to be initialized
 bounds_rect -  bitmap bounds rectangle.
 wptr         - pointer to the window the bitmap is for.
/
it_bitmap( this_bitmap, bounds_rect, wptr )
tMap *this_bitmap;
ct *bounds_rect;
ndowPtr wptr;

egister short remainder;
egister short rowbytes;
rafPtr saveport;

/* bounds should be just the right size, top, left = 0, 0 */
etRect ( &this_bitmap->bounds,
  0,
  0,
  bounds_rect->right - bounds_rect->left,
         bounds_rect->bottom - bounds_rect->top );

* rowBytes must accommodate AT LEAST bit width, and even */
emainder = bounds_rect->right % 8;
f (remainder)
   rowbytes = (bounds_rect->right / 8) + 1;
lse
   rowbytes = bounds_rect->right / 8;
emainder = rowbytes % 2;
f (remainder)
   rowbytes++;
his_bitmap->rowBytes = rowbytes;
/* bytes = rowbytes * height */
his_bitmap->baseAddr = NewPtr ( rowbytes * bounds_rect->bottom );

* now fill up the block of bits with the present contents of the
* window */
etPort( &saveport );
f (wptr == main_wptr)
  SetPort( &main_wrec.port );
lse if (wptr == user_wptr)
 SetPort( &user_wrec.port );
f (wptr == main_wptr)
/* copy bits from screen to main_bitmap area */
  {
       CopyBits ( &thePort->portBits, &main_bitmap,
   &screen_rect, &main_bitmap.bounds,
  srcCopy, (RgnHandle) 0 );
   }
```

```
lse
   if (wptr == user_wptr)
/*
SetPort ( scratchport );


PortSize( user_wrec.port.portRect.h,
   user_wrec.port.portRect.v );
zero_bits( &thePort->portBits );
*/

zero_bits( &user_bitmap );
/* copy bits from screen to user_bitmap area *
        CopyBits ( &thePort->portBits, &user_bitmap,
            &thePort->portRect, &user_bitmap.bounds,
      srcCopy, (RgnHandle) 0 );
*/
etPort( saveport );
/* init_bitmap() */

 is_edi_up() : if edi or develop mode is up, return 1, else return 0.
 it finds out by asking ztop if EDI or Develop mode is up.  If ztop
 returns EDIUP, the answer's yes, and if ztop returns EDINOTUP, the
 answer's no.  If the answer is neither, then it reads again, throwing
 away the character.  To prevent problems in ztop crashes or something,
 is_edi_up() only waits a certain amount of time and then assumes a no
 answer, and gives up.
/

_edi_up()

      int      now;  /* now is the time in Ticks from the startup of the
       * program */
nt new_time;
egister char c;
har get_tty();

* ask ztop if EDI/DEV mode is up */
utstr( ISEDIUP );

* set up variables for timeout */
ew_time = TickCount();
      now = TickCount();

* read answer from ztop */
hile (now + 600 > new_time)
   {
if (inbufcnt() > 0 )
    {
 c = get_tty();
 if ((c&0377) == EDIUP)
     return( YES );
 else if ((c&0377) == EDINOTUP )
   return( NO );

    }
new_time = TickCount();
   }
eturn( NO );


/* is_edi_up() */

 redraw_screen() : send Redraw Screen command to tester to get EDI/DEV
 to redraw the screen */


 draw_screen()

 ut_tty( REDRAW_SCREEN );
 /* redraw_screen() */
```

```
    MODULE VIDEO_ATT.C      */

 This module handles the video attribute data structure, which keeps
 track of where video attributes are on the screen */
nclude          <mac/quickdraw.h>
nclude          <mac/osintf.h>
nclude          <mac/toolintf.h>

nclude "terminal.h"
 for BUG# definitions */
nclude "global.h"
nclude "ddw.h"

tern short trace;

ruct video_attr {
hort *line;
hort columns;
hort attributes;
videotab[MAXLINES];

atic struct {
hort incoming_att;
hort old_att;
hort new_att;
att_tab[] = {
ORMAL_VIDEO,  NORMAL_VIDEO,  NORMAL_VIDEO,
ORMAL_VIDEO,  REVERSE_HL,  NORMAL_VIDEO,
T_REVERSE_VIDEO, NORMAL_VIDEO,  ST_REVERSE_VIDEO,
T_REVERSE_VIDEO, ST_REVERSE_VIDEO, ST_REVERSE_VIDEO,
T_REVERSE_VIDEO, END_REVERSE_VIDEO, ST_REVERSE_VIDEO,
T_REVERSE_VIDEO, REVERSE_HL,  HALF_INTENSITY,
ND_REVERSE_VIDEO, NORMAL_VIDEO,  END_REVERSE_VIDEO,
ND_REVERSE_VIDEO, ST_REVERSE_VIDEO, END_REVERSE_VIDEO,
ND_REVERSE_VIDEO, END_REVERSE_VIDEO, END_REVERSE_VIDEO,
ND_REVERSE_VIDEO, REVERSE_HL,  END_REVERSE_VIDEO,
EVERSE_HL,  NORMAL_VIDEO,  REVERSE_HL,
EVERSE_HL,  ST_REVERSE_VIDEO, HALF_INTENSITY,
EVERSE_HL,  END_REVERSE_VIDEO, END_REVERSE_VIDEO,
EVERSE_HL,  REVERSE_HL,  REVERSE_HL,
1,   -1,   -1,
;

atic side_effect[] = {
ORMAL_VIDEO,
EVERSE_HL,
ORMAL_VIDEO,
EVERSE_HL,
;

atic short *first_line;
atic short *last_line;


 initialize video attributes table */
it_video_tab()

  register short i;
  register short ind;

  for (i = 0; i < MAXLINES; i++)

   videotab[i].line = (short *) NewPtr( MAXCOLUMNS *
         sizeof( short ) );
   for( ind = 0; ind < MAXCOLUMNS; ind++)
{
    videotab[i].line[ind] = NORMAL_VIDEO;
}
```

```
 first_line = videotab[1].line;
 last_line = videotab[MAXLINES-1].line;
/* init_video_tab() */

 put_embedded(): puts an embedded attribute (field attribute) into
 character position and marks the attributes from there until the end
 of line or a new embedded attribute.  It returns the number of characters
 already possessing the side effect of the given attribute.  For example,
 the characters might have already been highlighted in inverse video.
 An embedded attribute is one which affects the characters from it's
 location on the line to the end-of-line, or another embedded attribute.
/
t
t_embedded( charloc, attribute)
gister char_pos *charloc;
gister short attribute;

  register short i;
  register short lineptr;
  short lookup_att();
  short new_att();
  int already_affected = 0;
  register short new_attribute;

fdef video_debug
  bugout(BUGS, "put_embedded(): attribute is %d", attribute);
ndif

  if ((charloc->line < 0) || (charloc->column < 0))

fdef video_debug
   errprintf("bad char position sent to put_embedded() \
       charloc->line is %d, charloc->column is %d",
       charloc->line, charloc->column);
ndif
   return(0);

  lineptr = charloc->line;
  videotab[lineptr].line[charloc->column] = attribute;
  attribute = side_effect[attribute];

fdef video_debug
  if (trace)
errprintf("put_embedded(): side_effect attribute is %d", attribute );
ndif

  for( i=charloc->column+1; i < MAXCOLUMNS; i++)

        if (embedded( videotab[lineptr].line[i] ))
      break;
        new_attribute = new_att( attribute,
  videotab[lineptr].line[i] );
        if (videotab[lineptr].line[i] == new_attribute)
      already_affected++;
      videotab[lineptr].line[i] = new_attribute;

 return( already_affected );
/* put_embedded() */


  prev_embedded(): looks from the character position back to the beginning
  of the line to find an embedded attribute previous on the line.  If
  there is none, return NORMAL_VIDEO.

  Parameters:
  charloc (char_pos *) character position to start search from.
```

```
 Return Values:
  attribute  short if an embedded attribute found, that attribute,
    otherwise, NORMAL_VIDEO.
/
ort
ev_embedded( charloc )
ar_pos *charloc;

  register short lineptr;
  register short i;

  lineptr = charloc->line;
  if (charloc->column > 0)
 = charloc->column - 1;
  else
 = -1;
  while ( i > -1 )

   if (embedded( videotab[lineptr].line[i] ))
return( videotab[lineptr].line[i] );
   i--;
 /* for */
  return( NORMAL_VIDEO );
/* prev_embedded() */


 lookup_att(): given the charcter position, looks up the associated
 attribute */
ort
okup_att( charloc )
ar_pos *charloc;

  return( videotab[charloc->line].line[charloc->column] );


 new_att(): from the incoming attribute and the stored attribute, new_att()
 determines what the new attribute should be and returns it */
ort
w_att( incoming_att, old_att )
gister short incoming_att;
gister short old_att;

  register short i;

  for(i=0; att_tab[i].incoming_att >= 0; i++)
      if(incoming_att == att_tab[i].incoming_att &&
  old_att == att_tab[i].old_att)
   break;

  if (att_tab[i].new_att >= 0)
eturn( att_tab[i].new_att );
  else

   /* default value, should never be used */
   /* if it is used, I forgot a combination in the att_tab[] */
   return( NORMAL_VIDEO );


/* new_att() */


 embedded(): returns 1 if the attribute is an embedded attribute, and
 0 if it isn't */
bedded( attribute )
ort attribute;
```

```
  switch (attribute) {
ase ST_REVERSE_VIDEO:
return( 1 );
ase END_REVERSE_VIDEO:
return( 1 );
efault:
return( 0 );
  }


 vid_scroll_up(): scrolls the video attribute table videotab[] up
 one line.  By 'scroll up' I mean that the data is moving up, and the
 last line will be cleared */
d_scroll_up()

  register short *tmp1;
  register short *tmp2;
  register short i;
  register short firstline;
  register short lastline;

  lastline = MAXLINES-1;
  firstline = 0;
  tmp1 = tmp2 = videotab[lastline].line;
  videotab[lastline].line = videotab[firstline].line;
  vid_clearline( lastline );

  for( i = lastline-1; i >= 0; i--)

   tmp1 = videotab[i].line;
   videotab[i].line = tmp2;
   tmp2 = tmp1;

/* vid_scroll_up() */


 vd_num_scr_up(): scrolls the video attribute table videotab[] up
 num lines.  By 'scroll up' I mean that the data is moving up, and the
 last line will be cleared */
_num_scr_up( num )
t num;

  register short *tmp1;
  register short *tmp2;
  register short i;
  register short firstline;
  register short lastline;
  register short in;

  lastline = MAXLINES-1;
  firstline = 0;

  for (in = 0; in < num; in++)

       tmp1 = tmp2 = videotab[lastline].line;
       videotab[lastline].line = videotab[firstline].line;
       vid_clearline( lastline );

       for( i = lastline-1; i >= 0; i--)
       {
           tmp1 = videotab[i].line;
           videotab[i].line = tmp2;
           tmp2 = tmp1;
       }

/* vd_num_scr_up() */
```

```
 vid_scroll_down(): scrolls the video attribute table videotab[] down
 one line.  By 'scroll down' I mean that the data is moving down, and the
 first line will be cleared */
d_scroll_down()

  register short *tmp1;
  register short *tmp2;
  register short i;
  register short firstline;
  register short lastline;

  lastline = MAXLINES-1;
  firstline = 0;
  tmp1 = tmp2 = videotab[firstline].line;
  videotab[firstline].line = videotab[lastline].line;
  vid_clearline( firstline );

  for( i = firstline+1; i < MAXLINES; i++)

   tmp1 = videotab[i].line;
   videotab[i].line = tmp2;
   tmp2 = tmp1;

/* vid_scroll_down() */


 vid_clearline(): initializes the given line video attribute line */
d_clearline( line )
ort line;

  register short *colptr;
  register short i;

  colptr = videotab[line].line;
  for (i=0; i<MAXCOLUMNS; i++)
colptr++ = NORMAL_VIDEO;
/* vid_clearline() */


  delete_att(): deletes the attribute at the given location
  and scrolls the attributes to the right one character position left
  It then checks to see if the line has to be updated because a
  embedded attribute previously on the line (such as ST_REVERSE_VIDEO)
  is now 'activated', ie, will now effect the line. Or if the attribute
  needed to be 'turned off' (by reseting the attributes it effected to
  NORMAL_VIDEO).

  Parameters:
   charloc - position of the attribute to be deleted
   redo_line - records whether the line has to be redone & how many
   positions on the line won't have to be changed.
 /
lete_att( charloc, redo_line)
gister char_pos *charloc;
L_PTR redo_line;

      register short *columnptr;
      register short i;
      char_pos new_charloc;
      short numchars = 0;
      short attribute;

 columnptr = videotab[charloc->line].line + charloc->column;

ttribute = lookup_att( charloc );

* was the deleted attribute an embedded one? */
* if so, turn off the effect */
f (embedded( attribute ))
   numchars = affected_chars( charloc );
```

```
     /* scroll them */
     for ( i = charloc->column; i < MAXCOLUMNS-1; i++ )
  {
      *columnptr = *(columnptr + 1);
      columnptr++;
  }
ideotab[charloc->line].line[MAXCOLUMNS-1] =
ideotab[charloc->line].line[MAXCOLUMNS-2];

* check for new attribute effect from an attribute previously
* on the line */
or ( i = charloc->column-1; i >= 0; i-- )
   if ( embedded( videotab[charloc->line].line[i] ) )
{
    new_charloc.line = charloc->line;
    new_charloc.column = i;
           redo_line->already_affected = put_embedded( &new_charloc,
                   videotab[charloc->line].line[i] );
    numchars = affected_chars( &new_charloc );
    if (numchars - redo_line->already_affected)
        {
            redo_line->redo = 1;
     redo_line->affected_chars = numchars -

            redo_line->already_affected;
          return;
        }
     else
        {
      redo_line->redo = 0;
      redo_line->already_affected = 0;
      return;.
        }
 }

 * if the attribute was embedded, then did it leave any characters
 * 'on'? */
 f (numchars)
    {
 redo_line->redo = 1;
 redo_line->affected_chars = numchars;
 redo_line->already_affected = 0;
 fdef video_debug
 bugout(BUG1, "in delete_att() after backwards scan,\
       numchars is %d", numchars );
ndif video_debug
 /* turn off affects of ST_REVERSE_VIDEO */
 numchars++;
 if (attribute == ST_REVERSE_VIDEO)
     for ( i = charloc->column; i < MAXCOLUMNS && numchars; i++)
  {
      videotab[charloc->line].line[i] = NORMAL_VIDEO;
      numchars--;
  }
 return;
     }

 edo_line->already_affected = 0;
 edo_line->redo = 0;
 /* delete_att() */

   insert_att(): inserts the attribute at the given char location */
 sert_att( charloc, attribute )
 gister char_pos *charloc;
 gister short attribute;

    register short line;
    register short i;
```

```
  line = charloc->line;
  for( i = charloc->column; i < MAXCOLUMNS -1; i++ )
ideotab[line].line[i+1] = videotab[line].line[i];
  videotab[line].line[charloc->column] = attribute;
  if ( embedded( attribute ) )
ut_embedded( charloc, attribute );
/* insert_att() */


 vid_delete_line(): delete the line of video attributes. Scroll up the lines
 below the line deleted to fill up the gap */
d_delete_line( delete_line )
gister short delete_line;

  register short *tmp1;
  register short *tmp2;
  register short i;
  register short lastline;

  lastline = MAXLINES - 1;
  tmp1 = videotab[lastline].line;
  videotab[lastline].line = videotab[delete_line].line;
  vid_clearline( delete_line );

fdef user_debug
ugout(BUG3, "in vid_delete_line() just cleared line %d", delete_line );
ndif
  for (i = lastline - 1; ((i > 0) && (i > delete_line - 1)); i-- )

   tmp2 = videotab[i].line;
   videotab[i].line = tmp1;
   tmp1 = tmp2;

  if (delete_line == 0 )

   tmp2 = videotab[0].line;
   videotab[0].line = tmp1;

/* vid_delete_line() */


 vid_insert_line(): insert a blank line at the given location, scroll the
 lines below down one line */
d_insert_line( insert_line )
gister short insert_line;

  register short *tmp1;
  register short *tmp2;
  register short i;
  register short lastline;

  lastline = MAXLINES - 1;
  tmp1 = videotab[insert_line].line;
  videotab[insert_line].line = videotab[lastline].line;
  vid_clearline( insert_line );
  for (i = insert_line + 1; i < MAXLINES; i++ )

   tmp2 = videotab[i].line;
   videotab[i].line = tmp1;
   tmp1 = tmp2;

/* vid_insert_line() */

  vd_clear_screen(): clear the whole screen of video attributes */
 _clear_screen()

   register short line;
   register short column;
   register short *colptr;
```

```
 for ( line = FIRST_LINE; line < MAXLINES; line++ )

  colptr = videotab[line].line;
  for( column = 0; column < MAXCOLUMNS; column++ )
      *colptr++ = NORMAL_VIDEO;

/* vd_clear_screen() */


 vid_eol_clear(): clear from the given char location to the end of
 line any attributes. Then check for embedded attributes previously
 on the line & take care of their effects */
i_eol_clear( charloc )
ar_pos *charloc;

   register short i;
   register short *colptr;
   char_pos new_charloc;

   /* set the attributes from the cursor position to the EOL to normal */
   colptr = (videotab[charloc->line].line) + charloc->column;
   for( i = charloc->column; i < MAXCOLUMNS; i++ )
colptr++ = NORMAL_VIDEO;

   /* check for embedded attributes previously on the line */
   for ( i = charloc->column-1; i >= 0; i-- )
       if ( embedded( videotab[charloc->line].line[i] ) )
    {
fdef debug
bugout( BUG5, "in vid_eol_clear(), just about to call \
      put_embedded with line %d, column %d",
      new_charloc.line,
      new_charloc.column );
ndif
new_charloc.column = i;
new_charloc.line = charloc->line;
       put_embedded( &new_charloc,
              videotab[charloc->line].line[i] );
              return( REDO_LINE );
    }
   return( LINE_OK );
/* vid_eol_clear() */


 vd_eos_clear(): clear from the given char location to end of screen */
t
.eos_clear( charloc )
ar_pos *charloc;

    int update_value;
    register short i;

    update_value = vid_eol_clear( charloc );
    for( i = charloc->line; i < MAXLINES; i++ )
 id_clearline( i );
    return( update_value );
 /* vd_eos_clear() */


  affected_chars(): returns the number of character positions affected by
  the attribute at the given location */
 t
 fected_chars( charloc )
 ar_pos *charloc;

    register short attribute;
    short side_aff;
    register short num_aff;
    register short i;
```

```
  attribute = videotab[charloc->line].line[charloc->column];
  side_aff = side_effect[attribute];
  num_aff = 0;
  for ( i = charloc->column + 1; i < MAXCOLUMNS; i++ )

   if ( videotab[charloc->line].line[i] != side_aff )
break;
   num_aff++;

  return( num_aff );
/* affected_chars() */

 highlight() :returns 1 if the given attribute is a highlight attribute
 (such as an inverse video attribute) or 0 if it's not */
ghlight( attribute )
ort attribute;

witch ( attribute ) {
   case NORMAL_VIDEO:
 return( 0 );
   case ST_REVERSE_VIDEO:
 return( 0 );
   case END_REVERSE_VIDEO:
 return( 0 );
   case REVERSE_HL:
 return( 1 );
   default:
fdef video_debug
errprintf("Unknown attribute: %d", attribute );
ndif video_debug
return( -1 );
break;
;
   return(-1);
/* highlight() */

 vid_redo_eolc(): redo line after an end-of-line clear function. Basically,
 check to see if there is a highlight attribute after the given character
 location, and if so, then highlight the rest of the line with that
 attribute *

  d_redo_eolc( charloc )
  ar_pos *charloc;

        Rect    tmp_rect;

* does the char location have a inverse video attribute? *
   if (videotab[charloc->line].line[charloc->column] == REVERSE_HL)
   {
    SetRect ( &tmp_rect, penloc.h,
                                penloc.v - fontinfo.ascent,
                                  right_margin,
                                    penloc.v + fontinfo.descent );
InvertRect ( &tmp_rect );
   }
/* vid_redo_eolc() */


 any_but_normal(): given the character position, it checks to see if there
 are any non-normal attributes from there to the end-of-line
 if there is any, it returns the first one it finds, otherwise, it
 returns NORMAL_VIDEO. */
ort
y_but_normal( charloc, numchars )
ar_pos *charloc;
gister short numchars;

egister short *colptr;
egister short i;
```

```
   colptr = (videotab[charloc->line].line) + charloc->column;
   for( i = 0; i < numchars; i++ )
   if (*colptr++ != NORMAL_VIDEO)
return( *(--colptr) );
eturn( NORMAL_VIDEO );
/* any_but_normal() */


/*.Module WINDOW_OUT.C */

 This module was created to isolate the Mac ROM routines which actually
 draw characters to the screen, so that I can put video attribute code
 in them.
/


nclude        <mac/quickdraw.h>
nclude <mac/osintf.h>
nclude        <mac/toolintf.h>
nclude        "terminal.h"
nclude "ddw.h"

 only for BUG1-BUG9 flags */
nclude  "global.h"

efine Wait_Button     {while(!Button()); while(Button());}

 this is the maximum amount of characters aprintf() (and errprintf())
 will handle */
efine MAXSTRING 200

 the following are for flush_buff */
efine XON             '\021'
efine XOFF            '\023'

tern char    *buffer; /* points to the chars to be put out on the screen */
tern int     buff_count;
tern Point   penloc; /* pen location in the main window */

fdef harv_debug
tern char lastchar;  /* for DEBUG */
ndif

tern short   right_margin;
atic short   escaping = 0;
tern char    esc_string[];
_struct      *escapes;
tern short   dumb;

tern char    ctrls[];

 try this to see if there's a problem with my GetPort() */
 Main window */
tern WindowRecord main_wrec;
tern WindowPtr main_wptr;

fdef user_debug
tern short  trace;
ndif
 userline window */

tern WindowRecord user_wrec;
tern WindowPtr user_wptr;

tern FontInfo        fontinfo; /* main window font info */

ntInfo        user_fontinfo;

tern short   charwidth; /* needed for clipping */
tern short   lineheight; /* needed for clipping */
```

```
 for user line */
ort user_load = OFF;
atic int u_loadnum = MAXUSERLINE;

 for auto line wrap */
atic short wrap_line = 1;

 for saving clip region */
atic RgnHandle save_rgn;

 for video attribute handling */
tern Rect    screen_rect;

 for echoing an unsupported (unimplemented) control character */
atic char crtl_char = 'x';

 for testing the terminal's speed, this sets the level at which we "XOFF" */
tern short xoff_level;

efine NULL '\000'
efine NONE -1

ruct line_buffer {
nar char_buffer[MAXCOLUMNS];
hort numchars;
line;

atic short char_column;

tern GrafPtr  scratchport;

 set to 1 if XON/XOFF handshaking is enabled */
tern short handshake;

tern short   max_escapes;

 initialize window_out global variables (for window_out.c) */
it_win_out()

rap_line = 1;
ave_rgn = NewRgn();

/* init_win_out()  */

 print_char(): Draw a single character in the main or user line window */
int_char( c )
ar c;

oint penlocation;
nar_pos charloc;
hort attribute;
hort lookup_att();

fdef user_debug
   bugout(BUG1,"called print_char()");
ndif
* check to see if we're loading the user line */
f (!user_load)
   {
fdef video_debug
  {
oint pt;
etPen( &pt );
f (!PtInRect( &pt, &screen_rect ) )
          bugout(BUG2,"pt not valid, pt.v %d pt.h %d", pt.v, pt.h );
```

```
   }
ndif
GetClip( save_rgn );
GetPen( &penlocation );
get_char_position( &penlocation, &charloc,
     &screen_rect );
attribute = lookup_att( &charloc );
fdef video_debug
ugout(BUG2," attribute is %d", attribute );
ndif
if (attribute == REVERSE_HL)
     {
          TextMode( srcXor );
     }
else
     /* if embedded, overwrite it with the char */
     if ( embedded( attribute ) )
  put_embedded( &charloc, NORMAL_VIDEO );
/* clip the drawing of chars to the char size */
clip_to_char();
   DrawChar( c );
TextMode( srcCopy );
SetClip( save_rgn );
/* check for long line, and line wrap */
/* wrap_line is checked to see if auto wrap is selected */
if (char_column >= MAXCOLUMNS)
   {
         flush_line();
         init_line_buff();
         if (wrap_line)
          auto_wrap();
}
} /* if (!user_load) */

/* not filled up yet and not end-of-string */
lse
  {
      if (u_loadnum < MAXUSERLINE)
  {
      SetPort( &user_wrec.port );
              DrawChar( c );
      u_loadnum++;
              SetPort( &main_wrec.port );
   }
      else
  {
      reset_user1();
      SetPort( &main_wrec.port );
      if (u_loadnum == MAXUSERLINE)
   {
fdef video_debug
  {
oint pt;
etPen( &pt );
f (!PtInRect( &pt, &screen_rect ) )
          bugout(BUG2,"pt not valid, pt.v %d pt.h %d", pt.v, pt.h );
  }
ndif
       GetClip( save_rgn );
       GetPen( &penlocation );
       get_char_position( &penlocation, &charloc,
            &screen_rect );
       attribute = lookup_att( &charloc );
fdef video_debug
ugout(BUG2," attribute is %d", attribute );
ndif
       if (attribute == REVERSE_HL)
               {
               TextMode( srcXor );
```

```
        }
        else
       /* if embedded, overwrite it with the char */
        if ( embedded( attribute ) )
        put_embedded( &charloc, NORMAL_VIDEO );
        GetClip( save_rgn );
        clip_to_char();
        DrawChar( c );
        SetClip( save_rgn );
        TextMode( srcCopy );
         /* check for long line, and line wrap */
         /* wrap_line is checked to see if auto wrap is selected */
               if (char_column >= MAXCOLUMNS)
                  {
              flush_line();
              init_line_buff();
              if (wrap_line)
                          auto_wrap();
                 }
    }
fdef debug

       else if (u_loadnum > MAXUSERLINE)
         printerr("u_loadnum got too big!", u_loadnum);
ndif debug
    }
fdef user_debug
   bugout(BUG1,"In print_char() about to SetPort back to main port");
ndif
   } /* else */

/* print_char() */

 print_string(): Draw a string in the main or user line window */
int_string( string )
ar *string;  /* character string to print out */

egister char *cptr;  /* pointer into string */
oint penlocation;    /* pen location of QuickDraw pen */
har_pos charloc;
egister short attribute;  /* video attribute of the
      * character position */
hort lookup_att();

fdef user_debug
   bugout(BUG1,"called print_string()");
ndif
ptr = string;
* if the user line isn't being loaded */
f (!user_load)
   {
GetClip( save_rgn );
       while (*cptr)
    {
fdef video_debug
  {
oint pt;
etPen( &pt );
f (!PtInRect( &pt, &screen_rect ) )
         bugout(BUG2,"pt not valid, pt.v %d pt.h %d", pt.v, pt.h );
  }
ndif
 GetPen( &penlocation );
 get_char_position( &penlocation, &charloc,
      &screen_rect );
 attribute = lookup_att( &charloc );
fdef video_debug
ugout(BUG2," attribute is %d", attribute );
ndif
```

```
if (attribute == REVERSE_HL)
    {
        TextMode( srcXor );
    }
else
    /* if embedded, overwrite it with the char */
    if ( embedded( attribute ) )
 put_embedded( &charloc, NORMAL_VIDEO );
        /* clip the drawing of chars to the char size */
clip_to_char();
        DrawChar(*cptr++);
TextMode( srcCopy );
SetClip( save_rgn );
   /* check for long line, and line wrap */
   /* wrap_line is checked to see if auto wrap is selected */

         if (char_column >= MAXCOLUMNS)
             {
          flush_line();
          init_line_buff();
          if (wrap_line)
                    auto_wrap();
             }
      }
SetClip( save_rgn );
    }
lse
   {
      SetPort( &user_wrec.port );
      while (*cptr)
   {
 /* if beyond end of user_line */
               if (u_loadnum >= MAXUSERLINE)
          if (u_loadnum > MAXUSERLINE)
              {
def user_debug
   bugout(BUG1,"u_loadnum beyond MAXUSERLINE :%d", u_loadnum);
ndif
              }
          else /* u_loadnum == MAXUSERLINE */
             {
  reset_userl();
          SetPort( &main_wrec.port );
  break;
             }
               else
            {
         DrawChar( *cptr++ );
         u_loadnum++;
    }
    } /* while (*cptr) */
    /* in case there are more to write to main */
    if (*cptr)
 GetClip( save_rgn );
    while (*cptr)
 {
fdef video_debug
  {
oint pt;
etPen( &pt );
f (!PtInRect( &pt, &screen_rect ) )
         bugout(BUG2,"pt not valid, pt.v %d pt.h %d", pt.v, pt.h );
  }
ndif
     GetPen( &penlocation );
     get_char_position( &penlocation, &charloc,
          &screen_rect );
     attribute = lookup_att( &charloc );
```

```
?def video_debug
ugout(BUG2," attribute is %d", attribute );
ndif
     if (attribute == REVERSE_HL)

         {
              TextMode( srcXor );
         }
     else

         /* if embedded, overwrite it with the char */
         if ( embedded( attribute ) )
      put_embedded( &charloc, NORMAL_VIDEO );
     clip_to_char();
     DrawChar(*cptr++);
     TextMode( srcCopy );
     SetClip( save_rgn );
         /* check for long line, and line wrap */
         /* wrap_line is checked to see if auto wrap is selected */
            if (char_column >= MAXCOLUMNS)
                {
             flush_line();
             init_line_buff();
             if (wrap_line)
                      auto_wrap();
                }
 } /* while (*cptr) */
}
/* print_string() */


 print_text(): Draw the given string, starting from start position, numchars
 chars in the main or user line window */
int_text ( string, start, numchars )
ar * string;  /* contains the characters to be printed out */
t start;   /* starting character in string */
gister int numchars;  /* number of chars to print out */

egister char *cptr; /* used to access the char string */
egister int i;   /* index */
oint penlocation;

ptr = string + start;

?def user_debug
if (strlen(cptr) > MAXSTRING)
     bugout(BUG1, "called print_text(), numchars = %d cptr is\
   too long", numchars);
         else
     bugout(BUG1,"called print_text(), \
   numchars = %d cptr is #%s#",
      numchars, cptr);
ndif user_debug
* check to see if we're loading the user line */
f (!user_load)
   {
GetPen( &penlocation );
       for (i = 0; i < numchars; i++ )
    {
 /* check putting gather_chars() in line for speed
 gather_chars(*cptr++);
 */
 /* put the char into the array */
 line.char_buffer[char_column++] = *cptr++;
 line.numchars++;
    /* check for long line, and line wrap */
    /* wrap_line is checked to see if auto wrap is selected */
        if (penlocation.h + (charwidth * char_column)
     >= right_margin)
            {
```

```
            flush_line();
            init_line_buff();
            if (wrap_line)
                        auto_wrap();
    GetPen( &penlocation );
                }
        } /* for */
      } /* if (!user_load) */
 lse
    {
 for (i = 0; i < numchars; i++ )
     {
 if (u_loadnum >= MAXUSERLINE)
     if (u_loadnum > MAXUSERLINE)
  {
 def user_debug

 gout(BUG1, "u_loadnum bigger than MAXUSERLINE  %d",
   u_loadnum);
 ndif
       /* in case the port was still set
        * to the user line for some strange
        * reason */
       SetPort( &main_wrec.port );
   }
      else /* u_loadnum == MAXUSERLINE */
   {
       flush_line();
       init_line_buff();
       reset_user1();
 def user_debug
    bugout(BUG1,"about to SetPort back to main port");
 ndif
       SetPort( &main_wrec.port );
       break;
   }
  else /* still in user line */
      {
    gather_chars( *cptr++ );
    u_loadnum++;
      }
    } /* for */
 /* in case more to write to main */
 while ( i < numchars )
     {
 def video_debug
   {
 oint pt;
 etPen( &pt );
 f (!PtInRect( &pt, &screen_rect ) )
          bugout(BUG2,"pt not valid, pt.v %d pt.h %d", pt.v, pt.h );
   }
 ndif
  GetPen( &penlocation );
         gather_chars( *cptr++ );
     /* check for long line, and line wrap */
     /* wrap_line is checked to see if auto wrap is selected */
         if (penlocation.h + (charwidth * char_column)
      >= right_margin)
             {
          flush_line();
          init_line_buff();
          if (wrap_line)
                     auto_wrap();
             }
         i++;
     } /* while ( i < numchars ) */
   } /* else */
 f (line.numchars)
```

```
   {
        flush_line();
init_line_buff();
   }

/* print_text() */

 print_scr_rep(): print the screen repesentation of the given embedded
 video attribute */
int_scr_rep( attribute )
ort attribute;

har c;
oint penlocation;

witch( attribute )
   {
case ST_REVERSE_VIDEO:
     {
 c = ' ';
 break;
     }
case END_REVERSE_VIDEO:
     {
 c = ' ';
 break;
     }
default:
     {
 c = ' ';
 break;
     }
   }
etClip( save_rgn );
lip_to_char();
rawChar( c );
etClip( save_rgn );
etPen( &penlocation );
     /* check for long line, and line wrap */
     /* wrap_line is checked to see if auto wrap is selected */
       if (penlocation.h + (charwidth * char_column)
   >= right_margin)
             {
         flush_line();
         init_line_buff();
         if (wrap_line)
                    auto_wrap();
             }
/* print_src_rep() */

 clip_to_char()
 function:  Set the clipping region of the current GrafPort to a box
 the size of a character (the dimensions of which are determined by
 global variables).
/

ip_to_char()

      Rect    tmp_rect; /* clipping rectangle */
oint   tmp_penloc;  /* point on which to anchor clipping rectangle */

etPen( &tmp_penloc );
      SetRect ( &tmp_rect, tmp_penloc.h,
                           tmp_penloc.v - lineheight,
                           tmp_penloc.h + charwidth,
                           tmp_penloc.v + fontinfo.descent );
lipRect( &tmp_rect );
/* clip_to_char() */
```

```
 merely for debugging */
tern short   curse_state;   /* terminal cursor: 1 if cursor on (black), 0 if
 * it's off */
fdef cursor_debug
tern short   curse_enable;  /* terminal cursor: OFF if cursor is off
         * (invisible), ON if it's on (black) */
ndif

ush_buff()


       register char   *cptr;
       register char   c;
       register short  nchars;
       short           xoff;
       short           n;
egister char *outptr;

       outptr = buffer;
       cptr = outptr;
fdef cursor_debug
rrprintf("in flush_buff, just before cursor(OFF), curse_state is %d\
        curse_enable is %d",
       curse_state, curse_enable);
ndif

       if ( buff_count > 0 )
           {
               cursor ( OFF );
           }
fdef cursor_debug
rrprintf("in flush_buff, just after cursor(OFF), curse_state is %d\
        curse_enable is %d",
       curse_state, curse_enable);
ndif
f (handshake)
           if ( buff_count > xoff_level )
               {
                   put_tty ( XOFF );
                   xoff = 1;
               }
           else
               {
                   xoff = 0;
               }
       MoveTo ( penloc.h, penloc.v );

       nchars = 0;
       while ( buff_count > 0 )
           {

fdef harv_debug
lastchar = *cptr;
ndif
               c = *cptr & 0x7f;

/* for echoing c in do_function()
 * in case it is an unimplemented
 * control character */

crtl_char = c;

/* this will mask
   the parity bit */

*cptr = *cptr & 0x7f;
fdef chardebug
rintf("char:%c",*cptr);
```

```
ndif
/* end of try */
                buff_count--;
                nchars++;
                if ( escaping )
                    {
                        if ( ( n = end_sequence ( c ) ) >= 0 )
                            {
                                if ( n == UNKNOWN_SEQUENCE )
                                    {
                                        print_string ("^[" );
                                        print_string( esc_string );
                                    }
                                else
                                    {
   int err;

                                        err = do_function (escapes[n].e_func);
   if (err == -1)
   print_string(
           "end_esc accept, do_funct, not");
                                    }
                                escaping = 0;
                                outptr = cptr + 1;
                            }
                        if ( buff_count == 0 )
                            {
                                break;
                            }
 /* set nchars = 0 each time end_sequence is called, no
  * matter what the result
  */
          nchars = 0;

                    }
               else if ( c < ' ' )
                    {
 if (escaping)
    {
       /* this is the case of a not-yet-terminated
        * long escape seq, prematurely terminated.
        */
                              print_string ("^[" );
                              print_string( esc_string );
    }
                        else
    {
    /* try out an optimization (which will also help
     * in debugging
     */
        if ((nchars - 1) > 0)
            print_text ( outptr, 0, nchars - 1 );
    }
                           nchars = 0;
                           outptr = cptr + 1;
    /* remaining_chars keeps track of the remaining chars
     * to be printed for do_function(), so that it can
     * scroll multiple times to save time *
    remaining_chars = buff_count;
    */
                           if ( dumb || ( ( do_function ( ctrls[(int)c] ))
         == -1 ) )

                              {
   #def escdebug
   printf("about to print caret followed by char\r\n");
```

```
ndif
  print_char('^');
  print_char( (char) ( c | 0x40 ) );
                                }
                        if ( buff_count == 0 )
                                 {
                                      break;
                                 }
                      }
                else if ( buff_count == 0 )
                      {
                           print_text ( outptr, 0, nchars );
                           break;
                      }
                cptr++;
            }
* (line.numchars)
   {
        flush_line();
init_line_buff();
   }

      GetPen ( &penloc );
      move_cursor ( &penloc );

f (handshake)
            if ( xoff )
                 {
                      put_tty ( XON );
                 }
      cursor ( ON );
/* flush_buff() */

 set up variables to begin writing to the user line */
_userl()

  SetPort( &user_wrec.port );
  EraseRect( &user_wptr->portRect );
  SetPort( &main_wrec.port );
  user_load = ON;
  u_loadnum = 0;
/* set_userl() */

  move user line pen location back to beginning */
  it assumes the calling procedure will reset the port, at least for now */
set_userl()


def user_debug
    bugout(BUG1,"called reset_userl()");
ndif
   user_load = OFF;
   SetPort( &user_wrec.port );
   /* move to beginning of user line */
   MoveTo( LEFTMARGIN,user_fontinfo.ascent );


 move the cursor to the beginning of the next line if the pen is at the
 right margin */
o_wrap()

   int err;

          err = do_function(RETURN);
          err = do_function(LINEFEED);
/* auto_wrap() */

get_char_position():  Takes a pen location and returns the line and
column of the character in given rectangle.
```

```
,_char_position( penlocation, charloc, screen_rt )
.nt *penlocation;
ır_pos *charloc;
:t *screen_rt;

ıarloc->line = (penlocation->v - screen_rt->top) / lineheight;

`def video_debug
       if ( (charloc->line < 0) )
            bugout(BUG2,"bad line number: %d", charloc->line);
ıdif
ıarloc->column = (penlocation->h - screen_rt->left) / charwidth;

`def video_debug
       if ((charloc->line < 0) && trace)
            bugout(BUG2,"bad line number: %d", charloc->line);
       bugout(BUG2,"charloc->line is %d charloc->column is %d",
         charloc->line,
         charloc->column);
ıdif

/* get_char_position() */

 get_line(): return the line number of the pen location in the given
 rectangle.
 /
,_line( penlocation, line, screen_rt )
.nt *penlocation;
ırt *line;
:t *screen_rt;

line = (penlocation->v - screen_rt->top) / lineheight;
/* get_line() */


 gather_chars():  gather the characters to be drawn on the screen into
 an array so they can be more quickly drawn later with DrawText()
/
ther_chars( c )
ır c;

: put the char into the array */
.ne.char_buffer[char_column++] = c;
ine.numchars++;
/* gather_chars() */

 phony_flush(): same as flush_line, but doesn't check for video attributes *
ony_flush()

:act chars_rect;
›int penloc;

? (user_load)
   {
        SetPort( &user_wrec.port );
)rawText(line.char_buffer, 0, line.numchars);
:eturn;
   }
:tPen( &penloc );
   GetClip( save_rgn );
:tRect( &chars_rect, penloc.h,
        penloc.v - fontinfo.ascent,
        penloc.h + ( charwidth *
          line.numchars ),
               penloc.v + fontinfo.descent);
      ClipRect( &chars_rect );
      DrawText( line.char_buffer,
```

```
    0,
    line.numchars );
        SetClip( save_rgn );
 '* phony_flush() *

 flush_line(): draws the characters in the line buffer to the screen
 with DrawText().  It goes through the array of video attributes updating
 them an using them to determine the high-lighting, if any, needed in
 printing out the characters.   Note: certain things were done in this
 function for speed, as this is the main place where time is used
 In particular, several checks are made in order to handle the
 data without entering the main loop, where a lot of time can
 be lost */
ish_line()

)int penloc;
iar_pos charloc;
-gister short attribute;
gister short highlight_att; /* highlight attribute */
iort lookup_att(), any_but_normal(), prev_embedded();
gister short i;
iort highlight_length;
iort start_chars;
gister short chars_to_draw;
ct chars_rect;

 if no characters to print, return */
 (line.numchars == 0)
   return;
 if loading user line */
 (user_load)
   {
       SetPort( &user_wrec.port );
)rawText(line.char_buffer, 0, line.numchars);
eturn;
   }
def user_debug
gout(BUG2, "in flush_line, line.numchars is %d, line.char_buffer is\
     #%s#", line.numchars, line.char_buffer );
idif
tPen( &penloc );
t_char_position( &penloc, &charloc,
      &screen_rect );

 if only normal attributes on the line, draw them and return */
 (any_but_normal( &charloc, line.numchars ) == NORMAL_VIDEO)
      {
/* don't use draw_normal_text(), as this is faster */
      GetClip( save_rgn );
      SetRect( &chars_rect, penloc.h,
              penloc.v - fontinfo.ascent,
              penloc.h + ( charwidth *
                line.numchars ),
                     penloc.v + fontinfo.descent);
            ClipRect( &chars_rect );
            DrawText( line.char_buffer,
        0,
        line.numchars );
            SetClip( save_rgn );
eturn;

   }
def user_debug
gout(BUG3, "in flush_line, any_but_normal() returns %d",
    any_but_normal( &charloc, line.numchars ) );
```

```
ndif
ighlight_att = NONE;
ighlight_length = 0;
hars_to_draw = 0;
tart_chars = 0;

* search for special (non-normal video) attributes to be handled */
or ( i = 0; i < line.numchars; i++ )
   {
attribute = lookup_att( &charloc );

if ( embedded(attribute) )
    {
        /* over-write the video attribute with the character */
        attribute = prev_embedded( &charloc );
        if (attribute == NORMAL_VIDEO)
    {
         normal_field( &charloc, chars_to_draw );
         chars_to_draw++;
    }
        else
    {
         switch( attribute ) {
       case ST_REVERSE_VIDEO:
   {
        if (!chars_to_draw)
    reverse_field( &charloc,
            highlight_length);
        else
            reverse_field( &charloc,
            chars_to_draw );
        attribute = REVERSE_HL;
             if (highlight_att == NONE)
     {
          /* optimize a little */
          if (chars_to_draw)
         {
      draw_normal_text(
         save_rgn,
         start_chars,
         chars_to_draw,
         line.char_buffer );
     chars_to_draw = 0;
         }
           highlight_att = attribute;
           highlight_length = 1;
           start_chars = i;
     }
           else if ( highlight_att !=
              attribute )
             /* draw old one on screen */
                   {
                 draw_highlight(
             start_chars,
                 highlight_length,
                 highlight_att );
         highlight_att =
       attribute;
         highlight_length = 1;
         start_chars = i;
                        }
                else /* highlight_att==
         attribute */
                         {
               highlight_length++;
                  } /* else */
         break;
    }
        case END_REVERSE_VIDEO:
```

```
    {
        normal_field( &charloc,
        chars_to_draw );
        chars_to_draw++;
        break;
    }
              default:
    {
'def flush_debug
'rintf(" prev_embedded returned unexpected result %d", attribute );
idif
        break;
    }
         } /* switch */
     } /* else */
     } /* if embedded */
else if ( highlight( attribute ))
   {
       if (highlight_att == NONE)
    {
        /* optimize a little */
        if (chars_to_draw)
    {
     draw_normal_text( save_rgn,
         start_chars,
         chars_to_draw,
         line.char_buffer );
     /*
                  GetClip( save_rgn );
              SetRect( &chars_rect, penloc.h,
       penloc.v - fontinfo.ascent,
       penloc.h + ( charwidth *
             chars_to_draw ),
              penloc.v + fontinfo.descent);
              ClipRect( &chars_rect );

       DrawText( line.char_buffer,
      start_chars,
      chars_to_draw );
       SetClip( save_rgn );
  */
  chars_to_draw = 0;
 }
     highlight_att = attribute;
     highlight_length = 1;
     start_chars = i;
 }
    else if ( highlight_att != attribute )
      /* draw old one on screen */
      {
          draw_highlight( start_chars,
            highlight_length,
            highlight_att );
   highlight_att = attribute;
   highlight_length = 1;
   start_chars = i;
      }
  else /* highlight_att == attribute */
      {
   highlight_length++;
      } /* else */
} /* if highlight */
  else
{
   if (highlight_att != NONE)
 {
```

```
        draw_highlight( start_chars,
                  highlight_length,
          highlight_att);
        highlight_att = NONE;
        chars_to_draw = 0;
        start_chars = i;
    }
        else
    chars_to_draw++;
   } /* else */
         charloc.column++;
     } /* for... */
     /* if any chars left to draw, draw them */
     /* or if any highlighted fields left draw, draw it */
  ? (chars_to_draw || (highlight_att != NONE))
     {
  if (highlight_att != NONE)
     draw_highlight( start_chars,
         highlight_length,
           highlight_att);
  !lse
     {
         /* don't use draw_normal_text(), as this is faster */
         GetClip( save_rgn );
         SetRect( &chars_rect, penloc.h,
          penloc.v - fontinfo.ascent,
          penloc.h + ( charwidth *
              chars_to_draw ),
          penloc.v + fontinfo.descent);
         ClipRect( &chars_rect );

                DrawText(line.char_buffer, start_chars, chars_to_draw );
        SetClip( save_rgn );
     }
     }
  /* flush_line() */


  draw_highlight(): draw the numchars chars starting at start from the
  global line buffer, in the given highlight effect. */
 aw_highlight( start, numchars, attribute )
 ort start;
 jister short numchars;
 ort attribute;

 itMap hl_bits;
 afPtr saveport;

 witch ( attribute ) {
 case REVERSE_HL:
     {
  Rect highlight_rect;
  Point penloc;

  /* draw highlighted chars in off-screen
  port */
  SetRect( &hl_bits.bounds, 0,
              0,
              (charwidth * numchars),
              lineheight);
  hl_bits.rowBytes = bytewidth (
       &hl_bits.bounds);
  hl_bits.baseAddr =
      NewPtr( hl_bits.rowBytes * hl_bits.bounds.bottom );
  GetPort( &saveport );
  SetPort( scratchport );
  SetPortBits( &hl_bits );
```

```
/* probably can move this font stuff to an init
 * routine */
TextFont ( Monaco );
       TextSize ( 9 );
       TextMode ( srcCopy );

/* fontinfo is the font information for the main
 * window */
MoveTo( 0, fontinfo.ascent );
DrawText(line.char_buffer, start, numchars );
InvertRect( &hl_bits.bounds );

/* now copy the results back to the port we
 * are writing to */
SetPort( saveport );
GetPen( &penloc );
SetRect( &highlight_rect, penloc.h,
     penloc.v - fontinfo.ascent,
     penloc.h + ( charwidth *
           numchars ),
            penloc.v + fontinfo.descent);

CopyBits( &hl_bits, &thePort->portBits,
              &hl_bits.bounds, &highlight_rect,
     srcCopy, (RgnHandle) 0 );

 if (hl_bits.baseAddr != NIL)
     DisposPtr( hl_bits.baseAddr );
 /* move pen, as we just put out some text, which
  * would ordinarily move the pen for us */
 Move( charwidth * numchars, 0 );

break;
    }
lefault:
    {
fdef debug
errprintf("Bad highlight value %d", attribute);
ndif
break;
    }
}

/* draw_highlight() */

init_line_buff(): Initialize the line buffer */
t_line_buff()

egister short i;
egister char *cptr;

f (line.numchars == 0)
   return;
tr = line.char_buffer;
r ( i = 0; i < line.numchars; i++ )
   *cptr++ = NULL;
ne.numchars = 0;
ar_column = 0;
```

```
scan_for_linefeeds(): It scans the entire input buffer looking for
linefeeds until it reaches the end, or one of the special characters
which will stop it -- at the moment an ESC, Cursor Home or Char Up.
The reason it stops at the special characters as they will move the
cursor thereby messing up the number of lines that can be scrolled at
once.
It returns the number of lines that can be scrolled.
```

```
in_for_linefeeds()

efine CHAR_LINEFEED  '\015'
efine CHAR_ESCAPE   '\033'
efine CHAR_HOME '\036'
efine CHAR_UP  '\013'
egister char *cptr;
egister short done = 0;
egister int scrolls = 0;
egister int lines = 0;

ptr = buffer;
nile (!done)
   {
switch (*cptr++)
    {
 case CHAR_LINEFEED:
     {
  scrolls++;
  break;
     }
 case CHAR_ESCAPE:
     {
  if (*cptr++ != 'G')
      done = 1;
  break;
     }
 case CHAR_HOME:
     {
  done = 1;
  break;
     }
 case CHAR_UP:
     {
  done = 1;
  break;
     }
case NULL:
     {
  done = 1;
  break;
     }

 default:
     break;
    } /* switch (*cptr++) */
   } /* while (!done) */
ptr--;

gout(BUG5, "in scan_for_linefeeds, scrolls is %d", scrolls);

 check for long lines */
ines = (cptr - buffer - scrolls) / MAXCOLUMNS;
 (lines > scrolls)
   scrolls = lines;

eturn( scrolls );
/* scan_for_linefeeds() */

l_echo()

rint_char('^');
rint_char( (char) ( crtl_char | 0x40 ) );
/* ctl_echo() */

 for end_sequence() */
atic char    *tgt_ptr;
atic char    *pat_ptr;
tern char    *seq_ptr;
atic short   esc_index;
```

```
Procedure: end_sequence

Function: check if the given character ends an escape sequence

Parameters:
c - char - latest character in escape sequence.

Return Values:
positive integer (short)  a match with a known escape sequence is
made, the index to that sequence is returned.
-1  Part of a sequence is matched, but sequence not yet complete
UNKNOWN_SEQUENCE the escape sequence is not one known, it has
 failed to match.

Discussion:
        This routine scans the escape sequence list to see if the new
        arrival is one we know about.  It uses global pointers to keep
        track of where it is in its search, so it can be re-entered
        for each new character ( passed as the argument 'c' ).
        It always picks up where it left off, and it gives up as soon
        as it has a match or it passes the point in the list where the
        correct string would have been had it been present.

        If a match is found, the value returned is the appropriate index
        into the escape sequence list.

        If the entire target pattern matches PART of a valid sequence, the
        value returned is -1, indicating that the search should continue
        when a new character arrives.

        If the target pattern is determined to NOT be a valid sequence,
        the value returned is UNKNOWN_SEQUENCE, indicating that the
    string of characters should simply be passed through unmolested.

Imports modified:
pat_ptr - char *  pointer to esc_string, used to put the character c
    in the escape string
tgt_ptr - char *  pointer to esc_string, used to compare current
    char with array of known escape sequences.
seq_ptr - char *  pointer to table of known escape strings
esc_index - short index into escape string table
/
d_sequence ( c )
ar     c;


                         /* add the new character to the pattern */
     *pat_ptr++ = c;
                         /* terminate the pattern temporarily */
     *pat_ptr = NULL;
for ( ;; )
   {
                 /* continue the scan where we left off last time */
       if ( *tgt_ptr++ == *seq_ptr || *seq_ptr == ANY_CHAR )
                 {
                     seq_ptr++;

                     if ( *seq_ptr == NULL )
                          {
                                   /* we have a match */
                              return ( esc_index );
                          }
                     else
                          {
                              if ( *tgt_ptr == NULL )
                                   {
                                        /* so far so good, but not complete */
                                        return ( -1 );
                                   }
                          }
```

```
                }
        else
                {
                    if ( esc_index < max_escapes - 1 )
                        {
                                    /* try the next sequence in our list */
                            esc_index++;
                            seq_ptr = escapes[esc_index].e_seq;
                                    /* reset the target pattern pointer */
                            tgt_ptr = esc_string;
                                    /* have we passed where
                                            it should have been? */
                            if ( *tgt_ptr < *seq_ptr )
                                {
                                    /* if so, it's not a valid sequence */
                                    return ( UNKNOWN_SEQUENCE );
                                }
                        }
                    else
                        {
                                    /* end of list; must not be valid */
                            return ( UNKNOWN_SEQUENCE );
                        }
                }
        }
'* end_sequence() */



   Procedure: escape

   Function:
     escape(): note that an escape came, in preparation to
    process an escape sequence

   Parameters:
   None.

   Return Values:
   None.

   Discussion:
   set escaping to indicate an escape sequence is not being processed.
   set esc_index, and escape sequence pointers up.
   If the user line is being loaded with characters, switch back to
   the main window.

   Imports modified:
   pat_ptr - char *
   tgt_ptr - char *
   seq_ptr - char *
   esc_index - short

  /
  :ape()

       escaping++;
        esc_index = 0;
        seq_ptr = escapes[esc_index].e_seq;
        pat_ptr = esc_string;
        tgt_ptr = esc_string;
  ` (user_load)
     {
  ıser_load = OFF;
  ;etPort( &main_wrec.port );
     }
  '* escape() */
```

```
 TERMINAL.H     */

 Function Codes  */

·fine NULL_FUNC 0x80 /* null function; nothing echoed */
·fine CTL_ECHO 0x81 /* echo '^' followed by char | 0x40 */
·fine RETURN  0x82 /* move cursor to beginning of line */
·fine LINEFEED 0x83 /* move cursor down one; scroll if necessary */
·fine TAB  0x84 /* move cursor to next tab stop */
·fine ESCAPE  0x85 /* begin escape sequence processing */
·fine LEFT_CURSOR 0x86 /* move cursor one position to the left */
·fine RIGHT_CURSOR 0x87 /* move cursor one position to the right */
·fine UP_CURSOR 0x88 /* move cursor one position up */
·fine DOWN_CURSOR 0x89 /* move cursor one position down */
·fine HOME_CURSOR 0x8A /* move cursor to home position ( top left ) */
·fine MOVE_CURSOR 0x8B /* move cursor to specified coordinates */
·fine EOL_CLEAR 0x8C /* erase to end of line */
·fine EOS_CLEAR 0x8D /* erase to end of screen */
·fine CLEAR_LINE 0x8E /* erase a line */
·fine CLEAR_SCREEN 0x8F /* erase entire screen */
·fine CHAR_INSERT 0x90 /* insert a character */
·fine CHAR_DELETE 0x91 /* delete a character */
·fine LINE_INSERT 0x92 /* insert a line */
·fine LINE_DELETE 0x93 /* delete a line */
·fine VID_REVERSE 0x94 /* imbedded reverse video field */
·fine VID_NORMAL 0x95 /* imbedded normal video characters */
·fine BELL  0x96 /* bell */
·fine SET_TAB  0x97 /* set tab */
·fine USER_DISPLAY 0x98 /* display user line */
·fine USER_BLANK 0x99 /* blank user line from screen */
·fine USER_LOAD 0x9A /* load user line with data */
·fine CLEAR_TO_END 0x9B /* clear page from cursor to end of page */
·fine REVERSE_LF 0x9C /* reverse linefeed */
·fine LOAD_FILE 0xA0 /* load a file */
·fine MPRINTF  0xA1 /* print error message from the tester */
·fine MACBUFF  0xA2 /* buffer a message from the tester */
·fine MACFLUSH 0xA3 /* flush the message buffer to the screen */
·fine ZTOP_THERE 0xA4 /* ztop sent this to say it's up */
·fine ZTOP_N_THERE 0xA5 /* ztop sent this to say it's exiting */

 take out for now, in ddw.h
·fine TRUE  0xFFFF

·fine FALSE  0

·fine OPTIONS          265
·fine CLEAR            1
·fine PLAYDUMB         2
·fine PRINT_TRACE 3
·fine FREE_MEM 4
·fine HIDE_WINDOWS 5
·fine SHOW_WINDOWS 6
·fine DISABLE_MENUS 7
·fine ENABLE_MENUS 8
·fine BITMAP_SIZE 9
·fine BAUD             266

 The function menu will replace the DEBUG menu for now, because
 I've run out of space along the "menu line" at the top of the screen,
 and I have had very little use for the DEBUG menu, anyway

'def harv_debug
·fine DEBUG   258
ise
·fine FUNCTION 258
idif
```

```
?def ztopdebug
efine DEBUG_ZTOP 259
idef MOVEMENT
idif

efine DEBUG_ESCAPES 260

 The function menu will replace the DEBUG menu for now, because
 I've run out of space along the "menu line" at the top of the screen,
 and I have had very little use for the DEBUG menu, anyway
,
?def harv_debug
efine BUFFSTATS 1
efine ESCAPES  2
efine LASTCHAR 3
lse
efine CANCEL  1
efine START  2
 The dividing line is a menu item, though it can't be selected.
 If it could, it would be number 3 */
efine HOLD  4
efine REPEAT  5
efine CRT  6
efine REP_PAGE 7
efine BREAK  8
 just for testing arrows & editing stuff */
efine CHR_INSERT 9
efine CHR_DELETE 10
efine LN_INSERT 11
efine LN_DELETE 12
efine PAGE_ERASE 13
idif

'def ztopdebug
efine WAVE_EDIT 1
efine WAVE_CREATE 2
efine SRC_INSERT 3
efine SRC_REPLACE 4
efine DUMP_IO_OUT 5
lse
efine UP  1
efine DOWN  2
efine LEFT  3
efine RIGHT  4
efine HOME  5
efine END  6
efine NEXT_PAGE 7
efine PREVIOUS_PAGE  8
idif

efine CLR_SCR  1
efine CLR_SCRN_N 2
efine CLR_SCR2 3
efine ST_TAB  4
efine MV_CRSR  5
efine EOL_CLRsp 6
efine EOL_CLRn  7
efine HALF_INoff 8
efine HALF_INon 9
efine CHR_INSRT 10
efine CHR_DLT  11
efine LN_INSRT  12
efine LN_DLT  13
efine OPTIONS_INDEX  7
efine BAUD_INDEX  8
'def harv_debug
efine DEBUG_INDEX 3
idef  FUNCTIONMENU
idif harv_debug
```

```
'def ztopdebug
fine DEBUG_ZTOP_INDEX 4
idef MOVEMENU
idif ztopdebug

'def esc_debug
fine DEBUG_ESC_INDEX  5
idef MODEMENU
idif esc_debug

 end of Menu defines */

 the following are my error codes which I chose arbitrarly --
 change them if they conflict with other error codes */
fine ESC_RES_ERROR    0
fine BUFSIZE          1024

fine BS               '\010'
fine LF               '\012'
fine SC               '\033'

fine ANY_CHAR         '\377'
fine COMMANDKEY       0x100
fine SHIFTKEY 0x200
fine OPTIONKEY 0x800
fine CHAR_SIX 0x36
fine CHAR_TWO 0x32
fine CTRL_ARROW 0x1e
fine CTRL_ATSIGN 0x00

 keypad Key Codes */
fine KP_CLEAR  0x47
fine KP_MINUS 0x4E
fine KP_PLUS  0x46
fine KP_MULT  0x42
fine KP_SEVEN 0x59
fine KP_EIGHT 0x5B
fine KP_NINE  0x5C
fine KP_SLASH 0x4D
fine KP_FOUR  0x56
fine KP_FIVE  0x57
fine KP_SIX  0x58
fine KP_EQUALS 0x48
fine KP_ONE  0x53
fine KP_TWO  0x54
fine KP_THREE 0x55
fine KP_ENTER 0x4C
fine KP_ZERO  0x52
fine KP_PERIOD 0x41
 end keypad Key Codes */

 Ascii codes for Mac Plus arrow keys */
'def MAC_PLUS
fine LEFT_ARROW 0x1C
fine RIGHT_ARROW 0x1D
fine DOWN_ARROW 0x1F
fine UP_ARROW 0x1e
lse
'def MAC_512K
lse
) machine specified
idif MAC_512K
idif MAC_PLUS

fine OPTION1  '\302'
fine OPTION2  '\303'
fine OPTION3  '\304'
fine OPTION4  '\305'
fine LINE_LOAD '\301'
fine DISK_LOAD '\300'
```

```
key codes for keys on keyboard */
efine ONE_KEY  0x12
efine TWO_KEY  0x13
efine THREE_KEY 0x14
efine FOUR_KEY 0x15
efine FIVE_KEY 0x17
efine SIX_KEY  0x16

efine LEFTMARGIN      5
efine TOPMARGIN 5
efine LINELENGTH      80
efine LINEHEIGHT      15
efine TOPLINE         20
efine BOTTOMLINE      332
efine MAXLINES        24
efine UNKNOWN_SEQUENCE 999

efine ON              1
efine OFF             0

moved here for window_out.c */
edef struct
 {
     char    e_func;
     char    *e_seq;
 } Esc_struct;

for video_att.c */
first line,column is 0,0 */
edef struct {
ort line;
ort column;
har_pos;

for video_att.c */
efine NORMAL_VIDEO  0
efine ST_REVERSE_VIDEO 1
efine END_REVERSE_VIDEO 2
efine REVERSE_HL  3
efine HALF_INTENSITY  4

return flags for video_att.c */
efine LINE_OK   0
efine REDO_LINE  1
efine FIRST_LINE  0

for status line */
efine END_OF_DATA '\015'  /* CR */
efine MAXUSERLINE 80

efine MAXCOLUMNS 80

these NILs work on 68000 machines, NIL may be different on
other machines */
efine NIL_HANDLE 0
efine NIL  0
efine NIL_PTR  0

edef struct del_effects {
ort redo;
t already_affected;
t affected_chars;

EL_EFF, *DEL_PTR;

maximum number of lines to scroll at one shot */
efine MAXSCROLLS 24
```

```
 these defines are for accessing the keys[] table in terminal.c */
efine COMMAND_INDEX    0
efine DEVELOP_INDEX   1
efine OPERATE_INDEX   2
efine CANCEL_INDEX   3
efine START_INDEX   4
efine HOLD_INDEX  5
efine REPEAT_INDEX   6
efine CRT_INDEX   7
efine RP_PAGE_INDEX   8
efine BREAK_INDEX   9
efine CHR_INSERT_INDEX  10
efine CHR_DELETE_INDEX  11
efine LN_INSERT_INDEX  12
efine LN_DELETE_INDEX   13
efine PAGE_ERASE_INDEX  14
efine UP_INDEX   15
efine DOWN_INDEX   16
efine LEFT_INDEX   17
efine RIGHT_INDEX  18
efine HOME_INDEX   19
efine END_INDEX   20
efine NXT_PAGE_INDEX    21
efine PREV_PAGE_INDEX   22
efine LINE_FEED_INDEX  23
efine CTRL_CLEAR_SPACE_INDEX 24
efine CTRL_SHIFT_CL_SP_IND 25

efine TESTERTIMEOUT -1

#include <mac/quickdraw.h>
#include <mac/osintf.h>
#include <mac/toolintf.h>

#include "ddw.h"
#include "global.h"

#define SPOTBLINK 30
#define MAXDATARECTS 16
#define BS  '\010'
#define CR  '\015'

extern struct QDVar QDVar;
extern  quit();
extern short *getpargs();
extern short which_loop;
extern short maxwaves;
extern Rect screenrect;
extern RgnHandle junkrgn;
extern short word_width;
extern short waiting;
extern int wait_time;
extern short edit_length;

extern MenuHandle menus[];
Handle  namehandle;

WindowRecord data_wrec;
WindowPtr data_wptr;

extern MenuHandle menus[];
extern EventRecord event;

extern wavestruct *waves;
extern short  proto_type;
extern short  maxdatawords;

ControlHandle data_scroll;
ControlHandle width_control;
TEHandle tehandle;
```

```
.ect  viewrect;
Rect  destrect;
Rect  widthbox;
Rect  contentrect;
Rect  datascreen;
Rect  numscreen;
Rect  triscreen;
Rect  addrect;
Rect  *datarect;
Rect  *numrect;
Rect  *trirect;
Rect  spotrect;
Rect  editrect;
short  blinkstate;
char  numstring[20];
short  spotwidth;
short  spotheight;
short  spot;
short  row = -1;
short  column = -1;
short  digit;
short  maxbits;
short  num_selected = -1;
short  data_selected = -1;
short  vis_data = -1;
short  curse_showing = 1;
short  hi_state = HIGH;
short  numheight;
short  maxdigits;
short  first_vis_word;
short  last_vis_word;
short  max_vis_words;
short  last_word;
short  vis_words;
short  cold_data = 1;
char  states[4] = { '0', '1', 'Z', '?' };
extern short  debug;
int  blink_time;
int  auto_start;
dedit()

{
 register i;
 Point mouseloc;
 char numstring[10];
 int value;
 int nextevent;
 int now;
 set_data_menus();

 proto_type = DATA;
 ShowWindow ( data_wptr );
 SelectWindow ( data_wptr );
 SetPort ( data_wptr );
 HiliteControl ( data_scroll, 0 );
 HiliteControl ( width_control, 0 );

 even_em_up();

 size_em_up();
 bugout ( BUG7, "maxdatawords = %d\rmax_vis_words = %d\rvis_words = %d",
   maxdatawords, max_vis_words, vis_words );
 reset_data();

 GetMouse ( &mouseloc );

 while ( which_loop == DATAEDIT )
     {
  SystemTask();
```

```
if ( waiting )
    {
 (void) ReadDateTime ( &now );
 if ( now >= wait_time +  READTIME )
     {
  aprintf("Tester did not acknowledge request.");
  waiting = 0;
     }
    }
nextevent = GetNextEvent ( everyEvent, &event );
if ( nextevent && ( !waiting || event.what == updateEvt ) )
    {
 switch ( event.what )
     {
  case mouseDown:
      {
   ded_mouse_service ( event.where );
   break;
      }
  case keyDown:
  case autoKey:
      {
    /* for wizards only:  special key
     * combinations for internal use only */

    if ( (event.modifiers & BUGMASK)
       == WIZARD )
        {
     wiz_service ( event.message
       & 0xff );
     return;
        }
   if ( num_selected > -1 )
       {
    hex_key(event.message & 0xff);
       }
   break;
      }
  case updateEvt:
      {
   update ( (WindowPtr) event.message );
   break;
      }
  default:
      {
   break;
      }
     }
    }

watch_escapes();

if ( num_selected > -1 )
    {
 blink_spot();
    }
if ( data_selected != num_selected )
    {
 if ( data_selected >= 0 )
     {
  InvertRect ( &datarect[vis_data] );
     }
 data_selected = num_selected;
 vis_data = data_selected - first_vis_word;
 if ( data_selected >= 0 )
     {
  InvertRect ( &datarect[vis_data] );
     }
    }
```

```
  curse_update();
     }
#ifdef WHAT_THE_HELL?
 for ( i = word_width; i < maxwaves; i++ )
     {
   if ( waves[i].len > 0 )
       {
   bugout ( BUG7, "Deleting wave number %d", i );
   wave_delete ( i );
       }
     }
#endif WHAT_THE_HELL?

 EnableItem ( menus[DDWMENU], DATAEDIT );
 HideWindow ( data_wptr );
}

size_em_up()

{
 int value;

 maxbits = word_width < 32 ? word_width : 32;
 maxdatawords = maxwavelen();
 last_word = maxdatawords - 1;
 last_vis_word = first_vis_word + vis_words - 1;
 vis_words = maxdatawords < max_vis_words ?
     maxdatawords : max_vis_words;
 last_vis_word = first_vis_word + vis_words - 1;
 value = maxdatawords <= max_vis_words ?
     0 : maxdatawords - max_vis_words;
 SetCtlMax ( data_scroll,  value );
 SetCtlValue ( data_scroll, first_vis_word );
}

set_data_menus()

{
 HiliteMenu ( 0 );

 EnableItem ( menus[DESKMENU], 0 );
 EnableItem ( menus[DDWMENU], 0 );
 EnableItem ( menus[DDWMENU], TERMINAL );
 EnableItem ( menus[DDWMENU], WAVEDIT );
 EnableItem ( menus[DDWMENU], LOGIC );
 DisableItem ( menus[DDWMENU], DATAEDIT );
 DisableItem ( menus[DDWMENU], PRINT );
 DisableItem ( menus[MODEMENU], 0 );
 DisableItem ( menus[FUNCTIONMENU], 0 );
 DisableItem ( menus[MOVEMENU], 0 );
 DisableItem ( menus[CONTROLMENU], 0 );
 EnableItem ( menus[PROTOMENU], 0 );
 DisableItem ( menus[PROTOMENU], INSERT );
 DisableItem ( menus[PROTOMENU], REPLACE );
 EnableItem ( menus[PROTOMENU], REVERT );
 EnableItem ( menus[EDITMENU], 0 );
 DisableItem ( menus[EDITMENU], UNDO );
 DisableItem ( menus[EDITMENU], COPY );
 DisableItem ( menus[EDITMENU], PASTE );
 DisableItem ( menus[EDITMENU], REPLICATE );
 DisableItem ( menus[DISPLAYMENU], 0 );

 DrawMenuBar();
}

curse_update()

{
 register i;
```

```
Point mouseloc;
short newrow;
short newcol;

GetMouse ( &mouseloc );
if ( PtInRect ( &mouseloc, &datascreen ) )
    {
 if ( curse_showing )
     {
  HideCursor();
  curse_showing = 0;
     }
 newrow = ( mouseloc.v - datascreen.top ) / spotheight;
 newcol = ( mouseloc.h - datascreen.left ) / spotwidth;

 if ( newrow != row || newcol != column )
     {
  if ( spot )
      {
   InvertRect ( &spotrect );
      }
  spotrect.left = datascreen.left + newcol * spotwidth;
  spotrect.top = datascreen.top + newrow * spotheight;
  spotrect.right = spotrect.left + spotwidth;
  spotrect.bottom = spotrect.top + spotheight;
  InsetRect ( &spotrect, 1, 1 );
  InvertRect ( &spotrect );
  row = newrow;
  column = newcol;
     }
 spot = 1;
    }
else
    {
 if ( PtInRect ( &mouseloc, &numscreen ) )
     {
  if ( num_selected == -1 )
      {
   num_spot ( &mouseloc, numrect );
      }
     }
 else
     {
  if ( PtInRect ( &mouseloc, &triscreen ) )
      {
   if ( num_selected == -1 )
       {
    num_spot ( &mouseloc, trirect );
       }
      }
  else
      {
   if ( spot )
       {
    InvertRect ( &spotrect );
    row = -1;
    column = -1;
    spot = 0;
       }
   if ( !curse_showing )
       {
    ShowCursor();
    curse_showing = 1;
       }
      }
     }
    }
```

```
}

num_spot ( mptr, rectptr )
Point *mptr;
Rect *rectptr;

{
 register i;
 short newrow;
 short newcol;

 if ( curse_showing )
     {
  HideCursor();
  curse_showing = 0;
     }
for ( i = 0; i < maxdatawords; i++ )
    {
 if ( PtInRect ( mptr, &rectptr[i] ) )
     {
  newrow = i;
  newcol = ( mptr->h - rectptr[i].left ) / 6;
  break;
     }
    }

if ( newrow != row || newcol != column )
    {
 if ( spot )
     {
  InvertRect ( &spotrect );
     }
 spotrect.left = rectptr[i].left + 6 * newcol;
 spotrect.top = rectptr[i].top;
 spotrect.right = spotrect.left + 6 + 1;
 spotrect.bottom = spotrect.top + numheight;
 InvertRect ( &spotrect );
 row = newrow;
 column = newcol;
    }
spot = 1;
}

new_data()

{
 int reply;
 int i;

 if ( maxwavelen() == 0 )
     {
  return;
     }

 reply = (decide1 ("All existing data will be lost.\r\rAre you sure?"));

 if ( reply == YES )
     {
  InvalRect ( &contentrect );
  InvalRect ( &widthbox );
  init_waves();
  init_names();
  init_data();
  reset_data();
  size_em_up();
     }
}

init_bits()

{
```

```
 register char *ptr;
 register ptrsize;

 ptr = (char *) waves;
 ptrsize = GetPtrSize ( (char *) waves );

 while ( ptrsize-- )
     {
  *ptr++ = 0;
     }
}

init_data()

{
 Rect tmprect;
 short new_max;

 spotwidth = 11;
 spotheight = 16;

 row = -1;
 column = -1;
 num_selected = -1;
 curse_showing = -1;
 word_width = 8;
 maxbits = word_width;

 TextFont ( Monaco );
        TextSize ( 9 );

 destrect = thePort->portBits.bounds;
 viewrect = thePort->portBits.bounds;
    /* force creation of an edit record */
 tehandle = TENew ( &destrect, &viewrect );
    /* get the lineheight from the record */
 numheight = (*tehandle)->lineHeight;
    /* let go of the handle */
 TEDispose ( tehandle );
 tehandle = (TEHandle) 0;

 if ( cold_data )
     {
  datarect = (Rect *) NewPtr ( MAXDATARECTS * sizeof (Rect) );
  numrect = (Rect *) NewPtr ( MAXDATARECTS * sizeof (Rect) );
  trirect = (Rect *) NewPtr ( MAXDATARECTS * sizeof (Rect) );
  reset_data();

  tmprect.left = data_wptr->portRect.right - 15;
  tmprect.top = data_wptr->portRect.top - 1;
  tmprect.right = data_wptr->portRect.right + 1;
  tmprect.bottom = data_wptr->portRect.bottom + 1;
  data_scroll = NewControl ( data_wptr, &tmprect, "", 1, 0, 0, 0,
        ScrollBarProc, 1 );

  SetRect ( &widthbox, 0, 0, 48, 16 );
  OffsetRect ( &widthbox, 240, 5 );
  width_control = NewControl ( data_wptr, &widthbox, "", 1, 0, 0,
        10, ScrollBarProc, 2 );
  InsetRect ( &widthbox, 16, 1 );
  cold_data = 0;
     }

first_vis_word = 0;
vis_words = 0;
last_vis_word = first_vis_word + vis_words - 1;
last_word = last_vis_word;
maxdatawords = 1;
```

```
 new_max = maxdatawords <= max_vis_words ?
     0 : maxdatawords - max_vis_words;
 bugout ( BUG7, 'new_max = %d', new_max );
 SetCtlMax ( data_scroll,  new_max );
}

reset_data()

{
 register i;
 Rect tmpdrect;
 Rect tmpnrect;
 Rect tmptrect;
 short shrinkage;

 SetRect ( &numscreen, 10, 30, 10 + 6 * 8, 290 );
 SetRect ( &triscreen,
  numscreen.right + 10, numscreen.top,
   numscreen.right + 10 + 6 * 8, numscreen.bottom );
 SetRect ( &datascreen,
   triscreen.right + 10,
   numscreen.top,
   triscreen.right + 10 + maxbits * spotwidth,
   numscreen.bottom );
 OffsetRect ( &numscreen, 0, 3 );
 OffsetRect ( &triscreen, 0, 3 );

 tmpdrect = datascreen;
 tmpdrect.bottom = datascreen.top + spotheight;
 tmpnrect = numscreen;
 tmpnrect.bottom = numscreen.top + spotheight;
 tmptrect = numscreen;
 tmptrect.bottom = triscreen.top + spotheight;
 OffsetRect ( &tmptrect, triscreen.left - numscreen.left, 0 );

 i = 0;
 while ( tmpdrect.bottom + spotheight < datascreen.bottom )
     {
  datarect[i] = tmpdrect;
  numrect[i] = tmpnrect;
  trirect[i] = tmptrect;
  OffsetRect ( &tmpdrect, 0, spotheight );
  OffsetRect ( &tmpnrect, 0, spotheight );
  OffsetRect ( &tmptrect, 0, spotheight );
  i++;
     }
 max_vis_words = i;
 if ( max_vis_words > 0 && maxbits > 0 )
     {
  last_vis_word = first_vis_word + vis_words - 1;
  datascreen.bottom = datarect[vis_words-1].bottom;
  numscreen.right = numscreen.left + 6 * ( ( maxbits + 3 ) / 4 );
  triscreen.right = triscreen.left + 6 * ( ( maxbits + 3 ) / 4 );
  numscreen.bottom = datascreen.bottom;
  triscreen.bottom = datascreen.bottom;
  SetRect ( &addrect,
      numscreen.left, datarect[vis_words-1].bottom,
    datascreen.right, data_wptr->portRect.bottom );
  SetRect ( &contentrect,
   0, datascreen.top, 485, addrect.bottom );
     }
 else
     {
  last_vis_word = 0;
  datascreen.bottom = datascreen.top;
  numscreen.right = numscreen.left + 6 * ( ( maxbits + 3 ) / 4 );
  triscreen.right = triscreen.left + 6 * ( ( maxbits + 3 ) / 4 );
  numscreen.bottom = datascreen.bottom;
  triscreen.bottom = datascreen.bottom;
```

```
  SetRect ( &addrect,
      numscreen.left, datascreen.bottom,
    datascreen.right, data_wptr->portRect.bottom );
  SetRect ( &contentrect,
    0, datascreen.top, 485, addrect.bottom );
    }
}

data_init_windows()

{
 data_wptr = GetNewWindow ( 302, (Ptr) &data_wrec, (WindowPtr) -1 );
}

ded_mouse_service ( mouseloc )
Point mouseloc;

{
 WindowPtr window;
 int  code;
 int  menu_stuff;

 GlobalToLocal ( &mouseloc );

 code = FindWindow ( &event.where, &window );
 if ( code == inMenuBar )
     {
  menu_stuff = MenuSelect ( &event.where );
  if ( num_selected > -1 && HiWord ( menu_stuff ) != EDIT )
      {
   blink_off();
   int_to_data ( hatoi ( numstring ),
      num_selected, hi_state );
   num_selected = -1;
      }
  do_menu ( menu_stuff );
     }
 else if ( code == inSysWindow )
     {
  SystemClick ( &event, window );
     }
 else if ( window == data_wptr )
     {
  data_window_service ( window, &mouseloc, code );
     }
}

data_window_service ( wptr, mptr, code )
WindowPtr wptr;
Point  *mptr;
int  code;

{
 register i;
 ControlHandle whichcontrol;
 int  controlpart;
 short  dataword;
 short  new_max;

 if ( num_selected > -1 )
     {
  blink_off();
  int_to_data ( hatoi ( numstring ), num_selected, hi_state );
  draw_data ( num_selected );
  num_selected = -1;
     }
```

```
if ( PtInRect ( mptr, &datascreen ) )
    {
 edit_bit ( mptr );
    }
else if ( PtInRect ( mptr, &numscreen ) && spot )
    {
 if ( num_selected > -1  )
     {
  draw_data ( num_selected );
     }
 edit_dep ( mptr );
    }
else if ( PtInRect ( mptr, &triscreen ) && spot )
    {
 if ( num_selected > -1  )
     {
  draw_data ( num_selected );
     }
 edit_tri ( mptr );
    }
 else if ( PtInRect ( mptr, &addrect ) && last_vis_word == last_word )
     {
  add_word();
     }
 else
     {
  controlpart = FindControl ( mptr, data_wptr, &whichcontrol );
  if ( controlpart )
      {
   if ( whichcontrol == data_scroll )
       {
    data_control ( whichcontrol, mptr );
       }
   else if ( whichcontrol == width_control )
       {
    set_width ( whichcontrol, controlpart, mptr );
       }
   FlushEvents ( mDownMask + mUpMask, 0 );
      }
     }
}

data_control ( whichcontrol, mptr )
ControlHandle whichcontrol;
Point  *mptr;

{
 int  controlpart;

 controlpart = TrackControl ( whichcontrol, mptr, (ProcPtr) 0 );

 switch ( controlpart )
     {
  case inUpButton:
      {
   up_one();
   break;
      }
  case inDownButton:
      {
   down_one();
   break;
      }
  case inPageUp:
      {
   up_page();
   break;
      }
  case inPageDown:
```

```
    {
  down_page();
  break;
    }
 case inThumb:
    {
  go_direct ();
    break;
      }
     }
}

up_one()

{
 if ( first_vis_word > 0 )
     {
  first_vis_word--;
  last_vis_word--;
  SetCtlValue ( data_scroll, first_vis_word );
  ScrollRect ( &numscreen, 0, spotheight, junkrgn );
  ScrollRect ( &triscreen, 0, spotheight, junkrgn );
  ScrollRect ( &datascreen, 0, spotheight, junkrgn );
  draw_lines ( datarect[0].top, datarect[0].bottom );
  draw_data ( first_vis_word );
     }
}

down_one()

{
 if ( last_vis_word < maxdatawords - 1 )
     {
  if ( data_selected >= 0 )
      {
   InvertRect ( &datarect[vis_data] );
   data_selected = -1;
   vis_data = -1;
      }
  first_vis_word++;
  last_vis_word++;
  SetCtlValue ( data_scroll, first_vis_word );
  ScrollRect ( &numscreen, 0, -spotheight, junkrgn );
  ScrollRect ( &triscreen, 0, -spotheight, junkrgn );
  ScrollRect ( &datascreen, 0, -spotheight, junkrgn );
  draw_lines ( datarect[vis_words-1].top,
       datarect[vis_words-1].bottom );
  draw_data ( last_vis_word );
     }
}

up_page()

{
 if ( first_vis_word > max_vis_words )
     {
  first_vis_word -= max_vis_words;
     }
 else
     {
  first_vis_word = 0;
     }
 if ( data_selected >= 0 )
     {
  InvertRect ( &datarect[vis_data] );
  data_selected = -1;
  vis_data = -1;
     }
```

```
   last_vis_word = first_vis_word + vis_words - 1;
   SetCtlValue ( data_scroll, first_vis_word );
   draw_lines ( datascreen.top, datarect[vis_words-1].bottom );
   draw_all_data();
 }

 down_page()

 {
  if ( last_vis_word + max_vis_words < maxdatawords )
      {
   first_vis_word += max_vis_words;
      }
  else
      {
   first_vis_word = maxdatawords - vis_words;
      }
  if ( data_selected >= 0 )
      {
   InvertRect ( &datarect[vis_data] );
   data_selected = -1;
   vis_data = -1;
      }
  last_vis_word = first_vis_word + vis_words - 1;
  SetCtlValue ( data_scroll, first_vis_word );
  draw_lines ( datascreen.top, datarect[vis_words-1].bottom );
  draw_all_data();
 }

 go_direct()

 {
  first_vis_word = GetCtlValue ( data_scroll );
  last_vis_word = first_vis_word + vis_words - 1;
  if ( data_selected >= 0 )
      {
   InvertRect ( &datarect[vis_data] );
   data_selected = -1;
   vis_data = -1;
      }
  draw_lines ( datascreen.top, datarect[vis_words-1].bottom );
  draw_all_data();
 }

 hex_key ( c )
 char c;

 {
  if ( ishex ( c ) )
      {
   numstring[digit] = c;
  int_to_data ( hatoi ( numstring ), num_selected, hi_state );
  draw_data ( num_selected );
     }

if ( ishex ( c ) ||  c == ' ' )
    {
 if ( digit < ( maxbits + 3 ) / 4 - 1 )
      {
  digit++;
  blink_off();
  OffsetRect ( &editrect, 6, 0 );
  InvertRect ( &editrect );
  blinkstate = 1;
      }
    }
else if ( c == '\010' )
    {
```

```
  if ( digit > 0 )
     {
    digit--;
    blink_off();
    OffsetRect ( &editrect, -6, 0 );
    InvertRect ( &editrect );
    blinkstate = 1;
     }
    }
 else if ( c == '\015' )
    {
  blink_off();
  num_selected++;
  row++;
  column = 0;
  digit = 0;
  if ( editrect.left < triscreen.left )
     {
   editrect.left = numscreen.left + 6 * column;
   editrect.top = numrect[num_selected].top;
   editrect.right = editrect.left + 6 + 1;
   editrect.bottom = editrect.top + numheight;
     }
  else
     {
   editrect.left = triscreen.left + 6 * column;
   editrect.top = trirect[num_selected].top;
   editrect.right = editrect.left + 6 + 1;
   editrect.bottom = editrect.top + numheight;
     }
  if ( num_selected > last_word )
     {
   add_word();
     }
  sputnhex ( numstring, data_to_int ( num_selected, HIGH ),
      ( maxbits + 3 ) / 4 );
    }
 else
    {
  SysBeep ( 1 );
    }
}

add_word()

{
 register short i;
 register short dataword;
 short new_max;

 dataword = maxdatawords;
 for ( i = 0; i < maxbits; i++ )
    {
  if ( waves[i].len == 0 )
     {
   if ( waves[i].data )
      {
    DisposPtr ( waves[i].data );
    waves[i].len = 0;
      }
   waves[i].data =
    (unsigned char *) NewPtr ( edit_length / 4 );
     }
  append ( i, LOW, 1 );
    }
 maxdatawords++;
 last_word++;
 new_max = maxdatawords <= max_vis_words ?
    0 : maxdatawords - max_vis_words;
```

```
SetCtlMax ( data_scroll,  new_max );
vis_words = maxdatawords < max_vis_words ?
   maxdatawords : max_vis_words;
reset_data();
if ( dataword > last_vis_word )
    {
 down_one();
    }
else
    {
 draw_lines ( datarect[vis_words-1].top,
    datarect[vis_words-1].bottom );
 draw_dep ( dataword );
 draw_tri ( dataword );
 draw_data ( dataword );
    }
}

edit_dep ( mptr )
Point *mptr;

{
 register i;

 for ( i = 0; i < maxdatawords; i++ )
    {
  if ( PtInRect ( mptr, &numrect[i] ) )
    {
  break;
    }
   }

 num_selected = i + first_vis_word;
 digit = column;
 editrect = spotrect;
 blinkstate = 1;
 hi_state = HIGH;
 spot = 0;

 sputnhex ( numstring,
  data_to_int ( num_selected, HIGH ), ( maxbits + 3 ) / 4 );
}


edit_tri ( mptr )
Point *mptr;

{
 register i;

 for ( i = 0; i < maxdatawords; i++ )
    {
  if ( PtInRect ( mptr, &trirect[i] ) )
    {
  break;
    }
   }

 num_selected = i + first_vis_word;
 digit = column;
 editrect = spotrect;
 blinkstate = 1;
 hi_state = TRISTATE;
 spot = 0;

 sputnhex ( numstring,
  data_to_int ( num_selected, TRISTATE ), ( maxbits + 3 ) / 4 );
}
```

```
edit_bit ( mptr )
Point *mptr;

{
 register i;
 short state;
 short dataword;
 short databit;

 column = ( mptr->h - datascreen.left ) / spotwidth;
 databit = maxbits - column - 1;
 dataword = ( mptr->v - datascreen.top ) / spotheight + first_vis_word;
 state = State ( databit, dataword );
 state = state == TRISTATE ? LOW : state + 1;
 newstate ( databit, dataword, state );

 InvertRect ( &spotrect );
 draw_bit ( dataword, databit );
 InvertRect ( &spotrect );

 draw_dep ( dataword );
 draw_tri ( dataword );
}

data_edit_window()

{
 char widthstring[10];

 GetClip ( junkrgn );
 EraseRect ( &thePort->portRect );
 DrawControls ( data_wptr );
 TextFont ( systemFont );
 TextSize ( 12 );
 TextMode ( srcOr );
 TextFace ( 0 );
 MoveTo ( 10, widthbox.bottom - 2 );
 DrawString ( 'Deposit' );
 MoveTo ( 68 , widthbox.bottom - 2 );
 DrawString ( 'Tristate' );
 MoveTo ( widthbox.left - 55, widthbox.bottom - 2 );
 DrawString ( 'Word' );
 MoveTo ( widthbox.right + 21, widthbox.bottom - 2 );
 DrawString ( 'Width' );
 ClipRect ( &widthbox );
 NumToString ( word_width, widthstring );
 TextFont ( Monaco );
 TextSize ( 9 );
 TextFace ( boldStyle );
 TextBox ( widthstring, strlen ( widthstring ),
       &widthbox, teJustCenter );
 SetClip ( junkrgn );
 draw_lines ( datascreen.top, datarect[vis_words-1].bottom );
 draw_all_data();
 if ( spot )
     {
  InvertRect ( &spotrect );
     }
 ClipRect ( &thePort->portRect );
}

draw_lines ( ceiling, floor)
int ceiling;
int floor;

{
 register i;
 register column;
 int  right_side;
```

```
 if ( word_width == 0 || vis_words == 0 )
     {
  return;
     }

 right_side = datascreen.left + ( maxbits * spotwidth );

 for ( i = 0; i <= word_width; i++ )
     {
  if ( i % 8 == 0 )
     {
   PenSize ( 2, 1 );
     }
  else
      {
   PenSize ( 1, 1 );
      }
  column = right_side - ( i * spotwidth );
  MoveTo ( column, ceiling );
  LineTo ( column, floor );
     }
 PenSize ( 1, 1 );
}

draw_all_data()

{
 register i;

 if ( word_width > 0 )
     {
  for ( i = first_vis_word; i <= last_vis_word; i++ )
      {
   draw_data ( i );
      }
     }
}

draw_data ( dataword )
short dataword;

{
 register i;
 Rect  tmprect;
 short  state;
 short  row;
 short  column;
 short  vis;
 char  c;

 vis = dataword - first_vis_word;
 if ( vis < 0 || vis >= vis_words || dataword >= maxdatawords  )
     {
  return;
     }

 draw_dep ( dataword );
 draw_tri ( dataword );

 TextFont ( systemFont );
 TextSize ( 12 );
 TextMode ( srcCopy );
 TextFace ( 0 );

 column = datarect[vis].left + 2;
 row = datarect[vis].bottom - 3;
 SetRect ( &tmprect, column,
    datarect[vis].bottom - spotheight + 1,
     column + spotwidth - 2, row );
```

```
  if ( vis == vis_data )
      {
   TextMode ( srcBic );
      }
  for ( i = maxbits - 1; i >= 0; i-- )
      {
   MoveTo ( column, row );
   state = State ( i, dataword );
   c = states[state];
   ClipRect ( &tmprect );
   if ( vis == vis_data )
       {
    FillRect ( &tmprect, &QDVar.black );
       }
   DrawChar ( c );
   column += spotwidth;
   OffsetRect ( &tmprect, spotwidth, 0 );
      }

 TextMode ( srcOr );
 ClipRect ( &thePort->portRect );
}

draw_bit ( dataword, databit )
short dataword;
short databit;

{
 Rect tmprect;
 short state;
 short vis;
 char c;

 vis = dataword - first_vis_word;
 if ( vis < 0 || vis >= vis_words )
     {
  return;
     }
 if ( vis == vis_data )
     {
  TextMode ( srcBic );
     }
else
     {
 TextMode ( srcCopy );
     }

TextFont ( systemFont );
TextSize ( 12 );
TextFace ( 0 );

state = State ( databit, dataword );
c = states[state];

tmprect = datarect[vis];
tmprect.right = datarect[vis].left + spotwidth - 1;
OffsetRect ( &tmprect, ( maxbits - databit - 1 ) * spotwidth, 0 );

MoveTo ( tmprect.left + 2, tmprect.bottom - 3 );
ClipRect ( &tmprect );
if ( vis == vis_data )
    {
 FillRect ( &tmprect, &QDVar.black );
    }
DrawChar ( c );
TextMode ( srcOr );
ClipRect ( &thePort->portRect );
}
```

```
draw_dep ( dataword )
short dataword;

{
 short vis;
 char tmp_string[10];

 vis = dataword - first_vis_word;
 if ( vis < 0 || vis >= vis_words || word_width == 0 )
     {
  return;
     }

 TextFont ( Monaco );
 TextSize ( 9 );
 TextMode ( srcCopy );
 TextFace ( 0 );

 blink_off();
 sputnhex ( tmp_string,
  data_to_int ( dataword, HIGH ), ( maxbits + 3 ) / 4 );
 TextBox ( tmp_string, strlen ( tmp_string ),
     &numrect[vis], teJustLeft );

 TextFont ( systemFont );
 TextSize ( 12 );
}

draw_tri ( dataword )
short dataword;

{
 short vis;
 char tmp_string[10];

 vis = dataword - first_vis_word;
 if ( vis < 0 || vis >= vis_words || word_width == 0 )
     {
  return;
     }

 TextFont ( Monaco );
 TextSize ( 9 );
 TextMode ( srcCopy );
 TextFace ( 0 );

 blink_off();
 sputnhex ( tmp_string,
  data_to_int ( dataword, TRISTATE ), ( maxbits + 3 ) / 4 );
 TextBox ( tmp_string, strlen ( tmp_string ),
     &trirect[vis], teJustLeft );

 TextFont ( systemFont );
 TextSize ( 12 );
}

int_to_data ( data, word, hi_type )
unsigned data;
int word;
short hi_type;

{
 short i;

 for ( i = 0; i < maxbits; i++ )
     {
  if ( data & 1 )
      {
   newstate ( i, word, hi_type );
      }
```

```
  else
      {
    if ( State ( i, word ) == hi_type )
        {
     newstate ( i, word, LOW );
        }
      }
  data >>= 1;
      }
}

blink_spot()

{
        register     now;

        now = TickCount();

        if ( now - blink_time > SPOTBLINK )
      {
  if ( num_selected > -1 )
       {
   InvertRect ( &editrect );
   blinkstate = !blinkstate;
       }
  blink_time = now;
      }
}

blink_off()

{
 if ( blinkstate )
      {
  InvertRect ( &editrect );
  blinkstate = 0;
      }
}

ishex( c )
char c;

{
 if ( (( c >= '0' ) && ( c <= '9' )) || (( c >= 'a' ) && ( c <= 'f' ))
      {                                                        || (( c >=
  return( 1 );
      }
 else
      {
  return( 0 );
      }
}

hatoi ( ptr )
char *ptr;

{
 register char c;
 unsigned register value = 0;

  while ( c = *ptr++ )
       {
  if ( c >= '0' && c <= '9' )
       {
   value = ( value << 4 ) + ( c & 0x0f );
       }
  else if (( c >= 'a' && c <= 'f' ) || ( c >= 'A' && c <= 'F' ))
       {
   value = ( value << 4 ) + ( c & 0x0f ) + 9;
       }
```

```
  else
      {
   break;
      }
      }
 return ( value );
}

even_em_up()

{
 int length;
 int i;

 length = maxwavelen();

 for ( i = 0; i < word_width; i++ )
     {
  if ( waves[i].len < length )
      {

   append ( i, State ( i, ( waves[i].len ) - 1 ),
      length - waves[i].len );
      }
     }
}

auto_click()

{
 struct
     {
  short  part_code;
  ControlHandle ctl_hdl;
     } my_args;

 int now;
 char widthstring[10];

 getpargs ( &my_args, sizeof my_args );

 now = TickCount();

 switch ( my_args.part_code )
     {
  case inUpButton:
      {
   InvalRect ( &contentrect );
   if ( now > auto_start + 30 && word_width > 0 )
       {
    if ( now % 10 == 0 )
        {
     word_width--;
     maxbits--;
     NumToString (word_width, widthstring);
     TextBox ( widthstring,
      strlen ( widthstring ),
          &widthbox, teJustCenter );
        }
       }
   break;
      }
  case inDownButton:
      {
   if ( now > auto_start + 30 && word_width < 32 )
       {
    if ( now % 10 == 0 )
        {
```

```
      word_width++;
      maxbits++;
      NumToString (word_width, widthstring);
      TextBox ( widthstring,
       strlen ( widthstring ),
           &widthbox, teJustCenter );
         }
        }
    InvalRect ( &contentrect );
    break;
       }
   default:
       {
    break;
       }
     }
}

set_width ( whichcontrol, controlpart, mptr )
ControlHandle whichcontrol;
int  controlpart;
Point  *mptr;

{
 register i;
 wavestruct tmpwave;
 int newpart;
 int old_width;
 char widthstring[10];

 TextFont ( Monaco );
 TextSize ( 9 );
 TextFace ( boldStyle );

 old_width = word_width;
 if ( controlpart != inThumb )
     {
  auto_start = TickCount();
  newpart =
      TrackControl ( whichcontrol, mptr, (ProcPtr) auto_click );
     }
 else
     {
  newpart = controlpart;
      }

  switch ( newpart )
      {
   case inUpButton:
       {
    if ( word_width > 0 )
        {
     word_width--;
     maxbits--;
     NumToString ( word_width, widthstring );
     TextBox ( widthstring,
      strlen ( widthstring ),
          &widthbox, teJustCenter );
     reset_data();
        }
    break;
       }
   case inDownButton:
       {
    if ( word_width < 32 )
        {
     word_width++;
     maxbits++;
```

```
    TextBox ( widthstring,
     strlen ( widthstring ),
         &widthbox, teJustCenter );
    reset_data();
       }
   break;
      }
  default:
      {
   break;
      }
     }

 if ( word_width > old_width )
     {
  for ( i = old_width; i < word_width; i++ )
      {
   if ( waves[i].data )
       {
    DisposPtr ( waves[i].data );
    waves[i].len = 0;
       }
   waves[i].data =
    (unsigned char *) NewPtr ( edit_length / 4 );
   append ( i, LOW, maxdatawords );
      }
     }
 else if ( word_width < old_width )
     {
  for ( i = word_width; i < old_width; i++ )
      {
   if ( waves[i].data )
        {
     DisposPtr ( waves[i].data );
     waves[i].len = 0;
        }
       }
      }

  InvalRect ( &widthbox );
 }

 deci_filter()

 {
  modalargs args;
  short *funretptr;
  char numstring[10];
  char c;

  funretptr = (short *) getpargs ( &args, sizeof args );

  switch ( args.event->what )
      {
   case mouseDown:
       {
    *funretptr = 0;
    break;
       }
   case keyDown:
   case autoKey:
       {
    c = args.event->message & 0xff;
    switch ( c )
        {
     case BS:
         {
      *funretptr = 0;
      break;
```

```
            }
        case CR:
            {
         *(args.itemhit) = OK;
         *funretptr = 0xffff;
         break;
            }
        default:
            {
         if ( c < '0' || c > '9' )
             {
          SysBeep ( 1 );
          *(args.itemhit) = TEXT;
          *funretptr = 0xffff;
             }
         else
             {
          GetIText ( namehandle,
            numstring );
            if ( strlen ( numstring )
              > maxdigits )
                {
             *(args.itemhit) = TEXT;
             *funretptr = 0xffff;
                }
            else
                {
             *funretptr = 0;
                }
              }
           break;
              }
             }
        break;
            }
        default:
            {
         *funretptr = 0;
         break;
            }
           }
}

#ifdef OBSOLETE?
fetch_decimal ( prompt, cptr, max )
char *prompt;
char *cptr;
int max;

{
 Rect  itembox;
 Handle  itemhandle;
 DialogRecord dlogrec;
 DialogPtr dlogptr;
 int  itemhit;
 char  buffer[256];

 maxdigits = max;
 sprintf ( buffer, "%r", &prompt );
 dlogptr =  GetNewDialog ( 261, (Ptr)&dlogrec, (WindowPtr) -1 );

 if ( dlogptr == 0 )
     {
  aprintf ( "GetNewDialog() Failed.\rBummer!" );
  return ( -1 );
     }
 else
     {
```

```
   save_te_windows();
   GetDItem ( dlogptr, 3, &itemhit, &itemhandle, &itembox );
   SetIText ( itemhandle, buffer );
   GetDItem ( dlogptr, TEXT, &itemhit, &namehandle, &itembox );
   InsetRect ( &itembox, 60, 0 );
   SetDItem ( dlogptr, TEXT, itemhit, namehandle, &itembox );
   SetIText ( namehandle, numstring );
   SelIText ( dlogptr, 4, 0, 50 );
   ShowWindow ( (WindowPtr) dlogptr );

   do
       {
    ModalDialog ( deci_filter, &itemhit );
    switch ( itemhit )
        {
     case OK:
         {
      GetIText ( namehandle, cptr );
      word_width = atoi ( cptr );
      if (word_width < 1 || word_width > 32)
          {
       aprintf ( "Invalid width.\rData width must be greater than 0 and less
       than 32"
       update ( data_wptr );
       itemhit = 99;
          }
      break;
         }
     case Cancel:
         {
      break;
         }
     case TEXT:
         {
      break;
         }
     default:
         {
      aprintf ( "Unexpected Item Number: %d",
         itemhit );
         }
        }
       }
   while ( itemhit > Cancel );
   CloseDialog ( dlogptr );
   return ( itemhit );
      }
}
#endif OBSOLETE?

data_check()

{
 register i;
 int len;
 int last_len;
 int not_even = 0;
 int reply;
 int count;

 last_len = waves[0].len;

 if ( ( count = max_wave() ) > 32 )
     {
```

```
  count = 32;
      }

 for ( i = 0; i < count; i++ )
      {
  if ( ( len = waves[i].len ) > 0 )
       {
   word_width = i + 1;
       }
  if ( len != last_len )
       {
   not_even++;
       }
      }

 if ( not_even )
      {   .
  reply  = ( decide1
 ("These waveforms must be evened up for data editing.\rProceed?"));
  if ( reply != YES )
       {
   EnableItem ( menus[DDWMENU], DATAEDIT );
   HideWindow ( data_wptr );
   which_loop = WAVEDIT;
   return ( 0 );
       }
      }
 return ( 1 );

}

data_cut()

{
 register short i;
 Rect tmprect;

 if ( num_selected >= 0 )
      {
  for ( i = 0; i < maxbits; i++ )
       {
   copy_wave ( &waves[i], &waves[i],
    num_selected + 1, num_selected,
     waves[i].len - num_selected - 1 );
    waves[i].len--;
       }
  num_selected = -1;
  InvalRect ( &numscreen );
  InvalRect ( &triscreen );
  tmprect = datascreen;
  InsetRect ( &tmprect, -4, -4 );
  InvalRect ( &tmprect );
  InvalRect ( &widthbox );
  size_em_up();
      }
}

data_revert()

{
 revert();
 init_data();
 reset_data();
 (void) data_check();
 even_em_up();
 size_em_up();
}
```

```
#include <mac/quickdraw.h>
#include <mac/osintf.h>
#include <mac/toolintf.h>
#include "global.h"
#include "ddw.h"

#define DDW_MAGIC 0x1234567
#define DoubleTime (*((int*)(0x02f0)))

extern struct QDVar QDVar;

extern ControlHandle w_hscroll;
extern ControlHandle w_vscroll;
extern WindowPtr wavewptr;
extern Rect  screenrect;
extern Rect  wavescreen;
extern int  last_up;
extern short  edit_length;
extern short debug;

extern int resume();

EventRecord event;

WindowRecord wavewrec;

WindowRecord protowrec;
ControlHandle p_vscroll;

WindowRecord poswrec;

extern GrafPtr scratchport;

BitMap wavebits;  /* waveform drawing area */

Rect tmprect;
Rect namescreen;
extern Rect *waverect;

CursHandle curshdl;
WindowRecord cursewrec;

extern Block block;  /* file input block */
extern short block_count;
extern short firstwave;
extern short lastwave;
extern short expand;
extern wavestruct *waves; /* array of waveform structures */
short in_count = 0;

extern wavestruct undo_wave; /* "undo" storage area */
extern wavestruct clipboard; /* "clipboard" storage for waveform data */

char *serial_input_buffer;

extern short waveheight; /* height of waveforms ( in pixels ) */
extern short clockwidth; /* width of single clock ( in pixels ) */
extern short firstclock; /* first visible clock in wave windoe */
extern short lastclock; /* last visible clock in wave windoe */
extern short viswaves; /* number of waveforms currently visible */
extern short wavechange;
extern short maxlength;
extern short scrolling;
short gridheight; /* height of grid ( in pixels ) */
short gridwidth; /* width of grid ( in pixels ) */
short updating;
short saved_wave;

extern Point curse_org;
extern Point curse_end;
```

```
int curse_time;
short curse_on;
short curse_state;

Rect sel_rect;
short lo_select, hi_select;
short sel_wave;
short sel_clock;
short sel_count;

wave_edit( mouseptr )
Point *mouseptr;

{
 register i;
 register wave;
 register state;
 short length;
 short clock, lastclk, highclock;
 short vis;
 short start, end;
 short editing, inserting;
 short save_expand;
 short maxlength;

  /* find out which *visible* wave we're dinking in */

 for ( vis = 0; vis < viswaves; vis++ )
     {
  if ( PtInRect ( mouseptr, &waverect[vis] ) )
      {
   switch ( ( mouseptr->v - waverect[vis].top )
        / waveheight )
       {
    case 0:
        {
     state = HIGH;
     break;
        }
    case 1:
        {
     state = TRISTATE;
     break;
        }
    case 2:
        {
     state = LOW;
     break;
        }
       }
   break;
      }
     }
  /* convert visible wave to actual wave */
 wave = vis + firstwave;
 if ( waves[wave].len == 0 && waves[wave].data == (Byte *) 0 )
     {
  if ( waves[wave].data )
      {
   DisposPtr ( waves[wave].data );
      }
  waves[wave].data =
    (Byte *) NewPtr ( ( edit_length + 3 ) / 4 );
     }

maxlength = maxwavelen();
save_expand = expand;
expand = 0;
wave_unexpand ( wave );
```

```
wave_save ( wave );
clock = ( ( mouseptr->h - waverect[vis].left ) / clockwidth )
       + firstclock;
lastclk = clock - 1;
highclock = lastclk;
if ( clock > waves[wave].len )
    {
 state = NOT_USED;
    }
if ( curse_on && wave == sel_wave )
    {
 editing = FALSE;
 if ( clock == sel_clock && clock <= waves[wave].len )
     {
  inserting = TRUE;
     }
 else
     {
  inserting = FALSE;
     }
    }
else
    {
 erase_curse();
 curse_on = FALSE;
 erase_select();
 sel_wave = -1;
 inserting = FALSE;
 editing = TRUE;
    }

while ( StillDown() )
    {
 if ( PtInRect ( mouseptr, &waverect[vis] ) )
     {
  clock = ( ( mouseptr->h - waverect[vis].left )
      / clockwidth ) + firstclock;
  if ( clock > lastclock )
      {
   clock = lastclock;  /* last clock on screen */
      }
  if ( clock != lastclk )
      {
   start = lastclk < clock ? lastclk
        : clock - 1;
   end = lastclk < clock ? clock + 1
        : lastclk;
   length = end - start + 1;
   if ( inserting && clock > highclock )
       {
    if ( waves[wave].len >= edit_length )
        {
     erase_curse();
     wave_overflow();
     update ( wavewptr );
        }
    else
        {
     insert ( sel_wave, sel_clock,
      state, length - 2 );
     erase_curse();
     draw_wave ( wave, 0,
      edit_length, srcCopy );
     highclock = clock;
        }
       }
   else if ( editing )
       {
    for ( i = start+1; i <= end-1; i++ )
        {
```

```
      newstate ( wave, i, state );
         }
      draw_wave ( wave, start,
        length, srcCopy );
        }
   lastclk = clock;
       }
     }
  GetMouse ( mouseptr );
    }
 wavechange++;
 expand = save_expand;
 if ( expand )
    {
  if ( maxwavelen() != maxlength )
     {
   expand_all();
     }
  else
     {
   wave_expand ( wave );
   draw_wave ( wave, firstclock, edit_length, srcCopy );
     }
    }
 set_controls();
}

wave_select ( mptr )
Point *mptr;

{
 BitMap tmpbits;
 BitMap savebits;
 BitMap wavebits;
 Point mousept;
 short wave;
 short vis;
 short clock, lastclk;
 short org;
 short last_sel;

 erase_curse();
 erase_select();
 sel_count = 0;
 curse_on = FALSE;
 last_sel = sel_wave;
 sel_wave = -1;
 for ( vis = 0; vis < viswaves; vis++ )
    {
  if ( PtInRect ( mptr, &waverect[vis] ) )
     {
   wave = vis + firstwave;

   mousept = *mptr;
     /* round up so cursor will 'snap' to nearest clock */
   mptr->h += clockwidth / 2;
   clock = ( mptr->h - waverect[vis].left ) / clockwidth
        + firstclock;
   if ( clock > waves[wave].len )
      {
    clock = waves[wave].len;
      }

   lo_select = org;
   hi_select = lo_select;
   sel_wave = wave;
   lastclk = clock;
   org = clock;
   break;
```

```
      }
     }

   /* set up wave storage area */
  wavebits.bounds = waverect[vis];
  OffsetRect ( &wavebits.bounds,
    -waverect[vis].left, -waverect[vis].top );
  wavebits.rowBytes = bytewidth ( &wavebits.bounds );
  wavebits.baseAddr =
   NewPtr ( wavebits.rowBytes * wavebits.bounds.bottom );

    /* grab a clean copy of the waveform */
  HideCursor();
  CopyBits ( &thePort->portBits, &wavebits,
    &waverect[vis], &wavebits.bounds,
     srcCopy, (RgnHandle) 0 );
  ShowCursor();

  if ( wave == last_sel && event.when - last_up < DoubleTime )
      {
   sel_wave = wave;
   sel_count = waves[wave].len;
   lo_select = 0;
   hi_select = sel_count;
   sel_clock = lo_select;
   sel_rect = waverect[vis];
   if ( hi_select < lastclock )
       {
     sel_rect.right = sel_rect.left +
      ( hi_select - firstclock ) * clockwidth;
       }
   OffsetRect ( &sel_rect,
    -waverect[vis].left, -waverect[vis].top );
   draw_wave ( wave, 0, sel_count, srcCopy );
   while ( StillDown() )
       {
       }
   DisposPtr ( wavebits.baseAddr );
   return;
      }

    /* create a temporary work area */
  tmpbits = wavebits;
  tmpbits.baseAddr =
   NewPtr ( tmpbits.rowBytes * tmpbits.bounds.bottom );

  while ( StillDown() )
      {
   if ( PtInRect ( &mousept, &waverect[vis] ) )
       {
    mousept.h += clockwidth / 2;
    clock = ( mousept.h - waverect[vis].left ) / clockwidth
         + firstclock;
    if ( clock > waves[wave].len )
        {
     clock = waves[wave].len;
        }
     lo_select = org < clock ? org : clock;
     hi_select = org < clock ? clock : org;

     if ( clock != lastclk )
        {
      CopyBits ( &wavebits,
           &tmpbits,
            &wavebits.bounds,
             &tmpbits.bounds,
              srcCopy,
        (RgnHandle) 0 );
```

```
     sel_rect = tmpbits.bounds;
     sel_rect.left =
         ( lo_select - firstclock ) * clockwidth;
     sel_rect.top += waveheight - 2;
     sel_rect.right =
         ( hi_select - firstclock ) * clockwidth;
     sel_rect.bottom -= waveheight - 2;

     savebits = thePort->portBits;
     SetPort ( scratchport );
     SetPortBits ( &tmpbits );
     InvertRect ( &sel_rect );
     SetPort ( &wavewrec.port );
     SetPortBits ( &savebits );
     CopyBits ( &tmpbits,
          &thePort->portBits,
           &tmpbits.bounds,
            &waverect[vis],
             srcCopy,
       (RgnHandle) 0 );

     lastclk = clock;
        }
       }
   GetMouse ( &mousept );
      }

  if ( lo_select == hi_select )
      {
     /* compute new end points for cursor */
   curse_org.h = waverect[vis].left +
     ( lo_select - firstclock ) * clockwidth;
   curse_org.v = waverect[vis].top;
   curse_end.h = curse_org.h;
   curse_end.v = curse_org.v + ( 3 * waveheight );
   curse_on = TRUE;
      }
  sel_count = hi_select - lo_select;
  sel_clock = lo_select;
  DisposPtr ( wavebits.baseAddr );
  DisposPtr ( tmpbits.baseAddr );
}
wave_cut ()

{
bugout ( BUG7, "sel_wave = %d\rlo_select = %d, hi_select = %d\rsel_count = %d",
   sel_wave, lo_select, hi_select, sel_count );

 if ( sel_count > 0 )
     {
  wave_save ( sel_wave );
  erase_select();
  erase_curse();
  curse_on = FALSE;
  copy_wave ( &waves[sel_wave], &clipboard,
    lo_select, 0, sel_count );
  clipboard.len = sel_count;

  copy_wave ( &waves[sel_wave], &waves[sel_wave],
    hi_select, lo_select,
     waves[sel_wave].len - hi_select );
  waves[sel_wave].len -= sel_count;

  hi_select = lo_select;
  sel_count = 0;
  sel_clock = lo_select;
  sel_update();
  if ( expand )
      {
```

```
    if ( maxwavelen() != maxlength )
        {
     expand_all();
        }
    else
        {
     wave_expand ( sel_wave );
        }
       }
   draw_wave ( sel_wave, firstclock, edit_length, srcCopy );
      }
 set_controls();
}

wave_copy()

{
 if ( sel_count > 0 )
      {
  copy_wave ( &waves[sel_wave], &clipboard,
    lo_select, 0, sel_count );
  clipboard.len = sel_count;
      }
}

wave_paste()

{
 if ( waves[sel_wave].len + clipboard.len > edit_length )
      {
  erase_curse();
  wave_overflow();
  update ( wavewptr );
  return;
      }
 if ( waves[sel_wave].len == 0 && waves[sel_wave].data == (Byte *) 0 )
      {
  if ( waves[sel_wave].data )
       {
   DisposPtr ( waves[sel_wave].data );
       }
  waves[sel_wave].data =
    (Byte *) NewPtr ( ( edit_length + 3 ) / 4 );
      }
 if ( sel_wave >= 0 && clipboard.len > 0 )
      {
  wave_save ( sel_wave );
  erase_curse();
  curse_on = FALSE;
  if ( sel_count > 0 )
       {
   wave_save ( sel_wave );
   erase_select();
   copy_wave ( &waves[sel_wave], &waves[sel_wave],
     hi_select + 1, lo_select,
         waves[sel_wave].len - hi_select );
   waves[sel_wave].len -= sel_count;
   hi_select = lo_select;
   sel_count = 0;
   sel_clock = lo_select;
   sel_update();
       }
  insert ( sel_wave, sel_clock, LOW, clipboard.len );
  copy_wave ( &clipboard, &waves[sel_wave],
     0, sel_clock, clipboard.len );
  if ( expand )
       {
   if ( maxwavelen() != maxlength )
        {
```

```
    expand_all();
        }
    else
        {
    wave_expand ( sel_wave );
        }
      }
  draw_wave ( sel_wave, firstclock, edit_length, srcCopy );
    }
 set_controls();
}

wave_replicate()

{
 Rect tmp_rect;
 Point mouseloc;
 short vis;
 short rep_count;

 if ( sel_count < 1 )
     {
  return;
     }
 rep_count = sel_count;

 wave_save ( sel_wave );
 erase_curse();
 erase_select();
 tmp_rect = sel_rect;

 vis = sel_wave - firstwave;
 OffsetRect ( &tmp_rect,
  waverect[vis].left, waverect[vis].top );
 if ( tmp_rect.left < waverect[vis].left )
     {
  tmp_rect.left = waverect[vis].left;
     }
 if ( tmp_rect.right > waverect[vis].right )
     {
  tmp_rect.right = waverect[vis].right;
     }
 tmp_rect.top = waverect[vis].top;
 tmp_rect.bottom = waverect[vis].bottom;
 PenMode ( patXor );
 FrameRect ( &tmp_rect );
 sel_count = 0;

 for ( ;; )
     {
  if ( GetNextEvent( everyEvent, &event ) )
      {
   if ( event.what == mouseDown )
       {
    GetMouse ( &mouseloc );
    if ( PtInRect( &mouseloc, &tmp_rect ) )
        {
     if ( waves[sel_wave].len + rep_count
        > edit_length )
         {
      wave_overflow();
      update ( wavewptr );
      FrameRect ( &tmp_rect );
         }
     else
         {
      insert ( sel_wave,
        hi_select,
        LOW,
```

```
       rep_count );
     copy_wave( &waves[sel_wave],
         &waves[sel_wave],
            sel_clock,
            hi_select,
            rep_count );
        wave_expand ( sel_wave );
        draw_wave ( sel_wave,
             hi_select,
             edit_length,
             srcCopy );
          }
         }
     else
         {
      break;
         }
        }
       }
      }
 PenMode ( patXor );
 FrameRect ( &tmp_rect );
 sel_wave = -1;
 return ( -1 );
}

wave_delete ( wave )
short wave;

{
 Point origin;
 register i;

 SetPt ( &origin, 0, 0 );

 waves[wave].org = origin;
 waves[wave].len = 0;
 waves[wave].name[0] = NULL;

 for ( i = 0; i < edit_length / 4; i++ )
     {
  waves[wave].data[i] = 0xFF;
     }
}

wave_save ( wave )
short wave;

{
 dupe_wave ( &waves[wave], &undo_wave );
 saved_wave = wave;
}

wave_restore()

{
 wavestruct tmp_wave;

 tmp_wave.data = (unsigned char *) NewPtr ( edit_length / 4 );
if ( saved_wave >= 0 )
    {
 dupe_wave ( &waves[saved_wave], &tmp_wave );
 dupe_wave ( &undo_wave, &waves[saved_wave] );
 dupe_wave ( &tmp_wave, &undo_wave );

 wave_expand ( saved_wave );
 if ( maxwavelen() != maxlength )
     {
  expand_all();
     }
 else
     {
```

```
   wave_expand ( saved_wave );
      }
 . draw_wave ( saved_wave, firstclock, edit_length, srcCopy );
     }

 DisposPtr ( tmp_wave.data );
}

dupe_wave ( src_ptr, dst_ptr )
wavestruct *src_ptr, *dst_ptr;

{
 dst_ptr->org = src_ptr->org;
 dst_ptr->len = src_ptr->len;
 strcpy ( dst_ptr->name, src_ptr->name );
 bytecopy ( dst_ptr->data, src_ptr->data, ( src_ptr->len + 3 ) / 4 );
}

copy_wave ( src_waveptr, dst_waveptr, src_clock, dst_clock, length )
wavestruct *src_waveptr, *dst_waveptr;
short src_clock, dst_clock;
int length;

{
 register unsigned char src_mask, dst_mask;
 register unsigned char tmp_byte;
 register unsigned char *src_ptr, *dst_ptr;
 short i;

 TextMode ( srcCopy );
 src_ptr = &( src_waveptr->data[src_clock/4] );
 dst_ptr = &( dst_waveptr->data[dst_clock/4] );

 src_mask = 0xC0 >> ( src_clock % 4 ) * 2;
 dst_mask = 0xC0 >> ( dst_clock % 4 ) * 2;

 for ( i = 0; i < length; i++ )
     {
  *dst_ptr &= ~dst_mask;
  tmp_byte = *src_ptr & src_mask;
  if ( src_mask >= dst_mask )
      {
   while ( tmp_byte & ~dst_mask )
       {
    tmp_byte >>= 2;
       }
      }
  else
      {
   while ( tmp_byte & ~dst_mask )
       {
    tmp_byte <<= 2;
       }
      }

  *dst_ptr |= tmp_byte;


  if ( src_mask == 0x03 )
      {
   src_mask = 0xC0;
   src_ptr++;
      }
  else
      {
   src_mask >>= 2;
      }
  if ( dst_mask == 0x03 )
      {
```

```
    dst_mask = 0xC0;
    dst_ptr++;
        }
   else
        {
    dst_mask >>= 2;
        }
      }
}

sel_update()

{
 Rect tmp_rect;
 short vis;

 vis = sel_wave - firstwave;
 if ( sel_count > 0 )
     {
   /* compute new selection highlighting rectangle */

  sel_rect = waverect[vis];
  OffsetRect ( &sel_rect, -sel_rect.left, -sel_rect.top );

  sel_rect.left = ( ( lo_select - firstclock ) * clockwidth );
  sel_rect.top += waveheight - 2;
  sel_rect.right = ( ( hi_select - firstclock )  * clockwidth );
  sel_rect.bottom -= waveheight - 2;

#ifdef MAYBE_NOT
  if ( !scrolling )
      {
   tmp_rect = sel_rect;
   OffsetRect ( &tmp_rect, waverect[vis].left,
     waverect[vis].top );
   InvertRect ( &tmp_rect );
      }
#endif MAYBE_NOT
     }
   /* compute new end points for cursor */

 if ( lo_select == hi_select )
     {
  curse_org.h = waverect[vis].left +
    ( lo_select - firstclock ) * clockwidth;
  curse_org.v = waverect[vis].top;
  curse_end.h = curse_org.h;
  curse_end.v = curse_org.v + ( 3 * waveheight );
     }
}

erase_curse()

{
    /* if cursor is active */
 if ( curse_on )
     {
    /* and it is currently visible */
  if ( curse_state )
      {
    /* carefully remove it from display */
   PenMode ( patXor );
   MoveTo ( curse_org.h, curse_org.v );
   LineTo ( curse_end.h, curse_end.v );
   PenMode ( patOr );
   curse_state = 0;
      }
     }
}
```

```
erase_select()

{
 Rect tmp_rect;
 short vis;
 short count;


 vis = sel_wave - firstwave;
 if ( sel_count > 0 )
     {
  count = sel_count;
  sel_count = 0;
  draw_wave ( sel_wave, lo_select, count, srcCopy );
  sel_count = count;
     }
}

shownum ( strptr, num )
char *strptr;
int num;

{
 char string[50];

 TextMode ( srcCopy );
 DrawString ( strptr );
 NumToString ( num, string );
 DrawString ( string );
}

wave_overflow()

{
 aprintf ( "Sorry!\r This operation would make the waveform
           longer than the current limi
}



/*
    wavedraw.c

 This module contains most of the routines which actually draw
 things on the screen for the wave editor and  logic analyzer.
*/


#include <mac/quickdraw.h>
#include <mac/osintf.h>
#include <mac/toolintf.h>
#include "global.h"
#include "ddw.h"

#define TRIHIGH 3

extern struct QDVar QDVar;
extern MenuHandle menus[MAXMENUS];
extern wavestruct *waves;
extern RgnHandle scrollrgn;
extern cursestruct  cursors[]; /* array of cursors */

extern WindowRecord wavewrec;
extern Rect screenrect;
extern Rect wavescreen;
extern Rect namescreen;
extern Rect bus_screen;
extern Rect hscrollrect;
extern short hair_on;
```

```
extern Rect hair_rect;
extern Rect hair2_rect;
extern BitMap wavebits;  /* waveform drawing area */
extern BitMap snapshot;  /* hairline background storage */
extern BitMap snap2shot;  /* hairline background storage */
extern short ind_clock;
extern short ind2_clock;
extern short curse_on;
extern short curse_state;
extern short cur_curs;
extern short wave_curs;
extern short saved_wave;
extern short debug;
extern short numheight; /* height of numeric text line ( in pixels ) */
extern short maxwaves; /* total number of active waveforms */
extern short maxclocks;
extern short edit_length;
extern short which_loop;
extern short comp1;
extern short comp2;
extern short sel_wave;
extern short sel_count;
extern short bus_width;
extern WindowPtr wavewptr;
extern ControlHandle w_hscroll;
extern ControlHandle w_vscroll;
extern short textheight; /* height of text line ( in pixels ) */
extern short cur_size;
extern short cur_scale;
extern short lo_select, hi_select;

Rect *namerect;
Rect bus_box;
short clockwidth; /* width of single clock ( in pixels ) */
short gridheight; /* height of grid ( in pixels ) */
short gridwidth; /* width of grid ( in pixels ) */
short vert_offset; /* vertical offset from one waveform to the next */
Rect viewrect, destrect;

short log_size;
short wav_size;
Point curse_org;
Point curse_end;
extern short scale[];
extern short size[];
extern short hair_top;
extern short hair_bottom;
extern short hair_pos;
extern short hair2_pos;
extern short proto_length;
extern short firstclock; /* first visible clock in the window */
extern short lastclock; /* last visible clock in the window */
extern short visclocks; /* number of clocks currently visible */
extern short firstwave; /* first visible waveform in window */
extern short lastwave; /* last visible waveform in window */
extern short viswaves; /* number of waveforms currently visible */
extern short greatest;

TEHandle tehandle;
Rect  *waverect;
BitMap  gridbits;  /* background grid */
GrafPtr  scratchport;
short  gray_wave;
short  grid_on;    /* !0 = display grid,  0 = don't display grid */
Rect  damaged_rect;
RgnHandle ind_handle;
RgnHandle ind2_handle;
RgnHandle save_region;
```

```
short  waveheight; /* height of waveforms ( in pixels ) */
short  maxlength;
short  expand;
short  expand_length;
/*
 draw_wave ( wave, clock, count, mode )

 Draws waveform number 'wave', starting at clock number 'clock'
 for 'count' clock cycles, using pen mode 'mode'.
 current pen location.

 In addition to drawing the waveform, this routine takes care of any
 highlighting and/or foreign objects (hairlines) that may need
 updating as a result of the new drawing.
*/

draw_wave ( wave, clock, count, mode )
int wave, clock, count, mode;
{
     /* current data byte in waveform array */
 register unsigned char thisbyte;
 register short  offset;      /* bit offset into data byte */
 RgnHandle save_region;
 Rect newrect;     /* rectangle where new waveform will be drawn */
 Rect snap_rect;   /* 'snapshot' area behind hairline */
 Rect tmp_rect;    /* general purpose utility rectangle */
 GrafPtr saveport;    /* storage for current grafport */
 short i;      /* general purpose index/counter/whatever */
 short clk;      /* current action clock */
 short vdelta;      /* vertical dimension of waveform */
 short endtravel;   /* right-most pixel from first clock */
 short state;
 short newstate;    /* new logic state for current clock */
 short laststate;   /* old logic state for current clock */
 short vis;      /* mapping of 'wave' into visible waveforms */
 short wave_width;
 short line_width;
 short cycles;
 short real_end;



 if ( waves[wave].len == 0 && waves[wave].data == (Byte *) 0 )
     {
   if ( waves[wave].data )
      {
    DisposPtr ( waves[wave].data );
      }
   waves[wave].data =
     (Byte *) NewPtr ( ( edit_length + 3 ) / 4 );
     }

   /* if the requested waveform is not on the screen, return */

 if ( wave < firstwave || wave > lastwave || clock > lastclock )
     {
   return;
     }
 /* remember the current grafport */
GetPort ( &saveport );
SetPort ( wavewptr );
save_region = NewRgn();
GetClip ( save_region );

 /* determine which wave on the screen is the one we want */

vis = wave - firstwave;

 /* compute vertical dimension of waveform, keeping line
    thickness ( LINEWIDTH ) in mind */
```

```
vdelta = waveheight - ( LINEWIDTH - 1 );

 /* do not try to draw any clock cycle that is not visible */

if ( clock < firstclock )
    {
 clock = firstclock;
 count -= firstclock - clock;
    }

 /* compute how far "clock" is from right edge of screen */

endtravel = wavescreen.right - wavescreen.left -
   ( ( clock - firstclock) * clockwidth );

if ( count * clockwidth > endtravel )
    {
 wave_width = endtravel / clockwidth;
    }
else
    {
 wave_width = count;
    }

 /* determine what state we're coming from */
if ( clock > 0 )
    {
 laststate = State ( wave, clock - 1 );
    }
else
    {
 laststate = State ( wave, 0 );
    }

    /* set array index to the byte which contains our first clock */
i = clock / 4;

 /* get that byte */
thisbyte = waves[wave].data[i];

 /* determine where our bit pair is within this byte */
offset = ( 3 - clock % 4 ) * 2;
state = ( thisbyte >> offset ) & 0x03;

 /* set up a temporary bit map to draw in */

wavebits.bounds = gridbits.bounds;
wavebits.bounds.right = wave_width * clockwidth;
wavebits.bounds.bottom -= ( 2 * waveheight ) - 4;
wavebits.rowBytes = bytewidth ( &wavebits.bounds );
wavebits.baseAddr =
  NewPtr ( wavebits.rowBytes * wavebits.bounds.bottom );

 /* make sure the clock count doesn't go past end-of-wave */

real_end = waves[wave].len - firstclock;
if ( expand && waves[wave].len
  && expand_length % waves[wave].len == 0
   /* && expand_length - clock < count */ )
    {
 count = expand_length - clock;
    }
else
    {
 if ( waves[wave].len - clock < count )
     {
  count = waves[wave].len - clock;
     }
    }
```

```
if ( count * clockwidth > endtravel )
    {
    count = endtravel / clockwidth;
    }

    /* point our pen at our scratch port */

SetPort ( scratchport );
SetPortBits ( &wavebits );
    /* wipe it clean */
zero_bits ( &wavebits );

    /* if grid is on, copy the grid bits in first */
if ( grid_on )
    {
    tmp_rect = wavebits.bounds;
    OffsetRect ( &tmp_rect, 0, waveheight - 2 );
    CopyBits ( &gridbits, &wavebits,
        &tmp_rect, &wavebits.bounds,
        srcCopy, (RgnHandle) 0 );
    }

    /* now we can OR our waveform on top of the grid */
PenMode ( patOr );
PenSize ( 1, LINEWIDTH );

    /* position our pen at the appropriate starting position */
if ( laststate == LOW )
    {
    MoveTo ( 0, wavebits.bounds.bottom - 2 - LINEWTDTH );
    }
else
    {
    MoveTo ( 0, wavebits.bounds.top + 2 );
    }

/* Here we go... */

/* for ( clk = 0; clk < count; clk++ ) */
clk = 0;
while ( clk < count )
    {
    /* if we're in compare mode, use gray pen */

    if ( wave_curs == COMPARE )
        {
        if ( wave == comp1 || wave == comp2 )
            {
            PenPat ( &QDVar.black );
            }
        else
            {
            PenPat ( &QDVar.gray );
            }
        }
    else
        /* also use gray if it's forced on us by the global or we're expanding */
        {
        if ( gray_wave ||
            ( expand && clock + clk > waves[wave].len - 1 ) )
            {
            PenPat ( &QDVar.gray );
            }
        else
            {
            PenPat ( &QDVar.black );
            }
        }
```

```
/* begin new junk */

  newstate = state;
  cycles = 0;

  do
      {
   cycles++;
   clk++;
   if ( offset == 0 )
       {
    i++;
    thisbyte = waves[wave].data[i];
    offset = 6;
       }
   else
       {
    offset -= 2;
       }
   state = ( thisbyte >> offset ) & 0x03;
      }
  while ( cycles < count &&
    state == newstate && clk < real_end );
  line_width = cycles * clockwidth;

/* end new junk */
   /* read the new state from the data */

 /* newstate = ( thisbyte >> offset ) & 0x03; */

     /* our action is determined, in part,  by the previous state */

  switch ( laststate )
      {
   case LOW:
       {
    switch ( newstate )
        {
     case LOW:
         {  /* draw horizontal */
      Line ( line_width, 0 );
      break;
         }
     case HIGH:
         {  /* draw rise, then horizontal */
      Line ( 0, -vdelta );
      Line ( line_width, 0 );
      break;
         }
     case TRISTATE:
         {
      Move ( 0, -vdelta );
      PenSize ( 1, vdelta + 2 );
      PenPat ( &QDVar.gray );
      Line ( line_width, 0 );
      PenSize ( 1, LINEWIDTH );
      PenPat ( &QDVar.black );
      break;
         }
     case TRIHIGH:
         {
      break;
         }
        }
    break;
       }
   case HIGH:
       {
```

```
  switch ( newstate )
      {
   case LOW:
       { /* draw fall, then horizontal */
    Line ( 0, vdelta );
    Line ( line_width, 0 );
    break;
       }
   case HIGH:
       {  /* draw horizontal */
    Line ( line_width, 0 );
    break;
       }
   case TRISTATE:
       {
    PenSize ( 1, vdelta + 2 );
    PenPat ( &QDVar.gray );
    Line ( line_width, 0 );
    PenSize ( 1, 2 );
    PenPat ( &QDVar.black );
    break;
       }
   case NOT_USED:
       {
    break;
       }
     }
  break;
    }
 case TRISTATE:
    {
  switch ( newstate )
      {
   case LOW:
       {
    Move ( 0, vdelta );
    Line ( line_width, 0 );
    break;
       }
   case HIGH:
       {
    Line ( line_width, 0 );
    break;
       }
   case TRISTATE:
       {
    PenSize ( 1, vdelta + 2 );
    PenPat ( &QDVar.gray );
    Line ( line_width, 0 );
    PenSize ( 1, 2 );
    PenPat ( &QDVar.black );
    break;
       }
   case NOT_USED:
       {
    break;
       }
     }
  break;
    }
   }
  laststate = newstate;

#ifdef OLD_WAY
   /* roll on to the next clock */
  laststate = newstate;

  if ( offset == 0 )
      {
```

```
   i++;
   thisbyte = waves[wave].data[i];
   offset = 6;
      }
  else
      {
   offset -= 2;
      }
#endif OLD_WAY
     }

 /* if this wave is involved in a compare, highlight it accordingly */

 if ( wave == comp1 || wave == comp2 )
     {
  if ( comp1 >= 0 && comp2 >= 0 )
      {
   tmp_rect = wavebits.bounds;
   tmp_rect.right = tmp_rect.left + clockwidth;

   i = clock;

   for ( clk = 0; clk < count; clk++ )
       {
    if ( State ( comp1, i ) != State ( comp2, i ) )
        {
     InvertRect ( &tmp_rect );
        }
    OffsetRect ( &tmp_rect, clockwidth, 0 );
    i++;
       }
      }
     }

    /* if this waveform is involved in a selection, highlight it accordingly */

 if ( wave == sel_wave && sel_count > 0 )
     {
  tmp_rect = wavebits.bounds;
  tmp_rect.right = tmp_rect.left + clockwidth;

  i = clock;

  for ( clk = 0; clk < count; clk++ )
      {
   if (i >= lo_select && i < hi_select && i <= lastclock)
       {
    InvertRect ( &tmp_rect );
        }
    OffsetRect ( &tmp_rect, clockwidth, 0 );
    i++;
       }
     } /* end of drawing loop */

   /* let's go back to our waveform window now */

  SetPort ( wavewptr );
  PenSize ( 1, 1 );

   /* figure out which piece of screen we're replacing */

  newrect = wavebits.bounds;
  OffsetRect ( &newrect,
      waverect[vis].left + ( ( clock - firstclock ) * clockwidth ),
      waverect[vis].top + waveheight - 2 );
   /* copy our newly drawn waveform onto the screen */

  CopyBits ( &wavebits, &thePort->portBits,
    &wavebits.bounds, &newrect, srcCopy, (RgnHandle)0 );
```

```
 /* update the snapshot behind the hairline */

 if ( hair_on && SectRect ( &hair_rect, &newrect, &tmp_rect ) )
     {
  SetRect ( &damaged_rect, hair_rect.left,
       waverect[vis].top + waveheight,
    hair_rect.right,
        waverect[vis].bottom - waveheight );

  snap_rect = damaged_rect;
  OffsetRect ( &snap_rect,
   -hair_rect.left, -hair_rect.top );
  CopyBits ( &thePort->portBits, &snapshot,
    &damaged_rect, &snap_rect,
     srcCopy, (RgnHandle) 0 );

  ClipRect ( &waverect[vis] );
  draw_hair ( ind_handle, ind_clock, srcOr );
  SetClip ( save_region );
     }

 if ( hair_on && SectRect ( &hair2_rect, &newrect, &tmp_rect ) )
     {
  SetRect ( &damaged_rect, hair2_rect.left,
       waverect[vis].top + waveheight,
    hair2_rect.right,
        waverect[vis].bottom - waveheight );
  snap_rect = damaged_rect;
  OffsetRect ( &snap_rect,
   -hair2_rect.left, -hair2_rect.top );

  CopyBits ( &thePort->portBits, &snap2shot,
    &damaged_rect, &snap_rect,
     srcCopy, (RgnHandle) 0 );

  ClipRect ( &waverect[vis] );
  draw_hair ( ind2_handle, ind2_clock, srcOr );
  SetClip ( save_region );
     }

  /* throw away our scratch pad */

 DisposPtr ( wavebits.baseAddr );

  /* restore the port */
 SetPort ( saveport );
 SetClip ( save_region );
 DisposeRgn ( save_region );
}

expand_all ( draw )
int draw;

{
 register i;

 if ( expand )
     {
  SetCursor ( &cursors[WAIT].c_cursor );
  for ( i = 0; i < maxwaves; i++ )
     {
   wave_expand ( i );
     }
  if ( draw )
     {
   draw_vis_waves ( srcCopy );
     }
  InitCursor();
     }
```

```
}

wave_expand ( wave )
int wave;

{
 register maxlen;
 register length;
 register count;
 short save_expand;

 expand_length = maxwavelen();
 if ( waves[wave].len == 0 || !expand )
     {
  return;
     }
 else if ( waves[wave].len && expand_length % waves[wave].len != 0 )
     {
  wave_unexpand ( wave );
  return;
      }

  length = waves[wave].len;
  count = length;

  while ( count < expand_length )
      {
   copy_wave ( &waves[wave], &waves[wave], 0, count, length );
   count += length;
      }
 }

 wave_unexpand ( wave )
 int wave;

 {
  register maxlen;
  register length;
  short save_expand;

  if ( waves[wave].len == 0 )
      {
   return;
      }

  save_expand = expand;
  expand = 0;
  draw_wave ( wave, waves[wave].len, edit_length, srcCopy );
  expand = save_expand;
 }

/*
 draw_grid  -- Draw the background pattern of reference dots
 for all visible waveforms.
*/

draw_grid( mode )
int mode;

{
 int i;

 for ( i = 0; i < viswaves; i++ )
     {
  CopyBits ( &gridbits, &thePort->portBits,
    &gridbits.bounds, &waverect[i],
          mode, (RgnHandle)0 );
     }
}
```

```
show_rect ( str, rect )
char *str;
Rect *rect;

{
 aprintf ( "%s = %d, %d, %d, %d", str,
   rect->left, rect->top, rect->right, rect->bottom );
}

/*
 draw_vis_waves  --  Draw all waveforms and names which are
 currently visible on the screen, using the pen mode indicated
 by the argument.
*/

draw_vis_waves ( mode )
int mode;

{
 register i;

 for ( i = firstwave; i < firstwave + viswaves; i++ )
      {
  draw_name ( i );
  draw_wave ( i, firstclock, visclocks, mode );
      }
}

/*
 draw_all_waves  -- Draw all waveforms, starting at clock number
 "start" for a length of "len", using pen mode "mode".
*/

draw_all_waves ( start, len, mode )
int start, len, mode;

{
 register i;

 for ( i = firstwave; i < firstwave + viswaves; i++ )
      {
  draw_wave ( i, start, len, mode );
      }
}

/*
 draw_name  --  Draw the name on the screen for the waveform indicated.

 If we're in Logic Analyzer mode and the current waveform size
 indicates things are really scrunched up, scale the font down.
*/

draw_name ( wave )
int wave;

{
 GrafPtr saveport;
 short vis;

 GetPort ( &saveport );
 SetPort ( wavewptr );
 TextMode ( srcOr );
 PenMode ( patOr );

 vis = wave - firstwave;
 if ( which_loop == LOGIC && cur_size == 1 )
     {
  TextFont ( Monaco );
  TextSize ( 7 );
  TextFace ( 0 );
```

```
      }
  else
      {
   if ( cur_size == 1 )
       {
    TextFont ( Monaco );
    TextSize ( 9 );
    TextFace ( boldStyle );
       }
   else
       {
    TextFont ( systemFont );
    TextSize ( 0 );
    TextFace ( 0 );
       }
      }
  if ( namerect[vis].top != 0 )
      {
   TextBox ( waves[wave].name, strlen ( waves[wave].name ),
      &namerect[vis], teJustRight );
      }
  SetPort ( saveport );
 }

 /*
  grid_toggle  -- Toggle the grid_on global variable and erase
  or re-draw the background grid accordingly.
 */

 grid_toggle ()

 {
  short i;

  if ( !grid_on )
      {
    /* turn off any waveform selection for a sec */
   erase_select();
   grid_on = 1;
    /* OR in the dot pattern */
   draw_grid ( srcOr );
    /* turn waveform selection back on now */
   sel_update();
      }
  else
      {
   erase_select();
   grid_on = 0;
   draw_all_waves ( firstclock, visclocks, srcCopy );
   sel_update();
      }
 }

/*
 new_scale  -- Adjust the world so waveforms will henceforth be drawn
 in the scale indicated by the argument.
*/

new_scale ( n )
int n;

{
 short i;
 short tmp;

    /* Un-check the old size on the menu */
 CheckItem ( menus[DISPLAYMENU], cur_scale + 4, FALSE );
    /* change our scale global */
 cur_scale = n;
```

```
   /* check the new size on the menu */
CheckItem ( menus[DISPLAYMENU], cur_scale + 4, TRUE );
   /* un-draw the hairline for now */
draw_hair ( ind_handle, ind_clock, srcBic );
draw_hair ( ind2_handle, ind2_clock, srcBic );

   /* erase the waveforms */
EraseRect ( &wavescreen );
   /* establish the new screen format */
set_format ( scale[cur_scale - 1], waveheight );
   /* pretend the hairline isn't on, regardless */
tmp = hair_on;
hair_on = 0;

if ( grid_on )
    {
 draw_all_waves ( firstclock, visclocks, srcOr );
    }
else
    {
 draw_all_waves ( firstclock, visclocks, srcCopy );
    }
  /* compute new end points for the blinking cursor */
curse_org.h = waverect[sel_wave].left +
   ( lo_select * clockwidth );
curse_org.v = waverect[sel_wave].top;
curse_end.h = curse_org.h;
curse_end.v = curse_org.v + ( 3 * waveheight );

  /* update the waveform selection */
sel_update();
  /* restore hair flag  */
hair_on = tmp;
  /* re-compute the hairline position */
hair_pos = new_hair_pos ( ind_handle, ind_clock, &hair_rect );
hair2_pos = new_hair_pos ( ind2_handle, ind2_clock, &hair2_rect );

  /* take a new snapshot behind hairline */
snap_hair ( ind_handle );
 snap_hair ( ind2_handle );

   /* re-draw hairline if necessary */
 if ( hair_on )
     {
  draw_hair ( ind_handle, ind_clock, srcOr );
  draw_hair ( ind2_handle, ind2_clock, srcOr );
/*
  hair_deactivate( ind_handle );
  hair_deactivate( ind2_handle );
*/
     }
}
/*
 new_size  -- Adjust the world so waveforms will henceforth be drawn
 in the size indicated by the argument.
*/

new_size ( n )
int n;

{
 short i;
 short tmp;

    /* un-check the old size in the menu */
 CheckItem ( menus[DISPLAYMENU], cur_size + 9, FALSE );
    /* update our size global */
 cur_size = n;
    /* check the new size in the menu */
```

```
CheckItem ( menus[DISPLAYMENU], cur_size + 9, TRUE );
   /* un-draw the hairline for now */
draw_hair ( ind_handle, ind_clock, srcBic );
draw_hair ( ind2_handle, ind2_clock, srcBic );
   /* erase the waveforms and the names */
EraseRect ( &namescreen );
EraseRect ( &wavescreen );
   /* establish the new screen format */
set_format ( clockwidth, size[cur_size - 1] );
   /* pretend the hairline isn't on, regardless */
tmp = hair_on;
hair_on = 0;
   /* draw all visible waveforms */
draw_vis_waves ( srcOr );
if ( curse_on )
    {
  /* compute new end points for cursor */
 curse_org.h = waverect[sel_wave].left +
   ( lo_select * clockwidth );
 curse_org.v = waverect[sel_wave].top;
 curse_end.h = curse_org.h;
 curse_end.v = curse_org.v + ( 3 * waveheight );
 curse_on = TRUE;
 curse_state = 0;
    }
   /* update the waveform selection */
sel_update();
   /* restore the hair flag */
hair_on = tmp;
if ( hair_on )
    {
 hair_pos =
  new_hair_pos ( ind_handle, ind_clock, &hair_rect );
 hair2_pos =
  new_hair_pos ( ind2_handle, ind2_clock, &hair2_rect );
 snap_hair ( ind_handle );
 snap_hair ( ind2_handle );
 draw_hair ( ind_handle, ind_clock, srcOr );
 draw_hair ( ind2_handle, ind2_clock, srcOr );
/*
 hair_deactivate( ind_handle );
 hair_deactivate( ind2_handle );
*/
    }
}

/*
 set_format  -- Re-compute everything which is affected by a
 change in size or scale.
*/

set_format ( unitwidth, unitheight )
int unitwidth, unitheight;

{
 int i;
 int total_height;
 int gridsize;
 GrafPtr saveport;
 Rect gridrect;
 Rect tmprect;
 FontInfo fontinfo;

 GetPort ( &saveport );
 SetPort ( waveptr );

    /* update our clockwidth global */
 clockwidth = unitwidth;
```

```
SetRect ( &wavescreen,
  100, 20, wavewrec.port.portRect.right - 17,
    wavewrec.port.portRect.bottom - 16 );
SetRect ( &namescreen,
  5, 16, 90, wavewrec.port.portRect.bottom - 30 );

   /* compute number of visible waveforms */
visclocks = ( wavescreen.right - wavescreen.left ) / clockwidth;

wavescreen.right = wavescreen.left + visclocks * clockwidth;

if ( which_loop == LOGIC && bus_width > 0 )
    {
 wavescreen.bottom -= 30;
 namescreen.bottom -= 30;
    }

   /* find right-most visible clock */
lastclock = firstclock + visclocks - 1;

   /* update our waveheight global */
waveheight = unitheight;
   /* re-compute grid dimensions */
gridheight = waveheight * 3 + 1;
gridwidth = wavescreen.right - wavescreen.left;
gridwidth -= gridwidth % clockwidth;
SetRect ( &gridrect, 0, 0, gridwidth, gridheight );

   /* find which pixel the hairline is now on */
hair_pos = wavescreen.left + ( ind_clock * clockwidth );

  /* find which pixel the other hairline is now on */
hair2_pos = wavescreen.left + ( ind2_clock * clockwidth );


   /* carefully dispose of old gridbits space */
if ( gridbits.baseAddr )
    {
 DisposPtr ( gridbits.baseAddr );
    }
   /* set up a new bitmap for the grid */
gridbits.bounds = gridrect;
gridbits.rowBytes = bytewidth ( &gridbits.bounds );
gridsize = ( gridheight * gridbits.rowBytes );
gridbits.baseAddr = NewPtr ( gridsize );

init_grid();  /* fill in the new bitmap */

   /* compute new waveform rectangle */
waverect[0] = gridrect;
OffsetRect ( &waverect[0], wavescreen.left, wavescreen.top );
SetPort ( saveport );

/* HEY CHUMP!!!  I don't think we have to do this font stuff every time!   */

   /* compute size of numeric text lines */
GetPort ( &saveport );
SetPort ( scratchport );
TextFont ( Monaco );
       TextSize ( 9 );
tehandle = TENew ( &destrect, &viewrect );
numheight = (*tehandle)->lineHeight;
TEDispose ( tehandle );
   /* compute size of alpha text lines */
if ( which_loop == LOGIC && cur_size == 1 )
    {
 TextFont ( Monaco );
 TextSize ( 7 );
    }
```

```
else
    {
 TextFont ( systemFont );
 TextSize ( 12 );
    }
GetFontInfo ( &fontinfo );
   /* force creation of an edit record */
tehandle = TENew ( &destrect, &viewrect );
   /* get the lineheight from the record */
textheight = (*tehandle)->lineHeight;
   /* let go of the handle */
TEDispose ( tehandle );

SetPort ( saveport );

/* end chump  */


  /* compute new name and wave rectangle tables */
  namerect[0].left = namescreen.left;
  namerect[0].right = namescreen.right;
  namerect[0].bottom = waverect[0].bottom;

  if ( cur_size > 1 )
      {
   namerect[0].bottom -= waveheight - fontinfo.descent;
   namerect[0].top = namerect[0].bottom - textheight;
      }
  else
      {
   namerect[0].top = waverect[0].top;
      }
    /* compute vertical offset for spacing waveforms */
  if ( which_loop == LOGIC )
      {
     /* in logic analyzer mode,
      we don't need extra space for
       clicking highs and lows */
   vert_offset = waveheight * 2 - 1;
   wavescreen.top += waveheight - 1;
      }
  else
      {
   vert_offset = gridheight - 1;
      }
  i = 0;

     /* fill in the tables */

  while ( waverect[i].bottom + vert_offset < wavescreen.bottom - 16 )
      {
   i++;
   waverect[i] = waverect[i-1];
   OffsetRect ( &waverect[i], 0, vert_offset );
   namerect[i] = namerect[i-1];
   OffsetRect ( &namerect[i], 0, vert_offset );
   if ( i == MAXWAVES - 1 )
       {
    break;
       }
      }
  bugout ( BUG6, "Number of waverects & namerects: %d", i );

  namescreen.bottom = namerect[i].bottom;
  namescreen.top = namerect[0].top;

  if ( which_loop == LOGIC )
      {
   wavescreen.bottom = waverect[i].bottom - ( waveheight - 1 );
      }
```

```
else
    {
 wavescreen.bottom = waverect[i].bottom;
    }
i++;
 SetRect ( &hscrollrect, namescreen.right + 1, 0,
        wavewrec.port.portRect.right - 20,
       wavescreen.bottom );

 if ( scrollrgn )
     {
  DisposeRgn ( scrollrgn );
     }
 scrollrgn = NewRgn();
 OpenRgn();
     FrameRect ( &wavescreen );
     tmprect = hscrollrect;
     tmprect.bottom = wavescreen.top;
     FrameRect ( &tmprect );
 CloseRgn ( scrollrgn );

 SetRect ( &bus_screen, screenrect.left, wavescreen.bottom,
        wavescreen.right, screenrect.bottom );
   /* now we know how many waveforms are visible */
 viswaves = i;
   /* compute last visible waveform */
 lastwave = firstwave + viswaves - 1;

    /* adjust lower limit of hairline */
 if ( which_loop == LOGIC )
     {
  hair_bottom = wavescreen.bottom + 4;
     }
 else
     {
  hair_bottom = wavescreen.bottom;
     }

 SetRect ( &snapshot.bounds, 0, 0, 1, hair_bottom - hair_top );

 hair_rect = snapshot.bounds;
 OffsetRect ( &hair_rect, hair_pos, hair_top );

 hair2_rect = snapshot.bounds;
 OffsetRect ( &hair2_rect, hair2_pos, hair_top );

   /* update the scroll bars */
 set_controls();

   /* zero out the rest of the rectangle tables */
 while ( i < 40 )
     {
  SetRect ( &waverect[i], 0, 0, 0, 0 );
  SetRect ( &namerect[i++], 0, 0, 0, 0 );
     }
}

/*
 draw_info  --  Draw the numbers representing the first visible clock
 and the length of the longest waveform.
*/

draw_info ( first, max )

{
 Rect  tmprect;
 char numstring[20];
```

```
 TextFont ( systemFont );
 TextSize ( 12 );
 TextMode ( srcCopy );
 TextFace ( 0 );

 GetClip ( save_region );

 SetRect ( &tmprect,
  5, thePort->portRect.top, 60, thePort->portRect.top + 16 );
 NumToString ( first, numstring );
 TextBox ( numstring, strlen ( numstring ), &tmprect, teJustLeft );
 SetRect ( &tmprect,
  5, thePort->portRect.bottom -32,
   60, thePort->portRect.bottom - 16 );
 NumToString ( max, numstring );
 TextBox ( numstring, strlen ( numstring ), &tmprect, teJustLeft );
#ifdef MAYBE_NOT
 ClipRect ( &tmprect );
 MoveTo ( 5, thePort->portRect.top + 14 );
 NumToString ( first, numstring );
 DrawString ( numstring );
 tmprect.top = namescreen.bottom;
 tmprect.bottom = thePort->portRect.bottom - 15;
 ClipRect ( &tmprect );
 MoveTo ( 5, thePort->portRect.bottom - 16 );
 NumToString ( max, numstring );
 DrawString ( numstring );
#endif MAYBE_NOT

 SetClip ( save_region );
}

/*
 comp_waves  -- compare two waveforms.

 This routine actually just handles the selection of which waveforms
 are to be compared.  The real comparison is done in draw_wave().

 This routine checks the waveform the mouse was just clicked on and:

  If the waveform was already selected, deselects it.
  If not, makes sure that only ONE has previously been selected.
   If so, select the new one.
   If not, BEEP!!!
 It then calls draw_wave() for any waveform whose appearance
 should change.
*/

comp_waves ( mptr )
Point *mptr;

{
 short vis;
 short hit;

   /* set vis to the waveform the mouse is on */

 for ( vis = 0; vis <= viswaves; vis++ )
     {
  if ( PtInRect ( mptr, &waverect[vis] ) )
      {
   break;
      }
     }
 hit = vis + firstwave;
 if ( hit == comp1 ) /* if waveform already selected, deselect it */
     {
  comp1 = -1;
  draw_wave ( hit, firstclock, visclocks, srcCopy );
  if ( comp2 >= 0 )
```

```
        {
    draw_wave ( comp2, firstclock, visclocks, srcCopy );
        }
      }
  else
      {   /* if waveform already selected, deselect it */
   if  ( hit == comp2 )
        {
    comp2 = -1;
    draw_wave ( hit, firstclock, visclocks, srcCopy );
    if ( comp1 >= 0 )
        {
     draw_wave ( comp1, firstclock,
        visclocks, srcCopy );
        }
      }
   else
        {
    if ( comp1 < 0 )
        {
     comp1 = hit;
     draw_wave ( comp1, firstclock,
        visclocks, srcCopy );
     if ( comp2 >= 0 )
         {
      draw_wave ( comp2, firstclock,
        visclocks, srcCopy );
         }
        }
    else
        {
     if ( comp2 < 0 )
         {
      comp2 = hit;
      draw_wave ( comp2, firstclock,
        visclocks, srcCopy );
      draw_wave ( comp1, firstclock,
        visclocks, srcCopy );
         }
     else
         {
      SysBeep ( 1 );
         }
        }
      }
    }
}

/*
 drag_wave  -- Drag a waveform into a new vertical position.

 While the mouse is down, 'snap' a gray version of the selected waveform
 around to possible new homes.
 When the mouse is released, re-arrange the waveforms into the new
 sequence.
*/

drag_wave ( mptr )
Point *mptr;

{
 wavestruct tmpwave;
 BitMap dragbits;
 Point mouseloc;
 Rect hitrect;
 Rect tmprect;
 unsigned char *savedata;
 short hit;
 short vis;
```

```
short this_wave;
short last_wave;
short offset;
short gridstat;
short tmphair;
short i;

ClipRect ( &screenrect );
offset = gridheight / 2;

  /* set vis to the waveform the mouse is on */

for ( vis = 0; vis <= viswaves; vis++ )
    {
 if ( PtInRect ( mptr, &waverect[vis] ) )
     {
  break;
     }
    }
hit = vis + firstwave;
  /* if there's nothing to drag, don't try */
if ( waves[hit].len == 0 )
    {
 SysBeep ( 1 );
 return;
    }
this_wave = hit;
last_wave = hit;
SetRect ( &hitrect, waverect[vis].left,
   waverect[vis].top + waveheight - 2,
   waverect[vis].right,
   waverect[vis].bottom - waveheight );
dragbits.bounds = hitrect;
OffsetRect ( &dragbits.bounds,
   -waverect[vis].left, -waverect[vis].top );
dragbits.rowBytes = bytewidth ( &dragbits.bounds );
dragbits.baseAddr = NewPtr ( dragbits.rowBytes *
     dragbits.bounds.bottom );
gridstat = grid_on;
grid_on = 0;
gray_wave = 1;
draw_wave ( hit, firstclock, visclocks, srcCopy );
CopyBits ( &thePort->portBits, &dragbits,
   &hitrect, &dragbits.bounds,
     srcCopy, (RgnHandle) 0 );
gray_wave = 0;
grid_on = gridstat;
if ( grid_on )
    {
 CopyBits ( &gridbits, &thePort->portBits,
   &gridbits.bounds, &waverect[vis],
         srcOr, (RgnHandle)0 );
    }

while ( StillDown() )
    {
 GetMouse ( &mouseloc );
 mouseloc.v += offset;
 for ( vis = 0; vis < viswaves; vis++ )
     {
  if ( PtInRect ( &mouseloc, &waverect[vis] ) )
      {
   this_wave = vis + firstwave;
   if ( this_wave != last_wave &&
     this_wave != hit + 1 )
       {
    CopyBits ( &dragbits,
      &thePort->portBits,
      &dragbits.bounds,
```

```
        &hitrect,
        srcXor,
        (RgnHandle) 0 );
      if ( this_wave == hit )
          {
       CopyBits ( &gridbits,
        &thePort->portBits,
        &gridbits.bounds,
        &waverect[hit +
         firstwave],
        srcOr,
        (RgnHandle)0 );
          }
      SetRect ( &hitrect,
       waverect[vis].left,
       waverect[vis].top +
           waveheight - 2,
       waverect[vis].right,
       waverect[vis].bottom -
           waveheight );
      if ( this_wave != hit )
           {
        OffsetRect ( &hitrect,
          0, -offset );
           }
       CopyBits ( &dragbits,
         &thePort->portBits,
         &dragbits.bounds,
         &hitrect,
         srcXor,
         (RgnHandle) 0 );
       last_wave = this_wave;
          }
      break;
        }
       }
      }

 GetMouse ( &mouseloc );
 for ( vis = 0; vis <= viswaves; vis++ )
     {
  if ( PtInRect ( &mouseloc, &waverect[vis] ) )
      {
   break;
      }
     }
 if ( mouseloc.v < waverect[0].top )
     {
  this_wave = firstwave;
     }
 else if ( mouseloc.v > waverect[viswaves-1].bottom )
     {
  this_wave = firstwave + viswaves;
     }
/*
 else
     {
  this_wave = vis + firstwave;
     }
*/
 if ( this_wave != hit )
     {
  savedata = waves[saved_wave].data;
  tmpwave = waves[hit];
  if ( hit > this_wave )
      {
   for ( i = hit; i > this_wave; i-- )
```

```
        {
    waves[i] = waves[i-1];
        }
      }
  else
      {
   for ( i = hit; i < this_wave - 1; i++ )
        {
    waves[i] = waves[i+1];
        }
         }
    waves[i] = tmpwave;
    tmphair = hair_on;
    off_hair();
    refresh();
    if ( hair_on = tmphair )
         {
     on_hair();
         }
    if ( saved_wave >= 0 )
         {
     for ( i = 0; i < maxwaves; i++ )
           {
       if ( savedata == waves[i].data )
             {
        saved_wave = i;
        break;
             }
           }
         }
       }
  else
       {
    draw_wave ( hit, firstclock, visclocks, srcCopy );
       }
   DisposPtr ( dragbits.baseAddr );
 }

:lide_wave ( mptr )
'oint *mptr;

{
 wavestruct tmpwave;
 BitMap dragbits;
 Point mouseloc;
 RgnHandle save_region;
 Rect newrect;
 Rect tmprect;
 short gridstat;
 short clock;
 short start_clock;
 short prev_clock;
 short delta_clock;
 short state;
 short hit;
 short vis;
 short vislen;
 short i;
 short save_expand;
 short tmphair;

 save_region = NewRgn();
 GetClip ( save_region );
   /* set vis to the waveform the mouse is on */

 if ( debug & BUG7 )
```

```
    {
  FrameRect ( &wavescreen );
    }
 for ( vis = 0; vis <= viswaves; vis++ )
    {
  if ( PtInRect ( mptr, &waverect[vis] ) )
     {
   hit = vis + firstwave;
   tmprect = waverect[vis];
   if ( waves[hit].len < lastclock + 1 )
      {
    vislen = waves[hit].len - firstclock;
    tmprect.right = tmprect.left +
      ( vislen * clockwidth );
      }
   if ( PtInRect ( mptr, &tmprect ) )
      {
    break;
      }
     }
    }
 hit = vis + firstwave;
   /* if there's nothing to drag, don't try */
 if ( waves[hit].len == 0 )
    {
  SysBeep ( 1 );
  return;
    }

 wave_save ( hit );
 save_expand = expand;
 expand = 0;
 wave_unexpand ( hit );

 SetRect ( &newrect, waverect[vis].left,
    waverect[vis].top + waveheight - 2,
    waverect[vis].right,
    waverect[vis].bottom - waveheight );
 dragbits.bounds = newrect;
 OffsetRect ( &dragbits.bounds,
    -waverect[vis].left, -waverect[vis].top );
 dragbits.rowBytes = bytewidth ( &dragbits.bounds );
dugout ( BUG6, "dragbits.bounds = %d, %d, %d, %d\rrowBytes = %d", /* DEBUG */
    dragbits.bounds.left, /* DEBUG */
    dragbits.bounds.top, /* DEBUG */
    dragbits.bounds.right, /* DEBUG */
    dragbits.bounds.bottom, /* DEBUG */
    dragbits.rowBytes ); /* DEBUG */
 if ( dragbits.rowBytes * dragbits.bounds.bottom  <= 0 ) /* DEBUG */
    { /* DEBUG */
  return; /* DEBUG */
    } /* DEBUG */
 dragbits.baseAddr = NewPtr ( dragbits.rowBytes *
     dragbits.bounds.bottom );
 gridstat = grid_on;
 if ( grid_on )
    {
  CopyBits ( &gridbits, &thePort->portBits,
    &gridbits.bounds, &waverect[vis],
          srcBic, (RgnHandle)0 );
    }
 grid_on = 0;

 gray_wave = 1;
 draw_wave ( hit, firstclock, visclocks, srcCopy );
 CopyBits ( &thePort->portBits, &dragbits,
    &newrect, &dragbits.bounds,
      srcCopy, (RgnHandle) 0 );
 gray_wave = 0;
```

```
grid_on = gridstat;
if ( grid_on )
    {
 CopyBits ( &gridbits, &thePort->portBits,
   &gridbits.bounds, &waverect[vis],
         srcXor, (RgnHandle)0 );
    }

start_clock = ( ( mptr->h - waverect[vis].left ) / clockwidth )
       + firstclock;
prev_clock = start_clock;

ClipRect ( &wavescreen );
while ( StillDown() )
    {
 GetMouse ( &mouseloc );
 clock = ( ( mouseloc.h - waverect[vis].left ) / clockwidth )
       + firstclock;
 if ( clock < firstclock )
     {
  clock = firstclock;
     }
 if ( clock > lastclock )
     {
  clock = lastclock;
     }
 if ( clock != prev_clock )
     {
  CopyBits ( &dragbits, &thePort->portBits,
    &dragbits.bounds, &newrect,
         srcXor, (RgnHandle)0 );
  OffsetRect ( &newrect,
   ( clock - prev_clock ) * clockwidth, 0 );
  CopyBits ( &dragbits, &thePort->portBits,
    &dragbits.bounds, &newrect,
         srcXor, (RgnHandle)0 );
  prev_clock = clock;
     }
    }

state = State ( hit, 0 );
delta_clock = clock - start_clock;
if ( delta_clock > 0 )
    {
 if ( delta_clock + waves[hit].len > edit_length )
     {
  waves[hit].len = edit_length - delta_clock;
     }
 insert ( hit, 0, state, delta_clock );
    }
else if ( delta_clock < 0 )
    {
 sel_wave = hit;
 lo_select = 0;
 hi_select = -delta_clock;
 sel_count = hi_select - lo_select;
 wave_cut();
 curse_on = 0;
    }

expand = save_expand;
if ( expand )
    {
 if ( maxwavelen() != maxlength )
     {
  expand_all ( 1 );
     }
 else
     {
```

```
    wave_expand ( hit );
    draw_wave ( hit, 0, visclocks, srcOr );
       }
      }
  else
      {
   tmphair = hair_on;
   off_hair();
   draw_wave ( hit, 0, visclocks, srcOr );
   if ( hair_on = tmphair )
       {
    on_hair();
       }
      }

 DisposPtr ( dragbits.baseAddr );
 SetClip ( save_region );
 DisposeRgn ( save_region );
*
bytewidth  -- Return the width of the given rectangle, in bytes,
rounded up to the nearest byte.

Handy for setting up bitmaps.
/

ytewidth( rctptr )
ect *rctptr;


int hdelta, hbytes;
int slop;

hdelta = rctptr->right - rctptr->left + 1;
if ( ( slop = hdelta % 8 ) > 0 )
     {
 hdelta += 8 - slop;
     }
hbytes = hdelta / 8;
if ( hbytes % 2 )
     {
 hbytes++;
     }
return( hbytes );
include <mac/quickdraw.h>
include <mac/osintf.h>
include <mac/toolintf.h>
include "ddw.h"
include "global.h"

xtern struct QDVar QDVar;
itMap snapshot;  /* hairline background storage */
itMap snap2shot;  /* hairline background storage */
ect hair_rect;
ect hair2_rect;
ect tmprect;

xtern WindowPtr wavewptr;
xtern Rect screenrect;
xtern Rect namescreen;
xtern Rect wavescreen;

xtern  short ind_clock;
xtern  short ind2_clock;
xtern short which_loop;
xtern short bus_width;
xtern short debug;

ect hairscreen;
indowRecord poswrec;
```

```
xtern RgnHandle ind_handle;
xtern RgnHandle ind2_handle;
hort numheight; /* height of numeric text line ( in pixels ) */
hort hair_top;
hort hair_bottom;
hort hair_on = 0;
hort hair_selected;
hort hair_pos;
hort hair2_pos;
xtern short firstclock;
xtern short lastclock;
hort clockwidth;

air_test()

{
 Rect tmp1;
 Rect tmp2;

 tmprect = snapshot.bounds;
 OffsetRect ( &tmprect, hair_rect.left, hair_rect.top );
 if ( !EqualRect ( &tmprect, &hair_rect ) )
    {
  aprintf ( 'Hair rectangle mismatch!\rhair_rect = %d, %d, %d, %d\rsnapshot.bounds = %d,
    hair_rect.left,
    hair_rect.top,
    hair_rect.right,
    hair_rect.bottom,
    snapshot.bounds.left,
    snapshot.bounds.top,

/*
 draw_info  --  Draw the numbers representing the first visible clock
 and the length of the longest waveform.
*/

draw_info ( first, max )

{
 Rect  tmprect;
 char numstring[20];

 TextFont ( systemFont );
 TextSize ( 12 );
 TextMode ( srcCopy );
 TextFace ( 0 );

 GetClip ( save_region );

 SetRect ( &tmprect,
  5, thePort->portRect.top, 60, thePort->portRect.top + 16 );
 NumToString ( first, numstring );
 TextBox ( numstring, strlen ( numstring ), &tmprect, teJustLeft );
 SetRect ( &tmprect,
  5, thePort->portRect.bottom -32,
   60, thePort->portRect.bottom - 16 );
 NumToString ( max, numstring );
 TextBox ( numstring, strlen ( numstring ), &tmprect, teJustLeft );
#ifdef MAYBE_NOT
 ClipRect ( &tmprect );
 MoveTo ( 5, thePort->portRect.top + 14 );
 NumToString ( first, numstring );
 DrawString ( numstring );
 tmprect.top = namescreen.bottom;
 tmprect.bottom = thePort->portRect.bottom - 15;
 ClipRect ( &tmprect );
 MoveTo ( 5, thePort->portRect.bottom - 16 );
 NumToString ( max, numstring );
 DrawString ( numstring );
#endif MAYBE_NOT

 SetClip ( save_region );
}
```

```
    snapshot.bounds.right,
    snapshot.bounds.bottom );
     }


nap_hair ( knob_handle )
gnHandle knob_handle;


 Rect *rectptr;
 BitMap *bitptr;

 SetPort ( wavewptr );
 if ( knob_handle == ind_handle )
     {
  bitptr = &snapshot;
  rectptr = &hair_rect;
     }
 else
     {
  bitptr = &snap2shot;
  rectptr = &hair2_rect;
  if ( debug & BUG8 )
      {
   show_rect ( "hair2_rect", &hair2_rect );
      }
     }

 CopyBits ( &thePort->portBits, bitptr,
      rectptr, &(bitptr->bounds),
       srcCopy, (RgnHandle) 0 );


n_hair()


 snap_hair ( ind_handle );
 snap_hair ( ind2_handle );
 draw_hair ( ind_handle, ind_clock, srcOr );
 draw_hair ( ind2_handle, ind2_clock, srcOr );
 hair_pos = new_hair_pos ( ind_handle, ind_clock, &hair_rect );
 hair2_pos = new_hair_pos ( ind2_handle, ind2_clock, &hair2_rect );
 hair_on = 1;


ff_hair()


 draw_hair ( ind_handle, ind_clock, srcXor );
 CopyBits ( &snapshot, &thePort->portBits,
     &snapshot.bounds, &hair_rect,
      srcCopy, (RgnHandle) 0 );

 draw_hair ( ind2_handle, ind2_clock, srcXor );
 CopyBits ( &snap2shot, &thePort->portBits,
      &snap2shot.bounds, &hair2_rect,
      srcCopy, (RgnHandle) 0 );
hair_on = 0;


rag_hair( knob_handle, clock_ptr )
gnHandle knob_handle;
hort *clock_ptr;


Point mouseptr;
int clock, prevclock;
int lo_limit, hi_limit;
```

```
HideCursor();
hair_activate( knob_handle );
PenMode ( patXor );

if ( knob_handle == ind_handle )
    {
 prevclock = ind_clock;
 lo_limit = firstclock;
 hi_limit = ind2_clock <= lastclock ? ind2_clock-1 : lastclock;
    }
else
    {
 prevclock = ind2_clock;
 lo_limit = ind_clock >= firstclock ? ind_clock+1 : firstclock;
 hi_limit = lastclock;
    }

while ( StillDown() )
    {
 GetMouse ( &mouseptr );
 clock = ( ( mouseptr.h - wavescreen.left + ( clockwidth / 2 ) )
     / clockwidth ) + firstclock;
 if ( clock < lo_limit )
     {
  clock = lo_limit;
     }
 if ( clock > hi_limit )
     {
  clock = hi_limit;
     }
 if ( clock != prevclock )
     {
  move_hair ( knob_handle, *clock_ptr, clock );
  prevclock = clock;
  *clock_ptr = clock;
  show_positions();
     }
    }
PenMode ( patOr );
hair_deactivate( knob_handle );
ShowCursor();
return ( clock );
ove_hair ( knob_handle, clock, new_clock )
gnHandle knob_handle;
hort clock;
hort new_clock;


BitMap *bitptr;
Rect *rectptr;
short delta_pos;
short clock_pos;
char num_string[20];

if ( knob_handle == ind_handle )
    {
 bitptr = &snapshot;
 rectptr = &hair_rect;
    }
else
    {
 bitptr = &snap2shot;
 rectptr = &hair2_rect;
    }

clock_pos = wavescreen.left + ( ( clock - firstclock ) * clockwidth );
delta_pos = ( new_clock - clock ) * clockwidth;
draw_hair ( knob_handle, clock, srcBic );
CopyBits ( bitptr, &thePort->portBits,
```

```
    &(bitptr->bounds), rectptr,
     srcCopy, (RgnHandle) 0 );
 OffsetRgn ( knob_handle, delta_pos, 0 );
 OffsetRect ( rectptr, delta_pos, 0 );
 snap_hair ( knob_handle );
 draw_hair ( knob_handle, new_clock, srcOr );


raw_hair ( knob_handle, clock, mode )
gnHandle knob_handle;
nt clock;
nt mode;


 int now;
 int clock_pos;
 short offset;

 if ( clock < firstclock || clock > lastclock + 1 )
      {
  return;
      }
 offset = knob_handle == ind_handle ? 0 : 6;
 PenMode ( mode + 8 );
 clock_pos = wavescreen.left + ( ( clock - firstclock ) * clockwidth );
 OffsetRgn ( knob_handle, -( (**knob_handle).rgnBBox.left + 6 ), 0 );
 OffsetRgn ( knob_handle, clock_pos + offset, 0 );
 MoveTo ( clock_pos, hair_top );
 now = TickCount();
 while ( now == TickCount() )
      {
      }
 if ( hair_selected )
      {
  PaintRgn ( knob_handle );
      }
 else
      {
  FrameRgn ( knob_handle );
      }
 LineTo ( clock_pos, hair_bottom );
 PenMode ( patOr );


air_activate( knob_handle )
gnHandle knob_handle;


 FillRgn ( knob_handle, &QDVar.black );
 hair_selected = 1;


ew_hair_pos ( knob_handle, clock, rectptr )
gnHandle knob_handle;
nt clock;
ect *rectptr;


 Rect tmprect;
 int new_pos;
 short offset;

 offset = knob_handle == ind_handle ? 0 : 6;
 if ( clock >= firstclock && clock <= lastclock )
      {
  new_pos = wavescreen.left +
  . ( ( clock - firstclock ) * clockwidth );
  hair_top = (*knob_handle)->rgnBBox.bottom;
  SetRect ( rectptr,
   new_pos, hair_top, new_pos+1, hair_bottom );
```

```
 tmprect = (**knob_handle).rgnBBox;
 OffsetRgn ( knob_handle, -tmprect.left - 6, 0 );
 OffsetRgn ( knob_handle, new_pos + offset, 0 );
    }
else
    {
 new_pos = -1;
    }
return ( new_pos );



iair_deactivate( knob_handle )
gnHandle knob_handle;


EraseRgn ( knob_handle );
FrameRgn ( knob_handle );
hair_selected = 0;


how_positions()


GrafPtr saveport;
Rect tmp_rect;
char num_string[10];

GetPort ( &saveport );
SetPort ( &poswrec.port );
TextMode ( srcCopy );
TextSize ( 9 );

SetRect ( &tmp_rect, -2, 20, 27, numheight + 20 );
NumToString ( ind_clock, num_string );
TextBox ( num_string, strlen ( num_string ), &tmp_rect, teJustCenter );

OffsetRect ( &tmp_rect, 0, numheight );
NumToString ( abs ( ind_clock - ind2_clock ), num_string );
TextBox ( num_string, strlen ( num_string ), &tmp_rect, teJustCenter );

OffsetRect ( &tmp_rect, 0, numheight );
NumToString ( ind2_clock, num_string );
TextBox ( num_string, strlen ( num_string ), &tmp_rect, teJustCenter );

if ( which_loop == LOGIC && bus_width > 0 )
    {
 bus_update();
    }
SetPort ( saveport );
 include <mac/quickdraw.h>
 include <mac/osintf.h>
 include <mac/toolintf.h>

 include "global.h"
 include "ddw.h"

 xtern MenuHandle menus[];
 esType typeDRVR = { "DRVR" };

 xtern GrafPtr  scratchport;
 xtern WindowPtr wavewptr;
 xtern WindowRecord wavewrec;
 xtern ControlHandle w_hscroll;
 xtern ControlHandle w_vscroll;
 xtern RgnHandle ind_handle;
 xtern RgnHandle ind2_handle;
 xtern RgnHandle scrollrgn;
 xtern RgnHandle save_region;
```

```
xtern WindowRecord cursewrec;
xtern cursestruct cursors[]; /* array of cursors */
xtern short  cur_curs;
xtern short  firstclock;
xtern short  lastclock;
xtern short  edit_length;
xtern short  wave_curs;
xtern BitMap  snapshot; /* hairline background storage */
xtern BitMap  snap2shot; /* hairline background storage */
xtern short  hair_top;
xtern short  hair_bottom;
xtern short  which_loop;
xtern short  debug;
xtern short  ind_clock;
xtern short  ind2_clock;
xtern Rect  armrect;

indowPtr protowptr;
indowRecord protowrec;
ontrolHandle p_vscroll;

xtern BitMap gridbits;  /* background grid */

xtern Rect mainrect;
xtern Rect tmprect;
xtern Rect screenrect;
xtern Rect namescreen;
xtern Rect wavescreen;
xtern Rect hairscreen;
xtern Rect bus_screen;
xtern Rect hscrollrect;
xtern Rect *waverect;
xtern Rect *namerect;
xtern Rect viewrect, destrect;

xtern Rect textrect;
xtern Rect chanrect;
xtern Rect busrect;

xtern short bus[];

xtern CursHandle curshdl;

xtern wavestruct *waves; /* array of waveform structures */
xtern wavestruct undo_wave; /* 'undo' waveform storage */
xtern wavestruct clipboard; /* 'clipboard' storage for waveform data */
xtern short scale[];
xtern short size[];

xtern short waveheight; /* height of waveforms ( in pixels ) */
xtern short textheight; /* height of text line ( in pixels ) */
xtern short clockwidth; /* width of single clock ( in pixels ) */
xtern short gridheight; /* height of grid ( in pixels ) */
xtern short gridwidth; /* width of grid ( in pixels ) */
xtern short grid_on; /* !0 = display grid,  0 = don't display grid */
xtern short text_editing;
xtern short active_name;
xtern short updating;
xtern short cur_scale;
xtern short cur_size;
xtern short log_size;
xtern short wav_size;
xtern short saved_wave;
xtern short textheight;

nit_menus()

int i;
```

```
menus[DESKMENU] = NewMenu(APPLE, APPLE_SYM);
menus[DDWMENU] = GetMenu ( DDW );
menus[MODEMENU] = GetMenu ( MODE );
menus[FUNCTIONMENU] = GetMenu ( FUNCTION );
menus[MOVEMENU] = GetMenu ( MOVEMENT );
menus[CONTROLMENU] = GetMenu ( CONTROLS );
menus[PROTOMENU] = GetMenu ( PROTOCOL );
menus[EDITMENU] = GetMenu ( EDIT );
menus[DISPLAYMENU] = GetMenu ( DISPLAY );
AddResMenu(menus[DESKMENU], typeDRVR.s); /* desk accessories */
for ( i = 0; i < MAXMENUS; i++ )
     {
 InsertMenu ( menus[i], 0 );
     }
DrawMenuBar();


nit_globals()


Rect tmprect;
int i;
TEHandle tehandle;
FontInfo fontinfo;

saved_wave = -1;
cur_scale = 3;
clockwidth = scale[cur_scale - 1];;
log_size = 2;
wav_size = 3;
gridbits.baseAddr = (char *) 0;
gridheight = WAVEHEIGHT * 3 + 1;
grid_on = 1;
text_editing = 0;
updating = 0;

SetPort ( wavewptr );
save_region = NewRgn();

screenrect = thePort->portRect;
screenrect.right -= 16;
screenrect.bottom -= 16;

bus_screen = screenrect;
bus_screen.top = screenrect.bottom - 30;
SetRect ( &wavescreen,
  100, 20, wavewrec.port.portRect.right - 17,
    wavewrec.port.portRect.bottom - 16 );
SetRect ( &hairscreen, wavescreen.left - 6,
    screenrect.top,
     wavescreen.right,
      wavescreen.top );
SetRect ( &namescreen,
  5, 16, 90, wavewrec.port.portRect.bottom - 30 );

SetRect ( &hscrollrect, namescreen.right + 1, 0,
     wavescreen.right,
      wavescreen.bottom );
SetRect ( &viewrect, 5, 30, 95, 50 );

SetPort ( &wavewrec.port );
destrect = viewrect;

waves = ( wavestruct * ) NewPtr ( MAXWAVES * sizeof ( wavestruct ) );
undo_wave.data = (unsigned char *) NewPtr ( MAXCLOCKS / 4 );
clipboard.data = (unsigned char *) NewPtr ( MAXCLOCKS / 4 );
waverect = ( Rect * ) NewPtr ( 40 * sizeof ( Rect ) );
namerect = ( Rect * ) NewPtr ( MAXWAVES * sizeof ( Rect ) );
for ( i = 0 ; i < MAXWAVES; i++ )
```

```
    {
 waves[i].len = 0;
 waves[i].data = (unsigned char *) 0;
 waves[i].id = 0;
 waves[i].comcount = 0;
 waves[i].comlist = (char**) 0;
 SetRect ( &namerect[i], 0, 0, 0, 0 );
    }
for ( i = 0; i < 40; i++ )
     {
  SetRect ( &waverect[i], 0, 0, 0, 0 );
     }
    /* compute size of alpha text lines */
 TextFont ( systemFont );
 TextSize ( 12 );
 GetFontInfo ( &fontinfo );
    /* force creation of an edit record */
 tehandle = TENew ( &destrect, &viewrect );
    /* get the lineheight from the record */
 textheight = (*tehandle)->lineHeight;
    /* let go of the handle */
 TEDispose ( tehandle );

 SetRect ( &textrect, 35, 5, 105, 5 + textheight * 16 );
 SetRect ( &chanrect, 10, 5, 30, 5 + textheight * 16 );

 SetRect ( &busrect, 0, 0, 16 * 17, 18 );
 OffsetRect ( &busrect,
  textrect.right + 20, textrect.top + 3 * textheight );

 for ( i = 0; i < 16; i++ )
     {
  bus[i] = -1;
     }

 data_init_windows();
 SetRect ( &armrect, 488, 0, 505, 16 );


ew_w_scrollbars()


 Rect tmprect;

 tmprect.left = wavewptr->portRect.right - 15;
 tmprect.top = wavewptr->portRect.top - 1;
 tmprect.right = wavewptr->portRect.right + 1;
 tmprect.bottom = wavewptr->portRect.bottom - 14;
 w_vscroll = NewControl ( wavewptr, &tmprect, "", 1, 0, 0, 31,
      ScrollBarProc, 1 );
 tmprect.left = wavewptr->portRect.left - 1;
 tmprect.top = wavewptr->portRect.bottom - 15;
 tmprect.right = wavewptr->portRect.right - 14;
 tmprect.bottom = wavewptr->portRect.bottom + 1;
 w_hscroll = NewControl ( wavewptr, &tmprect, "", 1, 0, 0, 1023,
      ScrollBarProc, 2 );
 HiliteControl ( w_hscroll, 0 );
 HiliteControl ( w_vscroll, 0 );


ew_p_scrollbars()


 Rect tmprect;
```

```
tmprect.left = protowptr->portRect.right - 15;
tmprect.top = protowptr->portRect.top - 1;
tmprect.right = protowptr->portRect.right + 1;
tmprect.bottom = protowptr->portRect.bottom - 14;
p_vscroll = NewControl ( protowptr, &tmprect, "", 1, 1, 1, 20,
      ScrollBarProc, 1 );


nit_cursors()

Rect tmprect;
short i;

SetPort ( &cursewrec.port );

curshdl = (CursHandle) GetCursor ( 257 );
cursors[CROSSHAIR].c_cursor = **curshdl;
curshdl = (CursHandle) GetCursor ( 258 );
cursors[SELECTOR].c_cursor = **curshdl;
curshdl = (CursHandle) GetCursor ( 259 );
cursors[VERTDRAG].c_cursor = **curshdl;
curshdl = (CursHandle) GetCursor ( 260 );
cursors[HORIZDRAG].c_cursor = **curshdl;
curshdl = (CursHandle) GetCursor ( 261 );
cursors[COMPARE].c_cursor = **curshdl;

curshdl = (CursHandle) GetCursor ( 4 );
cursors[WAIT].c_cursor = **curshdl;

cursors[CROSSHAIR].c_map.baseAddr =
   (Ptr) &cursors[CROSSHAIR].c_cursor.data;
cursors[CROSSHAIR].c_map.rowBytes = 2;
SetRect ( &cursors[CROSSHAIR].c_map.bounds, 0, 0, 16, 16 );

cursors[SELECTOR].c_map.baseAddr =
   (Ptr) &cursors[SELECTOR].c_cursor.data;
cursors[SELECTOR].c_map.rowBytes = 2;
SetRect ( &cursors[SELECTOR].c_map.bounds, 0, 0, 16, 16 );

cursors[VERTDRAG].c_map.baseAddr =
   (Ptr) &cursors[VERTDRAG].c_cursor.data;
cursors[VERTDRAG].c_map.rowBytes = 2;
SetRect ( &cursors[VERTDRAG].c_map.bounds, 0, 0, 16, 16 );

cursors[HORIZDRAG].c_map.baseAddr =
   (Ptr) &cursors[HORIZDRAG].c_cursor.data;
cursors[HORIZDRAG].c_map.rowBytes = 2;
SetRect ( &cursors[HORIZDRAG].c_map.bounds, 0, 0, 16, 16 );

cursors[COMPARE].c_map.baseAddr =
   (Ptr) &cursors[COMPARE].c_cursor.data;
cursors[COMPARE].c_map.rowBytes = 2;
SetRect ( &cursors[COMPARE].c_map.bounds, 0, 0, 16, 16 );

SetRect ( &tmprect, 0, 0, 25, 25 );
PenMode ( patOr );
for ( i = 0; i < MAXCURSORS; i++ )
    {
 cursors[i].c_rect = tmprect;
 OffsetRect ( &tmprect, 0, 25 );
    }

cur_curs = 999;
wave_curs = CROSSHAIR;


nit_hair()
```

```
ind_handle = NewRgn();
OpenRgn();
    MoveTo ( 8, 0 );
    LineTo ( 8, 17 );
    LineTo ( 0, 8 );
    LineTo ( 8, 0 );
CloseRgn ( ind_handle );
OffsetRgn ( ind_handle, wavescreen.left, 1 );

ind2_handle = NewRgn();
OpenRgn();
    MoveTo ( 0, 0 );
    LineTo ( 0, 14 );
    LineTo ( 7, 7 );
    LineTo ( 0, 0 );
CloseRgn ( ind2_handle );
OffsetRgn ( ind2_handle, wavescreen.right + 12, 2 );

   /* compute new hairline rectangle */
hair_top = (*ind_handle)->rgnBBox.bottom;

SetPort ( &wavewrec.port );

SetRect ( &snapshot.bounds, 0, 0, 1, hair_bottom - hair_top );
snapshot.rowBytes = 2;
snapshot.baseAddr = NewPtr ( ( thePort->portRect.bottom
      - hair_top ) * 2 );

SetRect ( &snap2shot.bounds, 0, 0, 1, hair_bottom - hair_top );
snap2shot.rowBytes = 2;
snap2shot.baseAddr = NewPtr ( ( thePort->portRect.bottom
      - hair_top ) * 2 );

ind_clock = firstclock;
ind2_clock = lastclock;


nit_waves()


Point origin;
int i, j;
SetPt ( &origin, 0, 0 );

for ( i = 0; i < MAXWAVES; i++ )
    {
 waves[i].org = origin;
 waves[i].len = 0;
 waves[i].id = 0;
ifdef NOT_NOW
 if ( waves[i].comcount )
     {
  for ( j = 0; j < waves[i].comcount; j++ )
      {
   DisposPtr ( waves[i].comlist[j] );
      }
  DisposPtr ( waves[i].comlist );
     }
endif NOT_NOW
 waves[i].comlist = (char**) 0;
 waves[i].comcount = 0;
 waves[i].name[0] = NULL;

 if ( waves[i].data )
     {
  bugout ( BUG8, "Disposing of waves[%d].data...",  i );
  DisposPtr ( waves[i].data );
     }
ifdef MAYBE_NEVER
```

```
 waves[i].data = (unsigned char *) NewPtr ( MAXCLOCKS / 4 );
 for ( j = 0; j < MAXCLOCKS / 4; j++ )
      {
  waves[i].data[j] = 0xFF;
      }
endif MAYBE_NEVER
     }
edit_length = MAXCLOCKS;


nit_names()


int i;

for ( i = 0; i < MAXWAVES; i++ )
     {
 NumToString ( i, waves[i].name );
     }


nit_grid ( )


GrafPtr saveport;
BitMap tmpbits;
int *bugptr;
short i;
GetPort ( &saveport );
SetPort ( scratchport );

zero_bits ( &gridbits );
SetPortBits ( &gridbits );
PenSize ( 1, 1 );

MoveTo ( 0, waveheight );
for ( i = 0; i < gridwidth / clockwidth; i++ )
     {
 Line ( 0, 0 );
 Move ( clockwidth, 0 );
     }
MoveTo ( 0, waveheight * 2 );
for ( i = 0; i < gridwidth / clockwidth; i++ )
     {
 Line ( 0, 0 );
 Move ( clockwidth, 0 );
     }
SetPort ( saveport );
include <mac/quickdraw.h>
include <mac/osintf.h>
include <mac/toolintf.h>
include "global.h"
include "ddw.h"

define DDW_MAGIC 0x1234567

xtern short post_mortem;
xtern int new_waves();
xtern int (*New_waves)();
xtern int (*save_new_waves)();

xtern Rect  datascreen;
xtern Rect  numscreen;
xtern Rect  triscreen;
xtern Rect  addrect;

xtern struct QDVar QDVar;
xtern  wavestruct *waves;
xtern wavestruct undo_wave; /* "undo" storage area */
```

```
xtern Rect  *namerect;
xtern MenuHandle menus[];
xtern Rect  screenrect;
xtern Rect  wavescreen;
xtern RgnHandle scrollrgn;
xtern short  which_loop;
xtern short  cur_size;
xtern short  log_size;
xtern short  wav_size;
xtern short  edit_length;
xtern short  scale[];
xtern short  size[];
xtern short  cur_scale;
xtern short  name_selected;
xtern short  logic_enabled;
xtern short  proto_type;
xtern short  expand;
xtern short  new_file;
xtern short  just_back;

xtern Rect  *waverect;
xtern Rect  namescreen;
xtern Rect  bus_screen;
xtern Rect  armrect;
xtern GrafPtr  deskptr;
xtern GrafPtr  scratchport;
xtern EventRecord event;
xtern TEHandle tehandle;

xtern ControlHandle w_hscroll;
xtern ControlHandle w_vscroll;

xtern LASetup  setup_values;
xtern short  auto_display;
xtern short  curse_on;
xtern short  sel_wave;
xtern short  sel_clock;
xtern short  sel_count;
xtern short  wavechange;

xtern short  hair_on;
xtern BitMap  snapshot; /* hairline background storage */
xtern short  ind_clock;
xtern short  ind2_clock;
xtern Rect  hair_rect;
xtern short  hair_top;
xtern short  hair_bottom;
xtern short  hair_pos;
xtern short  hair_selected;

xtern Point  curse_org;
xtern Point  curse_end;
xtern int  curse_time;
xtern int  logic_time;
xtern short  curse_state;

xtern Rect  viewrect, destrect;
xtern short  firstclock; /* first visible clock in the window */
xtern short  firstwave; /* first visible waveform in window */
xtern short  lastwave; /* last visible waveform in window */
xtern short  visclocks;
xtern short  viswaves;
xtern short  maxwaves;
xtern short  maxclocks;
xtern char  file_name[];
xtern char  proto_name[];
xtern short  proto_length;
xtern WindowPtr disp_wptr;
xtern WindowPtr wavewptr;
```

```
xtern WindowPtr data_wptr;
xtern short  arm_toggle;
xtern short  append_offset;
xtern cursestruct  cursors[MAXCURSORS]; /* array of cursors */
xtern short  escaping;
xtern short  waiting;
xtern int  wait_time;
xtern short  greatest; /* latest value of maxwavelen() */

hort latest;    /* latest value of firstclock */

gnHandle  ind_handle;
andle   wave_menu_handle;
indowPtr  cursewptr;
indowPtr  poswptr;
indowRecord  wavewrec;
indowPtr  window;
indowPtr  protowptr;
hort   curse_on;
hort   wave_curs;
hort   active_name;
oint   mouseloc;
nt   cold_start = 1;
nt   grow;
nt   last_up;
hort   cur_curs;
hort   text_editing;
hort   region_on;

ain ( start_magic )
nt start_magic;


short i;
short this_loop;
short nextevent;
int error;
int now;
char c;

  /* set up all the Macintosh stuff we need */
QD = &QDVar;

if ( cold_start )
    {
  /* save pointer to new_waves() function in global */

 New_waves = new_waves;
 save_new_waves = New_waves;

 if ( start_magic != DDW_MAGIC )
     {
      /* standard Macintosh initialization sequence */
  init_mac();
  switch ( decide1 ( "Want to be a logic analyzer?" ) )
      {
   case YES:
       {
    which_loop = LOGIC;
    break;
       }
   case NO:
       {
    which_loop = WAVEDIT;
    break;
       }
```

```
    case ABORT:
        {
      quit();
      break;
        }
      }.
     }

  scratchport = (GrafPtr) NewPtr ( sizeof ( GrafPort ) );
  OpenPort ( scratchport );

  init_windows();
  init_menus();
  init_io();
  TextFont(0);
  init_globals();

  cur_size = which_loop == LOGIC ? log_size : wav_size;
  set_format (scale[cur_scale - 1], size[cur_size - 1] );

  init_hair();
  init_waves();
  init_names();
  init_cursors();
  init_la();
  init_data();
  reset_data();
     }
 else
     {
  if ( which_loop == LOGIC )
      {
   cur_size = log_size;
      }
  else if ( which_loop == WAVEDIT )
      {
   cur_size = wav_size;
      }
  set_format (scale[cur_scale - 1], size[cur_size - 1] );
  SetMenuBar ( wave_menu_handle );
  just_back = 1;
     }

 if ( new_file )
     {
  if ( expand )
      {
   expand_all ( 0 );
      }
  new_file = 0;
     }

 if ( which_loop == LOGIC )
     {
 bugout ( BUG6,
 Enter logic analyzer:\rundo_wave.data = %d bytes\rundo_wave.data = %08x",
   GetPtrSize ( undo_wave.data ), undo_wave.data );
  SetWTitle ( wavewptr, "Logic Analyzer" );
  set_logic_menus();
  if ( greatest > visclocks )
      {
   SetCtlMax ( w_hscroll, greatest - visclocks );
      }
  else
      {
   SetCtlMax ( w_hscroll, 0 );
      }
```

```
    }
else if ( which_loop == DATAEDIT )
    {
 SetWTitle ( data_wptr, "Data Protocol Editor" );
 set_wave_menus();
 maxwaves = MAXWAVES;
    }
else
    {


   /* in case we were launched stand-alone */
 which_loop = WAVEDIT;

 SetWTitle ( wavewptr, "Waveform Editor" );
 set_wave_menus();
 SetCtlMax ( w_hscroll, edit_length - visclocks );
 maxwaves = MAXWAVES;
    }

if ( cold_start && start_magic == DDW_MAGIC )
    {
 cold_start = 0;
 EnableItem ( menus[DDWMENU], WAVEDIT );
 which_loop = TERMINAL;
 wave_menu_handle = GetMenuBar();    /* save our menu list */
 return ( 1 );
    }
else
    {
 cold_start = 0;
    }

this_loop = which_loop;

if ( which_loop == DATAEDIT )
    {
 if ( data_check() )
     {
  dedit();
  set_controls();
  if ( which_loop == WAVEDIT )
      {
   proto_type = CONTROL;
      }
     }
    }
else
    {
 set_format (scale[cur_scale - 1], size[cur_size - 1] );

 ShowWindow ( cursewptr );
 ShowWindow ( poswptr );
 ShowWindow ( wavewptr );
 SelectWindow ( wavewptr );
 SetPort ( wavewptr );
 DrawMenuBar();
 proto_type = CONTROL;
    }

SetPt ( &mouseloc, -1, -1 );
while ( which_loop == this_loop )
    {
ifdef DEBUG
 if ( save_new_waves != New_waves )
     {
aprintf("Important globals have been clobbered!\rNew_waves = %08x",
      (int) New_waves );
  New_waves = save_new_waves;
```

```
    }
endif DEBUG

 SystemTask();
 our_task();

 if ( waiting )
     {
  (void) ReadDateTime ( &now );
  if ( now >= wait_time +  READTIME )
      {
   aprintf('Tester did not acknowledge request.');
   waiting = 0;
      }
     }
 else
     {
  GetMouse ( &mouseloc );
     }

 if ( PtInRect ( &mouseloc, &wavescreen ) )
     {
  if ( cur_curs != wave_curs )
      {
   SetCursor ( &cursors[wave_curs].c_cursor );
   cur_curs = wave_curs;
      }
     }
 else if ( PtInRect ( &mouseloc, &namescreen ) )
     {
  if ( cur_curs != SELECTOR )
      {
   SetCursor ( &cursors[SELECTOR].c_cursor );
   cur_curs = SELECTOR;
      }
     }
 else if ( cur_curs != -1 )
     {
  InitCursor();
  cur_curs = -1;
     }

 if ( text_editing )
    {
 TEIdle ( tehandle );
    }

nextevent = GetNextEvent ( everyEvent, &event );
if ( nextevent && ( !waiting || event.what == updateEvt ) )
    {
 switch ( event.what )
     {
  case mouseDown:
      {
   mouse_service();
   break;
      }
  case mouseUp:
      {
   last_up = event.when;
   break;
      }
  case keyDown:
  case autoKey:
      {
   key_service();
   break;
      }
  case updateEvt:
```

```
        {
     update ( (WindowPtr) event.message );
     break;
        }
    default:
        {
     break;
        }
      }
     }

x   watch for the escape sequence ESC L ( load file ).  Eat anything else  */

 watch_escapes();
    }

HideWindow ( wavewptr );
HideWindow ( cursewptr );
HideWindow ( poswptr );
wave_menu_handle = GetMenuBar(); /* save our menu list */

if ( this_loop == LOGIC )  /* save the size */
    {
 log_size = cur_size;
 EnableItem ( menus[DDWMENU], LOGIC );
    }
else if ( this_loop == WAVEDIT )
    {
 wav_size = cur_size;
 EnableItem ( menus[DDWMENU], WAVEDIT );
    }
else
    {
 EnableItem ( menus[DDWMENU], DATAEDIT );
    }
bugout ( BUG7, "Exit wavedit...\rproto_type = %d", proto_type );
return ( 1 );


atch_escapes()


register char c;
short tmphair;

if ( inbufcnt() > 0 )
    {
 if ( escaping )
     {
  switch ( c = get_tty() )
      {
   case TRAP_L:
       {
    read_file();
    tmphair = hair_on;
    off_hair();
    refresh();
    if ( hair_on = tmphair )
        {
     on_hair();
        }
    break;
       }
   case TRAP_P:
       {
    mprintf();
    break;
       }
   case TRAP_B:
```

```
        {
    macbuff();
    break;
        }
  case TRAP_F:
        {
    macflush();
    break;
        }
      }
 escaping = 0;
     }
else
     {
 if ( get_tty() == ESC )
      {
  escaping++;
        }
      }
     }


et_wave_menus()


EnableItem ( menus[DESKMENU], 0 );
EnableItem ( menus[DDWMENU], 0 );
DisableItem ( menus[DDWMENU], PRINT );
DisableItem ( menus[DDWMENU], WAVEDIT );
DisableItem ( menus[MODEMENU], 0 );
DisableItem ( menus[FUNCTIONMENU], 0 );
DisableItem ( menus[MOVEMENU], 0 );
DisableItem ( menus[CONTROLMENU], 0 );
EnableItem ( menus[PROTOMENU], 0 );
DisableItem ( menus[PROTOMENU], INSERT );
DisableItem ( menus[PROTOMENU], REPLACE );
EnableItem ( menus[PROTOMENU], NEW );
EnableItem ( menus[PROTOMENU], REVERT );
EnableItem ( menus[EDITMENU], 0 );
EnableItem ( menus[EDITMENU], UNDO );
EnableItem ( menus[EDITMENU], COPY );
EnableItem ( menus[EDITMENU], PASTE );
EnableItem ( menus[EDITMENU], REPLICATE );
EnableItem ( menus[DISPLAYMENU], 0 );
CheckItem ( menus[DISPLAYMENU], cur_scale + 4, TRUE );
CheckItem ( menus[DISPLAYMENU], log_size + 9, FALSE );
CheckItem ( menus[DISPLAYMENU], wav_size + 9, TRUE );
if ( !cold_start )
    {
 DrawMenuBar();
    }


et_logic_menus()


EnableItem ( menus[DESKMENU], 0 );
EnableItem ( menus[DDWMENU], 0 );
DisableItem ( menus[DDWMENU], PRINT );
DisableItem ( menus[DDWMENU], LOGIC );
DisableItem ( menus[MODEMENU], 0 );
EnableItem ( menus[FUNCTIONMENU], 0 );
EnableItem ( menus[FUNCTIONMENU], CANCEL );
EnableItem ( menus[FUNCTIONMENU], START );
DisableItem ( menus[FUNCTIONMENU], HOLD );
DisableItem ( menus[FUNCTIONMENU], REPEAT );
DisableItem ( menus[FUNCTIONMENU], CRT );
DisableItem ( menus[FUNCTIONMENU], REPPAGE );
DisableItem ( menus[FUNCTIONMENU], BREAK );
```

```
DisableItem ( menus[FUNCTIONMENU], CHARINSERT );
DisableItem ( menus[FUNCTIONMENU], CHARDELETE );
DisableItem ( menus[FUNCTIONMENU], LINEINSERT );
DisableItem ( menus[FUNCTIONMENU], LINEDELETE );
DisableItem ( menus[FUNCTIONMENU], PAGEERASE );
DisableItem ( menus[MOVEMENU], 0 );
EnableItem ( menus[CONTROLMENU], 0 );
DisableItem ( menus[CONTROLMENU], HANDSHAKE );
EnableItem ( menus[CONTROLMENU], LOGICSETUP );
EnableItem ( menus[CONTROLMENU], LOGICDISPLAY );
EnableItem ( menus[CONTROLMENU], LOADFILE );
EnableItem ( menus[CONTROLMENU], AUTODISPLAY );
EnableItem ( menus[CONTROLMENU], LOGICENABLE );
DisableItem ( menus[PROTOMENU], 0 );
DisableItem ( menus[EDITMENU], 0 );
EnableItem ( menus[DISPLAYMENU], 0 );
CheckItem ( menus[DISPLAYMENU], cur_scale + 4, TRUE );
CheckItem ( menus[DISPLAYMENU], wav_size + 9, FALSE );
CheckItem ( menus[DISPLAYMENU], log_size + 9, TRUE );
if ( logic_enabled )
    {
 CheckItem ( menus[CONTROLMENU], LOGICENABLE, TRUE );
    }
else
    {
 CheckItem ( menus[CONTROLMENU], LOGICENABLE, FALSE );
    }
DrawMenuBar();


*
new_waves() -- Throws away all existing waveform data.
        Reinitializes all associated pointers and counters.
/

ew_waves ( reason )
hort reason;


register char *ptr;
register i;
int reply;

if ( maxwavelen() == 0 )
    {
 init_names();
 for ( i = firstwave; i <= lastwave; i++ )
     {
  draw_name ( i );
     }
 return ( OK );
    }
if ( reason == NEW )
    {
 reply = ( decide1
     ("All existing waveforms will be lost.\r\rAre you sure?"));
    }
else
    {
      reply = decide2 ("Some waveforms already exist.");
      }

       switch ( reply )
      {
   case YES:
       {
  x
    while ( !( GetNextEvent ( updateEvt, &event ) ) )
        {
```

```
        }
    update ( (WindowPtr) event.message );

    init_waves();
    init_names();
    maxclocks = 0;
    maxwaves = MAXWAVES;
    firstwave = 0;
    firstclock = 0;
    append_offset = 0;
    set_format (scale[cur_scale - 1], size[cur_size - 1] );
    set_controls();
    InvalRect ( &screenrect );
    InvalRect ( &(*w_hscroll)->contrlRect );
    InvalRect ( &(*w_vscroll)->contrlRect );

    break;
      }
  case NO:
      {
    for ( i = 0; i < maxwaves; i++ )
      {
     if ( waves[i].len > 0 )
       {
      append_offset = i + 1;
       }
     reply = OK;
      }
    break;
     }
  case ABORT:
     {
    break;
     }
   }
return ( reply );


ouse_service()


Point mouseloc;
int code;


mouseloc = event.where;
GlobalToLocal ( &mouseloc );
code = FindWindow ( &event.where, &window );

if ( code != inMenuBar )
   {
 if ( text_editing )
    {
  end_text_edit();
    }
   }
if ( window == wavewptr )
   {
 wave_window_service ( &mouseloc, code );
   }
else if ( window == protowptr )
   {
 proto_window_service ( &mouseloc, code );
   }
else if ( window == cursewptr )
   {
 curse_window_service ( &mouseloc, code );
   }
else if ( window == poswptr )
```

```
    {
 pos_window_service ( &event.where, code );
    }

if ( code == inSysWindow )
    {
 SystemClick ( &event, window );
    }
else if ( code == inMenuBar )
    {
 do_menu ( MenuSelect ( &event.where ) );
    }


o_menu ( menustuff )
nt menustuff;


GrafPtr saveport;
int menu_number, menu_item;
int i;
int tmp;
char name[256];
char *fudge();

menu_number = HiWord ( menustuff );
menu_item = LoWord ( menustuff );

if ( menu_number != EDIT )
    {
 if ( text_editing )
    {
  end_text_edit();
    }
   }
switch ( menu_number )
   {
case APPLE:
    {
 GetItem(menus[DESKMENU], menu_item, name);
 GetPort( &saveport );
 (void) OpenDeskAcc(fudge(name));
 SetPort( saveport );
 break;
    }
case DDW:
    {
 switch ( menu_item )
     {
  case TERMINAL:
      {
   which_loop = TERMINAL;
   break;
      }
  case WAVEDIT:
      {
   which_loop = WAVEDIT;
   break;
      }
  case DATAEDIT:
      {
   if ( data_check() )
       {
    which_loop = DATAEDIT;
    HideWindow ( wavewptr );
    HideWindow ( cursewptr );
    HideWindow ( poswptr );
    dedit();
    set_controls();
```

```
    if ( which_loop == WAVEDIT )
        {
        ShowWindow (wavewptr);
        ShowWindow (cursewptr);
        ShowWindow (poswptr);
        SetPort ( wavewptr );
        set_wave_menus();
        proto_type = CONTROL;
        }
    else if ( which_loop == LOGIC )
        {
        ShowWindow (wavewptr);
        ShowWindow (cursewptr);
        ShowWindow ( poswptr );
        SetPort ( wavewptr );
        set_logic_menus();
        }
      }
   break;
    }
   case LOGIC:
      {
      which_loop = LOGIC;
      break;
      }
   case QUIT:
      {
      quit();
      break;
      }
   case PRINT:
      {
      print();
      break;
      }
    }
  break;
   }
 case MODE:
   {
  switch ( menu_item )
    {
    case COMMAND:
    case DEVELOP:
    case OPERATE:
      {
      break;
      }
    }
  break;
   }
 case FUNCTION:
   {
  switch ( menu_item )
    {
    case CANCEL:
      {
      putstr ( "F\r" );
      break;
      }
    case START:
      {
      putstr ( "G\r" );
      if ( logic_enabled )
        {
      SetCursor ( &cursors[WAIT].c_cursor );
      (void) ReadDateTime ( &wait_time );
      waiting = 1;
        }
```

```
break;
}
case HOLD:
case REPEAT:
case CRT:
case REPPAGE:
case BREAK:
case CHARINSERT:
case CHARDELETE:
case LINEINSERT:
case LINEDELETE:
case PAGEERASE:
{
break;
}
}
break;
}
case MOVEMENT:
{
switch ( menu_item )
{
case UP:
case DOWN:
case LEFT:
case RIGHT:
case HOME:
case END:
case NEXTPAGE:
case PREVPAGE:
{
break;
}
}
break;
}
case CONTROLS:
{
switch ( menu_item )
{
case HANDSHAKE:
{
break;
}
case LOGICSETUP:
{
LAsetup ( &setup_values );
break;
}
case LOGICDISPLAY:
{
if ( LAdisplay() )
{
set_format (scale[cur_scale-1],
size[cur_size-1] );
InvalRect ( &bus_screen );
}
break;
}
case LOADFILE:
{
load_file();
break;
}
case AUTODISPLAY:
{
if ( auto_display )
{
auto_display = 0;
```

```
CheckItem ( menus[CONTROLMENU],
 AUTODISPLAY, FALSE );
   }
else
   {
 auto_display = 1;
 CheckItem ( menus[CONTROLMENU],
  AUTODISPLAY, TRUE );
   }
break;
   }
case LOGICENABLE:
   {
 if ( logic_enabled )
    {
  logic_enabled = 0;
  CheckItem( menus[CONTROLMENU],
             LOGICENABLE, FALSE);
  GetPort ( &saveport );
  SetPort ( deskptr );
  EraseRect ( &armrect );
  SetPort ( saveport );
    }
 else
    {
  start_la();
  logic_enabled++;
  CheckItem( menus[CONTROLMENU],
             LOGICENABLE, TRUE );
  GetPort ( &saveport );
  SetPort ( deskptr );
  TextFont ( systemFont );
  TextSize ( 12 );
  TextMode ( srcXor );
  TextFace ( shadowStyle );
  MoveTo ( 490, 14 );
  DrawChar ( 'L' );
  TextMode ( srcOr );
  TextFace ( 0 );
  SetPort ( saveport );
    }
break;
   }
  }
break;
 }
case PROTOCOL:
 {
 switch ( menu_item )
  {
  case NEW:
   {
   if ( which_loop == WAVEDIT )
    {
    (void) new_waves ( NEW );
    }
   else
    {
    new_data ();
    }
   break;
   }
  case LOAD:
   {
   load_protocol();
   break;
   }
  case INSERT:
   {
```

```
 if ( maxwavelen() == 0 )
    {
  aprintf ( "No waveforms" );
    }
 else if ( wave_to_proto() != -1 )
    {
  putstr ( INSERT_PROTO );
  send_proto();
    }
 break;
   }
case REPLACE:
   {
 if ( maxwavelen() == 0 )
    {
  aprintf ( "No waveforms" );
    }
 else if ( wave_to_proto() != -1 )
    {
  putstr ( REPLACE_PROTO );
  send_proto();
    }
 break;
   }
case REVERT:
   {
 if ( which_loop == WAVEDIT )
    {
  revert();
    }
 else if ( which_loop == DATAEDIT )
    {
  data_revert();
    }
 break;
   }
case NAME:
    {
   if ( name_and_length() != OK )
      {
      }
   break;
     }
    }
 break;
   }
case EDIT:
   {
 switch ( menu_item )
    {
  case UNDO:
     {
   erase_curse();
   curse_on = FALSE;
   erase_select();
   sel_wave = -1;
   sel_count = 0;
   wave_restore();
   break;
     }
  case CUT:
     {
   bugout ( BUG3, "which_loop = %d",
     which_loop );
   if ( text_editing )
      {
    TECut ( tehandle );
      }
   else if ( which_loop == WAVEDIT )
```

```
        {
      wave_cut();
        }
    else if ( which_loop == DATAEDIT )
        {
      data_cut();
        }
    break;
      }
  case COPY:
      {
    if ( text_editing )
        {
      TECopy ( tehandle );
        }
    else
        {
      wave_copy();
        }
    break;
      }
  case PASTE:
      {
    if ( text_editing )
        {
      TEPaste ( tehandle );
        }
    else
        {
      wave_paste();
        }
    break;
      }
  case REPLICATE:
      {
    if ( which_loop = WAVEDIT )
        {
      wave_replicate();
        }
    break;
      }
    }
  break;
    }
case DISPLAY:
    {
  switch ( menu_item )
      {
    case GRID:
        {
      grid_toggle();
      break;
        }
    case HAIRLINE:
        {
      PenMode ( patXor );
      if ( !hair_on )
          {
        on_hair();
          }
      else
          {
        off_hair();
          }
      PenMode ( patOr );
      break;
        }
fdef FOR_DEMO
    case SHOWREGIONS:
```

```
        {
    if ( region_on )
        {
     PenMode ( patBic );
        }
    else
        {
     PenMode ( patOr );
        }
    region_on = !region_on;
    for ( i = 0; i < MAXWAVES; i++ )
        {
     FrameRect ( &waverect[i] );
        }
    PenMode ( patOr );
ndif FOR_DEMO
  case EXPAND:
      {
    if ( expand )
        {
     expand = 0;
     for ( i = firstwave;
         i < firstwave + viswaves;
         i++ )
         {
      wave_unexpand ( i );
         }
     CheckItem ( menus[DISPLAYMENU],
      EXPAND, FALSE );
        }
    else
        {
     expand = 1;
     expand_all ( 0 );
     draw_vis_waves ( srcCopy );
     CheckItem ( menus[DISPLAYMENU],
      EXPAND, TRUE );
        }
    break;
      }
fdef FOR_DEMO
  case FREEMEMORY:
      {
    MaxMem ( &grow );
    sprintf ( "Max Memory: %d", grow );
    SetPort ( wavewptr );
    break;
      }
ndif FOR_DEMO
  default:
      {
    if ( menu_item < 9 )
        {
     new_scale ( menu_item - 4 );
        }
    else
        {
     new_size ( menu_item - 9 );
        }
      }
     }
 break;
    }

case DEBUG:
    {
 switch ( menu_item )
```

```
      {
   case 1:
       {
    ShowWindow ( wavewptr );
    select_window ( wavewptr );
    DrawControls ( wavewptr );
    break;
       }
   case 2:
       {
           ShowWindow ( protowptr );
    select_window ( protowptr );
    break;
       }
     }
  break;
    }

   }
iliteMenu ( 0 );

y_service()


nt i;
har c;

/* for wizards only:  special key combinations for
 * internal use only */

if ( (event.modifiers & BUGMASK) == WIZARD )
    {
 wiz_service ( event.message & 0xff );
 return;
    }

 = event.message & 0xff;
f ( which_loop == WAVEDIT || which_loop == LOGIC )
   {
SetPort ( wavewptr );
   }
f ( text_editing )
   {
bugout ( BUG6, "cur_size = %d", cur_size );
if ( cur_size == 1 )
    {
 TextFont ( Monaco );
 TextSize ( 9 );
 TextFace ( boldStyle );
    }
else
    {
 TextFont ( systemFont );
 TextSize ( 12 );
 TextFace ( 0 );
    }
 if ( c == CR )
    {
  if ( active_name < maxwaves )
      {
   copytext ( waves[active_name].name,
      tehandle, NAMELENGTH );
   TEDeactivate ( tehandle );
   TEDispose ( tehandle );
   active_name++;
   if ( active_name > lastwave )
       {
    down_scroll();
```

```
        }
    viewrect = namerect[active_name - firstwave];
    destrect = viewrect;
    tehandle = TENew( &destrect, &viewrect );
    TESetText ( waves[active_name].name,
         strlen( waves[active_name].name ),
            tehandle );
    TESetJust ( teJustRight,
      tehandle );
    TESetSelect ( 0, NAMELENGTH, tehandle );
    TEActivate ( tehandle );
    wavechange++;
      }
     }
 else if ( c == BACKSPACE ||
    Textlength(tehandle) - Textselsize(tehandle) < NAMELENGTH )
     {
  TEKey ( c, tehandle );
     }
 else
     {
  SysBeep ( 1 );
     }
    }
lse
   {
 switch( c )
     {
  case EXIT:
      {
   quit();
   break;
      }
     }
    }


r_task()


gnHandle save_rgn;
       int     now;
hort len;
      now = TickCount();
      if ( now - curse_time > CURSEBLINK )
          {
               if ( curse_on )
                       {
 if ( PtInRect ( &curse_org, &wavescreen ) &&
    PtInRect ( &curse_end, &wavescreen ) )
      {
   PenMode ( patXor );
   MoveTo ( curse_org.h, curse_org.v );
   LineTo ( curse_end.h, curse_end.v );
   PenMode ( patOr );
   curse_state = !curse_state;
      }
                       }

if ( ( len = maxwavelen() ) != greatest ||
     firstclock != latest )
    {
 draw_info ( firstclock, len );
 latest = firstclock;
 if ( len != greatest )
     {
  greatest = len;
  proto_length = greatest;
     }
```

```
    }

                 curse_time = now;
            }

        if ( now - logic_time > LOGICBLINK )
     {
 armblink();
 logic_time = now;
     }

id_text_edit()

opytext ( waves[active_name].name, tehandle, NAMELENGTH );
EDeactivate ( tehandle );
EDispose ( tehandle );
ext_editing = 0;
ctive_name = -1;
avechange++;

it()

raseRect ( &thePort->portBits.bounds );
xitToShell();
nclude <mac/quickdraw.h>
nclude <mac/toolintf.h>
nclude <mac/osintf.h>
nclude <mac/macprint.h>
nclude "wavedit.h"

efine PRINTING_PROGRESS 501

efine CANCEL  1
efine PAUSE  2
efine CONTINUE 3

efine NIL 0
efine IPRABORT 128

atic THPrint print_handle;
tern Rect *waverect;
tern Rect wavescreen;
tern short grid_on;
tern short waveheight;
tern short cur_size;
tern short textheight;
tern wavestruct *waves;
tern short clockwidth;
tern short gridheight;
tern Rect namescreen;
atic DialogPtr print_dialog;

atic init_dialog()

  int item;

  ParamText("", "", "", "");
  print_dialog = GetNewDialog(PRINTING_PROGRESS, (Ptr) NIL, (WindowPtr) -1);
  set_hilite(CONTINUE, 255);
  DrawDialog(print_dialog);

atic finis_dialog()

  CloseDialog(print_dialog);
```

```
.atic idle_loop()

   auto EventRecord e;
   auto GrafPtr save_grafptr;
   DialogPtr dp;
   auto int item;
   int looping;

   GetPort(&save_grafptr);
   looping = 0;
   do
f (GetNextEvent(mDownMask | updateMask, &e) &&
    IsDialogEvent(&e) &&
    DialogSelect(&e, &dp, &item))
    switch (item)
    {
case CANCEL: PrSetError(IPRABORT);
   return 1;

case PAUSE: looping = 1;
   set_hilite(PAUSE, 255);
   set_hilite(CONTINUE, 0);
   break;

case CONTINUE: looping = 0;
   set_hilite(CONTINUE, 255);
   set_hilite(PAUSE, 0);
   break;
    }
   while (looping);
   SetPort(save_grafptr);
   return 0;


.atic set_hilite(item, value)
t item, value;

   auto int type;
   auto Handle cp;
   auto Rect box;

   GetDItem(print_dialog, item, &type, &cp, &box);
   HiliteControl((ControlHandle) cp, value);


int()

   register int i, j, k;
   register TPPrPort printing_port;
   GrafPtr save_port;
   auto TPrStatus status;
   register int nwaves, nclocks, nhoriz, nvert;
   register unsigned char *data;
   register int page_height, page_width;
   int waves_per_page, total_width;
   Rect r_page, r;
   int error;

   PrOpen();
   if (error = PrError())
   { if (error == MemFullErr)
    aprintf("Not enough memory to print");
lse
    aprintf("DDW disk improperly configured: code %d", error);
eturn;
   }
   print_handle = (THPrint) NewHandle(sizeof (TPrint));
   PrintDefault(print_handle);
```

```
(**print_handle).PrInfo.iHRes = 72;
(**print_handle).PrInfo.rPage.right = 792;
(**print_handle).PrInfo.rPage.bottom = 576;
(**print_handle).rPaper.left = 0;
(**print_handle).rPaper.top = -18;
(**print_handle).rPaper.right = 792;
(**print_handle).rPaper.bottom = 594;
(**print_handle).PrStl.wDev = 272;
(**print_handle).PrInfoPT.iHRes = 72;
(**print_handle).PrInfoPT.rPage.right = 792;
(**print_handle).PrInfoPT.rPage.bottom = 576;
(**print_handle).PrXInfo.iRowBytes = 4;
(**print_handle).PrXInfo.iBandV = 576;
(**print_handle).PrXInfo.iBandH = 32;
(**print_handle).PrXInfo.iDevBytes = 2880;
(**print_handle).PrXInfo.iBands = 25;
(**print_handle).PrXInfo.scan = 2;
(**print_handle).PrJob.pIdleProc = idle_loop;

for (nwaves = 0, nclocks = 0, i = 0; i < MAXWAVES; i++)
{ data = waves[i].data;
or (j = waves[i].len - 1; --j >= 0; )
 if ((data[j >> 2] >> 2 * (3 - (j & 3)) & 3) != NOT_USED)
break;
:++;
f (j > 0)
 nwaves = i + 1;
f (j > nclocks)
 nclocks = j;
}
r_page = (**print_handle).PrInfo.rPage;
page_width = r_page.right;
page_height = r_page.bottom;
waves_per_page = page_height / gridheight;
nvert = (nwaves + waves_per_page - 1) / waves_per_page;
total_width = clockwidth * nclocks + wavescreen.left;
nhoriz = (total_width + page_width - 1) / page_width;
GetPort(&save_port);
printing_port = PrOpenDoc(print_handle, (TPPrPort) NULL, (Ptr) NULL);
init_dialog();
SetPort((GrafPtr) printing_port);
for (i = 0; i < nvert; i++)
or (j = 0; j < nhoriz; j++)
 r = r_page;
 OffsetRect(&r, j * page_width, i * page_height);
 if (idle_loop())
 { PrCloseDoc(printing_port);
finis_dialog();
SetPort(save_port);
PrClose();
 return;
 }
 PrOpenPage(printing_port, &r);
 TextFont(0);
 for (k = 0; k < nwaves; k++)
 { if (grid_on)
 print_grid(k, nclocks);
print_name(k);
print_wave(k);
if (idle_loop())
{   PrCloseDoc(printing_port);
 finis_dialog();
 SetPort(save_port);
 PrClose();
  return;
}
 }
PrClosePage(printing_port);
```

```
    PrCloseDoc(printing_port);
    if (idle_loop())
    { PrCloseDoc(printing_port);
 inis_dialog();
 etPort(save_port);
 rClose();
 eturn;
    }
    PrPicFile(print_handle, (TPPrPort) NULL, (Ptr) NULL, (Ptr) NULL, &status);
    finis_dialog();
    SetPort(save_port);
    PrClose();


atic print_grid(n, nclocks)
gister int n, nclocks;

    register int i;

    PenSize(1, 1);
    MoveTo(waverect[0].left, n * (gridheight - 1) + waveheight);
    for (i = 0; i < nclocks; i++)
    { Line(0, 0);
ove(clockwidth, 0);
    }
    MoveTo(waverect[0].left, n * (gridheight - 1) + 2 * waveheight);
    for (i = 0; i < nclocks; i++)
    { Line(0, 0);
ove(clockwidth, 0);
    }


atic print_name(n)
t n;

    Rect r;
    FontInfo fontinfo;
    int baseline;

    TextFont(systemFont);
    TextMode(srcOr);
    TextSize(12);
    GetFontInfo(&fontinfo);
    baseline = n * (gridheight - 1) + 2 * waveheight;
    SetRect(&r, namescreen.left,
baseline - textheight,
namescreen.right,
baseline + fontinfo.descent);
    TextBox(waves[n].name, strlen(waves[n].name), &r, teJustRight);


atic print_wave(n)
t n;

    register int i;
    register int nclocks;
    register unsigned char *data;
    register int previous, current;
    register int hi, lo, vdelta, hpos;

    vdelta = waveheight - (LINEWIDTH - 1);
    data = waves[n].data;
    nclocks = waves[n].len;
    hi = n * (gridheight - 1) + waveheight;
    lo = hi + vdelta;
    previous = TRISTATE;
    PenSize(1, vdelta + 2);
    PenPat(&QD->gray);
    MoveTo(waverect[0].left, hi);
```

```
for (i = 0, hpos = waverect[0].left; i < nclocks; i++, hpos += clockwidth)
  { current = data[i >> 2] >> 2 * (3 - (i & 3)) & 3;
witch (current)

    case LOW:     if (previous == HIGH)
  Line(0, vdelta);
     else
     { MoveTo(hpos, lo);
  PenSize(1, 2);
  PenPat(&QD->black);
     }
     Line(clockwidth, 0);
     break;

    case HIGH:     if (previous == LOW)
  Line(0, -vdelta);
     else
     { PenSize(1, 2);
  PenPat(&QD->black);
     }
     Line(clockwidth, 0);
     break;

    case TRISTATE:  if (previous != TRISTATE)
     { MoveTo(hpos, hi);
  PenSize(1, vdelta + 2);
  PenPat(&QD->gray);
     }
     Line(clockwidth, 0);
     break;
    case NOT_USED:  return;

revious = current;
  }
nclude <mac/quickdraw.h>
nclude <mac/osintf.h>
nclude <mac/toolintf.h>

nclude "ddw.h"
nclude "global.h"

efine INACTIVE 254
efine ACTIVE  0

tern GrafPtr  scratchport;
tern TEHandle  tehandle;
tern EventRecord event;
tern wavestruct *waves; /* array of waveform structures */
tern MenuHandle wave_menus[];

tern WindowPtr wavewptr;
tern WindowRecord wavewrec;
tern WindowPtr cursewptr;
tern WindowPtr poswptr;
tern WindowRecord poswrec;
tern short  cur_size;

tern WindowRecord disp_wrec;
tern WindowPtr disp_wptr;

tern ControlHandle ok_handle;
tern ControlHandle can_handle;
tern ControlHandle w_hscroll;
tern ControlHandle w_vscroll;

tern WindowPtr protowptr;
tern WindowRecord protowrec;
tern ControlHandle p_vscroll;
```

```
 tern BitMap gridbits;  /* background grid */
 tern BitMap snapshot;  /* hairline background storage */

 tern Rect screenrect;
 tern Rect namescreen;
 tern Rect wavescreen;
 tern Rect *namerect;
 tern Rect viewrect, destrect;
 tern Rect hair_rect;
 tern Rect hair2_rect;

 tern short text_editing;
 tern short active_name;
 tern short gray_wave;
 tern short wavechange;
 tern short bus_width;
 tern short just_back;
 tern short grid_on;    /* !0 = display grid,  0 = don't display grid */

 tern WindowRecord cursewrec;
 tern cursestruct cursors[MAXCURSORS]; /* array of cursors */
 tern Point curse_org;
 tern Point curse_end;
 tern short cur_curs;
 tern short curse_on;
 tern short curse_state;
 tern short wave_curs;
 tern short delay_count;
 tern short sel_count;
 tern short sel_wave;
 tern short sel_clock;
 tern short clockwidth; /* width of single clock ( in pixels ) */
 tern Rect hair_grab;
 tern short hair_on;
 tern short hair_pos;
 tern short hair2_pos;
 tern RgnHandle ind_handle;
 tern RgnHandle ind2_handle;
 tern short ind_clock;
 tern short ind2_clock;
 tern short which_loop;
 tern short firstclock;
 tern short lastclock;
 tern short visclocks;
 tern short firstwave;
 tern short lastwave;
 tern short viswaves;
 tern short maxwaves;
 tern short vert_offset;
 tern short edit_length;
 tern short debug;

 ort hthumb;
 ort vthumb;
 ort comp1 = -1;
 ort comp2 = -1;
 ort scrolling;
 ct hscrollrect;
 ct knobrect;

 nHandle junkrgn;
 nHandle scrollrgn;

 efine PROTOSIZE 8

 it_windows()


 ect tmprect;
```

```
   /* define the cursors window */
 ursewptr = GetNewWindow ( 300, (Ptr) &cursewrec, (WindowPtr) -1 );
   /* define the positions window */
 oswptr = GetNewWindow ( 301, (Ptr) &poswrec, (WindowPtr) -1 );

   /* define the main waveform window */
 avewptr = GetNewWindow ( 256, (Ptr) &wavewrec, (WindowPtr) -1 );
 ew_w_scrollbars();
   /* define the LA display setup window */
 isp_wptr = GetNewWindow ( 258, (Ptr) &disp_wrec, wavewptr );

 f ( ( ok_handle = GetNewControl ( 300, disp_wptr ) ) == 0 )
    {
 aprintf ( "Failed to get OK button control from resource" );
    }

 f ( ( can_handle = GetNewControl ( 301, disp_wptr ) ) == 0 )
    {
 aprintf ( "Failed to get Cancel button control from resource" );
    }
   /* define a protocol window */
 etRect ( &tmprect, 30, 70, 400, 270 );
 rotowptr = GetNewWindow ( 257, (Ptr) &protowrec, wavewptr );
 ew_p_scrollbars();
 unkrgn = NewRgn();


 ve_window_service ( mptr, code )
 int *mptr;
 t code;


 ontrolHandle whichcontrol;
 nt  controlpart;
 nt  i;

 f ( wavewptr != FrontWindow() )
    {
 deselect_window ( FrontWindow() );
 select_window ( wavewptr );
    }
 witch ( code )
    {
 case inGrow:
     {
 /* grow_wave_window(); */
  break;
     }
 case inDrag:
     {
 /* DragWindow ( wavewptr, &event.where, &screenrect ); */
  break;
     }
 case inGoAway:
     {
  if ( TrackGoAway ( wavewptr, mptr ) )
      {
  /* HideWindow ( wavewptr ); */
      }
  break;
     }
 default:
     {
 controlpart = FindControl ( mptr,
    wavewptr, &whichcontrol );
 if ( controlpart )
     {
  control_service ( whichcontrol,
     controlpart, mptr );
     }
```

```
if ( PtInRect ( mptr, &wavescreen ) )
    {
 switch ( wave_curs )
     {
  case CROSSHAIR:
      {
   if ( which_loop == WAVES_LOOP )
       {
    wave_edit ( mptr );
       }
   else
       {
    SysBeep ( 1 );
    while ( StillDown() );
       }
   break;
      }
  case SELECTOR:
      {
   if ( which_loop == WAVES_LOOP )
       {
    wave_select ( mptr );
       }
   else
       {
    SysBeep ( 1 );
    while ( StillDown() );
       }
   break;
      }
  case VERTDRAG:
      {
   drag_wave ( mptr );
   break;
      }
  case HORIZDRAG:
      {
   slide_wave ( mptr );
   break;
      }
  case COMPARE:
      {
   comp_waves ( mptr );
   break;
      }
     }
    }
if ( PtInRgn ( mptr, ind_handle ) )
    {
 if ( hair_on && hair_pos >= 0 )
     {
  ind_clock = drag_hair ( ind_handle,
      &ind_clock );
     }
    }
if ( PtInRgn ( mptr, ind2_handle ) )
    {
 if ( hair_on && hair2_pos >= 0 )
     {
  ind2_clock = drag_hair ( ind2_handle,
      &ind2_clock );
     }
    }
for ( i = 0; i <= viswaves; i++ )
    {
 if ( PtInRect ( mptr, &namerect[i] ) )
     {
  if ( !text_editing )
      {
```

```
if ( which_loop == WAVEDIT )
    {
    SetPort ( waveptr );
    }
if ( cur_size == 1 )
    {
    TextFont ( Monaco );
    TextSize ( 9 );
    TextFace ( boldStyle );
    }
else
    {
    TextFont (systemFont);
    TextSize ( 12 );
    TextFace ( 0 );
    }
viewrect = namerect[i];
i += firstwave;
destrect = viewrect;
tehandle = TENew( &destrect,
  &viewrect );
TESetText ( waves[i].name,
    strlen( waves[i].name ),
  tehandle );
TESetJust ( teJustRight,
  tehandle );
    }
TEActivate ( tehandle );
SystemTask();
if ( which_loop == WAVEDIT )
    {
    TEClick ( mptr, 0, tehandle );
    text_editing++;
    active_name = i;
    }
break;
      }
    }
  if ( cur_curs != SELECTOR )
      {
      FlushEvents ( mDownMask + mUpMask, 0 );
      }
    }

    }


ntrol_service ( cntl_handle, cntl_part, mptr )
ntrolHandle cntl_handle;
t  cntl_part;
int *mptr;


ect cliprect;
rafPtr saveport;
nt track_result;
gnHandle save_region;

etPort ( &saveport );
etPort ( waveptr );
ave_region = NewRgn();
etClip ( save_region );
lipRect ( &waveptr->portRect );

 if blinking cursor is on screen, turn it off during scrolling */

f ( curse_on && curse_state )
  {
PenMode ( patXor );
```

```
MoveTo ( curse_org.h, curse_org.v );
LineTo ( curse_end.h, curse_end.v );
PenMode ( patOr );
curse_state = 0;
   }

rack_result = TrackControl ( cntl_handle, mptr, (ProcPtr) 0 );
witch ( GetCRefCon ( cntl_handle ) )
   {
case VSCROLL:
    {
 scrolling++;
 switch ( cntl_part )
     {
  case inUpButton:
      {
   up_scroll();
   break;
      }
  case inDownButton:
      {
   down_scroll();
   break;
      }
  case inPageUp:
      {
   page_up();
   break;
      }
  case inPageDown:
      {
   page_down();
   break;
      }
  case inThumb:
      {
   vert_thumb ();
   break;
      }
   . }
 break;
    }
case HSCROLL:
    {
 scrolling++;
 switch ( cntl_part )
     {
  case inUpButton:
      {
   left_scroll();
   break;
      }
  case inDownButton:
      {
   right_scroll();
   break;
      }
  case inPageUp: /* page left */
      {
   page_left();
   break;
      }
  case inPageDown: /* page right */
      {
   page_right();
   break;
      }
  case inThumb:
      {
```

```
        horiz_thumb();
        break;
           }
          }
     break;
        }
    default:
        {
     break;
        }
     }

  f ( sel_wave >= firstwave && sel_wave <= lastwave )
     {
  sel_update();
     }

  crolling = 0;

  fdef I_DONT_THINK_SO
  etRect ( &cliprect, 0, 0, thePort->portRect.right - 15,
     thePort->portRect.bottom - 15 );
  lipRect ( &cliprect );
  ndif I_DONT_THINK_SO

  etClip ( save_region );
  isposeRgn ( save_region );
  etPort ( saveport );


  ge_up()


  egister step;

  tep = viswaves - 1;
  f ( firstwave > step )
     {
  firstwave -= step;
     }
  lse
     {
  firstwave = 0;
     }
  astwave = firstwave + step;
  etCtlValue ( w_vscroll, firstwave );
  raw_vis_waves ( srcCopy );


  ge_down()


  egister step;

  tep = viswaves - 1;
  f ( lastwave + step < maxwaves + 1 )
     {
  firstwave += step;
     }
  lse
     {
  firstwave = maxwaves - step + 1;
     }
  astwave = firstwave + step;
  etCtlValue ( w_vscroll, firstwave );
  raw_vis_waves ( srcCopy );
```

```
_scroll()

rafPtr saveport;

etPort ( &saveport );

f ( firstwave > 0 )
   {
firstwave--;
lastwave--;
SetCtlValue ( w_vscroll, firstwave );
ScrollRect ( &wavescreen, 0, vert_offset, junkrgn );
ScrollRect ( &namescreen, 0, vert_offset, junkrgn );
draw_name ( firstwave );
draw_wave ( firstwave, firstclock, visclocks, srcCopy );

SetPort ( scratchport );
SetPortBits ( &snapshot );
ScrollRect ( &snapshot.bounds, 0, vert_offset, junkrgn );
   }

etPort ( saveport );


wn_scroll()

rafPtr saveport;

etPort ( &saveport );

f ( lastwave < maxwaves + 1 )
   {
firstwave++;
lastwave++;
SetCtlValue ( w_vscroll, firstwave );
ScrollRect ( &wavescreen, 0, -vert_offset, junkrgn );
ScrollRect ( &namescreen, 0, -vert_offset, junkrgn );
ScrollRect ( &snapshot.bounds, 0, -vert_offset, junkrgn );
draw_name ( lastwave );
draw_wave ( lastwave, firstclock, visclocks, srcCopy );

SetPort ( scratchport );
SetPortBits ( &snapshot );
ScrollRect ( &snapshot.bounds, 0, -vert_offset, junkrgn );
   }

etPort ( saveport );


rt_thumb()
irstwave = GetCtlValue ( w_vscroll );
astwave = firstwave + viswaves - 1;
raw_vis_waves ( srcCopy );


ge_right()

egister step;
egister tmp_hair;

f ( ( step = edit_length - lastclock - 1 ) > visclocks - 1 )
   {
step = visclocks - 2;
   }
f ( hair_on && hair_pos >= 0 )
   {
```

```
draw_hair ( ind_handle, ind_clock, srcXor );
   }
f ( hair_on && hair2_pos >= 0 )
   {
draw_hair ( ind2_handle, ind2_clock, srcXor );
   }

irstclock += step;
astclock = firstclock + visclocks - 1;
etCtlValue ( w_hscroll, firstclock );
air_pos = new_hair_pos ( ind_handle, ind_clock, &hair_rect );
air2_pos = new_hair_pos ( ind2_handle, ind2_clock, &hair2_rect );

mp_hair = hair_on;
air_on = 0;
raw_all_waves ( firstclock, visclocks, srcCopy );
air_on = tmp_hair;

f ( hair_on && hair_pos >= 0 )
   {
snap_hair ( ind_handle );
draw_hair ( ind_handle, ind_clock, srcOr );
   }
f ( hair_on && hair2_pos >= 0 )
   {
snap_hair ( ind2_handle );
draw_hair ( ind2_handle, ind2_clock, srcOr );
   }


ge_left()


egister step;
egister tmp_hair;

tep = visclocks - 2;
f ( hair_on && hair_pos >= 0 )
   {
draw_hair ( ind_handle, ind_clock, srcXor );
   }
f ( hair_on && hair2_pos >= 0 )
   {
draw_hair ( ind2_handle, ind2_clock, srcXor );
   }
f ( firstclock > step )
   {
firstclock -= step;
   }
lse
   {
firstclock = 0;
   }
astclock = firstclock + visclocks - 1;
etCtlValue ( w_hscroll, firstclock );
air_pos = new_hair_pos ( ind_handle, ind_clock, &hair_rect );
air2_pos = new_hair_pos ( ind2_handle, ind2_clock, &hair2_rect );

mp_hair = hair_on;
air_on = 0;
raw_all_waves ( firstclock, visclocks, srcCopy );
air_on = tmp_hair;

f ( hair_on && hair_pos >= 0 )
   {
snap_hair ( ind_handle );
draw_hair ( ind_handle, ind_clock, srcOr );
   }
f ( hair_on && hair2_pos >= 0 )
```

```
    {
snap_hair ( ind2_handle );
draw_hair ( ind2_handle, ind2_clock, srcOr );
    }

ght_scroll()

gnHandle save_region;

f ( lastclock < edit_length - 1 )
    {
save_region = NewRgn();
GetClip ( save_region );

if ( hair_on && ind_clock == firstclock )
     {
 PenMode ( patBic );
 FrameRgn ( ind_handle );
 PenMode ( patOr );
     }
if ( hair_on && ind2_clock == firstclock )
     {
 PenMode ( patBic );
 FrameRgn ( ind2_handle );
 PenMode ( patOr );
     }

firstclock++;
lastclock++;
SetCtlValue ( w_hscroll, firstclock );
OffsetRgn ( ind_handle, -clockwidth, 0 );
OffsetRgn ( ind2_handle, -clockwidth, 0 );

SetClip ( scrollrgn );
ScrollRect ( &hscrollrect, -clockwidth, 0, junkrgn );
ClipRect ( &hscrollrect );
hair_pos =
 new_hair_pos ( ind_handle, ind_clock, &hair_rect );
hair2_pos =
 new_hair_pos ( ind2_handle, ind2_clock, &hair2_rect );
draw_all_waves ( lastclock, 1, srcCopy );
if ( hair_on && ind_clock == lastclock + 1 )
    {
 hair_deactivate ( ind_handle );
    }
if ( hair_on && ind2_clock == lastclock + 1 )
    {
 hair_deactivate ( ind2_handle );
    }

SetClip ( save_region );
DisposeRgn ( save_region );
    }

ft_scroll()

gnHandle save_region;

f ( firstclock > 0 )
    {
save_region = NewRgn();
GetClip ( save_region );

if ( hair_on && ind_clock == lastclock )
    {
```

```
PenMode ( patBic );
FrameRgn ( ind_handle );
PenMode ( patOr );
    }
if ( hair_on && ind2_clock == lastclock )
    {
PenMode ( patBic );
FrameRgn ( ind2_handle );
PenMode ( patOr );
    }

firstclock--;
lastclock--;
SetCtlValue ( w_hscroll, firstclock );
OffsetRgn ( ind_handle, clockwidth, 0 );
OffsetRgn ( ind2_handle, clockwidth, 0 );
SetClip ( scrollrgn );
ScrollRect ( &hscrollrect, clockwidth, 0, junkrgn );
SetClip ( save_region );
hair_pos =
 new_hair_pos ( ind_handle, ind_clock, &hair_rect );
hair2_pos =
 new_hair_pos ( ind2_handle, ind2_clock, &hair2_rect );
draw_all_waves ( firstclock, 1, srcCopy );
if ( hair_on && ind_clock == firstclock )
    {
 hair_deactivate ( ind_handle );
    }
if ( hair_on && ind2_clock == firstclock )
    {
 hair_deactivate ( ind2_handle );
    }

DisposeRgn ( save_region );
   }


riz_thumb()


f ( hair_on && hair_pos >= 0 )
   {
draw_hair ( ind_handle, ind_clock, srcXor );
   }
f ( hair_on && hair2_pos >= 0 )
   {
draw_hair ( ind2_handle, ind2_clock, srcXor );
   }
irstclock = GetCtlValue ( w_hscroll );
astclock = firstclock + visclocks - 1;
air_pos = new_hair_pos ( ind_handle, ind_clock, &hair_rect );
air2_pos = new_hair_pos ( ind2_handle, ind2_clock, &hair2_rect );
raw_all_waves ( firstclock, visclocks, srcCopy );
f ( hair_on && hair_pos >= 0 )
   {
draw_hair ( ind_handle, ind_clock, srcOr );
   }
f ( hair_on && hair2_pos >= 0 )
   {
draw_hair ( ind2_handle, ind2_clock, srcOr );
   }


ow_wave_window()


ect limitrect;
ect growrect;
nt newsize;
```

```
etRect ( &limitrect, 100, 50, 494, 292 );
ewsize = GrowWindow ( wavewptr, &event.where, &limitrect );
nvalRect ( &(*w_hscroll)->contrlRect );
nvalRect ( &(*w_vscroll)->contrlRect );
et_grow_rect ( &growrect, wavewptr );
nvalRect ( &growrect );
izeWindow ( wavewptr, newsize & 0xffff, newsize >> 16, 1 );
lipRect ( &wavewptr->portRect );

oveControl ( w_hscroll, wavewptr->portRect.left - 1,
   wavewptr->portRect.bottom - 15 );
izeControl ( w_hscroll, wavewptr->portRect.right -
   wavewptr->portRect.left - 13, 16 );

oveControl ( w_vscroll, wavewptr->portRect.right - 15,
    wavewptr->portRect.top - 1 );
izeControl ( w_vscroll, 16, wavewptr->portRect.bottom -
    wavewptr->portRect.top - 13 );

 DrawGrowIcon( wavewptr ); */
alidRect ( &(*w_hscroll)->contrlRect );
alidRect ( &(*w_vscroll)->contrlRect );
et_grow_rect ( &growrect, wavewptr );
alidRect ( &growrect );


oto_window_service ( mptr, code )
int *mptr;
t code;


witch ( code )
   {
case inContent:
   {
 if ( protowptr != FrontWindow() )
     {
  deselect_window ( FrontWindow() );
  select_window ( protowptr );
     }
 break;
   }
case inGrow:
    {
/* grow_proto_window(); */
 break;
    }
case inDrag:
    {
/* DragWindow ( protowptr, &event.where, &screenrect ); */
    }
case inGoAway:
    {
 if ( TrackGoAway ( protowptr, mptr ) )
     {
  HideWindow ( protowptr );
  ShowWindow ( wavewptr );
  select_window ( wavewptr );
  DrawControls ( wavewptr );
     }
    }
   }


ow_proto_window()


ect limitrect;
ect growrect;
```

```
ect tmprect;
nt newsize;

etPort ( protowptr );
etRect ( &limitrect, 100, 50, 494, 292 );
ewsize = GrowWindow ( protowptr, &event.where, &limitrect );
nvalRect ( &(*p_vscroll)->contrlRect );
et_grow_rect ( &growrect, protowptr );
nvalRect ( &growrect );
etRect ( &tmprect, 0, protowptr->portRect.bottom - 16,
  protowptr->portRect.right - 16,
    protowptr->portRect.bottom );
nvalRect ( &tmprect );
izeWindow ( protowptr, LoWord ( newsize ), HiWord ( newsize ), 1 );
mprect = protowptr->portRect;
mprect.bottom -= 16;
lipRect ( &tmprect );
oveControl ( p_vscroll, protowptr->portRect.right - 15,
  protowptr->portRect.top - 1 );
izeControl ( p_vscroll, 16, protowptr->portRect.bottom -
    protowptr->portRect.top - 13 );
rawGrowIcon( protowptr );
alidRect ( &(*p_vscroll)->contrlRect );
et_grow_rect ( &growrect, protowptr );
alidRect ( &growrect );


s_window_service ( mptr, code )
int *mptr;
t code;


rafPtr saveport;
hort new_clock;

etPort ( &saveport );
etPort ( poswptr );
lobalToLocal ( mptr );

etPort ( wavewptr );
  /*   Here, doggie! */
f ( mptr->v < 20 &&
 ( ind_clock < firstclock || ind_clock > lastclock ) )
    {
if ( !hair_on )
     {
 on_hair();
     }
new_clock = firstclock;
if ( new_clock < ind2_clock )
     {
 ind_clock = new_clock;
 hair_pos = new_hair_pos ( ind_handle,
    ind_clock, &hair_rect );
 snap_hair ( ind_handle );
 draw_hair ( ind_handle, ind_clock, srcOr );
 show_positions();
     }
    }

f ( mptr->v > 50 &&
 ( ind2_clock < firstclock || ind2_clock > lastclock ) )
    {
if ( !hair_on )
     {
 on_hair();
     }
new_clock = lastclock;
if ( new_clock > ind_clock )
```

```
     {
  ind2_clock = new_clock;
  hair2_pos = new_hair_pos ( ind2_handle,
     ind2_clock, &hair2_rect );
  snap_hair ( ind2_handle );
  draw_hair ( ind2_handle, ind2_clock, srcOr );
  show_positions();
     }
    }

etPort ( saveport );


rse_window_service ( mptr, code )
int *mptr;
t code;


rafPtr saveport;
hort old_curse;
hort i;

ocalToGlobal ( mptr );
etPort ( &saveport );
etPort ( &cursewrec.port );
lobalToLocal ( mptr );

ld_curse = wave_curs;
or ( i = 0; i < MAXCURSORS; i++ )
   {
if ( PtInRect ( mptr, &cursors[i].c_rect ) )
    {
 wave_curs = i;
 if ( old_curse == COMPARE && wave_curs != COMPARE )
     {
  comp1 = -1;
  comp2 = -1;
  draw_vis_waves ( srcCopy );
     }
 if ( old_curse != COMPARE && wave_curs == COMPARE )
     {
  draw_vis_waves ( srcCopy );
     }
 if ( old_curse != wave_curs )
     {
  InvertRect ( &cursors[old_curse].c_rect );
  InvertRect ( &cursors[wave_curs].c_rect );
     }
 if ( wave_curs != CROSSHAIR )
     {
  if ( curse_on )
      {
   SetPort ( &wavewrec.port );
   erase_curse();
   curse_on = FALSE;
      }
  if ( sel_count > 0 )
      {
   SetPort ( &wavewrec.port );
   erase_select();
   sel_count = 0;
      }
     }
 break;
    }
   }
etPort ( saveport );
```

```
t_grow_rect( rectptr, wptr )
ct  *rectptr;
ndowPtr wptr;


ectptr->left = wptr->portRect.right - 16;
ectptr->top = wptr->portRect.bottom - 16;
ectptr->right = wptr->portRect.right;
ectptr->bottom = wptr->portRect.bottom;


date ( wptr )
ndowPtr wptr;


rafPtr saveport;
ect cliprect;
ect tmprect;
hort i;

etPort ( &saveport );
etPort ( wptr );
rawControls ( wptr );
lipRect ( &thePort->portRect );

witch ( (short) GetWRefCon ( wptr ) )
   {
case WAVEWINDOW:
    {
 BeginUpdate ( wptr );
 refresh();
 EndUpdate ( wptr );
 break;
    }
case CURSEWINDOW:
    {
 BeginUpdate ( wptr );
 SetRect ( &tmprect, 4, 4, 20, 20 );
 PenMode ( patOr );
 for ( i = 0; i < MAXCURSORS; i++ )
     {
  FrameRect ( &cursors[i].c_rect );
  CopyBits ( &cursors[i].c_map,
      &thePort->portBits,
      &cursors[i].c_map.bounds,
      &tmprect,
      srcOr,
      (RgnHandle) 0 );
  OffsetRect ( &tmprect, 0, 25 );
     }
 InvertRect ( &cursors[wave_curs].c_rect );
 EndUpdate ( wptr );
 break;
    }
case POSWINDOW:
    {
 BeginUpdate ( wptr );
 tmprect = (**ind_handle).rgnBBox;
 OffsetRgn ( ind_handle, 6 - tmprect.left,
     6 - tmprect.top );
 FrameRgn ( ind_handle );
 OffsetRgn ( ind_handle, tmprect.left - 6,
     tmprect.top - 6 );
 tmprect = (**ind2_handle).rgnBBox;
 OffsetRgn ( ind2_handle, 6 - tmprect.left,
    56 - tmprect.top );
 FrameRgn ( ind2_handle );
 OffsetRgn ( ind2_handle, tmprect.left - 6,
     tmprect.top - 56 );
```

```
show_positions();
EndUpdate ( wptr );
break;
    }
case PROTOWINDOW:
    {
 BeginUpdate ( wptr );
   DrawGrowIcon ( wptr );  */
 if ( wavechange )
     {
  EndUpdate ( wptr );
  wave_to_proto();
     }
 else
     {
  wave_to_proto();
  EndUpdate ( wptr );
     }
 break;
    }
case LADISPWINDOW:
    {
 BeginUpdate ( wptr );
 disp_draw();
 EndUpdate ( wptr );
 break;
    }
case DATAWINDOW:
    {
 BeginUpdate ( wptr );
 data_edit_window();
 EndUpdate ( wptr );
 break;
    }
default:
    {
    }
   }

etPort ( saveport );


fresh()


ect cliprect;
hort tmp_hair;

rawControls ( wavewptr );
mp_hair = hair_on;
air_on = 0;
raseRect ( &screenrect );
extFont(0);
raw_vis_waves ( srcOr );
ugout ( BUG8, "refresh()...\rtmp_hair %d, hair_pos %d, just_back %d",
   tmp_hair, hair_pos, just_back );
f ( tmp_hair && hair_pos >= 0 )
    {
 if ( just_back )
     {
  bugout ( BUG8, "snapping hair #1..." );
  hair_pos = new_hair_pos ( ind_handle,
     ind_clock, &hair_rect );
  snap_hair ( ind_handle );
     }
draw_hair ( ind_handle, ind_clock, srcOr );
   }
ugout ( BUG8, "refresh()...\rtmp_hair %d, hair2_pos %d, just_back %d",
  tmp_hair, hair2_pos, just_back );
```

```
f ( tmp_hair && hair2_pos >= 0 )
    {
if ( just_back )
      {
 bugout ( BUG8, "snapping hair #2..." );
 hair2_pos = new_hair_pos ( ind2_handle,
     ind2_clock, &hair2_rect );
 snap_hair ( ind2_handle );
      }
draw_hair ( ind2_handle, ind2_clock, srcOr );
    }
ust_back = 0;
air_on = tmp_hair;
raw_info ( firstclock, maxwavelen() );
f ( which_loop == LOGIC && bus_width > 0 )
    {
draw_bus();
bus_update();
    }


lect_window ( wptr )
ndowPtr wptr;


ect growrect;

etPort ( wptr );
f ( wptr == wavewptr )
    {
ShowControl ( w_hscroll );
ShowControl ( w_vscroll );
InvalRect ( &(*w_hscroll)->contrlRect );
InvalRect ( &(*w_vscroll)->contrlRect );
get_grow_rect ( &growrect, wavewptr );
InvalRect ( &growrect );
SelectWindow ( wptr );
DrawGrowIcon( protowptr );

EnableItem ( wave_menus[GRIDMENU], 0 );
EnableItem ( wave_menus[SCALEMENU], 0 );
EnableItem ( wave_menus[SIZEMENU], 0 );
EnableItem ( wave_menus[SELECTMENU], 2 );
DisableItem ( wave_menus[SELECTMENU], 1 );

DrawMenuBar();
    }
lse if ( wptr == protowptr )
    {
ShowControl ( p_vscroll );
InvalRect ( &(*p_vscroll)->contrlRect );
get_grow_rect ( &growrect, protowptr );
InvalRect ( &growrect );
SelectWindow ( wptr );
  DrawGrowIcon( wavewptr ); */

DisableItem ( wave_menus[GRIDMENU], 0 );
DisableItem ( wave_menus[SCALEMENU], 0 );
DisableItem ( wave_menus[SIZEMENU], 0 );
DisableItem ( wave_menus[SELECTMENU], 2 );
EnableItem ( wave_menus[SELECTMENU], 1 );

DrawMenuBar();
    }


select_window ( wptr )
ndowPtr wptr;
```

```
f ( wptr == wavewptr )
   {
HideControl ( w_hscroll );
HideControl ( w_vscroll );
   }
lse if ( wptr == protowptr )
   {
HideControl ( p_vscroll );
   }


g_note ( s_ptr )
ar *s_ptr;


rafPtr saveport;

etPort ( &saveport );
etPort ( wavewptr );
extMode ( srcCopy );
oveTo ( 300, 70 );
rawString ( s_ptr );

etPort ( saveport );
 Macros  */

efine Textlength(tehdl) ((*tehdl)->TElength)
efine Textlineheight(tehdl) ((*tehdl)->lineHeight)
efine Textselsize(tehdl) ((*tehdl)->selEnd - (*tehdl)->selStart)
efine State(wv,clk) ((waves[wv].data[(clk)/4]>>((3-(clk)%4)*2))&0x03)
efine Wait_Button {while(!Button()); while(Button());}

  Constants */

efine YES  1
efine NO  2
efine ABORT  3

efine noConstraint 0
efine hAxisOnly 1
efine vAxisOnly 2

efine TE_LOOP  1
efine WAVES_LOOP  2
efine LOGIC_LOOP 3

efine NULL  '\000'
efine APPLE_SYM  '\024'
efine TRUE  0xffff
efine FALSE  0
efine MAXCURSORS 5
efine MAXCLOCKS 1024
efine MAXWAVES 32
efine MAXSCALES 4
efine MAXSIZES 4
efine NAMELENGTH 16
efine WAVEHEIGHT 12
efine WAVEWIDTH 448
efine CLOCKWIDTH 8
efine LINEWIDTH 2
efine LOW  0
efine HIGH  1
efine TRISTATE 2
efine NOT_USED 3
efine BACKSPACE '\010'
efine CURSEBLINK      30
efine LOGICBLINK 15
efine BLK_SIZE 300
efine BUF_SIZE 10000
```

```
Window Reference Numbers */

efine WAVEWINDOW 1
efine CURSEWINDOW 2
efine POSWINDOW 3
efine PROTOWINDOW 9

Controls */

efine VSCROLL  1
efine HSCROLL  2

efine NO_HIGHLIGHT 254

Menu Definitions */

efine APPLE   1 /* menu ID for desk accessory menu */
efine MAXMENUS 9

efine DESKMENU 0
efine DDWMENU  1
efine MODEMENU 2
efine FUNCTIONMENU 3
efine MOVEMENU 4
efine CONTROLMENU 5
efine PROTOMENU 6
efine EDITMENU 7
efine DISPLAYMENU 8

efine DDW  256
efine TERMINAL 1
efine WAVEDIT  2
efine DATAEDIT 3
efine LOGIC  4
efine PRINT  6
efine QUIT  8

efine MODE  257
efine COMMAND  1
efine DEVELOP  2
efine OPERATE  3

efine FUNCTION 258
efine CANCEL  1
efine START  2
efine HOLD  4
efine REPEAT  5
efine CRT  6
efine REPPAGE  7
efine BREAK  8
efine CHARINSERT 9
efine CHARDELETE 10
efine LINEINSERT 11
efine LINEDELETE 12
efine PAGEERASE 13

efine MOVEMENT 259
efine UP  1
efine DOWN  2
efine LEFT  3
efine RIGHT  4
efine HOME  5
efine END  6
efine NEXTPAGE 7
efine PREVPAGE 8
efine CONTROLS 260
efine TERMSETUP 1
efine LOGICSETUP 2
efine LOGICDISPLAY 3
```

```
efine LOADFILE 4
efine AUTODISPLAY 5
efine LOGICENABLE 6

efine PROTOCOL 261
efine NEW  1
efine LOAD  2
efine INSERT  3
efine REPLACE  4
efine REVERT  5
efine NAME  6

efine EDIT  262
efine UNDO  1
efine CUT  2
efine COPY  3
efine PASTE  4
efine REPLICATE 5

efine DISPLAY  263
efine GRID  1
efine HAIRLINE 2
efine SHOWREGIONS 4
efine FREEMEMORY 5

 Keyboard Definitions */

efine EXIT  'q'

 Cursor Definitions */

efine CROSSHAIR 0
efine SELECTOR 1
efine VERTDRAG 2
efine HORIZDRAG 3
efine COMPARE  4

 Type Definitions */

pedef struct
  {
oint  org; /* top-left corner of waveform screen area */
hort  len; /* length of waveform ( in clocks ) */
har  name[NAMELENGTH+1]; /* waveform name (+ NULL) */
nsigned char *data; /* packed waveform data */
  } wavestruct ;

pedef struct
  {
hort c_id;
itMap c_map;
ect c_rect;
ursor c_cursor;
  } cursestruct;

pedef struct
  {
hort  blnum;   /* block number */
hort  blcount;  /* byte count */
hort  blcksum;  /* check sum */
nsigned char  *bldata;  /* pointer to data */
  } Block;

pedef struct
  {
hort  logic;
hort  exec;
hort  mhz2;
hort  mhz4;
```

```
hort   mhz8;
hort   efg;
hort   dut;
hort   del_off;
hort   del_on;
hort   q1;
hort   q2;
hort   q3;
hort   q4;
nsigned short del_count;
  } LASetup;

efine Delay(n) { delay_count = n; while ( delay_count-- ); }

 Sender/Receiver definitions */

efine READTIME  30

efine RDY   0x31
efine SOH    0x01
efine ACK    0x06
efine NAK    0x15
efine CAN    0x18
efine EOT   0x04

efine TIMOUT    -1
efine GOOD    0
efine NOTOK    1
efine MAXRETRY  3
efine BSIZE    256
```

What is claimed is:

1. A test system for in-circuit testing of a device, the test system comprising:

a. means for stimulating the device with a first waveform at any desired electrical node of the device;

b. means for measuring and recording at any desired electrical node a second waveform generated by the device in response to the first waveform;

c. means for editing the second waveform generated by the device to produce a third waveform;

d. means for stimulating the device at any desired electrical node with the third waveform; and e. means for measuring and recording at any desired electrical node a fourth waveform generated by the device in response to the third waveform.

2. A method for in-circuit testing of a device, the method comprising the steps of:

a. stimulating the device with a first waveformat any desired electrical node of the device;

b. measuring and recording at any desired electrical node a second waveform generated by the device in response to the first waveform;

c. editing the second waveform generated by the device to produce a third waveform;

d. stimulating the device at any desired electrical node with the third waveform; and e. measuring and recording at any desired electrical node a fourth waveform generated by the device in response to the third waveform.

3. The test system of claim 1 wherein the means for measuring and recording the second waveform and th means for measuring and recording the fourth waveform each icnlude means for measuring a waveform generated by the device when a microprocessor of the device is free-running, executing on-board programs.

4. The test system of claim 1 wherein the means for measuring and recording the second waveform and the means for measuring and recording the fourth waveform each include a measurement clock external to the test system.

5. The test system of claim 1 wherein the means for measuring and recording the second waveform and the means for measuring and recording the fourth waveform each include a measurement clock internal to the test system.

6. The test system of claim 1 wherein the means for measuring and recording the second waveform and the means for measuring and recording the fourth waveform each include a means for combining a measurement clock internal to the device with a qualifying signal so that the combination of the measurement clock internal to the device and the qualifying signal is valid for the bus cycles of a microprocessor of the device.

7. The test system of claim 3 wherein the means for measuring and recording the second waveform and the means for measuring and recording the fourth waveform each include a measurement clock external to the test system.

8. The test system of claim 3 wherein the means for measuring and recording the second waveform and the means for measuring and recording the fourth waveform each include a measurement clock internal to the test system.

9. The test sytem of claim 3 wherein the means for measuring and recording the second waveform and the means for measuring and recording the fourth waveform each include a means for combining a measurement clock internal to the device with a qualifying signal so that the combination of the measurement clock internal to the device and the qualifying signal is valid for the bus cycles of a microprocessor of the device.

10. The method of claim 2 wherein the step of measuring and recording the second waveform and the step of measuring and recording the fourth waveform each include measuring a waveform generated by the device when a microprocessor of the device is free-running, executing on-board programs.

11. The method of claim 2 wherein the step of measuring and recording the second waveform and the step of measuring and recording the fourth waveform each include using a measurement clock external to the test system.

12. The method of claim 2 wherein the step of measuring and recording the second waveform and the step of measuring and recording the fourth waveform each include using a measurement clock internal to the test system.

13. The method of claim 2 wherein the step of measuring and recording the second waveform and the step of measuring and recording the fourth waveform each include combining a measurement clock internal to the device with a qualifying signal so that the combination of the measurement clock internal to the device and the qualifying signal is valid for the bus cycles of a microprocessor of the device.

14. The method of claim 10 wherein the step of measuring and recording the second waveform and the step of measuring and recording the fourth waveform each include using a measurement clock external to the test system.

15. The method of claim 10 wherein the step of measuring and recording the second waveform and the step of measuring and recording the fourth waveform each include using a measurement clock internal to the test system.

16. The method of claim 10 wherein the step of measuring and recording the second waveform and the step of measuring and recording the fourth waveform each include combining a measurement clock internal to the device with a qualifying singla so that the combination of the measurement clock internal to the device and the qualifying signal is valid for the bus cycles of a microprocessor of the device.

* * * * *